US012777733B2

(12) United States Patent
Noudo et al.

(10) Patent No.: US 12,777,733 B2
(45) Date of Patent: Oct. 27, 2026

(54) IMAGING DEVICE AND ELECTRONIC DEVICE

(71) Applicant: SONY SEMICONDUCTOR SOLUTIONS CORPORATION, Kanagawa (JP)

(72) Inventors: Shinichiro Noudo, Kumamoto (JP); Tomohiko Baba, Kanagawa (JP); Masashi Nakata, Kanagawa (JP); Atsushi Toda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 943 days.

(21) Appl. No.: 18/001,707

(22) PCT Filed: May 13, 2021

(86) PCT No.: PCT/JP2021/018277
§ 371 (c)(1),
(2) Date: Dec. 13, 2022

(87) PCT Pub. No.: WO2021/261107
PCT Pub. Date: Dec. 30, 2021

(65) Prior Publication Data
US 2023/0238416 A1 Jul. 27, 2023

(30) Foreign Application Priority Data
Jun. 25, 2020 (JP) ................................ 2020-109967

(51) Int. Cl.
*H01L 27/146* (2006.01)
*G06V 10/147* (2022.01)
(Continued)

(52) U.S. Cl.
CPC ......... *H10F 39/807* (2025.01); *G06V 10/147* (2022.01); *G06V 40/1312* (2022.01);
(Continued)

(58) Field of Classification Search
CPC ............... H10F 39/807; H10F 39/8053; H10F 39/8057; H10F 39/8063; H10F 39/199;
(Continued)

(56) References Cited

U.S. PATENT DOCUMENTS

2004/0145672 A1 7/2004 Sugimoto
2008/0211628 A1 9/2008 Hashimoto et al.
(Continued)

FOREIGN PATENT DOCUMENTS

CN 102238323 A 11/2011
CN 110050344 A 7/2019
(Continued)

OTHER PUBLICATIONS

International Search Report and Written Opinion prepared by the Japan Patent Office on Aug. 5, 2021, for International Application No. PCT/JP2021/018277, 4 pgs.

*Primary Examiner* — Ermias T Woldegeorgis
(74) *Attorney, Agent, or Firm* — SHERIDAN ROSS P.C.

(57) ABSTRACT

A plurality of subpixels is included in one pixel. An imaging device includes a subpixel, a pixel, and a pixel array. The subpixel includes a photoelectric conversion element that receives light incident at a predetermined angle and outputs an analog signal on the basis of intensity of the received light. The pixel includes a plurality of the subpixels, a lens that condenses light incident from an outside on the subpixel, and a photoelectric conversion element isolation portion that does not propagate information regarding intensity of the light acquired in the photoelectric conversion element to the adjacent photoelectric conversion element, and further includes a light-shielding wall that shields light incident on the lens of another pixel. The pixel array includes a plurality of the pixels.

10 Claims, 212 Drawing Sheets

(51) Int. Cl.

| | |
|---|---|
| ***G06V 40/12*** | (2022.01) |
| ***G06V 40/13*** | (2022.01) |
| ***G06V 40/145*** | (2022.01) |
| ***H04N 13/243*** | (2018.01) |
| ***H10F 39/00*** | (2025.01) |
| *H10F 39/12* | (2025.01) |

(52) U.S. Cl.
CPC ........ *G06V 40/1388* (2022.01); *G06V 40/145* (2022.01); *H04N 13/243* (2018.05); *H10F 39/8053* (2025.01); *H10F 39/8057* (2025.01); *H10F 39/8063* (2025.01); *H10F 39/199* (2025.01)

(58) Field of Classification Search
CPC .... H10F 39/198; H10F 39/182; H10F 39/803; H10F 39/806; G06V 10/147; G06V 40/1312; G06V 40/1388; G06V 40/145; H04N 13/243
See application file for complete search history.

(56) References Cited

U.S. PATENT DOCUMENTS

| | | | | |
|---|---|---|---|---|
| 2008/0253620 | A1 | 10/2008 | Hashimoto | |
| 2012/0268634 | A1 | 10/2012 | Fukuda | |
| 2017/0220840 | A1 | 8/2017 | Wickboldt et al. | |
| 2017/0220844 | A1 | 8/2017 | Jones et al. | |
| 2019/0043901 | A1 | 2/2019 | Honda | |
| 2019/0268543 | A1 | 8/2019 | Kato | |
| 2020/0075652 | A1 * | 3/2020 | Chen | H04N 13/344 |

FOREIGN PATENT DOCUMENTS

| | | | | | |
|---|---|---|---|---|---|
| CN | 111261651 | A | * | 6/2020 | H04N 25/60 |
| EP | 3550273 | A1 | * | 10/2019 | H04N 25/76 |
| JP | 2003-331268 | | | 11/2003 | |
| JP | 2003331268 | A | * | 11/2003 | |
| JP | 2004-222184 | | | 8/2004 | |
| JP | 2006130308 | A | | 5/2006 | |
| JP | 2008-217190 | | | 9/2008 | |
| JP | 2008217190 | A | * | 9/2008 | G06V 10/10 |
| JP | 2008-262336 | | | 10/2008 | |
| JP | 2008262336 | A | * | 10/2008 | G06V 40/1312 |
| JP | 2018-033505 | | | 3/2018 | |
| JP | 2018-063378 | | | 4/2018 | |
| JP | 2018063378 | A | * | 4/2018 | G02B 5/28 |
| JP | 2019-047392 | | | 3/2019 | |
| JP | 2019-512762 | | | 5/2019 | |
| JP | 2019-114728 | | | 7/2019 | |
| JP | 2019-145563 | | | 8/2019 | |
| JP | 2019145563 | A | * | 8/2019 | H10F 39/8063 |
| JP | 2020-035327 | | | 3/2020 | |
| JP | 2020-047616 | | | 3/2020 | |
| JP | 2020-088029 | | | 6/2020 | |
| JP | 2020088029 | A | * | 6/2020 | |
| TW | 202023041 | A | * | 6/2020 | |
| WO | WO-2019131122 | A1 | | 7/2019 | |
| WO | WO-2020121724 | A1 | * | 6/2020 | H04N 25/778 |

* cited by examiner

USED PHYSICAL PROPERTY VALUE
@ WAVELENGTH 250nm

| | n | k |
|---|---|---|
| Air | 1.0000 | 0.0000 |
| SiO2 | 1.5230 | 0.0010 |
| PT | 3.1700 | 0.7750 |
| AO | 1.7435 | 0.0455 |
| Si | 1.6650 | 3.5900 |

FIG. 262

500d

| | | | | | | | | | | | | | | | | | | | | | | |
|---|---|---|---|---|---|---|---|---|---|---|---|---|---|---|---|---|---|---|---|---|---|---|
| 0 | 0 | 0 | 0 | 0 | 0 | 0 | 1 | 1 | 0 | 0 | 0 | 0 | 0 | 0 | 0 | 0 | 0 | 0 | 0 | 0 | 0 | 0 |
| 0 | 0 | 0 | 0 | 0 | 0 | 0.5 | 1 | 0.5 | 0 | 0 | 0 | 0 | 0 | 0 | 0 | 0 | 0 | 0 | 0 | 0 | 0 | 0 |
| 0 | 0 | 0 | 0 | 0 | 0 | 0.5 | 1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0.5 | 1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0.5 | 1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0.5 | 1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0.5 | 1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 1 | 1 | 0 | 0 | 0 | 0 | 0 | 0 | 0 | 0 | 0 | 0 | 0 | 0 | 0 | 0 | 0 |
| 0 | 0 | 0 | 0 | 0 | 0 | 1 | 1 | 0 | 0 | 0 | 0 | 0 | 0 | 0 | 0 | 0 | 0 | 0 | 0 | 0 | 0 | 0 |
| 0 | 0 | 0 | 0 | 0 | 1 | 1 | 0.5 | 0 | 0 | 0 | 0 | 0 | 0 | 0 | 0 | 0 | 0 | 0 | 0 | 0 | 0 | 0 |

500e

| | | | | | | | | | | | | | | | | | | | | | | |
|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0.5 | 1 | 1 | 0 | 0 | 0 | 0 | 0 | 0 | 0 | 0 | 0 |
| 0 | 0 | 0 | 0 | 0 | 0 | 0 | 0 | 0 | 0 | 0.5 | 1 | 1 | 0 | 0 | 0 | 0 | 0 | 0 | 0 | 0 | 0 | 0 |
| 0 | 0 | 0 | 0 | 0 | 0 | 0 | 0 | 0 | 0.5 | 1 | 1 | 0 | 0 | 0 | 0 | 0 | 0 | 0 | 0 | 0 | 0 | 0 |
| 0 | 0 | 0 | 0 | 0 | 0 | 0 | 0 | 0 | 0.5 | 1 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0.5 | 1 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0.5 | 1 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0.5 | 1 | 0 | 0 | 0 | 0 | 0 | 0 | 0 | 0 | 0 | 0 | 0 | 0 |
| 0 | 0 | 0 | 0 | 0 | 0 | 0 | 0 | 0 | 1 | 1 | 0 | 0 | 0 | 0 | 0 | 0 | 0 | 0 | 0 | 0 | 0 | 0 |
| 0 | 0 | 0 | 0 | 0 | 0 | 0 | 0 | 0.5 | 1 | 0.5 | 0 | 0 | 0 | 0 | 0 | 0 | 0 | 0 | 0 | 0 | 0 | 0 |
| 0 | 0 | 0 | 0 | 0 | 0 | 0 | 1 | 1 | 1 | 0 | 0 | 0 | 0 | 0 | 0 | 0 | 0 | 0 | 0 | 0 | 0 | 0 |

500f

| | | | | | | | | | | | | | | | | | | | | | | |
|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 1 | 1 | 0 | 0 | 0 | 0 | 0 | 0 |
| 0 | 0 | 0 | 0 | 0 | 0 | 0 | 0 | 0 | 0 | 0 | 0 | 0 | 0 | 1 | 1 | 0.5 | 0 | 0 | 0 | 0 | 0 | 0 |
| 0 | 0 | 0 | 0 | 0 | 0 | 0 | 0 | 0 | 0 | 0 | 0 | 0.5 | 1 | 1 | 0 | 0 | 0 | 0 | 0 | 0 | 0 | 0 |
| 0 | 0 | 0 | 0 | 0 | 0 | 0 | 0 | 0 | 0 | 0 | 0 | 0.5 | 1 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0.5 | 1 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0.5 | 1 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0.5 | 1 | 0 | 0 | 0 | 0 | 0 | 0 | 0 | 0 | 0 |
| 0 | 0 | 0 | 0 | 0 | 0 | 0 | 0 | 0 | 0 | 0 | 0 | 1 | 1 | 0 | 0 | 0 | 0 | 0 | 0 | 0 | 0 | 0 |
| 0 | 0 | 0 | 0 | 0 | 0 | 0 | 0 | 0 | 0 | 0 | 1 | 1 | 0.5 | 0 | 0 | 0 | 0 | 0 | 0 | 0 | 0 | 0 |
| 0 | 0 | 0 | 0 | 0 | 0 | 0 | 0 | 0 | 0.5 | 1 | 1 | 0.5 | 0 | 0 | 0 | 0 | 0 | 0 | 0 | 0 | 0 | 0 |

IMAGING DEVICE AND ELECTRONIC DEVICE

TECHNICAL FIELD

The present disclosure relates to an imaging device and an electronic device.

BACKGROUND ART

In recent years, in electronic devices such as smartphones, tablet terminals, and personal computers (PCs), sophisticated designs such as improvement in portability by thinning/downsizing and bezel-free displays are required. In these electronic devices, an image sensor for imaging and a biometric authentication function for a fingerprint or the like are almost indispensable. To achieve compatibility with thinning of a housing, an embodiment including an imaging device below a display is required, and in addition, thinning of an optical lens, eventually, an optical lens-less is desired. Moreover, in biometric authentication uses, security measures against impersonation problems are important.

Meanwhile, in electronic devices specialized in imaging, such as a digital single-lens reflex camera, a mirrorless camera, or a compact digital camera, demand replacement by a mobile terminal such as a smartphone including an imaging element has been in progress, and an added value unique to a camera is required.

CROSS REFERENCE TO RELATED APPLICATIONS

This application is a national stage application under 35 U.S.C. 371 and claims the benefit of PCT Application No. PCT/JP2021/018277, having an international filing date of 13 May 2021, which designated the United States, which PCT application claimed the benefit of Japanese Patent Application No. 2020-109967, filed 25 Jun. 2020, the entire disclosures of each of which are incorporated herein by reference.

CITATION LIST

Patent Document

Patent Document 1: Japanese Patent Application Laid-Open No. 2018-033505

SUMMARY OF THE INVENTION

Problems to be Solved by the Invention

One aspect of the present disclosure provides various implementations of an imaging device that includes a plurality of subpixels in one pixel.

Solutions to Problems

According to an embodiment, an imaging device includes at least a subpixel, a pixel, and a pixel array. The subpixel includes a photoelectric conversion element that receives light incident at a predetermined angle and outputs an analog signal on the basis of intensity of the received light. The pixel includes a plurality of the subpixels, a lens that condenses light incident from an outside on the subpixel, and a photoelectric conversion element isolation portion that does not propagate information regarding intensity of the light acquired in the photoelectric conversion element to the adjacent photoelectric conversion element, and further includes a light-shielding wall that shields light incident on the lens of another pixel. The pixel array includes a plurality of the pixels.

The lens may cause light incident in parallel to an optical axis of the lens to be incident on the subpixel located at a center of the pixel. Intensity of light received by each pixel can be accurately converted into a signal by condensing light incident on the subpixel located at the center of the pixel in parallel with the optical axis.

The lens may cause part of light incident in parallel to an optical axis of the lens to be incident on at least the subpixel located at a center of the pixel. As described above, the light is caused to be incident on the subpixel located at the center, and the light incident in parallel with the optical axis may be able to be received in a surrounding subpixel.

The lens may condense light incident at an angle not parallel to an optical axis of the lens on the subpixel provided at a predetermined position among the subpixels provided in the pixel. By condensing the light in this manner, the light can be condensed on each subpixel on the basis of an angle from the optical axis of the incident light in one pixel, and angular resolution can be improved. That is, an influence of light from a plurality of angles can be acquired in one pixel.

The lens may be a reflow lens, and may include a level difference of a reflow stopper between the lens and an adjacent lens. The lens (on-chip lens) can be manufactured by various manufacturing methods. For example, a reflow lens by reflow processing can be used. In this case, a stopper may be provided in order to suppress deterioration in performance of the lens due to the reflow processing.

The reflow stopper may be at least a part of the light-shielding wall, and may include a self-alignment reflow lens. As described above, the stopper may also have a function of a part of the light-shielding wall.

The lens may be a Fresnel lens. The Fresnel lens may be used as the on-chip lens. By using the Fresnel lens, the thickness of the lens can be suppressed.

The lens may be a diffractive lens. The diffractive lens may be used as the on-chip lens. The diffractive lens can suppress the thickness of the lens similarly to the Fresnel lens, and various characteristics of the lens can be easily controlled, for example, a position of a focal point in the pixel in a manufacturing process.

The pixel may further include an inner lens between the lens and the photoelectric conversion element. Not only the on-chip lens but also the inner lens may be provided so as to overlap the on-chip lens. By providing the inner lens, it is possible to impart characteristics of the lens such that mounting of only the on-chip lens is difficult and the shape becomes complicated. Furthermore, the inner lens can also be used for pupil correction and the like.

The lens may be arranged such that a position of a center of the lens is shifted from a position of a center of the corresponding pixel on the basis of a position of the pixel in the pixel array. In this manner, it is also possible to form the on-chip lens at the position shifted from the center of the pixel. For example, the pupil correction can be implemented by having different lens positions at a central portion and an end portion of the pixel array.

The pixel may include a color filter that transmits a predetermined color to at least one of the subpixels. By providing the color filter in the subpixel in each pixel, color resolution can be improved for light received in one pixel. Furthermore, by providing different the color filters for light incident at different angles with respect to the optical axis, it is possible to receive light having different wavelengths for the same object region between different pixels.

The subpixel does not need to include the photoelectric conversion element isolation portion between the subpixel and the adjacent subpixel in a case where light transmitted through the color filter of the same color as that of the adjacent subpixel is incident on the subpixel. The subpixels including the filters of the same color may be combined in this manner. By combining the subpixels in this manner, light reception sensitivity to the color filter can be improved.

The pixel may include a plasmon filter as at least one of the color filters. By providing the plasmon filter, for example, the sensitivity can be particularly improved in a predetermined wavelength region of interest.

The pixel may include at least two types of color filters between the lens and the photoelectric conversion element. For example, a filter for the pixel and a filter for each subpixel of the pixel may be provided. The characteristics of the filter vary by superposition. By providing the different filters for the pixel and the subpixel, various types of signal processing can be executed according to the characteristics. Furthermore, of course, the different color filters can also be provided between the subpixels.

The color filter may include a plasmon filter on a photoelectric conversion element side of the light-shielding wall. In this manner, the color filter and the plasmon filter can be used in an overlapping manner.

The color filter may include a color filter of an organic film on a lens side of the light-shielding wall.

A part of a combination of the color filters may have a transmittance spectrum that transmits light of near infrared rays and absorbs visible light. In this manner, an IR filter may be provided. As such, the pixel can include one or a plurality of filters having various characteristics.

The light-shielding wall may be configured in multiple stages at different positions in a case where the light-shielding wall is viewed from a direction of an optical axis of the pixel on the basis of a position where the lens is provided. With the configuration in multiple stages, a light beam or a light flux incident on the subpixel can be controlled in various modes.

A light-shielding film configured to shield light incident on an adjacent pixel from between the light-shielding walls configured in multiple stages may be further provided. In the case of the multistage configuration, there is a possibility that a gap between the light-shielding walls is generated between the pixels when viewed from the direction of the optical axis, depending on the degree of deviation between the lower light-shielding wall and the upper light-shielding wall. In such a case, there is a possibility that light incident on the subpixel from the adjacent pixel is generated. To shield the light from the adjacent pixel, the light-shielding film may be provided.

The pixel may include at least one diaphragm between the lens and the photoelectric conversion element, and the diaphragm may be a light-shielding film provided in a direction intersecting an optical axis of the lens. The pixel may include a diaphragm to suppress stray light, but the above-described light-shielding film may be used as the diaphragm.

A memory region in which a charge converted from light in the photoelectric conversion element is temporarily stored may be further provided. By including the memory region and reading out the charge stored in the memory region at predetermined timing, for example, rolling shutter distortion can be suppressed.

An antireflection film having a moth-eye structure may be provided on the lens side of the photoelectric conversion element, and a reflecting film on a side opposite to the antireflection film of the photoelectric conversion element, and a metal film in a semiconductor substrate of the photoelectric conversion element isolation portion may be provided. By processing the surface of the light receiving element into the moth-eye structure, it can be used as a film that prevents reflection of incident light. Moreover, the reflecting film may be provided on the opposite side of the light-receiving region in order to enhance efficiency of converting the received light into the charge.

The photoelectric conversion element isolation portion may include a groove from a side of the semiconductor substrate, the side being not an irradiation surface, may have a level difference in a part of the groove and include a vertical transistor, and may have a back-illuminated structure. In the manufacturing process, the imaging element can be formed from either the front surface or the back surface of the substrate. In a case of forming the photoelectric conversion element isolation portion from the side that is not the irradiation surface, it is easy to form a vertical transistor connected to wiring in the manufacturing process.

The photoelectric conversion element isolation portion may include an impurity layer by solid-phase diffusion. A well region in the substrate may be formed by a process by solid-phase diffusion in addition to ion implantation as described above.

The number of saturated electrons generally depends on the area of a photoelectric conversion region in a pixel potential formed by the ion implantation method. Meanwhile, solid-phase diffusion increases the number of saturated electrons by increasing capacitance at a trench sidewall dug into the substrate. That is, the solid-phase diffusion has an advantage of providing the capacitance in a depth direction as the pixel becomes smaller, and has an ineffective advantage of the solid-phase diffusion in a large pixel size region. Meanwhile, the solid-phase diffusion increases the number of processes and the manufacturing cost, and thus it is necessary to consider cost effectiveness. In view of such a background, in the pixel, an aspect ratio of a thickness of the semiconductor substrate a length of one side of the photoelectric conversion element may be at least 4 or more.

The pixel may have subpixels of at least two different sizes. For example, by using the subpixels of different sizes, it is possible to acquire signals focusing on sensitivity and focusing on not saturating in the same pixel at the same timing.

According to an embodiment, a method of manufacturing an imaging element including a subpixel and a pixel including a plurality of the subpixels includes steps of forming a well region in a substrate; forming a photoelectric conversion element isolation portion that isolates a light-receiving region of the subpixel in the well region; forming an insulating film on the substrate; forming an interlayer film including a material that transmits light on the insulating film; forming a light-shielding wall on the photoelectric conversion element isolation portion that isolates the pixel in the interlayer film; and forming a lens on the interlayer film.

According to an embodiment, an electronic device includes the imaging device according to any one of the above description.

A signal processing device that synthesizes outputs of a plurality of subpixels acquired by the imaging device and acquires three-dimensional stereoscopic information of an object may be provided. According to the signal processing device, it is possible to execute various types of signal processing regarding the three-dimensional stereoscopic information on the basis of the signal received by the subpixel.

A signal processing device that synthesizes outputs of a plurality of subpixels acquired by the imaging device and expands an angle of view may be provided. According to the signal processing device, it is possible to execute various types of signal processing regarding the expansion of the angle of view on the basis of the signal received by the subpixel.

A signal processing device that synthesizes outputs of a plurality of subpixels acquired by the imaging device and operates the number of pixels may be provided. According to the signal processing device, for example, high resolution of an image can be implemented.

A signal processing device that synthesizes outputs of a plurality of subpixels acquired by the imaging device and refocuses an object image may be provided. According to the signal processing device, for example, an image in focus on a plurality of surfaces can be acquired from the acquired information.

A signal processing device that acquires distance information of an object from a shift amount of a characteristic pattern of a plurality of subpixel images acquired by the imaging device may be provided. According to the signal processing device, for example, the distance to the object can also be measured.

A signal processing device including the imaging device and configured to identify a motion of a human body and convert the motion into an operation command may be provided. According to the signal processing device, gesture input can be performed.

A signal processing device configured to perform Fourier transform for an output from the subpixel and perform deconvolution using a point spread function of the subpixel may be provided. According to the signal processing device, deconvolution filters associated with various PSFs can be implemented.

A signal processing device in which an image of the subpixel is divided into a plurality of regions, and the point spread function is defined for each of the regions, and configured to perform deconvolution for the each of the regions may be provided. According to the signal processing device, deconvolution can be performed even for a PSF that changes for each region, that is, a shift variant PSF.

A display unit may be provided, and the imaging device is provided on a side opposite to a display surface of the display unit may be provided. According to the imaging device, for example, the imaging device can be used as a personal authentication device, an in-camera, or the like at timing when a display is displayed.

An address storage unit of a subpixel in which light from an object is shielded by an element of the display unit, and a signal processing device configured to synthesize a subpixel image excluding a signal of the subpixel may be provided. By including the signal processing device, it is possible to improve the accuracy of signal acquisition related to imaging from the display surface while displaying the display.

A storage unit that extracts a characteristic from a fingerprint image of an individual acquired by the imaging device and stores the characteristic in a database may be provided, and a personal authentication device configured to acquire the fingerprint image of an object during an authentication operation, extract and collate the characteristic with the database, and make a determination may be provided. By providing the storage unit, a range of the personal authentication for a terminal device or the like can be widened.

The imaging device that acquires a flip operation may be provided, and the fingerprint image acquisition method may be the flip operation. For example, it is possible to analyze, in the electronic device, fingerprint information acquired from the imaging device in a quick operation.

A storage unit that extracts a characteristic from a vein image of an individual acquired by the imaging device and stores the characteristic in a database may be provided, and a personal authentication device configured to acquire the vein image of an object during an authentication operation, extract and collate the characteristic with the database, and make a determination. Similar to the above description, a range of the vein authentication can be widened.

The characteristic of the vein image may be three-dimensional stereoscopic information. According to the above-described imaging device, it is also possible to acquire information regarding a three-dimensional shape. By using this three-dimensional shape, the personal authentication using more accurate vein information can be implemented.

An impersonation prevention function to collate spectrum information of an object acquired by the imaging device with a rising spectrum unique to human skin in a vicinity of a wavelength of 590 nm, and determine whether or not the object is a living body may be provided. By using information captured by the imaging device, it is also possible to prevent authentication by impersonation.

An impersonation prevention function to detect pulsation of a vein from a plurality of image differences of a vein image acquired by the imaging device, and determine whether or not the vein image is of a living body may be provided, and authentication by impersonation can be prevented, similarly to the above-description.

A function to calculate a signal ratio between a wavelength around 660 nm and a near-infrared region from spectrum information of an object acquired by the imaging device, and to measure a saturated oxygen concentration may be provided. For example, an oximeter can be used.

In the pixel, the wire grid polarizer may be provided in at least one of the plurality of subpixels.

In the pixel, the wire grid polarizer may be provided in the plurality of subpixels.

The wire grid polarizer may be provided for the pixel.

The wire grid polarizer having a plurality of polarization directions may be provided.

At least two types of the wire grid polarizers having polarization directions different by 90 degrees may be provided.

The wire grid polarizer having three or more types of polarization directions may be provided, and a normal analysis may be executed by fitting.

The subpixel may include the wire grid polarizer and another type of filter in a mixed manner.

The subpixel may receive light transmitted through the wire grid polarizer and another type of filter.

In the pixel, at least one of the subpixels may include a guided mode resonance (GMR) filter.

In the pixel, the GMR filter may be provided in the plurality of subpixels.

The GMR filter may be provided for the pixel.

Two or more types of the GMR filters having different peak wavelengths may be provided.

The subpixel may include the GMR filter and another type of filter in a mixed manner.

BRIEF DESCRIPTION OF DRAWINGS

FIG. 119 is a cross-sectional view schematically illustrating an isolation portion according to an embodiment.

FIG. 120 is a cross-sectional view schematically illustrating an isolation portion according to an embodiment.

FIG. 121 is a cross-sectional view schematically illustrating an isolation portion according to an embodiment.

FIG. 122 is a cross-sectional view schematically illustrating an isolation portion according to an embodiment.

FIG. 123 is a cross-sectional view schematically illustrating an imaging pixel according to an embodiment.

FIG. 124 is a cross-sectional view schematically illustrating imaging pixels according to an embodiment.

FIG. 125 is a cross-sectional view schematically illustrating imaging pixels according to an embodiment.

FIG. 126 is a cross-sectional view schematically illustrating imaging pixels according to an embodiment.

FIG. 127 is a plan cross-sectional view schematically illustrating an imaging pixel according to an embodiment.

FIG. 128 is a cross-sectional view schematically illustrating imaging pixels according to an embodiment.

FIG. 129 is a plan cross-sectional view schematically illustrating an imaging pixel according to an embodiment.

FIG. 130 is a cross-sectional view schematically illustrating imaging pixels according to an embodiment.

Figure 131:
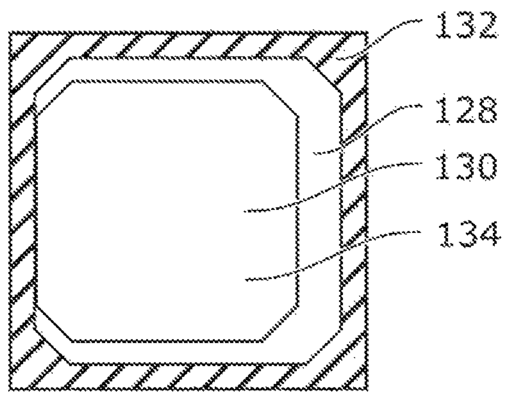

FIG. 131 is a plan cross-sectional view schematically illustrating an imaging pixel according to an embodiment.

Figure 132:
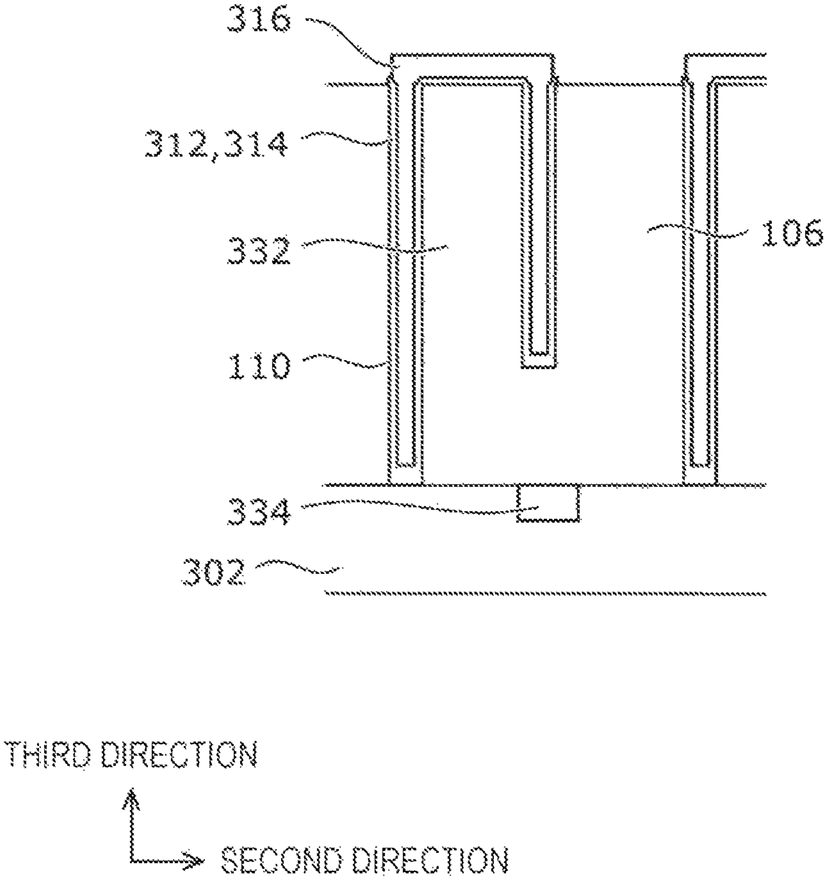

FIG. 132 is a cross-sectional view schematically illustrating an imaging pixel according to an embodiment.

Figure 133:
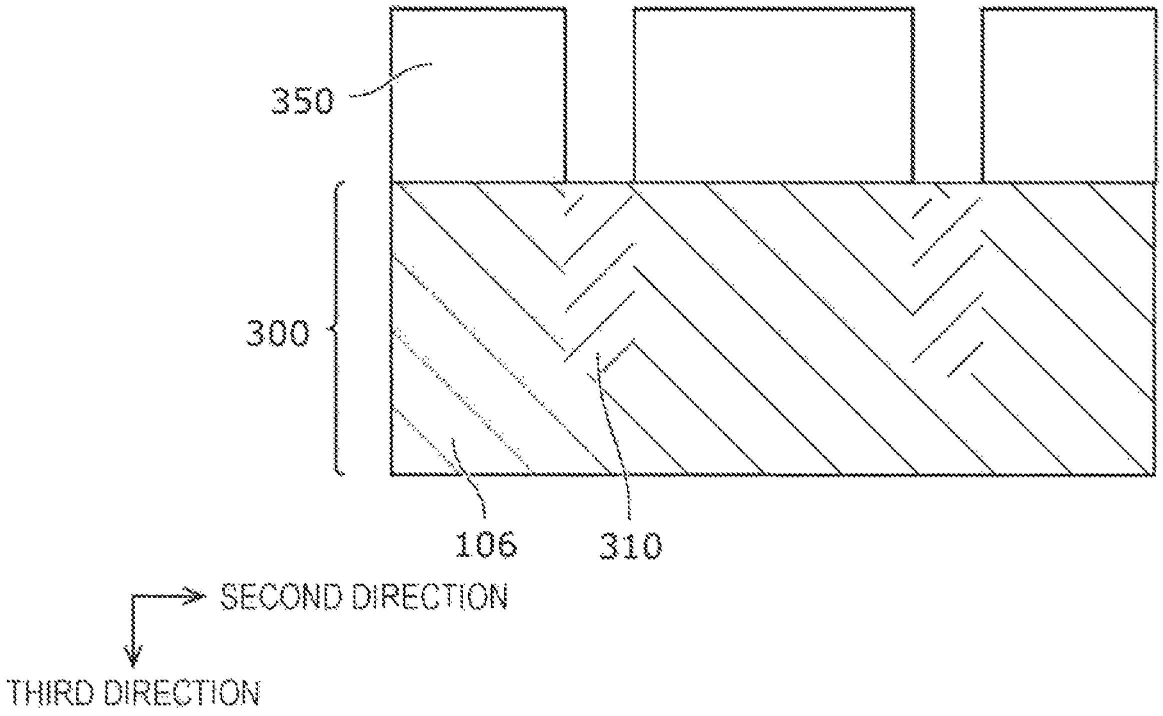

FIG. 133 is a view schematically illustrating a semiconductor process according to an embodiment.

Figure 134:
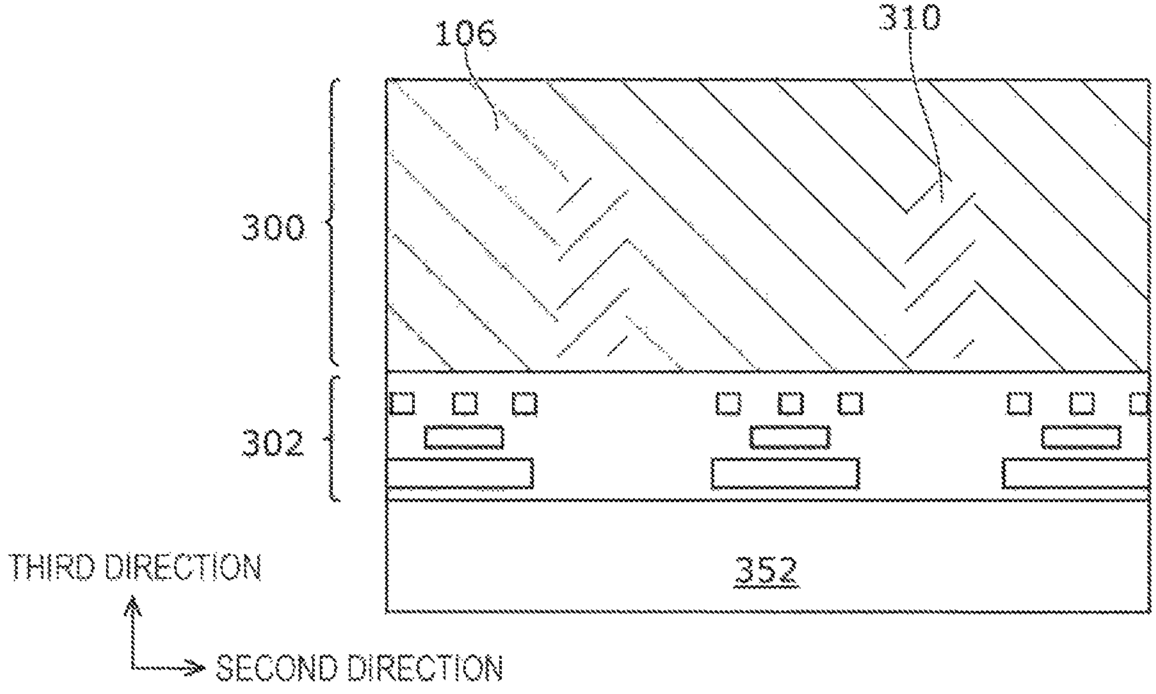

FIG. 134 is a view schematically illustrating a semiconductor process according to an embodiment.

Figure 135:
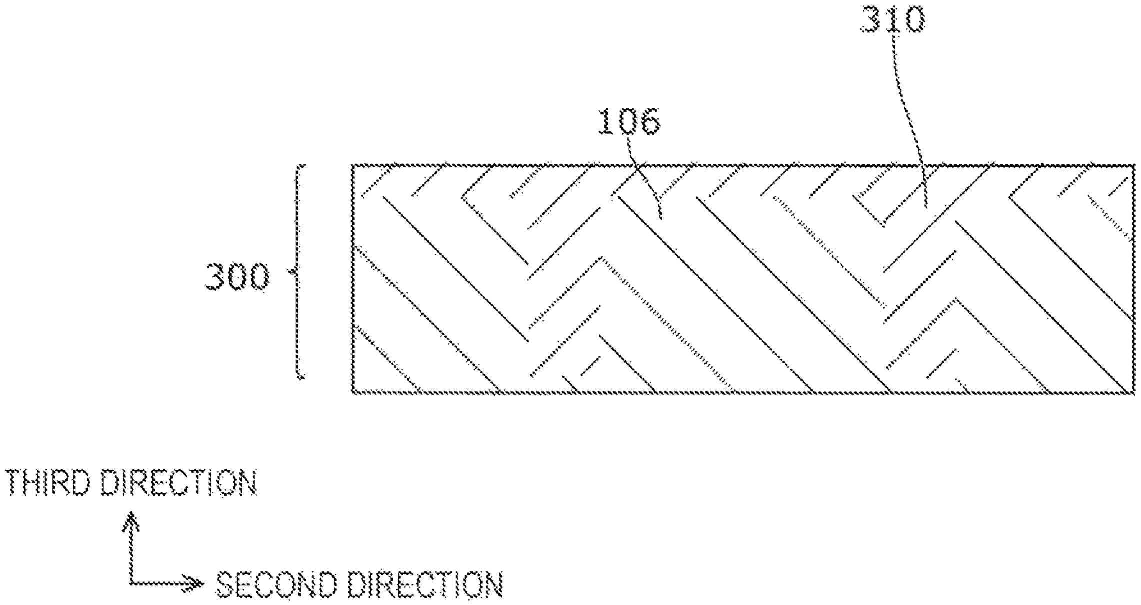

FIG. 135 is a view schematically illustrating a semiconductor process according to an embodiment.

Figure 136:
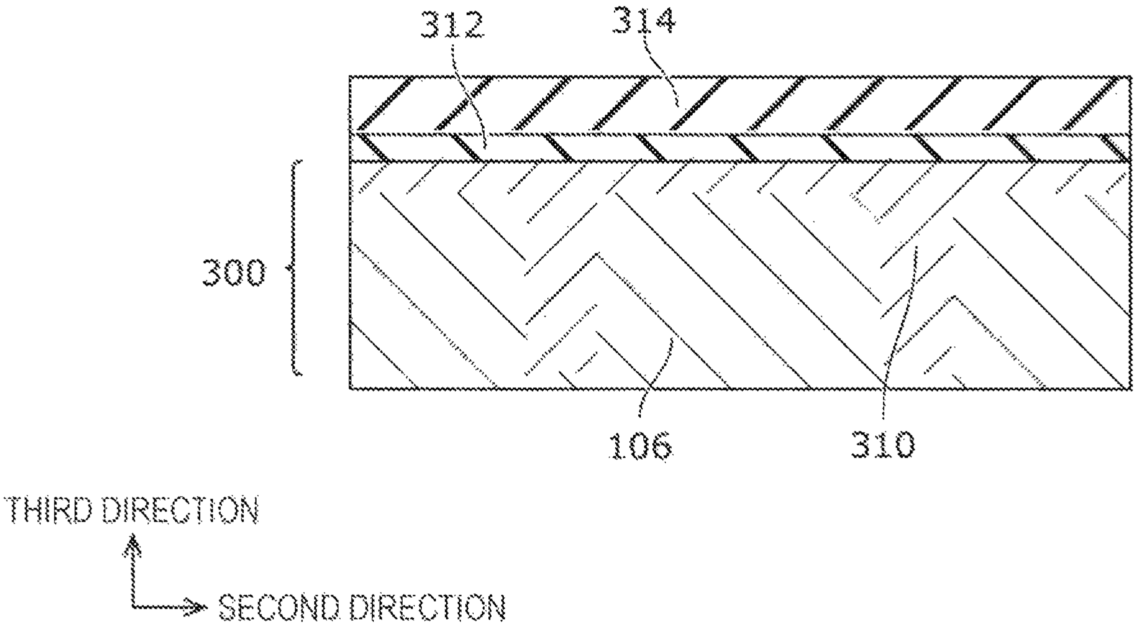

FIG. 136 is a view schematically illustrating a semiconductor process according to an embodiment.

Figure 137A:
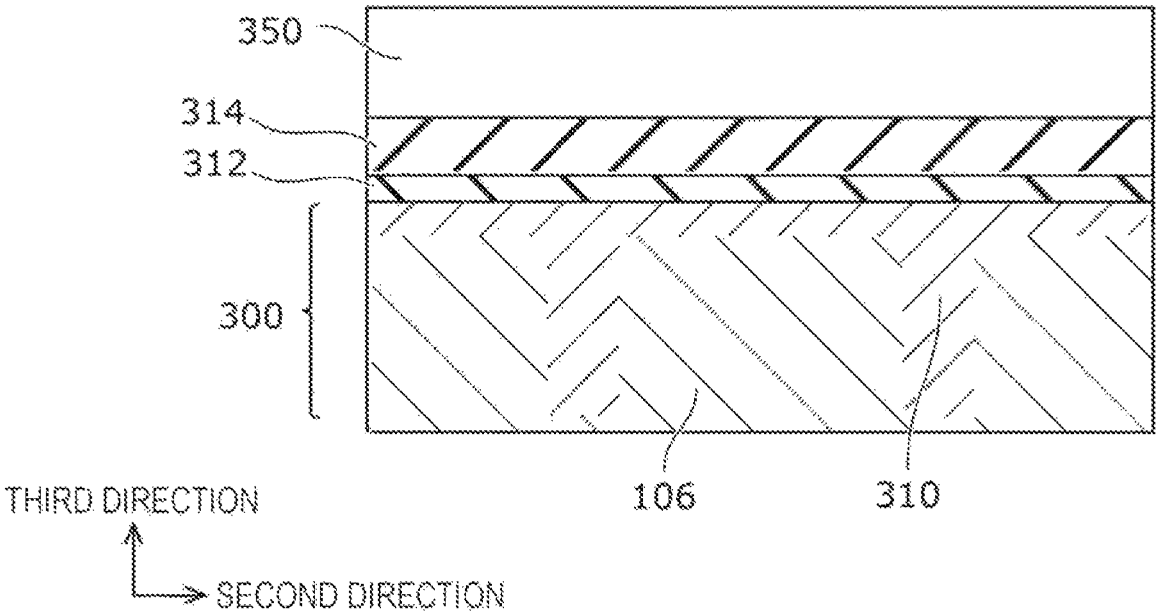

FIG. 137A is a view schematically illustrating a semiconductor process according to an embodiment.

Figure 137B:
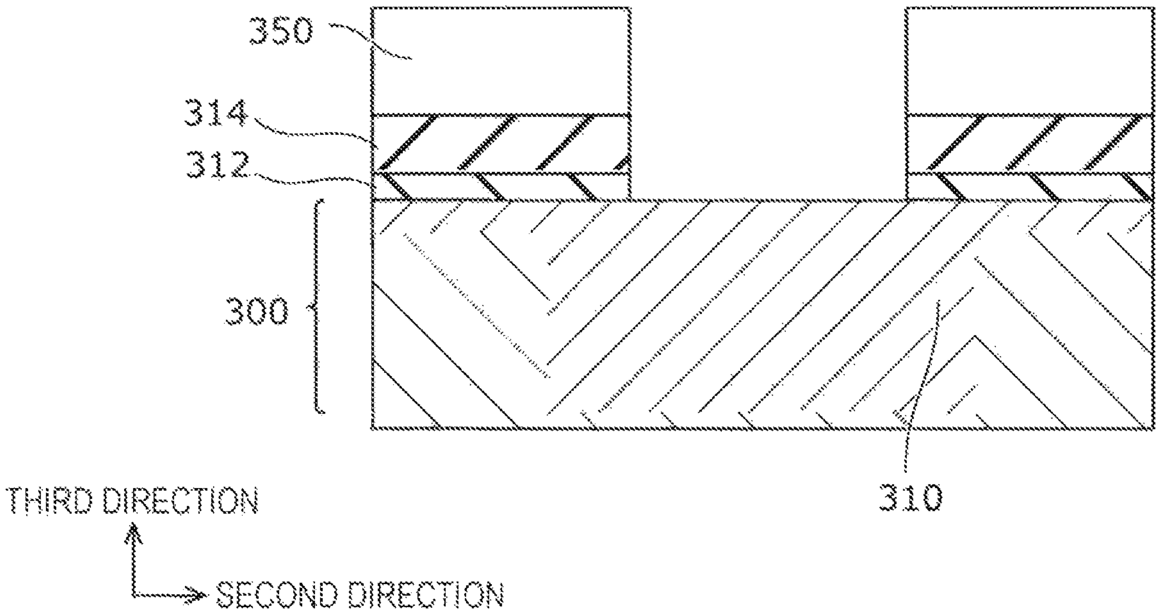

FIG. 137B is a view schematically illustrating a semiconductor process according to an embodiment.

Figure 138A:
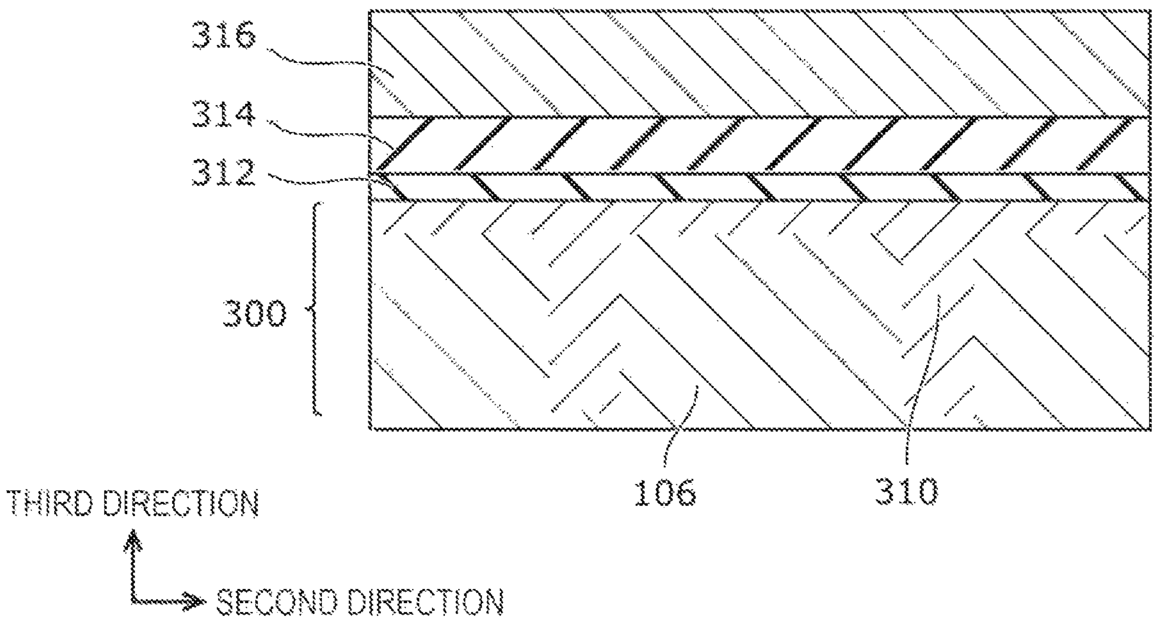

FIG. 138A is a view schematically illustrating a semiconductor process according to an embodiment.

Figure 138B:
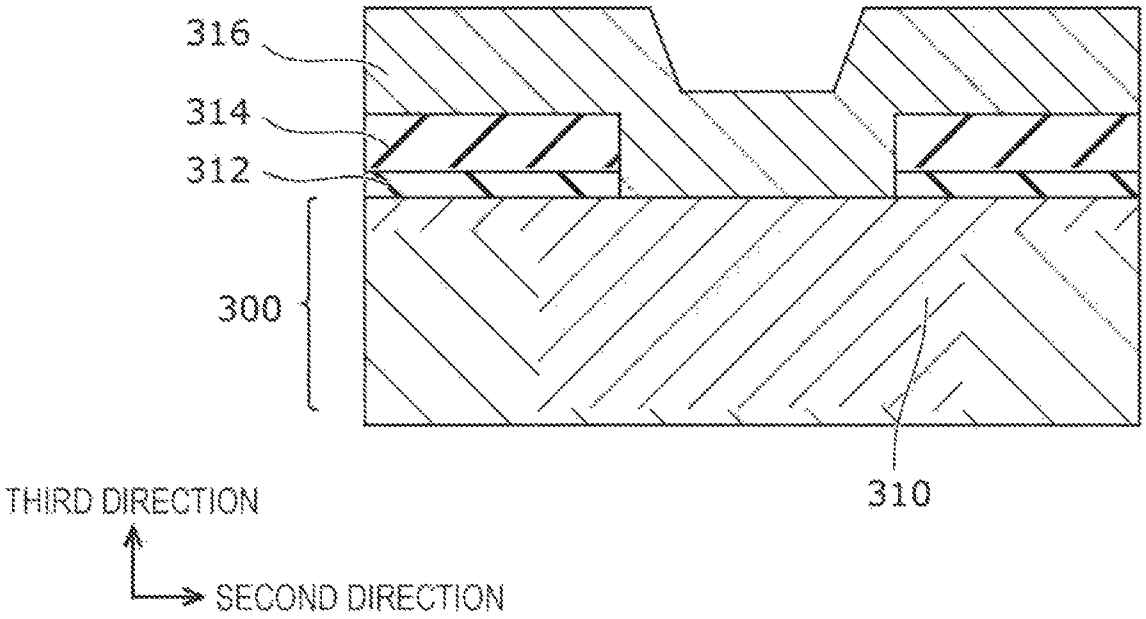

FIG. 138B is a view schematically illustrating a semiconductor process according to an embodiment.

Figure 139A:
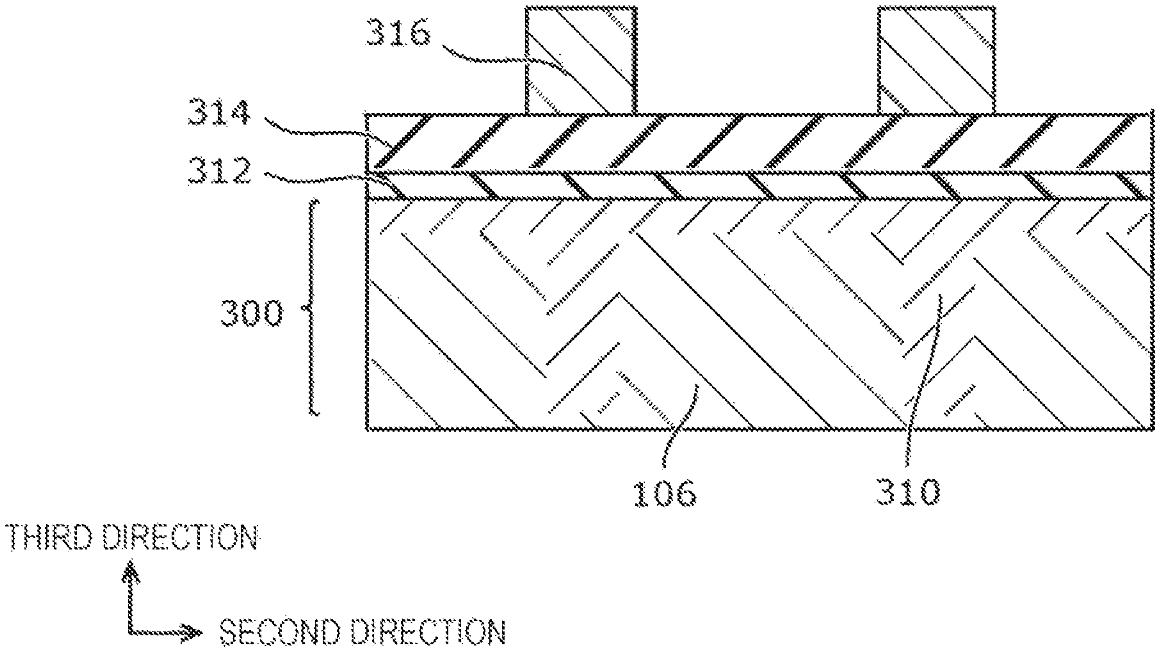

FIG. 139A is a view schematically illustrating a semiconductor process according to an embodiment.

Figure 139B:
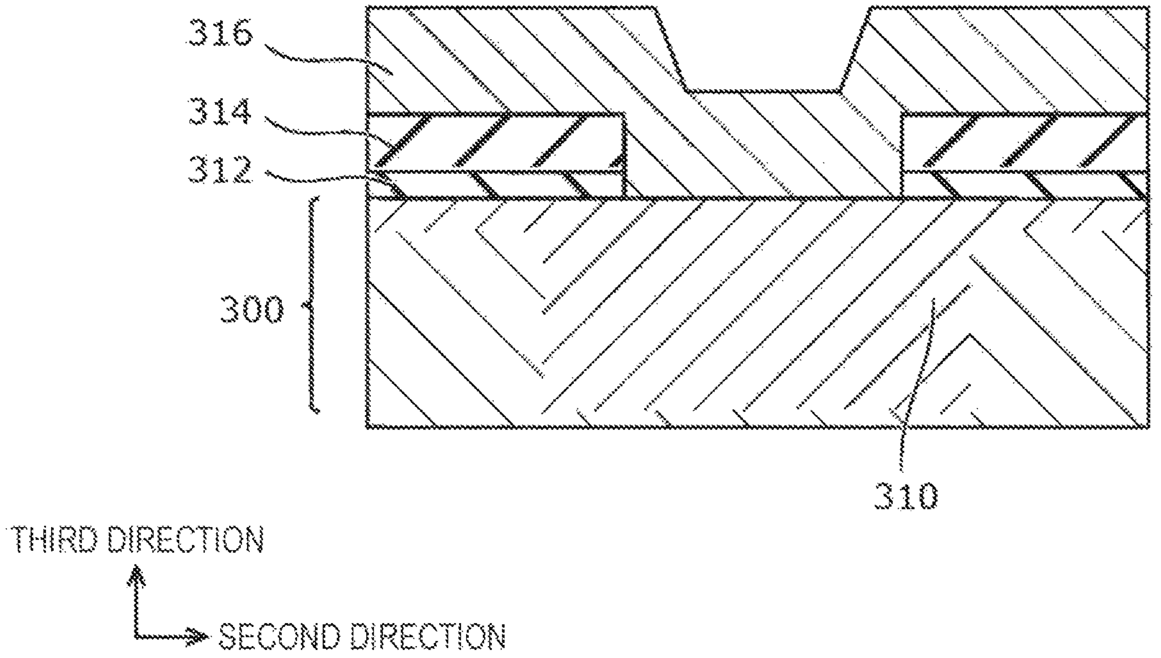

FIG. 139B is a view schematically illustrating a semiconductor process according to an embodiment.

Figure 140:
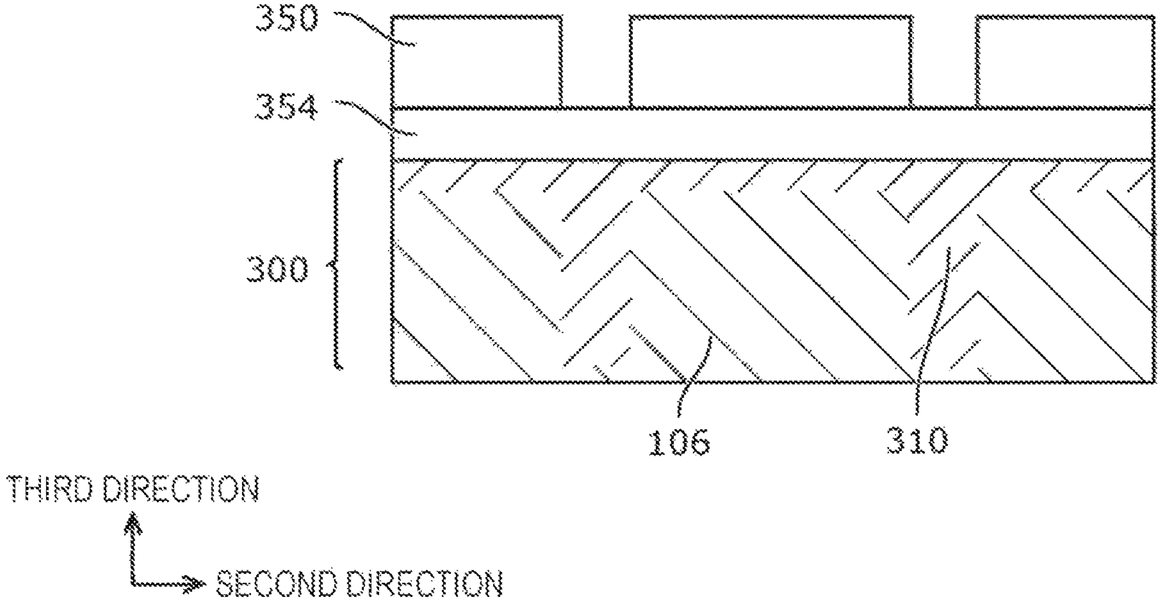

FIG. 140 is a view schematically illustrating a semiconductor process according to an embodiment.

Figure 141:
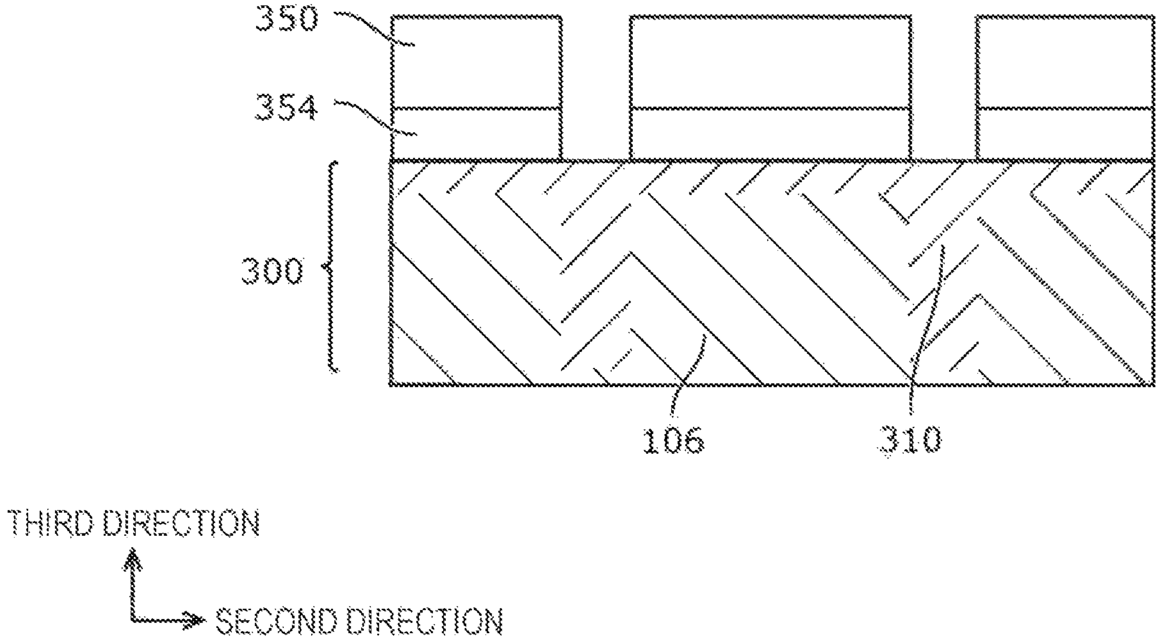

FIG. 141 is a view schematically illustrating a semiconductor process according to an embodiment.

Figure 142:
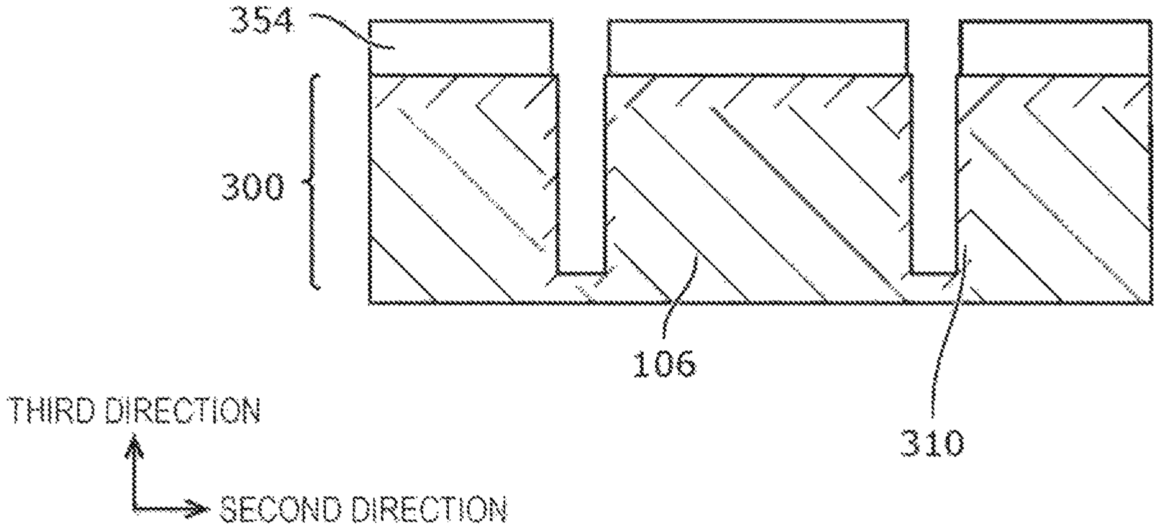

FIG. 142 is a view schematically illustrating a semiconductor process according to an embodiment.

Figure 143:
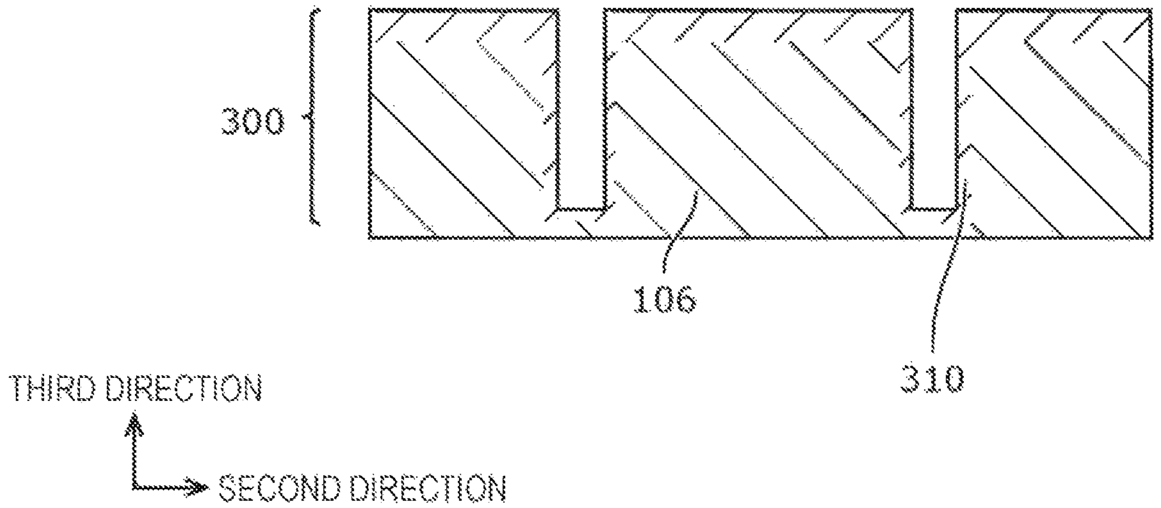

FIG. 143 is a view schematically illustrating a semiconductor process according to an embodiment.

Figure 144:
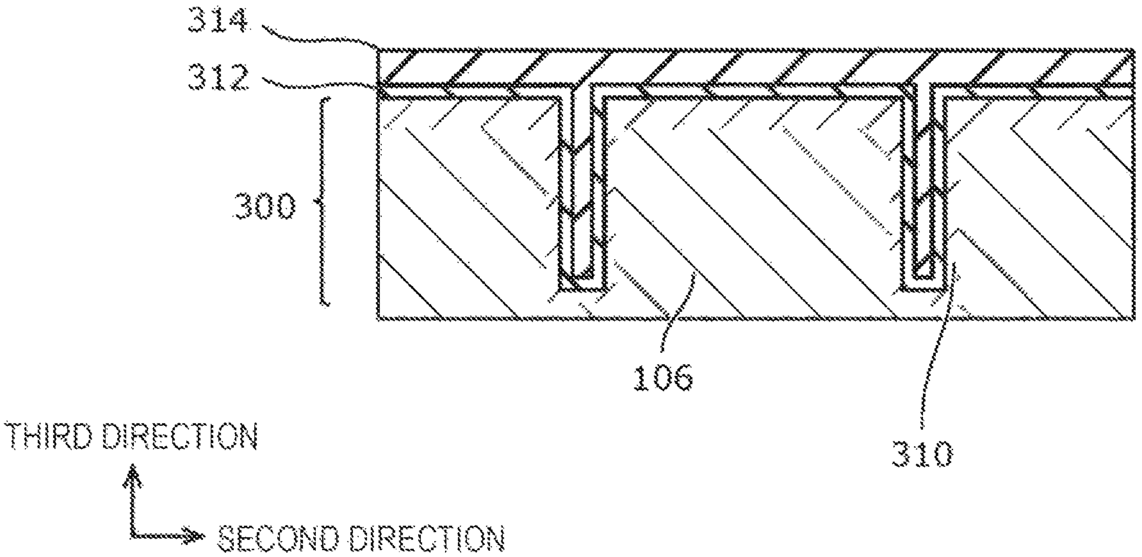

FIG. 144 is a view schematically illustrating a semiconductor process according to an embodiment.

Figure 145:
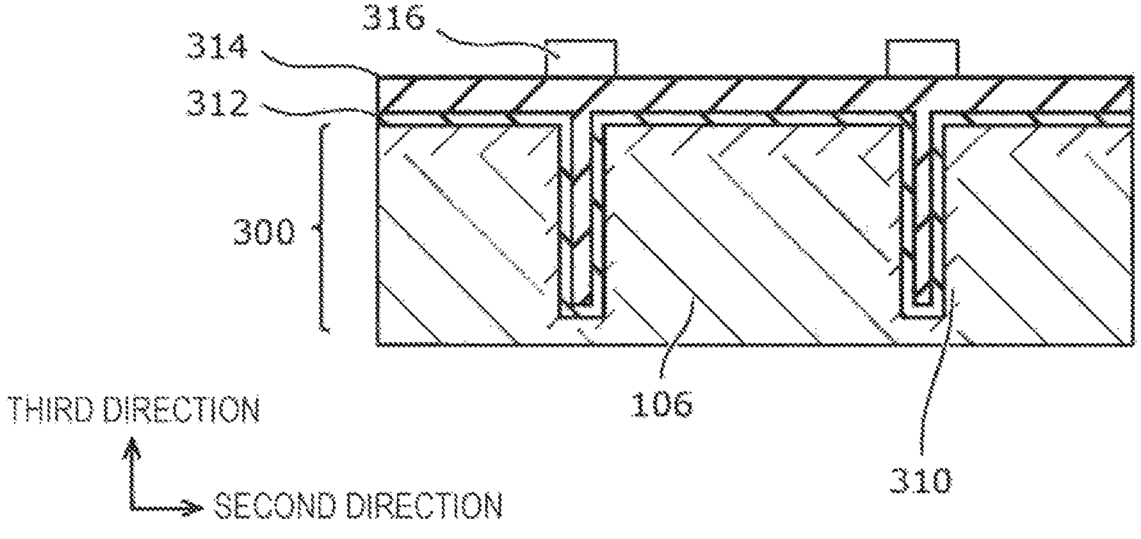

FIG. 145 is a view schematically illustrating a semiconductor process according to an embodiment.

Figure 146:
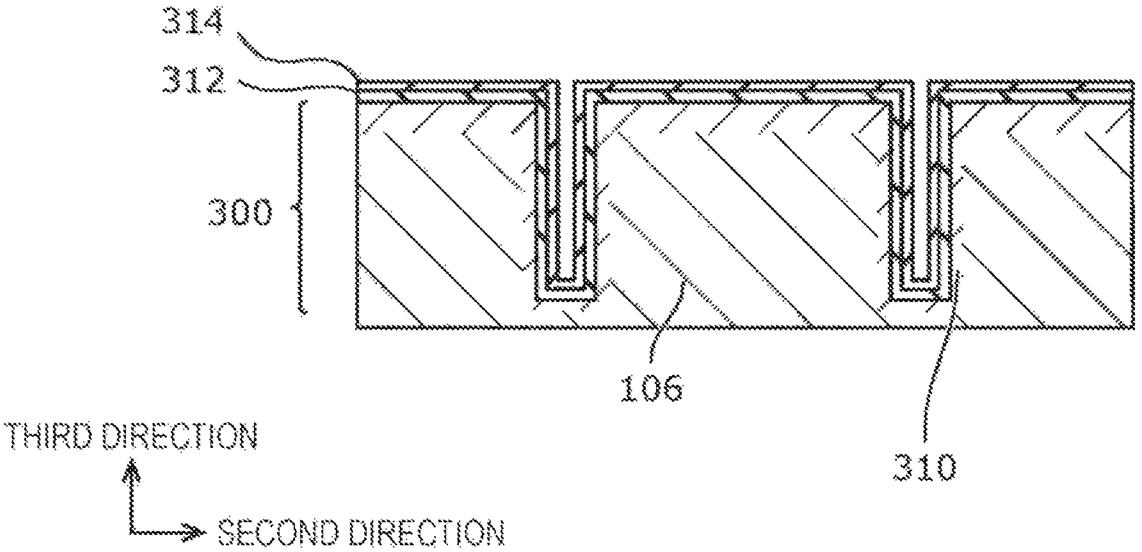

FIG. 146 is a view schematically illustrating a semiconductor process according to an embodiment.

Figure 147:
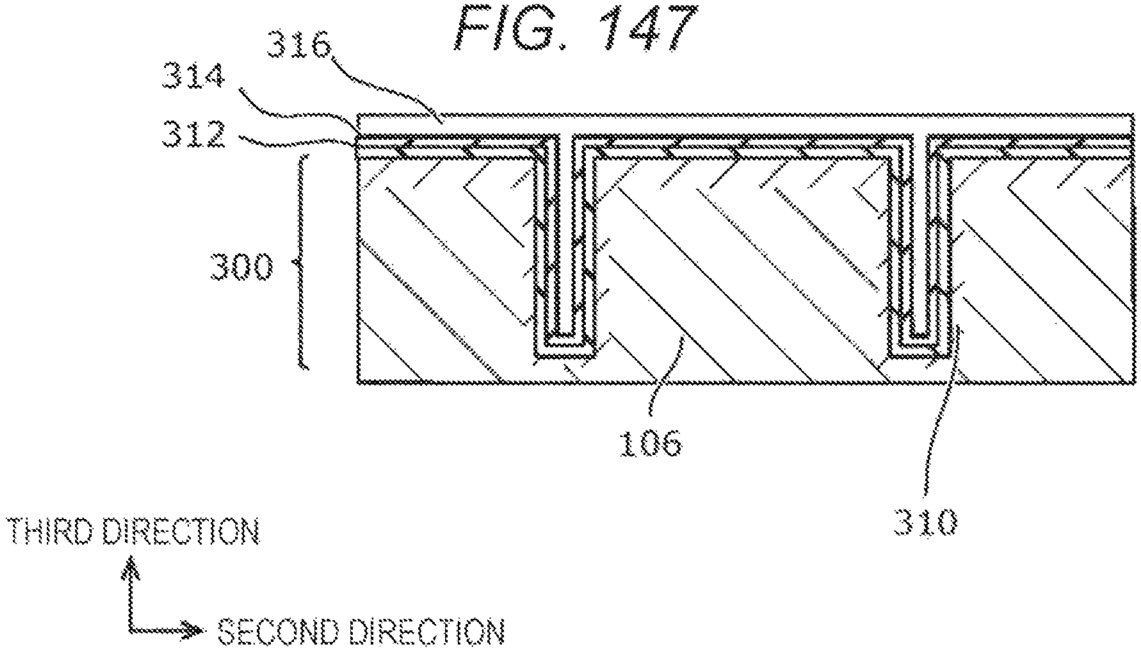

FIG. 147 is a view schematically illustrating a semiconductor process according to an embodiment.

Figure 148:
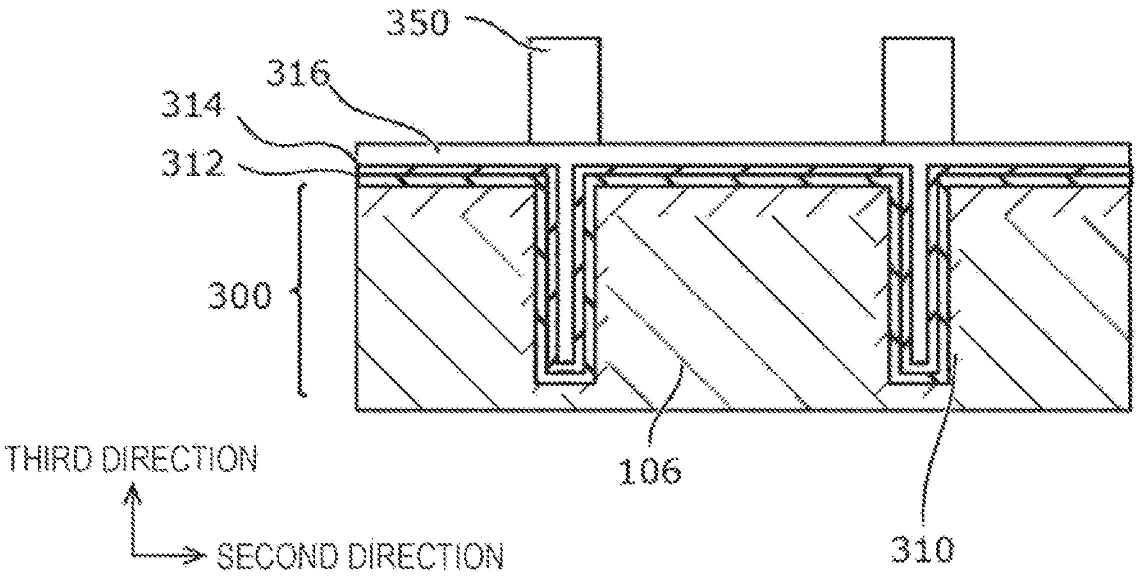

FIG. 148 is a view schematically illustrating a semiconductor process according to an embodiment.

Figure 149:
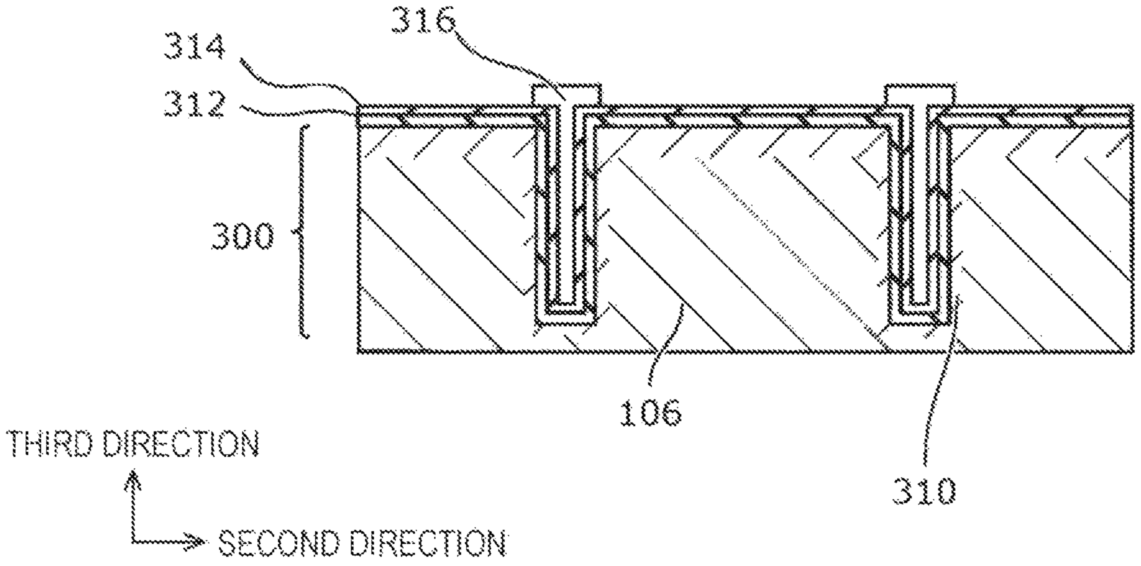

FIG. 149 is a view schematically illustrating a semiconductor process according to an embodiment.

Figure 150:
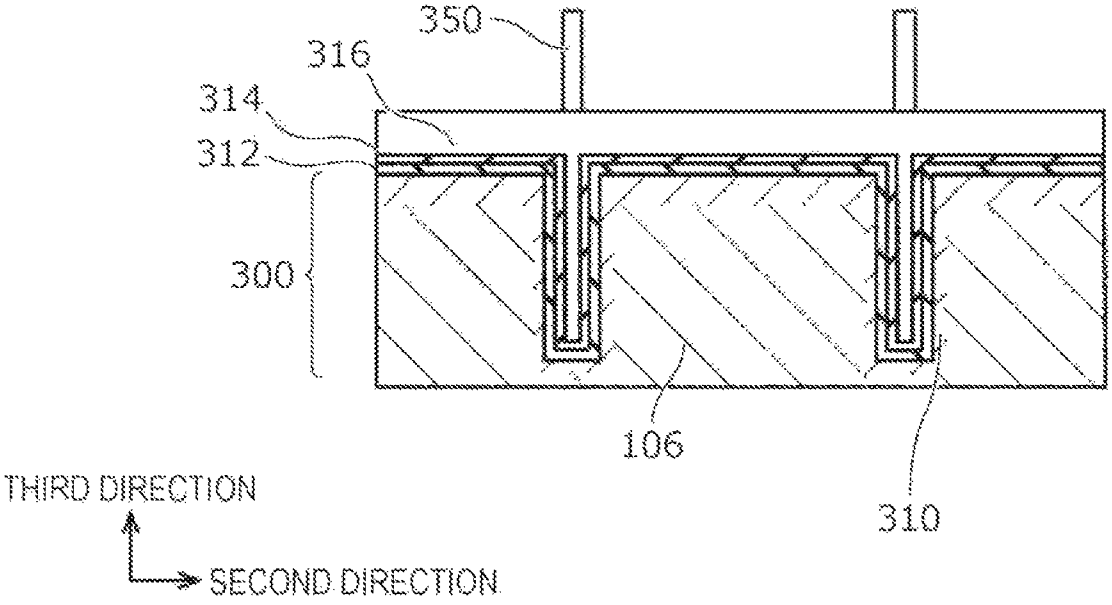

FIG. 150 is a view schematically illustrating a semiconductor process according to an embodiment.

Figure 151:
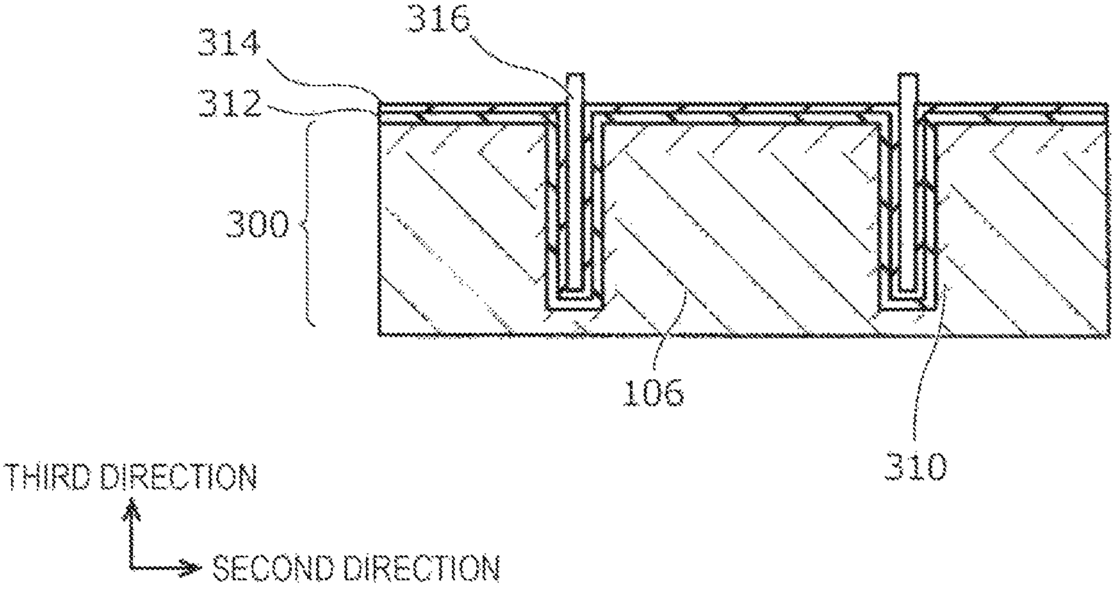

FIG. 151 is a view schematically illustrating a semiconductor process according to an embodiment.

Figure 152:
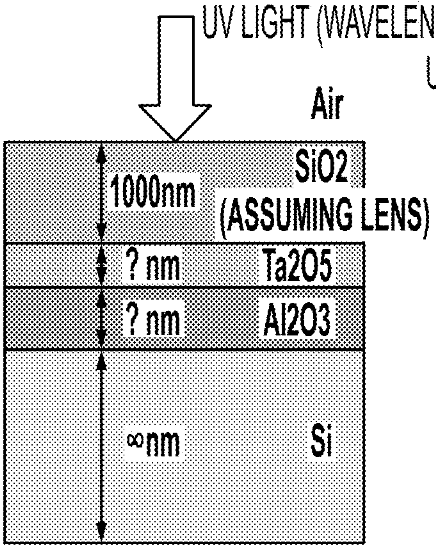
Figure 152:
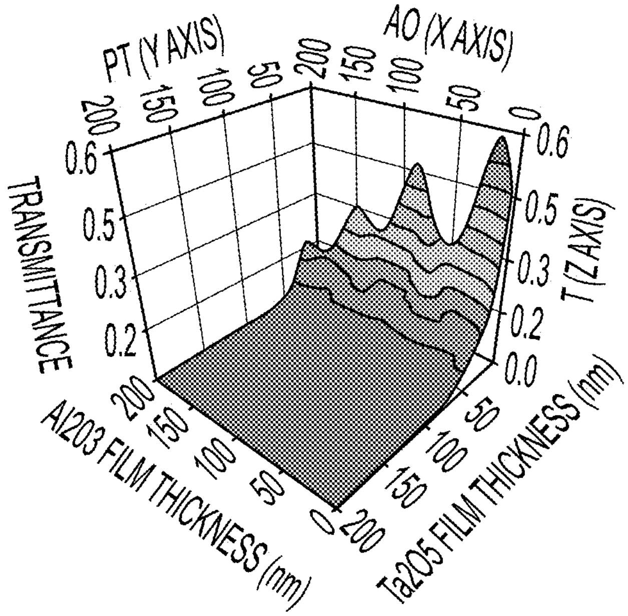
Figure 152:
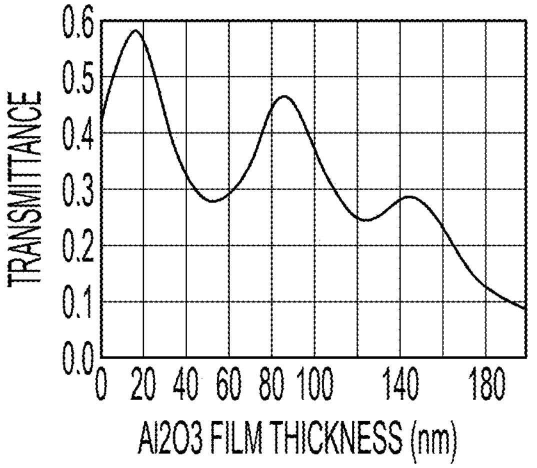
Figure 152:
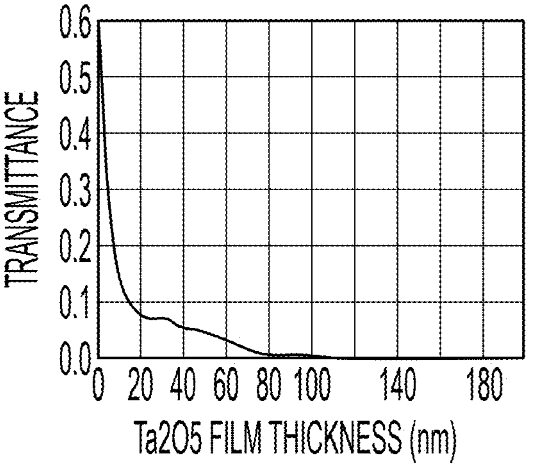

FIG. 152 is diagrams and graphs illustrating characteristics of a material according to an embodiment with respect to ultraviolet light.

Figure 153A:
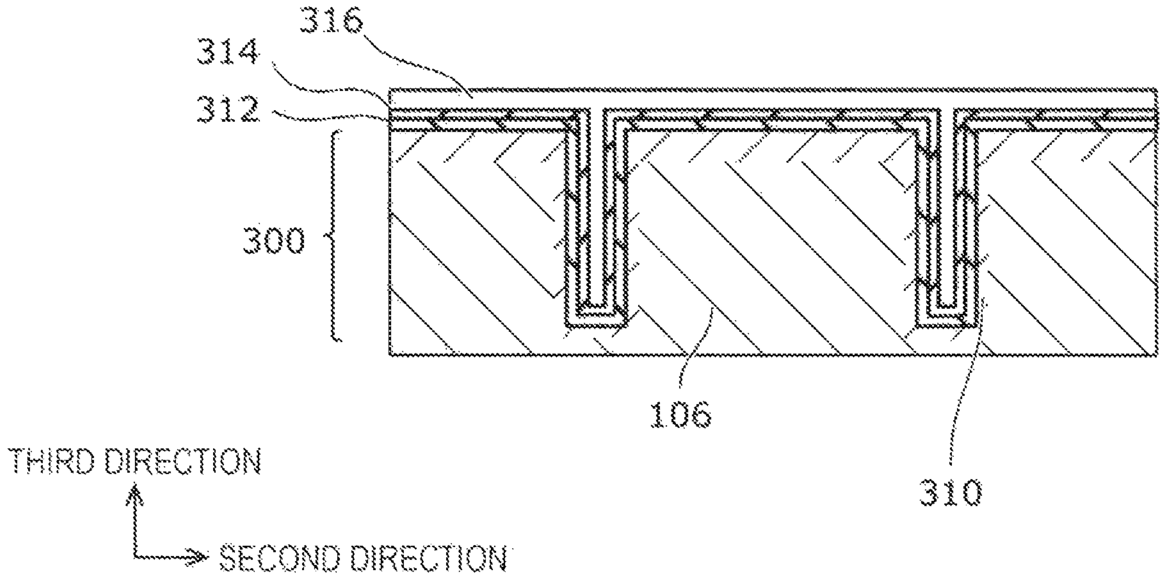

FIG. 153A is a view schematically illustrating a semiconductor process according to an embodiment.

Figure 153B:
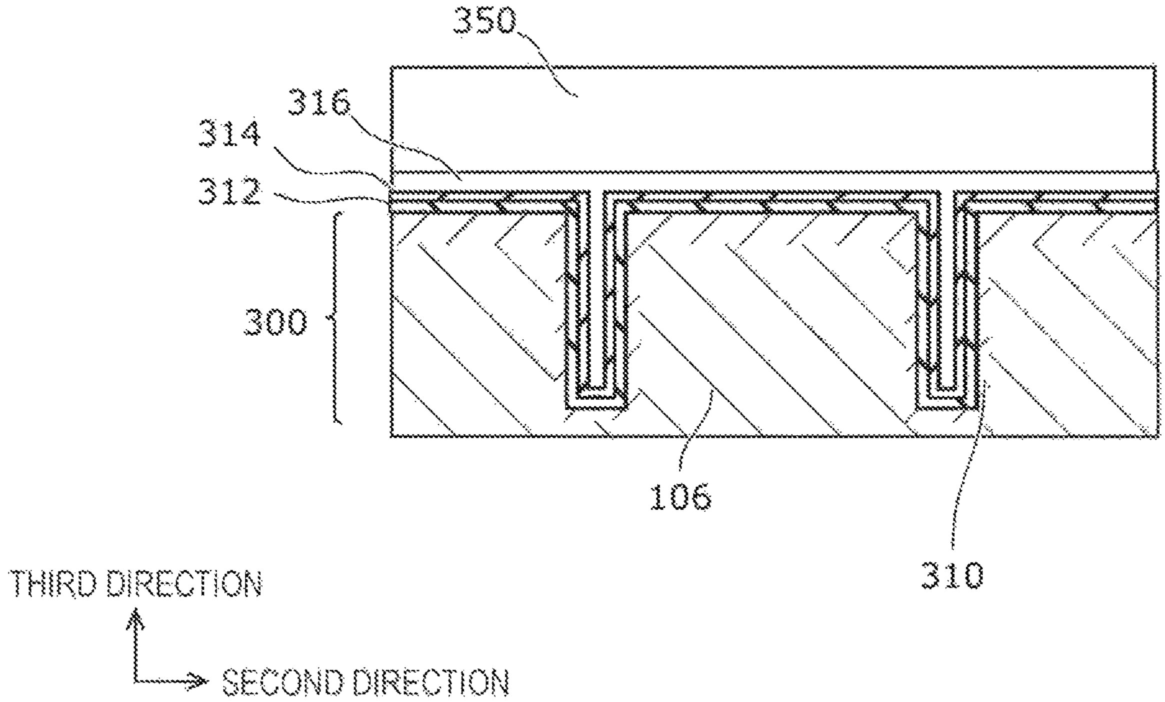

FIG. 153B is a view schematically illustrating a semiconductor process according to an embodiment.

Figure 153C:
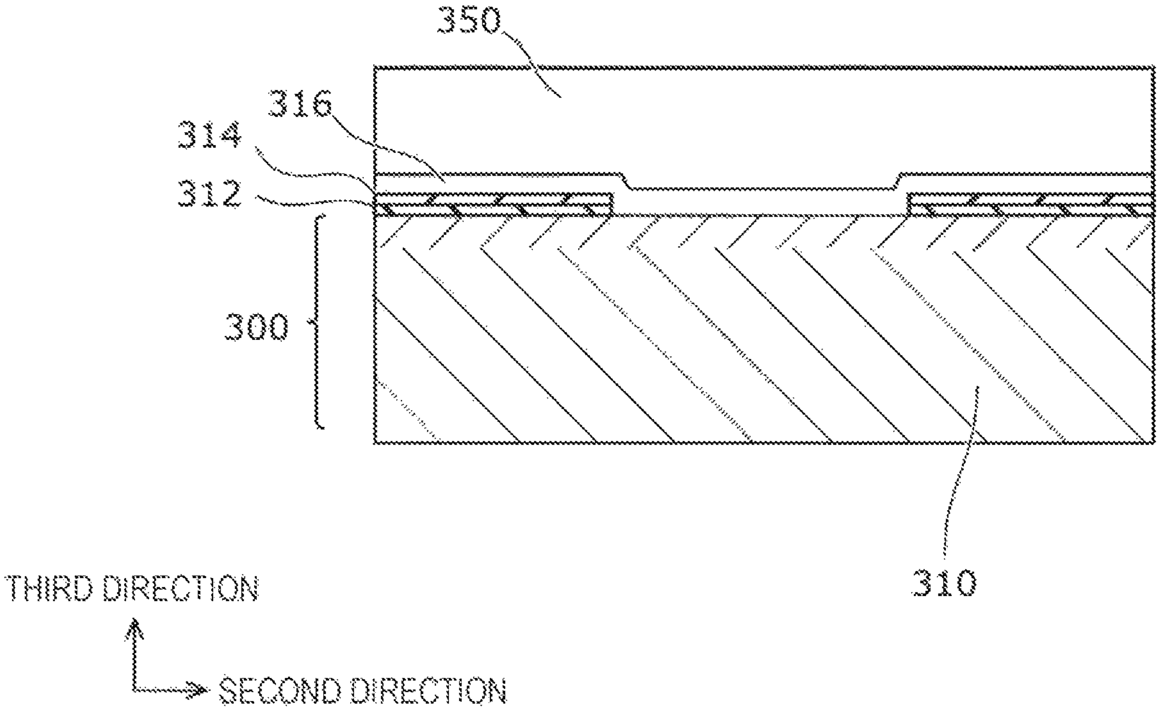

FIG. 153C is a view schematically illustrating a semiconductor process according to an embodiment.

Figure 154A:
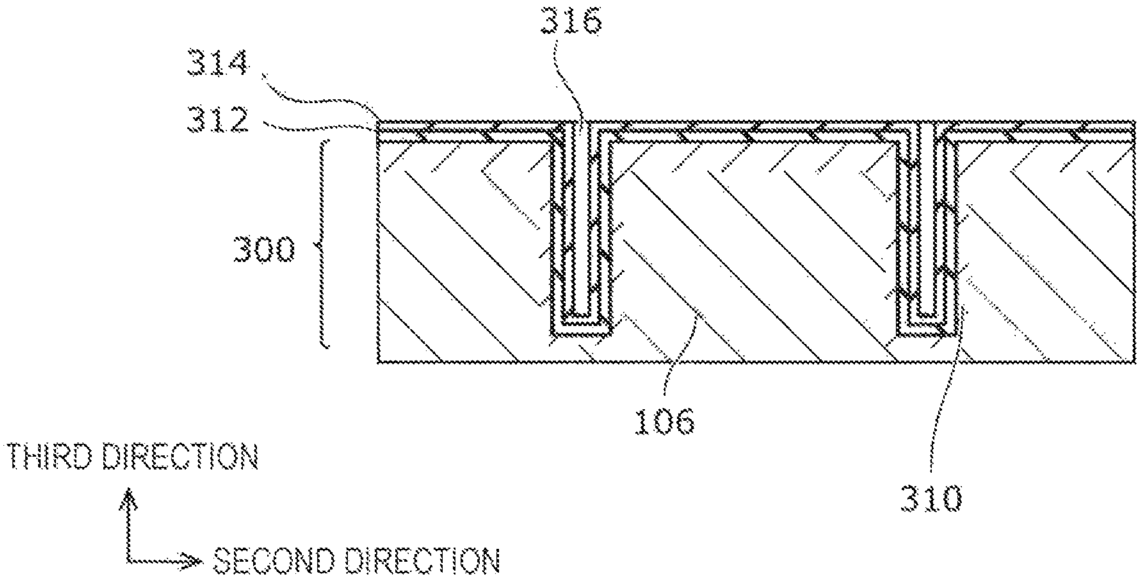

FIG. 154A is a view schematically illustrating a semiconductor process according to an embodiment.

Figure 154B:
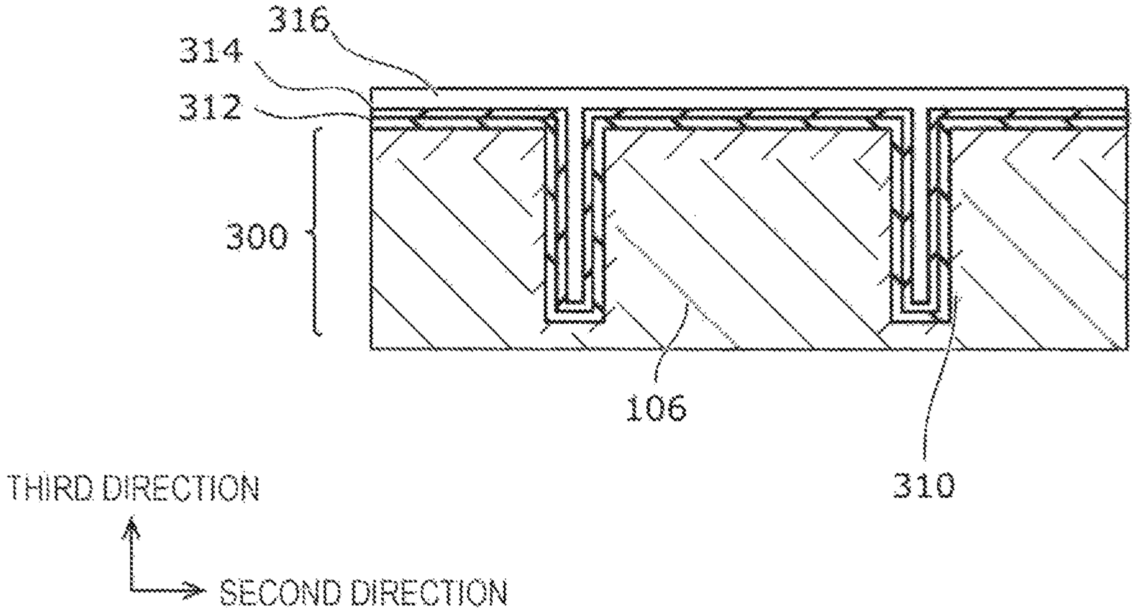

FIG. 154B is a view schematically illustrating a semiconductor process according to an embodiment.

Figure 154C:
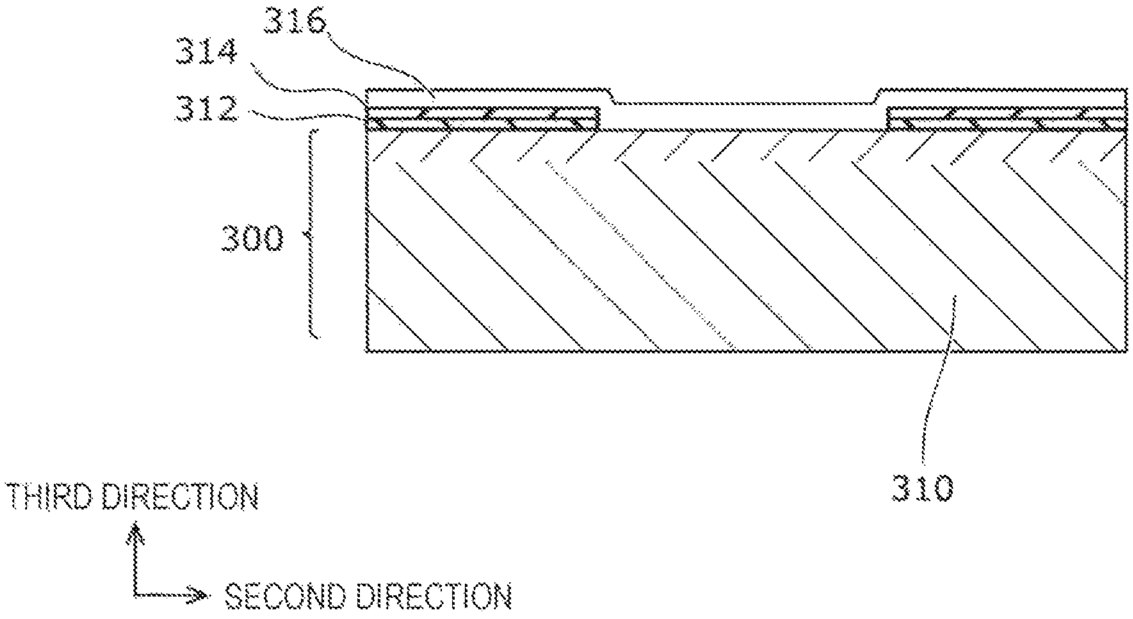

FIG. 154C is a view schematically illustrating a semiconductor process according to an embodiment.

Figure 155:
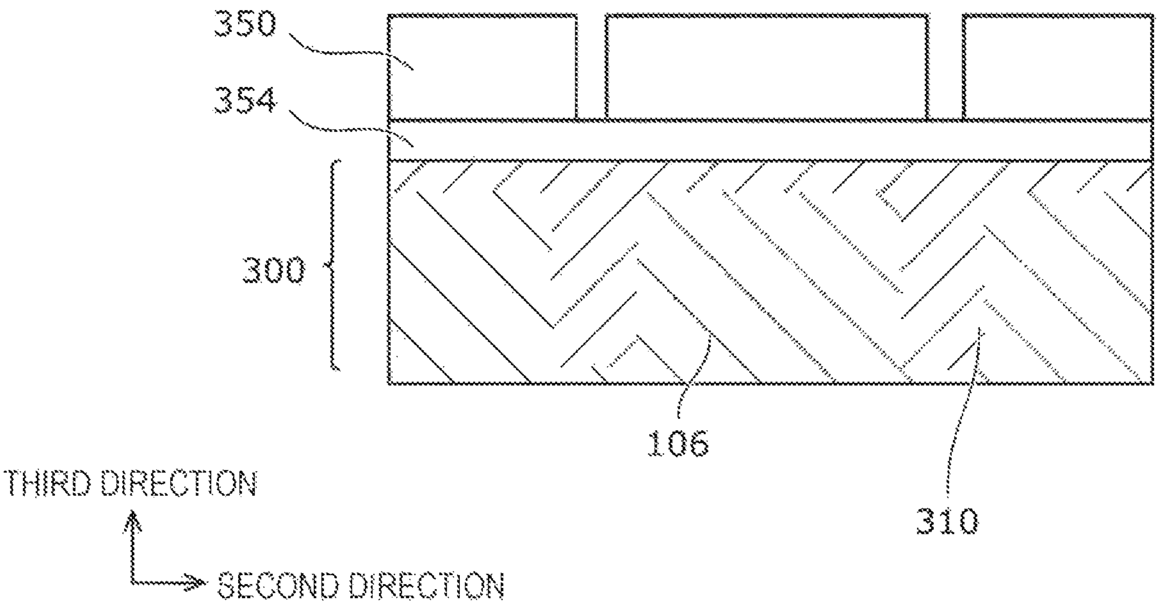

FIG. 155 is a view schematically illustrating a semiconductor process according to an embodiment.

Figure 156:
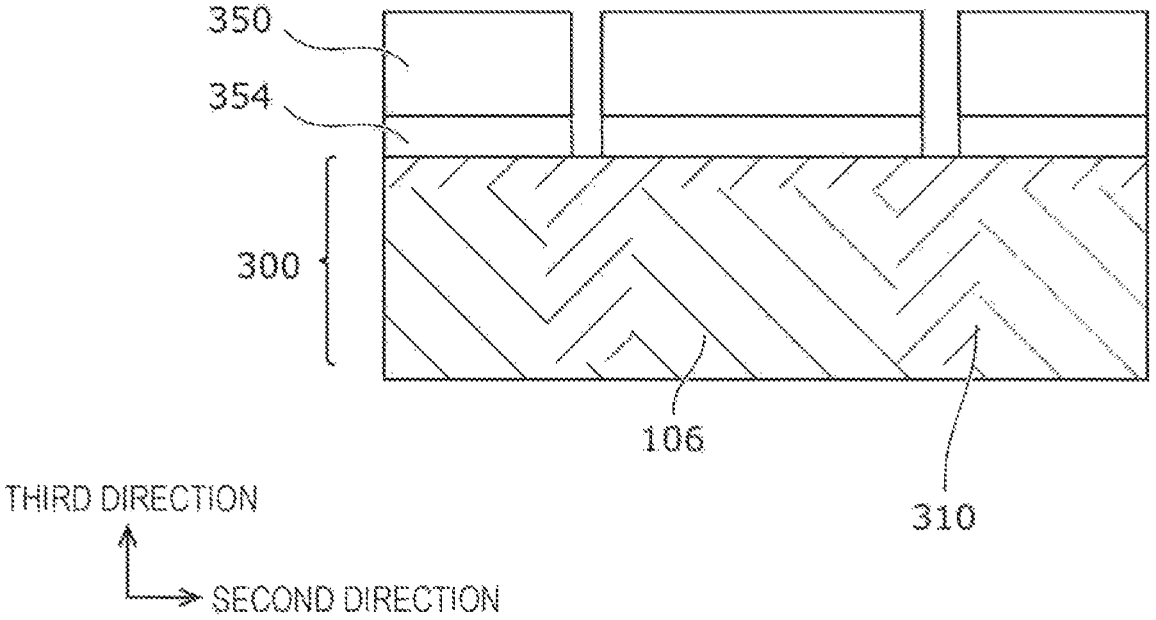

FIG. 156 is a view schematically illustrating a semiconductor process according to an embodiment.

Figure 157:
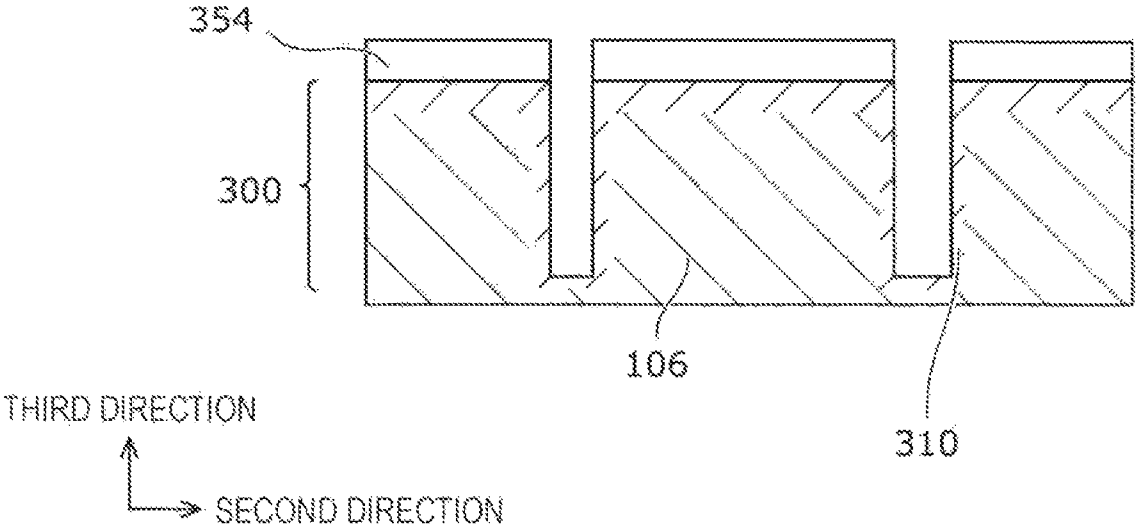

FIG. 157 is a view schematically illustrating a semiconductor process according to an embodiment.

Figure 158:
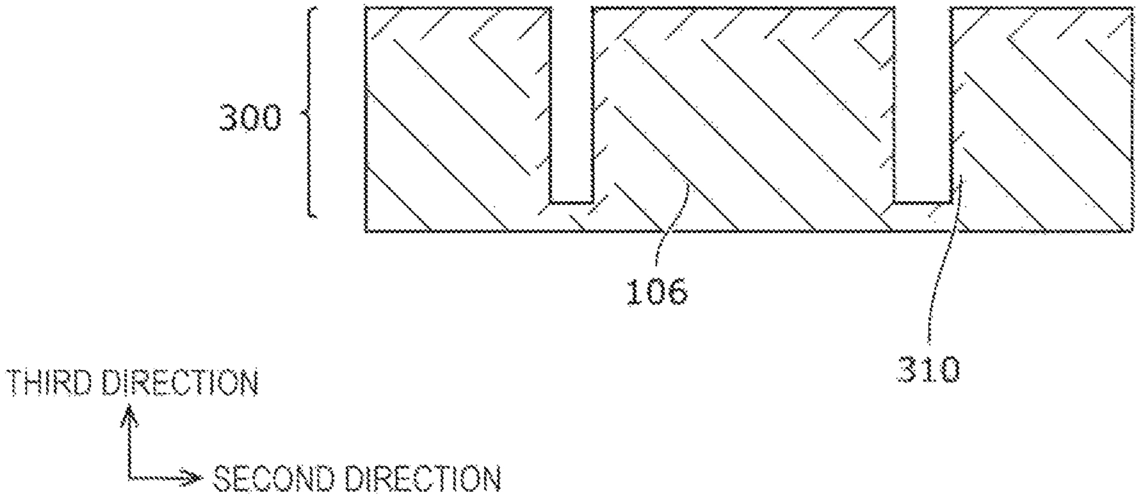

FIG. 158 is a view schematically illustrating a semiconductor process according to an embodiment.

Figure 159:
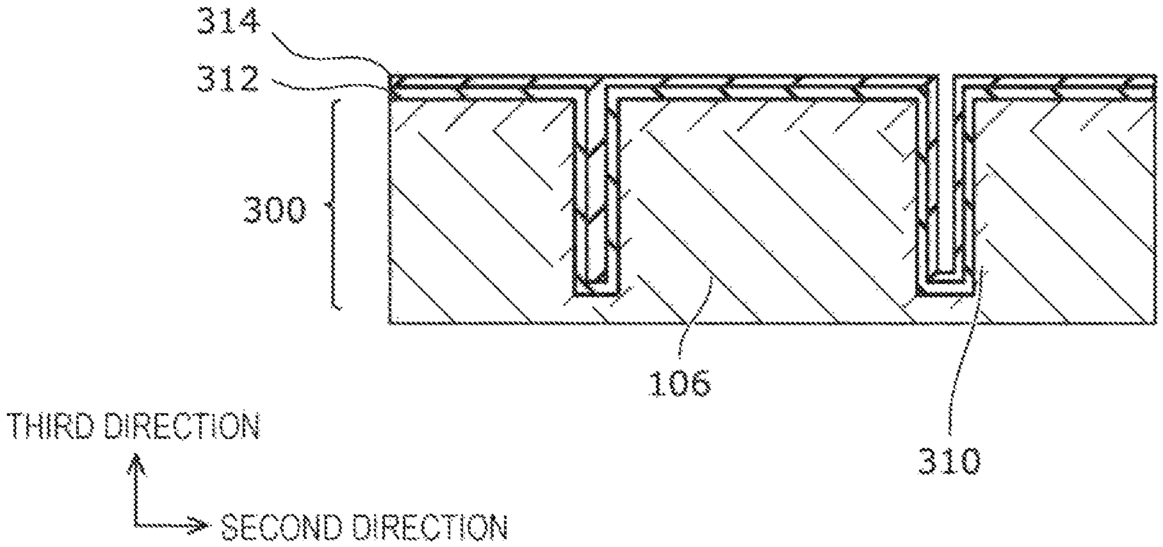

FIG. 159 is a view schematically illustrating a semiconductor process according to an embodiment.

Figure 160:
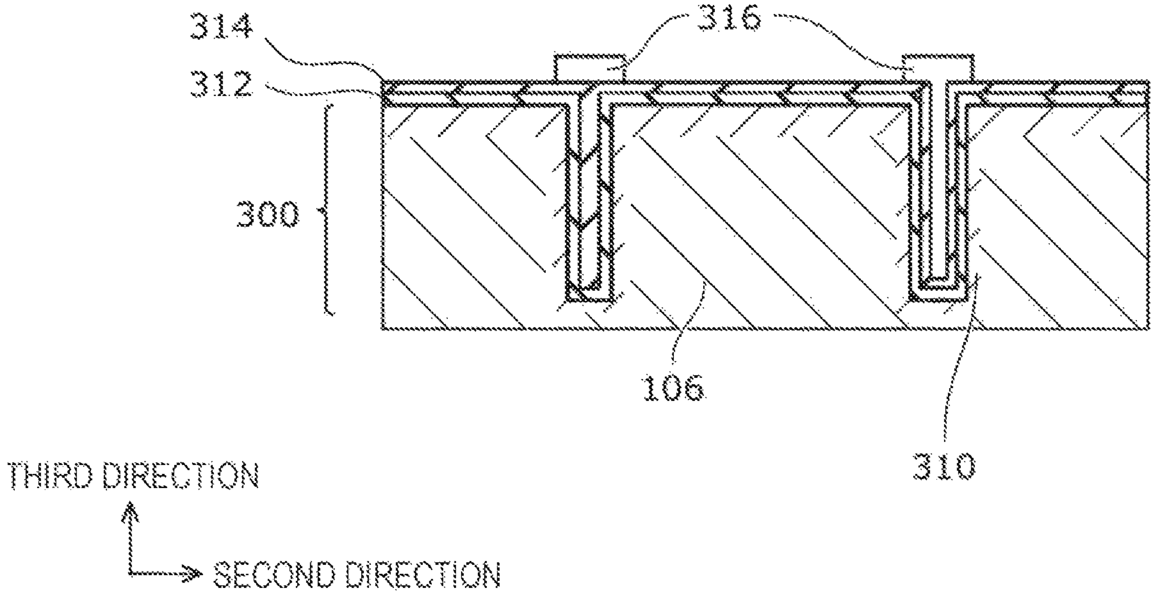

FIG. 160 is a view schematically illustrating a semiconductor process according to an embodiment.

Figure 161:
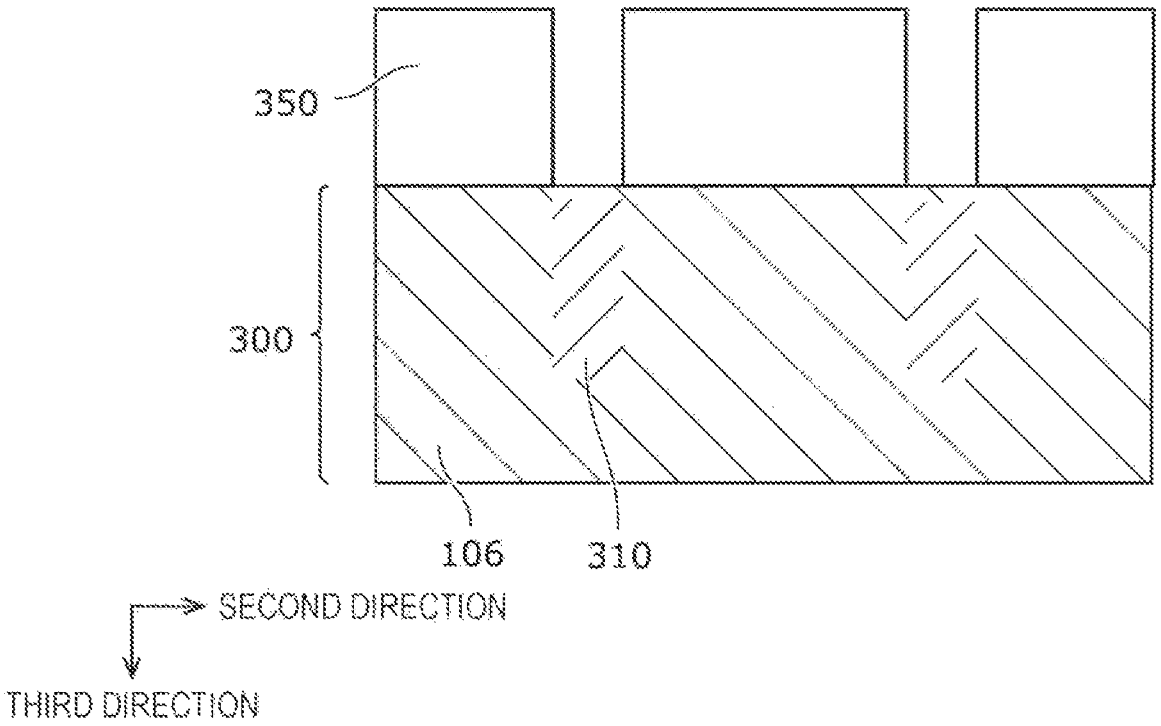

FIG. 161 is a view schematically illustrating a semiconductor process according to an embodiment.

Figure 162:
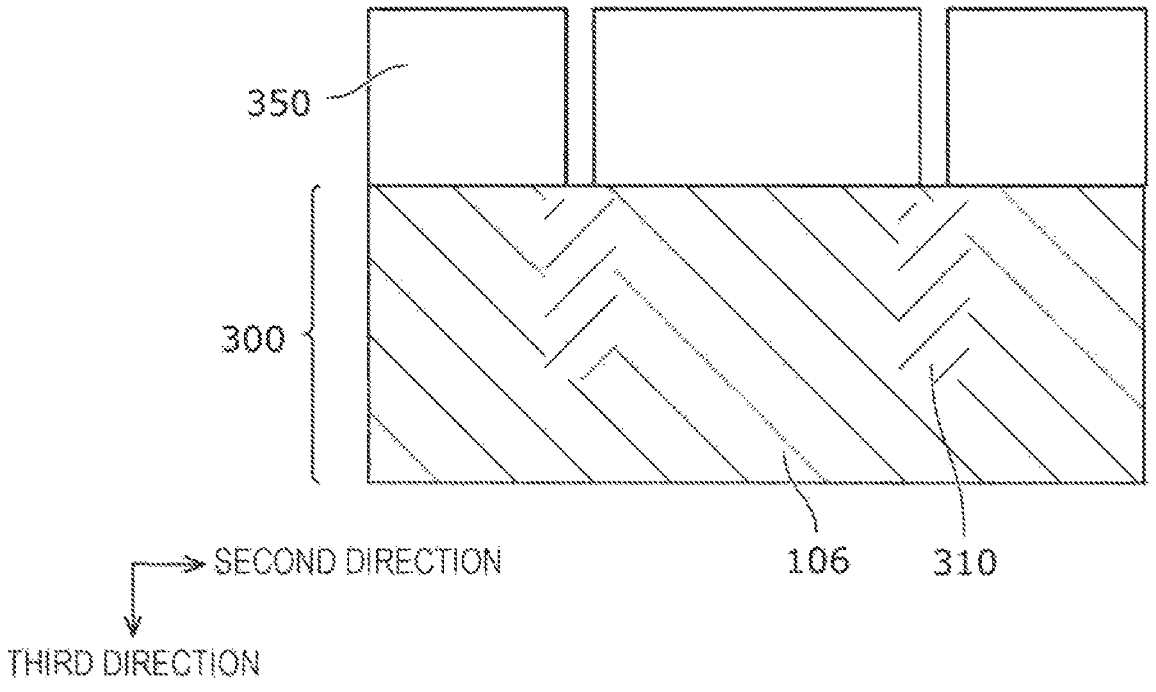

FIG. 162 is a view schematically illustrating a semiconductor process according to an embodiment.

Figure 163:
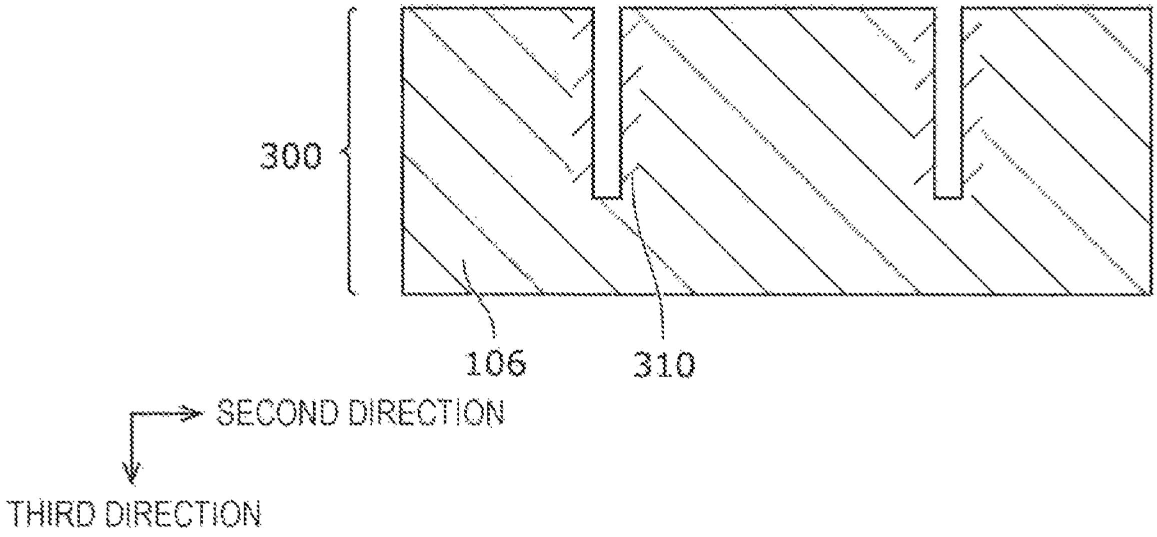

FIG. 163 is a view schematically illustrating a semiconductor process according to an embodiment.

Figure 164:
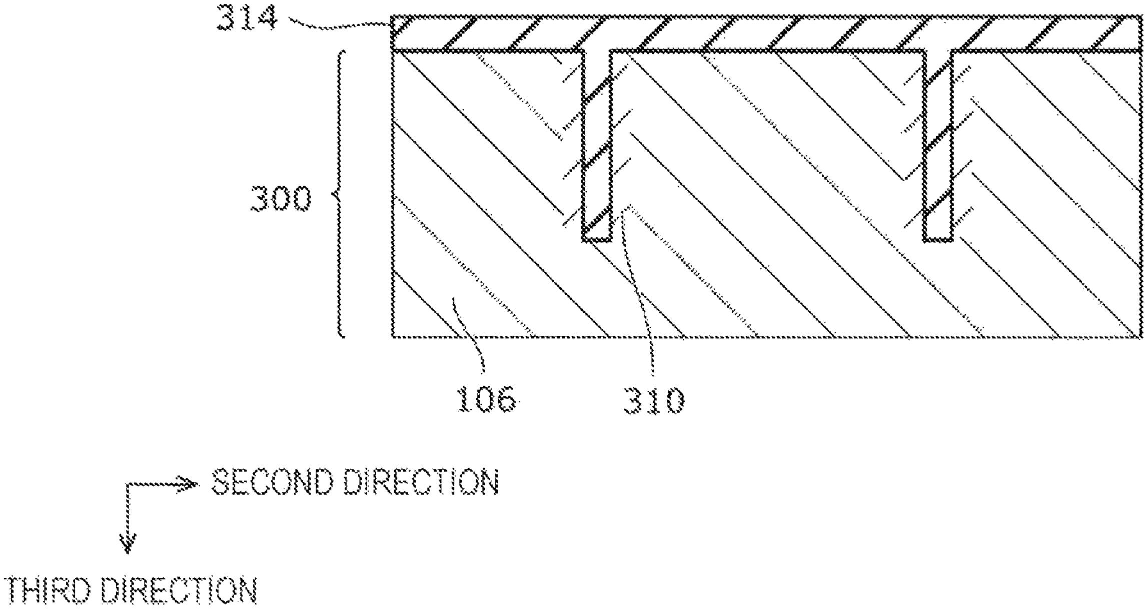

FIG. 164 is a view schematically illustrating a semiconductor process according to an embodiment.

Figure 165:
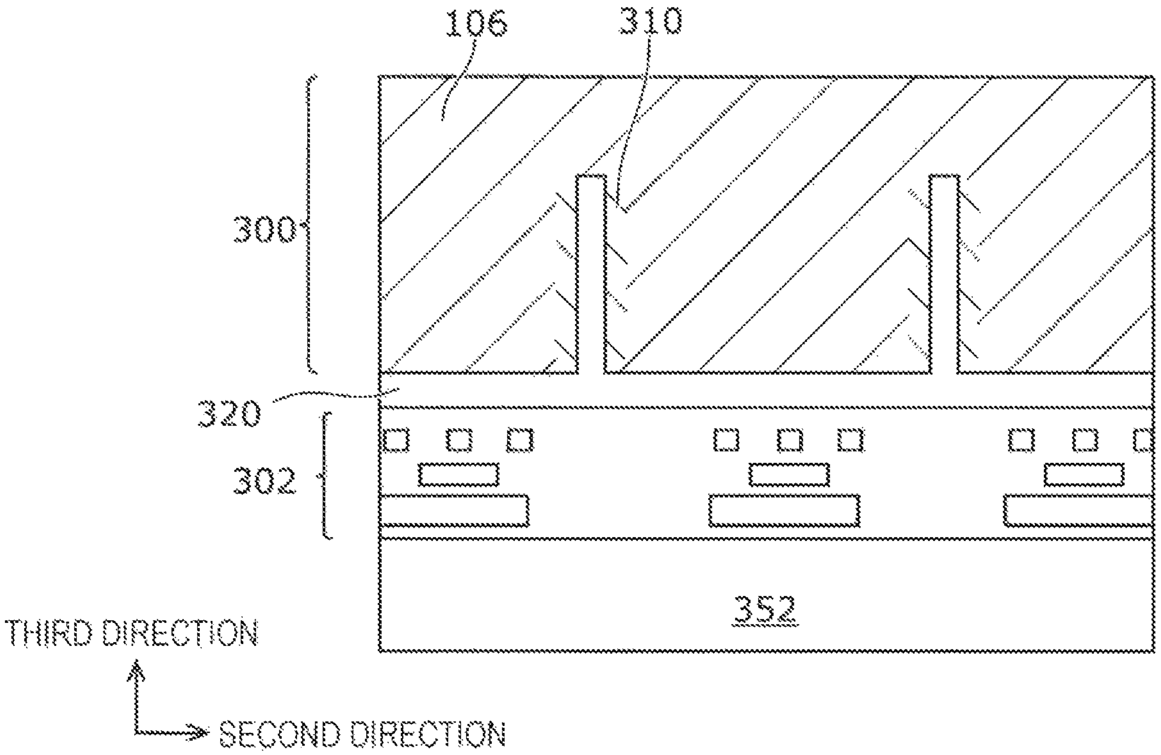

FIG. 165 is a view schematically illustrating a semiconductor process according to an embodiment.

Figure 166:
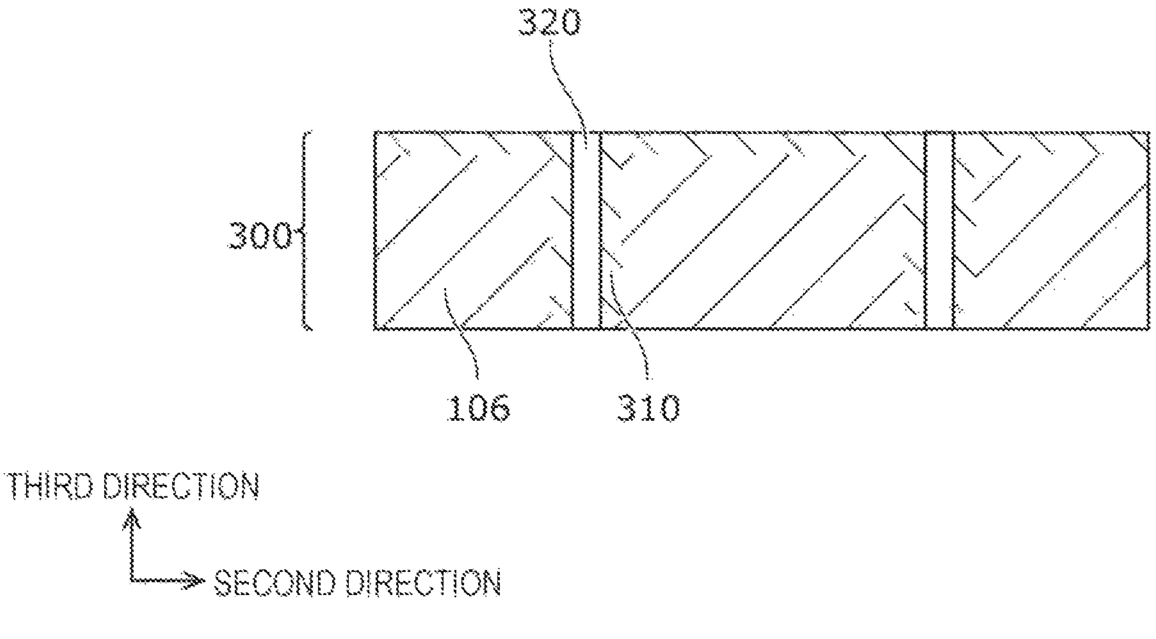

FIG. 166 is a view schematically illustrating a semiconductor process according to an embodiment.

Figure 167:
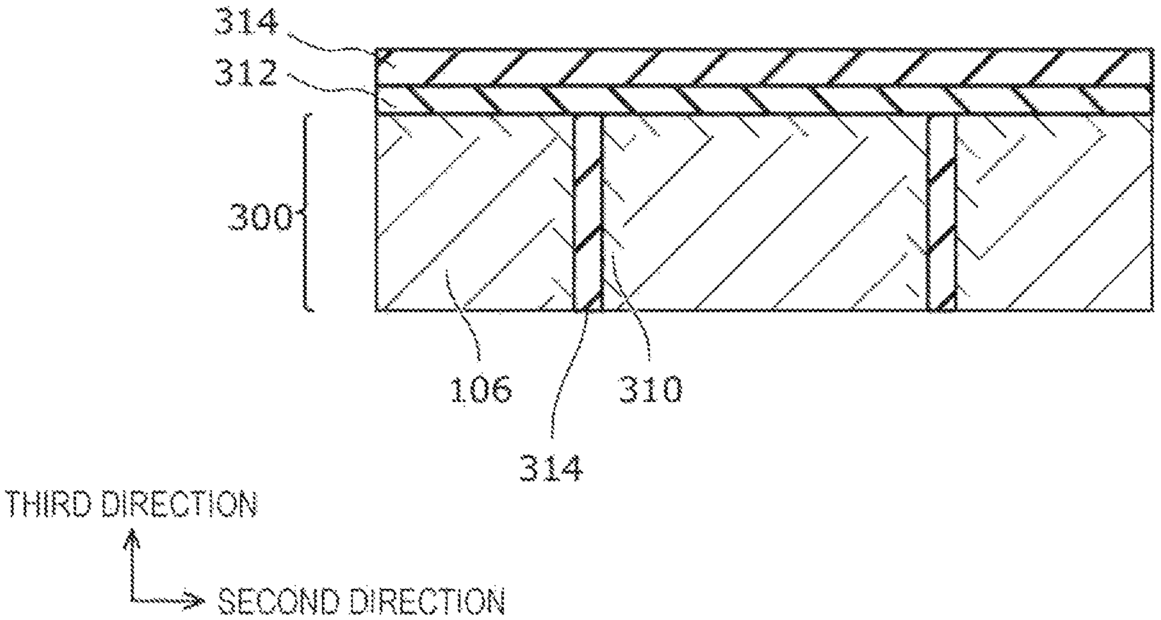

FIG. 167 is a view schematically illustrating a semiconductor process according to an embodiment.

Figure 168:
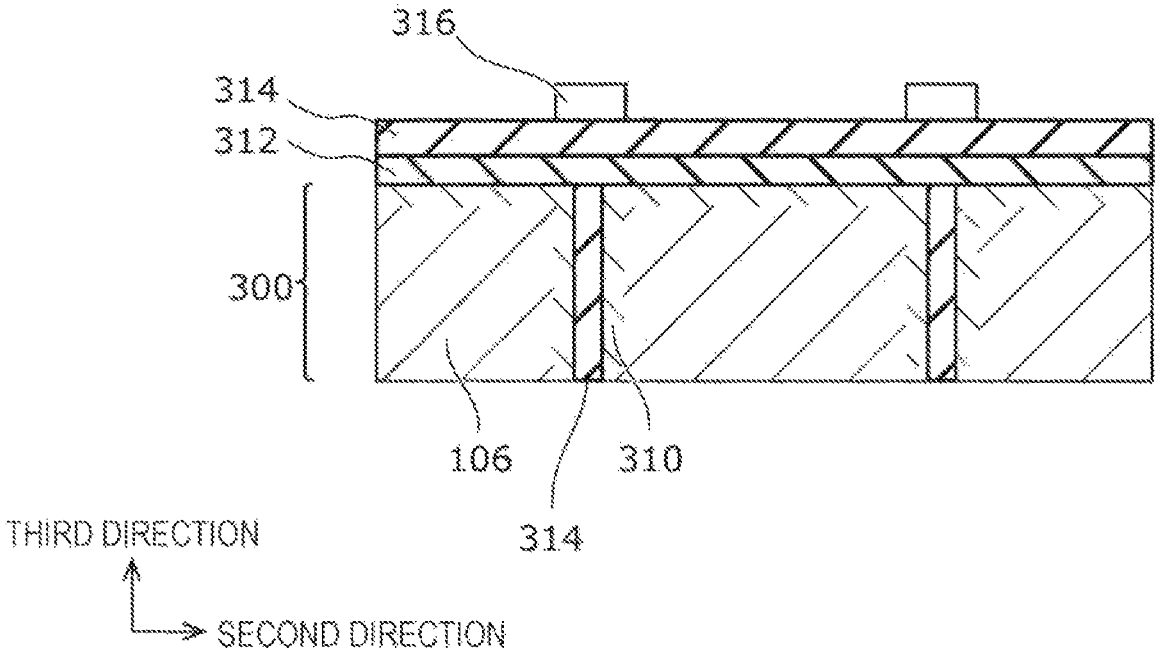

FIG. 168 is a view schematically illustrating a semiconductor process according to an embodiment.

Figure 169:
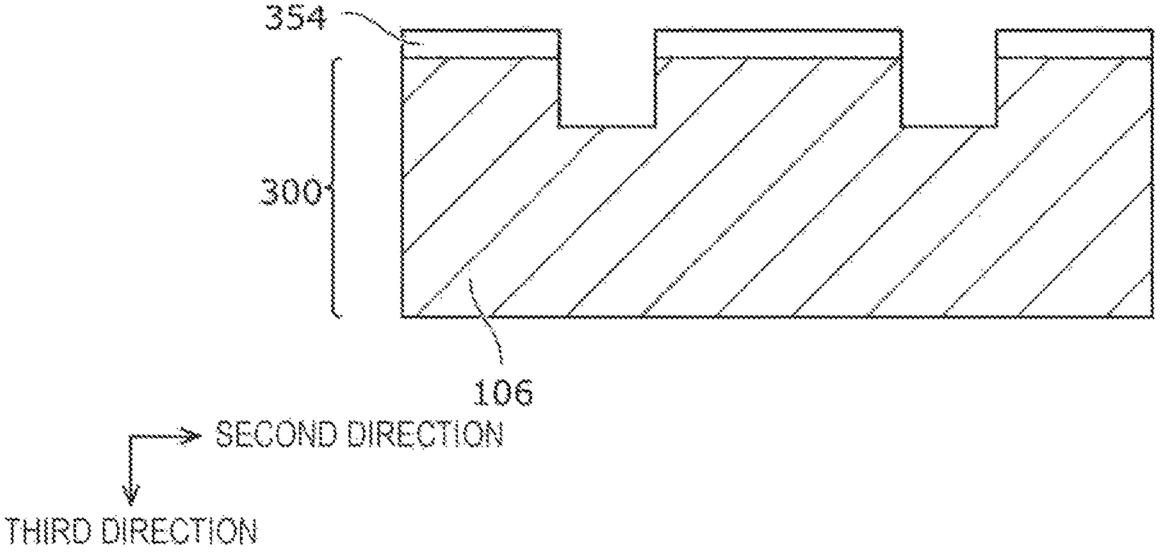

FIG. 169 is a view schematically illustrating a semiconductor process according to an embodiment.

Figure 170:
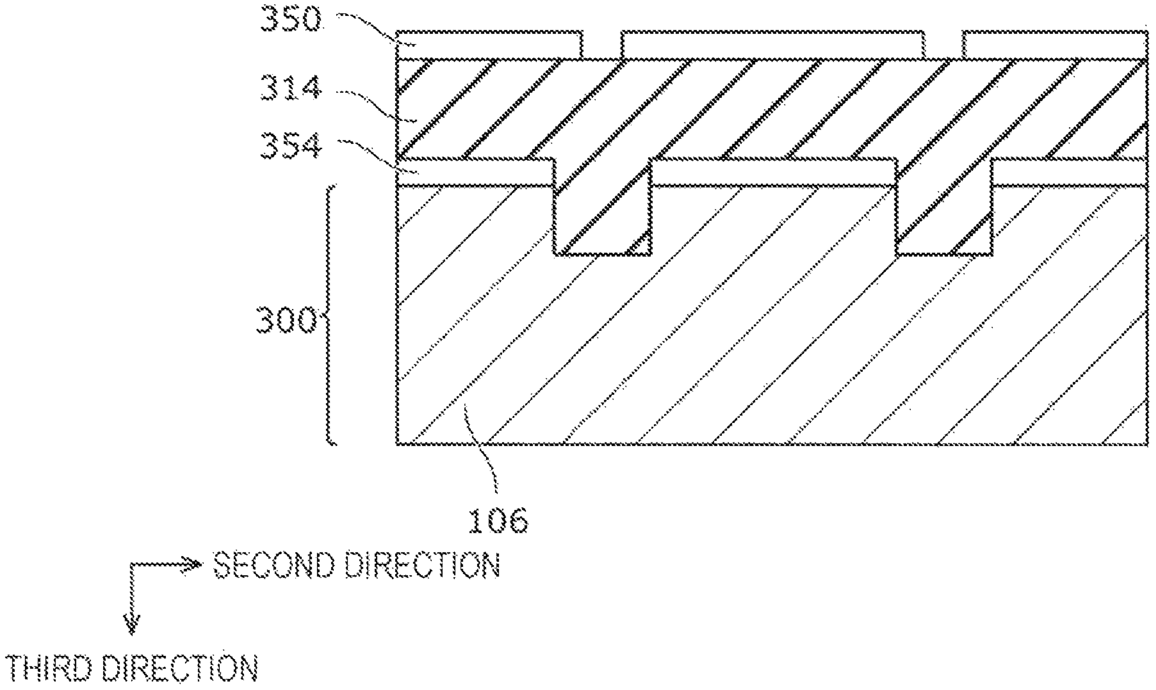

FIG. 170 is a view schematically illustrating a semiconductor process according to an embodiment.

Figure 171:
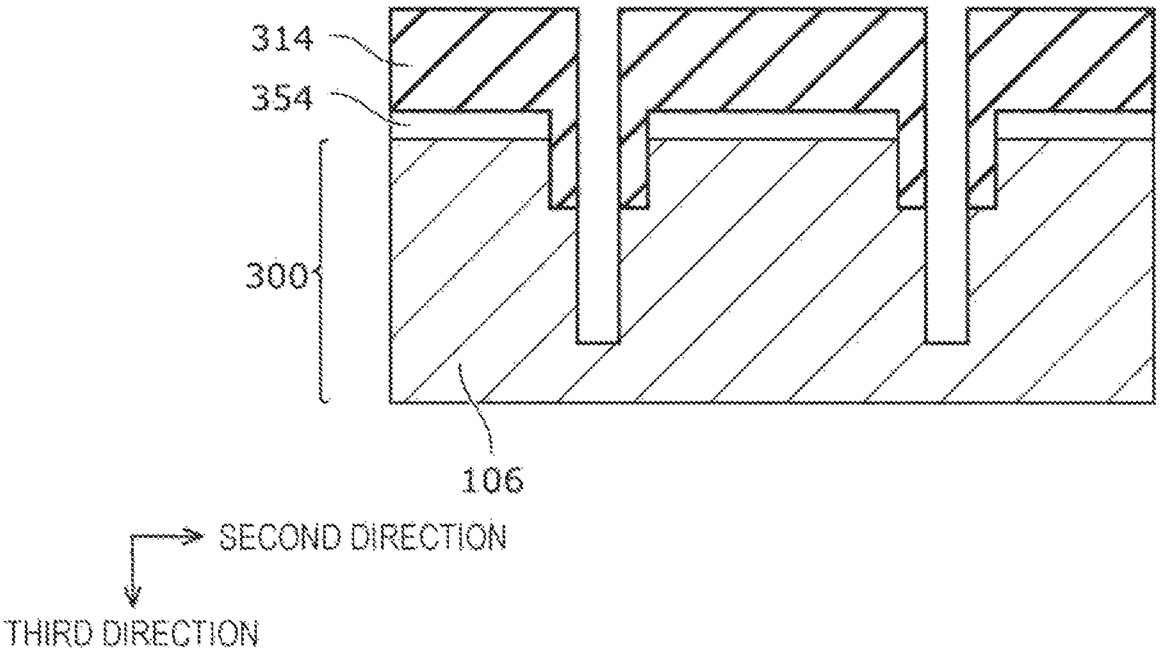

FIG. 171 is a view schematically illustrating a semiconductor process according to an embodiment.

Figure 172:
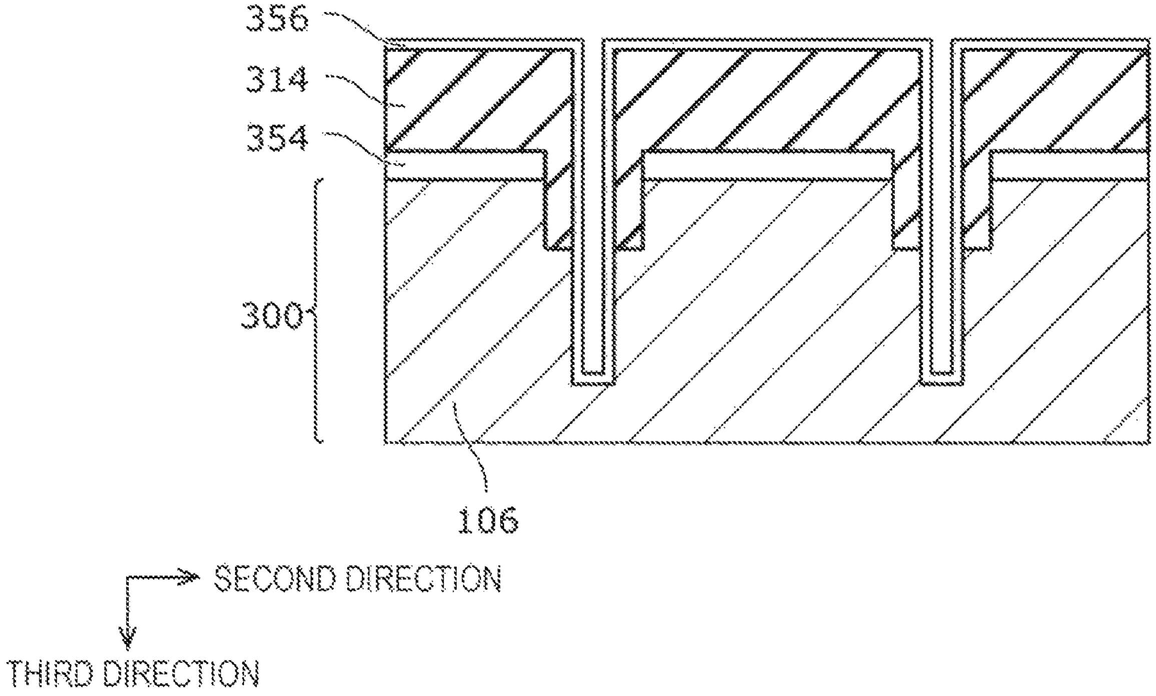

FIG. 172 is a view schematically illustrating a semiconductor process according to an embodiment.

Figure 173:
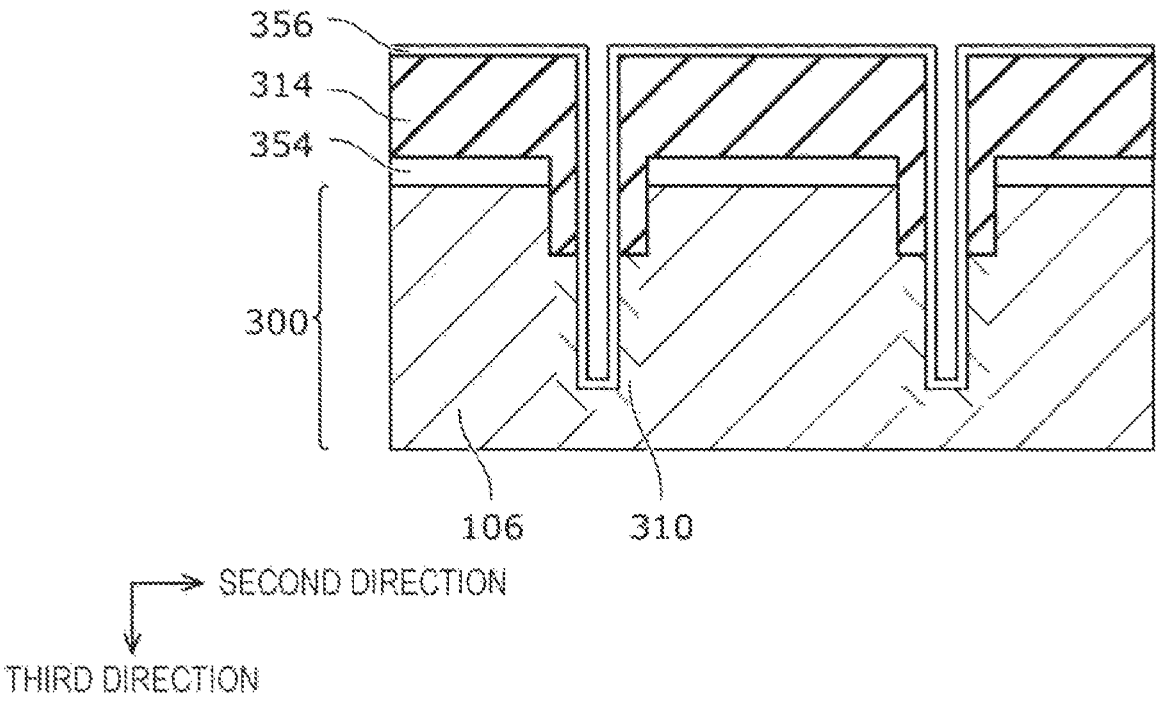

FIG. 173 is a view schematically illustrating a semiconductor process according to an embodiment.

Figure 174:
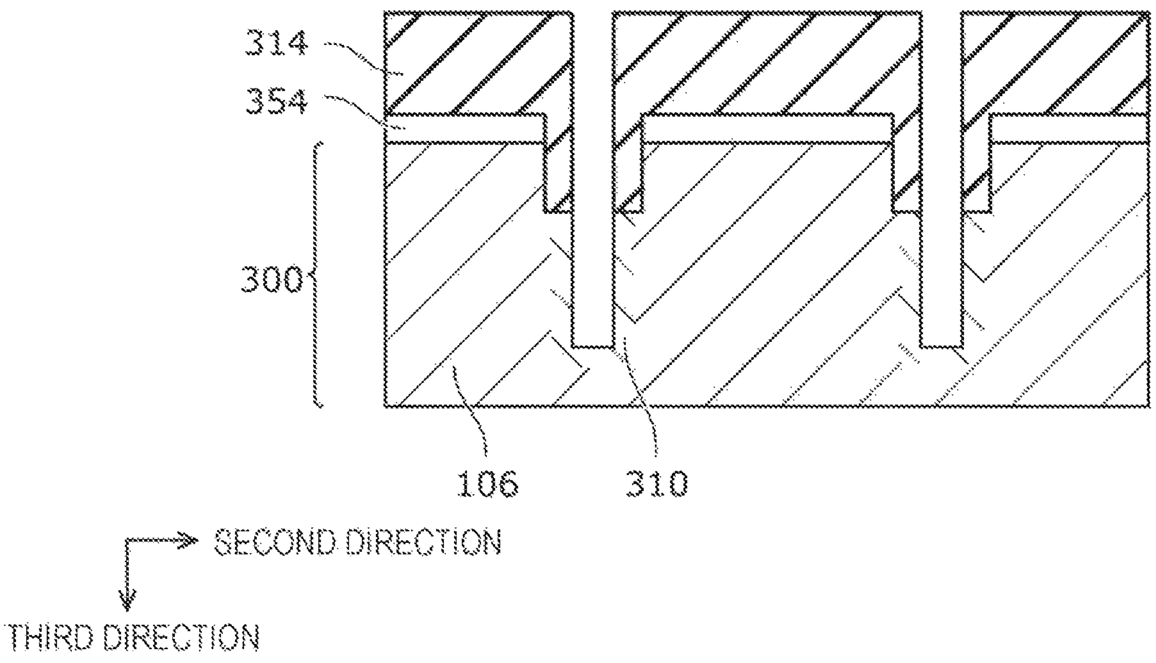

FIG. 174 is a view schematically illustrating a semiconductor process according to an embodiment.

Figure 175:
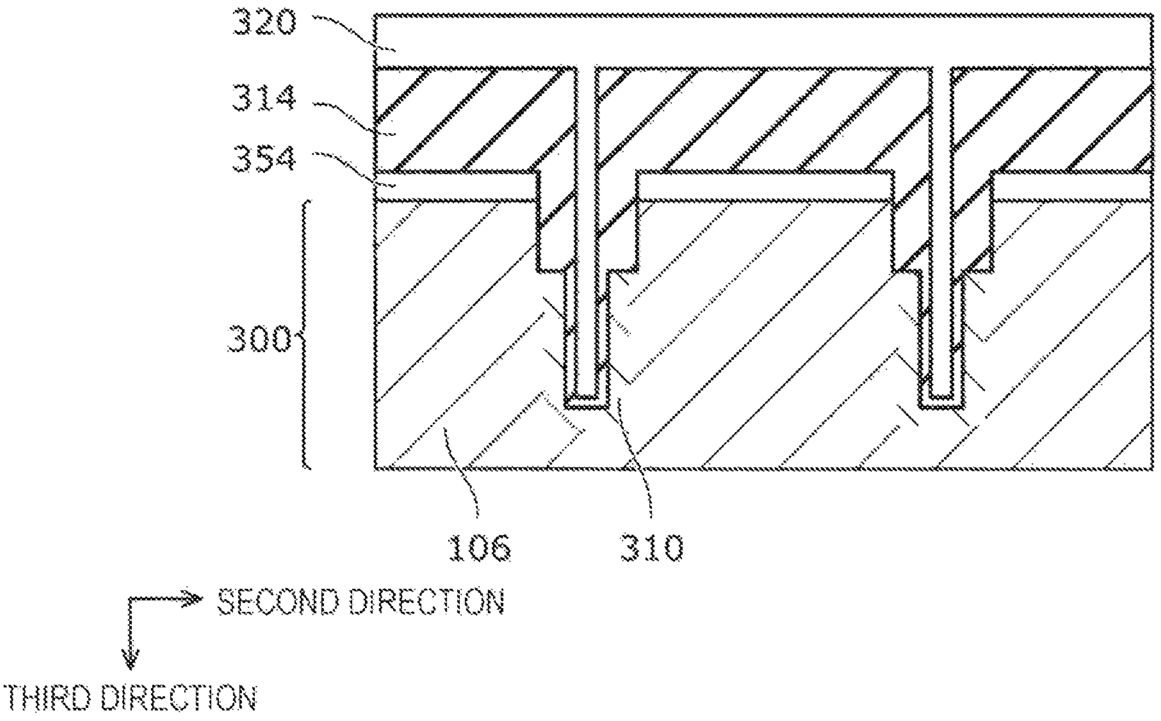

FIG. 175 is a view schematically illustrating a semiconductor process according to an embodiment.

Figure 176:
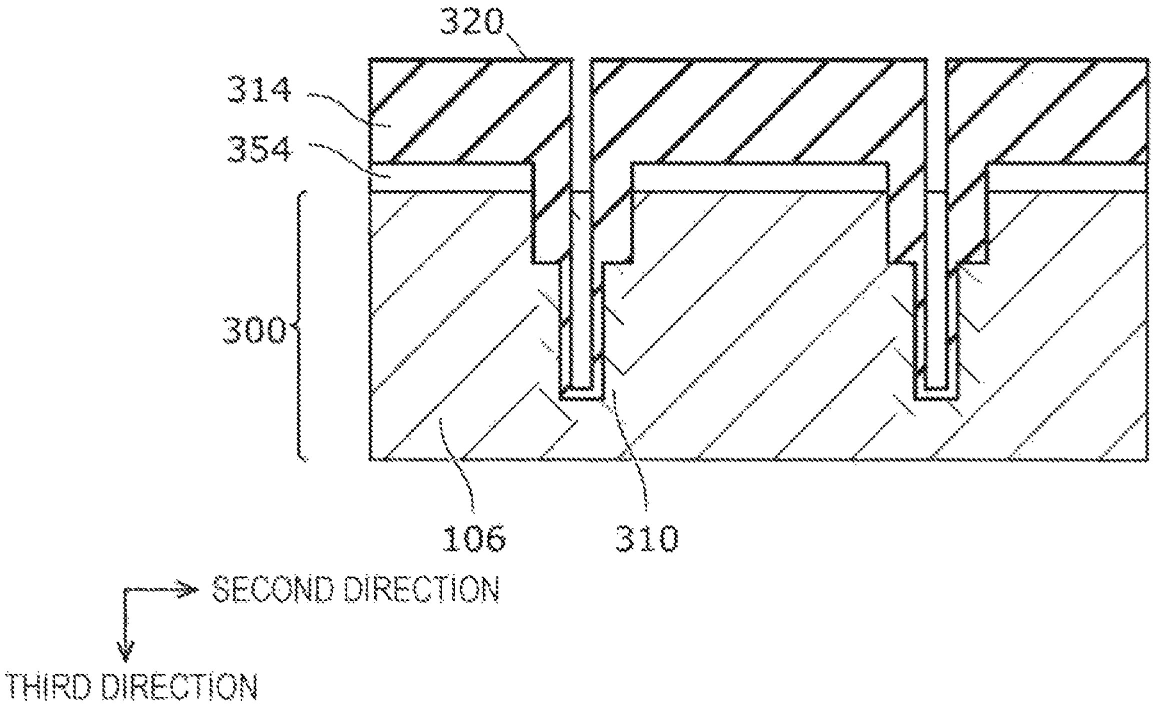

FIG. 176 is a view schematically illustrating a semiconductor process according to an embodiment.

Figure 177:
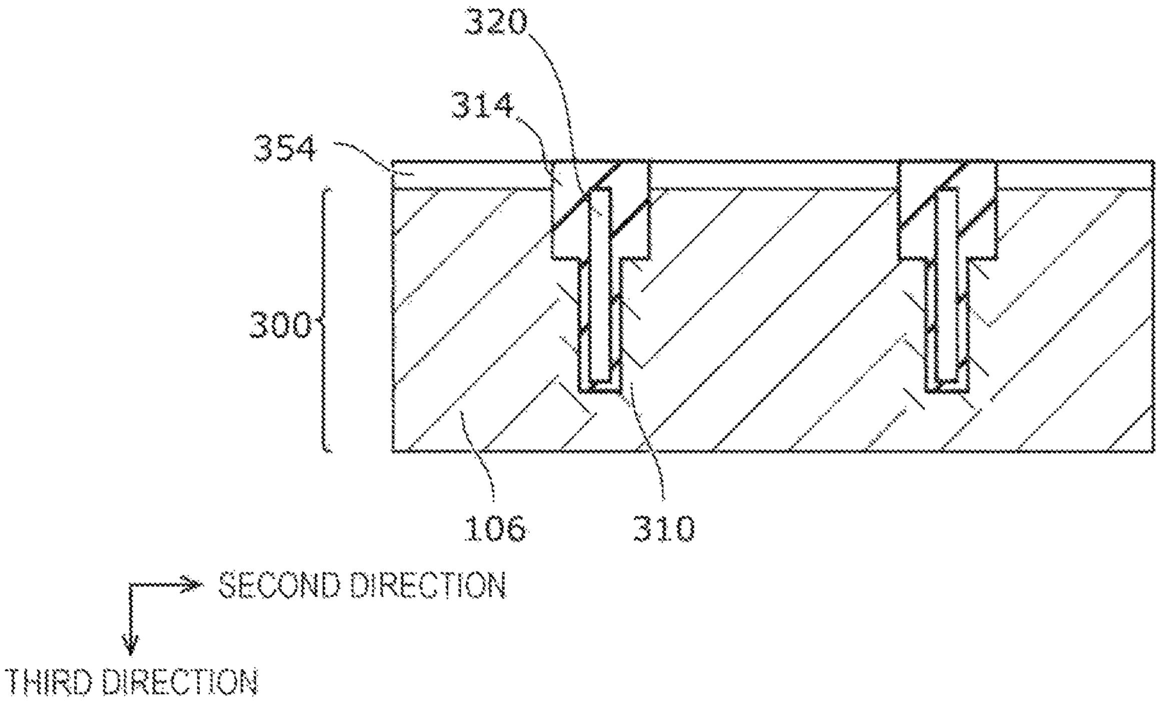

FIG. 177 is a view schematically illustrating a semiconductor process according to an embodiment.

Figure 178:
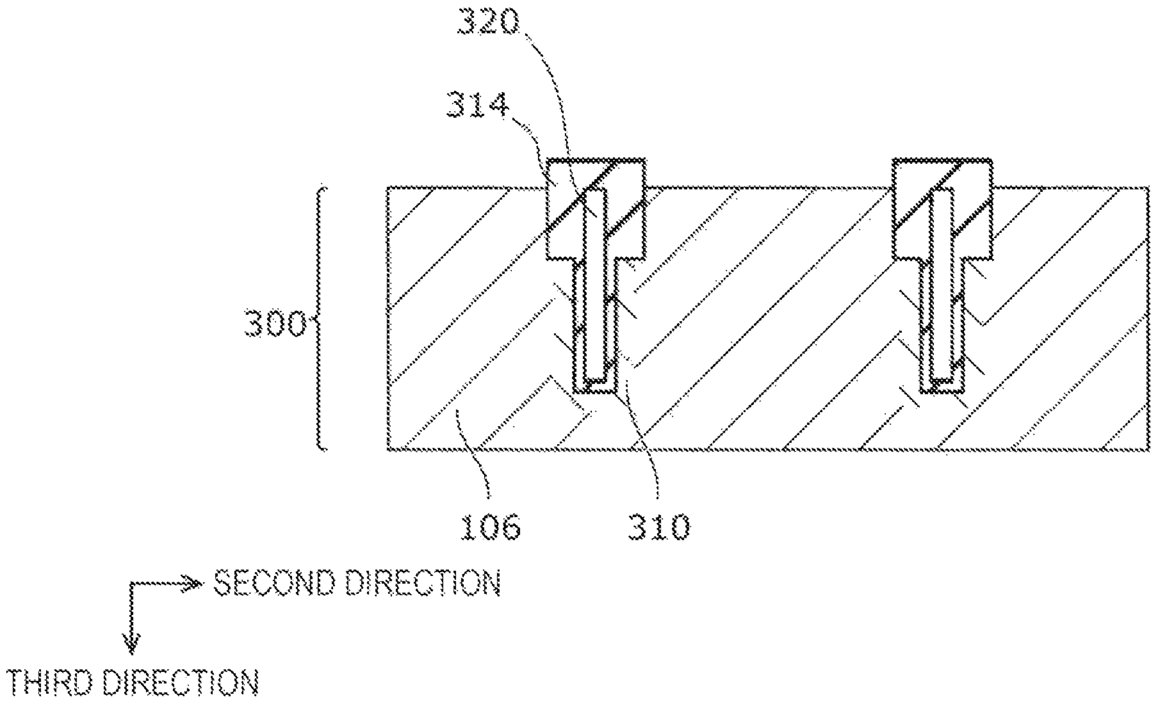

FIG. 178 is a view schematically illustrating a semiconductor process according to an embodiment.

Figure 179:
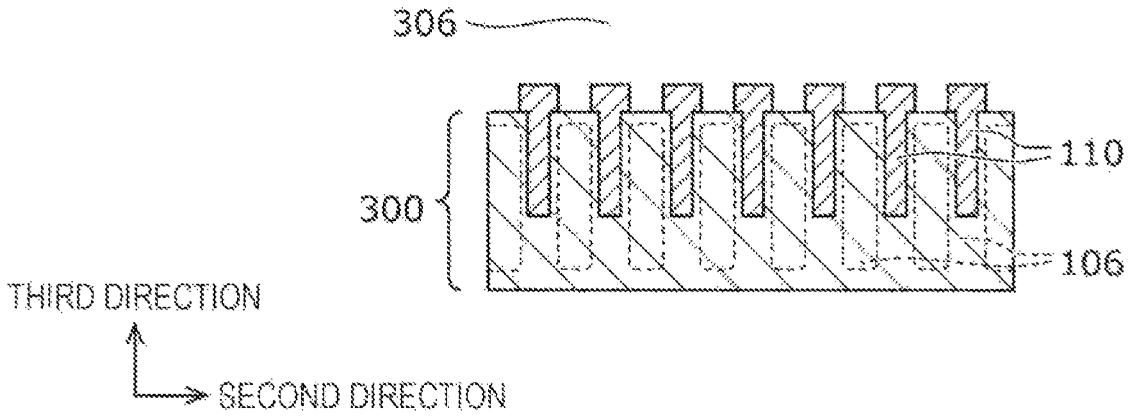

FIG. 179 is a view schematically illustrating a semiconductor process according to an embodiment.

Figure 180:
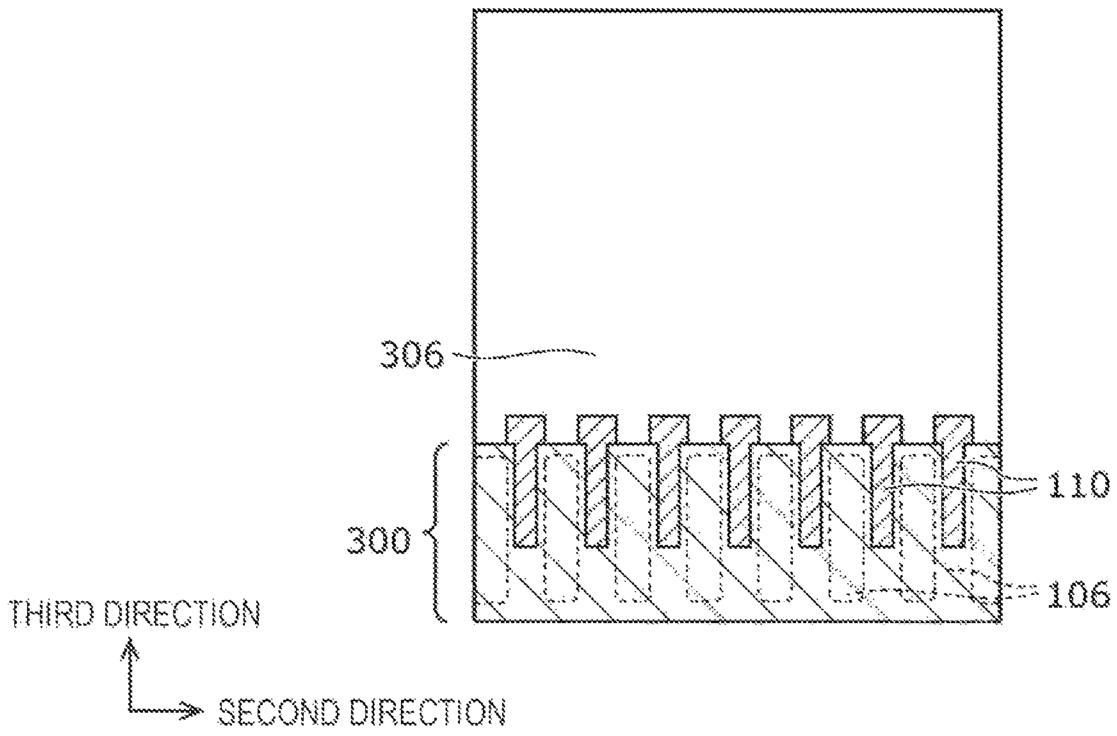

FIG. 180 is a view schematically illustrating a semiconductor process according to an embodiment.

Figure 181:
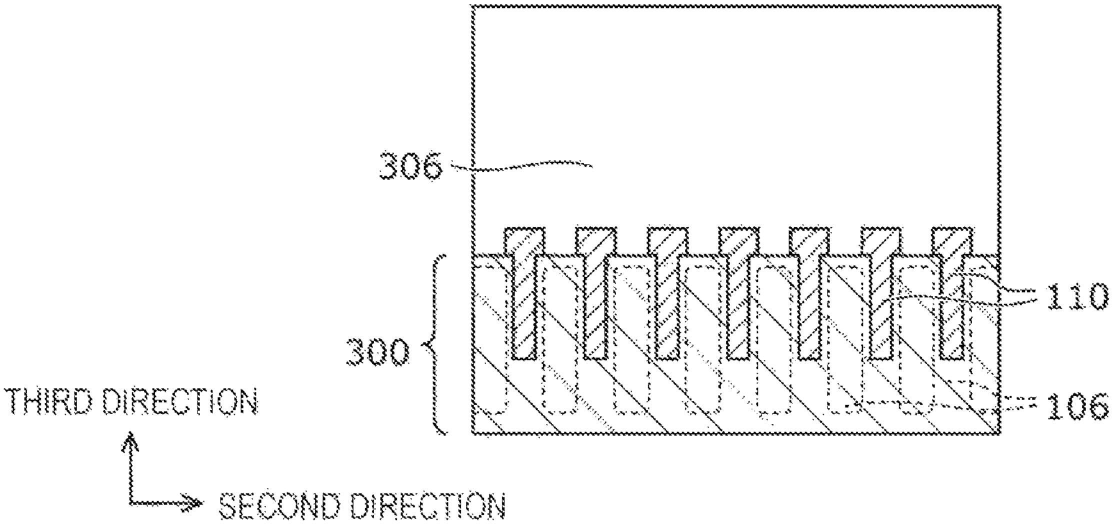

FIG. 181 is a view schematically illustrating a semiconductor process according to an embodiment.

Figure 182:
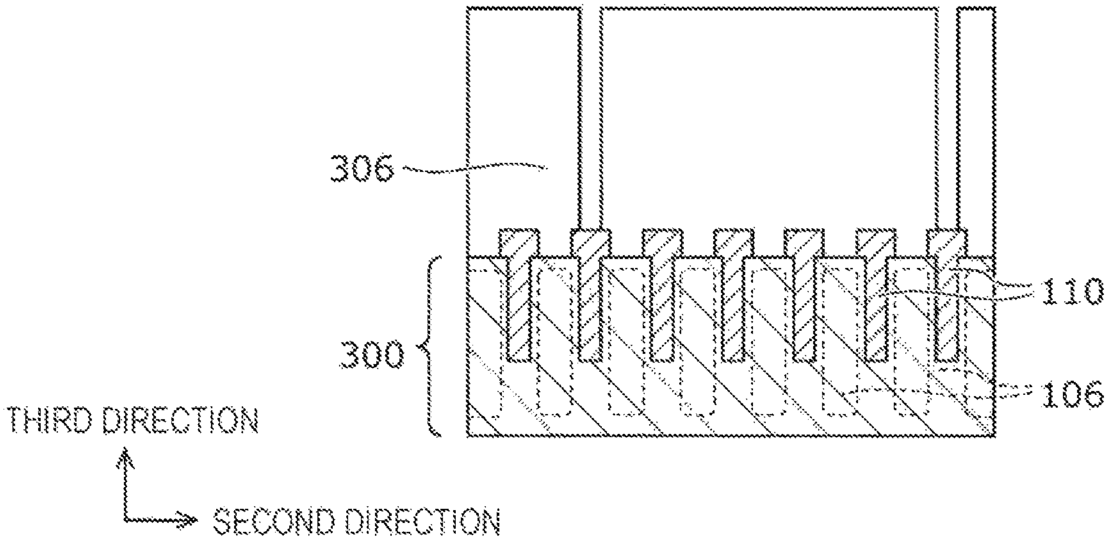

FIG. 182 is a view schematically illustrating a semiconductor process according to an embodiment.

Figure 183:
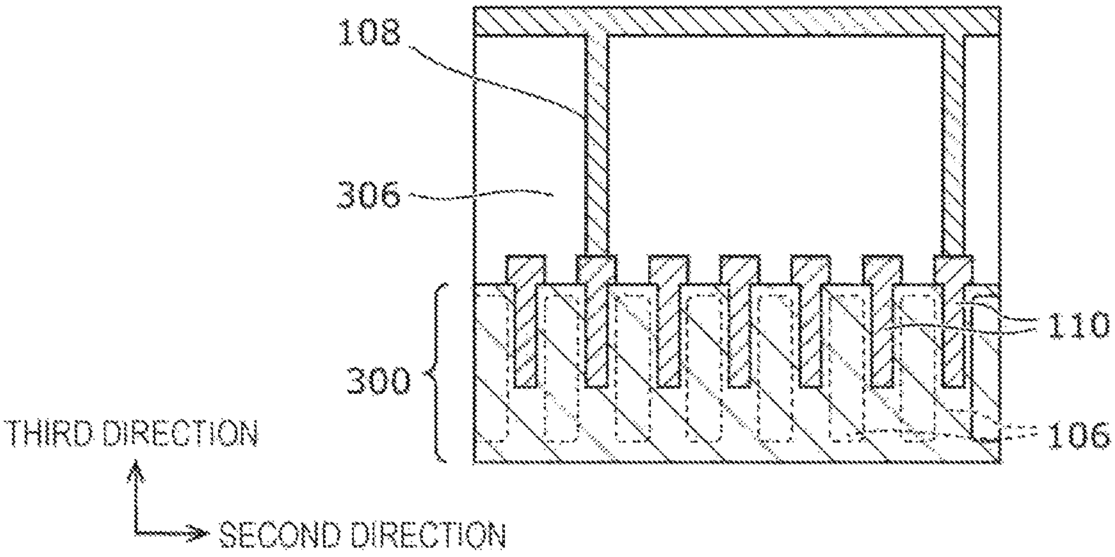

FIG. 183 is a view schematically illustrating a semiconductor process according to an embodiment.

Figure 184:
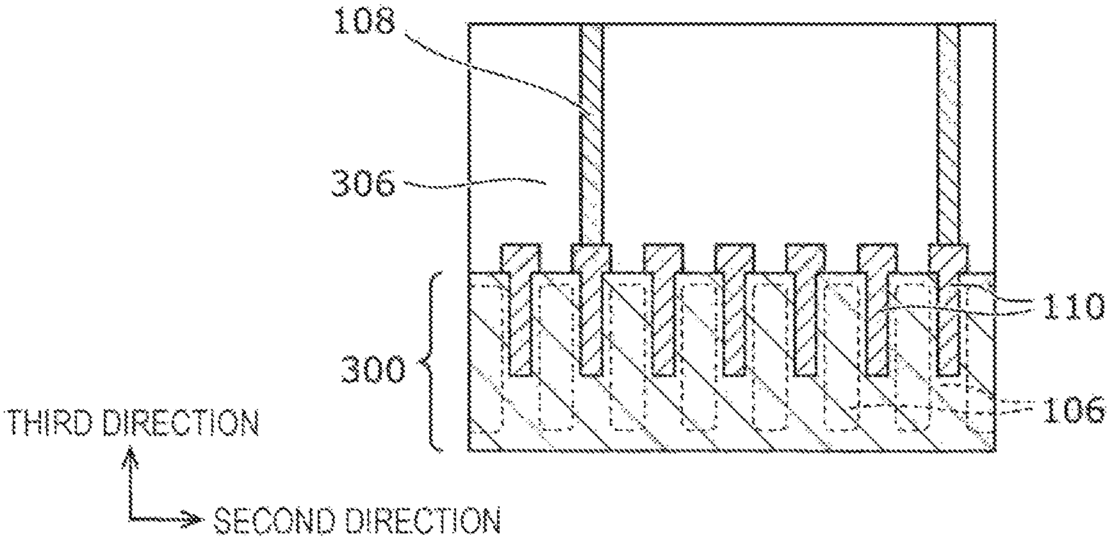

FIG. 184 is a view schematically illustrating a semiconductor process according to an embodiment.

Figure 185:
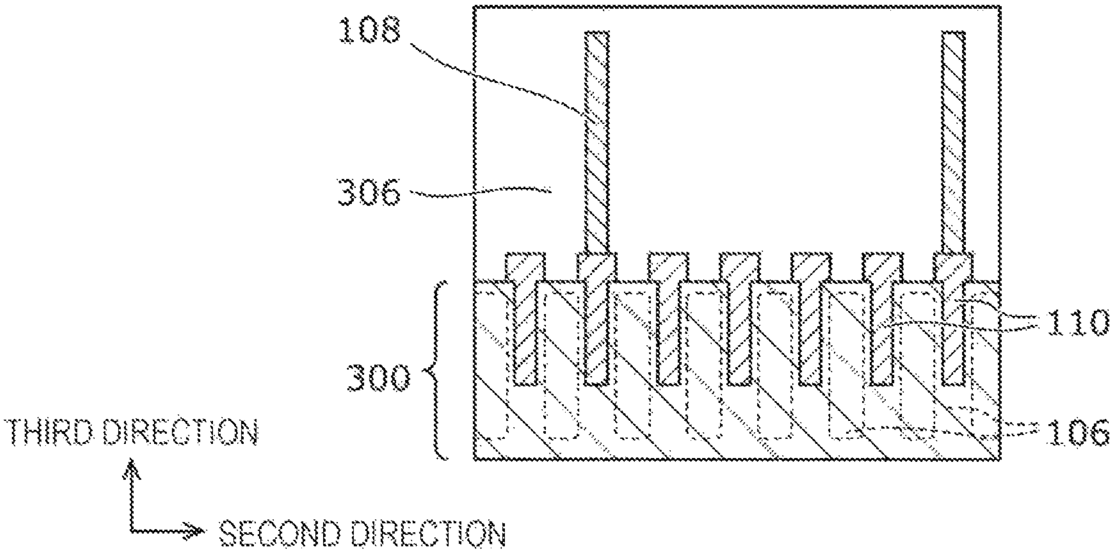

FIG. 185 is a view schematically illustrating a semiconductor process according to an embodiment.

Figure 186:
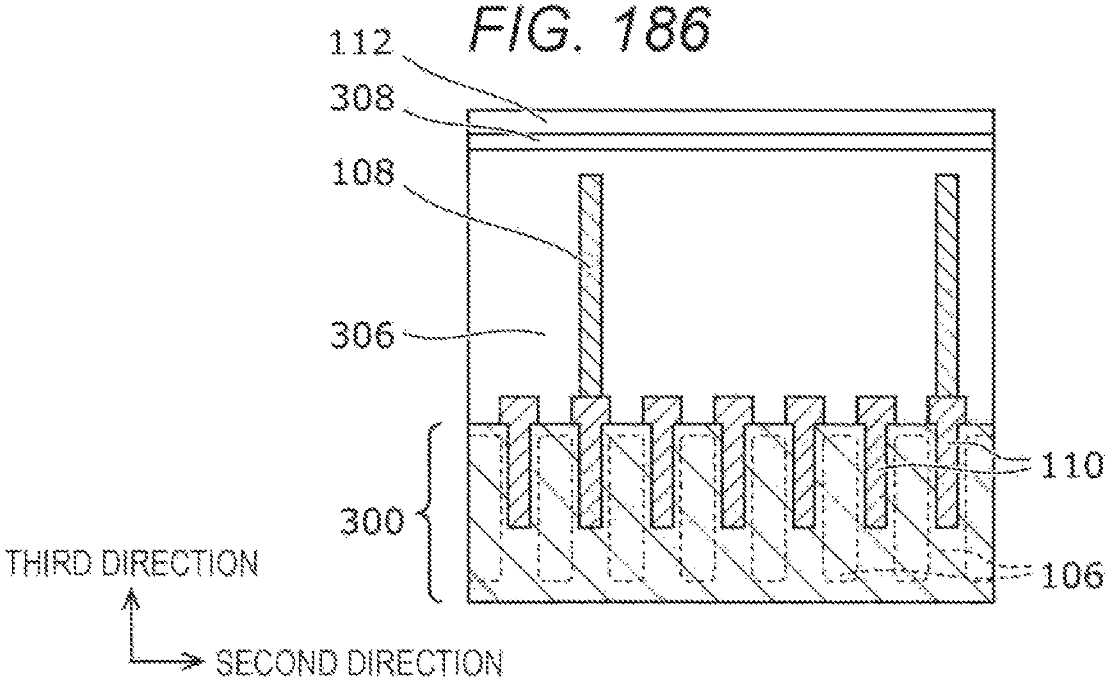

FIG. 186 is a view schematically illustrating a semiconductor process according to an embodiment.

Figure 187:
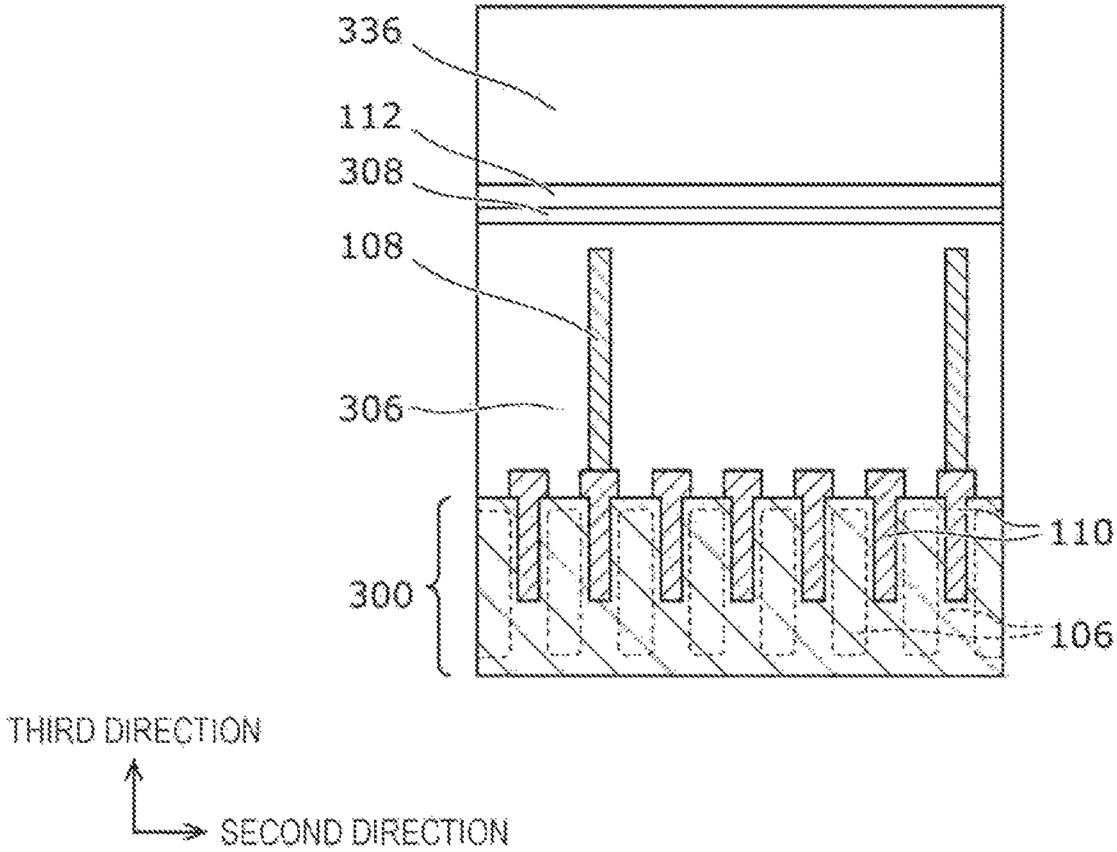

FIG. 187 is a view schematically illustrating a semiconductor process according to an embodiment.

Figure 188:
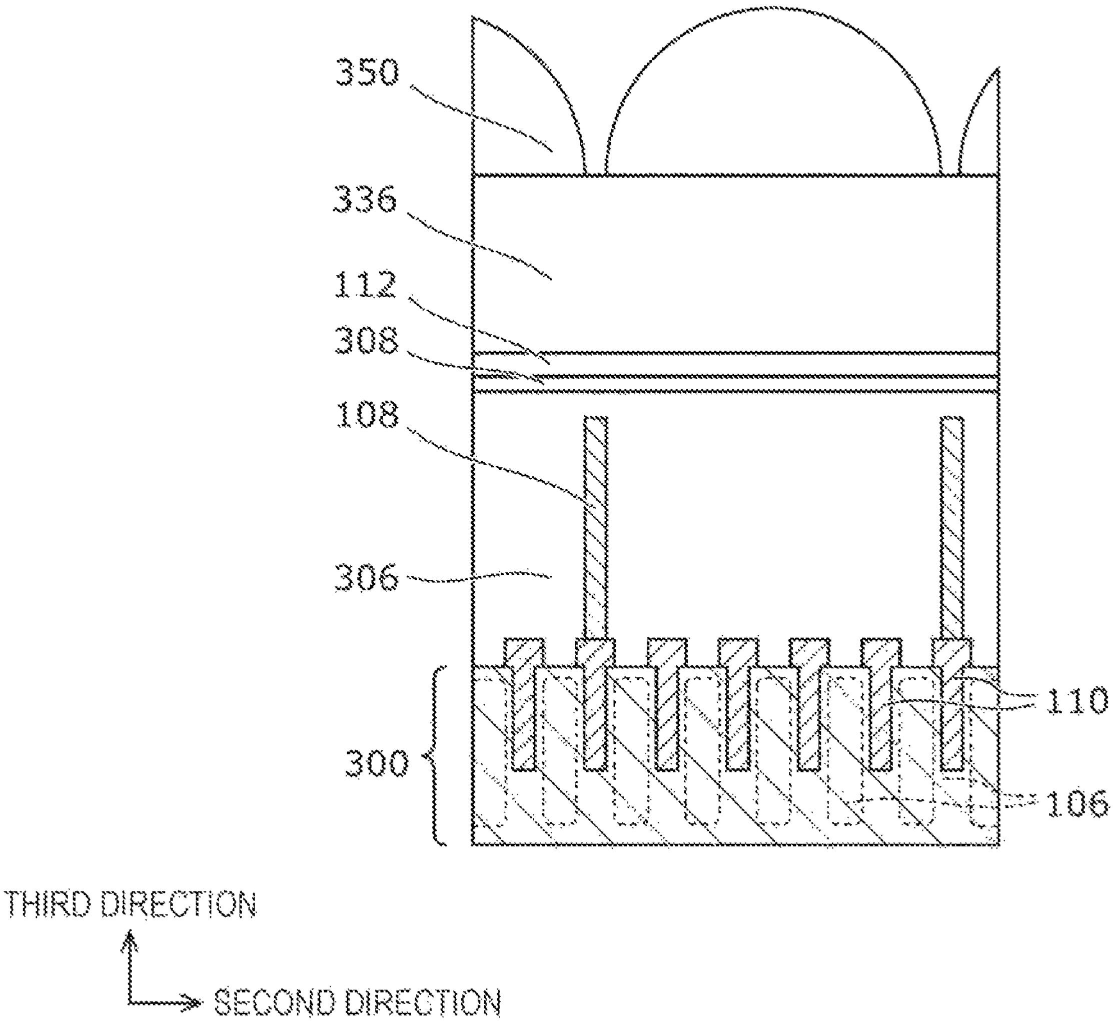

FIG. 188 is a view schematically illustrating a semiconductor process according to an embodiment.

Figure 189:
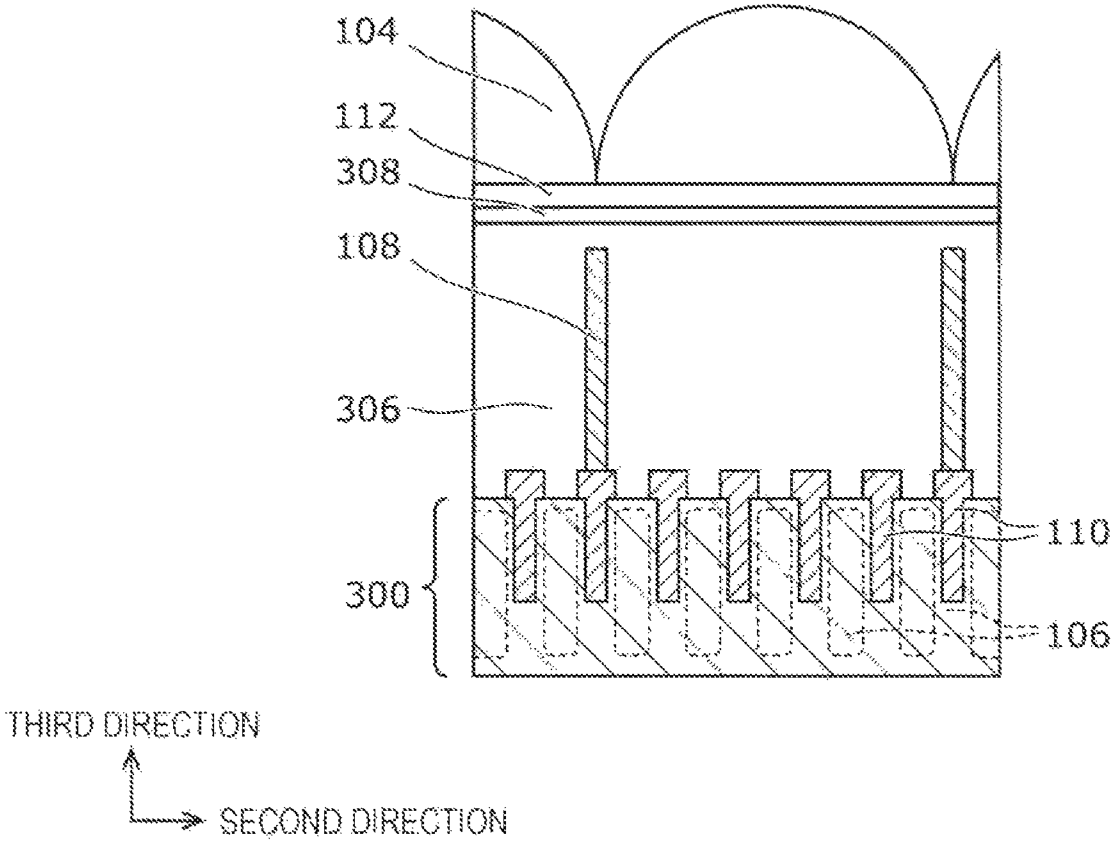

FIG. 189 is a view schematically illustrating a semiconductor process according to an embodiment.

Figure 190:
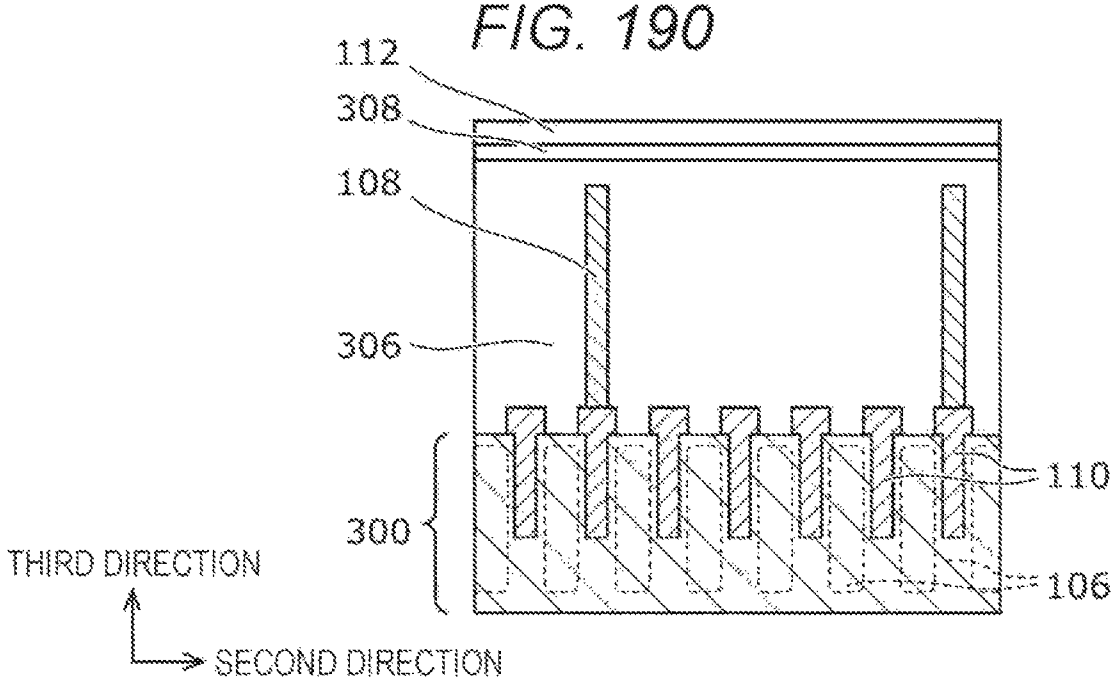

FIG. 190 is a view schematically illustrating a semiconductor process according to an embodiment.

Figure 191:
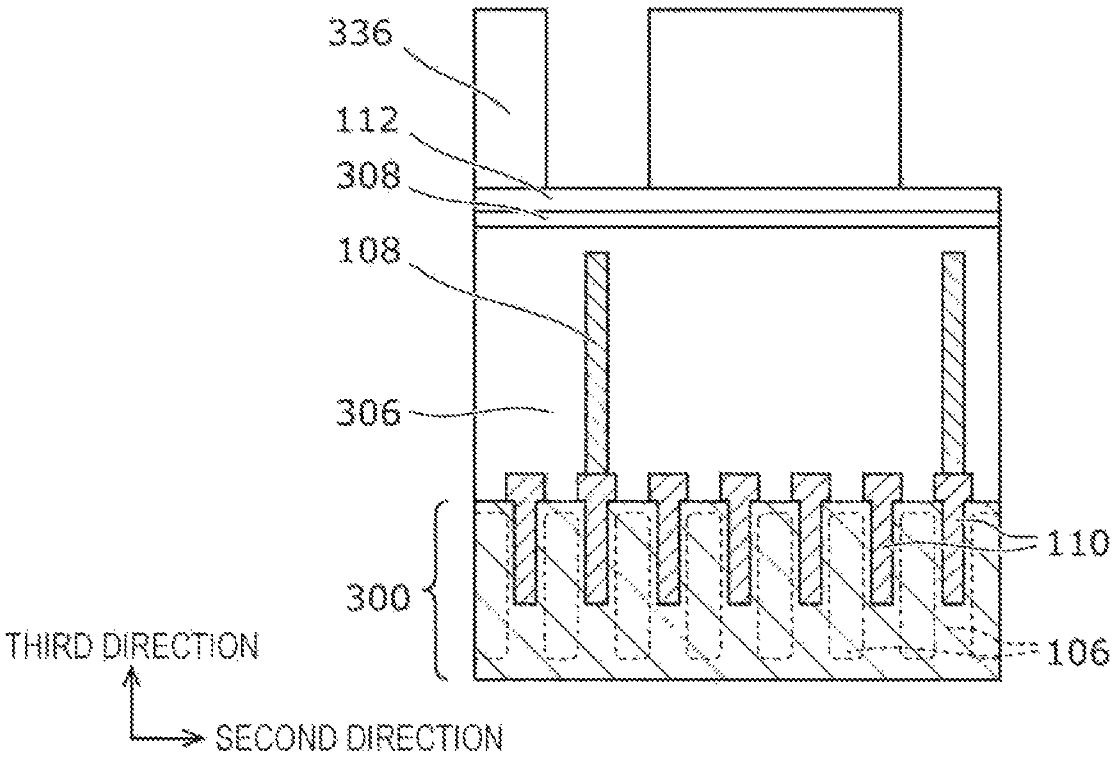

FIG. 191 is a view schematically illustrating a semiconductor process according to an embodiment.

Figure 192:
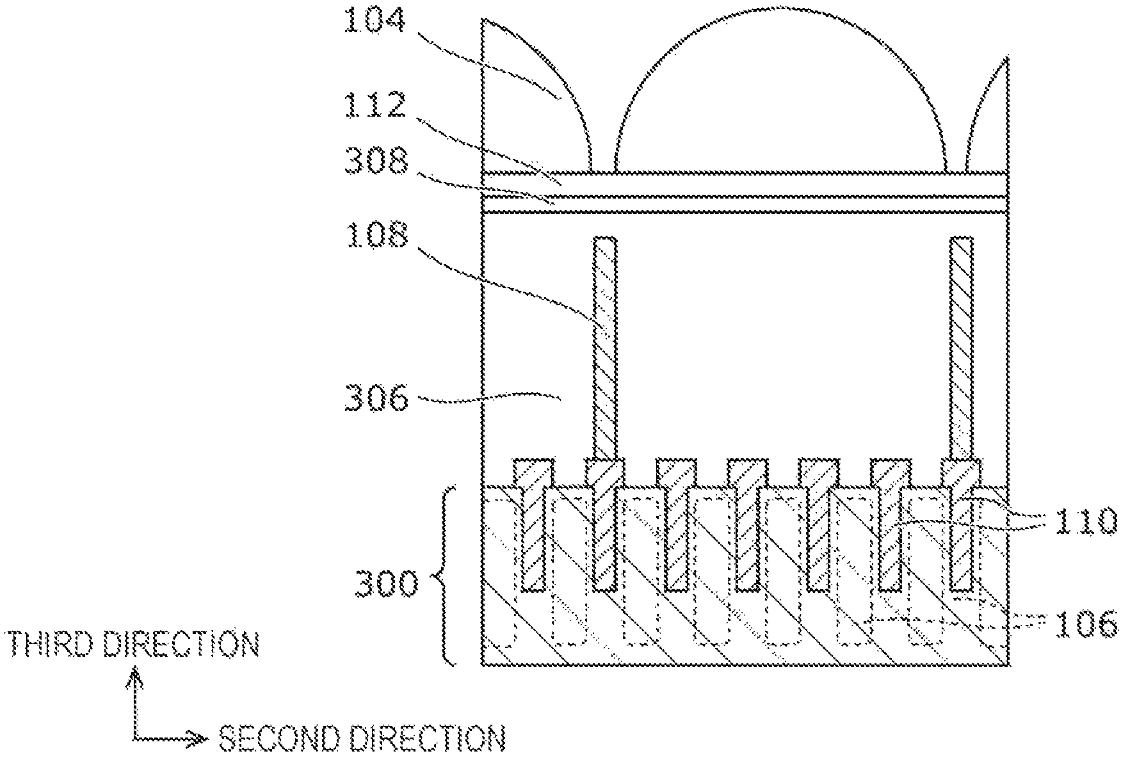

FIG. 192 is a view schematically illustrating a semiconductor process according to an embodiment.

Figure 193:
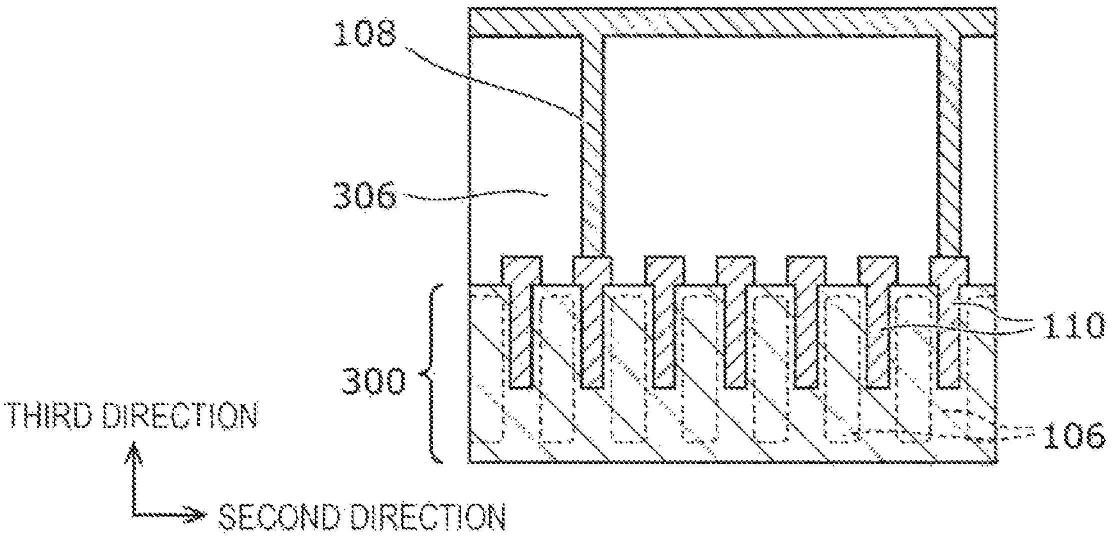

FIG. 193 is a view schematically illustrating a semiconductor process according to an embodiment.

Figure 194:
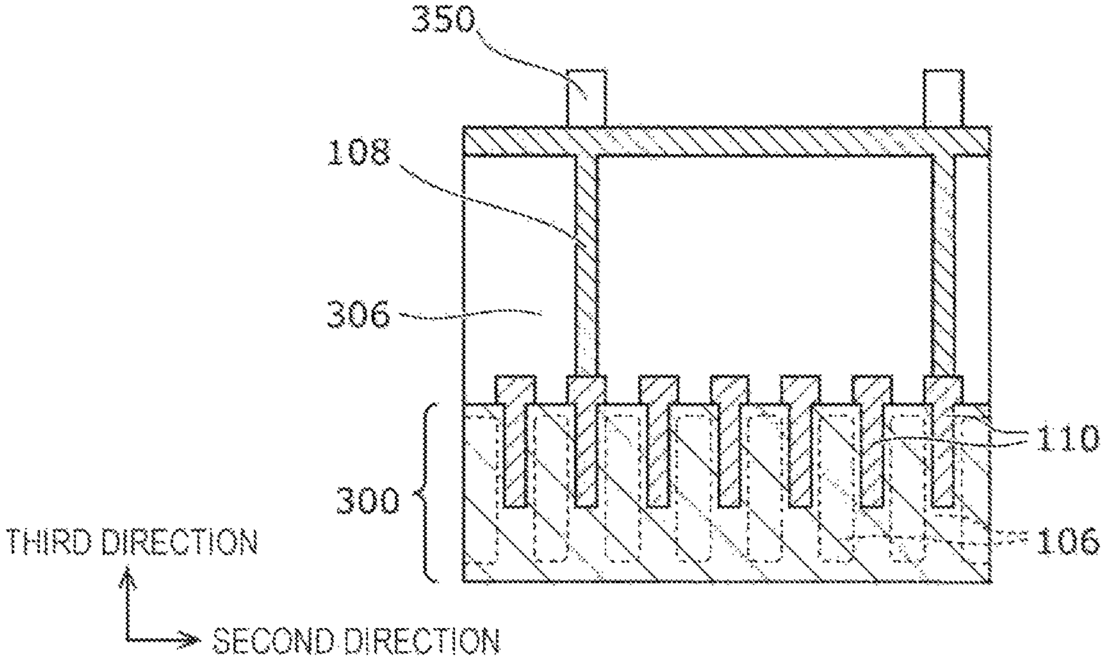

FIG. 194 is a view schematically illustrating a semiconductor process according to an embodiment.

Figure 195:
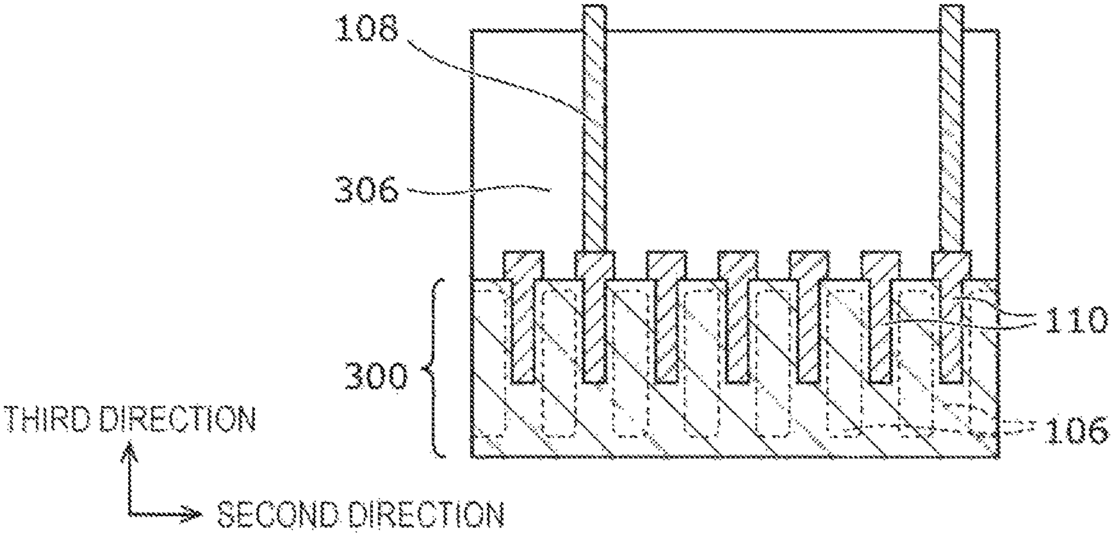

FIG. 195 is a view schematically illustrating a semiconductor process according to an embodiment.

Figure 196:
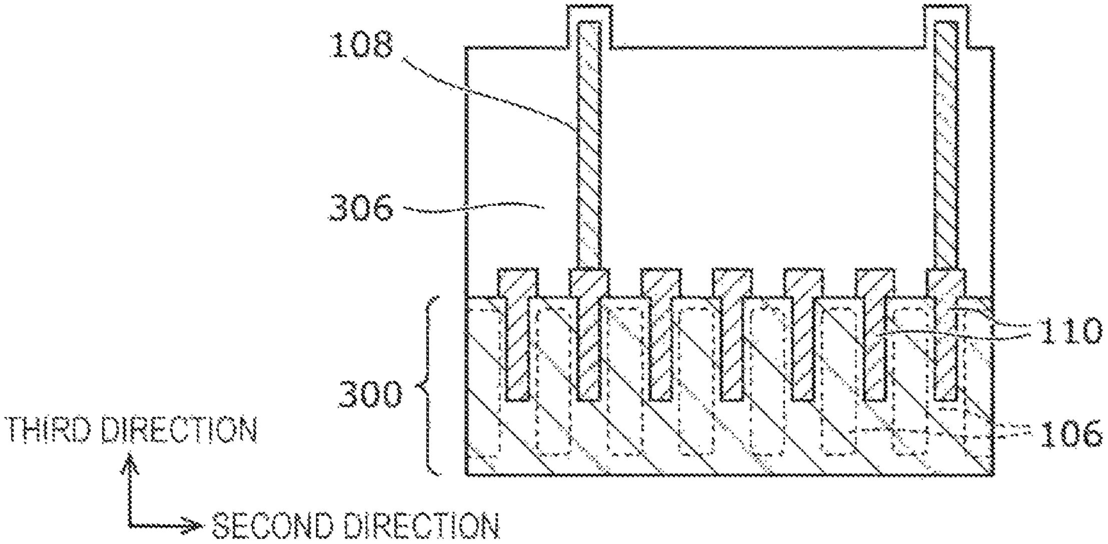

FIG. 196 is a view schematically illustrating a semiconductor process according to an embodiment.

Figure 197:
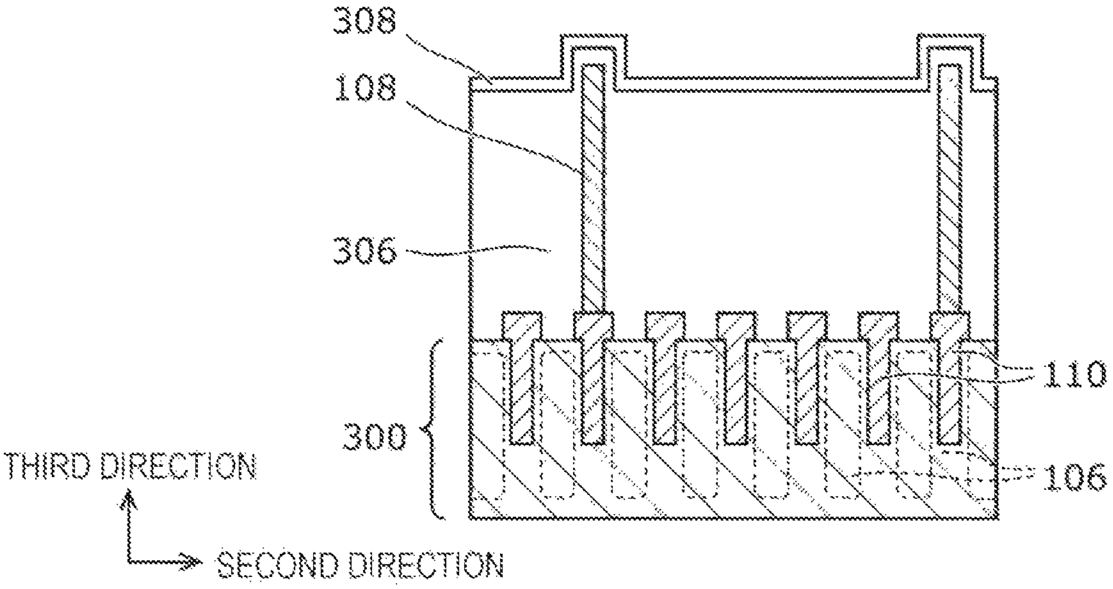

FIG. 197 is a view schematically illustrating a semiconductor process according to an embodiment.

Figure 198:
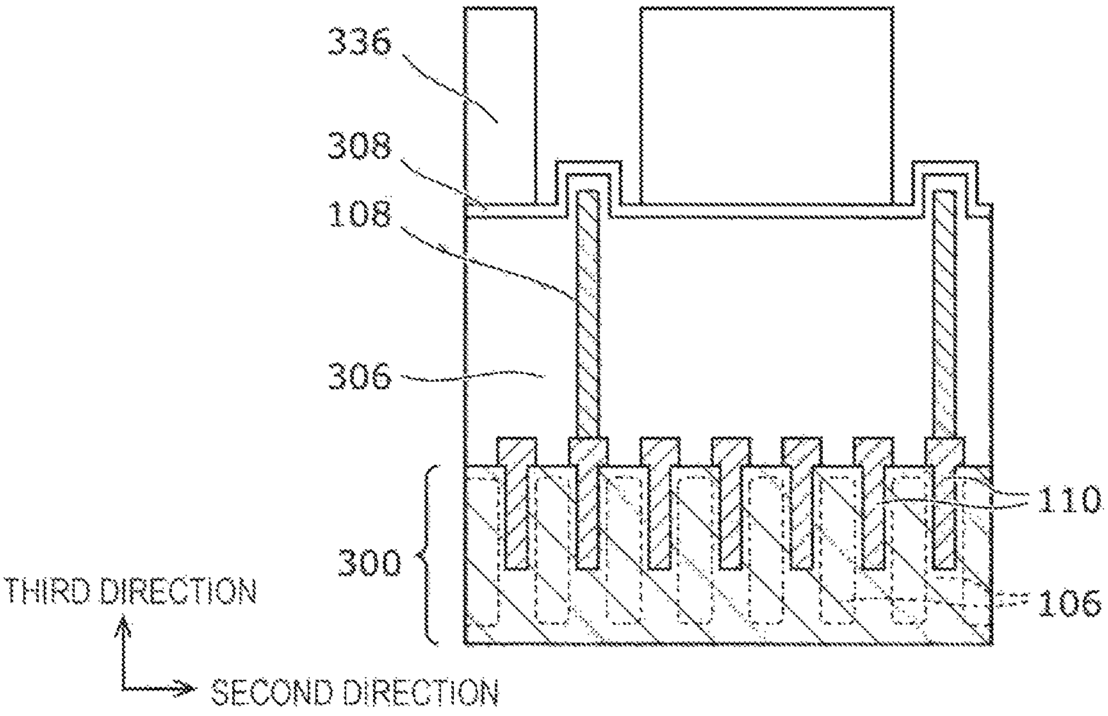

FIG. 198 is a view schematically illustrating a semiconductor process according to an embodiment.

Figure 199:
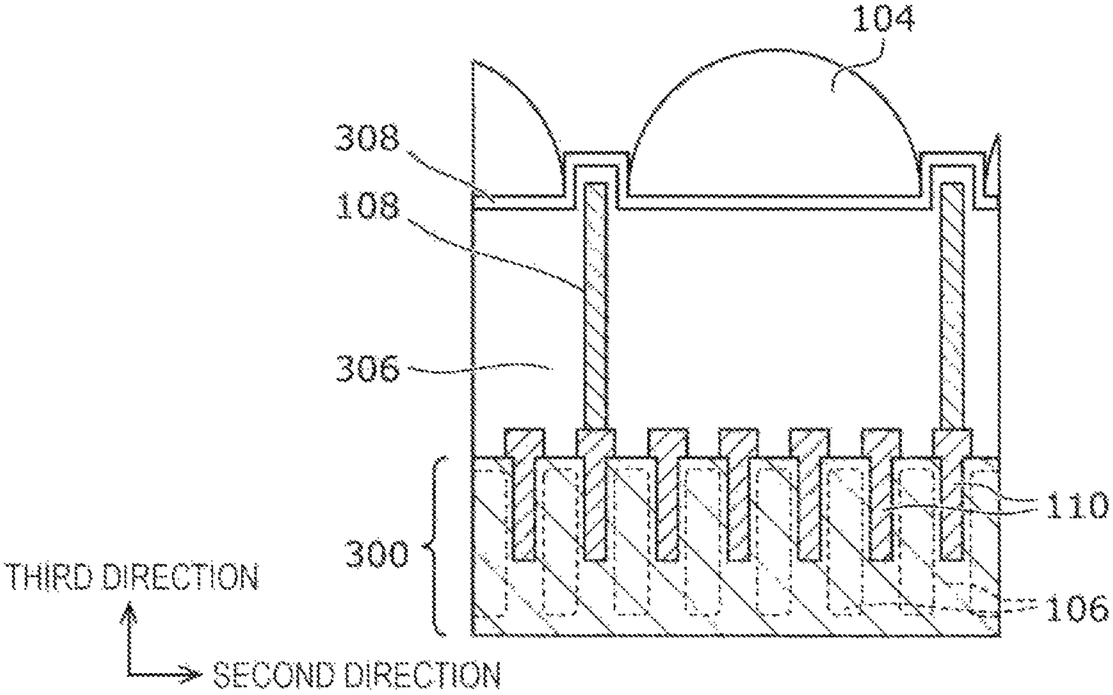

FIG. 199 is a view schematically illustrating a semiconductor process according to an embodiment.

Figure 200:
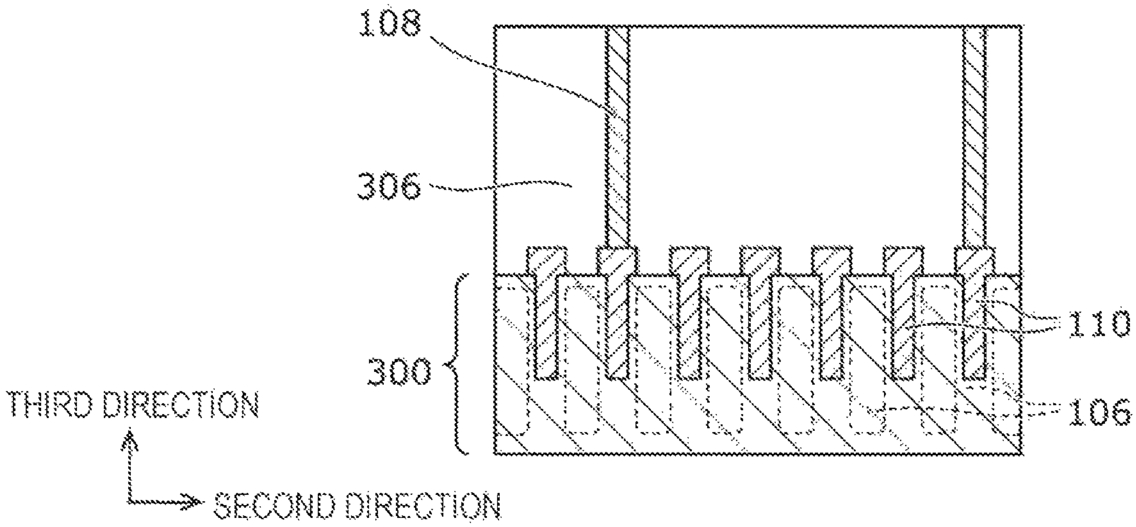

FIG. 200 is a view schematically illustrating a semiconductor process according to an embodiment.

Figure 201:
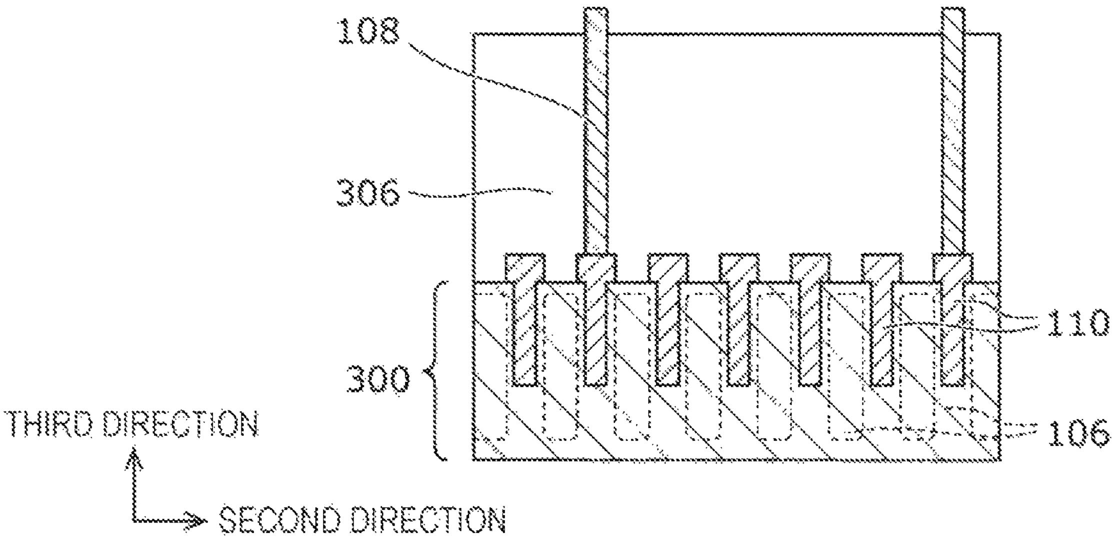

FIG. 201 is a view schematically illustrating a semiconductor process according to an embodiment.

Figure 202:
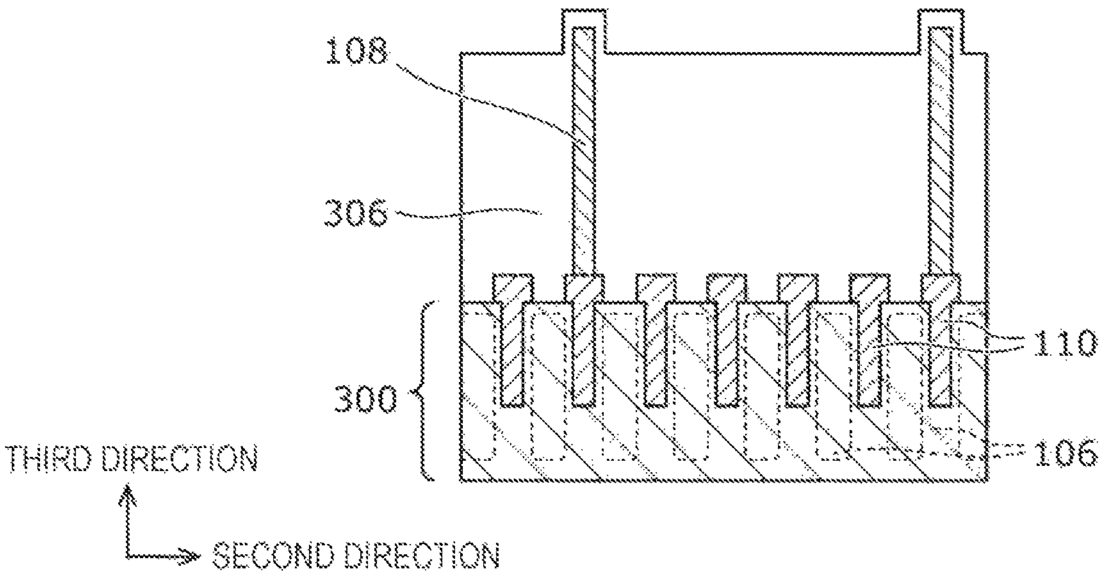

FIG. 202 is a view schematically illustrating a semiconductor process according to an embodiment.

Figure 203:
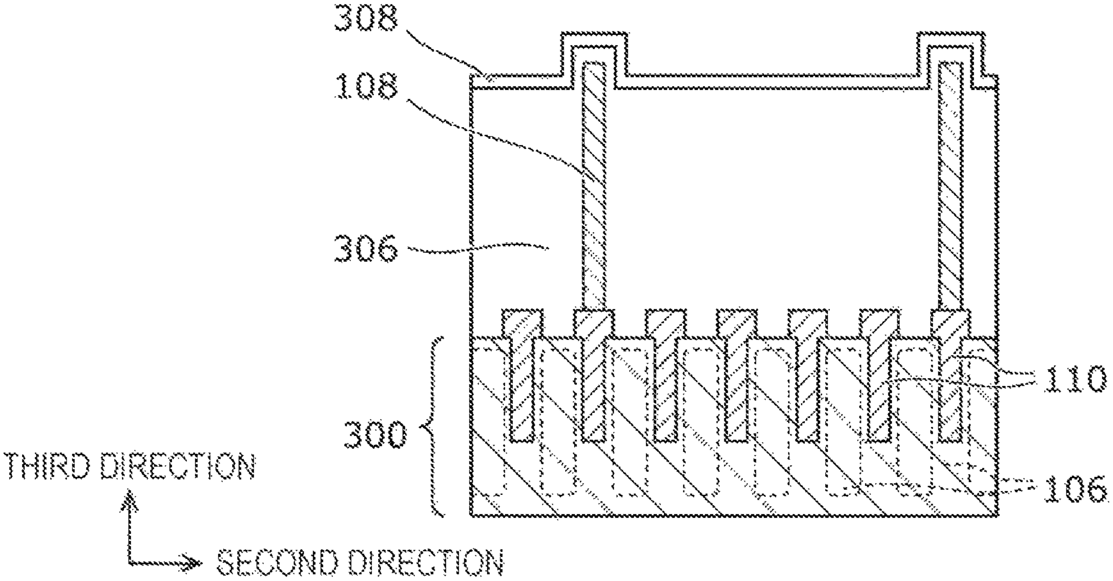

FIG. 203 is a view schematically illustrating a semiconductor process according to an embodiment.

Figure 204:
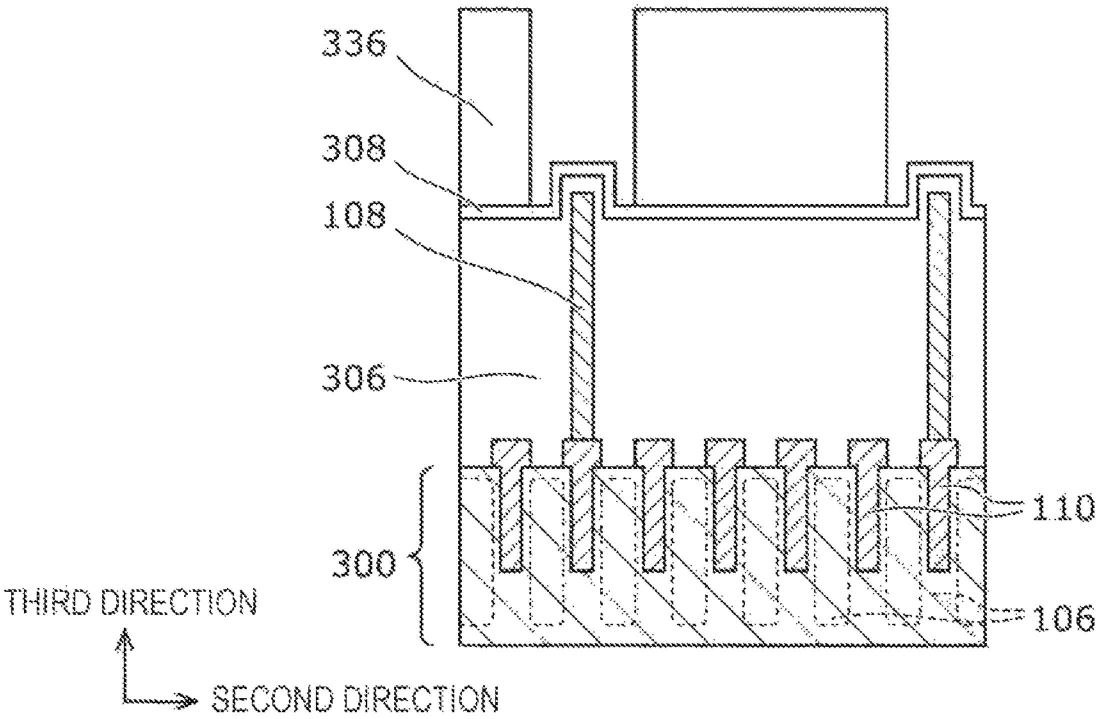

FIG. 204 is a view schematically illustrating a semiconductor process according to an embodiment.

Figure 205:
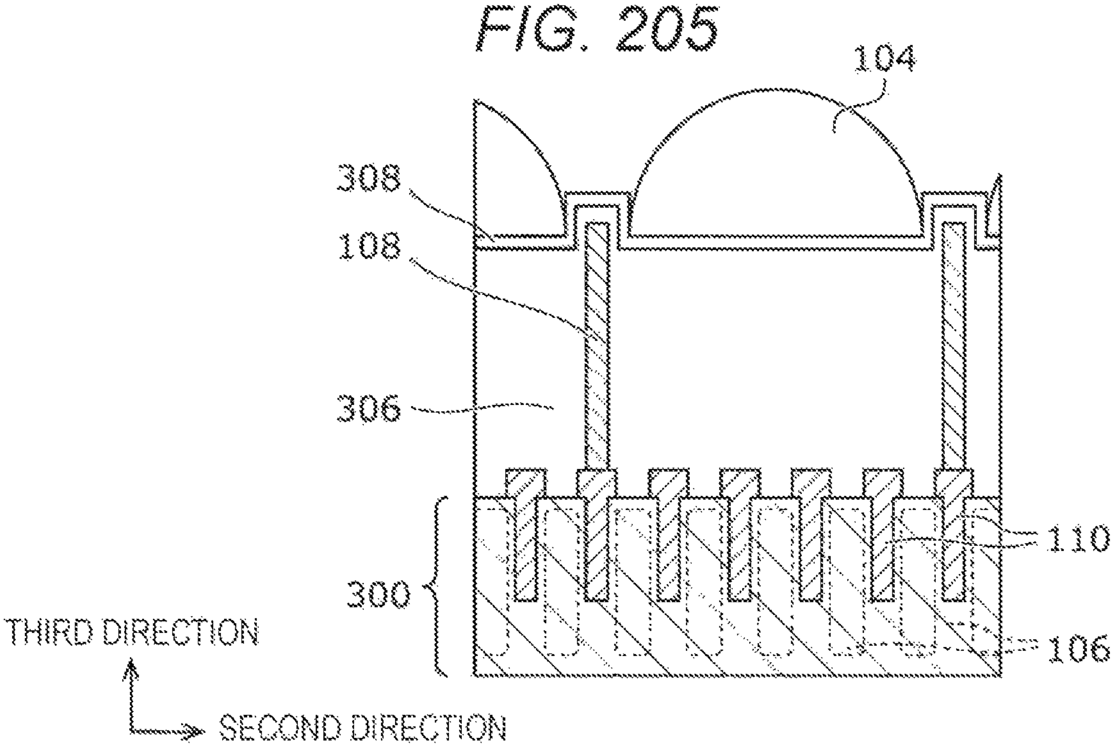

FIG. 205 is a view schematically illustrating a semiconductor process according to an embodiment.

Figure 206:
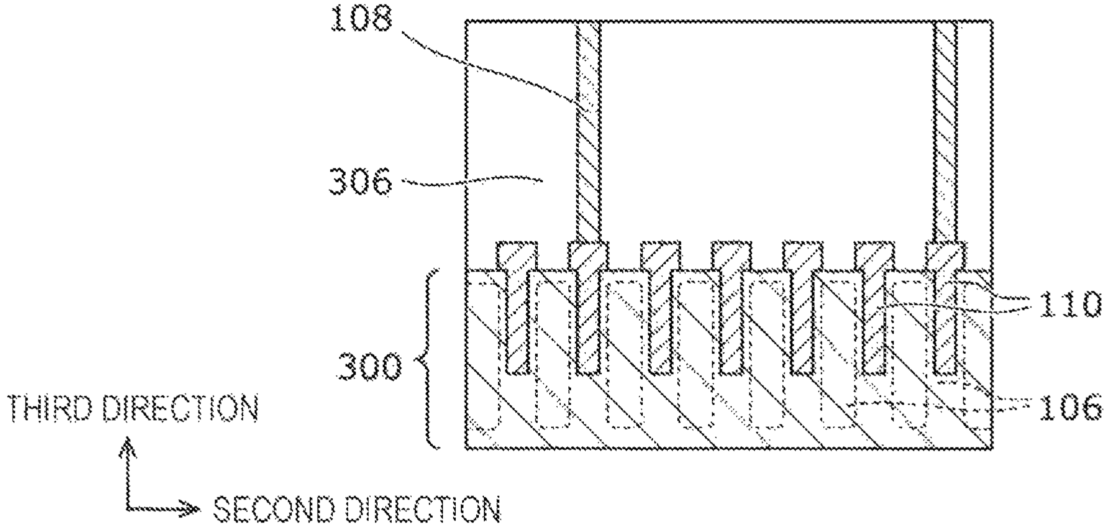

FIG. 206 is a view schematically illustrating a semiconductor process according to an embodiment.

Figure 207:
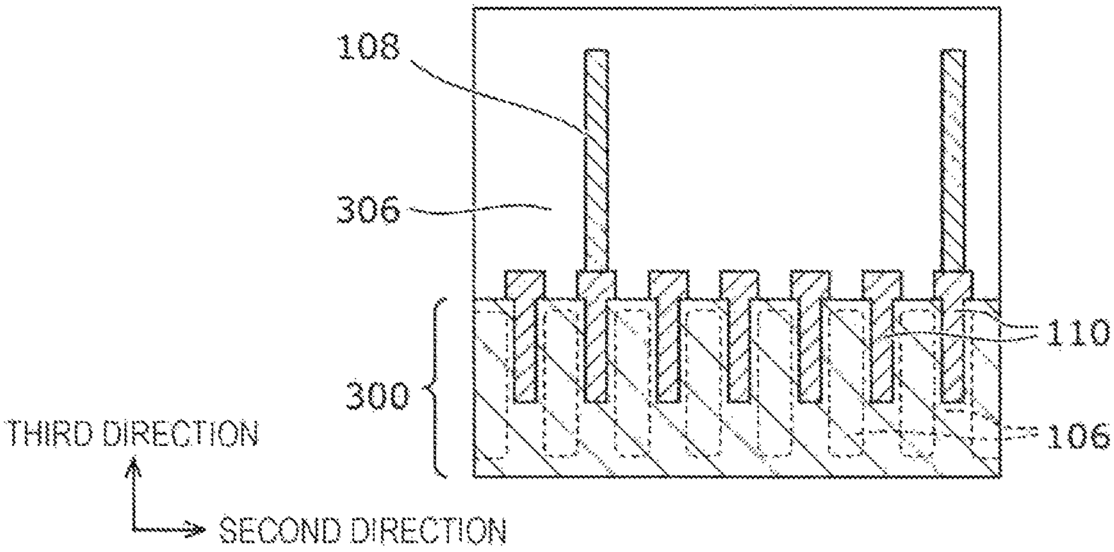

FIG. 207 is a view schematically illustrating a semiconductor process according to an embodiment.

Figure 208:
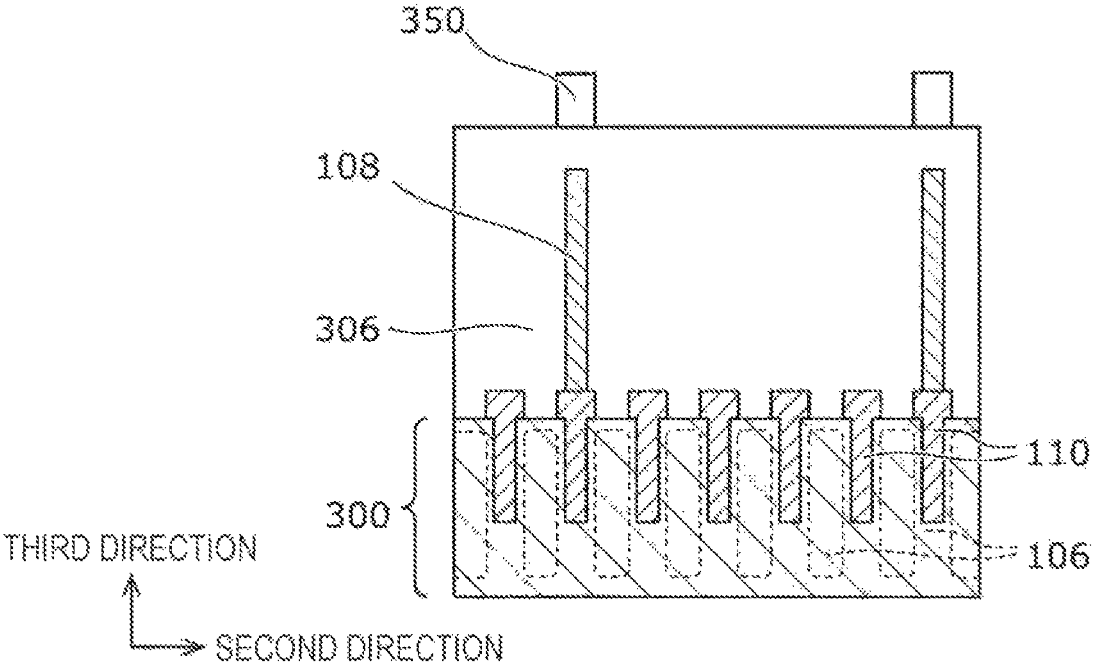

FIG. 208 is a view schematically illustrating a semiconductor process according to an embodiment.

Figure 209:
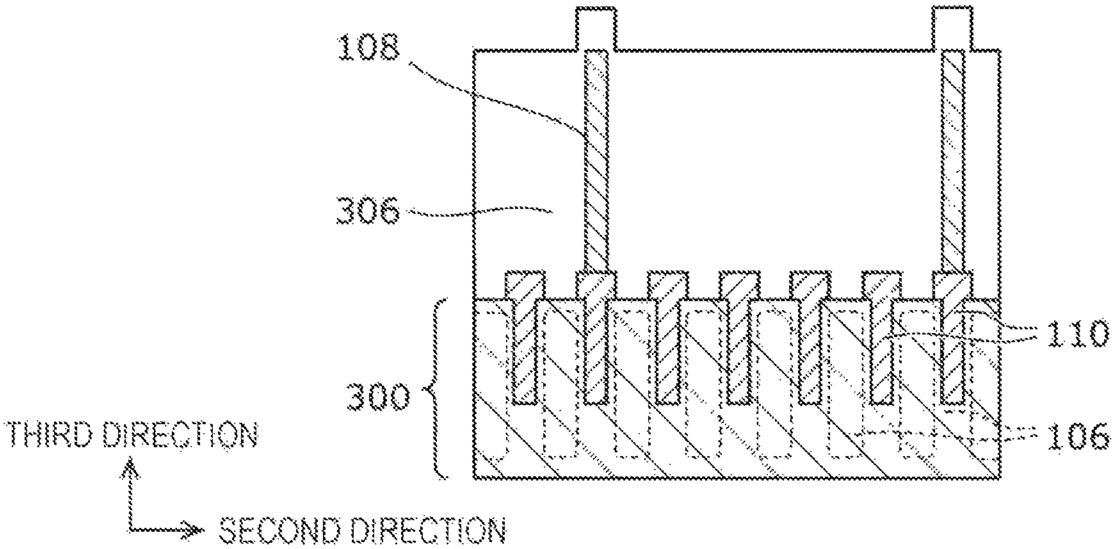

FIG. 209 is a view schematically illustrating a semiconductor process according to an embodiment.

Figure 210:
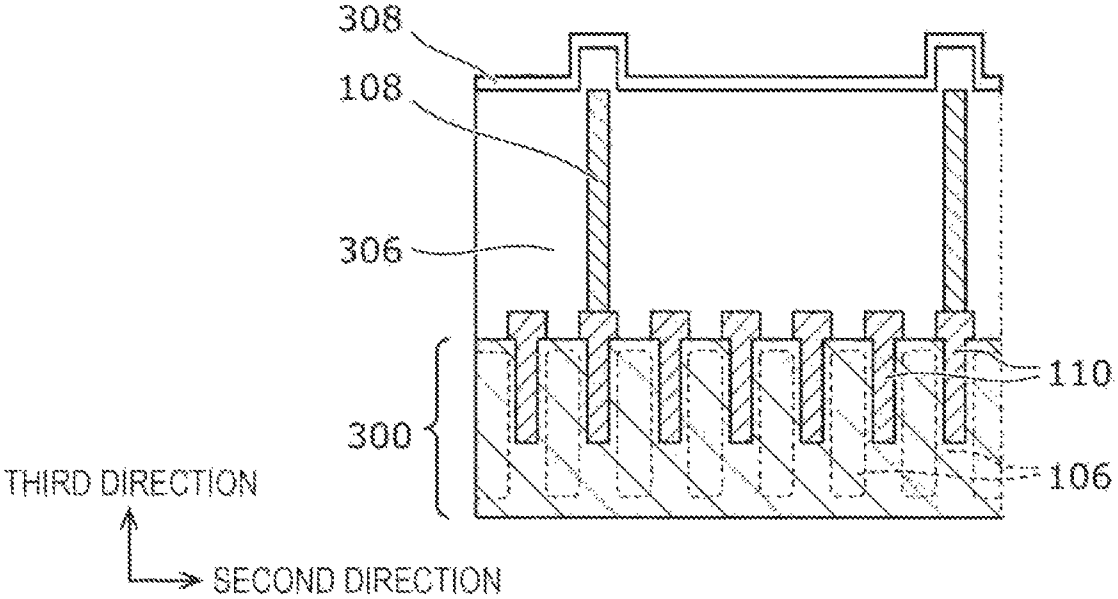

FIG. 210 is a view schematically illustrating a semiconductor process according to an embodiment.

Figure 211:
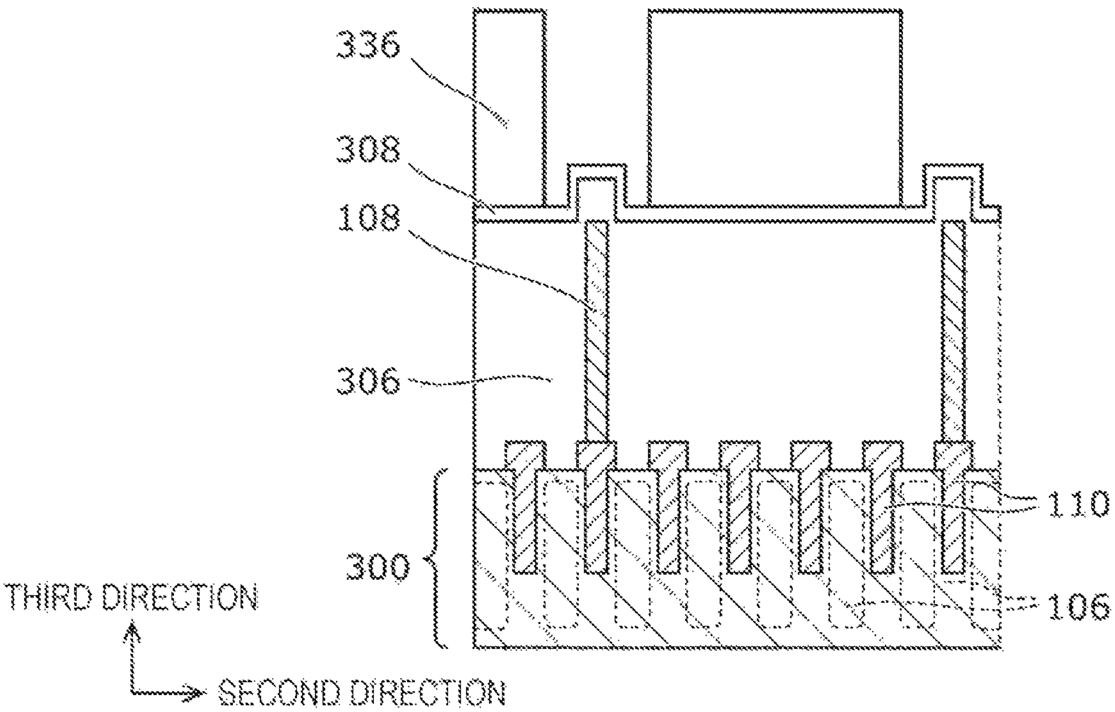

FIG. 211 is a view schematically illustrating a semiconductor process according to an embodiment.

Figure 212:
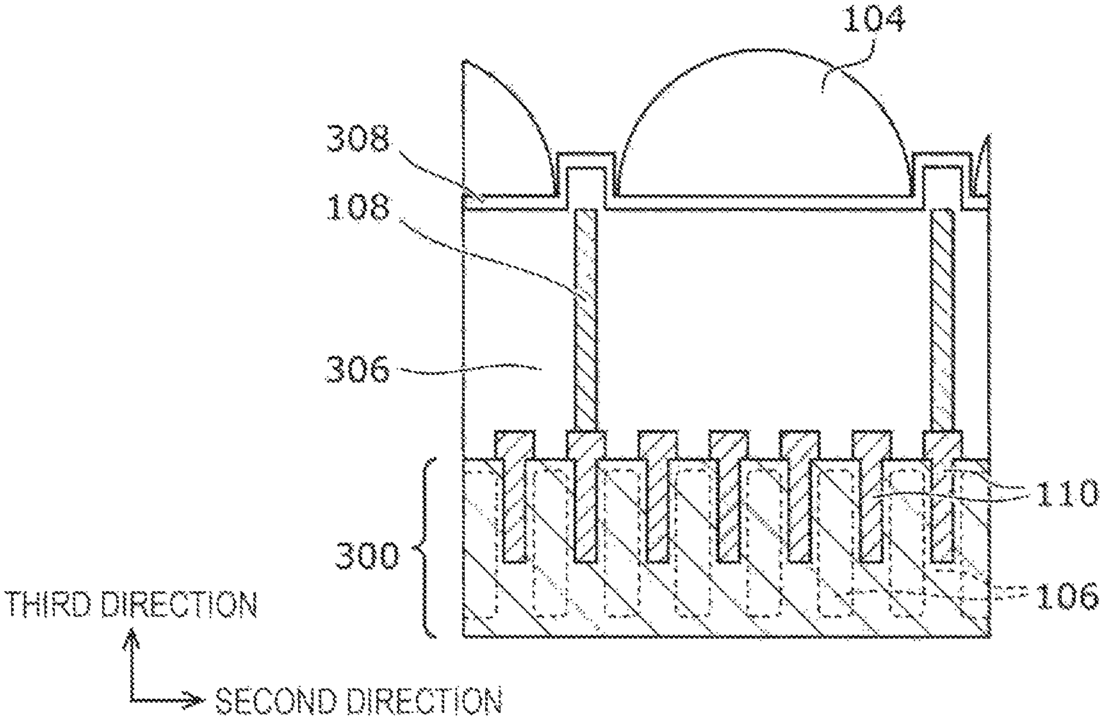

FIG. 212 is a view schematically illustrating a semiconductor process according to an embodiment.

Figure 213:
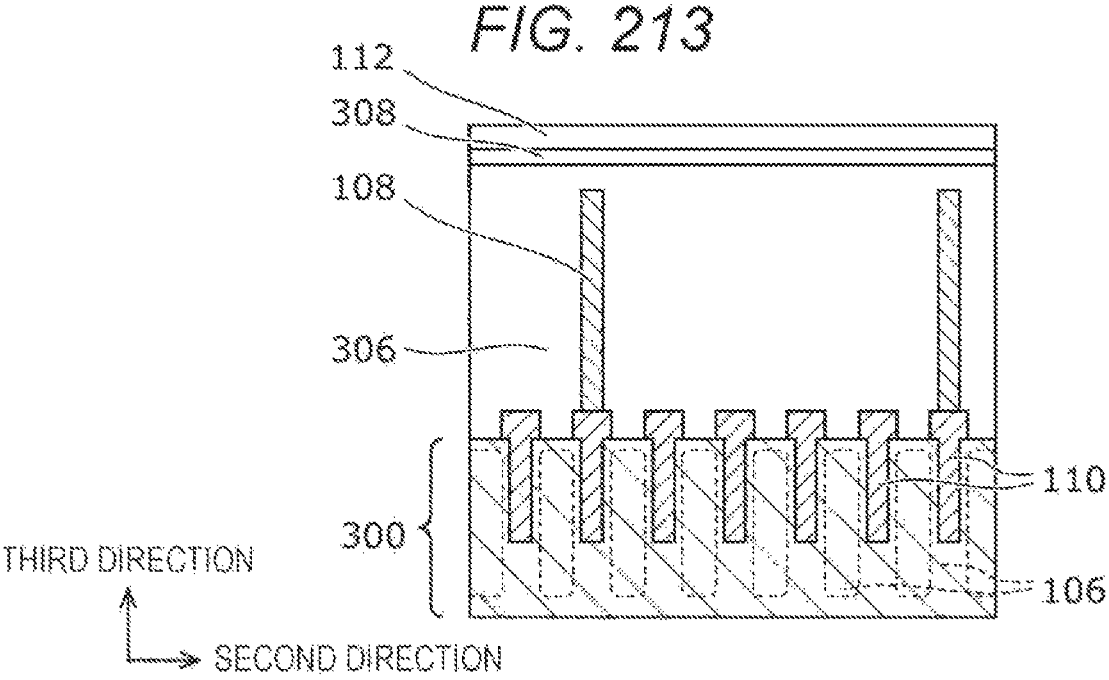

FIG. 213 is a view schematically illustrating a semiconductor process according to an embodiment.

Figure 214:
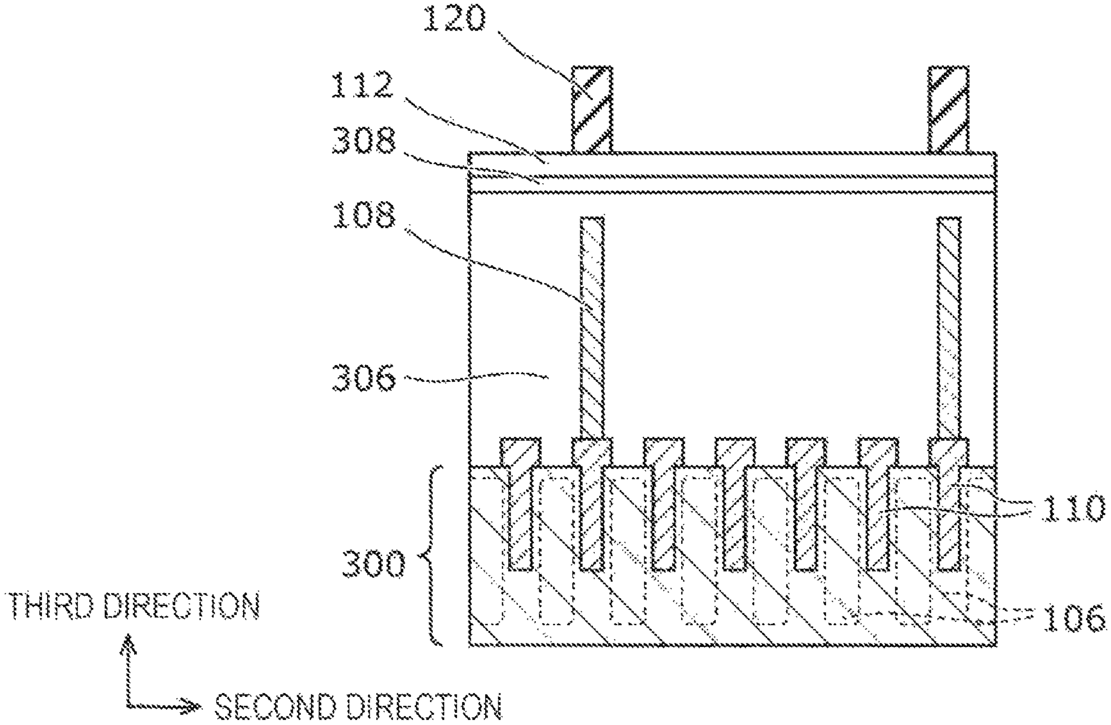

FIG. 214 is a view schematically illustrating a semiconductor process according to an embodiment.

Figure 215:
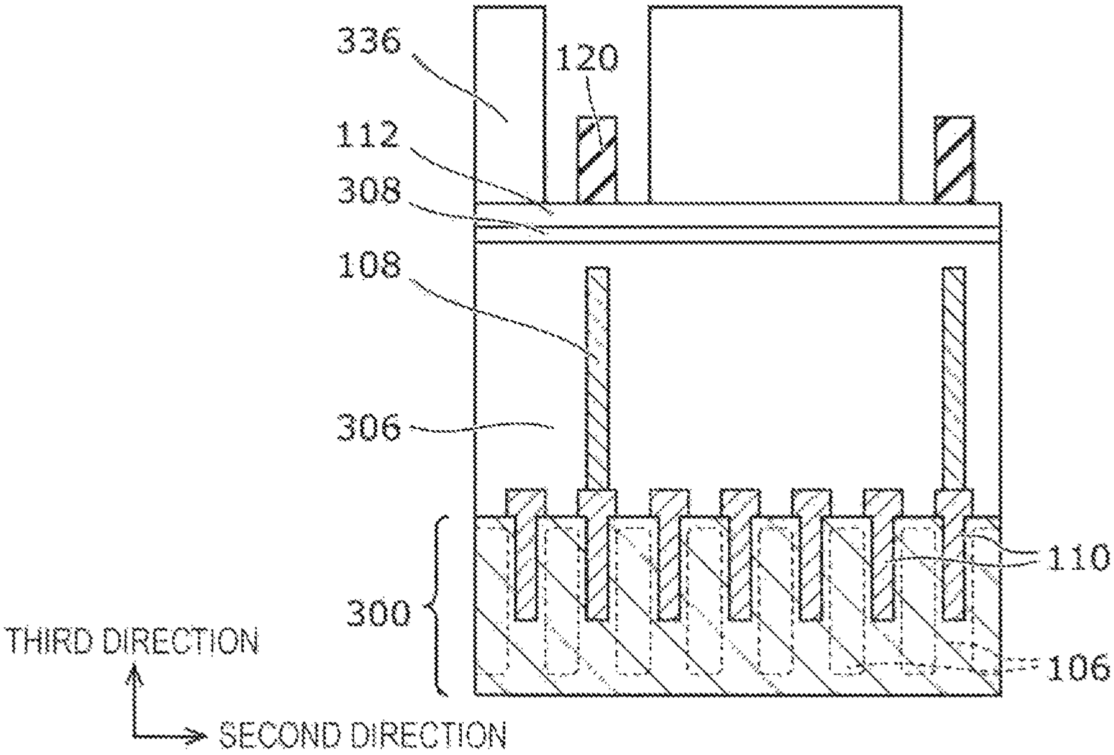

FIG. 215 is a view schematically illustrating a semiconductor process according to an embodiment.

Figure 216:
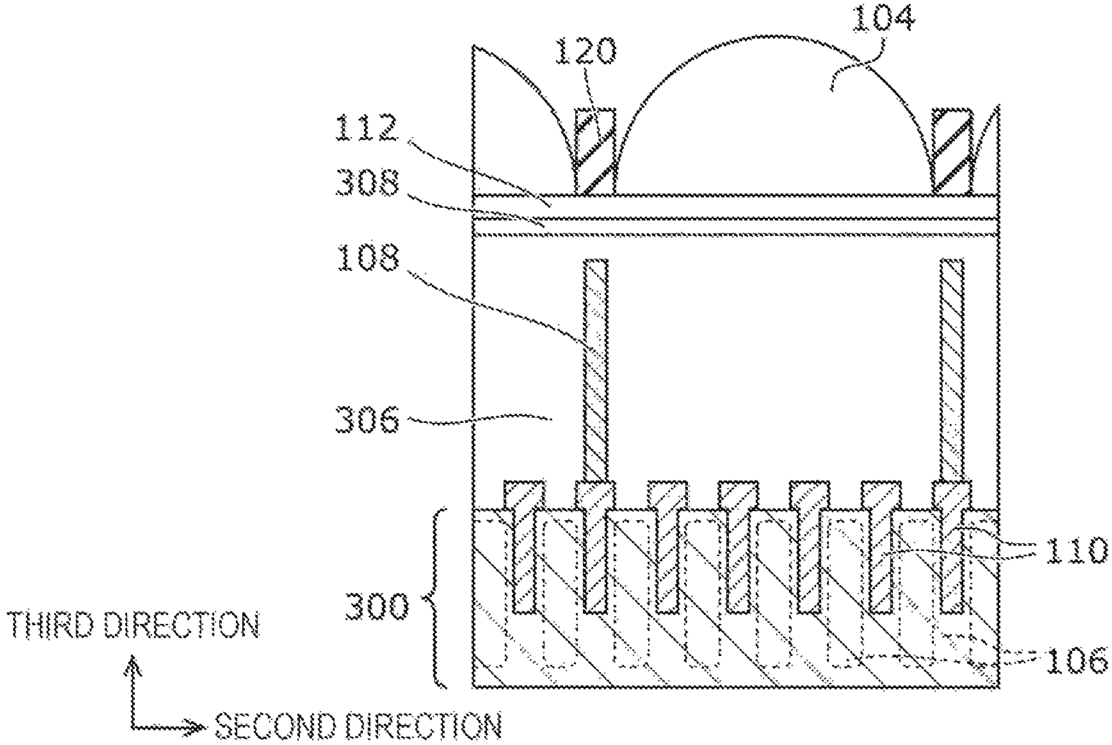

FIG. 216 is a view schematically illustrating a semiconductor process according to an embodiment.

Figure 217:
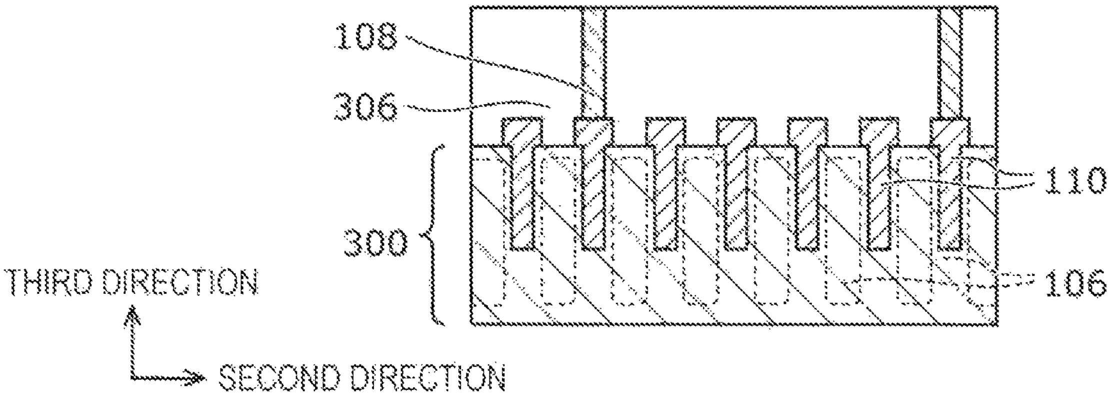

FIG. 217 is a view schematically illustrating a semiconductor process according to an embodiment.

Figure 218:
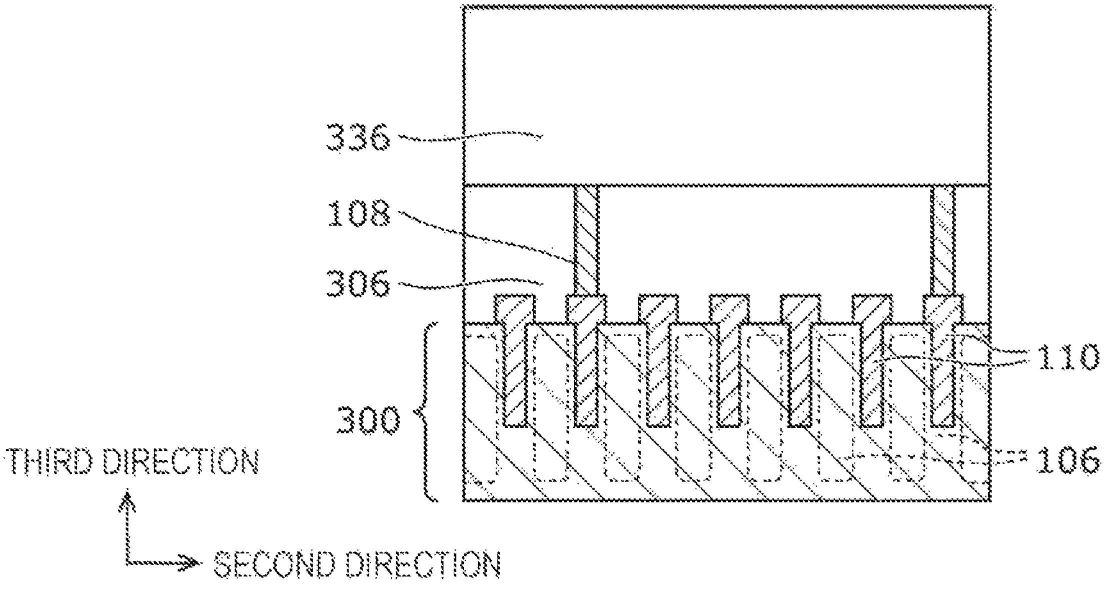

FIG. 218 is a view schematically illustrating a semiconductor process according to an embodiment.

Figure 219:
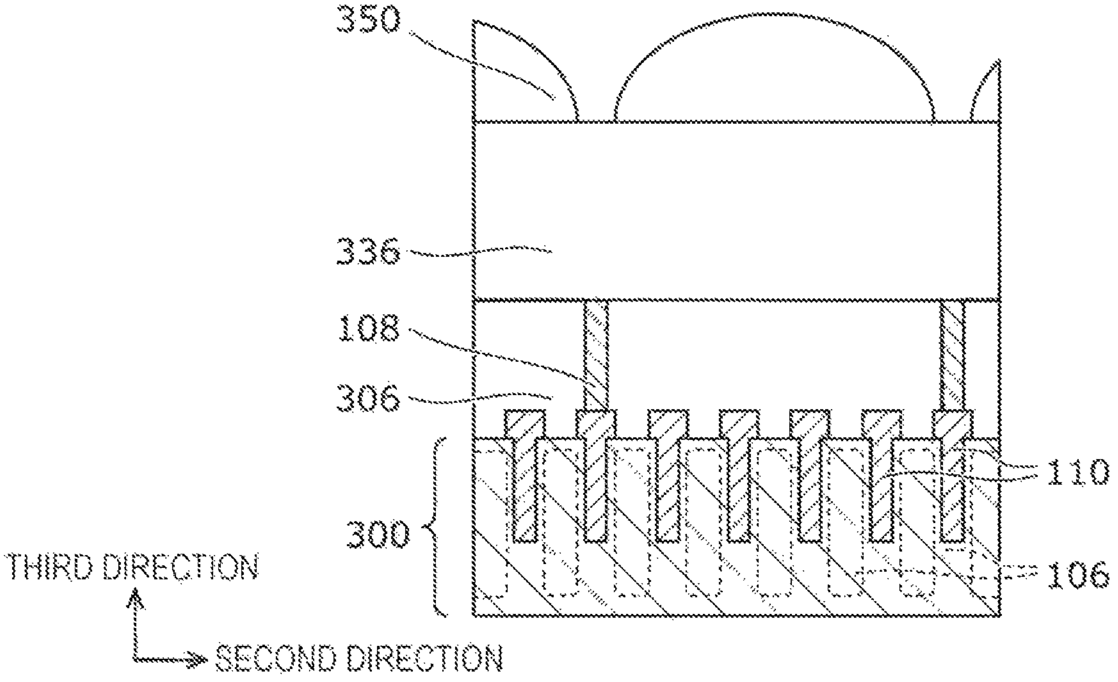

FIG. 219 is a view schematically illustrating a semiconductor process according to an embodiment.

Figure 220:
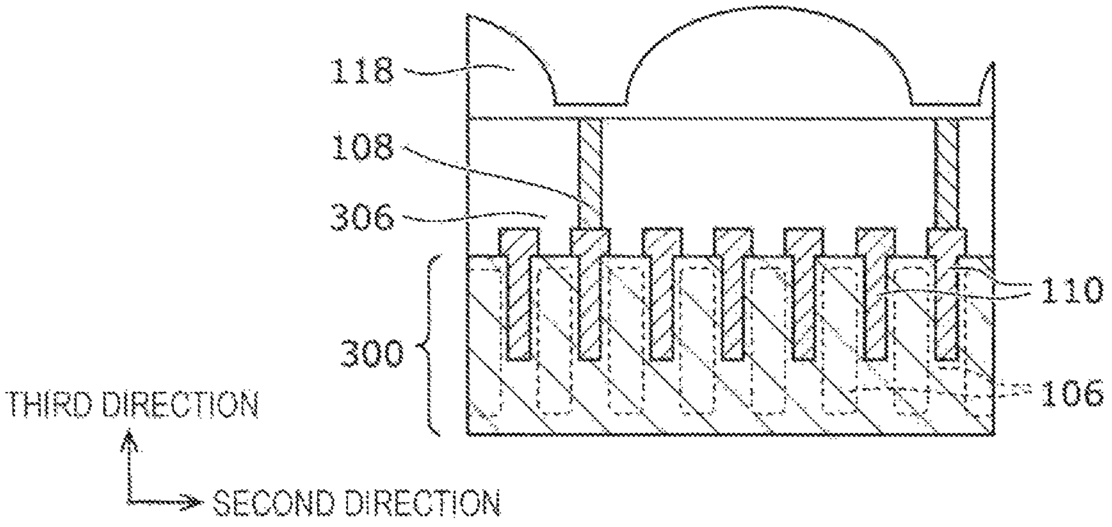

FIG. 220 is a view schematically illustrating a semiconductor process according to an embodiment.

Figure 221:
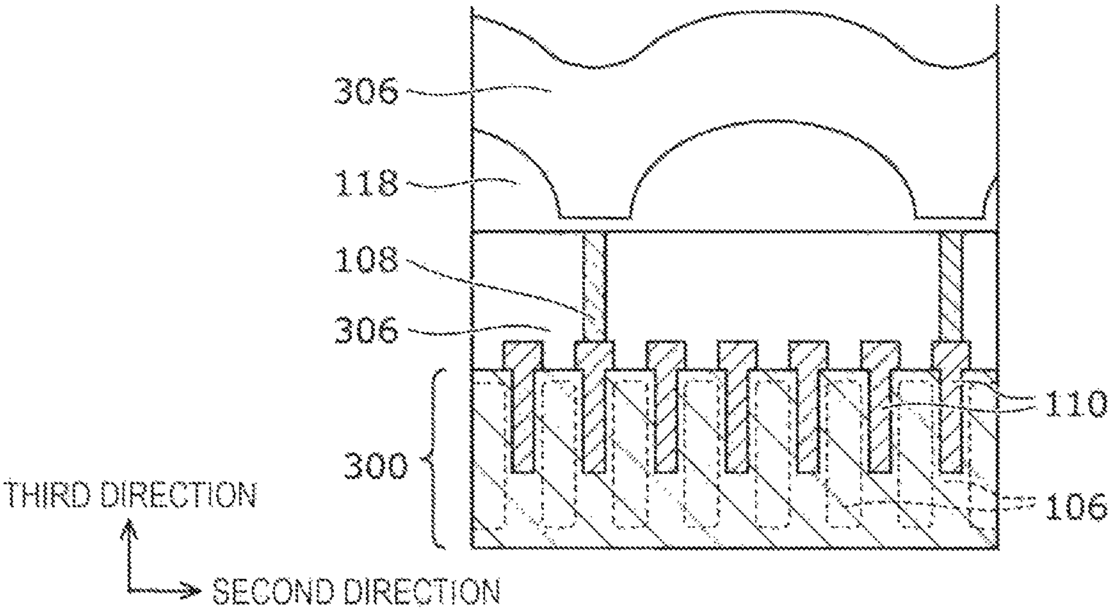

FIG. 221 is a view schematically illustrating a semiconductor process according to an embodiment.

Figure 222:
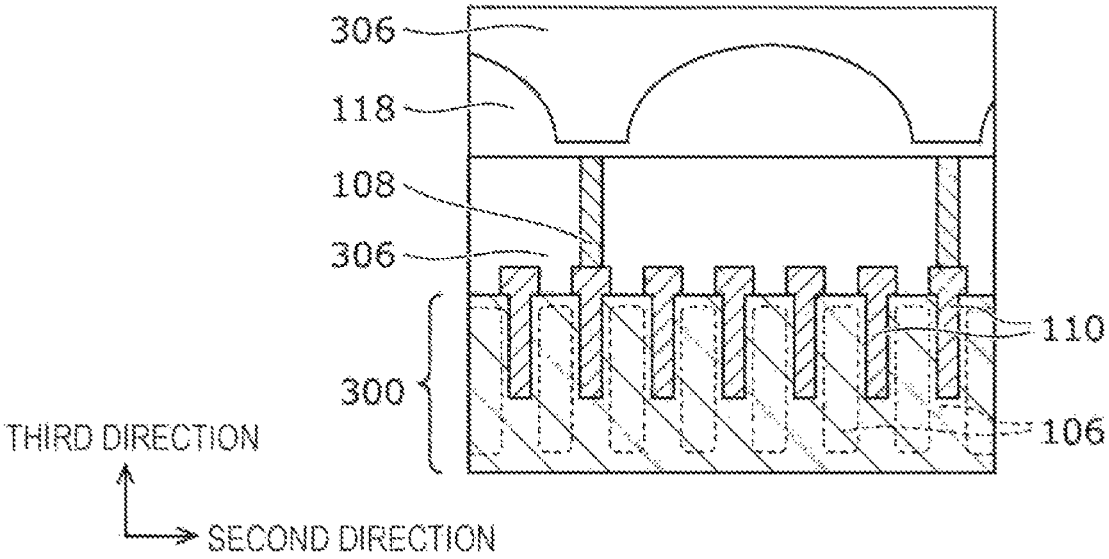

FIG. 222 is a view schematically illustrating a semiconductor process according to an embodiment.

Figure 223:
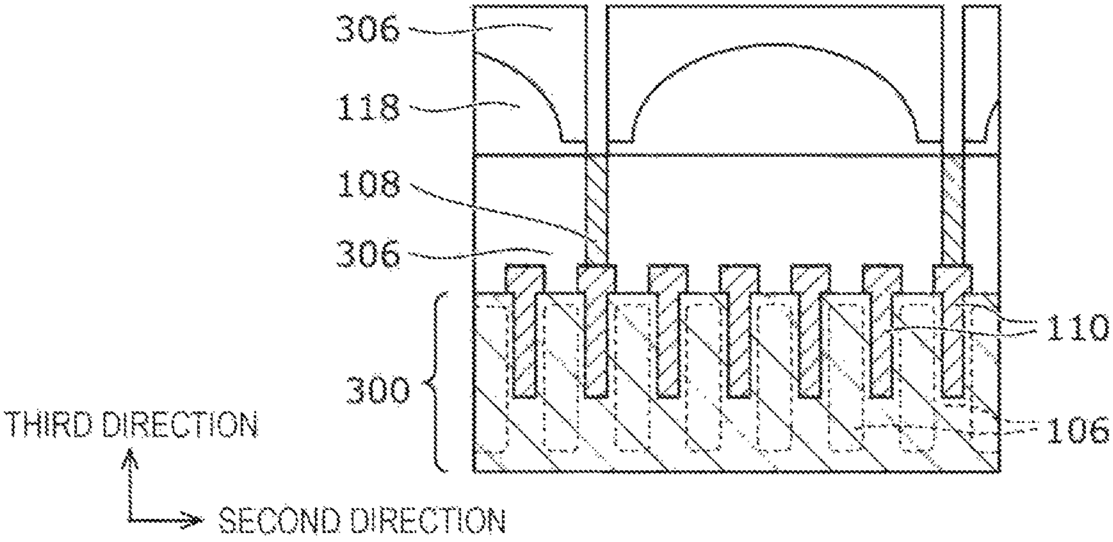

FIG. 223 is a view schematically illustrating a semiconductor process according to an embodiment.

Figure 224:
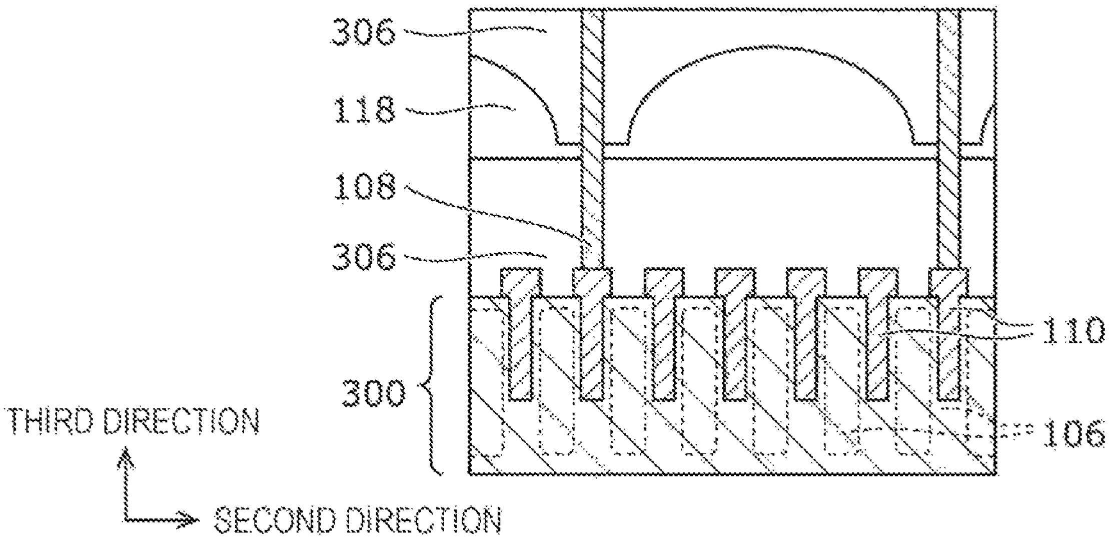

FIG. 224 is a view schematically illustrating a semiconductor process according to an embodiment.

Figure 225:
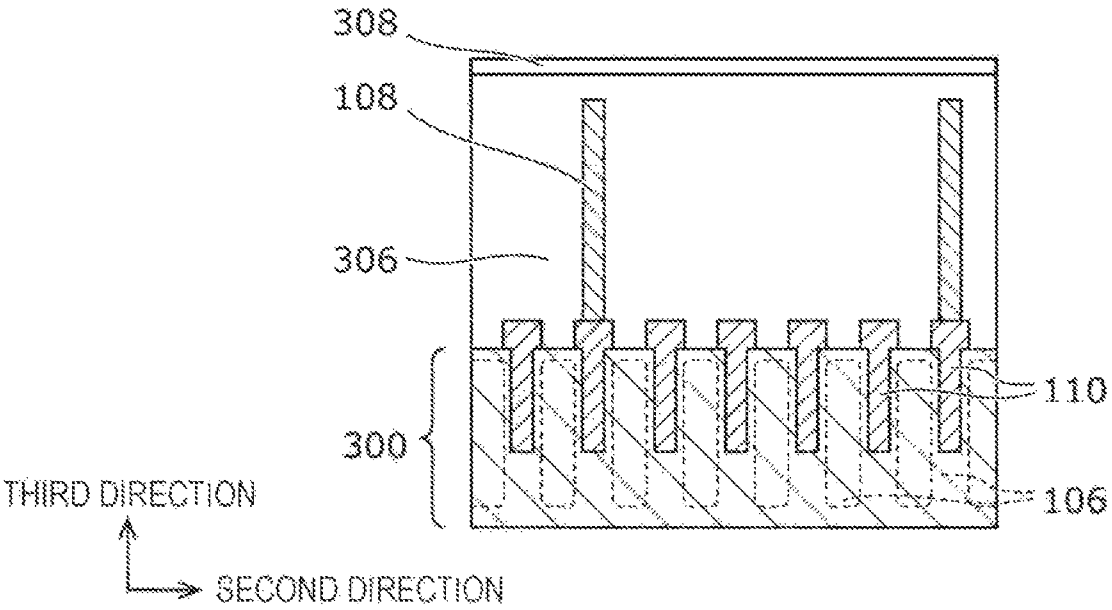

FIG. 225 is a view schematically illustrating a semiconductor process according to an embodiment.

Figure 226:
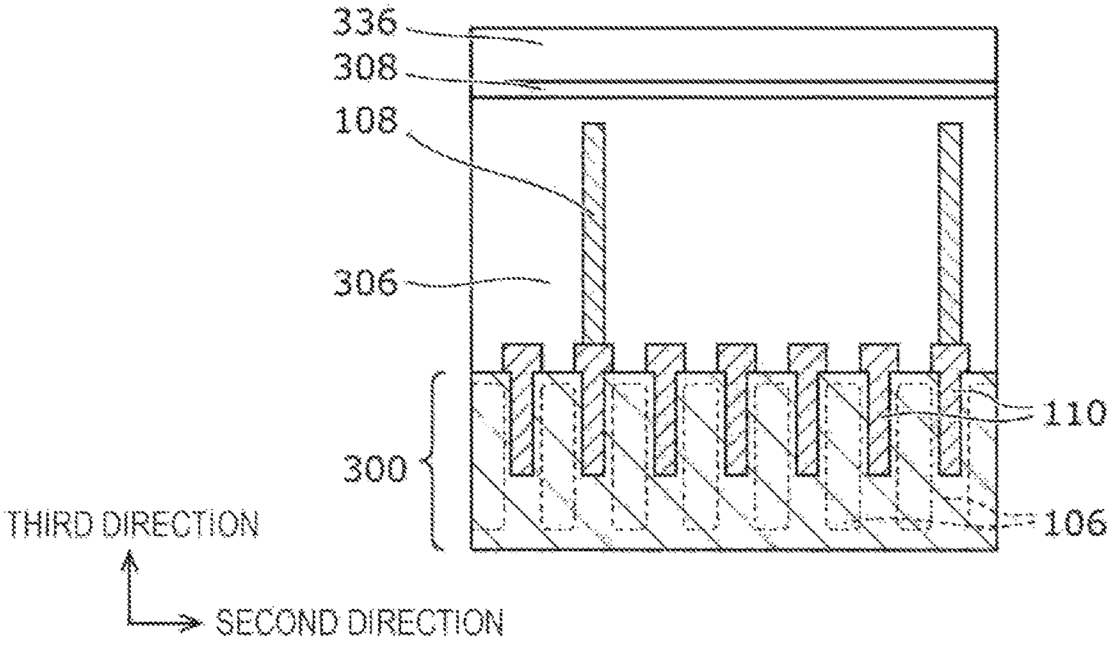

FIG. 226 is a view schematically illustrating a semiconductor process according to an embodiment.

Figure 227:
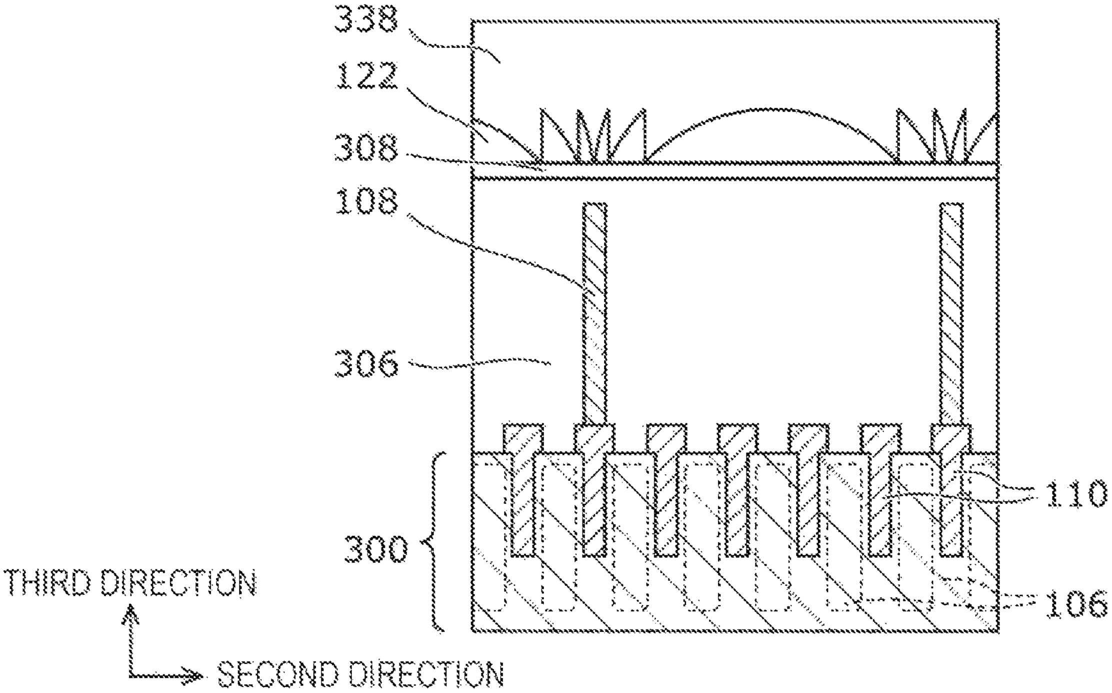

FIG. 227 is a view schematically illustrating a semiconductor process according to an embodiment.

Figure 228:
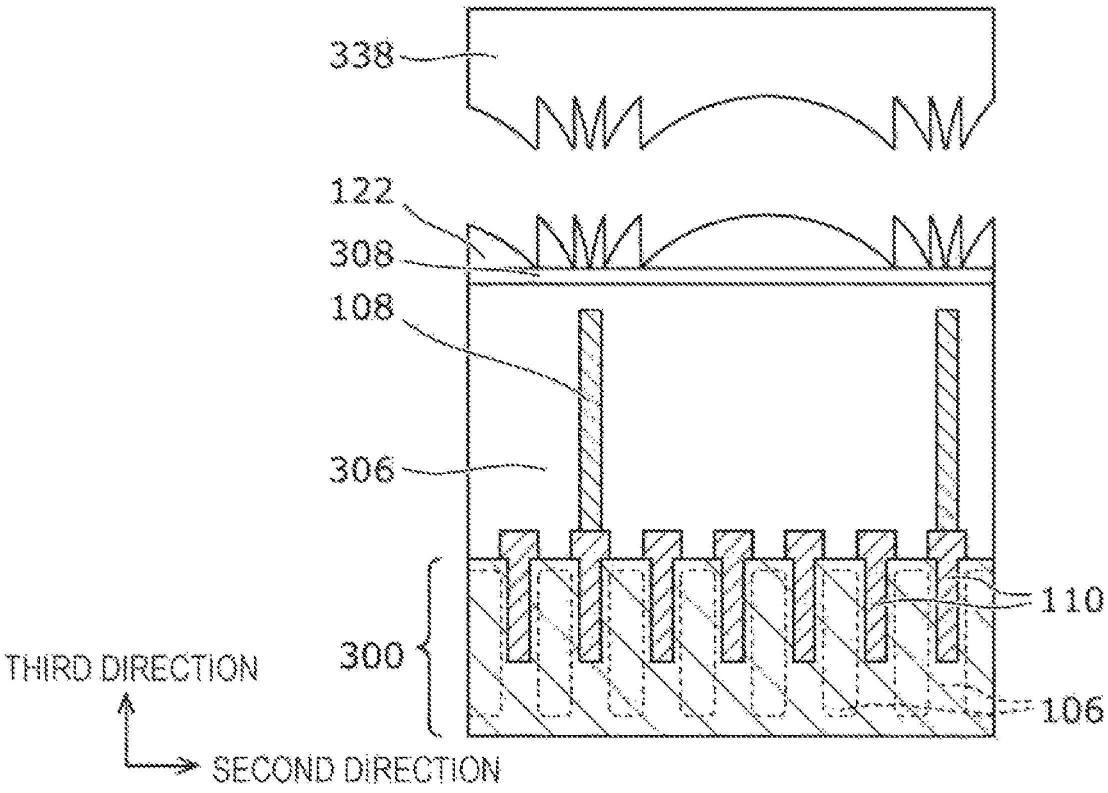

FIG. 228 is a view schematically illustrating a semiconductor process according to an embodiment.

Figure 229:
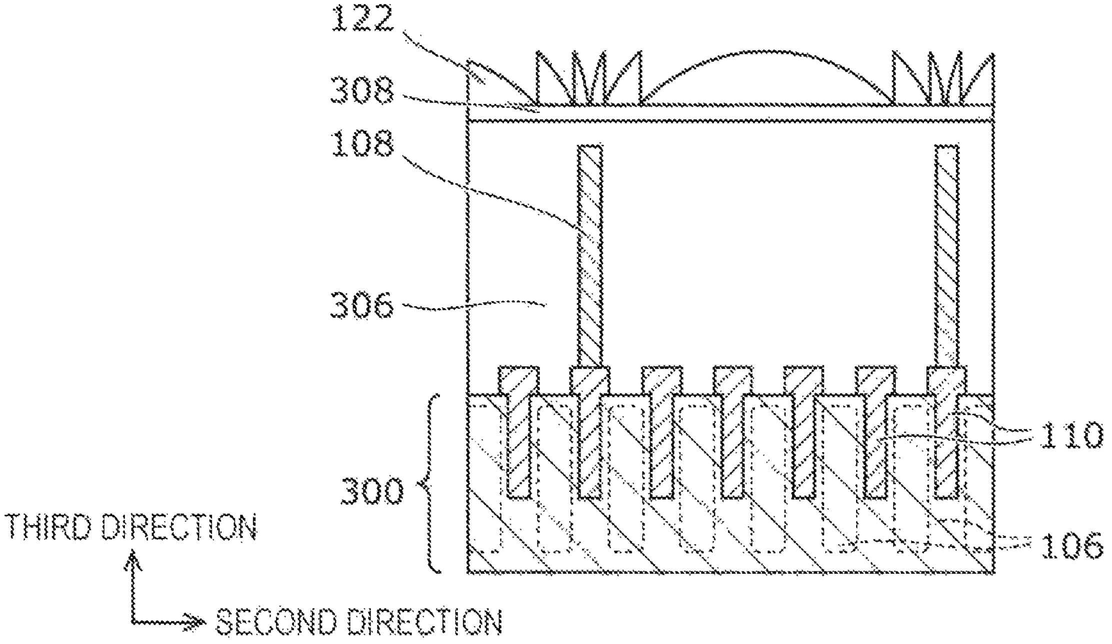

FIG. 229 is a view schematically illustrating a semiconductor process according to an embodiment.

Figure 230:
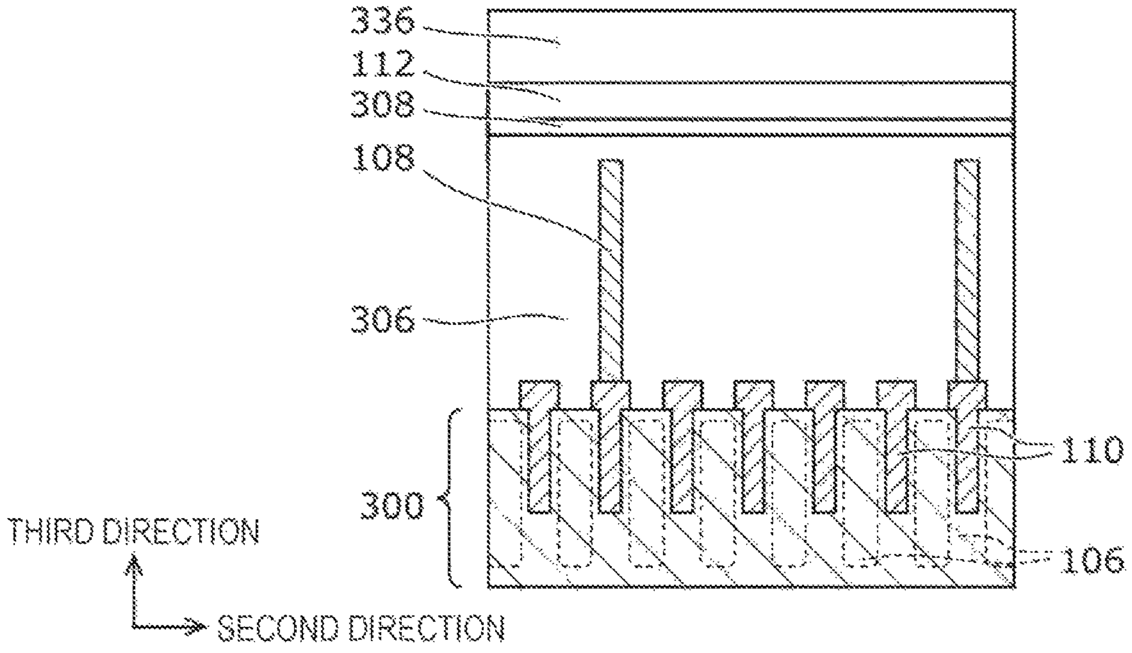

FIG. 230 is a view schematically illustrating a semiconductor process according to an embodiment.

FIG. 231 is views schematically illustrating a semiconductor process according to an embodiment.

Figure 232:
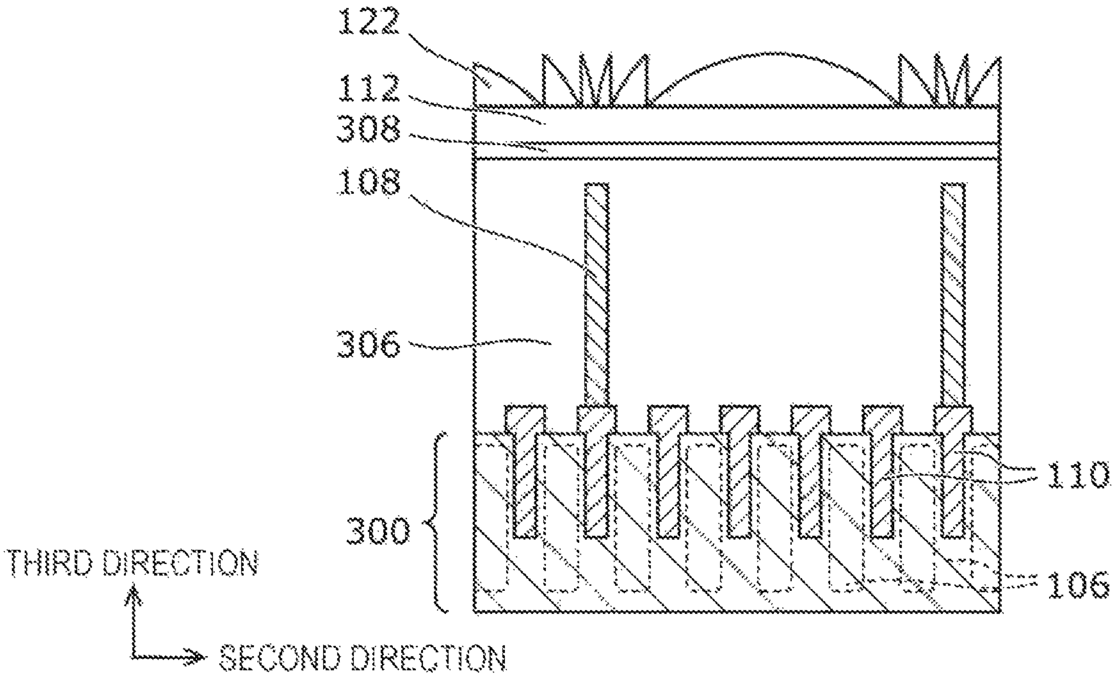

FIG. 232 is a view schematically illustrating a semiconductor process according to an embodiment.

Figure 233:
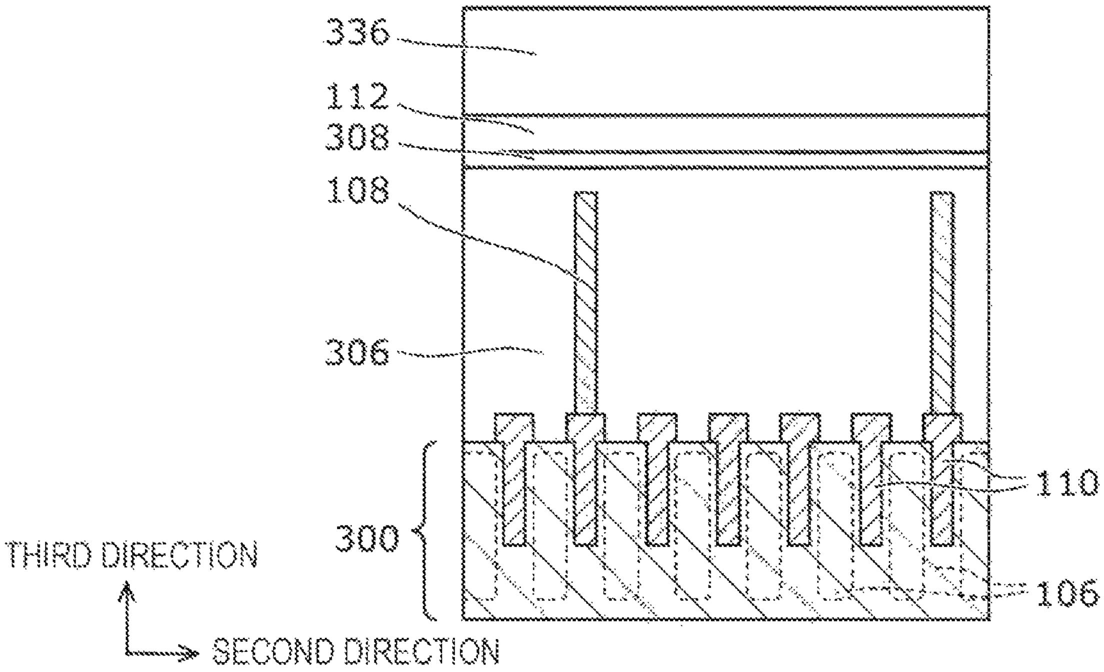

FIG. 233 is a view schematically illustrating a semiconductor process according to an embodiment.

Figure 234:
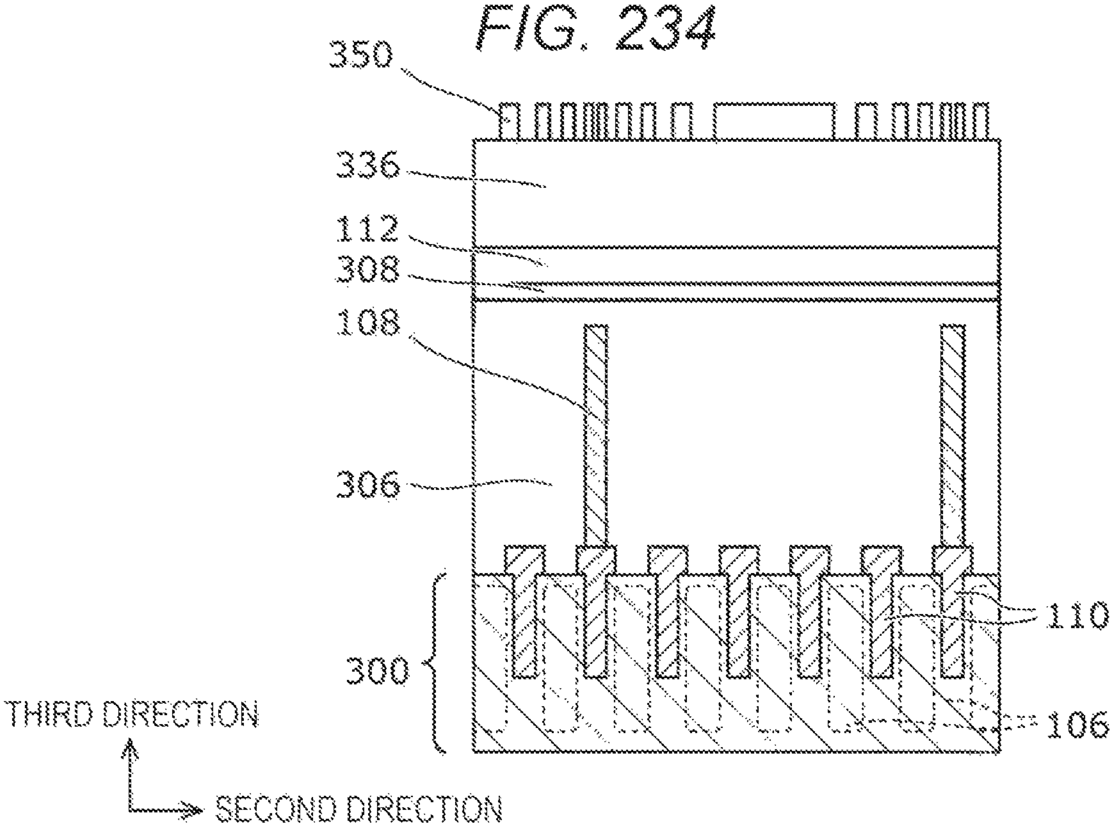

FIG. 234 is a view schematically illustrating a semiconductor process according to an embodiment.

Figure 235:
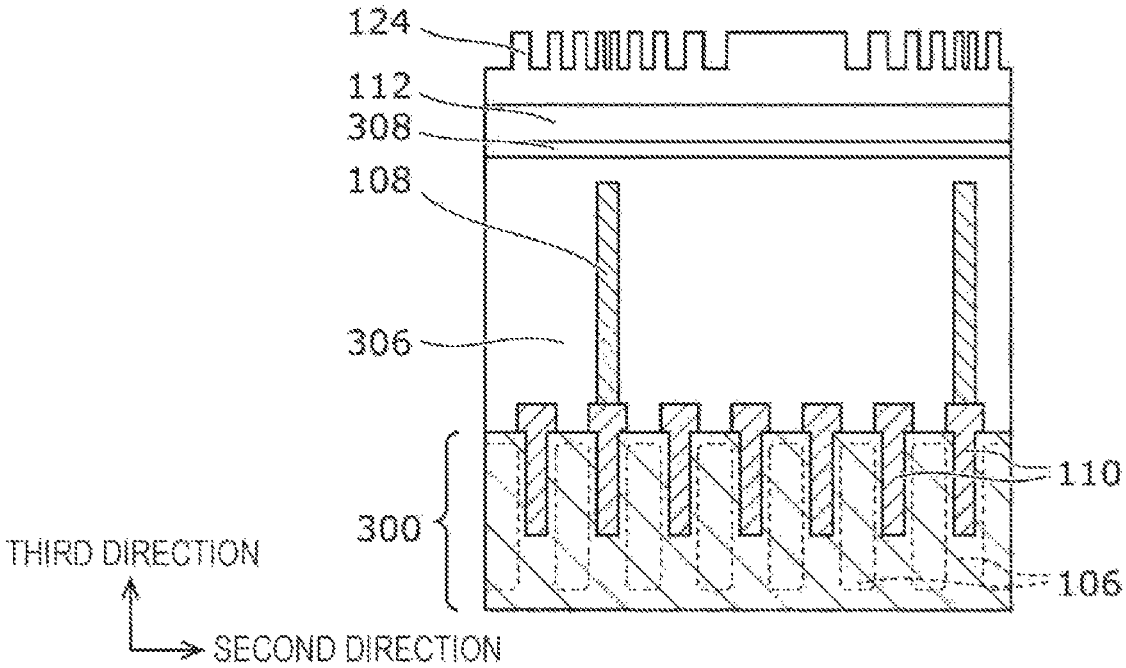

FIG. 235 is a view schematically illustrating a semiconductor process according to an embodiment.

Figure 236:
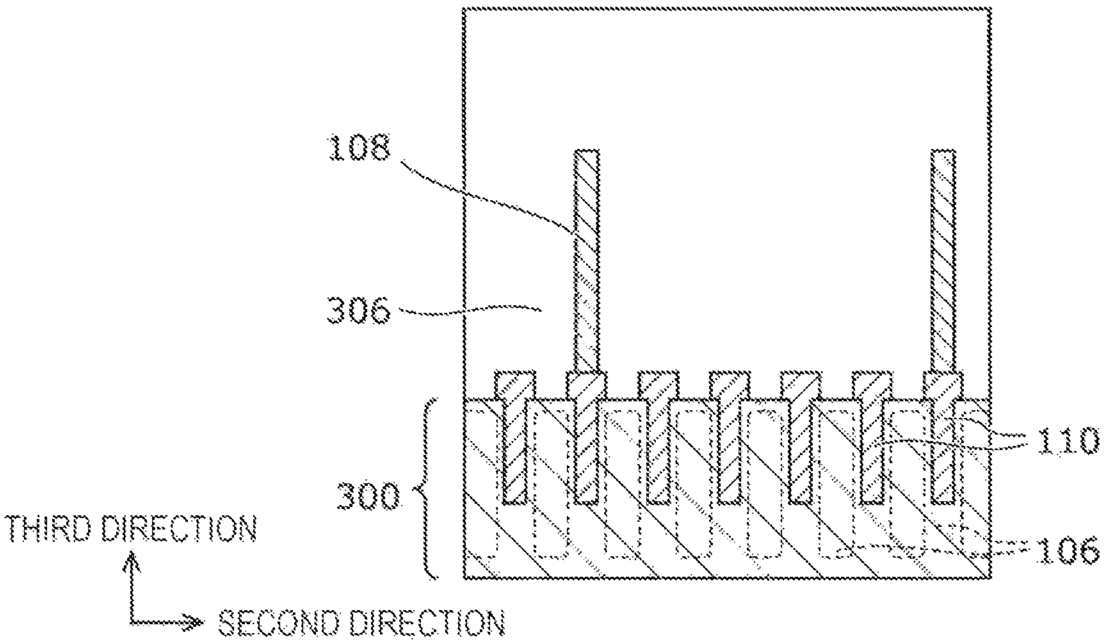

FIG. 236 is a view schematically illustrating a semiconductor process according to an embodiment.

Figure 237:
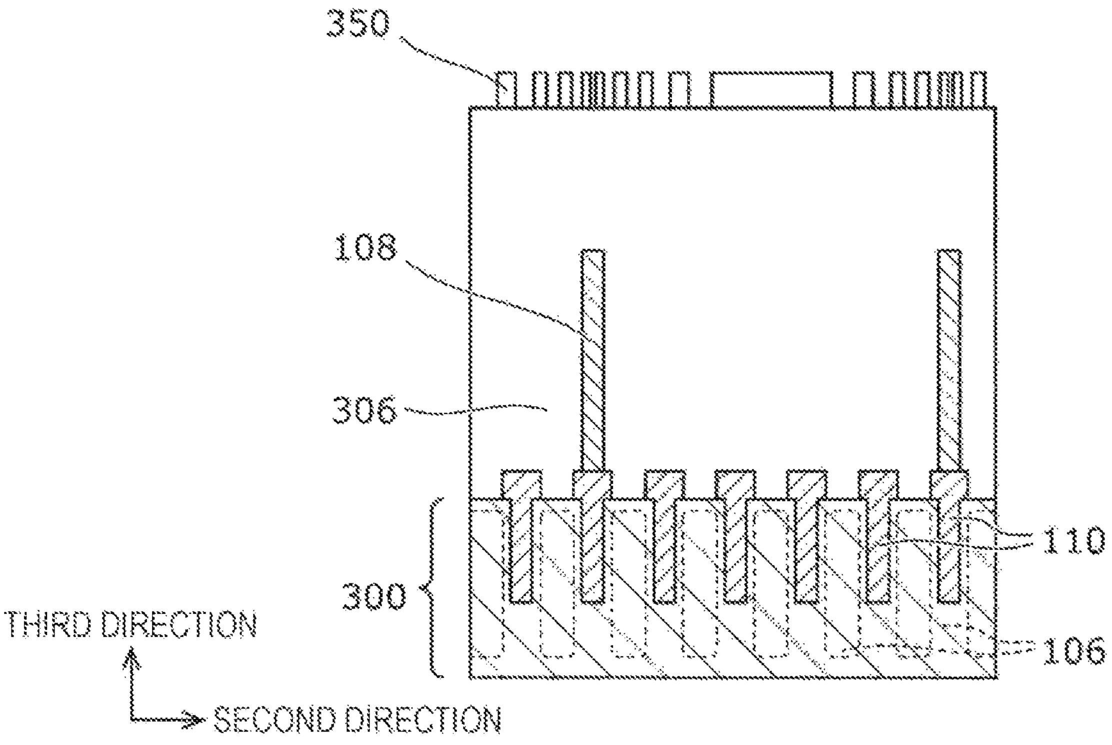

FIG. 237 is a view schematically illustrating a semiconductor process according to an embodiment.

Figure 238:
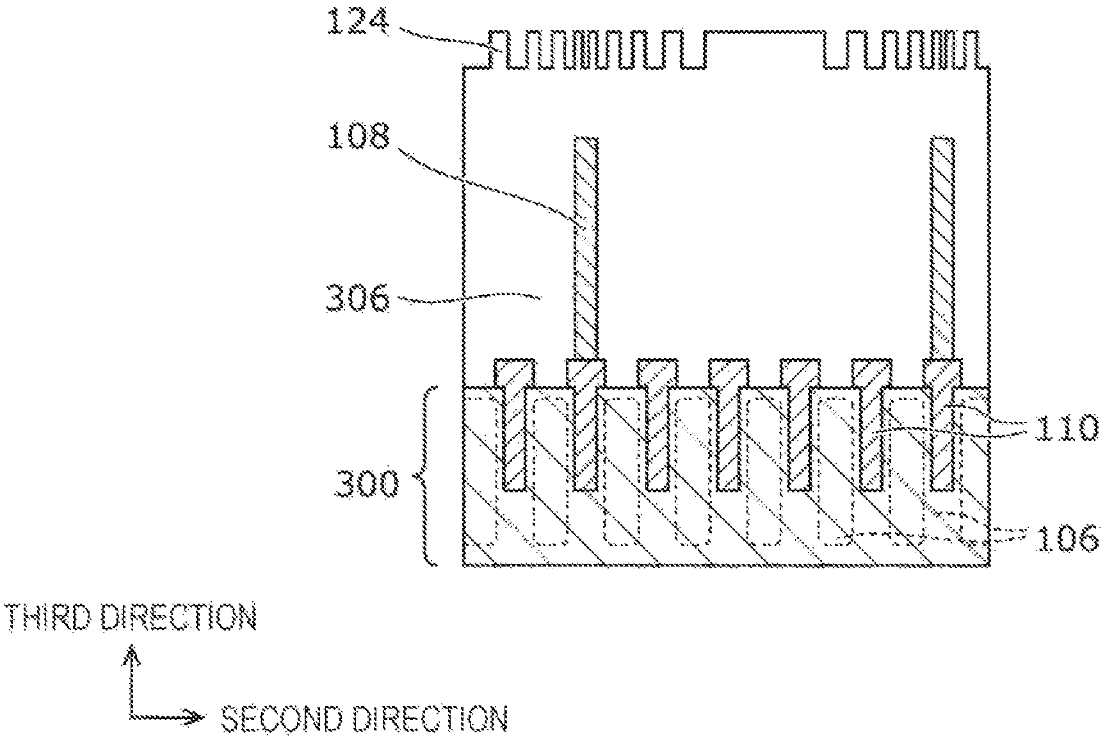

FIG. 238 is a view schematically illustrating a semiconductor process according to an embodiment.

Figure 239:
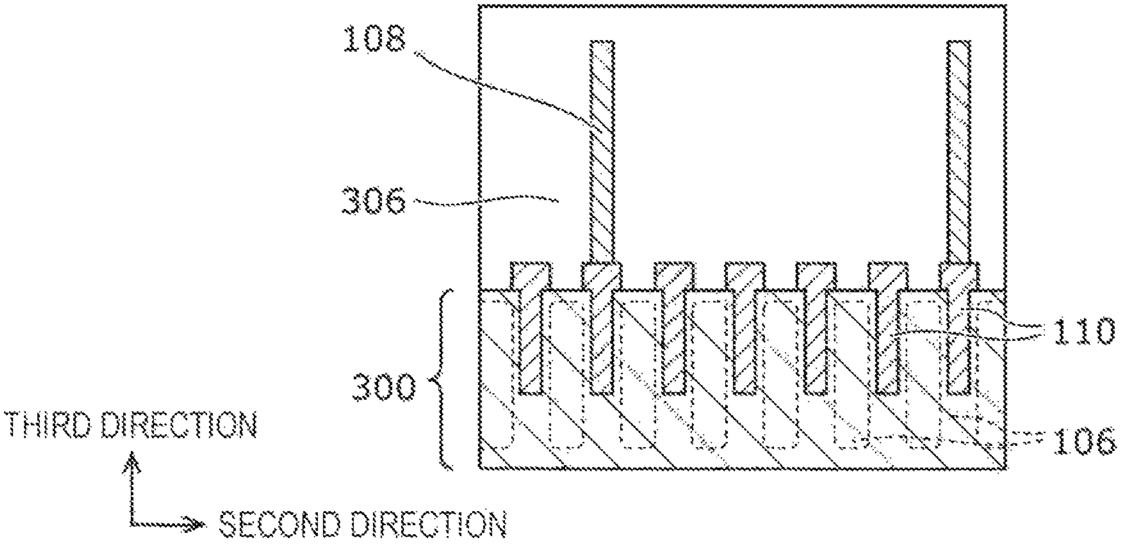

FIG. 239 is a view schematically illustrating a semiconductor process according to an embodiment.

Figure 240:
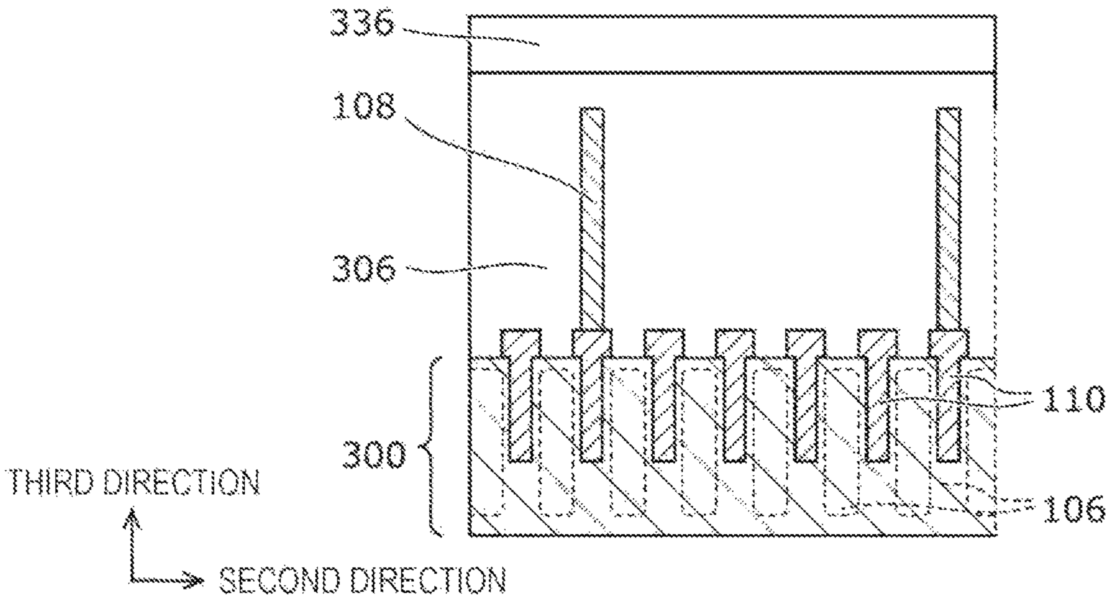

FIG. 240 is a view schematically illustrating a semiconductor process according to an embodiment.

Figure 241:
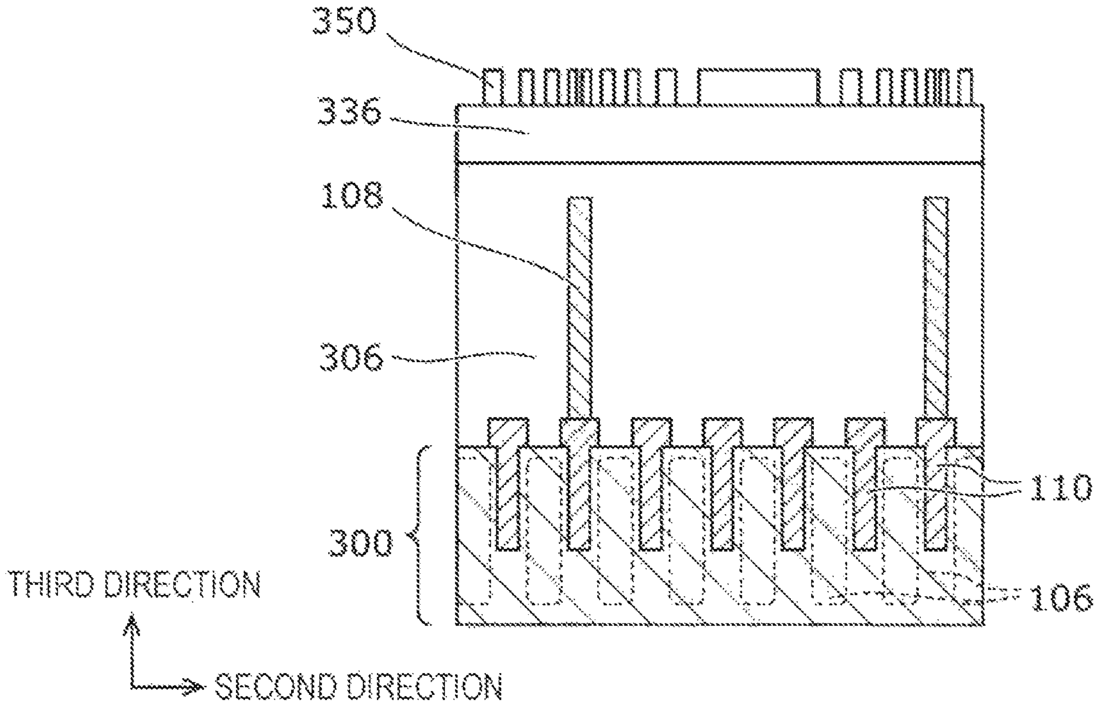

FIG. 241 is a view schematically illustrating a semiconductor process according to an embodiment.

Figure 242:
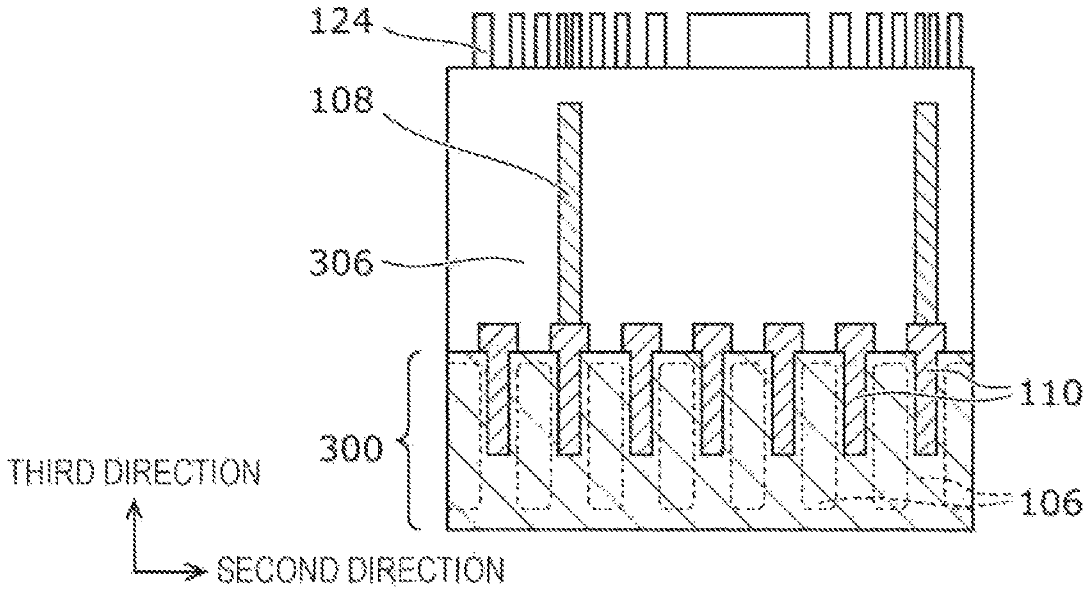

FIG. 242 is a view schematically illustrating a semiconductor process according to an embodiment.

Figure 243:
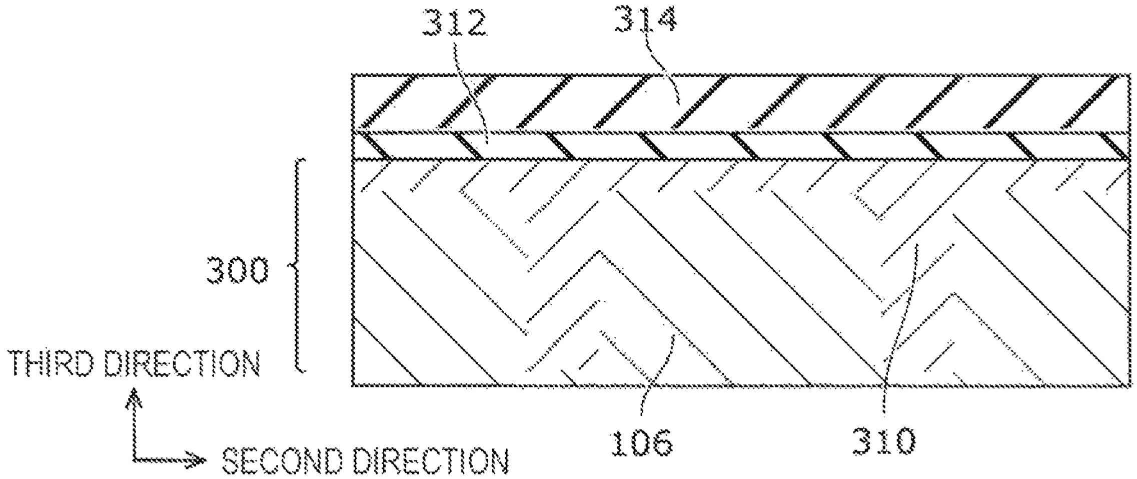

FIG. 243 is a view schematically illustrating a semiconductor process according to an embodiment.

Figure 244A:
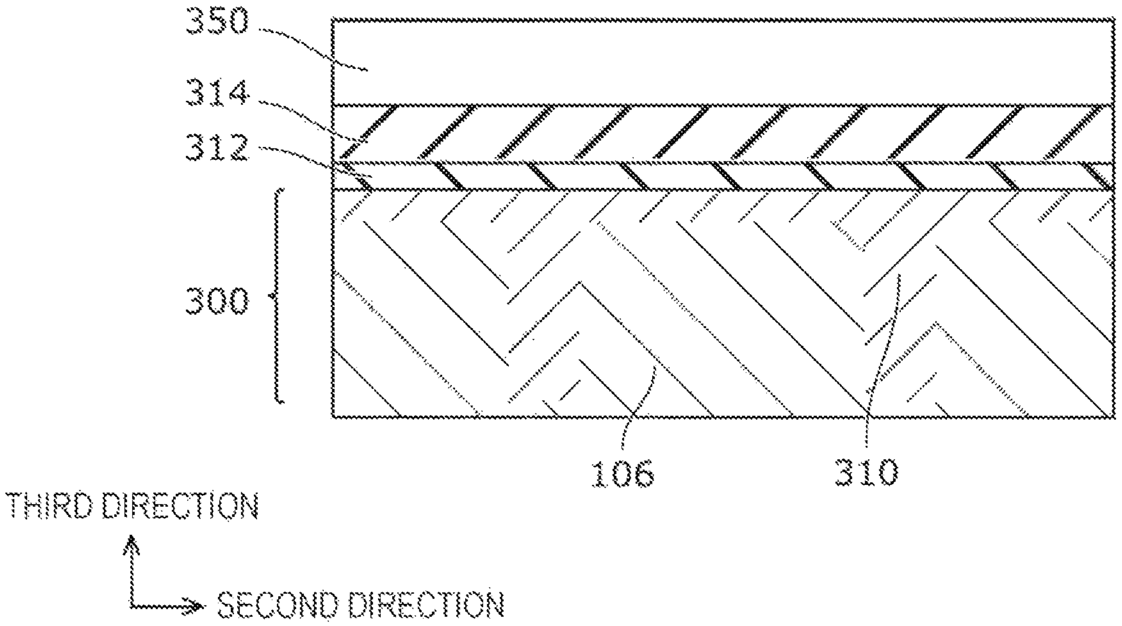

FIG. 244A is a view schematically illustrating a semiconductor process according to an embodiment.

Figure 244B:
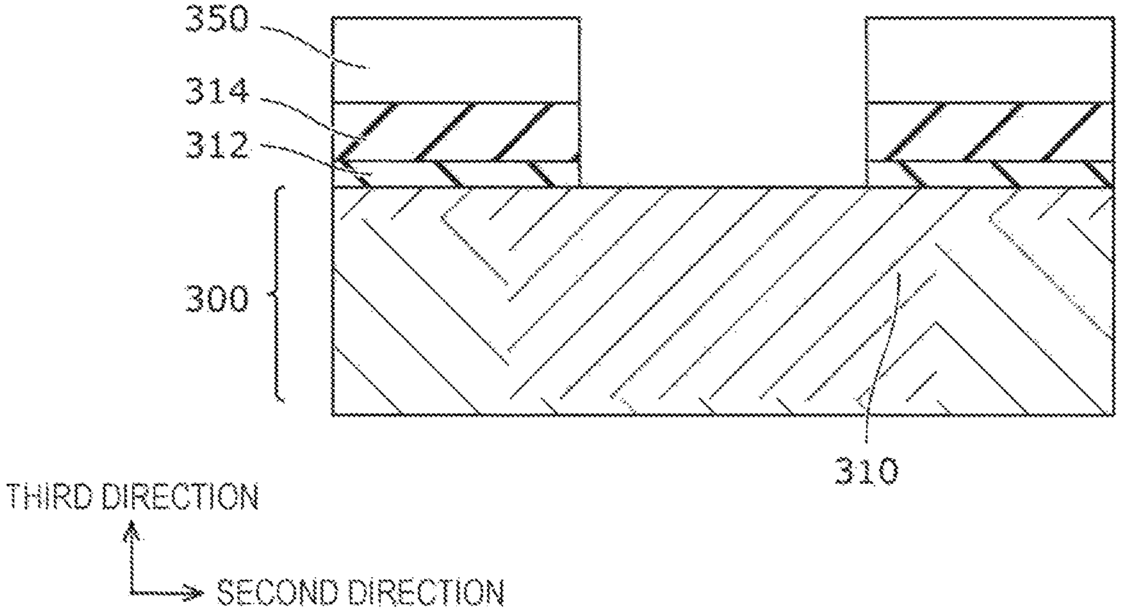

FIG. 244B is a view schematically illustrating a semiconductor process according to an embodiment.

Figure 245A:
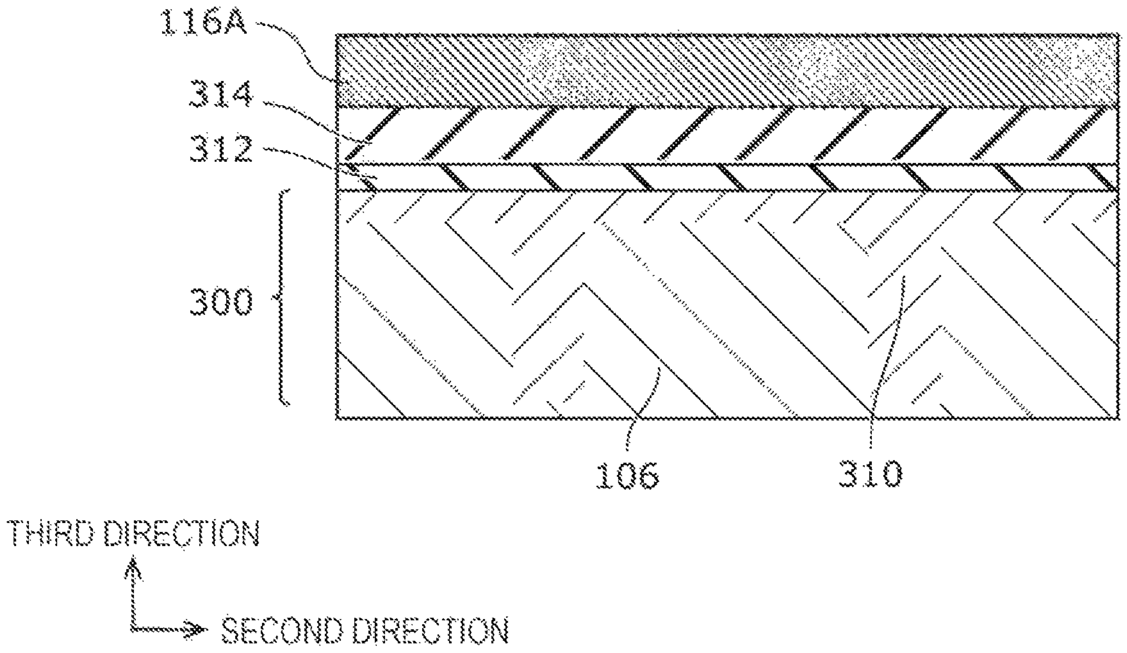

FIG. 245A is a view schematically illustrating a semiconductor process according to an embodiment.

Figure 245B:
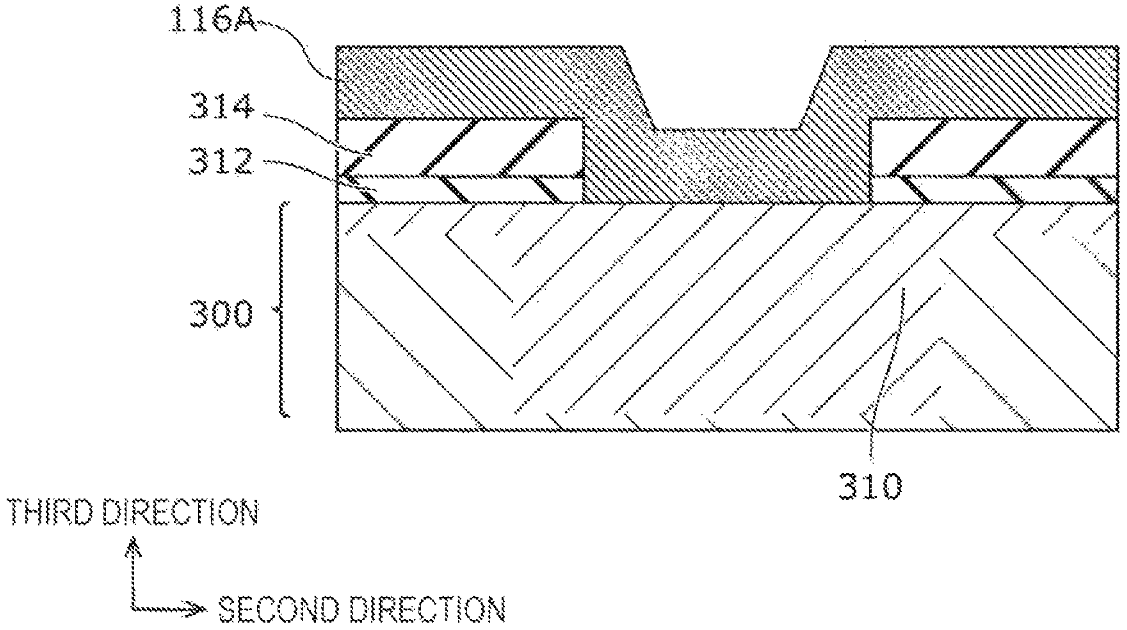

FIG. 245B is a view schematically illustrating a semiconductor process according to an embodiment.

Figure 246A:
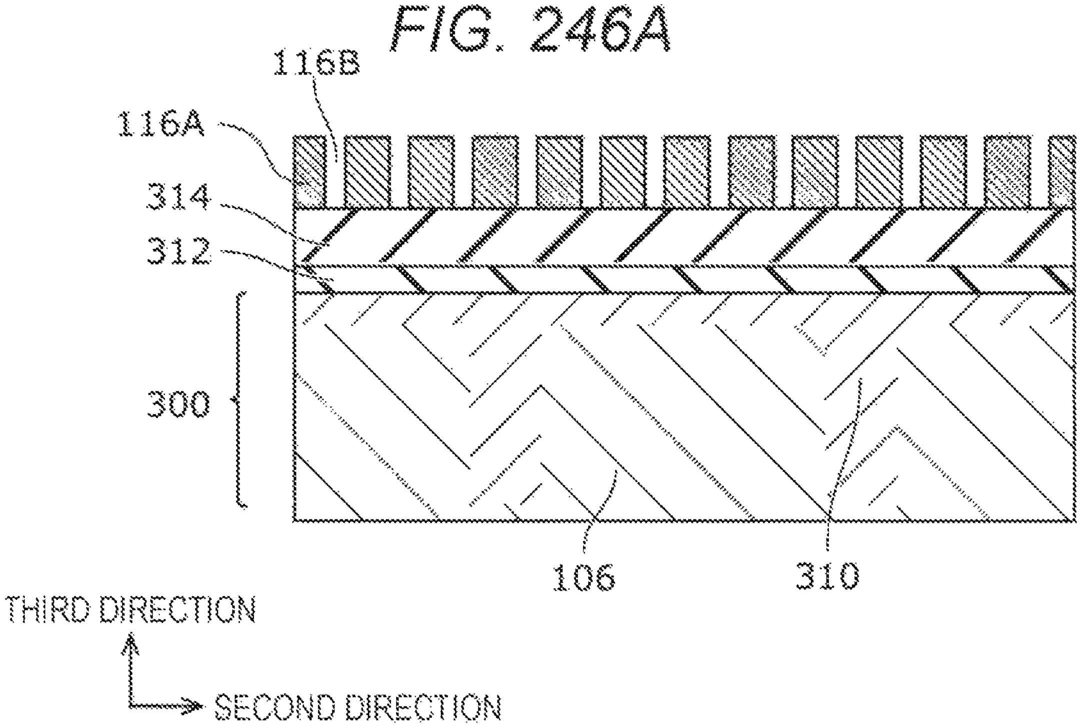

FIG. 246A is a view schematically illustrating a semiconductor process according to an embodiment.

Figure 246B:
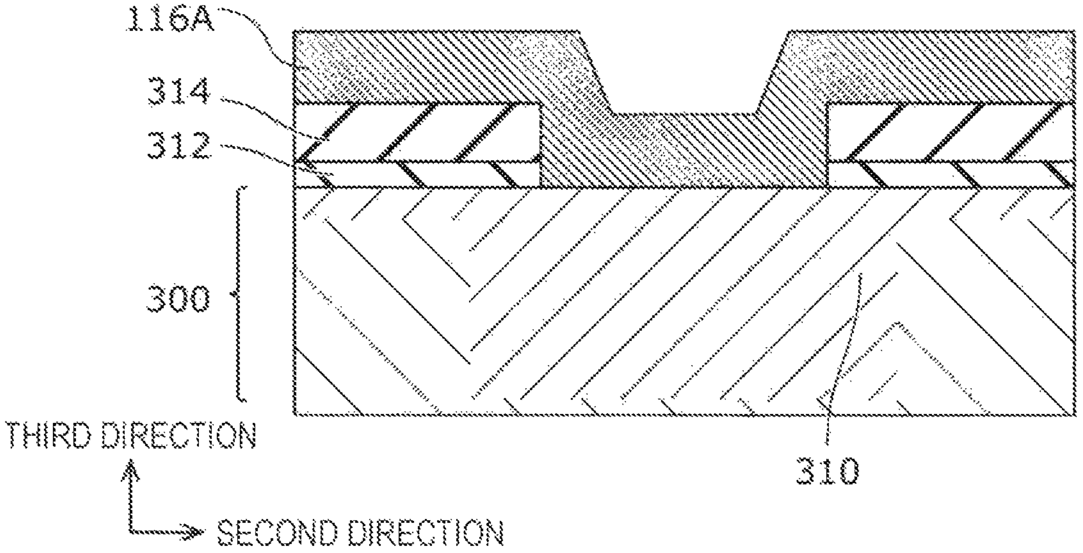

FIG. 246B is a view schematically illustrating a semiconductor process according to an embodiment.

Figure 247:
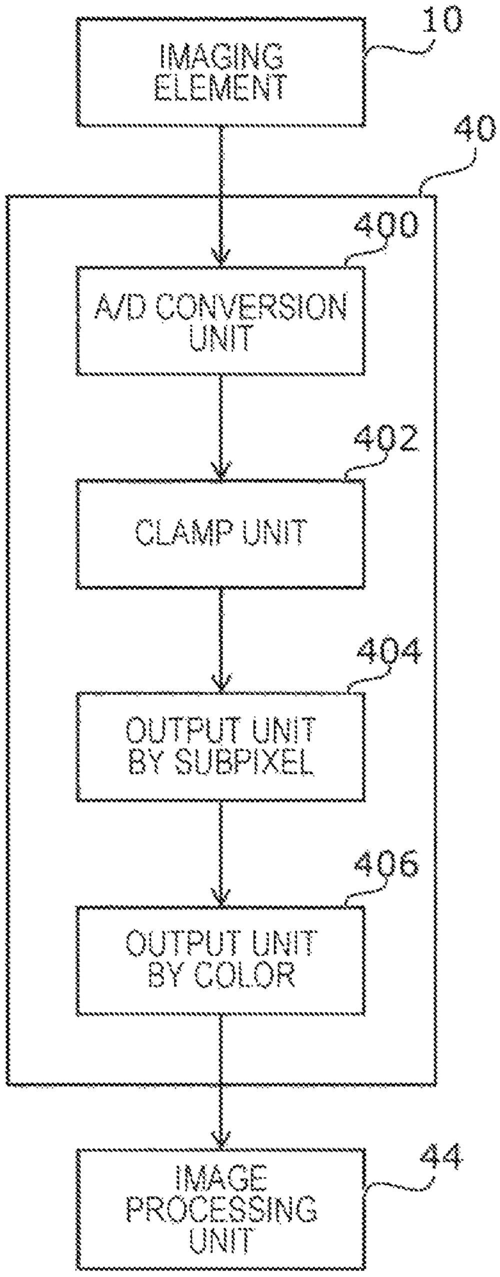

FIG. 247 is a block diagram schematically illustrating a signal processing device according to an embodiment.

Figure 248:
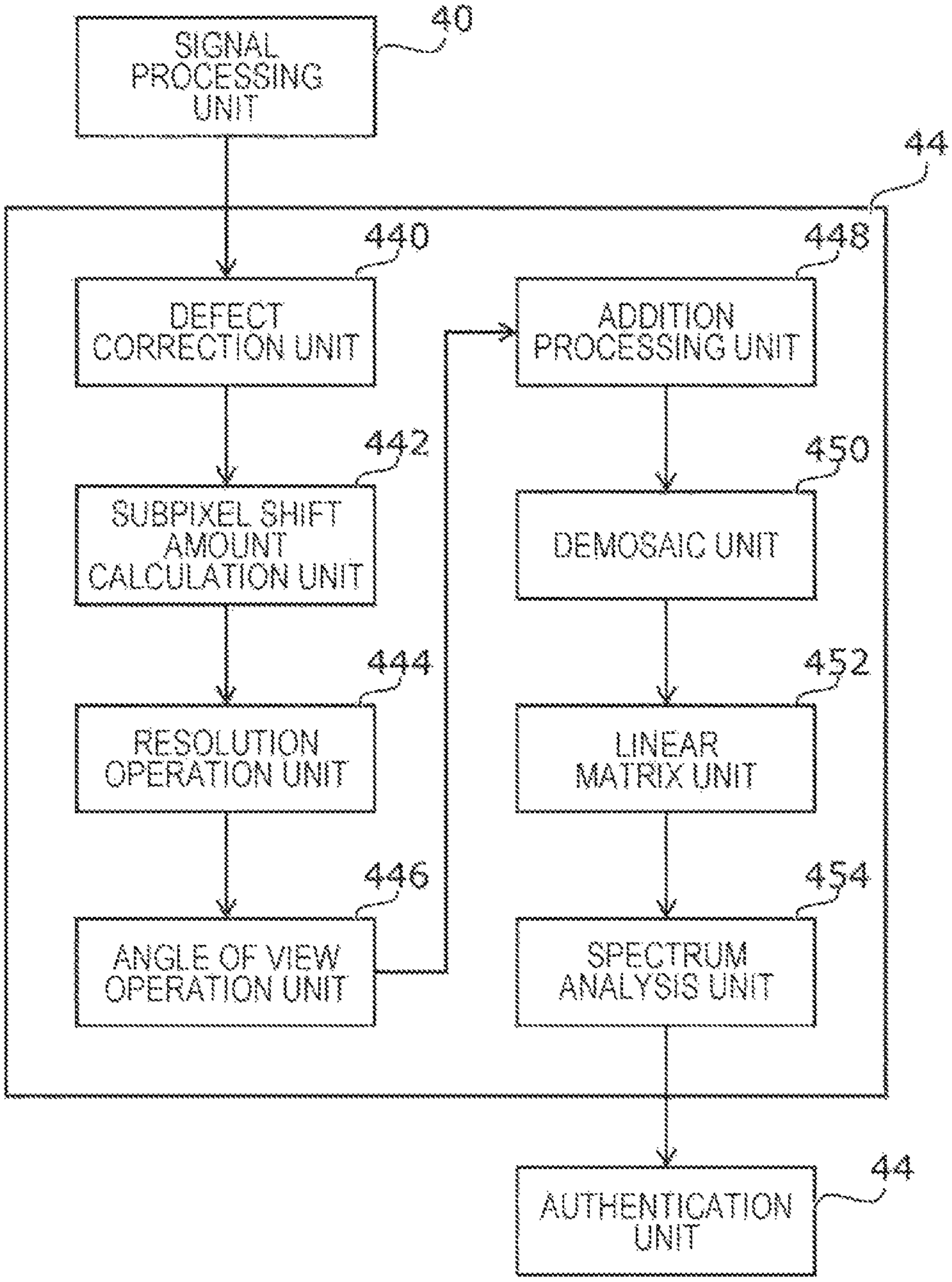

FIG. 248 is a block diagram schematically illustrating a signal processing device according to an embodiment.

Figure 249:
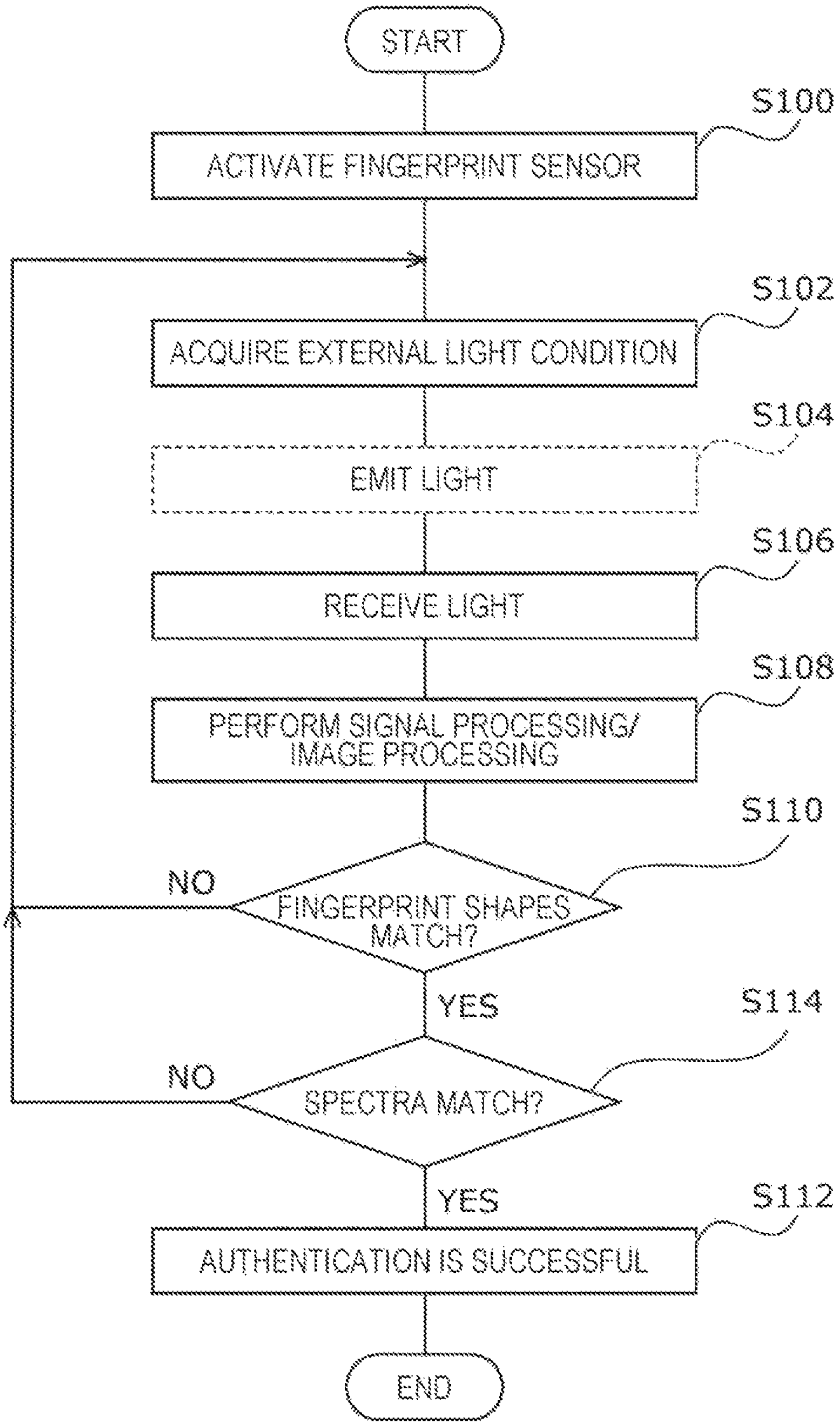

FIG. 249 is a flowchart illustrating processing of an electronic device according to an embodiment.

Figure 250:
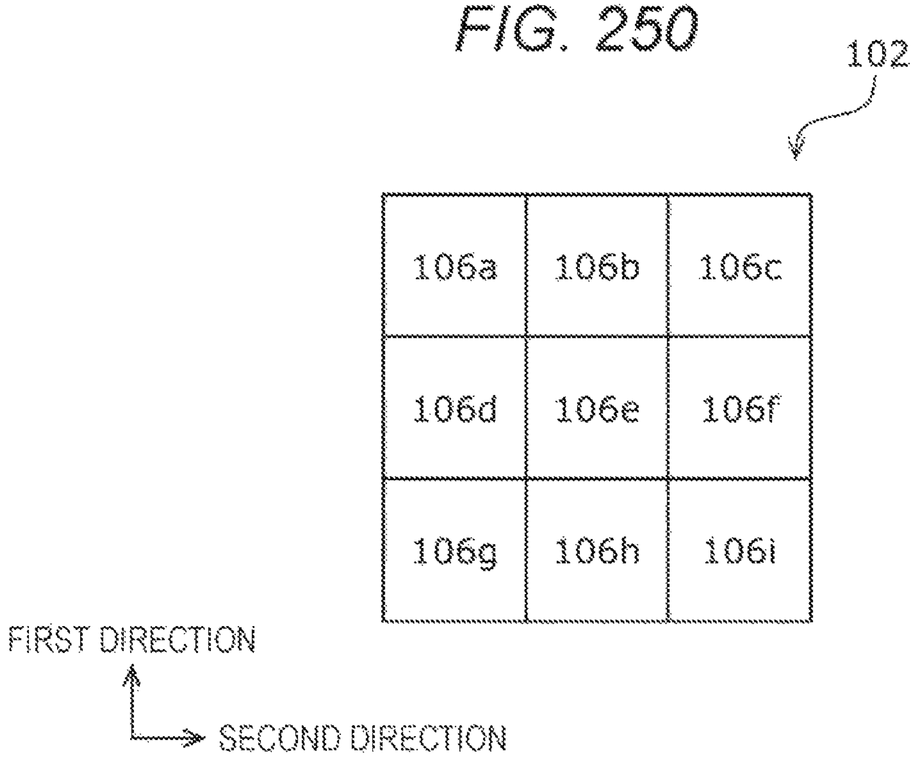

FIG. 250 is a diagram illustrating an example of subpixels in a pixel according to an embodiment.

Figure 251:
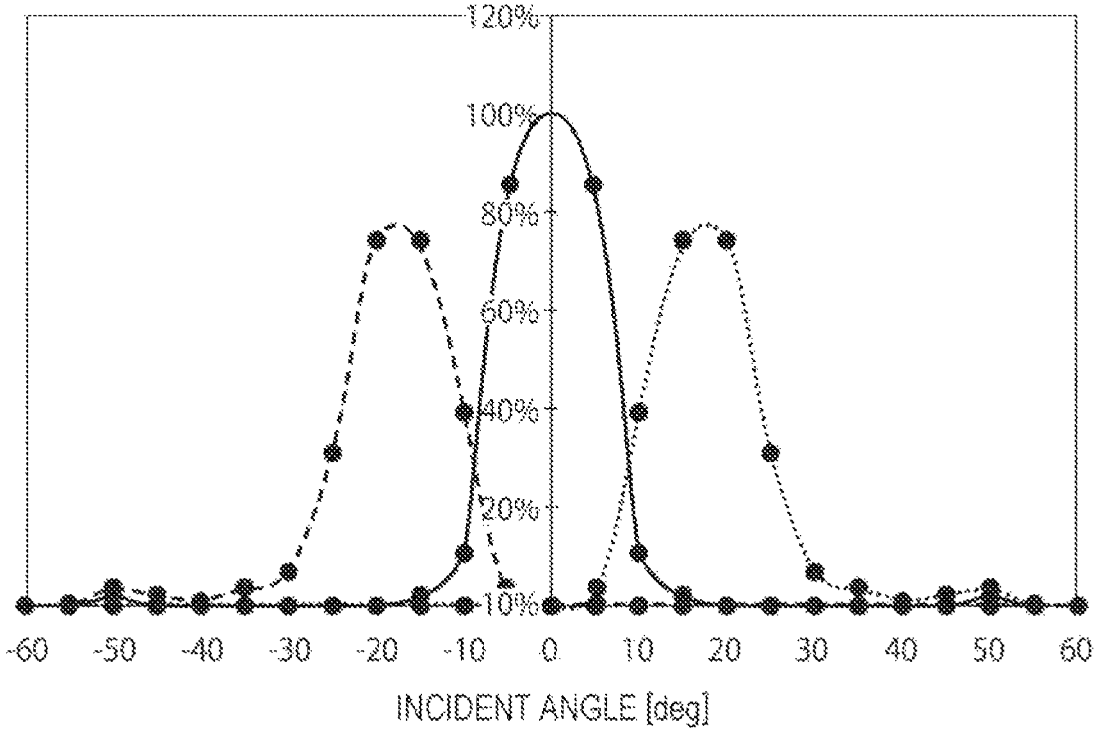

FIG. 251 is a graph illustrating angular dependence of sensitivity by a subpixel according to an embodiment.

Figure 252A:
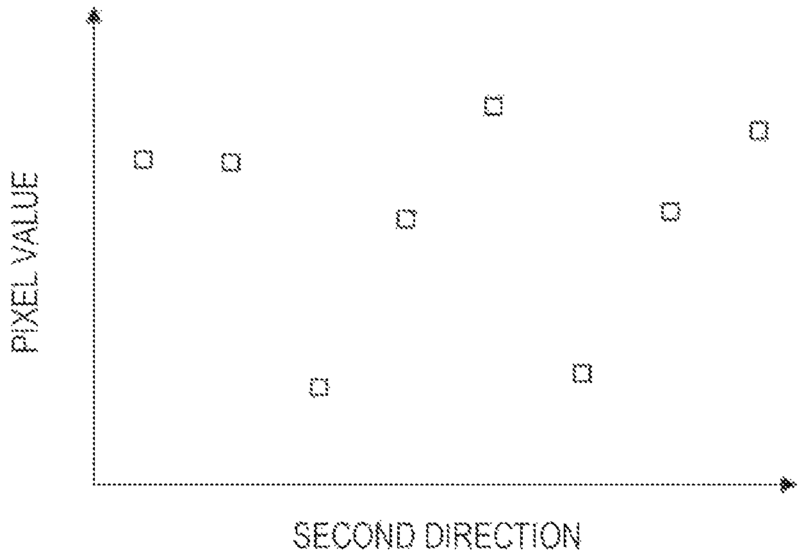

FIG. 252A is a graph illustrating an example of pixel values of a subpixel image according to an embodiment.

Figure 252B:
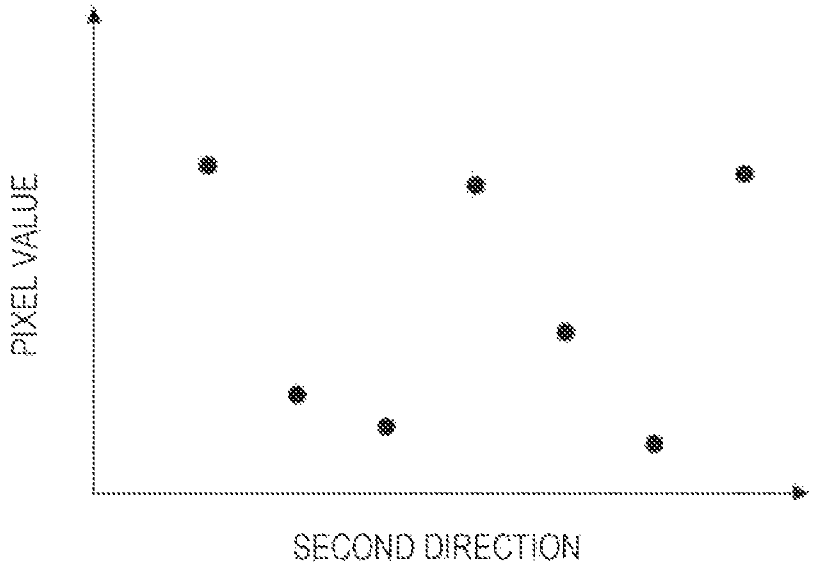

FIG. 252B is a graph illustrating an example of pixel values of a subpixel image according to an embodiment.

Figure 253:
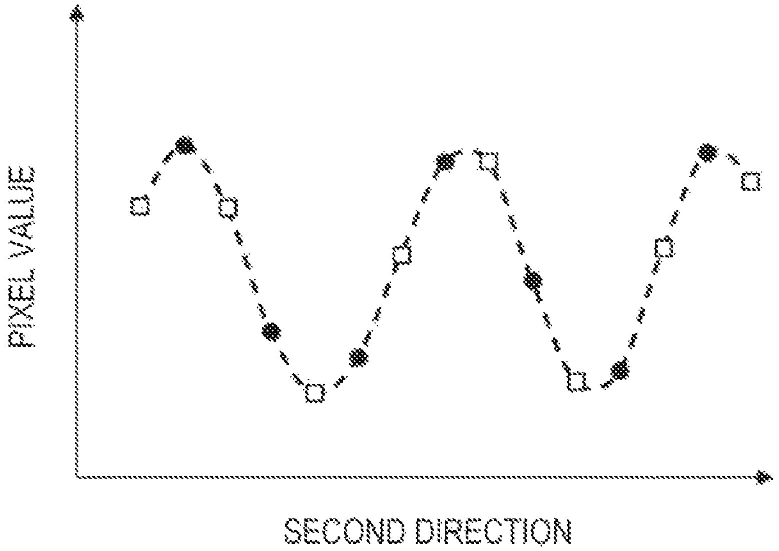

FIG. 253 is a graph illustrating an example of pixel values of a synthesized subpixel image according to an embodiment.

Figure 254:
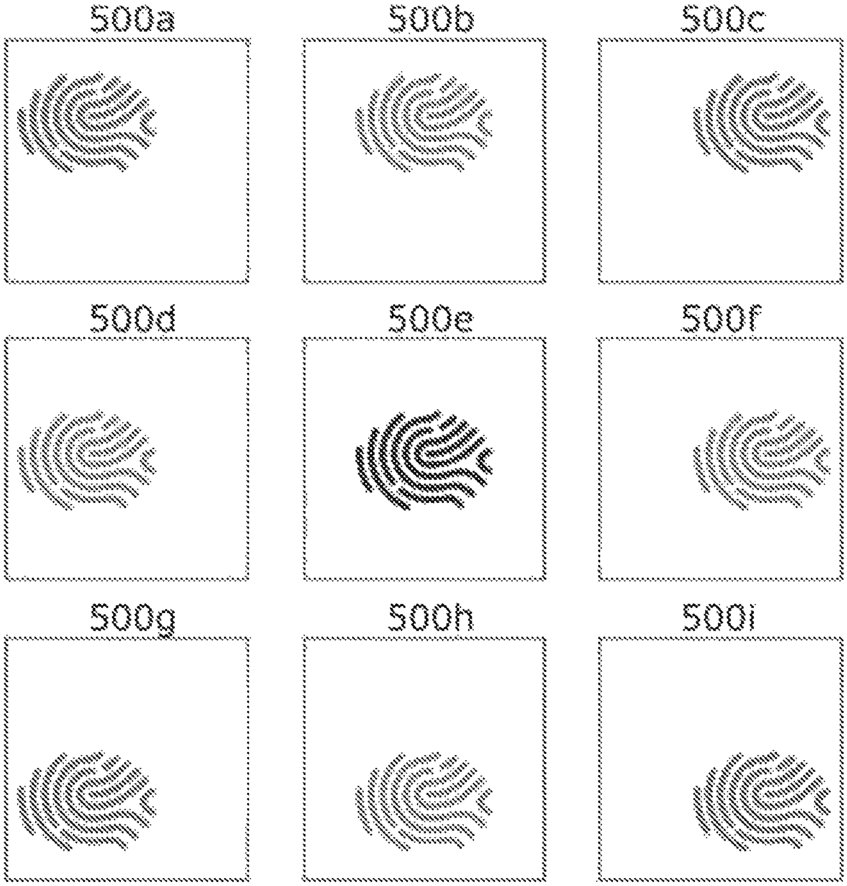

FIG. 254 is a diagram illustrating subpixel images according to an embodiment.

Figure 255:
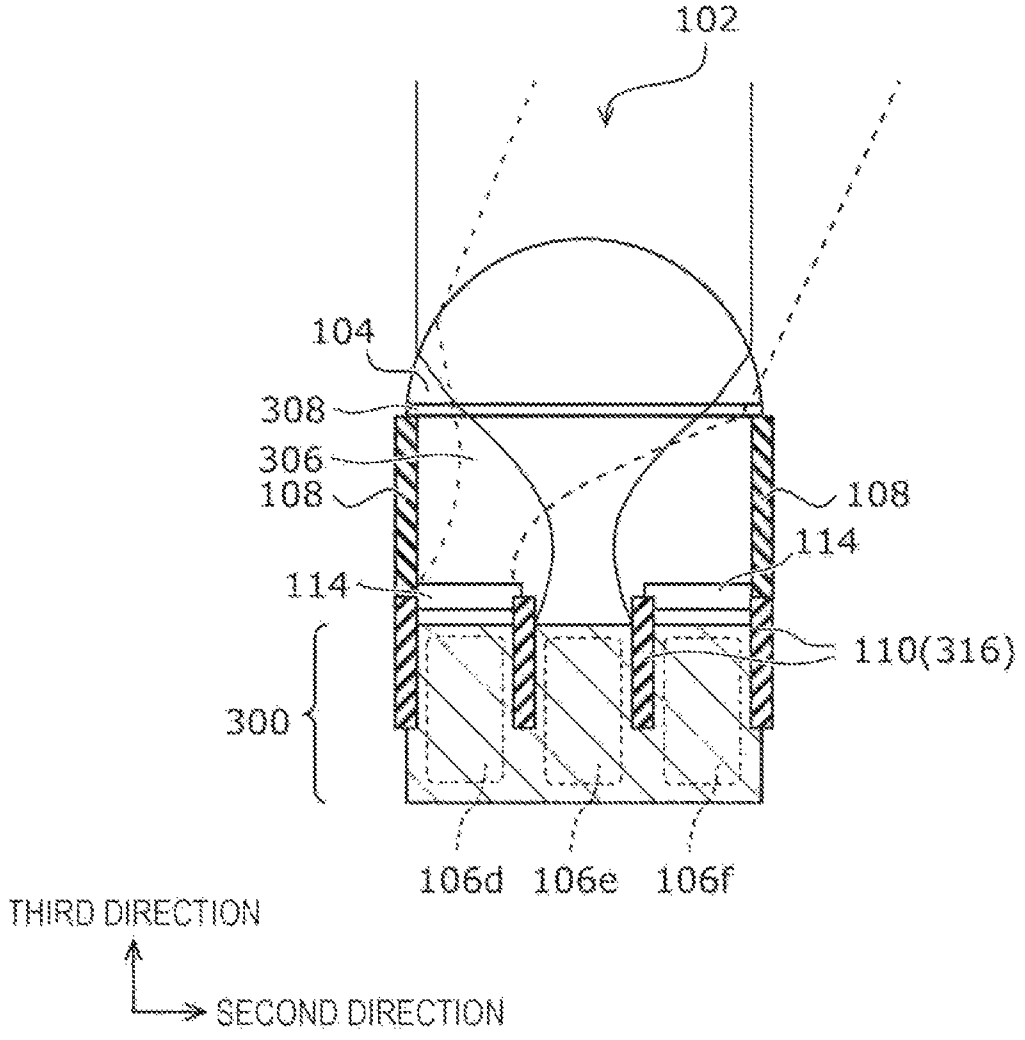

FIG. 255 is a cross-sectional view schematically illustrating an imaging pixel according to an embodiment.

Figure 256:
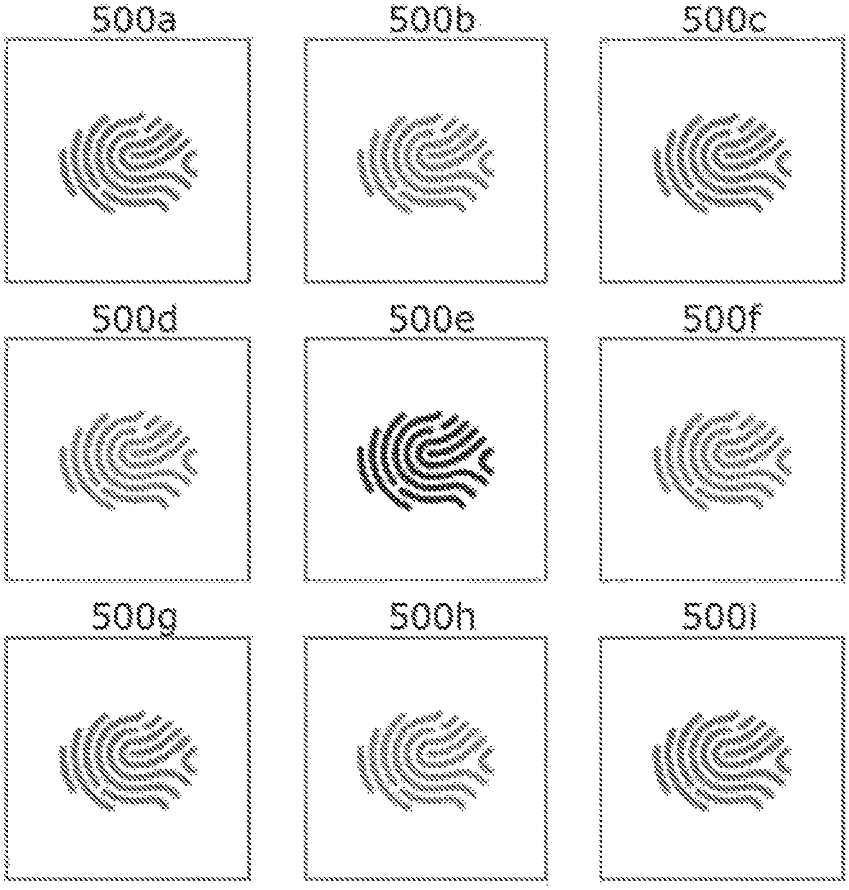

FIG. 256 is a diagram illustrating subpixel images according to an embodiment.

Figure 257:

FIG. 257 is a diagram illustrating an example of a synthesized image according to an embodiment.

Figure 258:
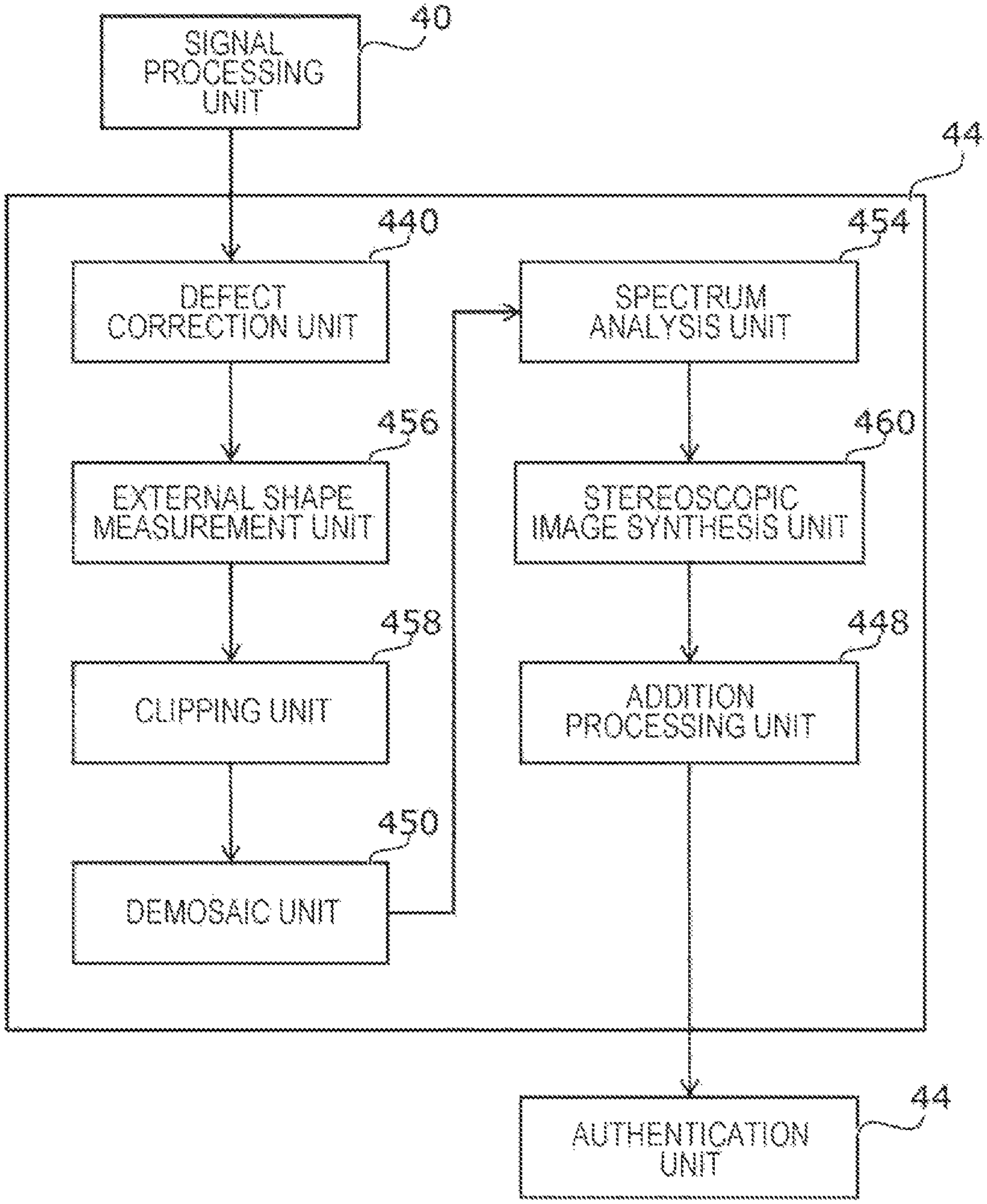

FIG. 258 is a block diagram schematically illustrating a signal processing device according to an embodiment.

Figure 259:
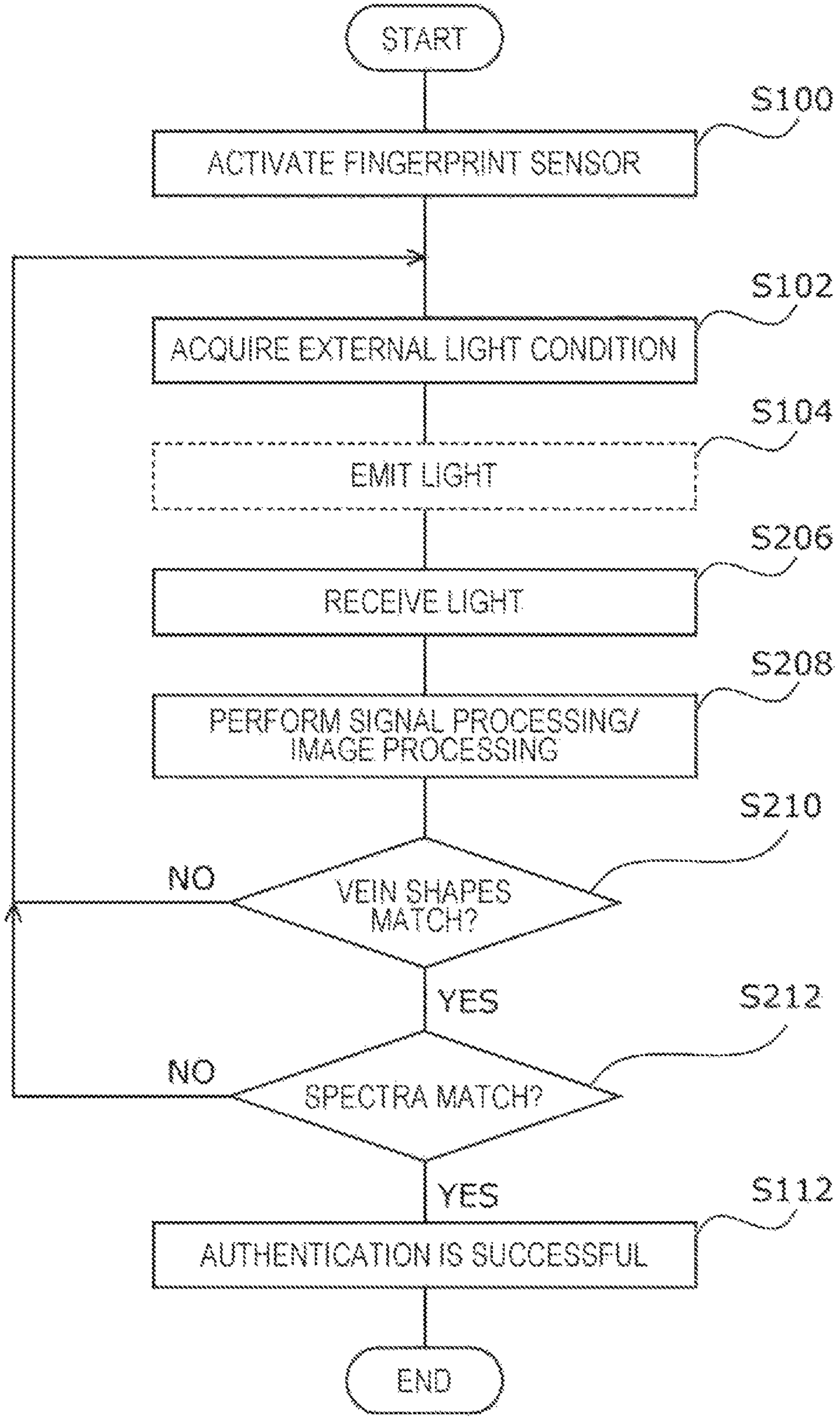

FIG. 259 is a flowchart illustrating processing of an electronic device according to an embodiment.

Figure 260:
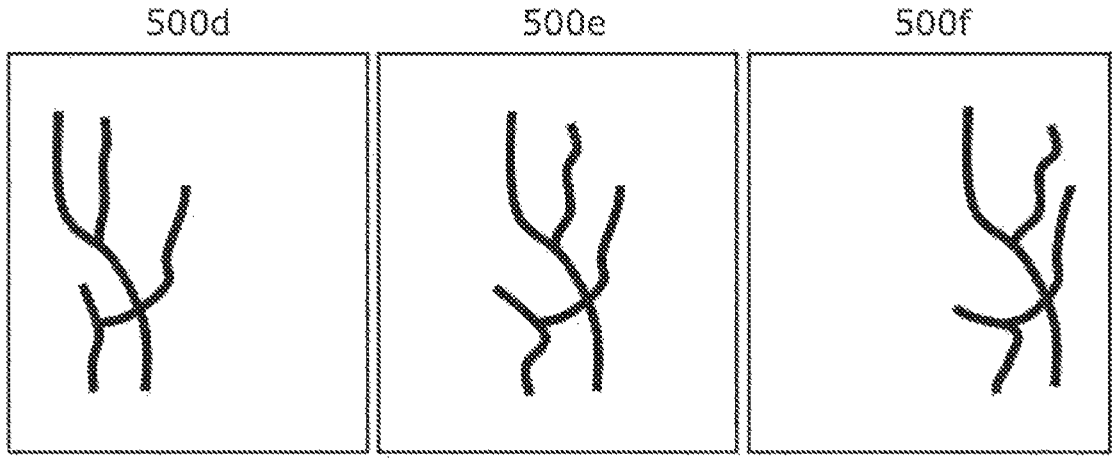

FIG. 260 is a diagram illustrating subpixel images according to an embodiment.

Figure 261:
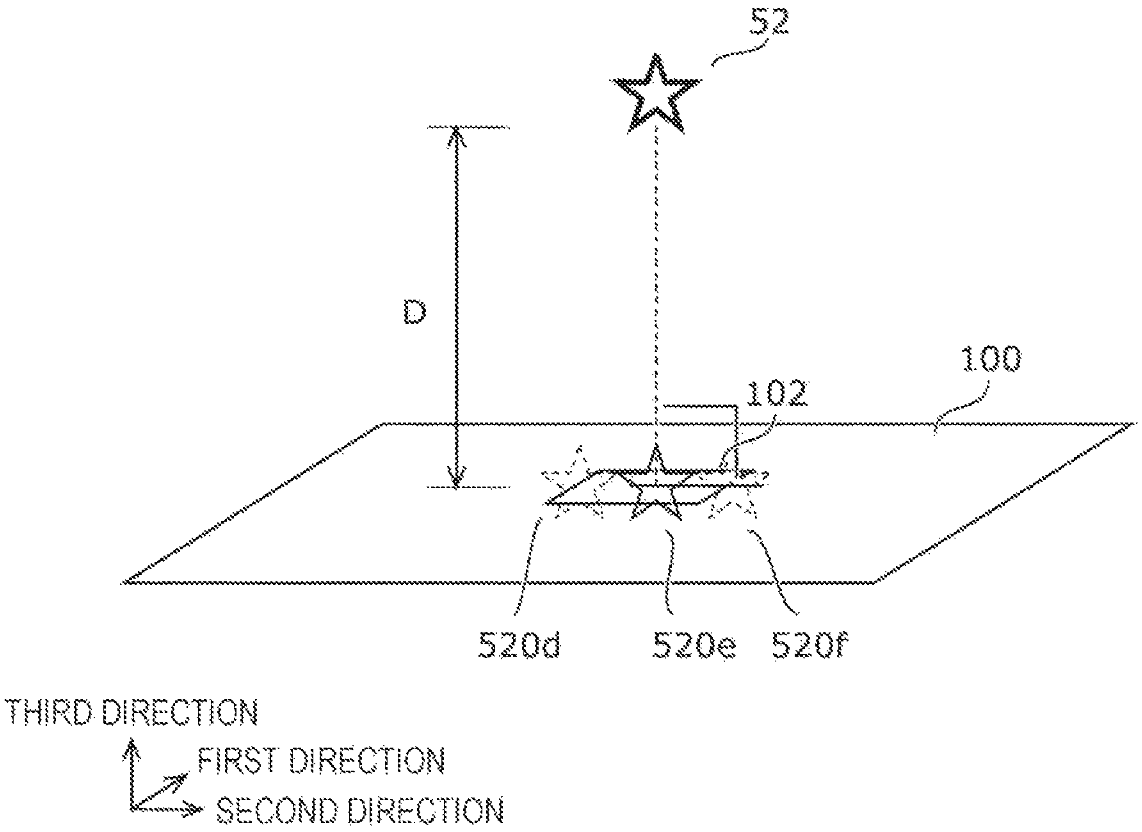

FIG. 261 is a diagram schematically illustrating a positional relationship between an object and a pixel according to an embodiment.

FIG. 262 is diagrams illustrating subpixel images according to an embodiment.

Figure 263:
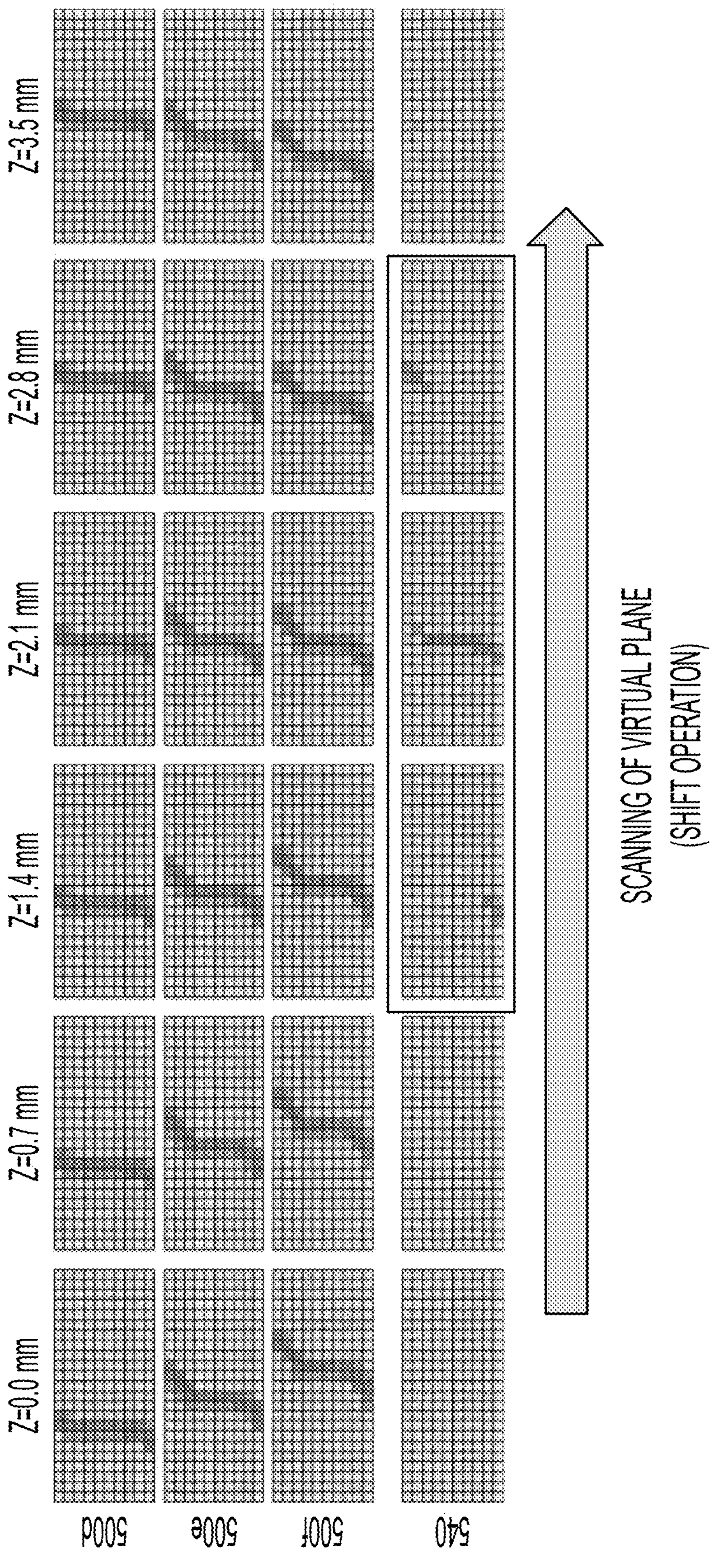

FIG. 263 is diagrams illustrating subpixel images according to an embodiment.

Figure 264:
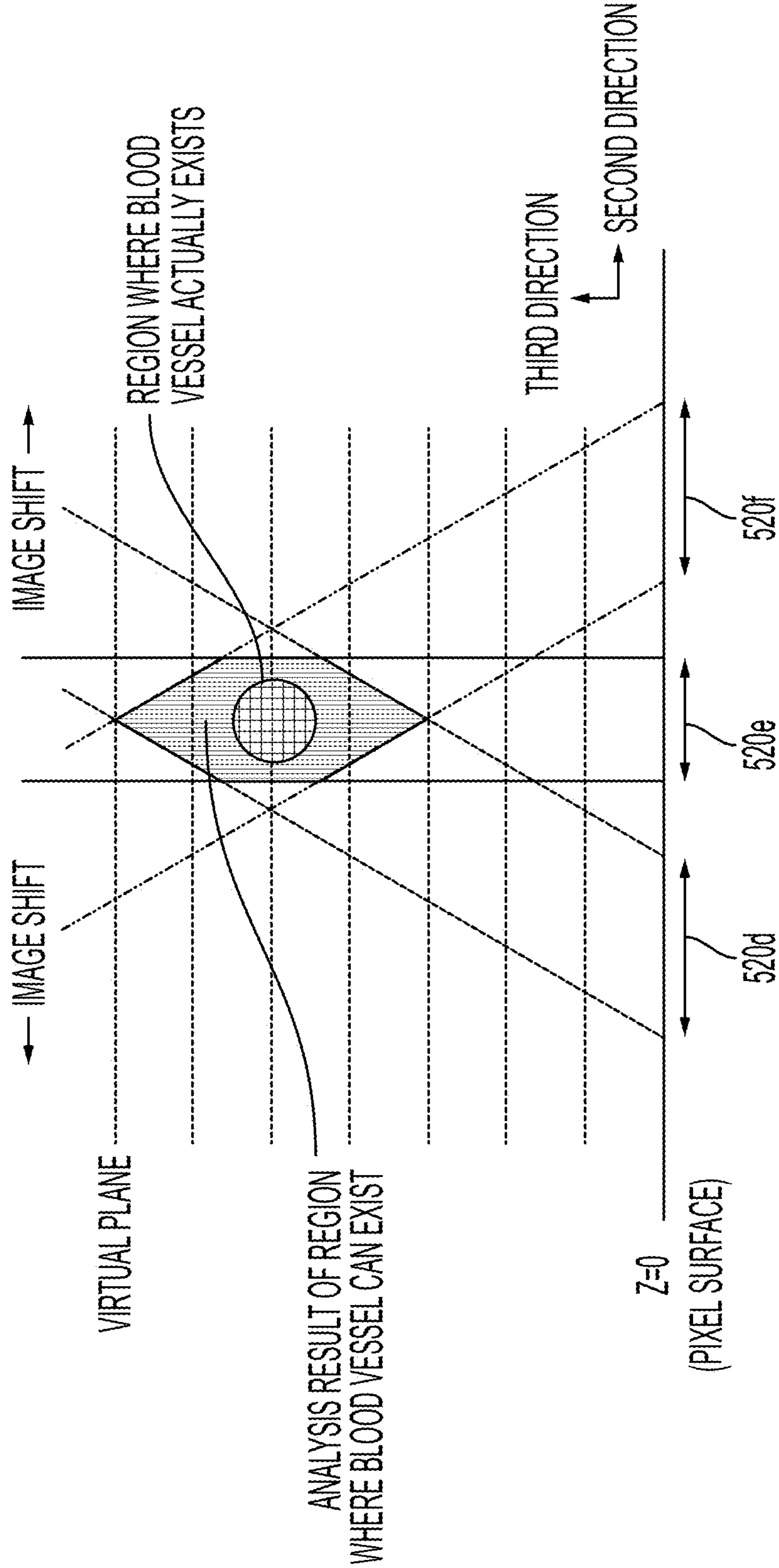

FIG. 264 is a diagram illustrating a subpixel image according to an embodiment.

Figure 265:
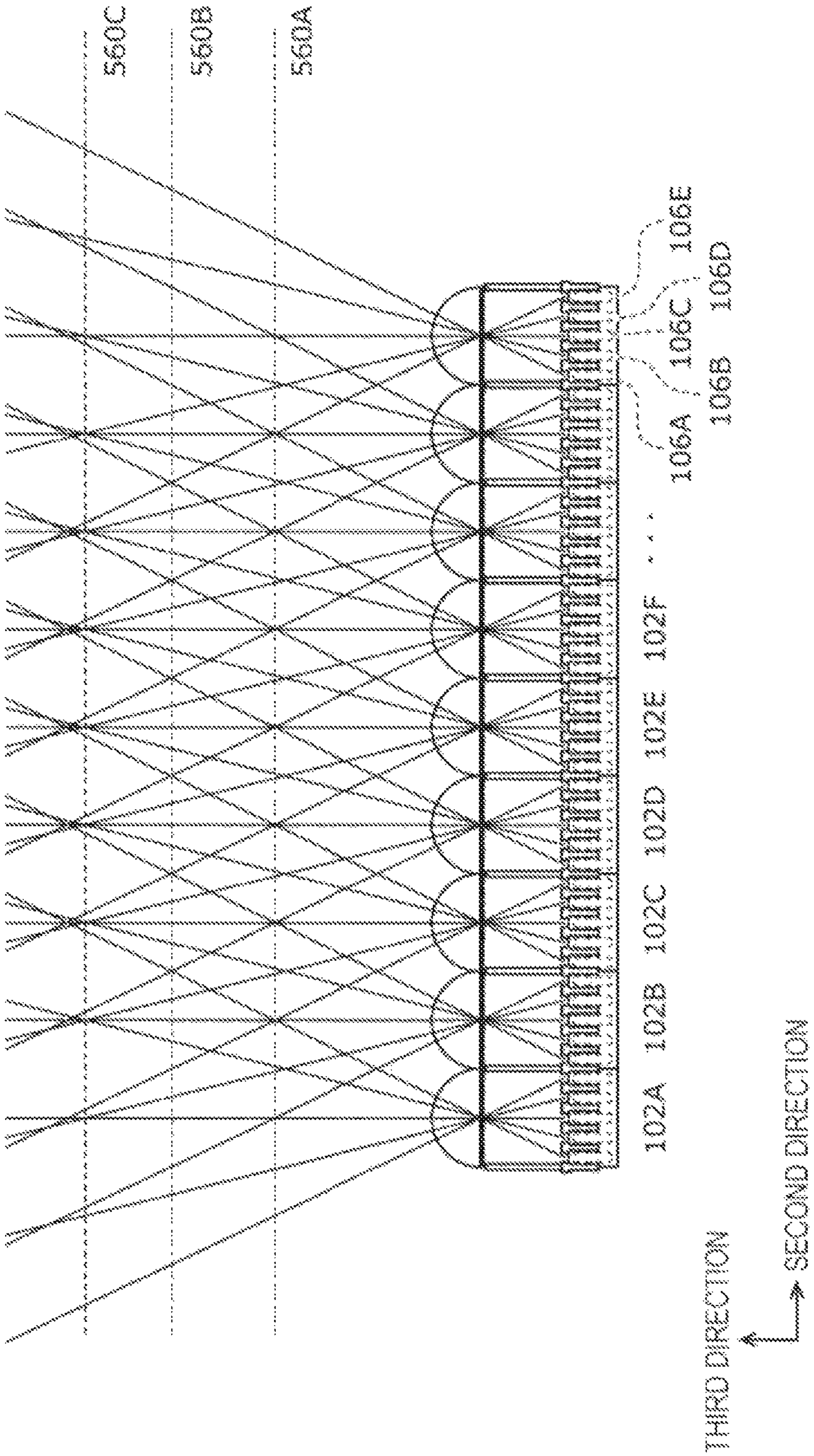

FIG. 265 is a view schematically illustrating light reception of an electronic device according to an embodiment.

Figure 266:
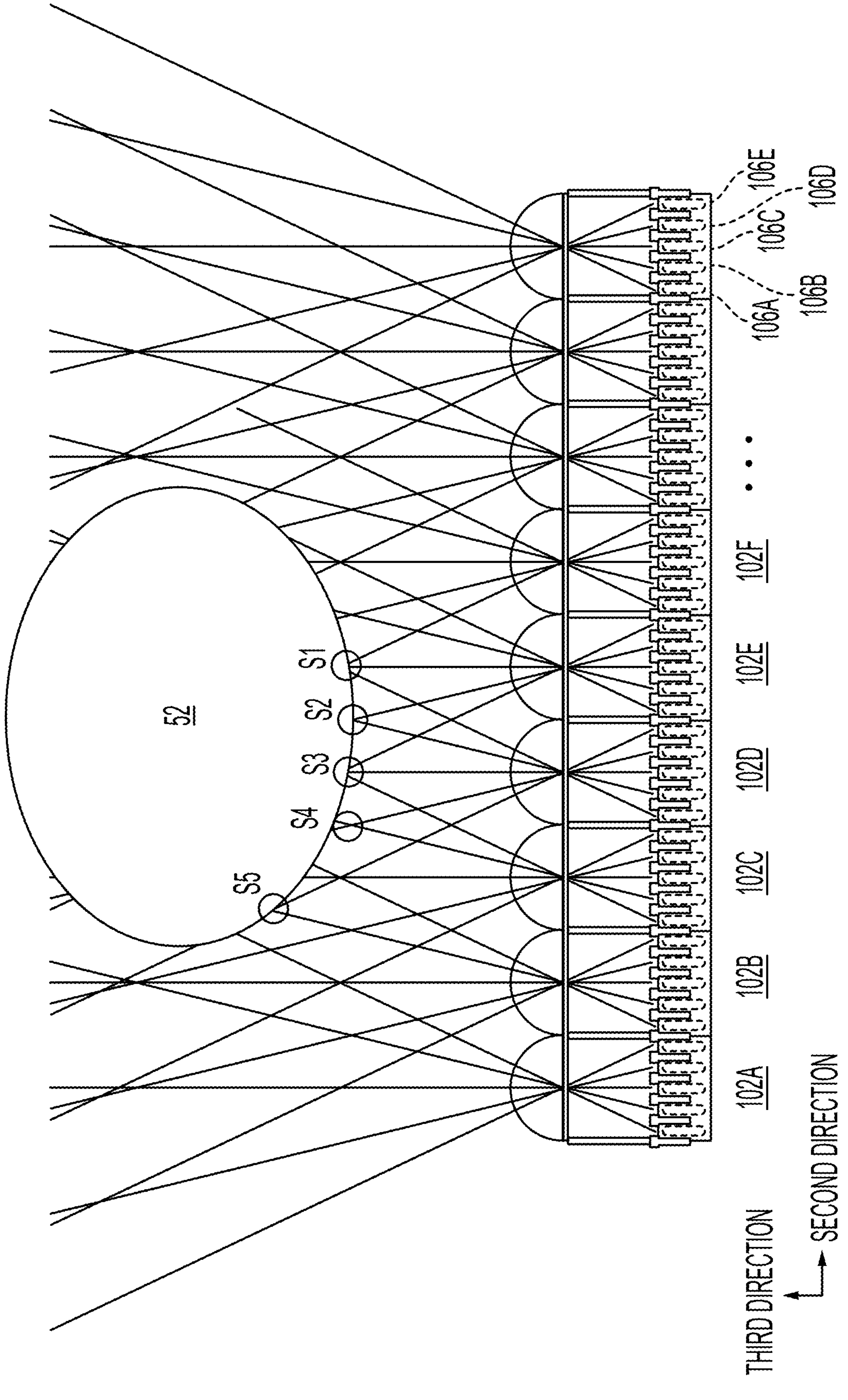

FIG. 266 is a view schematically illustrating light reception of an electronic device according to an embodiment.

Figure 267:
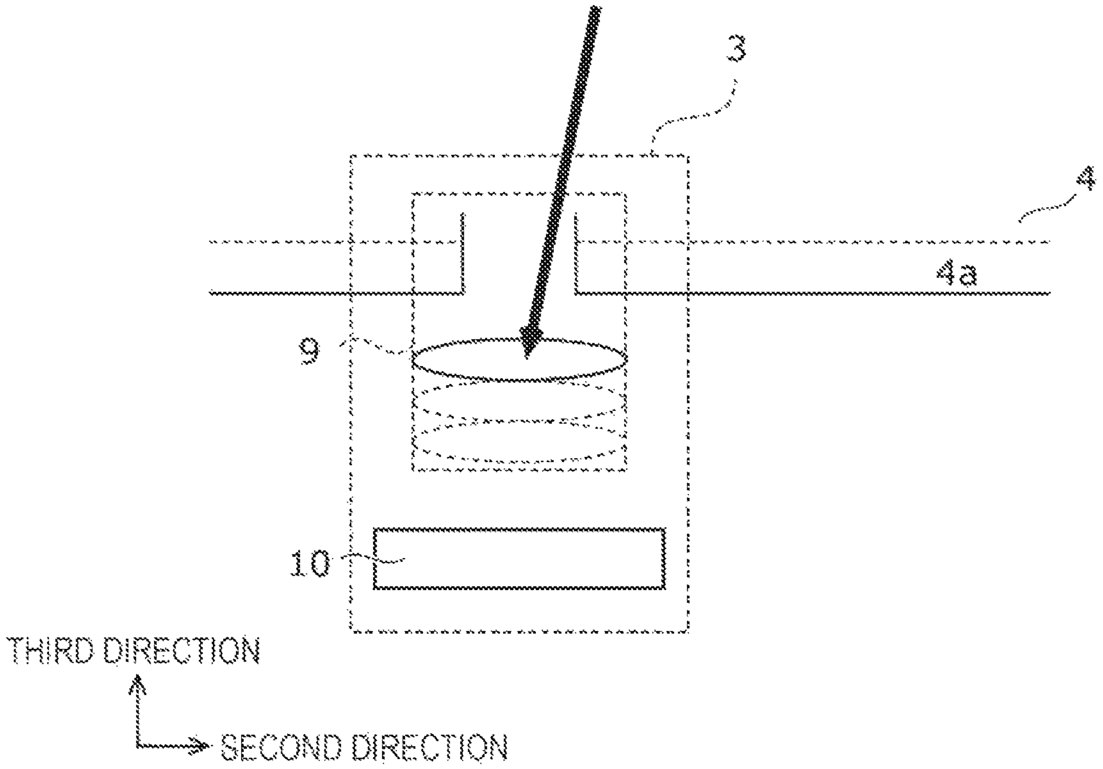

FIG. 267 is a cross-sectional view schematically illustrating an electronic device according to an embodiment.

Figure 268:
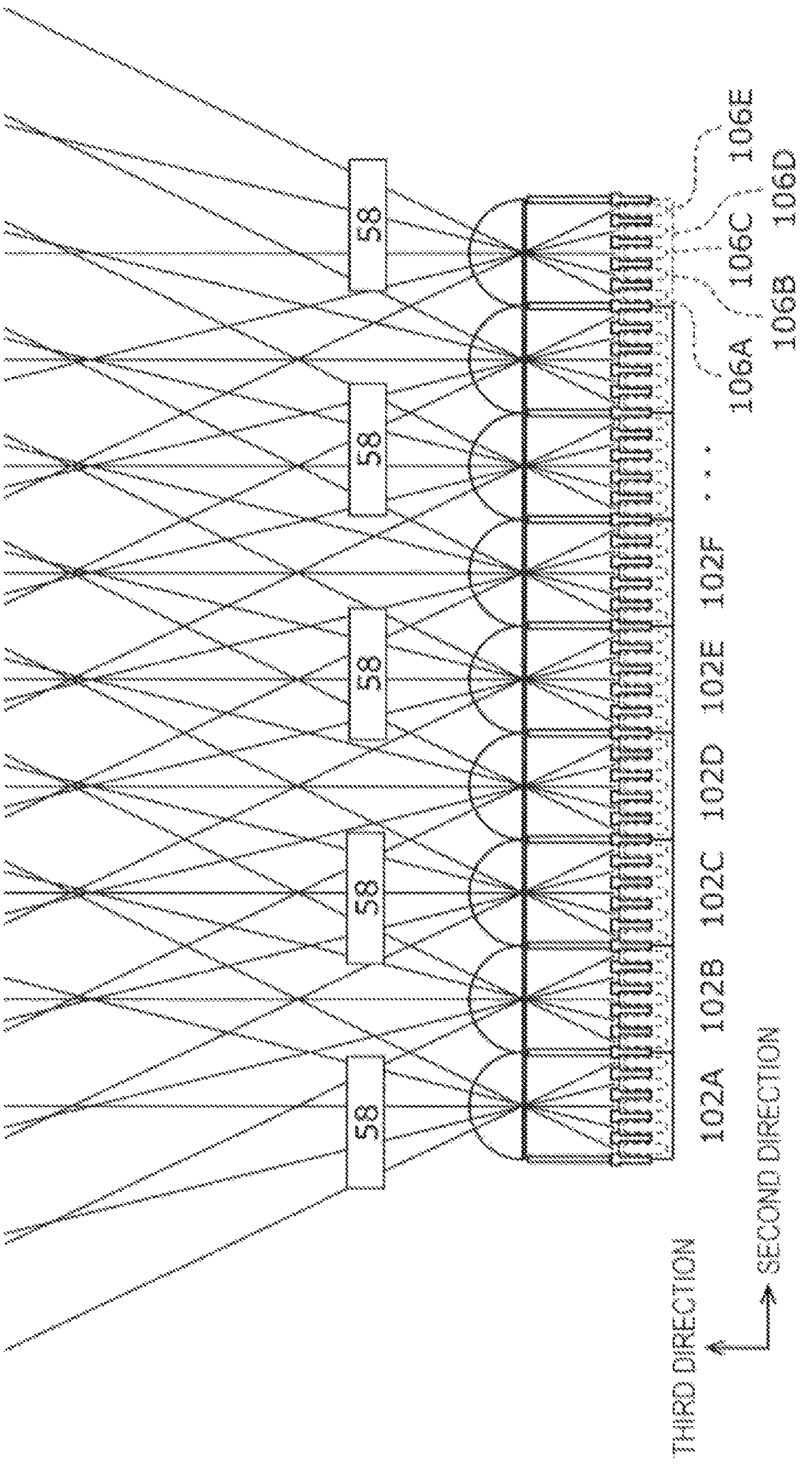

FIG. 268 is a view schematically illustrating light reception of an electronic device according to an embodiment.

Figure 269:
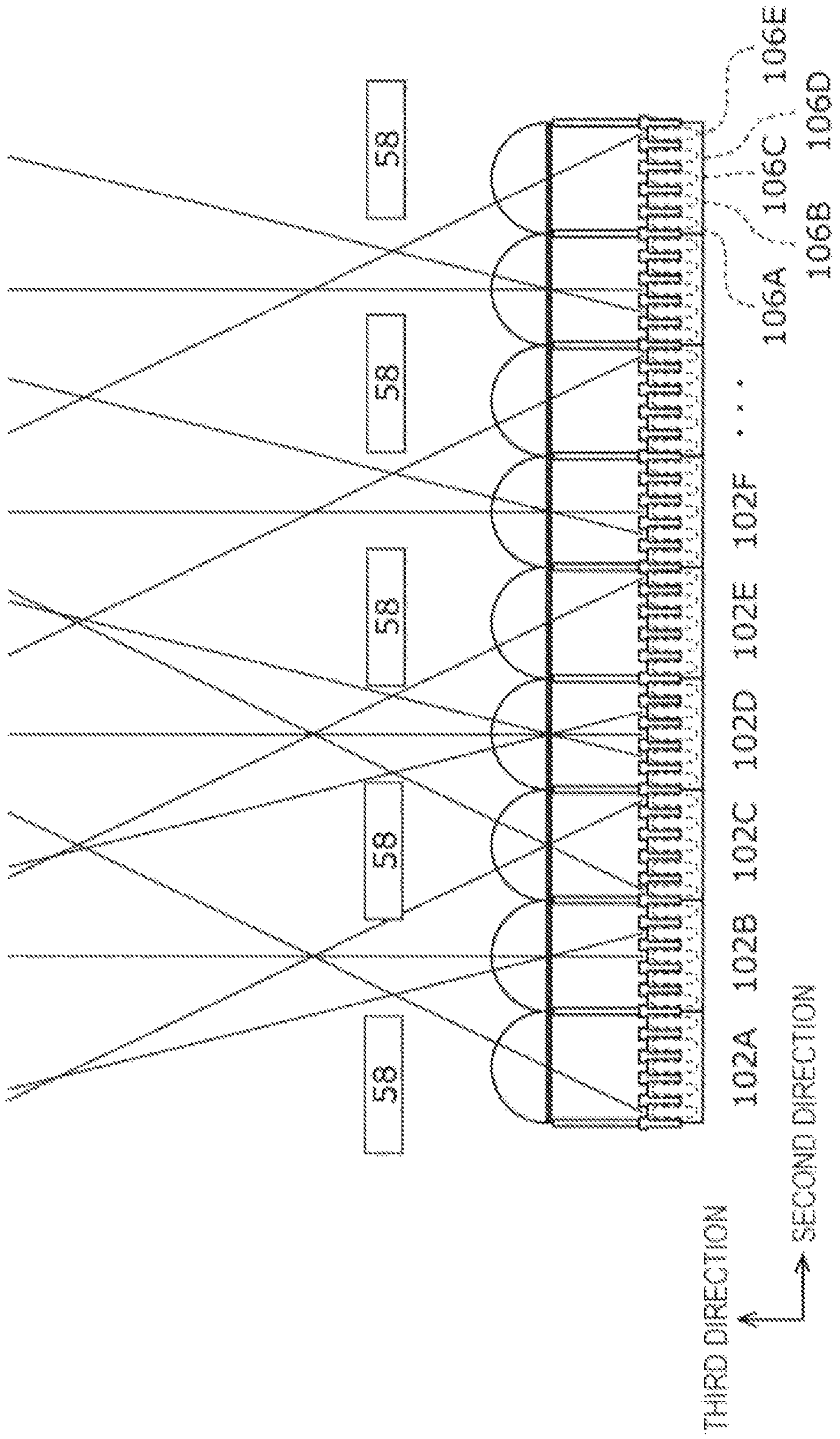

FIG. 269 is a view schematically illustrating light reception of an electronic device according to an embodiment.

Figure 270:
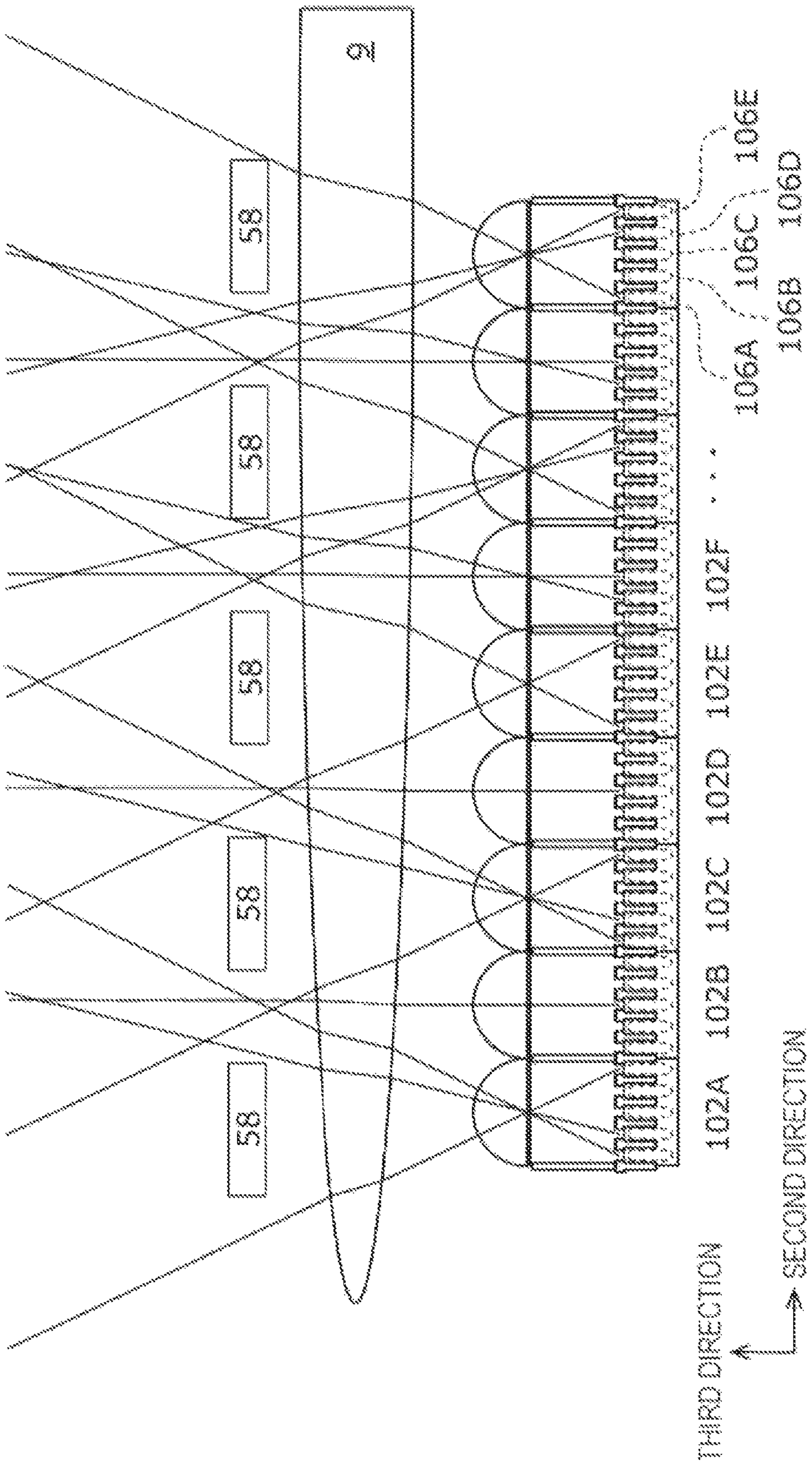

FIG. 270 is a view schematically illustrating light reception of an electronic device according to an embodiment.

Figure 271:
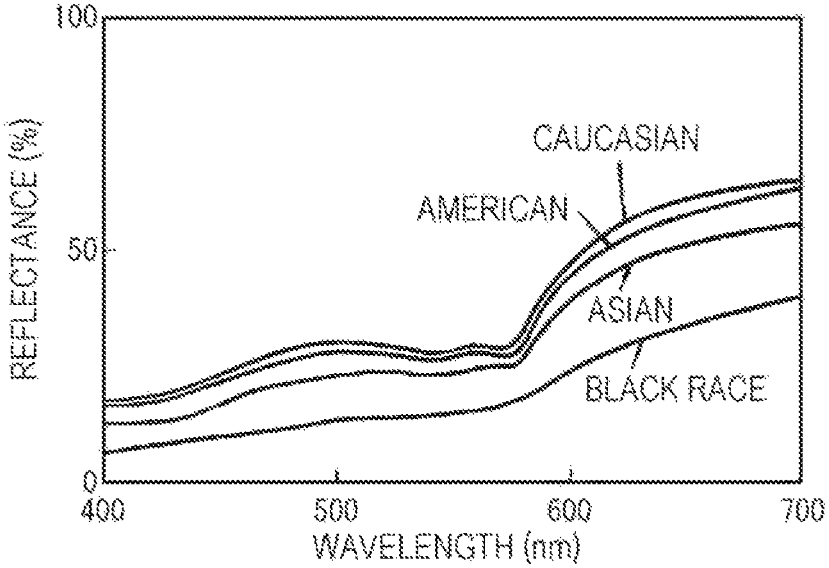
Figure 271:
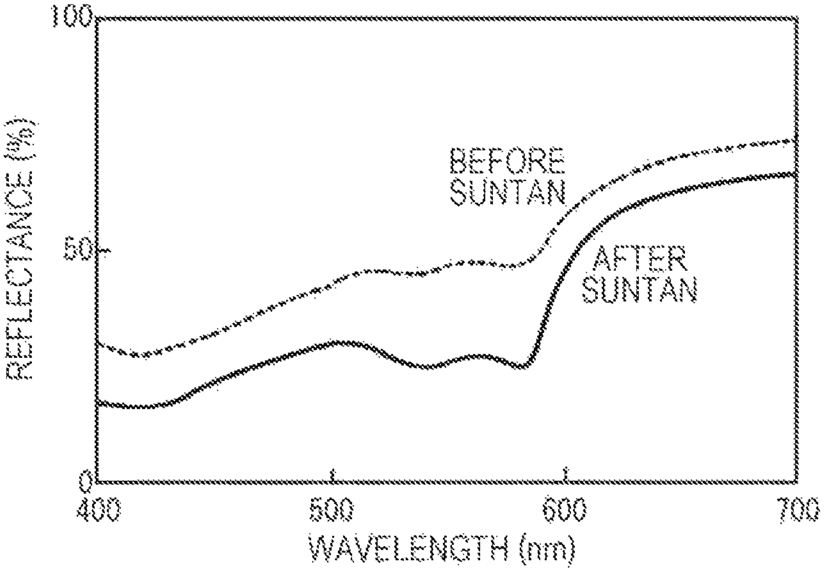

FIG. 271 is graphs illustrating transmission and reflection characteristics of light of human skin.

Figure 272:
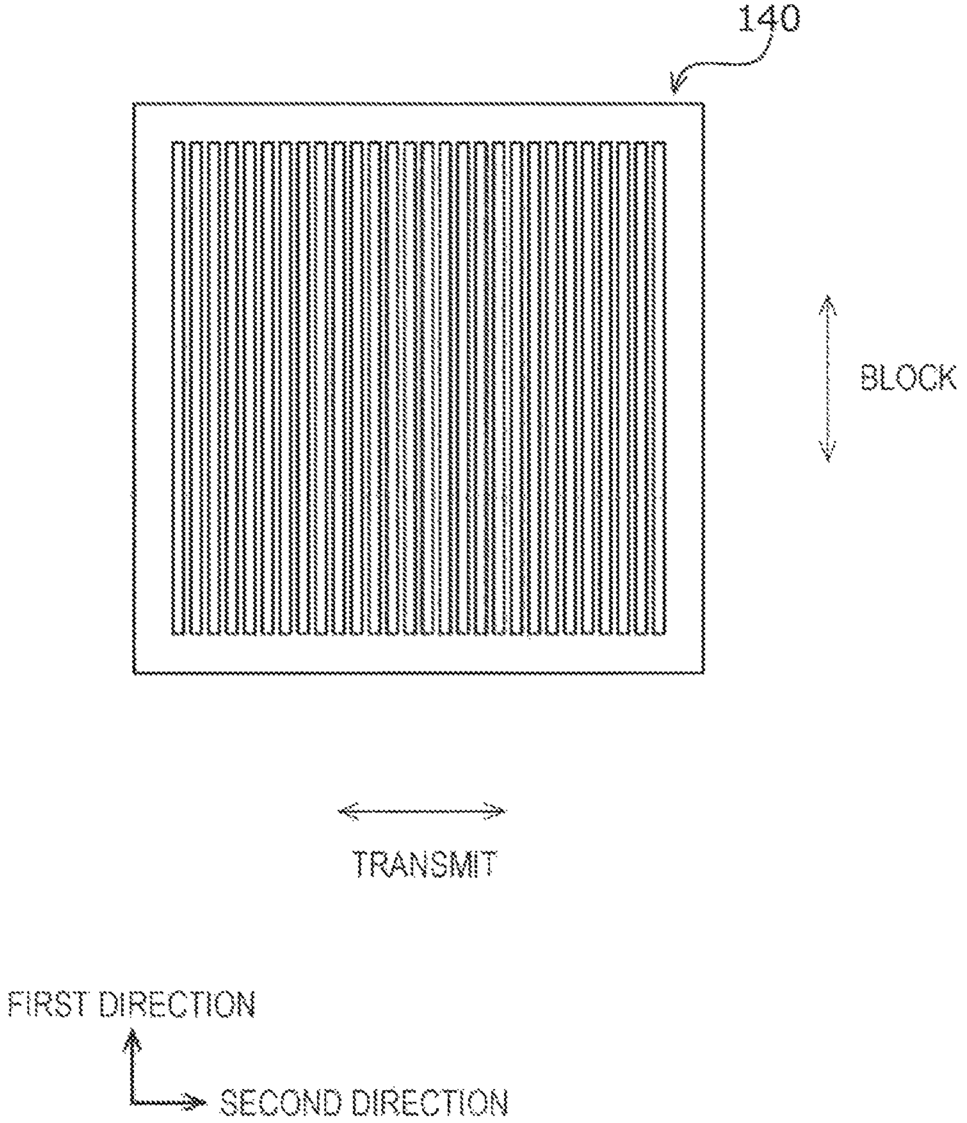

FIG. 272 is a view schematically illustrating an example of a filter according to an embodiment.

Figure 273:
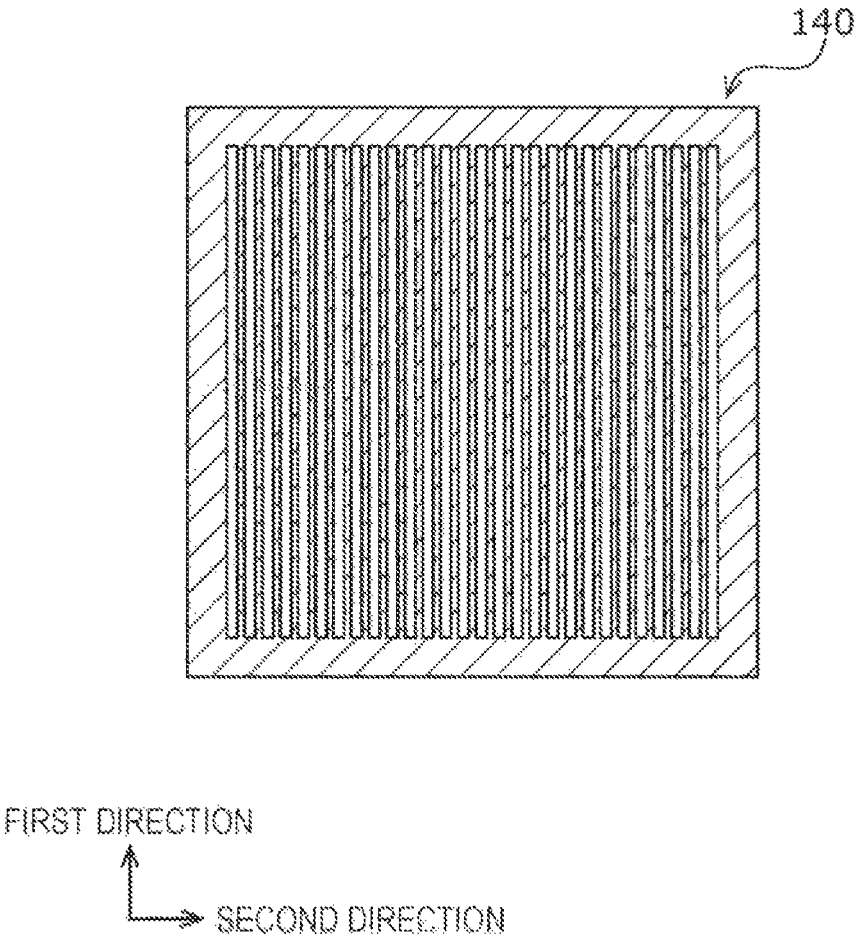

FIG. 273 is a view schematically illustrating an example of a filter according to an embodiment.

Figure 274:
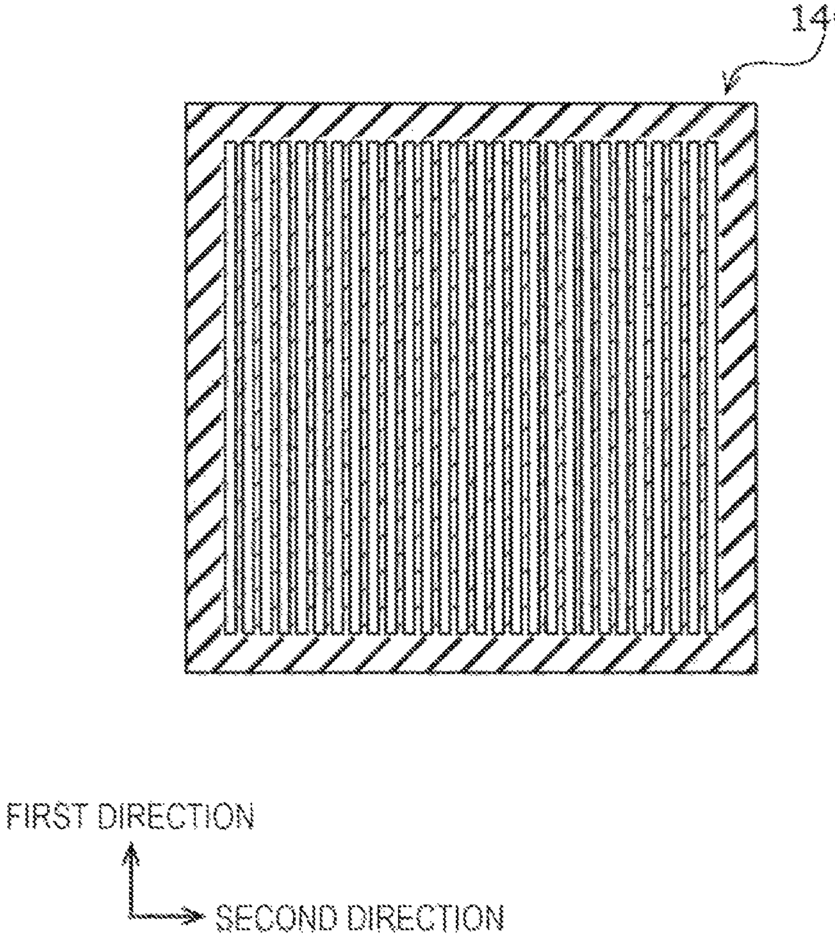

FIG. 274 is a view schematically illustrating an example of a filter according to an embodiment.

Figure 275:
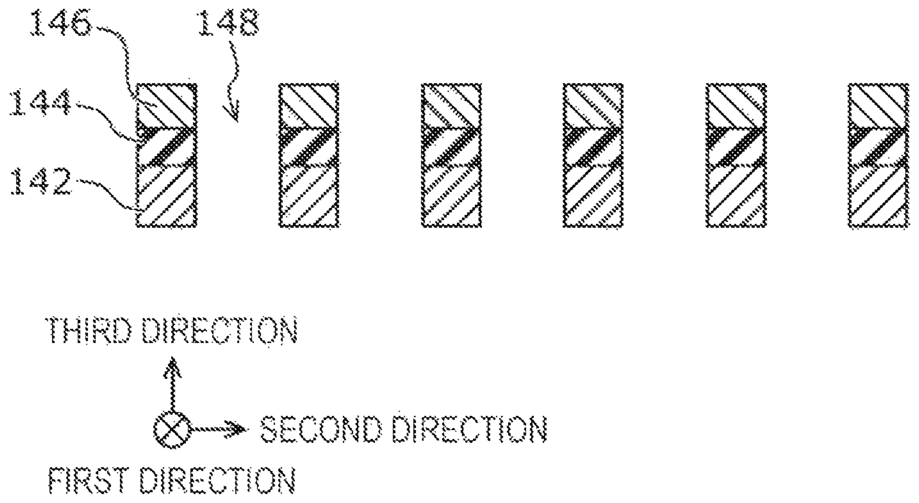

FIG. 275 is a view schematically illustrating an example of a filter according to an embodiment.

Figure 276:
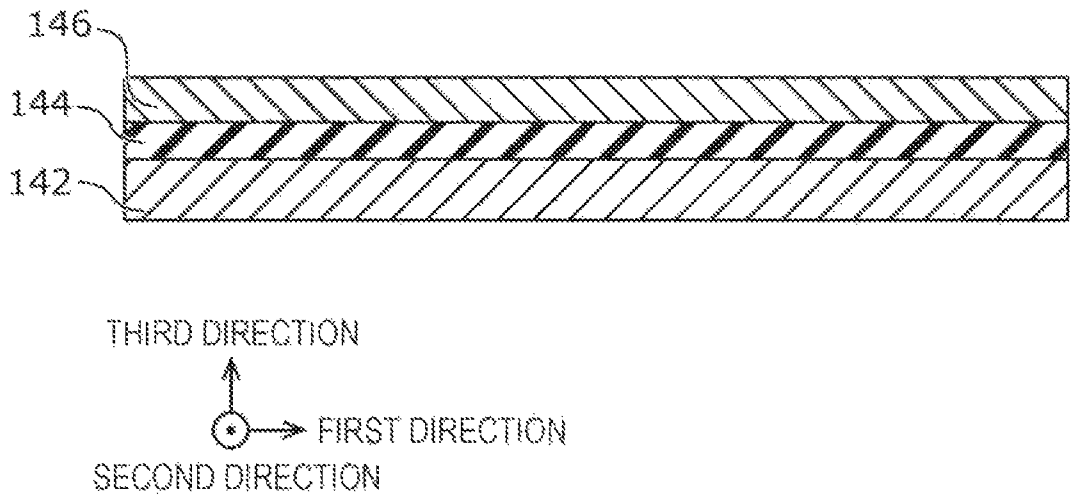

FIG. 276 is a view schematically illustrating an example of a filter according to an embodiment.

Figure 277:
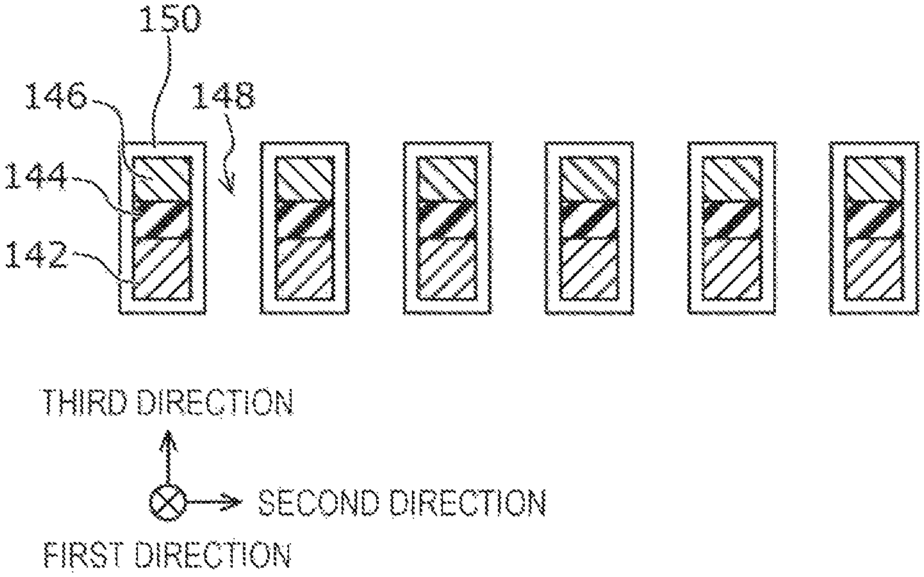

FIG. 277 is a view schematically illustrating an example of a filter according to an embodiment.

Figure 278:
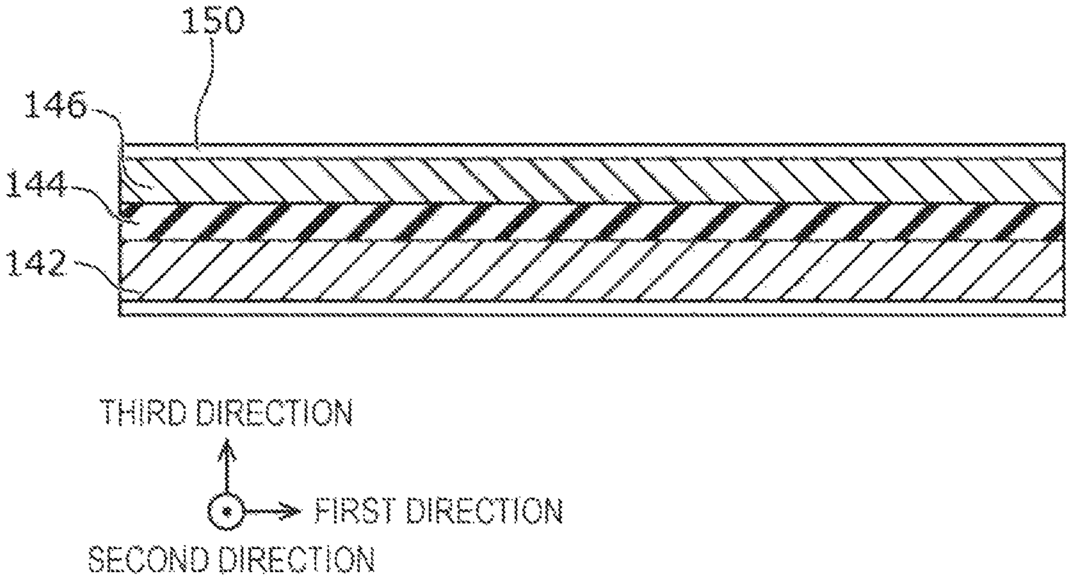

FIG. 278 is a view schematically illustrating an example of a filter according to an embodiment.

Figure 279:
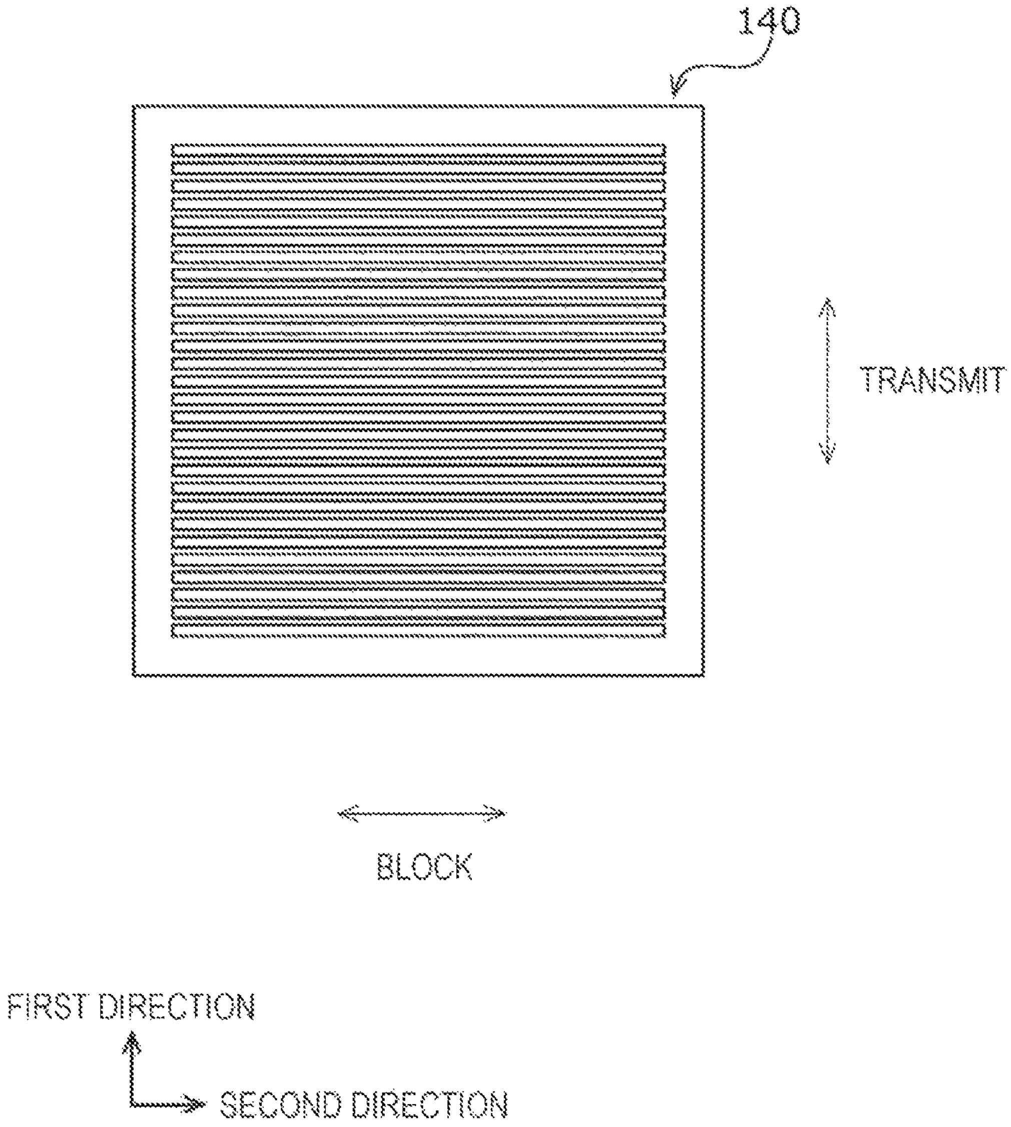

FIG. 279 is a view schematically illustrating an example of a filter according to an embodiment.

Figure 280:
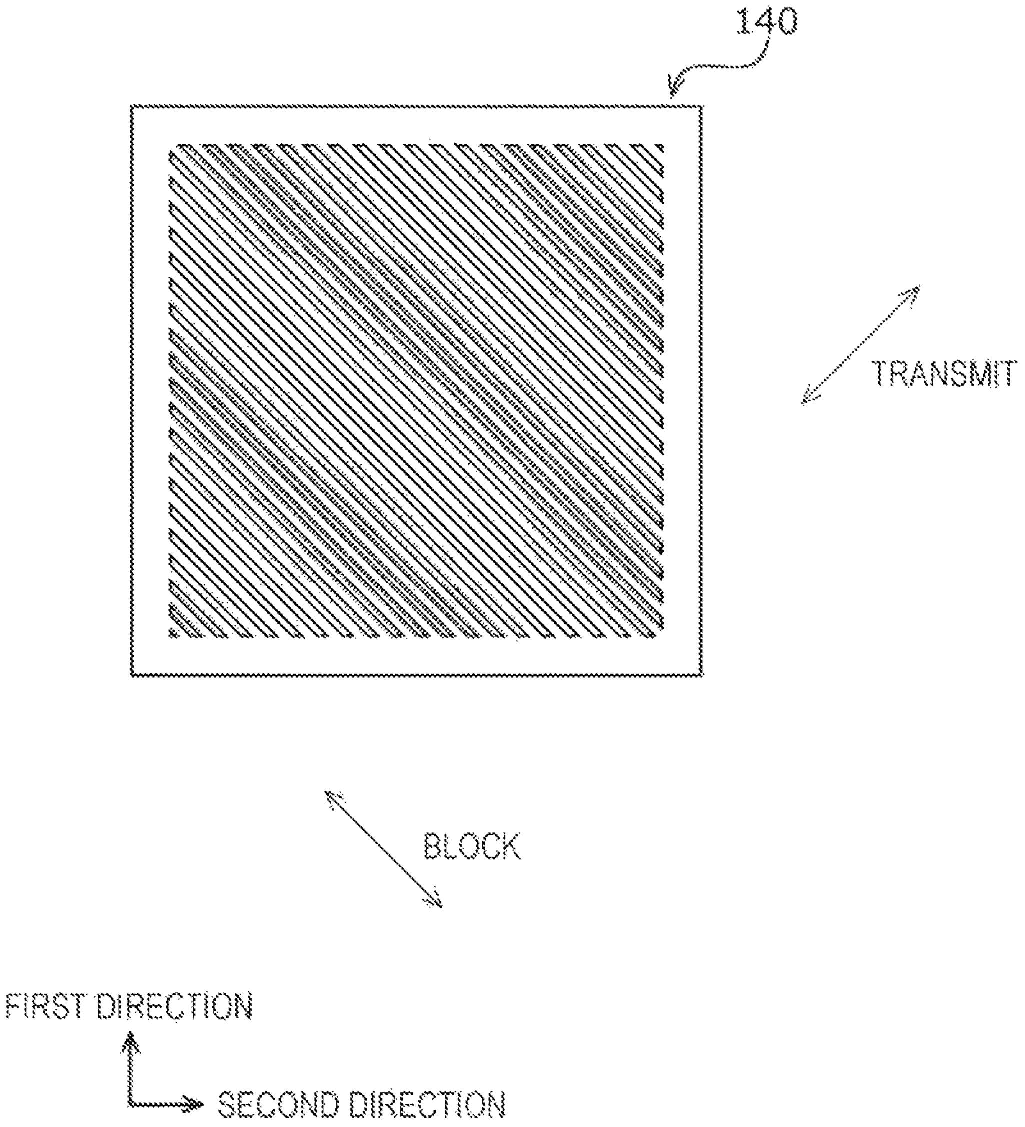

FIG. 280 is a view schematically illustrating an example of a filter according to an embodiment.

Figure 281:
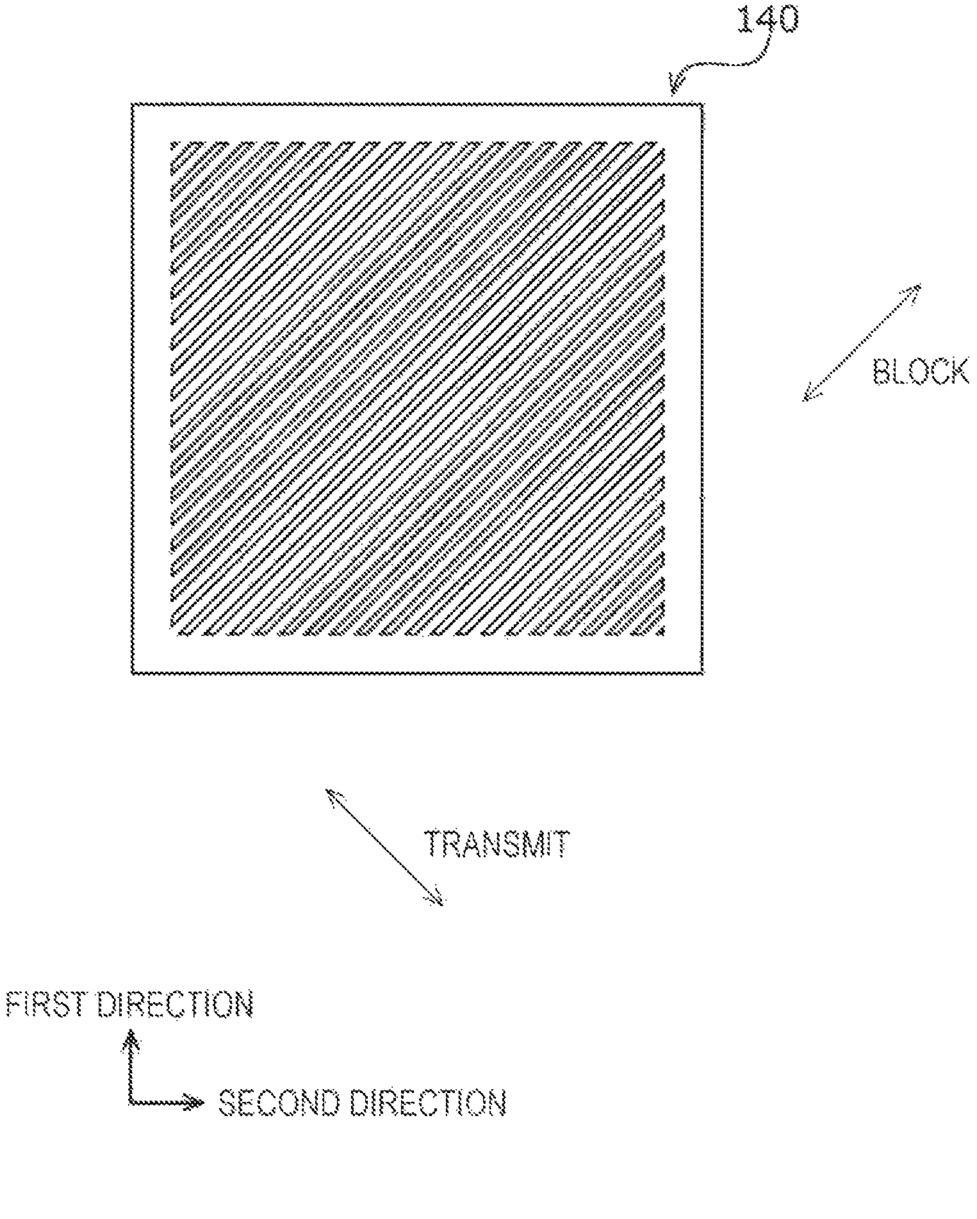

FIG. 281 is a view schematically illustrating an example of a filter according to an embodiment.

Figure 282:
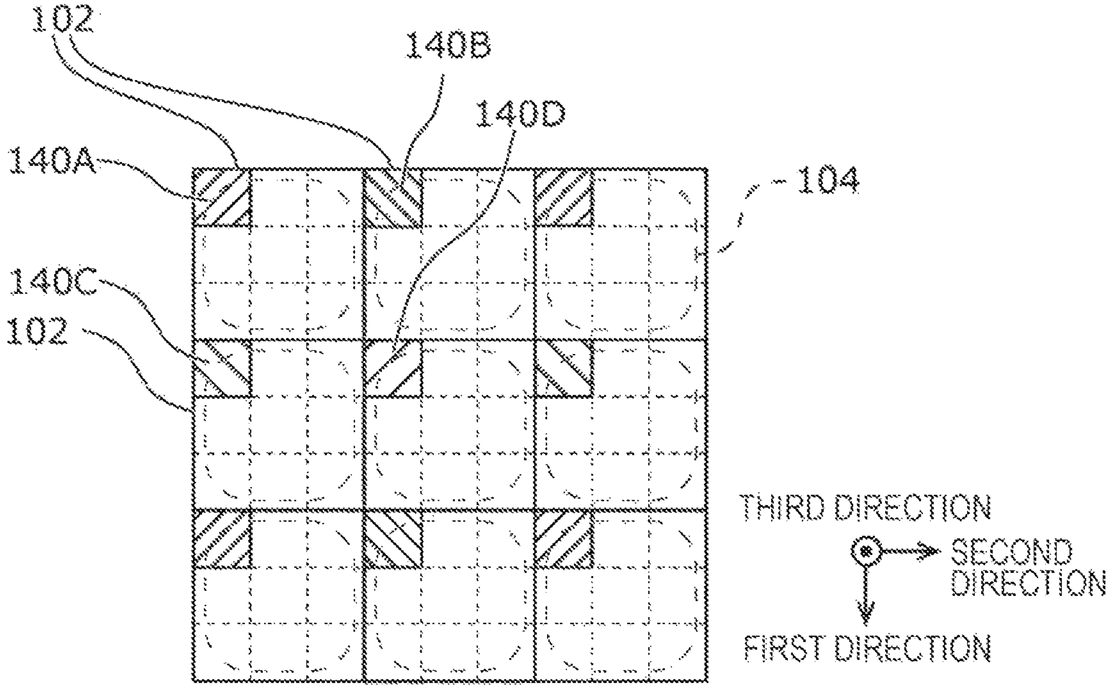

FIG. 282 is a view schematically illustrating an example of filter arrangement according to an embodiment.

Figure 283:
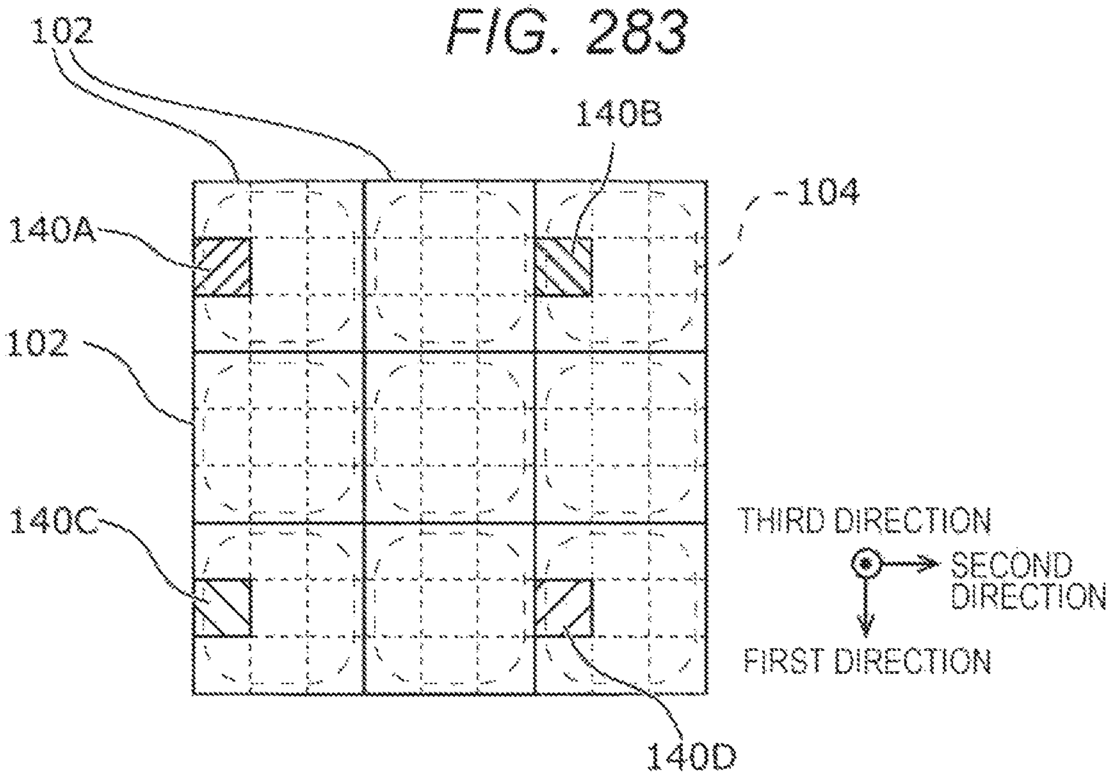

FIG. 283 is a view schematically illustrating an example of filter arrangement according to an embodiment.

Figure 284:
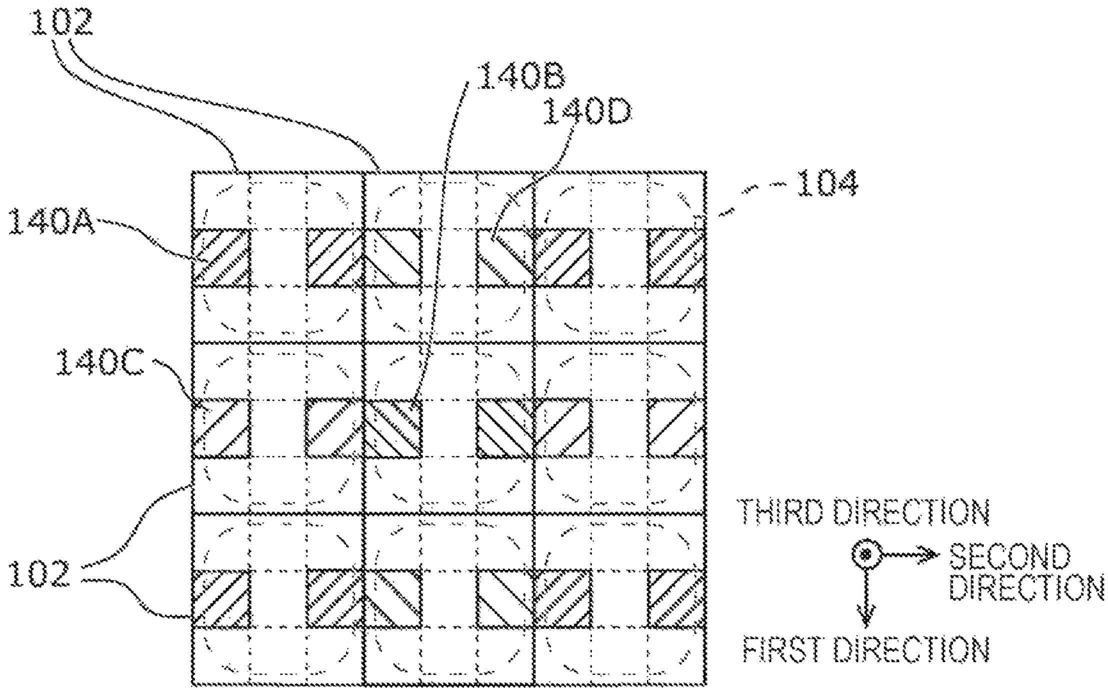

FIG. 284 is a view schematically illustrating an example of filter arrangement according to an embodiment.

Figure 285:
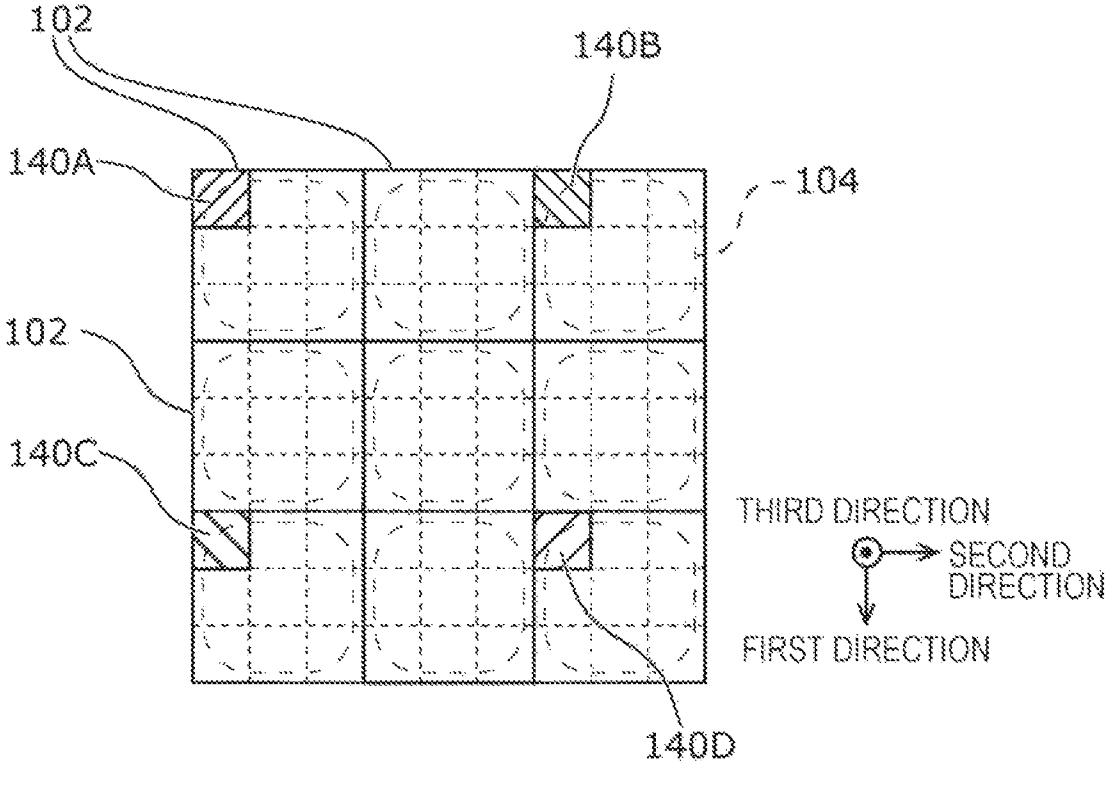

FIG. 285 is a view schematically illustrating an example of filter arrangement according to an embodiment.

Figure 286:
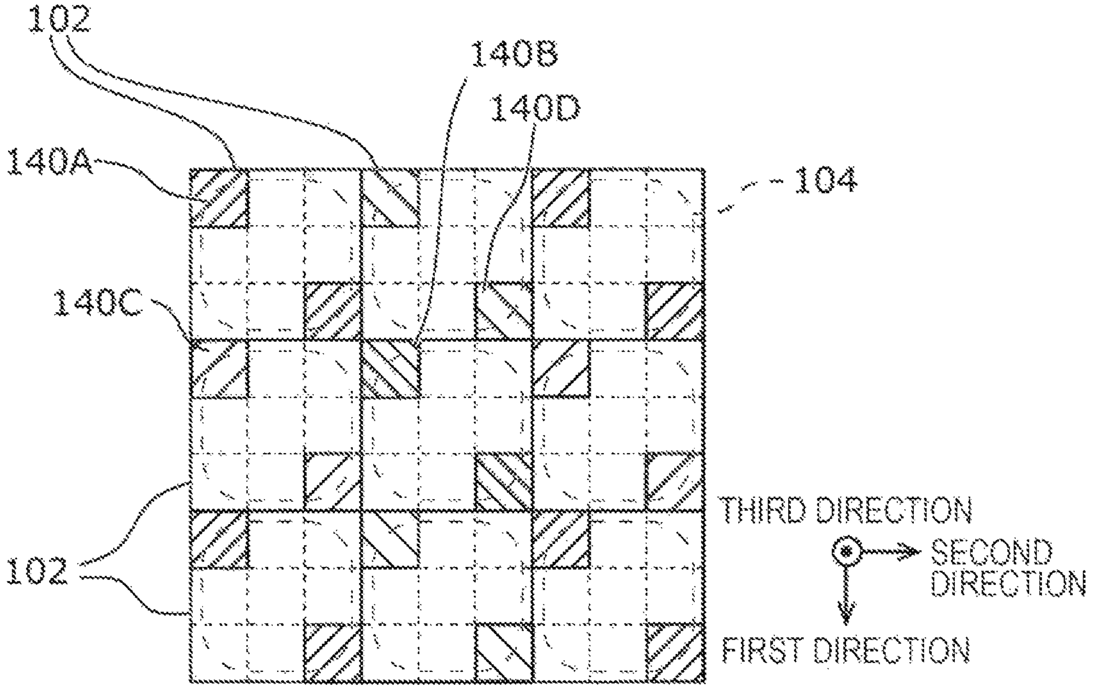

FIG. 286 is a view schematically illustrating an example of filter arrangement according to an embodiment.

Figure 287:
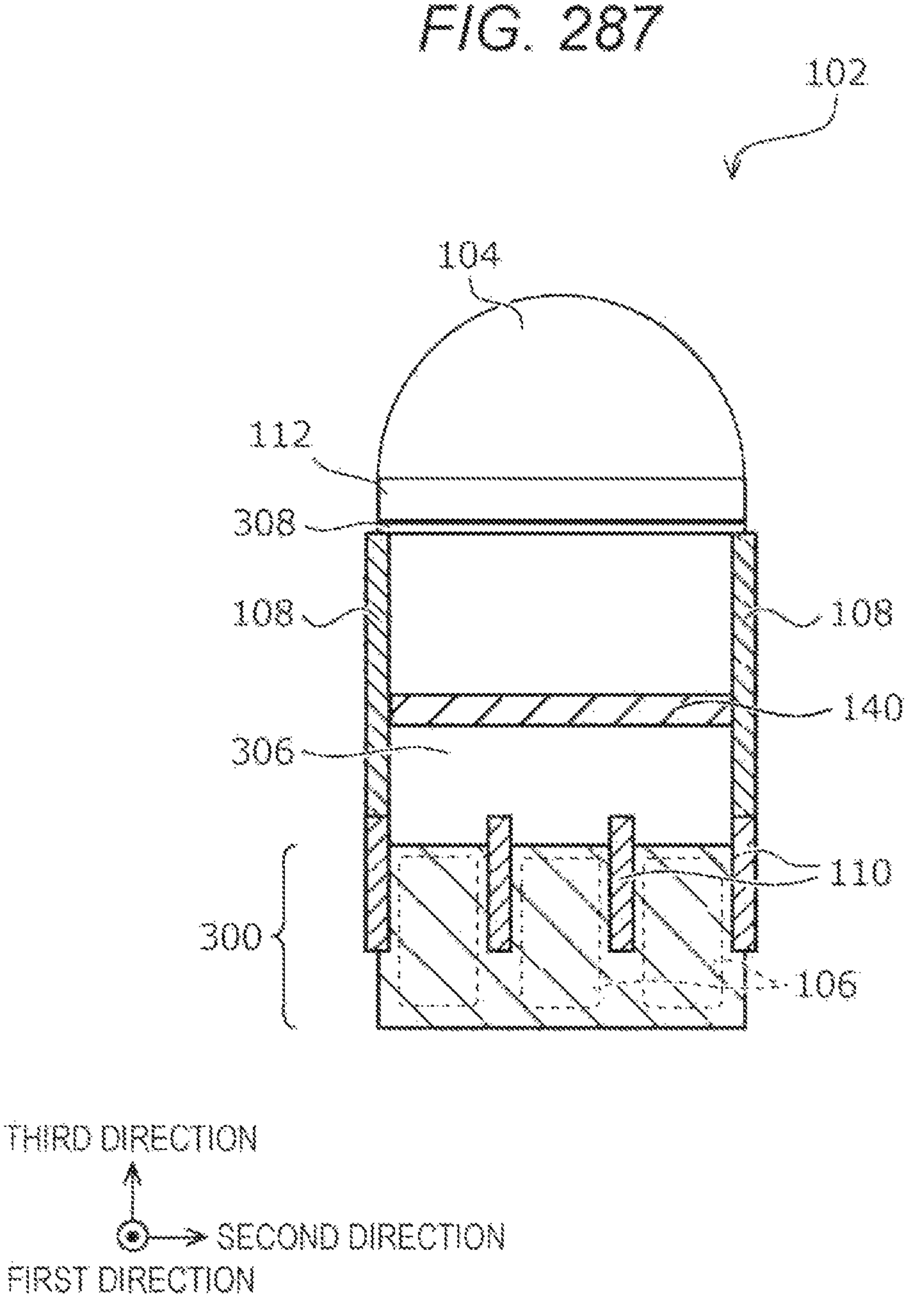
Figure 288:
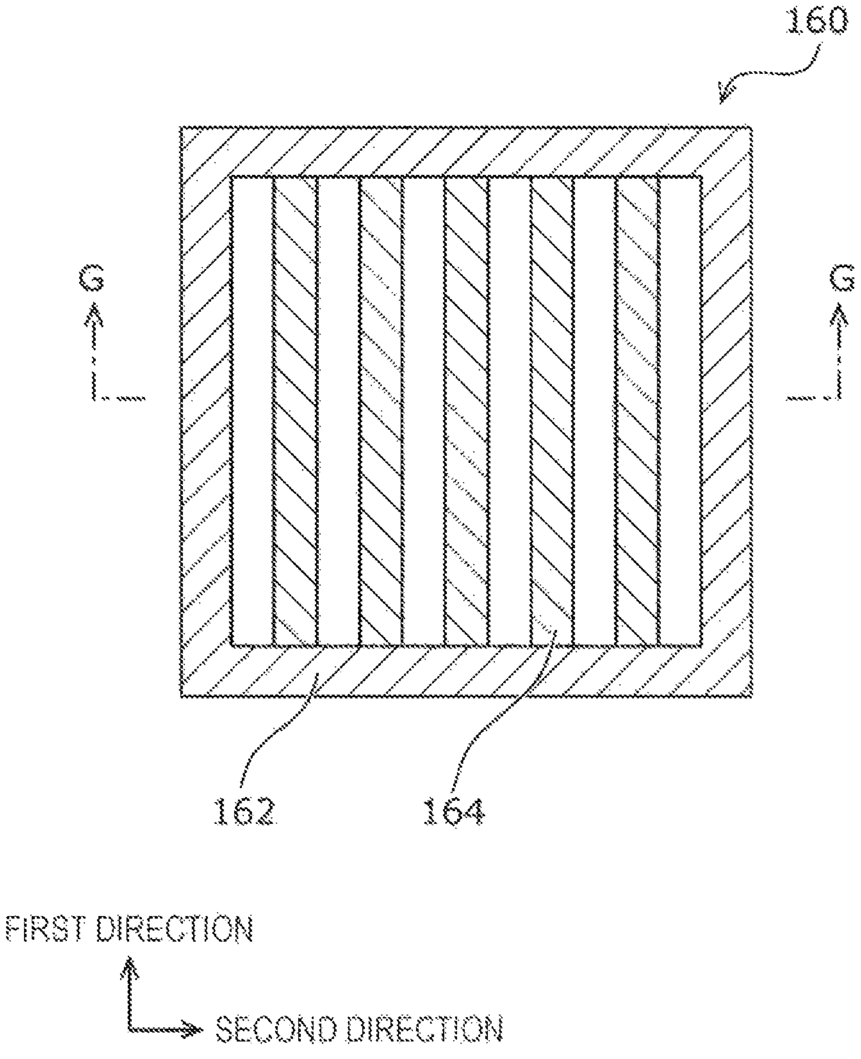

FIG. 287 is a view schematically illustrating an example of filter arrangement according to an embodiment.

Figure 289:
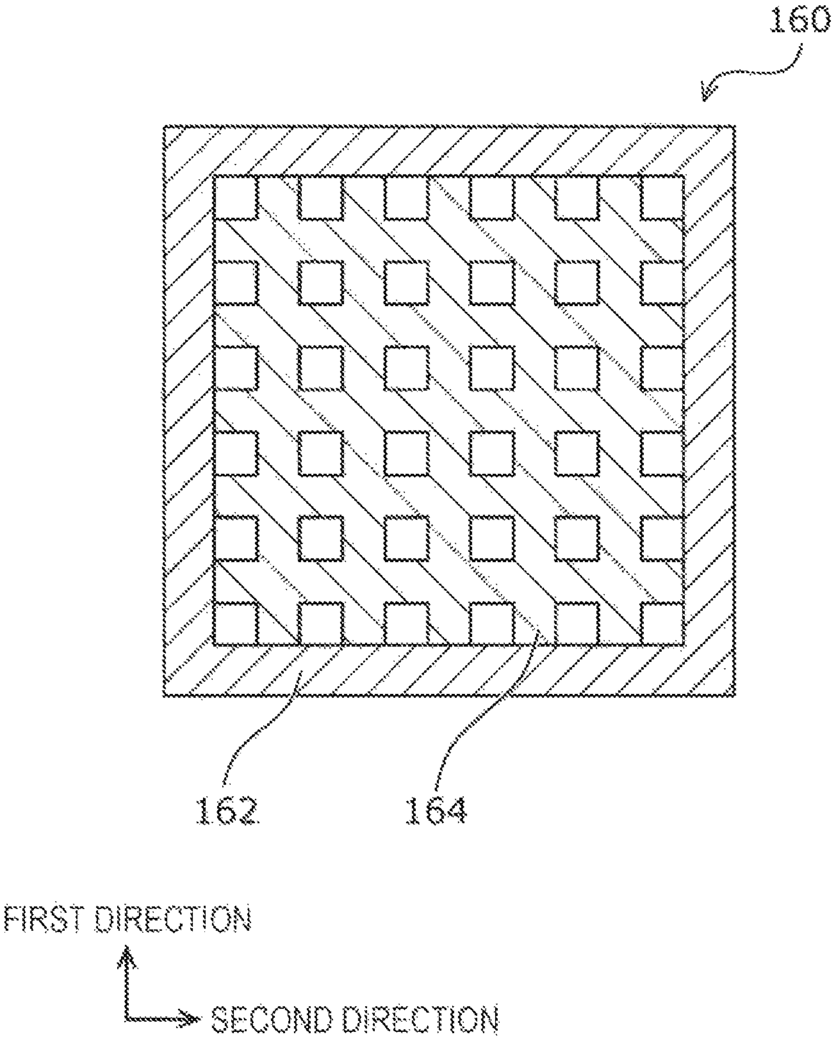

FIG. 289 is a diagram illustrating an example of a filter according to an embodiment.

Figure 290:
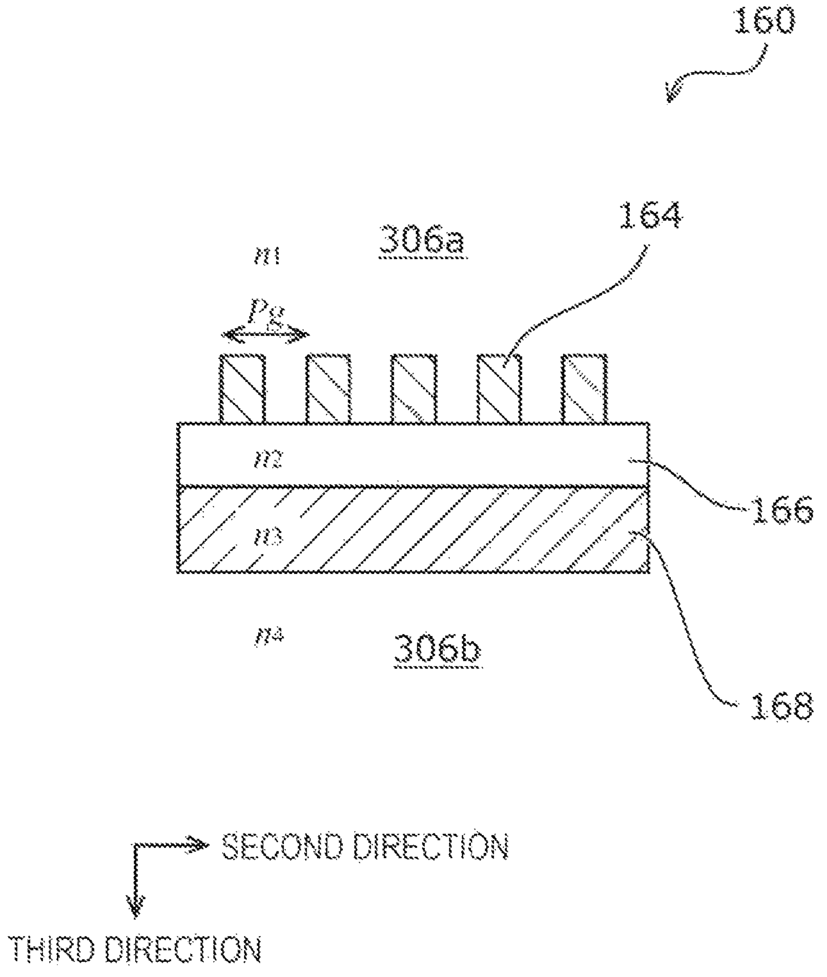

FIG. 290 is a diagram illustrating an example of a filter according to an embodiment.

Figure 291:
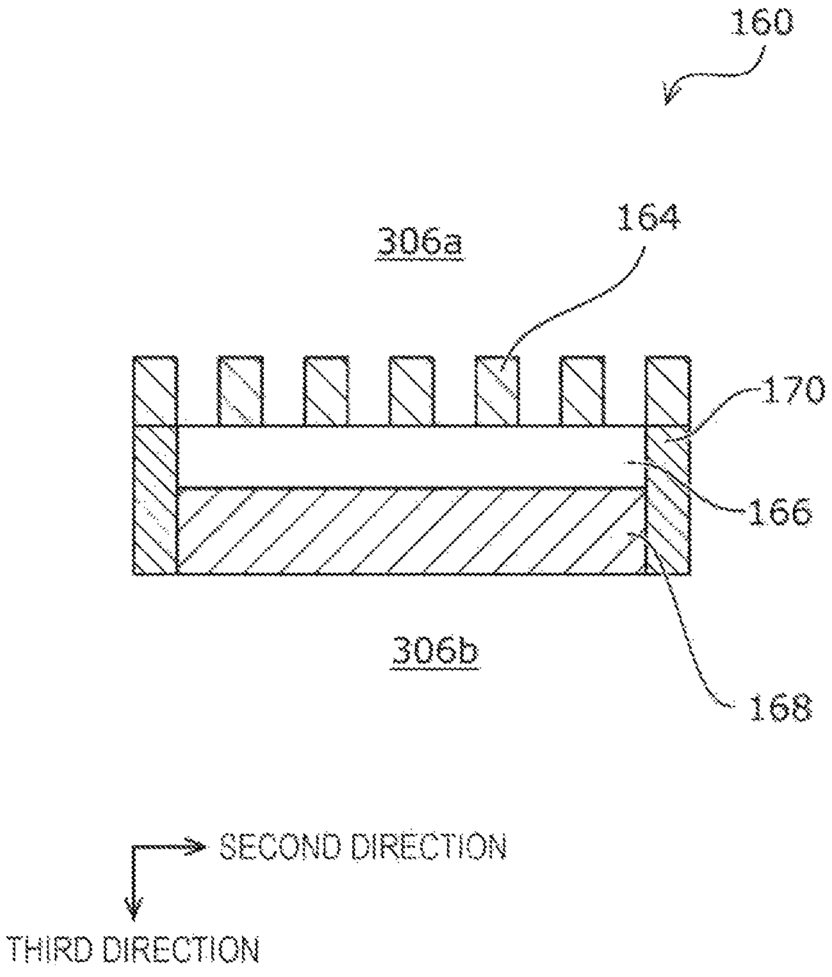

FIG. 291 is a diagram illustrating an example of a filter according to an embodiment.

Figure 292:
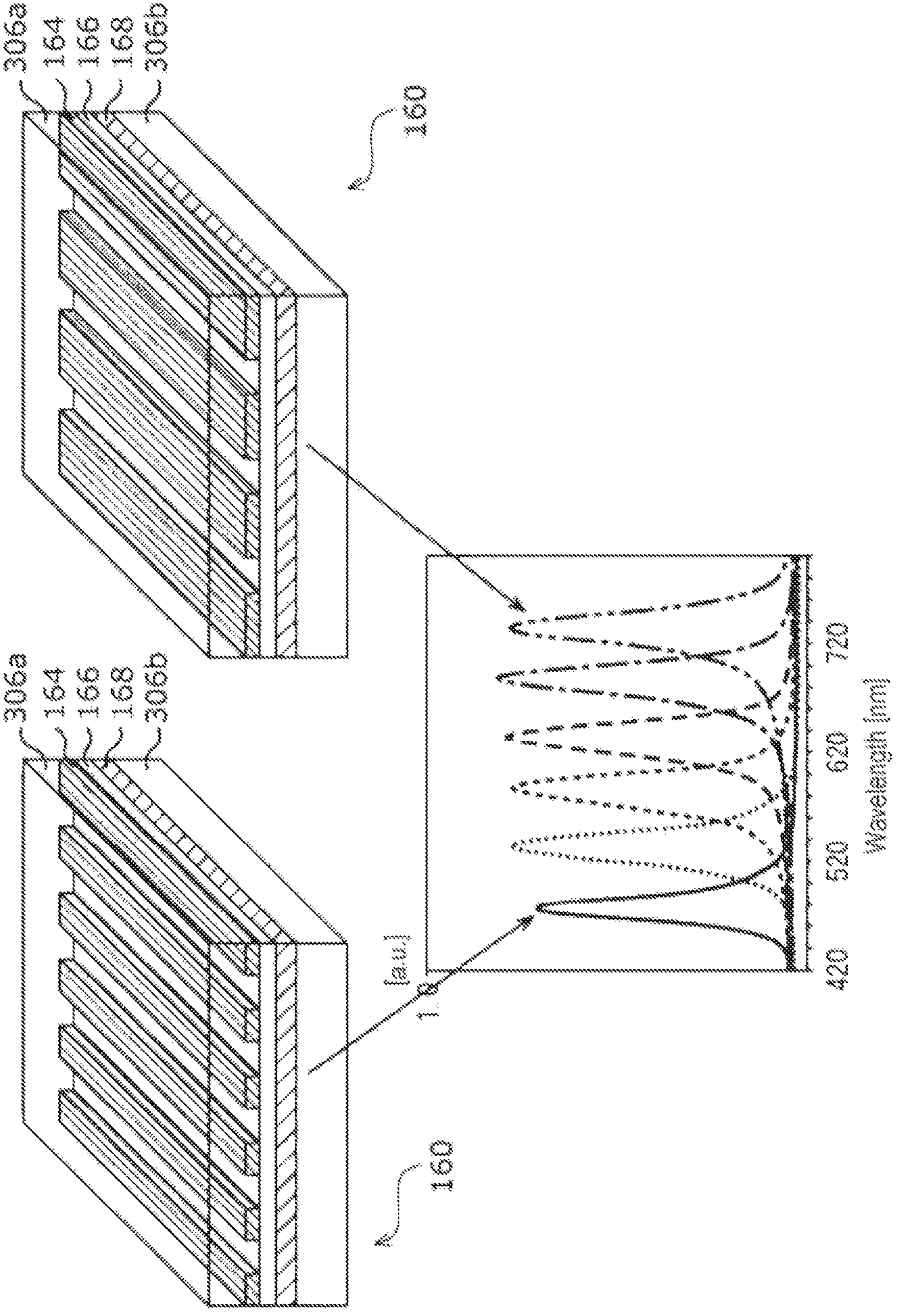

FIG. 292 is a diagram illustrating an example of a filter according to an embodiment.

FIG. 293 is a diagram illustrating an example of wavelength characteristics of a filter according to an embodiment.

MODE FOR CARRYING OUT THE INVENTION

Hereinafter, embodiments of an imaging device and an electronic device will be described with reference to the drawings. Hereinafter, main configuration parts of the imaging device and the electronic device will be mainly described, but the imaging device and the electronic device may have configuration parts and functions not illustrated or described.

The following description does not exclude components or functions not illustrated or described. Furthermore, there are cases where the size, shape, aspect ratio, and the like are changed for the sake of description, but these have an appropriate size, shape, aspect ratio, and the like in mounting. Furthermore, the drawings may illustrate cross-sectional views, which are intended to include end views. That is, it should be noted that what is described as a cross-sectional view includes a view illustrating only a cut surface.

Note that, in the following description, a signal to be acquired is described as image information or imaging information. The image information and the imaging information are concepts in a broad sense, and are concepts including an image of one frame in a still image, a moving image, or a video.

Figure 1:
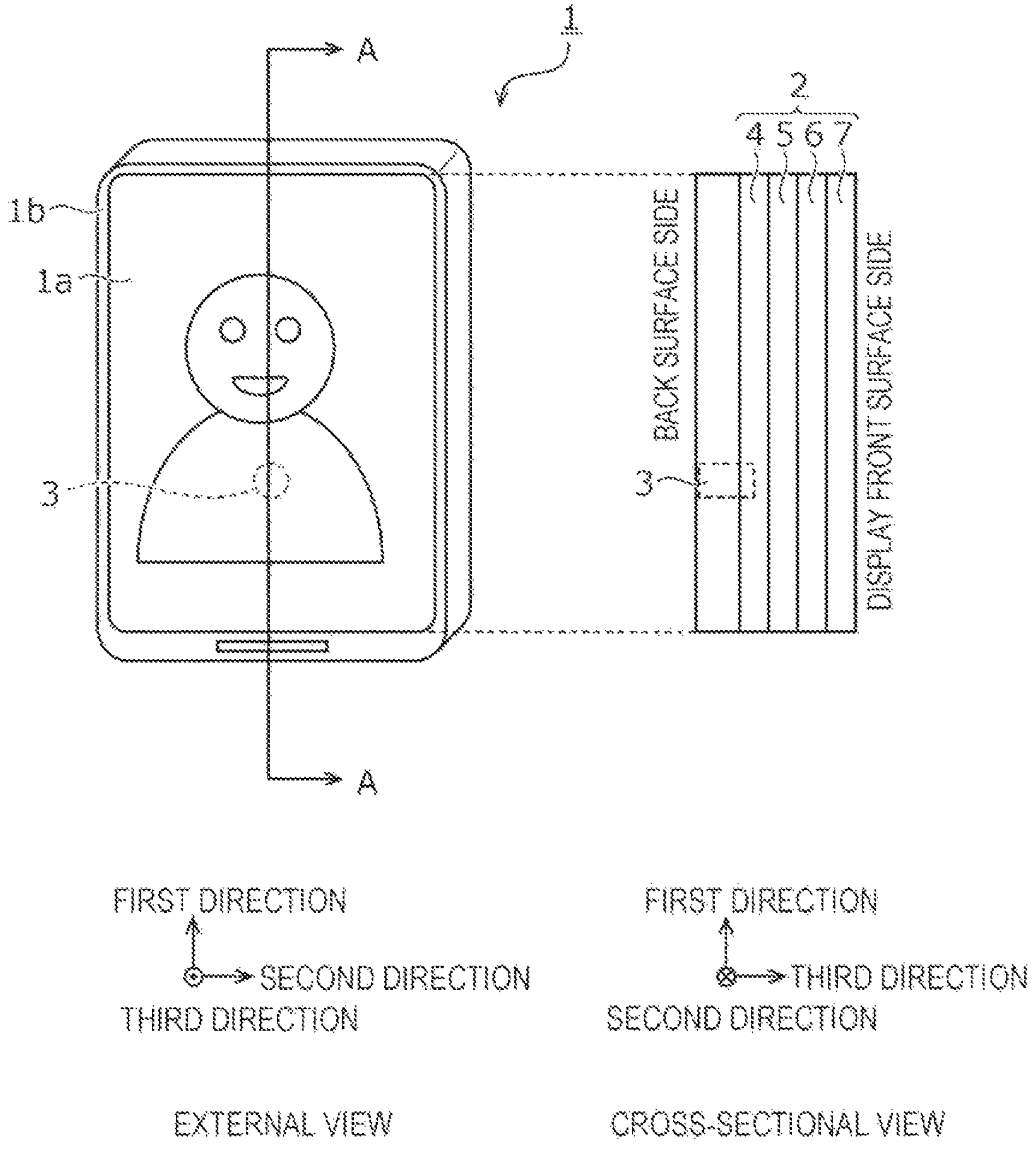
FIG. 1 is views schematically illustrating an electronic device according to an embodiment.

In the present disclosure, regarding directions, a first direction is a rightward direction in the drawing, a second direction is a direction perpendicular to the drawing, and a third direction is an upward direction in the drawing, as illustrated in the schematic view of an electronic device 1 in FIG. 1. That is, the second direction is a direction intersecting the first direction, and the third direction is a direction intersecting the first direction and the second direction. The term "intersect" may include an intersection at an angle of 90 degrees, or may not be strictly 90 degrees. Furthermore, as can be seen from the drawings, the first direction and the second direction are distinguished for convenience, and are equivalent even if they are interchanged.

Furthermore, an imaging element to be described below is also defined according to the electronic device, and the imaging elements are arranged in an array manner along the first direction and the second direction that is a direction intersecting the first direction. That is, a semiconductor substrate is provided along the first direction and the second direction. Then, the third direction is a direction intersecting the first direction and the second direction, and is a direction substantially perpendicular to the semiconductor substrate.

In the present specification, an electronic device will be described in the following order.

1. First Embodiment

A non-limiting example of an overall configuration of an electronic device will be described.

2. Second to Sixth Embodiments

Some non-limiting examples in which positions of an imaging element and a light source are not limited are described.

3. Seventh to Ninth Embodiments

Some non-limiting examples in which pixel shapes are not limited are described.

4. Tenth to Seventeenth Embodiments

Some non-limiting examples of planar arrangement of filters for pixels are described.

5. Eighteenth to Twenty-First Embodiments

Some non-limiting examples of planar arrangement of filters for subpixels are described.

6. Twenty-Second to Twenty-Ninth Embodiments

Some non-limiting examples of arrangement of filters on a substrate for pixels and subpixels are described.

7. Thirtieth to Forty-First Embodiments

Some non-limiting examples of a lens included in an imaging element are described.

8. Forty-Second to Sixty-Sixth Embodiments

Some non-limiting examples of peripheral technologies of photoelectric conversion elements in a pixel are described.

9. Sixty-Seventh to Ninety-Second Embodiments

Non-limiting examples of semiconductor processes are described for some of the imaging elements described in the above embodiments.

(9-1) Sixty-seventh to Seventy-fifth Embodiments: A process of manufacturing a photoelectric conversion unit in a pixel is described.

(9-2) Seventy-sixth to Ninety-second Embodiments: Processes of manufacturing a light-shielding wall isolating pixels, lenses constituting pixels, filters, and the like are described.

10. Ninety-Third to One Hundred and Fourth Embodiments: Other operations and configurations of signal processing, electronic devices, and the like are described.

Some non-limiting examples of signal processing for an imaging element having the configuration of each of the above embodiments are described.

11. One Hundred and Fifth and One Hundred and Sixth Embodiments

Still different non-limiting examples of filters for subpixels are described.

As described above, in the present disclosure, first, a configuration of an overall device including a sensor will be described with examples. Thereafter, a light-receiving sensor will be described with specific examples for each configuration element. Next, a process of manufacturing the light-receiving sensor will be described with specific examples. Finally, signal processing and configurations other than a semiconductor will be described with specific examples.

First Embodiment

[Electronic Device]

First, arrangement, function, and the like of a light receiving element in an electronic device 1, which are common in whole, will be described. More details will be described in each embodiment to be described below.

FIG. 1 schematically illustrates an external view and a cross-sectional view of an electronic device including an imaging device according to the present disclosure. The cross-sectional view illustrates an A-A cross section of a display portion including a display unit 2 along an alternate long and short dash line illustrated in the external view. Circuits and the like other than a housing portion and the display portion of the electronic device 1 are omitted for the sake of description.

In the external view, a display screen 1*a* expands to a vicinity of an outer diameter size of the electronic device 1, and the width of a bezel 1*b* around the display screen 1*a* is set to several mm or less. Normally, a front camera is often mounted on the bezel 1*b*. In the present embodiment, for example, as an imaging device 3, the front camera may be positioned approximately at a center of a lower portion of the display screen 1*a* in the second direction, as illustrated by the dotted line in the external view. In this manner, by arranging the front camera as the imaging device 3 on an opposite side of the display surface of the display unit 2, arrangement of the front camera in the bezel 1*b* is unnecessary and the width of the bezel 1*b* can be narrowed.

Note that the external view of FIG. 1 is illustrated as an example, and the imaging device 3, that is, the front camera may be arranged on the opposite side (back surface side) to the display surface of the display unit 2 at any position in the first direction and the second direction on the display screen 1*a*. For example, the front camera may be arranged in a peripheral edge portion (end portion or boundary portion) of the display screen 1*a*. Although one imaging device 3 is illustrated, the imaging device 3 is not limited thereto, and more imaging optical systems may be provided on the side opposite to the display surface. That is, a plurality of imaging elements 10 may be provided in one electronic device 1.

For example, as illustrated in the cross-sectional view, the imaging device 3 is provided in a back surface side opposite to a display surface side that is the display surface of the display unit 2. Note that this cross-sectional view is illustrated with omission. For example, similarly to the above, an adhesive layer and the like are also provided in the configuration of the cross-sectional view of FIG. 1, but are omitted for simplicity of description.

The imaging element in the present disclosure is provided under the display of the electronic device 1 as illustrated in FIG. 1, for example.

Figure 2:
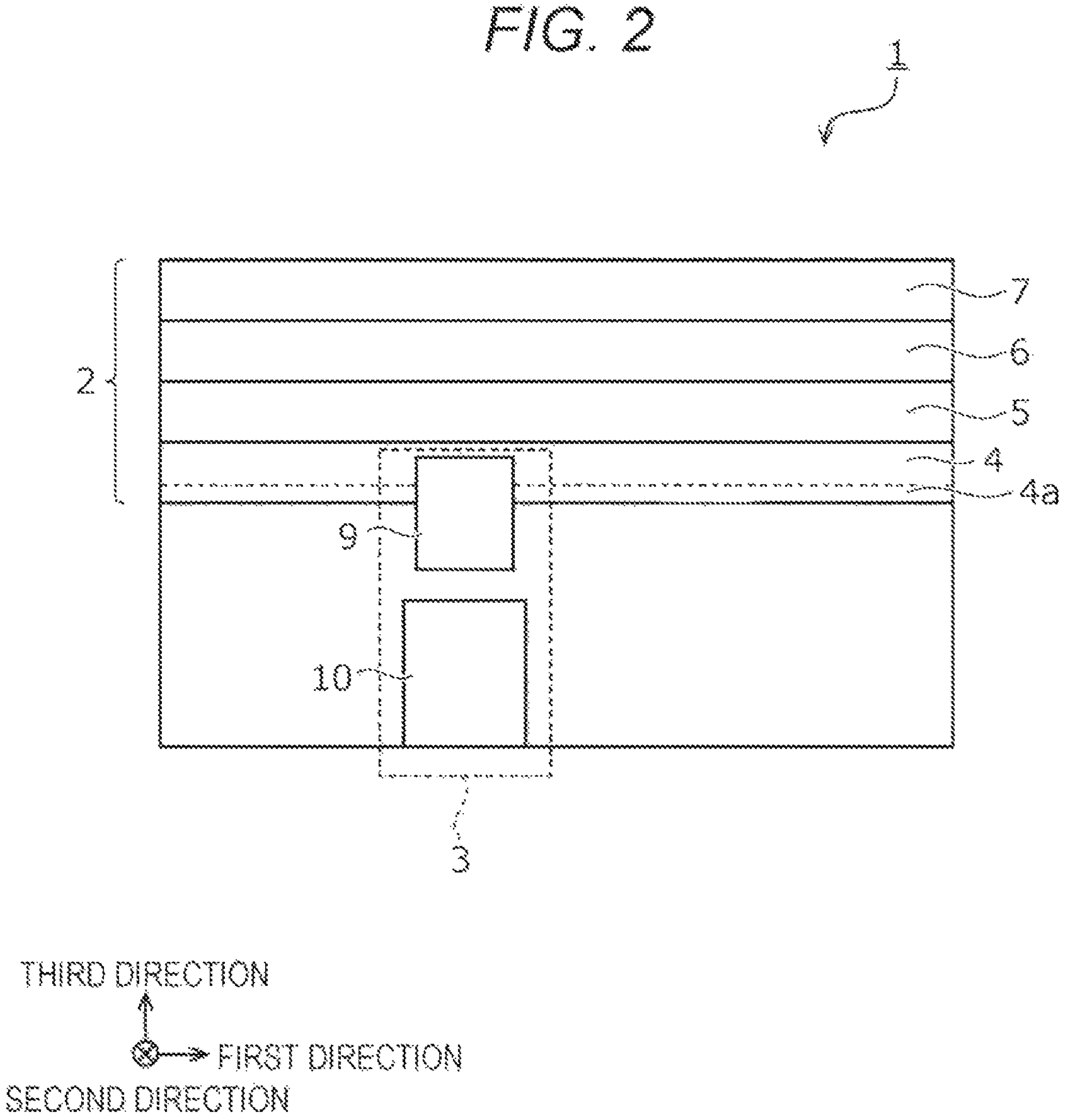
FIG. 2 is a cross-sectional view schematically illustrating an electronic device according to an embodiment.

FIG. 2 is a schematic cross-sectional view of the electronic device 1. That is, FIG. 2 illustrates the imaging device 3 in the cross-sectional view of FIG. 1 in more detail, and illustrates a relationship with other components. The electronic device 1 is any electronic device having both a display function and an imaging function, such as a smartphone, a mobile phone, a tablet, or a PC. The electronic device 1 provided with the imaging element is not limited to these forms, and can be used for various devices and the like.

The electronic device 1 includes the imaging device 3 (camera module or the like) arranged on the opposite side to the display surface of the display unit 2, and the imaging device 3 performs imaging through the display unit 2.

As illustrated in FIG. 2, the display unit 2 is a structure in which a display panel 4, a circularly polarizing plate 5, a touch panel 6, and a cover glass 7 are sequentially stacked along the third direction. The stack in FIG. 2 is illustrated as an example, and an adhesive layer or a glue layer may be provided between the display panel 4, the circularly polarizing plate 5, the touch panel 6, and the cover glass 7 as necessary. Furthermore, the order of the circularly polarizing plate 5 and the touch panel 6 may be appropriately changed according to design.

The imaging device 3 is provided on the opposite side to the display surface of the display unit 2. The imaging device 3 includes, for example, an imaging element 10 and an optical system 9.

A plurality of the imaging devices 3 may be provided for one display unit 2 of the electronic device 1. Light emitted on the display surface passes through, for example, the optical system 9 that is an opening, and is propagated to the imaging element 10. Furthermore, an optical system having some optical characteristics, for example, optical characteristics for adjusting an optical path length and changing a polarization state may be provided, instead of the opening.

The optical system 9 propagates the light emitted to the display surface to the imaging element. The optical system 9 may be, for example, a simple opening provided in the display panel 4. As another example, the optical system 9 may include a light propagation path including a substance having high transmittance, may have a waveguide structure in which a high refractive material having low absorption is surrounded by a low refractive material, or may have a lens shape. In the case of the lens shape, the optical system 9 may be a concept including an on-chip lens formed on the light receiving element. Furthermore, the imaging device 3 may not include the optical system 9.

Note that the imaging device 3 itself may be included in the imaging element 10. That is, the imaging element 10 may be appropriately formed in the lower side of the display panel 4 of the display.

Furthermore, in the following description, the imaging device 3 has the configuration including the above-described optical system 9 and imaging element 10, but may have a concept of further including an A/D conversion unit, an information processing unit, and the like. That is, in the case of describing the imaging device 3 in the present disclosure, the imaging device 3 may have a concept including not only the configuration of the imaging system but also an information processing unit or the like that outputs information including image data and a recognition result, as illustrated in FIG. 1 and the like.

Although not illustrated in detail, for example, the display panel 4 may include an organic light emitting device (OLED), a liquid crystal such as a TFT, a microLED, or a microOLED as the optical system (display optical system) for display. The display optical system may include a light emitting element based on another display principle.

The light emitting element as the display optical system may have, for example, a stripe array or a mosaic array. The light emitting elements may be arranged in an array in the first direction and the second direction, or may have oblique or partial pixel thinning. This array may be arranged in the same order as description regarding an array of the light receiving elements to be described below, for example. Furthermore, in the display optical system, the light emitting element may include a stacked filter to change a display color. In the case of including an OLED or the like as the light receiving element, the display panel 4 may include a plurality of layers such as an anode layer and a cathode layer. Furthermore, these layers may include a material having high transmittance.

The display panel 4 may be provided with a member having low transmittance such as a color filter layer. In the case where the display panel 4 includes the OLED, for example, the display panel 4 may include a substrate 4*a* and an OLED unit. The substrate 4*a* may include, for example, polyimide or the like. In the case where the substrate 4*a* includes a material having low light transmittance such as polyimide, an opening may be formed in accordance with an arrangement place of the imaging device 3. Furthermore, the display panel 4 may include a light propagation path including a substance having high transmittance, may have a waveguide structure in which a high refractive material having low absorption is surrounded by a low refractive material, or may have a lens shape. Also in this case, the light incident from the display surface of the display unit 2 is received by the imaging device 3 and converted into a signal.

The light emitting element included in the display panel 4 may perform a light emission operation at timing of acquiring fingerprint information in fingerprint authentication or the like to be described below. That is, the light emitting element included in the display panel 4 may operate as an element that outputs an image on the display surface of the display unit 2, and may operate as a light emitting element at timing of acquiring a fingerprint or the like.

The circularly polarizing plate 5 is provided to, for example, reduce glare or enhance visibility of the display screen 1*a* even in a bright environment.

A touch sensor is incorporated in the touch panel 6. There are various types of touch sensors such as a capacitive type and a resistive film type, but any type may be used. Furthermore, the touch panel 6 and the display panel 4 may be integrated.

By design, the order of the circularly polarizing plate 5 and the touch panel 6 in the third direction may be interchanged.

The cover glass 7 is provided to protect the display panel 4 and the like. As described above, an adhesive layer or a glue layer such as an optical clear adhesive (OCA) may be provided at an appropriate position.

Figure 3:
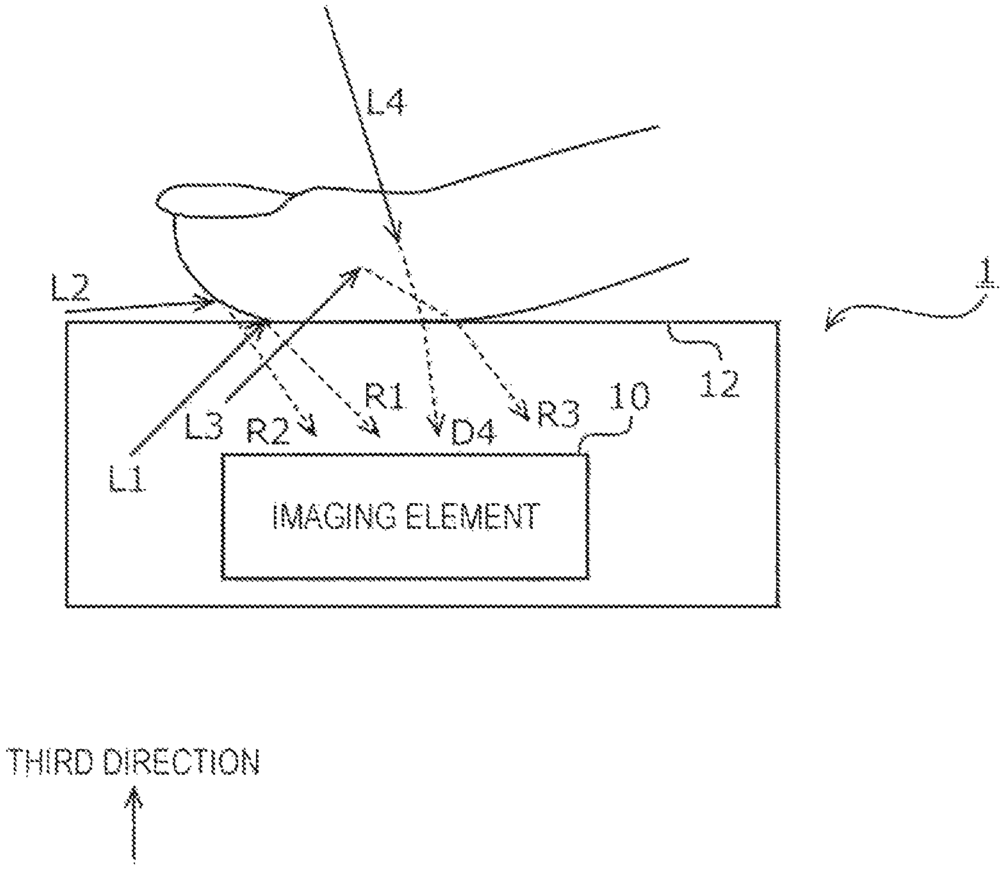
FIG. 3 is a view schematically illustrating light reception of an electronic device according to an embodiment.

FIG. 3 is a view schematically illustrating an example in which imaging is performed by the imaging element according to the embodiment. The electronic device 1 may have a function to read a fingerprint or the like of a person and execute personal authentication, for example. This personal authentication may be executed on the basis of a characteristic point of a fingerprint or the like, or may be executed using a trained neural network model, for example. As will be described below, for example, an option for determining whether or not an object is a living body may be added.

A portion on which a finger is placed is, for example, the cover glass 7 illustrated in FIG. 1 or 2. As described above, for example, light is incident on the imaging element 10 via the cover glass 7, the touch panel 6, the circularly polarizing plate 5, and the display panel 4.

The imaging element 10 receives reflected light R1 on a reading surface 12 of the electronic device 1, the reflected light being light L1 emitted from an inside of the electronic device 1. The light is received by the light receiving element provided in the imaging element 10, and appropriate processing is executed for the light.

As another example, light R2 reflected around the reading surface 12 may be received, the light R2 being light L2 emitted from an outside of the electronic device 1.

As another example, light may be received via the reading surface 12, the light being light L3 emitted from the inside of the electronic device 1 and transmitted not to the reading surface of the electronic device 1 but to a finger of a person or the like to some extent, for example, up to a skin portion, and reflected and scattered.

As another example, light D4 may be received, the light D4 being external light L4 transmitted and scattered by a human finger or the like, and diffracted on the reading surface 12. Of course, the direction of light is not limited to the direction of the external light L4, and for example, light coming from the direction of the light L2 may be transmitted through the finger, and light reflected and scattered inside the finger may be received.

As will be described below, the imaging element 10 includes pixels in an array manner. The imaging element 10 acquires information of a fingerprint or the like by reading a state of reflected light and diffracted light incident on a pixel in the pixel array.

For example, the reading surface 12 is set such that reflection is less likely to occur in a region where a ridge of the fingerprint and the reading surface 12 are in contact, and conversely, total reflection is performed in a region where the ridge of the fingerprint and the reading surface 12 are not in contact. By having such a reading surface 12, fingerprint information is acquired by reading the region where the ridge of the fingerprint exists and the region where the ridge of the fingerprint does not exist by each pixel.

Next, the imaging device of the electronic device 1 will be described in more detail.

[Imaging Element]

Figure 4:
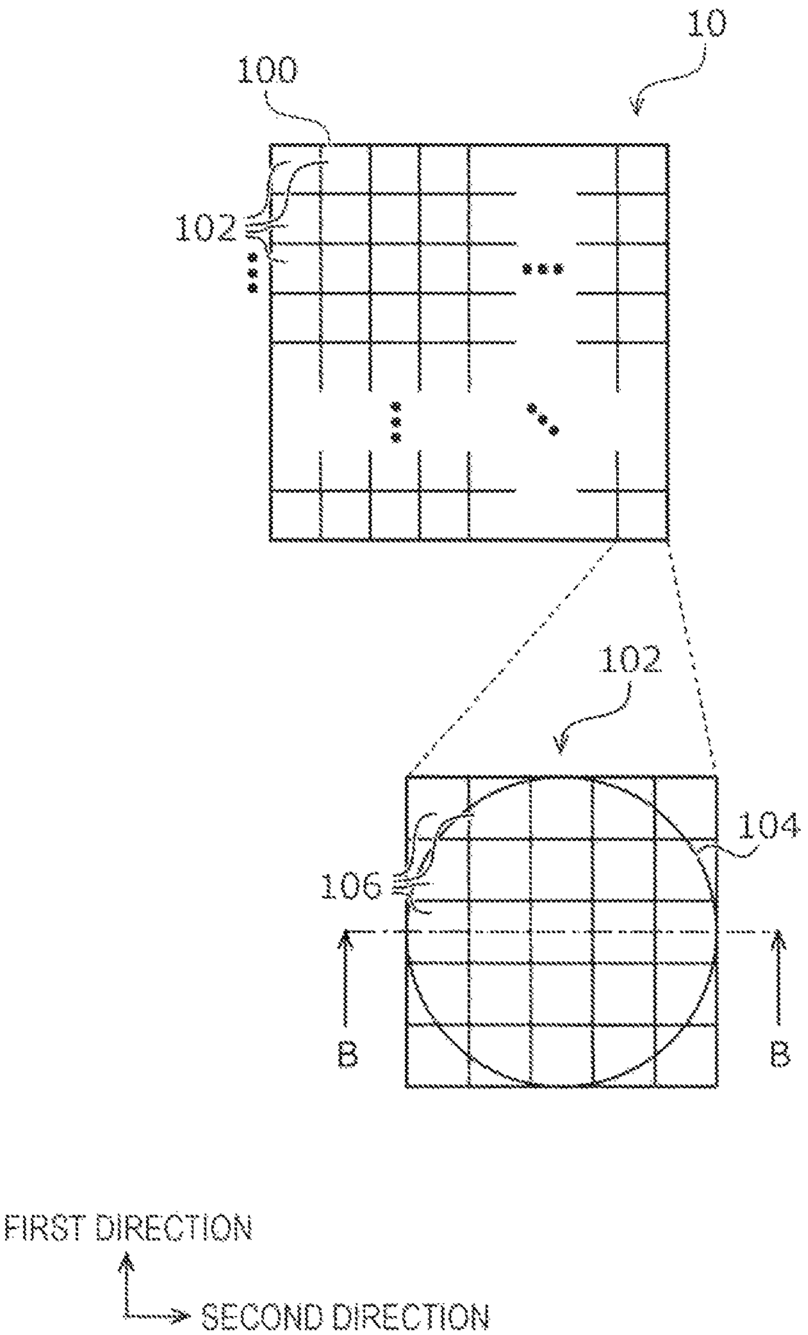
FIG. 4 is a plan view schematically illustrating imaging pixels according to an embodiment.

FIG. 4 is a plan view schematically illustrating imaging pixels included in the imaging element in the imaging device 3 according to the embodiment. For example, FIG. 4 is a plan view illustrating the imaging device 3 from the direction of the reading surface 12 illustrated in FIG. 2. Hereinafter, to simplify the description, the term "pixel" means an imaging pixel and is distinguished from a light emitting pixel unless otherwise specified.

Light is incident on the pixels of the imaging element 10 in the imaging device 3 illustrated in FIG. 4 via the optical system 9 illustrated in FIG. 2. For example, as illustrated in the upper view, the imaging element 10 includes a pixel array having pixels 102 in an array manner along the first direction and the second direction. That is, the optical system 9 is arranged so as to condense suitably desired light on a region present in the pixel 102.

The imaging element 10 includes a plurality of the pixels 102 in an array manner as described above. The arrangement of the pixels illustrated in FIG. 4 is illustrated as an example, and is not limited to this arrangement. Another example will be described in detail below.

The lower view illustrates a plan view of the pixel 102. The lower view is an enlarged view of one of the pixels 102 in the upper view. The pixel 102 includes, for example, a lens 104 and a plurality of subpixels 106.

For example, one lens 104 is provided for one pixel 102. The present embodiment is not limited thereto, and the lens 104 may include a plurality of stacked lenses. As illustrated in the plan view, the lens 104 is arranged such that the light is condensed on the subpixels 106 included in the pixel 102. For example, the lens 104 is arranged such that the light incident in parallel to a vertical direction of the drawing is condensed on the subpixels 106 located at the center of the pixel 102.

As an example, the light incident in parallel to an optical axis of the lens 104 is condensed on the subpixels 106 located at the center of the pixel 102. The lens 104 may be, for example, an on-chip micro-lens array formed on a chip forming the imaging element 10. The lens 104 may be a lens formed by etching back, for example, as will be described in a manufacturing process to be described below.

Figure 5:
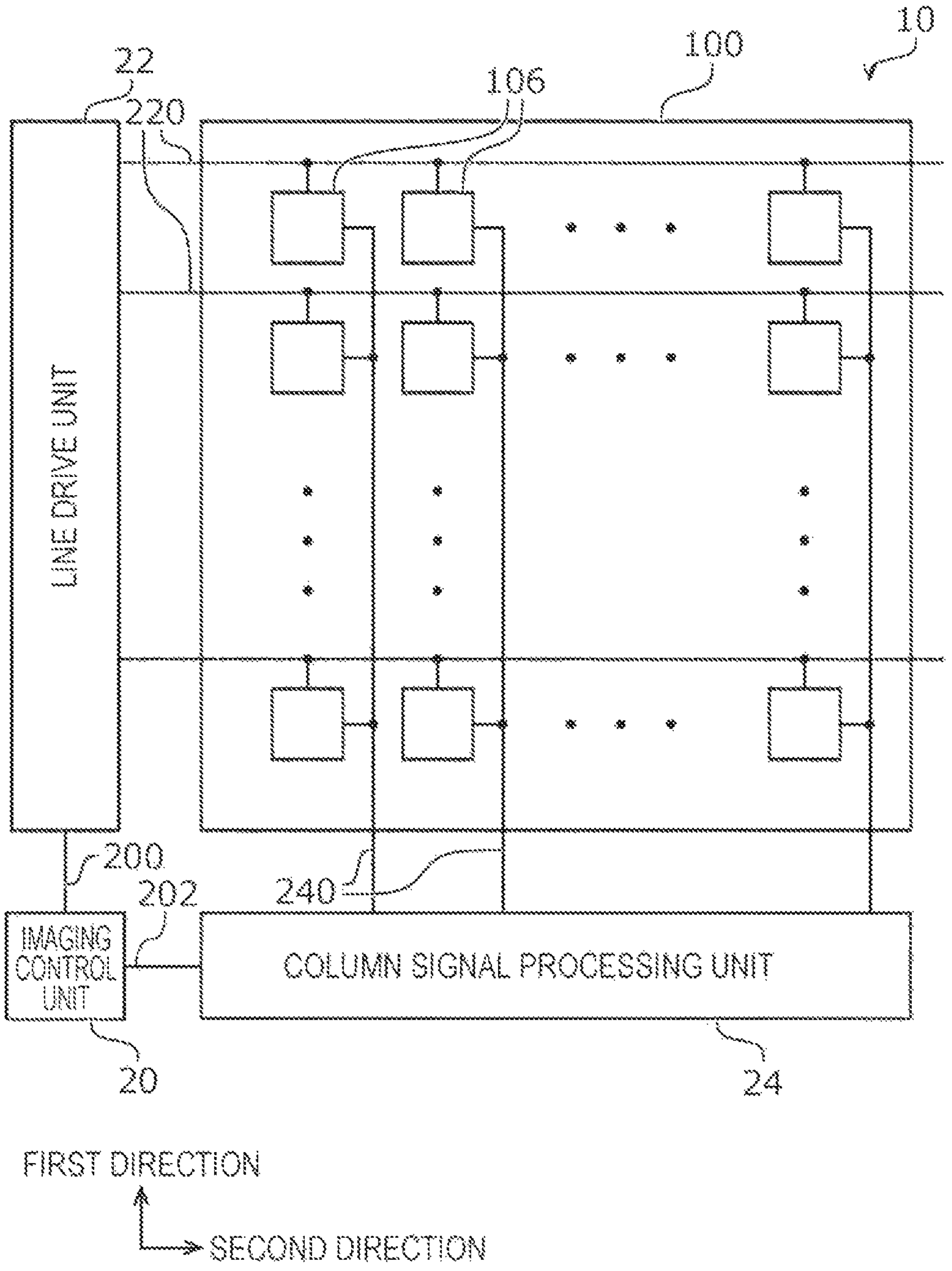
FIG. 5 is a diagram schematically illustrating an imaging element according to an embodiment.

FIG. 5 is a plan view schematically illustrating an example of a configuration of the imaging device 3 according to the embodiment. The imaging device 3 includes a pixel array 100, an imaging control unit 20, a line drive unit 22, and a column signal processing unit 24. Note that, in this drawing, the first direction and the second direction are illustrated for convenience, and the arrangement of each component is not limited to these directions.

The pixel array 100 includes the subpixels 106 arranged in an array manner on the semiconductor substrate and having photoelectric conversion elements. Furthermore, a line drive line 220 and a column signal line 240 are arranged in the pixel array 100.

As illustrated in FIG. 4 as an example, the plurality of subpixels 106 is provided in the pixel 102. The subpixel 106 includes a photoelectric conversion unit such as a photodiode in which a charge is generated and accumulated according to emitted light, and a plurality of pixel transistors.

The pixel transistor includes a source/drain region (not illustrated) formed on the front surface side of the semiconductor substrate, and a gate electrode formed via a gate insulating film. The pixel transistor may include a plurality of MOS transistors including a transfer transistor, a reset transistor, a selection transistor, and an amplifier transistor. Furthermore, the pixel transistor may include a plurality of transistors excluding the selection transistor among the above transistors.

Moreover, a pixel sharing structure including a plurality of subpixels 106, a plurality of transfer transistors, a shared floating diffusion, and another shared pixel transistor may be adopted. For example, the subpixels 106 belonging to the same pixel 102 may include one floating diffusion and a transistor constituting each one of the above-described pixel transistors in a shared manner.

The imaging control unit 20 acquires a signal in the imaging element 10 and performs control to appropriately transfer the acquired signal.

The line drive unit 22 is connected to the imaging control unit 20 and a plurality of the line drive lines 220. The line drive line 220 is connected to at least one of the pixel transistors included in the respective subpixels 106 belonging to one line, that is, a line along the first direction in the pixel array 100. The line drive unit 22 selectively outputs a drive signal for outputting a signal from the subpixel 106 for each line to the line drive line 220 under the control of the imaging control unit 20.

An image signal is generated by a pixel circuit from the charge generated by the photoelectric conversion element of the subpixel 106, and is controlled by a control signal of the line drive unit 22. In the array unit of the subpixels 106, the line drive lines 220 and the column signal lines 240 are arranged, for example, in a matrix manner along the first direction and the second direction.

The line drive line 220 is a signal line that transmits the control signal of the pixel circuit in the subpixel 106, and is arranged for each row of the pixel array 100. The line drive line 220 is commonly wired to the subpixels 106 arranged in each row.

The column signal processing unit 24 is connected to the imaging control unit 20 and the plurality of column signal lines 240. The column signal line 240 is connected to at least one of the pixel transistors included in the respective subpixels 106 belonging to one column, that is, a column along the second direction in the pixel array 100. The column signal processing unit 24 acquires the image signal obtained by photoelectric conversion by the subpixel 106 for each column via the column signal line 240 under the control of the imaging control unit 20. Then, the acquired image signal is output to an appropriate place.

The column signal line 240 is a signal line that transmits the image signal based on the charge generated in the subpixel 106, and is arranged for each column of the pixel array 100. The column signal line 240 is wired in common to the subpixels 106 arranged in each column.

The imaging control unit 20 appropriately outputs the light received by each of the subpixels 106 as an analog image signal by controlling the line drive unit 22 and the column signal processing unit 24.

The line drive unit 22 generates the control signal of the pixel circuit. The line drive unit 22 transmits the generated control signal to the pixel circuit of the photoelectric conversion element via the line drive line 220. The column signal processing unit 24 processes the image signal based on the charge generated in the subpixel 106. The column signal processing unit 24 processes the image signal via the column signal line 240. The processing in the column signal processing unit 24 corresponds to, for example, analog-digital (A/D) conversion for converting an analog image signal into a digital image signal. The image signal processed by the column signal processing unit 24 is output as the image signal of the imaging element 10.

The imaging control unit 20 controls the entire imaging element 10. The imaging control unit 20 controls the imaging element 10 by generating and outputting the control signal for controlling the line drive unit 22 and the column signal processing unit 24. The control signal generated by the imaging control unit 20 is transmitted to the line drive unit 22 and the column signal processing unit 24 by a signal line 200 and a signal line 202, respectively.

The imaging element 10 may include a black reference pixel region (not illustrated) for outputting optical black serving as a reference of a black level. The black reference pixel region is covered with a light-shielding film such as metal, and is usually arranged outside an effective pixel region.

The configuration example of the imaging element disclosed here can be applied to a back-illuminated imaging device, a front-illuminated imaging device, an imaging device using an organic photoelectric conversion film, and the like.

[Pixel]

Figure 6:
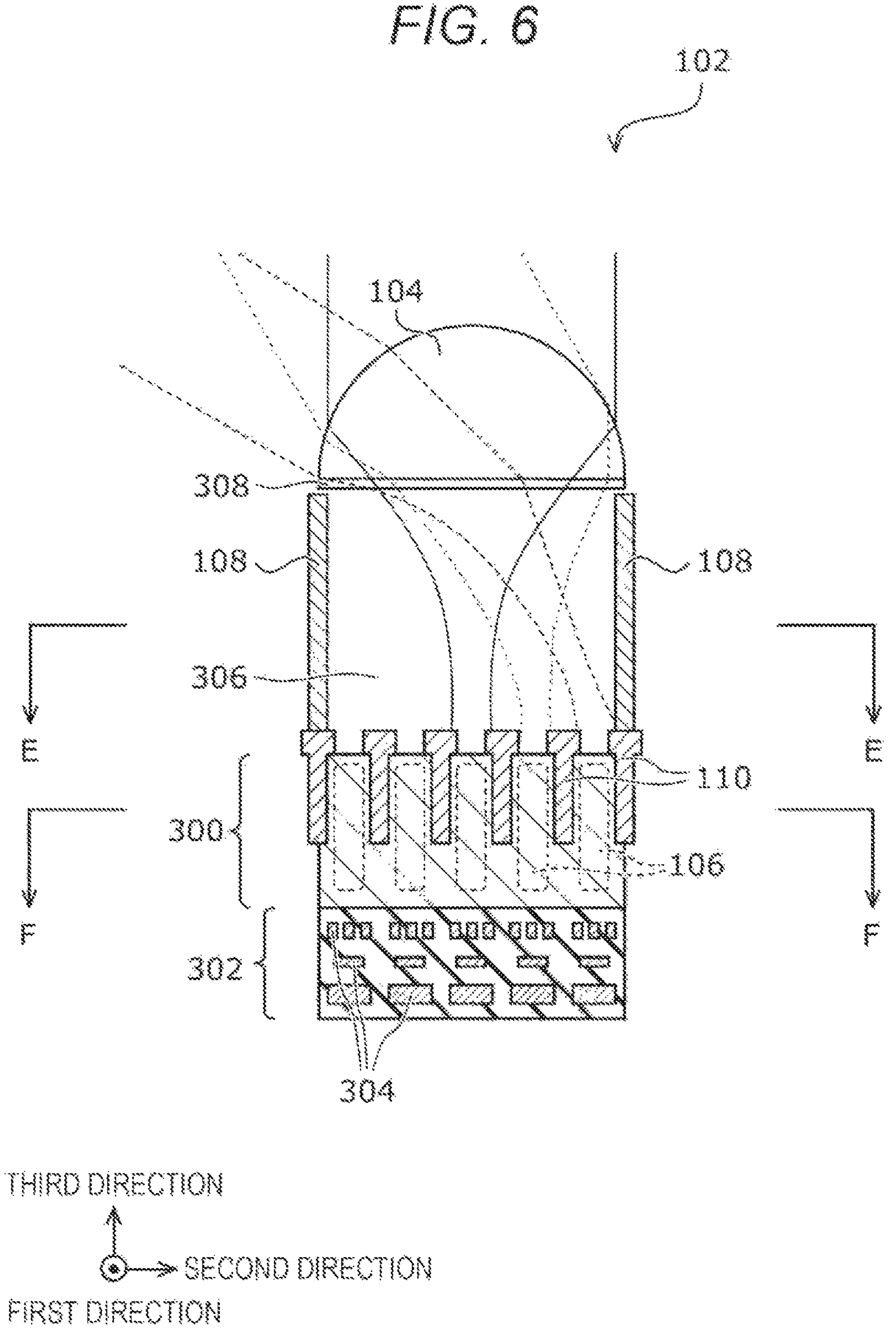
FIG. 6 is a cross-sectional view schematically illustrating an imaging pixel according to an embodiment.

FIG. 6 is a view schematically illustrating an example of a pixel according to the present embodiment. For example, an example of a back-illuminated imaging element is illustrated as the pixel 102. FIG. 6 is a cross-sectional view taken along B-B of FIG. 4. The pixel 102 includes the lens 104, the plurality of subpixels 106, a light-shielding wall 108, a plurality of photoelectric conversion element isolation portions 110, a semiconductor substrate 300, a wiring layer 302, a wiring 304, an interlayer film 306, and an adhesion layer 308.

Note that, in the drawings to be described below, hatching is given in principle, but this hatching is illustrated as an example in consideration of ease of understanding in viewing the drawings. For example, the photoelectric conversion element isolation portion 110 may be illustrated as an insulator, but the entire photoelectric conversion element isolation portion 110 is not necessarily configured as an insulator.

As an example, the photoelectric conversion element isolation portion 110 includes a metal or the like as a core, and includes an insulating film (oxide film) between the core and a semiconductor layer. The characteristic configuration is illustrated in each embodiment described below, and the cross-sectional view of the pixel 102 in FIG. 6 and the like includes configuration elements of a conductive pair, a semiconductor, and an insulator in each of these characteristic embodiments. That is, in the cross-sectional view of the pixel 102, the substance is not limited by hatching.

As another example, the lens 104, the interlayer film 306, and the like are not hatched in order to transmit light, but this may include, for example, an insulator. As described above, hatching may be omitted on the basis of light transmission performance and the like, but it should be noted that physical properties and the like appropriately correspond to the drawings according to the description of the present specification.

Furthermore, in these drawings, the size of the photoelectric conversion element isolation portion 110 is emphasized for easy understanding, but the actual size with respect to the subpixel 106 is not illustrated. That is, regardless of ratios in these drawings, the photoelectric conversion element isolation portion 110 may be formed sufficiently smaller than the subpixel 106.

The pixel 102 has a plurality of subpixels 106.

A plurality of subpixels 106 is provided for one pixel 102. For example, as illustrated in FIG. 4, 5×5=25 subpixels 106 may be provided for one pixel 102. The subpixel 106 is, for example, a photodiode. The number of the subpixels 106 is not limited thereto, and may be more or less than 25 as long as processing can be appropriately executed.

As will be described below, the subpixels 106 are all illustrated as the same square, but are not limited thereto, and may have an appropriate shape on the basis of information desired to be acquired according to various situations. Furthermore, another filter may be used for each subpixel 106 included in the pixel 102.

The subpixel 106 includes, for example, an n-type semiconductor region and a p-type well region around the n-type semiconductor region. When pn junction between the n-type semiconductor region and the p-type well region is irradiated with incident light, photoelectric conversion occurs. The charge generated by the photoelectric conversion is converted into the image signal by the pixel circuit (not illustrated). Semiconductor region portions of the line drive unit 22, the column signal processing unit 24, and the imaging control unit 20 illustrated in FIG. 5 may be further formed on the semiconductor substrate 300.

In the above description, the n-type and the p-type are exemplified, but the semiconductor type in the present disclosure is not limited thereto. For example, the n-type and the p-type may be interchanged as long as appropriate operation is performed. Furthermore, for example, an n+ type, an n++ type, a p+ type, a p++ type, or the like may be used so as to appropriately operate. The same similarly applies to the following description.

For example, one lens 104 is provided for one pixel 102. Furthermore, the lens 104 may include a plurality of stacked lenses. As an example, as illustrated in FIG. 6, the lens 104 may be a spherical lens or a lens having a shape close to a spherical surface. The lens 104 can include, for example, an organic material such as a styrene-based resin, an acrylic resin, a styrene-acrylic copolymer-based resin, or a silosane-based resin. Furthermore, the lens 104 can also include an inorganic material such as silicon nitride or silicon oxynitride. An antireflection film having a different refractive index may be provided on a lens surface.

Moreover, the lens 104 may include, for example, a planarization film including an organic material, for example, an acrylic resin under the lens material with respect to an underlying level difference. The lens 104 may include, as another means, a transparent inorganic material, for example, silicon oxide, planarized by chemical mechanical polishing (CMP) or the like. Furthermore, the lens 104 may be a reflow lens formed through a reflow process.

FIG. 6 illustrates an example of the back-illuminated imaging element 10, and illustrates a case where a light beam parallel to the installation of the element (parallel to the optical axis of the lens 104) and a light beam in an oblique direction (a direction not parallel to the optical axis of the lens 104) are incident from the third direction.

For example, a bundle of parallel light beams (solid lines) incident from an upper part of the lens 104 is condensed on the subpixel 106 located at the center. Meanwhile, a bundle of light beams incident in the oblique direction (dotted lines or broken lines) is condensed on the subpixel 106 that is not at the center. Note that, in the above description, the vertical optical axis of the lens 104 is used as a reference, but this is not necessarily the case, and from which direction the light beam is incident on the subpixel 106 located at the center of the pixel 102 may be determined by a pupil correction technique or the like to be described below.

Note that details of another form of the optical path will be described below.

The light-shielding wall 108 isolates the pixels 102 from each other. The light-shielding wall 108 can suppress incidence of light from an adjacent pixel 102, and stray light can be shielded by providing the light-shielding wall 108. As a result, crosstalk that may occur in the adjacent pixel 102 can be suppressed, and a resolution can be improved.

The light-shielding wall 108 can include a material having a light-shielding property, for example, a metal film containing at least one of tungsten (W), aluminum (Al), silver (Ag), gold (Au), copper (Cu), platinum (Pt), molybdenum (Mo), chromium (Cr), titanium (Ti), nickel (Ni), iron (Fe), tellurium (Te), or the like, a compound including at least two of these metals, an oxide of these metals, a nitride of these metals, or an alloy of these metals. Furthermore, a multilayer film obtained by combining these materials can also be configured.

Moreover, as will be described below, the light-shielding wall 108 may be divided in multiple stages in the third direction. At a boundary of the pixels 102, the light-shielding walls 108 and the photoelectric conversion element isolation portions 110 may be in continuous contact with each other.

The photoelectric conversion element isolation portion 110 isolates the plurality of subpixels 106 included in the pixel 102. That is, the photoelectric conversion element isolation portion 110 is provided such that an influence of the incident light does not reach the other subpixel 106 between the adjacent subpixels 106.

The photoelectric conversion element isolation portion 110 isolates the plurality of subpixels 106 included in the pixel 102. That is, the photoelectric conversion element isolation portion 110 is provided such that an influence of the incident light does not reach the other subpixel 106 between the adjacent subpixels 106.

The semiconductor substrate 300 is, for example, a silicon substrate. In the semiconductor substrate 300, the semiconductor region portion of the element constituting the pixel circuit is formed. The element of the pixel circuit is formed in a well region formed in the semiconductor substrate 300. As an example, the semiconductor substrate 300 in the drawing includes a p-type well region.

The wiring layer 302 connects the semiconductor elements in the pixel 102 to each other. Furthermore, the wiring layer 302 is also used for connection with a circuit outside the pixel, and constitutes a signal line. The wiring of the wiring layer 302 constitutes a wiring 304 that is a conductor using, for example, a metal such as copper or aluminum, and transmits an electrical signal, and an insulating layer includes, for example, silicon oxide ($SiO_2$) and insulates the wirings from each other.

In the case of the back-illuminated imaging element 10, the insulating layer and the wiring 304 are formed adjacent to the front surface side of the semiconductor substrate 300 to constitute the wiring layer 302. Moreover, a support substrate (not illustrated) may be arranged adjacent to the wiring layer 302. The support substrate is a substrate that supports the imaging element 10, and improves strength at the time of manufacturing the imaging element 10. A logic circuit or the like may be mounted on the support substrate in advance, and the semiconductor substrate 300 and the circuit of the support substrate may be electrically connected to each other.

The interlayer film 306 is provided on the metal film 316, for example, so as to cover the subpixel 106 and the photoelectric conversion element isolation portion 110. The interlayer film 306 may include a transparent material, for example, silicon oxide, silicon nitride, SiON, or the like.

Note that, in the drawing, hatching is omitted for ease of viewing, but appropriate conductors, semiconductors, and insulators are arranged. In a case where the light-shielding wall 108 is not formed, for example, an organic material such as a styrene-based resin, an acrylic resin, a styrene-acrylic copolymer-based resin, or a silosane-based resin may be used, and the lens 104 may be directly provided to the organic material.

As will be described below, an inner lens may be provided in the interlayer film 306, that is, between the lens 104 and the subpixel 106. Furthermore, the light-shielding wall 108 may be provided to penetrate the interlayer film 306 at the boundary between the pixels 102.

The adhesion layer 308 is provided between the interlayer film 306 and the lens 104. The adhesion layer 308 is provided to planarize the interlayer film 306 and bring the interlayer film 306 and the lens 104 into close contact with each other. The adhesion layer 308 includes, for example, a transparent organic material having adjusted viscosity, more specifically, an acrylic or epoxy resin.

Figure 7:
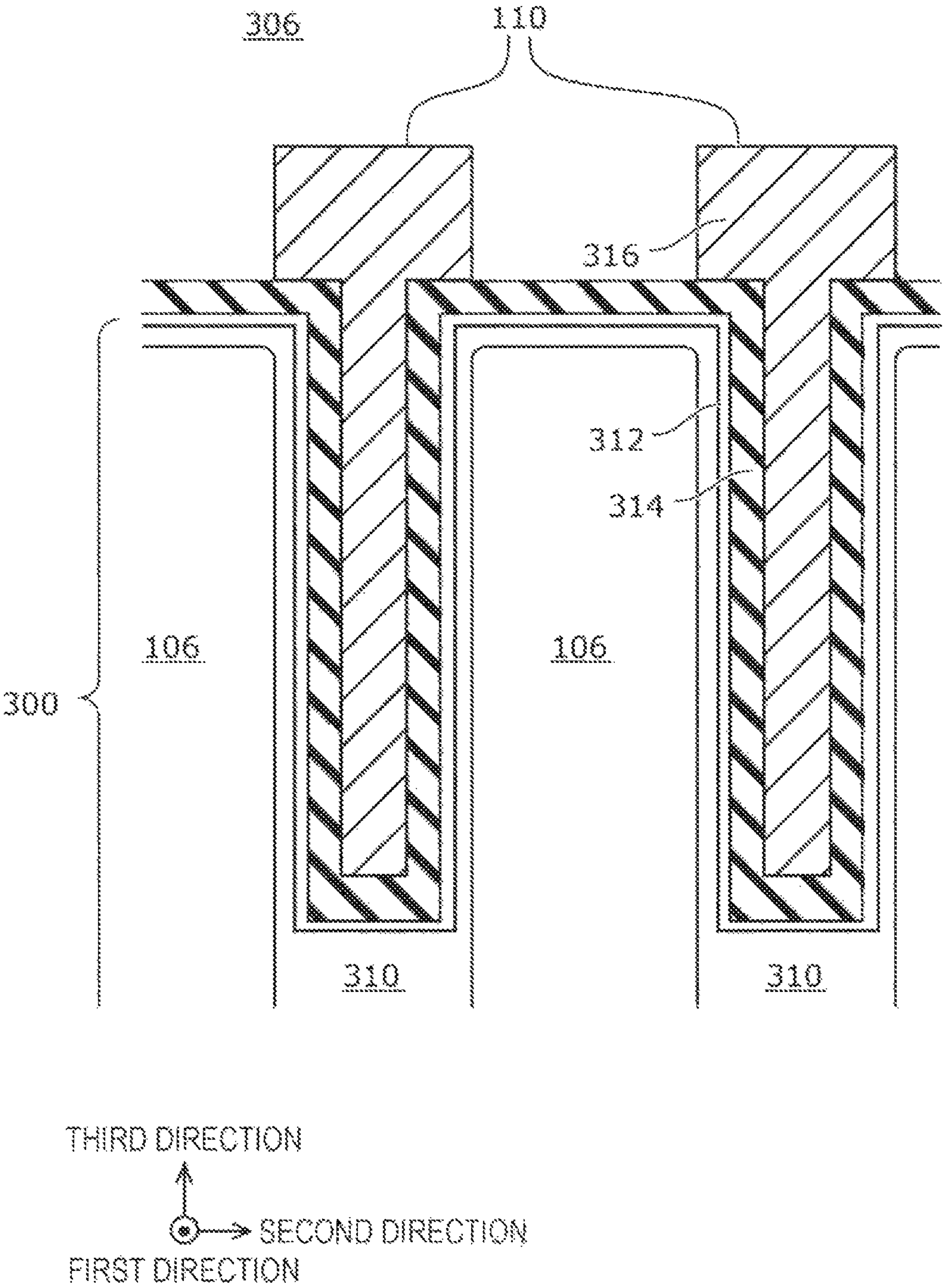
FIG. 7 is a cross-sectional view schematically illustrating an element isolation portion according to an embodiment.

FIG. 7 is a schematic cross-sectional view illustrating the subpixel 106 and the photoelectric conversion element isolation portion 110 according to an embodiment in more detail. In this drawing, since the photoelectric conversion element isolation portion 110 is emphasized, the ratio is greatly different from the actual ratio of the subpixel 106.

The photoelectric conversion element isolation portion 110 may include a p-type well region 310.

The photoelectric conversion element isolation portion 110 is formed by, for example, a fixed charge film 312, an insulating film 314, and a metal film 316 in the well region 310 of the semiconductor substrate 300. As described above, the photoelectric conversion element isolation portion 110 is provided in a trench formed in the semiconductor substrate 300 so as not to propagate information regarding intensity of light to the adjacent subpixel 106.

The insulating film 314 may be provided in the trench. Moreover, the metal film 316 may be provided in addition to the insulating film 314. The fixed charge film 312 having a negative fixed charge may be provided on a light-receiving surface of the semiconductor substrate 300 and a trench sidewall of the photoelectric conversion element isolation portion 110.

Since pinning of the fixed charge film 312 is enhanced by an inversion layer generated on a contact surface in the semiconductor substrate 300, generation of a dark current is suppressed. The negative fixed charge film 312 is, for example, an insulator and can include an oxide or a nitride containing at least one of hafnium (Hf), zirconium (Zr), aluminum, tantalum (Ta), or titanium.

The insulating film 314 includes, for example, silicon oxide or the like, and insulates the photoelectric conversion element of the subpixel 106 from the metal film 316.

The metal film 316 has an opening in at least a part of the subpixel 106. Moreover, the metal film 316 may be embedded in a gap of the insulating film 314 in the trench portion of the photoelectric conversion element isolation portion 110.

The metal film 316 may be shielded from light so as to cover the black reference pixel region and a peripheral circuit region. The metal film 316 can include a material having a light-shielding property, for example, a metal film containing at least one of metals such as tungsten, aluminum, silver, gold, copper, platinum, molybdenum, chromium, titanium, nickel, iron, and tellurium, a compound of these metals, an oxide of these metals, a nitride of these metals, or an alloy of these metals. Furthermore, these materials may be combined as a multilayer film. Moreover, a remaining width of the metal film 316 at the boundary of the pixels 102 may be provided larger than the remaining width of the metal film 316 at a position other than the boundary of the pixels 102 in consideration of a process variation of a line width and misalignment between the light-shielding wall 108 and the metal film 316.

The remaining width of the metal film 316 of the photoelectric conversion element isolation portion 110 may be larger or smaller than a trench width formed in the semiconductor substrate 300. In the former case, degradation of dark current and white spot characteristics is suppressed, and angular resolution is improved. The latter case improves sensitivity. Furthermore, in a part of the photoelectric conversion element isolation portion 110 included in the pixel 102, the metal film 316 may be provided only in the gap of the insulating film 314 in the trench portion, and the metal film 316 may not be provided above the surface of the insulating film 314.

Note that, in the following description, in the partial or entire cross-sectional view of the pixel 102 as in FIG. 6, the configuration elements illustrated in the description of FIG. 7 are sometimes omitted because the drawing is difficult to see, but the pixels 102 have a similar configuration unless otherwise specified. For example, the photoelectric conversion element isolation portion 110 includes the fixed charge film 312, the insulating film 314, and the metal film 316 between the subpixel 106 and the photoelectric conversion element isolation portion 110. Furthermore, the same similarly applies between the subpixel 106 and the interlayer film 306.

[Signal Processing]

The analog signal from the pixel 102 formed as described above is output from the column signal processing unit 24, and appropriate signal processing is further executed for the analog signal.

Figure 8:
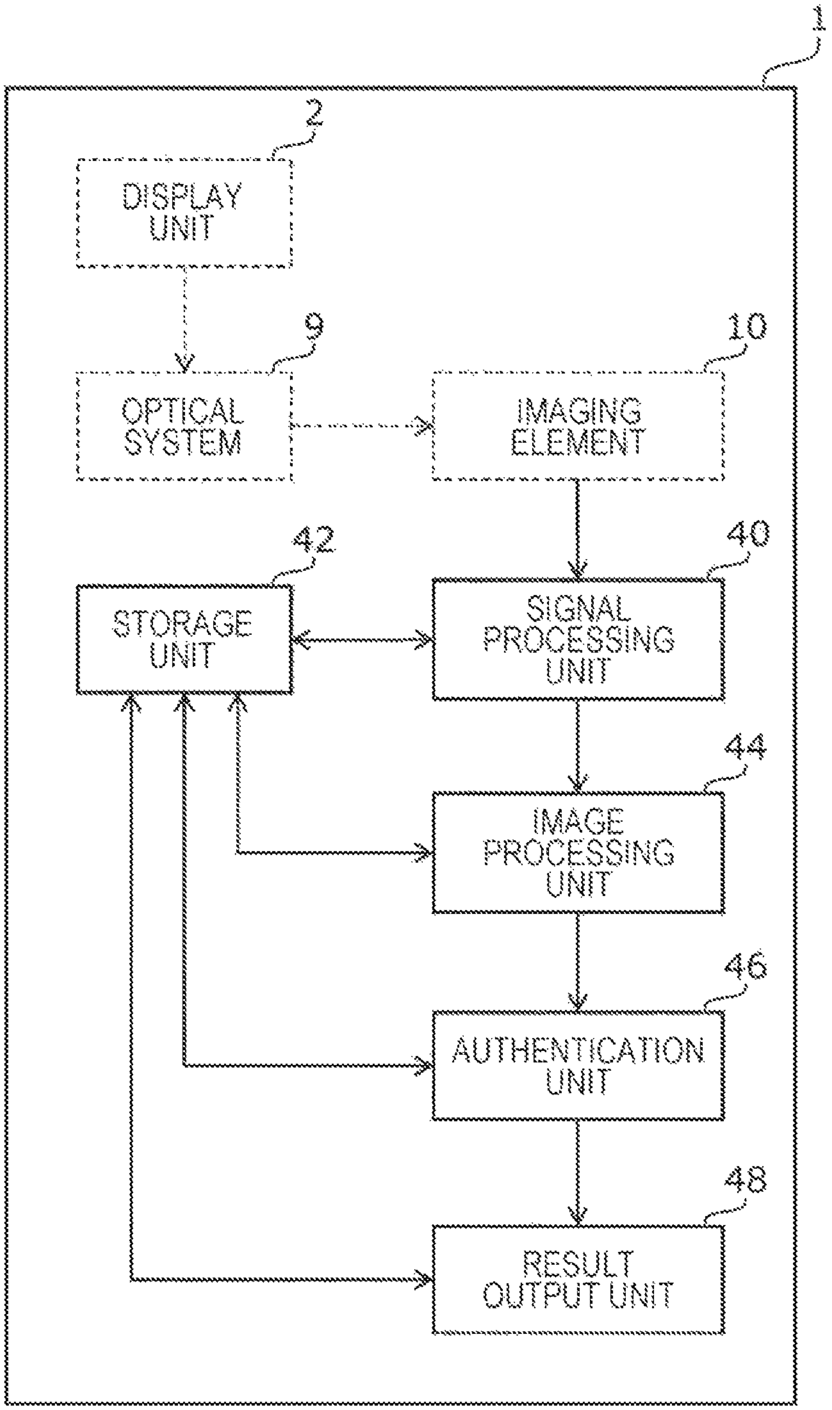
FIG. 8 is a block diagram schematically illustrating elements related to signal processing according to an embodiment.

FIG. 8 illustrates an example of a block diagram related to the signal processing in the electronic device 1 according to the embodiment. The display unit 2, the optical system 9, and the imaging element 10 are illustrated for reference, but are not limited to such a configuration. For example, a circuit that executes the signal processing for various displays may be connected to the display unit 2. Furthermore, a control unit that comprehensively controls the electronic device 1 may be further provided.

As in the electronic device 1 illustrated in FIG. 1, the electronic device 1 includes the display unit 2 in FIG. 8, for example, but the present embodiment is not limited thereto. That is, the electronic device 1 may not include the display unit 2.

The imaging element 10 may receive light via the optical system 9 including an optical lens that controls the incident light. Furthermore, the imaging element 10 may receive light from an object without including an optical lens. The imaging element 10 may receive reflected light of light emitted to a finger from a light source inside the housing, may receive transmitted light or scattered light of light emitted to the finger from a light source outside the housing, or may receive transmitted light or scattered light from the finger by ambient light.

In FIG. 8, the electronic device 1 includes, as configuration elements for processing signals and the like, a signal processing unit 40, a storage unit 42, an image processing unit 44, an authentication unit 46, and a result output unit 48. Although the imaging element 10 is illustrated as a separate element in FIG. 8, these units may be included in the imaging element 10, and the imaging element 10 may implement each of functions described below. These configuration elements may be provided in, for example, the same chip as the imaging element 10, another chip formed in a stacked type, or another chip.

The signal processing unit 40 converts the analog signal output from the imaging element 10 into a digital signal and outputs the digital signal. Furthermore, the signal processing unit 40 appropriately processes and converts the converted digital signal into image data. In this conversion, the signal processing unit 40 executes signal processing necessary for generating image data, for example, ground correction, pixel correction, and the like. For example, the column signal processing unit 24 described in FIG. 5 may be provided as a part of the signal processing unit 40.

The storage unit 42 stores data and the like necessary for the processing of the electronic device 1. The storage unit 42 temporarily stores, for example, the image data output from the signal processing unit 40 or another element. Furthermore, in a case where information processing by software of at least one configuration element in the electronic device 1 is specifically implemented using a hardware resource, the storage unit 42 may store a program or the like related to the software, and the corresponding configuration element may implement the processing by reading the program or the like stored in the storage unit 42.

The image processing unit 44 executes image processing for the image data output from the signal processing unit 40. This image processing may include, for example, conversion processing into an image suitable for recognition or data other than an image in the case of a fingerprint image. The image processing unit 44 executes, for example, demosaic processing, color correction processing, and the like.

Note that the signal processing unit 40 and the image processing unit 44 do not need to be strictly distinguished, and the direction of data input/output may not be one direction. For example, the signal processing unit 40 and the image processing unit 44 may be configured as the same element. As another example, each of the signal processing unit 40 and the image processing unit 44 may execute processing suitable for architecture constituting the each element. Detailed operations and functions of the respective configurations will be described in the following embodiments.

The authentication unit 46 executes personal authentication on the basis of, for example, a fingerprint shape (characteristic point) output from an addition processing unit or the like. The personal authentication may be executed not only in the fingerprint shape but also in position information of sweat glands scattered in a size of about 30 μm on the surface of the finger.

For example, the authentication unit 46 may execute biometric authentication or personal authentication with a rising spectrum shape of a skin color spectrum on the basis of a spectrum analysis result analyzed by the signal processing unit 40 or the like.

In the case where the signal processing unit 40 or the like detects the characteristic of the spectrum from a vein, the authentication unit 46 may confirm that an object in contact with the reading surface 12 is a living body using data regarding the characteristic of the spectrum. Moreover, the authentication may be executed in combination with authentication related to the vein shape. The authentication regarding an artery shape will be described in an embodiment to be described below.

For example, personal information may be stored in the authentication unit 46 as a characteristic point of a fingerprint or a sweat gland, or may be stored in a storage unit. The stored information may be information regarding a spectrum or information regarding a shape such as a fingerprint. In a case where an object comes into contact with the reading surface 12, the authentication unit 46 can determine that the object is a finger of a living body and can authenticate that the object is a stored individual.

The result output unit 48 outputs a personal authentication result on the basis of a result output from the authentication unit 46. For example, the result output unit 48 may output a signal of authentication OK in a case where the finger in contact with the reading surface 12 at the timing matches the recorded personal data, or may output a signal of authentication NG in the other cases.

For the electronic device 1 according to the present embodiment, a case where the personal authentication is performed using fingerprint will be described, for example. In this case, the electronic device 1 may further perform spectrum determination of a vein and a skin-specific rise as an impersonation prevention measure.

Note that the authentication method described in the present embodiment does not limit the combination, and the electronic device 1 may make determination only by the fingerprint shape and the spectrum unique to the skin, for example. Alternatively, the determination may be made only by the fingerprint shape and the spectrum unique to the vein. Furthermore, the determination may be made only by the fingerprint authentication or by a combination of all the authentication methods. That is, the electronic device 1 may execute authentication by a method including at least one of the various authentication methods.

Furthermore, another authentication method, for example, face authentication in which collation is performed based on the position of a characteristic point such as an eye, a nose, or a mouth of a face or the position or size of a face region, authentication by a passcode input, or the like may be combined with the authentication method according to the present embodiment, and these authentication methods are not excluded.

Moreover, the combination may be selectively used according to the use of the electronic device 1. For example, the electronic device 1 may shorten a processing time by using fingerprint authentication for unlocking a lock screen, and perform biometric authentication using spectrum information or the like (skin color spectrum and spectrum from a vein) in addition to the fingerprint authentication in a case where high authentication accuracy is required for financial transactions or the like.

Figure 9:
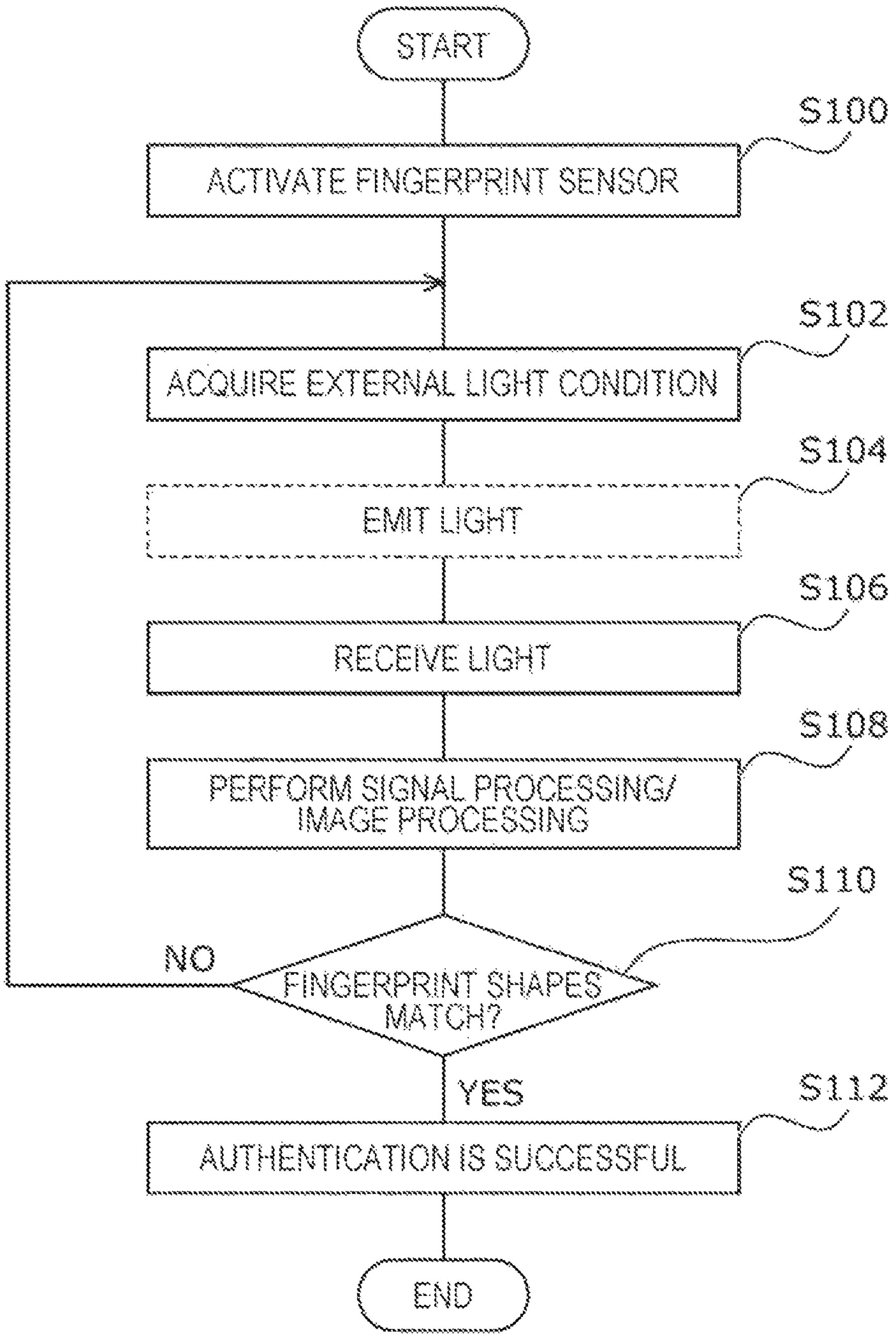
FIG. 9 is a flowchart illustrating processing of an electronic device according to an embodiment.

FIG. 9 is a flowchart illustrating a flow of processing of the electronic device 1 according to the embodiment.

First, the electronic device 1 activates a sensor (S100). When the electronic device 1 activates the sensor, the electronic device 1 may be in a standby state by energizing the above-described configuration elements, for example. The electronic device 1 may explicitly activate the sensor by a switch or the like. As another example, the electronic device 1 may optically or mechanically acquire a contact of the object on the reading surface 12, and activate the sensor using the acquisition as a trigger. As yet another example, the electronic device 1 may be triggered by detecting that the finger has approached the reading surface 12 by a distance less than a predetermined distance.

Next, the signal processing unit 40 detects the intensity of light incident at the timing of acquisition of information on the basis of the information acquired from the imaging element 10, and acquires a condition of external light on the basis of a result of the detection (S102). For example, the electronic device 1 acquires an image in a state where light from the inside is not incident. With this acquisition, sunlight, the intensity of light transmitted through a finger by an indoor light source, or the intensity of light entering through a gap between fingers is detected. The signal processing unit 40 may execute ground processing in a later process on the basis of the intensity of the light. The image acquisition of the external light for the grounding processing may be performed before or after the fingerprint image acquisition, or at both timings.

Next, a light emitting unit provided in the electronic device 1 is caused to emit light to irradiate at least a part of the region where the finger and the reading surface 12 are in contact with each other (S104). The light emission may be white light or light having a specific wavelength, for example, light emission of R, G, B, or the like. Hereinafter, in the case of expressing colors, red may be simply referred to as R, green may be simply referred to as G, and blue may be simply referred to as B.

For example, since the light on a long wavelength side is transmitted through the finger, B (and G) light may be emitted in order to acquire a surface shape. To analyze a reflection spectrum of a human skin surface, R (and G) light may be emitted. Furthermore, R (and near-infrared light) may be emitted in order to observe a vein. In this manner, the light emission may emit an appropriate color on the basis of subsequent processing.

These lights do not need to be emitted at the same timing. For example, B and G may be emitted first to acquire data for fingerprint shape analysis, R may be emitted next to acquire data for spectrum analysis, and then red to near-infrared light may be emitted to acquire data for vein authentication analysis. Note that, in a case of acquiring light reception information of light from the outside, the processing of S104 is not essential.

Next, the imaging element 10 receives light, which is light emitted by the light emitting unit and including information of the fingerprint or the like, and reflected on the reading surface 12 (S106). The light reception is performed by the above-described imaging element 10, and then subsequent necessary processing is performed. For example, the analog signal is output from the imaging element 10 (imaging device 3) by the photoelectric conversion element on the basis of the intensity of light received by a light receiving unit of the subpixel 106.

Next, the signal processing unit 40 and/or the image processing unit 44 executes appropriate processing for received light data (S108). For example, following the light reception, the signal processing unit 40 and the image processing unit 44 execute processing of acquiring the fingerprint shape, acquiring spectrum information of reflected or diffused light, or transmitted light, or calculating and combining a shift amount between subpixel images through A/D conversion and background correction.

Next, the authentication unit 46 determines whether or not the fingerprint shapes match each other (S110). The determination of the fingerprint shapes may be performed by a general method. For example, the authentication unit 46 extracts a predetermined number of characteristic points from the fingerprint, and determines whether or not the fingerprint can be determined as of a stored individual by comparing the extracted characteristic points.

In the case where the fingerprint shapes do not match each other (S110: NO), the electronic device 1 repeats the processing from S102. In the case of the repetitive processing, the processing may be changed as follows. For example, the light emitting unit initially causes the display unit to emit light in a wide region because the position of the finger is indefinite, but in the second and subsequent times, information of the region where the finger to be used for authentication is present and the like may be acquired in external light condition acquisition processing (S102) and a light emission area of the second and subsequent times may be controlled. As a result, noise light is reduced and authentication accuracy can be improved.

Furthermore, the electronic device 1 may execute the second and subsequent authentications while changing a light source condition. Moreover, the electronic device 1 may perform the second and subsequent authentications by switching content of the processing such as signal processing, image processing, or an authentication algorithm in the signal processing unit 40 or the image processing unit 44. When the processing is repeated in this manner, in a case where the light emission area is narrowed down on the basis of the image information of the first authentication, continuous operation may be performed without outputting an error message so as not to allow the user to get the finger off.

In the case where the fingerprint shapes match each other (S110: YES), the authentication unit 46 determines that the authentication is successful (S112) and outputs the authentication result from the result output unit 48. In this case, the result output unit 48 outputs information indicating that the authentication is successful, and permits access to another configuration of the electronic device 1, for example.

Note that, in the above description, the output is performed in the case where the result output unit 48 has succeeded, but the present invention is not limited thereto.

Furthermore, the above processing is repeated in a case where the authentication has failed, but for example, in a case where the repetition continues a predetermined number of times, access to the electronic device 1 may be blocked without performing the authentication any more. In this case, a user may be prompted to input a passcode by another access means, for example, a numeric keypad, from the interface.

Furthermore, in such a case, there is a possibility of failure in reading of the device, and thus the authentication processing may be repeated while changing the light emission, the light reception, the state of the reading surface, the spectrum being used, and the like. For example, in a case where an analysis result that the device is wet with water is obtained, some output may be performed via the interface to the user to wipe the water and perform the authentication operation again.

As described above, according to the present embodiment, the imaging device 3 of the electronic device 1 enables isolation and measurement of light intensity incident from a plurality of different angles while suppressing stray light with respect to light condensed by on-chip lenses arranged in an array. As described later, these measurements can provide information by color or spectrum information to each photoelectric conversion element by combining the color filter or the plasmon filter.

Moreover, the electronic device 1 may have a personal authentication function, and this personal authentication function can implement fingerprint authentication without including an optical lens. For example, it is possible to acquire information from the subpixels 106 different depending on the angle without requiring an optical system having a pinhole or the like. Therefore, the electronic device 1 can acquire an image captured in a state where the sensitivity is higher and a decrease in resolution is suppressed, and highly accurate authentication can be implemented by using the image for authentication.

Use of a global shutter to be described below enables authentication by a flip operation by global shutter driving of the imaging device 3.

When vein authentication to be described below is executed, three-dimensional vein authentication is enabled.

The rising spectrum specific to the skin color can be measured by using various filters to be described below. Furthermore, biometric measurement such as pulse measurement and saturated oxygen concentration measurement can be executed depending on the type of the filter. With these functions, personal authentication with enhanced impersonation prevention is implemented.

Hereinafter, various modes of each configuration element will be described. First, an aspect of light reception in the electronic device 1 will be described with an example.

Second Embodiment

Figure 10:
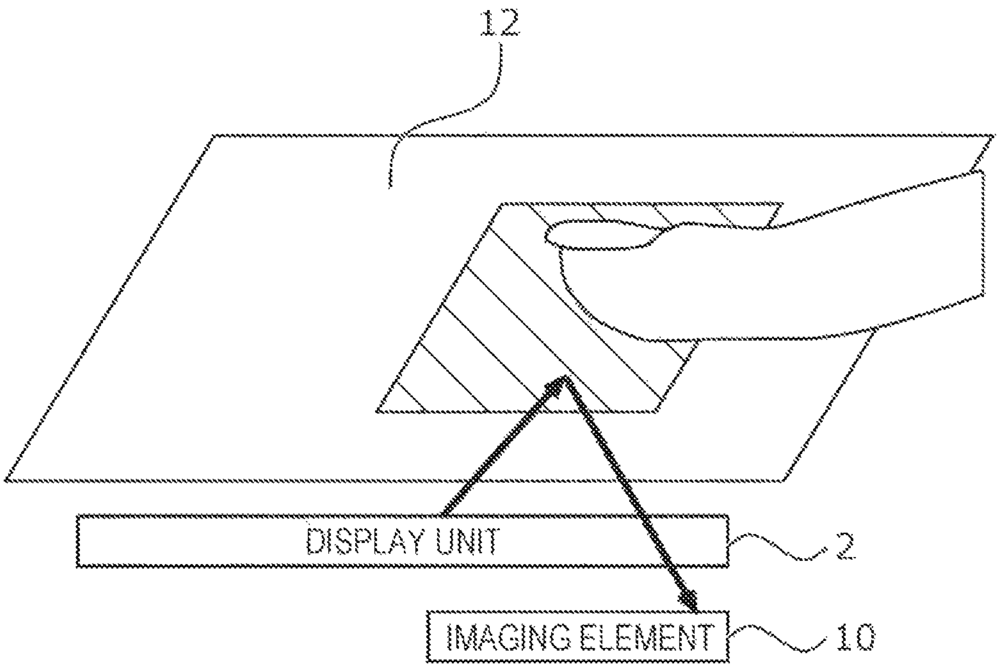
FIG. 10 is a view schematically illustrating an example of imaging according to an embodiment.

FIG. 10 is a view schematically illustrating an example of a state of imaging by an imaging element 10. An electronic device 1 illustrated in FIG. 10 includes a display as a display unit 2, like a smartphone or a tablet terminal. The electronic device 1 includes, for example, the imaging element 10 below the display that is the display unit 2. As illustrated in FIG. 1, the display unit 2 may include a touch panel 6 or the like, and may include an input interface through which input can be performed by touching the touch panel with a finger or the like.

The electronic device 1 may emit light toward a reading surface 12 by emitting light from the display unit 2 provided inside the electronic device 1. More specifically, a light emitting element included in the display unit 2 may emit light toward the finger. The imaging element 10 may receive light returned by reflection, scattering, or the like on the reading surface 12 or in the vicinity of the reading surface 12.

As illustrated in FIG. 10, a readable region may be set in a range in which the imaging element 10 can receive light. In this case, the light emitting element of the display unit 2 may emit light in a region where the imaging element 10 can receive reflected light or the like from the reading surface 12.

Figure 11:
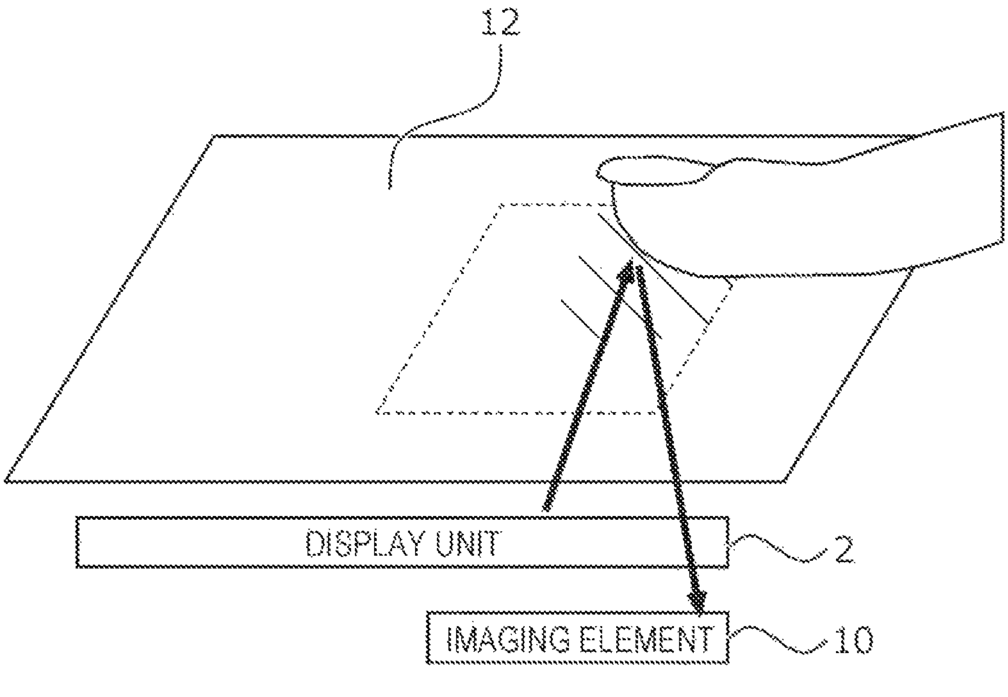
FIG. 11 is a view schematically illustrating an example of imaging according to an embodiment.

FIG. 11 is a view schematically illustrating another example of the state of imaging by the imaging element 10. As illustrated in FIG. 11, the region of the display unit for emitting light may be appropriately adjusted. For example, the electronic device 1 may narrow a light emission region only in the vicinity of the region where the finger is placed. Similarly, the imaging element 10 may also perform control to acquire a signal in the region where the imaging element can receive reflected light or the like from the reading surface 12 with which the finger is in contact.

As illustrated in FIGS. 10 and 11, in the case where the region to be authenticated is set on the reading surface 12, guide display may be performed to prompt a user to place a finger on the region of the display unit 2. This display may be set in advance on the basis of an imaging device 3 and positions of light emitting pixels that emit light at imaging timing.

Figure 12:
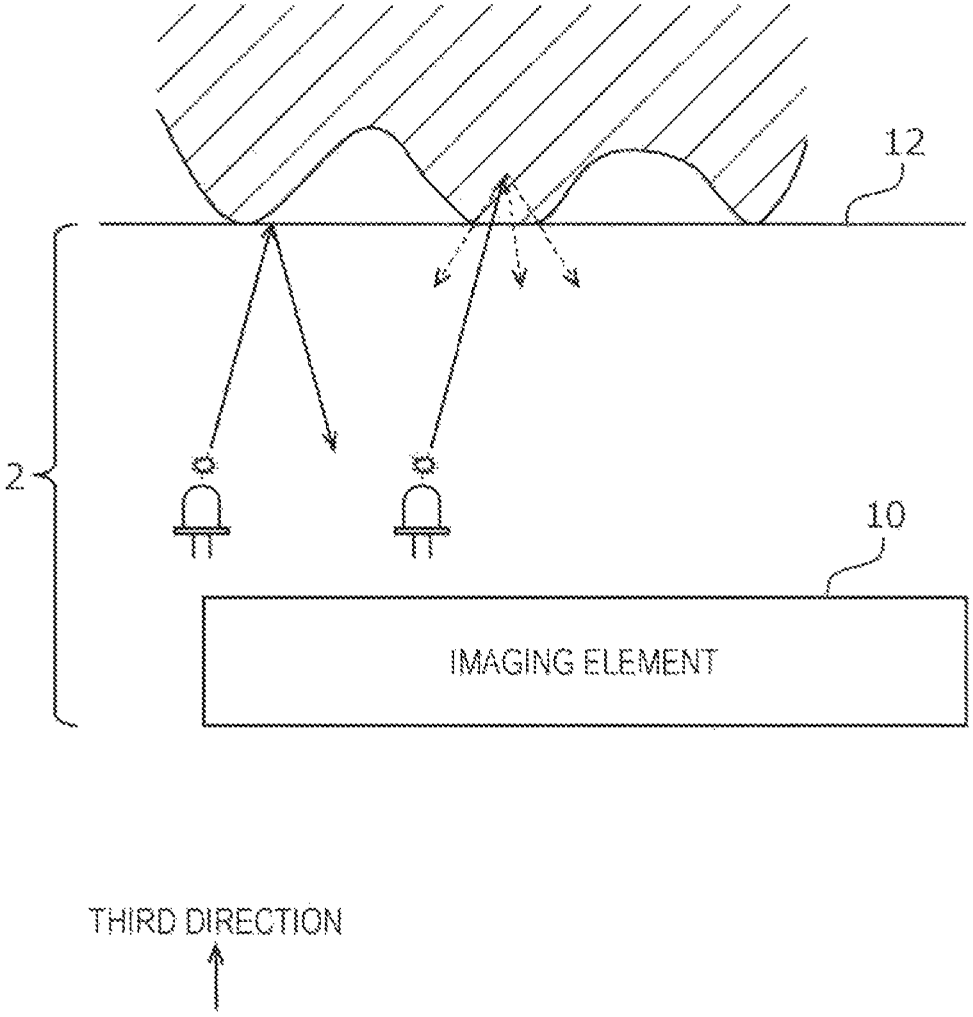
FIG. 12 is a view schematically illustrating an example of imaging according to an embodiment.

FIG. 12 is a view schematically illustrating reflection and scattering of light in the vicinity of the reading surface 12. As illustrated in FIG. 12, the light emitting element provided in the display unit 2 emits light, and the light emitted by the light emitting element is reflected or scattered on the reading surface 12 or in the vicinity of the reading surface 12. The imaging element 10 receives the reflected or scattered light, converts the reflected or scattered light into an analog signal, and outputs the analog signal.

Note that FIG. 12 illustrates the light emitting element in a shape like a light emitting diode for easy understanding, but the light emitting element may not actually have such a shape, and may be, for example, an OLED or the like for causing the display (display unit 2) formed on a semiconductor substrate to emit light.

The light output from the light emitting element is well reflected and propagates to the imaging element 10 in a region where a ridge of the finger is not in contact with the reading surface 12, for example. Meanwhile, in the region where the ridge of the finger is in contact with the reading surface 12, for example, a part of the light output from the light emitting element is transmitted to the inside of the finger, and the light reflected or scattered inside the finger is propagated to the imaging element 10 via the reading surface 12.

In the case of such propagation as in FIG. 12, the photoelectric conversion element in the imaging element 10 that has received the light reflected in the region where the ridgeline of the finger and the reading surface 12 are in contact and the photoelectric conversion element that has received the light reflected in the region where the ridgeline of the finger and the reading surface 12 are in contact receive light of different intensities.

The imaging element 10 and/or a signal processing unit 40 and the like can reconfigure an image of a fingerprint on the basis of the intensity of the received light. For example, as will be described below, the signal processing unit 40 and the like can also remove unnecessary reflections of elements used in the display on the basis of the analog signal acquired for each subpixel 106. As described above, the electronic device 1 can acquire an image from which unnecessary noise has been removed by the imaging device 3 including the subpixel 106.

Furthermore, the imaging device 3 may acquire a signal captured after light emission on the display unit 2 and a signal captured without light emission on the display unit 2. The imaging device 3 may switch the light emission state of the display unit 2 and acquire images, and the signal processing unit 40 or the image processing unit 44 may acquire a difference image between these images. By acquiring the difference image, the electronic device 1 may acquire an image in which an influence of optical noise from the outside is suppressed.

Furthermore, for example, the imaging element 10 may decompose a wavelength of light that has been diffused and propagated into the finger from the region where the ridge of the fingerprint and the reading surface 12 are in contact and returned to the electronic device side again, and acquire spectrum information unique to human skin or the like.

Moreover, the imaging element 10 may acquire the spectrum information (and the shape) related to a vein and an artery, using a fact that light in a red region to a near-infrared region is more easily absorbed in a range where the vein or the artery exists than in a range without blood.

As described above, according to the present embodiment, the electronic device 1 emits light from the light emitting element arranged in the display surface of the display unit 2, receives light reflected, scattered, or the like in the vicinity of the reading surface 12, using the imaging element 10, and acquires the analog signal. Such acquisition enables personal authentication using the light emitting element provided for display of the electronic device 1.

As described above, the electronic device 1 can include the imaging device 3 below the display. Then, the electronic device 1 can remove an unnecessary image of the display element provided immediately above by synthesis of a subpixel image and can extract only an original object image. Moreover, the electronic device 1 can remove the influence of external light noise by continuously acquiring an image captured with display light emission and an image captured without light emission and generating the difference image.

Third Embodiment

Figure 13:
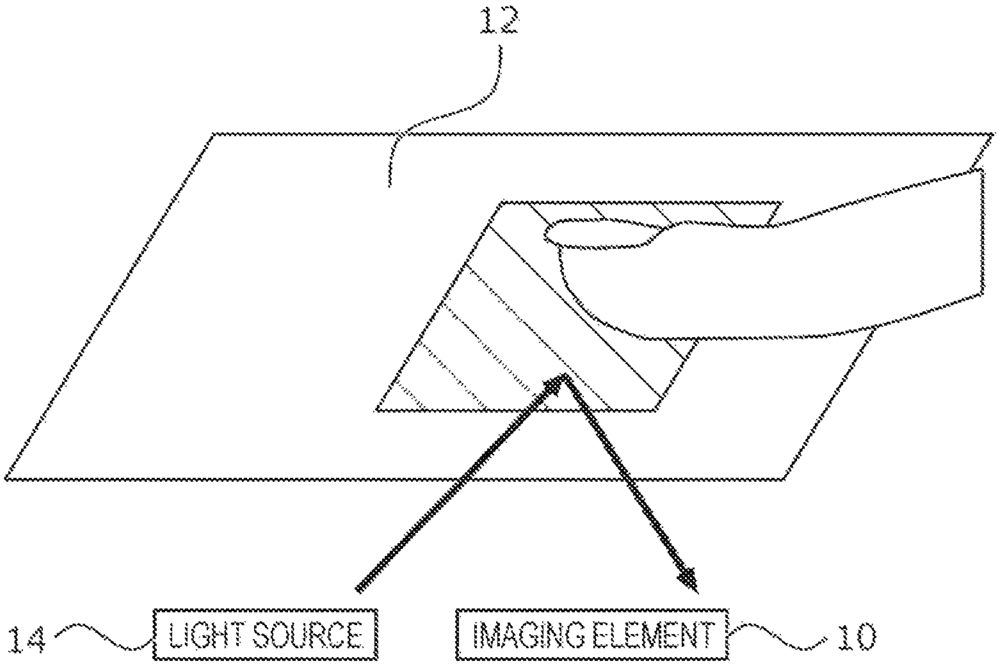
FIG. 13 is a view schematically illustrating an example of imaging according to an embodiment.

FIG. 13 is a view schematically illustrating another example of a state of imaging by an imaging element 10. The electronic device 1 includes a light source 14 different from a display in a housing of the electronic device 1.

The light source 14 is arranged in the electronic device 1, and is a light source different from a light emitting element used for display on the display of a display unit 2. The light source 14 is provided under a cover glass 7, for example. For example, in a case where authentication is executed using the imaging element 10, the light source 14 emits light to be imaged by the imaging element 10. The light source 14 may be, for example, an OLED, a microLED, a microOLED, or the like, but is not limited thereto, and may be any light source that can appropriately emit light.

The electronic device 1 may emit light from the light source 14 toward a reading surface 12 and receive returned light by the imaging element 10. The electronic device 1 may be a device such as a smartphone as in the above-described embodiment. In this case, similarly to FIG. 10 and the like, an imaging device 3 may include the imaging element 10 below the display unit 2, that is, below the display.

Furthermore, as another example, the electronic device 1 may include the imaging element 10 and the light source 14 in a configuration not including a display. For example, also in the electronic device 1 such as a smartphone including the display (display unit 2), at least one of the imaging element 10 or the light source 14 may be provided in a region not below the display, for example, a region where a lens unit or a speaker unit of a front camera is provided.

The electronic device 1 according to the present embodiment may acquire fingerprint information by reading a region where a ridge of a fingerprint exists and a region where the ridge of the fingerprint does not exist by each pixel, similarly to FIG. 12. Furthermore, the electronic device 1 may decompose a wavelength of light (for example, R3 in FIG. 3) that has been diffused and propagated into the finger and returned to the electronic device side again, using the imaging element 10, and acquire spectrum information unique to human skin. The present embodiment has an advantage of being provided with a light source specification specialized for authentication uses.

Moreover, in fingerprint shape measurement, it is desirable to receive a total reflection component by a difference in refractive index between the reading surface 12 and an air layer. For example, the electronic device 1 may display a contact region of the finger on the reading surface 12 so as to satisfy a condition that light from the light source 14 totally reflected by the reading surface 12 can be received by the imaging element 10.

Figure 14:
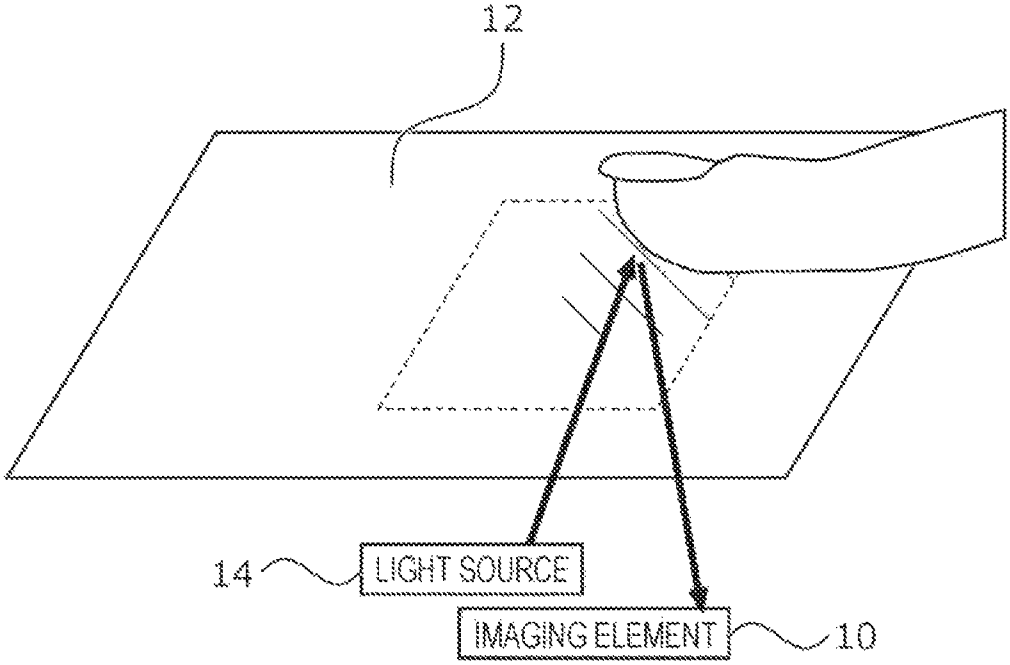
FIG. 14 is a view schematically illustrating an example of imaging according to an embodiment.

FIG. 14 is a view schematically illustrating another example of the state of imaging by the imaging element 10. It is of course possible to cope with such a region in the case of FIG. 11.

As described above, the light source used at imaging timing may not be the light emitting element used for display on the display unit 2. Note that, as described in the present embodiment, the electronic device 1 may not include the display unit 2.

Fourth Embodiment

Figure 15:
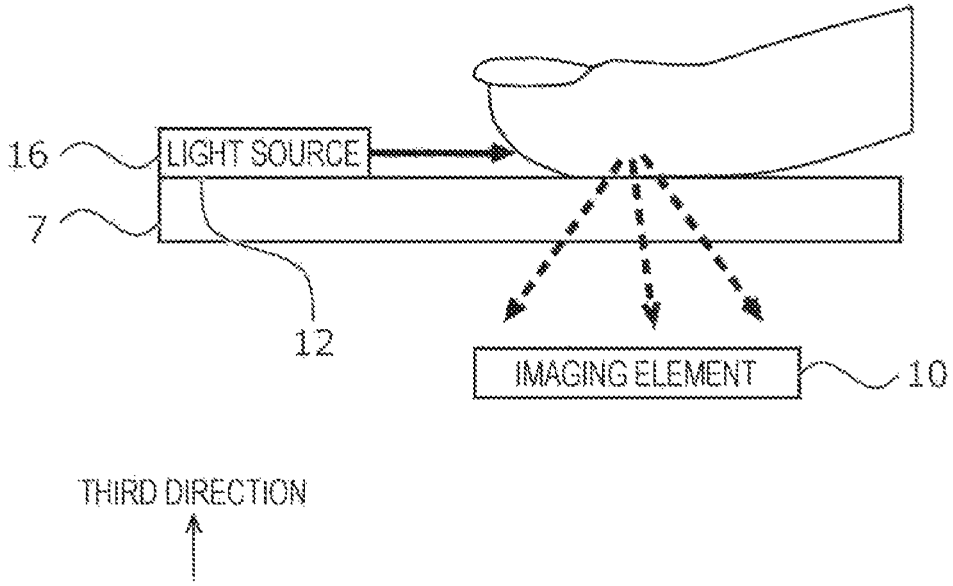
FIG. 15 is a view schematically illustrating an example of imaging according to an embodiment.

FIG. 15 is a view schematically illustrating an example of a state of imaging by an imaging element 10. An electronic device 1 includes a light source 16 so that light is incident on a finger or the like in substantially parallel to a cover glass 7. The imaging element 10 may receive light emitted from the light source 16 and reflected, scattered, or the like in a vicinity of a reading surface 12.

The light source 16 is provided so as to emit light in a direction parallel to a direction in which the cover glass 7 is arranged. Then, the light reflected, scattered, or the like in the finger or the like in the vicinity of the reading surface 12 is received by the imaging element 10. Although not illustrated in the drawing, the imaging element 10 may receive light reflected from the finger on an upper side of the reading surface 12, that is, on an outer side of the electronic device 1, as illustrated in FIG. 3.

As described above, according to the present embodiment, authentication can be executed using scattered light inside an object such as a finger, and thus, robust authentication can be executed against sweat, dryness, and the like.

Fifth Embodiment

Figure 16:
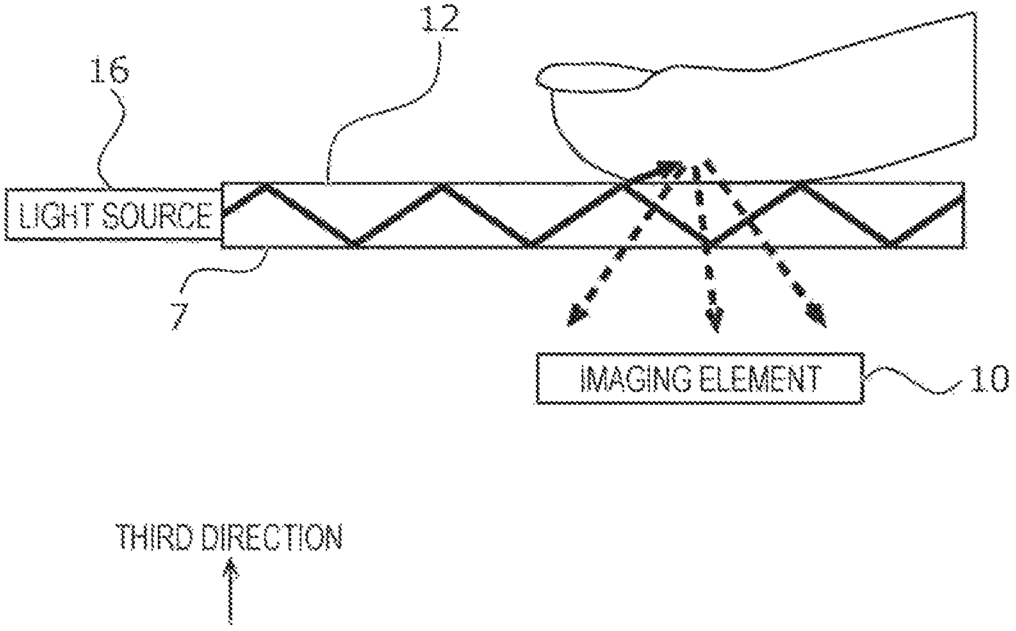
FIG. 16 is a view schematically illustrating an example of imaging according to an embodiment.

FIG. 16 is a view schematically illustrating an example of a state of imaging by an imaging element 10. An electronic device 1 includes a light source 16 so that light passes through an inside of a cover glass 7.

The light source 16 is arranged so as to propagate light by total reflection using the cover glass 7 as a light guide plate by total reflection. A part of the light emitted from the light source 16 is emitted to and enters an object through the inside of the cover glass 7. Then, the imaging element 10 may receive the light diffused and coming out of the reading surface 12.

That is, the light source 16 is provided such that the emitted light enters the cover glass 7 and propagates in the cover glass as a light guide plate while being totally reflected by a refractive index difference between the cover glass and an air layer. A region where the object is in contact with the reading surface 12 has a small refractive index difference. A part of this light enters the object, diffuses, and is emitted toward the imaging element 10 via the reading surface 12. The imaging element 10 receives the emitted light.

In the present embodiment, the cover glass 7 may be formed such that the refractive index changes in a third direction, for example. By forming the cover glass 7 with the refractive index that changes, it is possible to implement transmission of light from an outside or light at an angle emitted from an inside with higher accuracy while the light emitted from the light source 16 is not emitted to the reading surface 12 and the imaging element 10 side.

Furthermore, with such a formation, the angle of light changes due to reflection and scattering in a region touched by a finger or the like, and thus the light affected by the finger or the like can be sufficiently received by the imaging element 10. As described above, total reflection may be generated not only on the surface of the cover glass 7 including the reading surface 12 but also by the change in refractive index inside the cover glass 7.

As described above, according to the present embodiment, authentication can be executed using scattered light inside an object such as a finger, and thus, robust authentication can be executed against changes in imaging conditions such as sweat and dryness.

Sixth Embodiment

Figure 17:
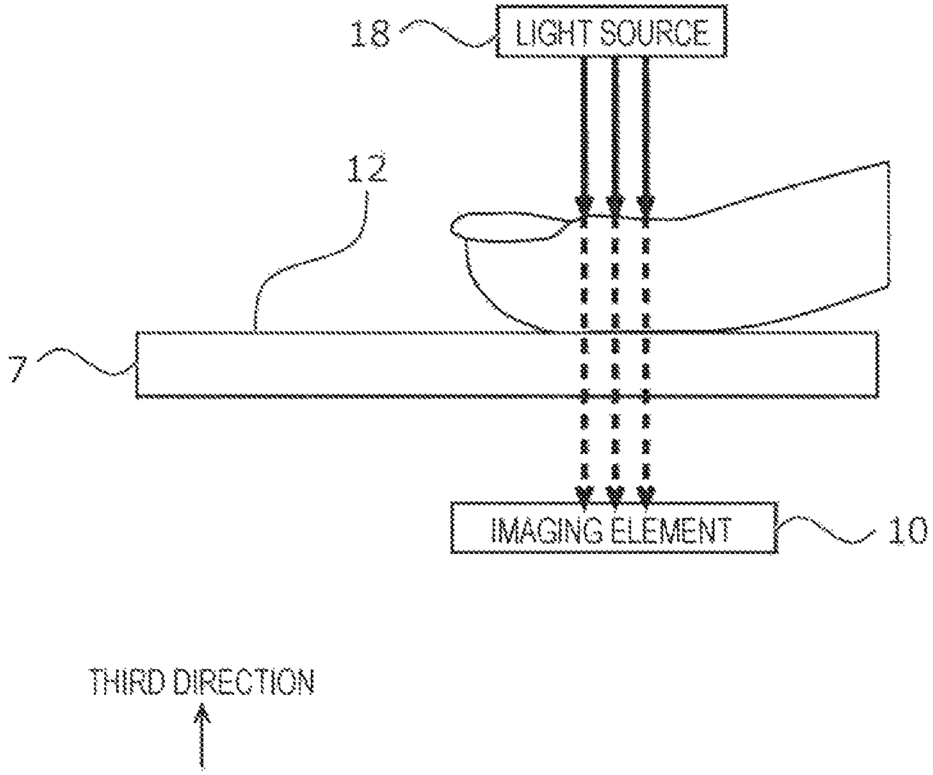
FIG. 17 is a view schematically illustrating an example of imaging according to an embodiment.

FIG. 17 is a view schematically illustrating an example of a state of imaging by an imaging element 10. An electronic device 1 includes a light source 18 on an upper side of a reading surface 12, that is, on a side opposite to the imaging element 10.

The light source 18 is arranged in a direction facing the reading surface 12 across an object such as a finger. Light emitted from the light source 18 may be transmitted and scattered through the object and received by the imaging element 10 via the reading surface 12.

The light source 18 may be provided to be detachable from the electronic device 1, for example. Furthermore, a system that emits light after having the electronic device 1 as a mobile terminal such as a smartphone provided with the imaging element 10 of the present embodiment brought close to the fixed light source 18 may be adopted. An operation command between the light source 18 and the electronic device 1 may be synchronized and transmitted by wireless communication such as infrared ray, Bluetooth (registered trademark), Wi-Fi (registered trademark), near field communication, or the like.

The light source 18 may be provided with a mold (groove) processed into a shape that allows an object such as a finger to be easily fixed. Furthermore, a jig that can fix the electronic device 1 at a predetermined position may be provided.

The electronic device 1 may have a form of being bought close to the light source 18 while keeping the object such as the finger be in direct contact with the electronic device. In this case, communication, infrared detection, or the like may be executed between the electronic device 1 and the light source 18, and the light source 18 may emit light when detecting that the electronic device 1 approaches a predetermined position, for example. Then, the electronic device 1 may receive reflected or scattered light by the imaging element 10 in synchronization with the light source 18 by wireless communication. The detection means may be a physical contact button or may be a sensing sensor for the electronic device 1 or the object. Furthermore, a signal transmitted from the electronic device 1 may be received on the light source 18 side and the light may be emitted.

As described above, the electronic device 1 according to the third to sixth embodiments has some forms provided with the light source other than the display unit. In these embodiments, the imaging element 10 may be provided below the display, or the display may not be provided between the cover glass and the imaging element. The embodiments described herein are not necessarily required, and the electronic device 1 may use, for example, natural light such as the sun as the light source.

As described in the second to sixth embodiments, the light source that emits the light to the object may be an organic EL display that emits red, blue, and green light, or may be an organic EL display that emits white light, and includes a color filter and develops color. Furthermore, the light source may be a liquid crystal display or a light emitting diode (LED).

Moreover, a laser diode (LD) may be used as the light source. The LD may be, for example, a vertical cavity surface emitting laser called so-called vertical cavity surface emitting laser (VCSEL) that resonates light in a direction perpendicular to a substrate surface and emits light in a direction perpendicular to the surface in a configuration including a stacked structure of a semiconductor or a dielectric in a reflecting mirror. A phosphorescent material such as ZnS including rare earth ions $Yb3+$, $Tm3+$, $Nd3+$, or the like at an emission center may be used. Furthermore, quantum dots such as GaAs or InGaAs may be used.

The type of the light source is not limited to some examples listed above. The light source used for authentication desirably has appropriate intensity in a wavelength region corresponding to each detection purpose.

As an example, in the case of performing fingerprint authentication, it is desirable to select the light source having an output in a blue to green wavelength region, specifically, in the vicinity of approximately 400 nm to 500 nm. In general, it is known that a scattering coefficient of a skin surface and a molar absorption coefficient of a melanin pigment depend on the wavelength of light. More specifically, the characteristics related to scattering and absorption tend to be smaller as the wavelength becomes longer. For this reason, the influence of scattering and absorption becomes smaller for the light having a longer wavelength, and the light enters the skin. That is, in a case of using long-wavelength light for imaging a skin pattern, light that has entered the skin is reflected by a tissue inside the skin.

Such light having a long wavelength may become background light at the time of imaging, and may be a factor of resolution degradation. For this reason, it is effective to use light having a short wavelength as the light source for imaging the skin pattern. For example, in a case of using light emission of an organic EL display, blue and green pixels may be emitted or one of the blue and green pixels may be emitted as a light source.

For example, in a case of performing reflection from human skin, a rise often exists in a wavelength region of approximately 550 nm to 650 nm, typically around 590 nm. For example, FIG. 271 illustrates reflection characteristics on human skin (cited from "Skin color", Akihiro OHGA, Television, 1967, Vol. 21, No. 8, pp. 534-540). As also illustrated in this drawing, it can be seen that reflectance rises at 550 to 650 nm regardless of the skin color, sunburn, and the like. Therefore, for example, to detect a rise of a signal in a range including 500 nm to 700 nm, it is desirable to select a light source having an output in the wavelength region.

For example, to accurately separate rising tendency of FIG. 10, a green organic EL that emits light of approximately 500 nm to 600 nm and a red organic EL that emits light of approximately 600 nm to 700 nm may be separately emitted, and respective images may be acquired and subjected to spectrum analysis.

These light sources do not need to be formed by one type of element, and may be configured by a plurality of light sources each having a unique emission spectrum. As the light source, for example, both the organic EL that emits visible light and the LED light source that emits near infrared rays may be provided.

Next, arrangement of pixels 102, various filters provided in the pixels 102, and the like will be described.

Seventh Embodiment

In the above-described embodiments, the pixels 102 and the subpixels 106 have been arranged in a rectangular shape as a pixel array in an array manner along the first direction and the second direction without any gap, but the present technology is not limited to such an aspect. For example, the shape may not be a rectangle, and does not need to be provided along the first direction and the second direction. Moreover, there may be a gap between the pixels.

Figure 18:
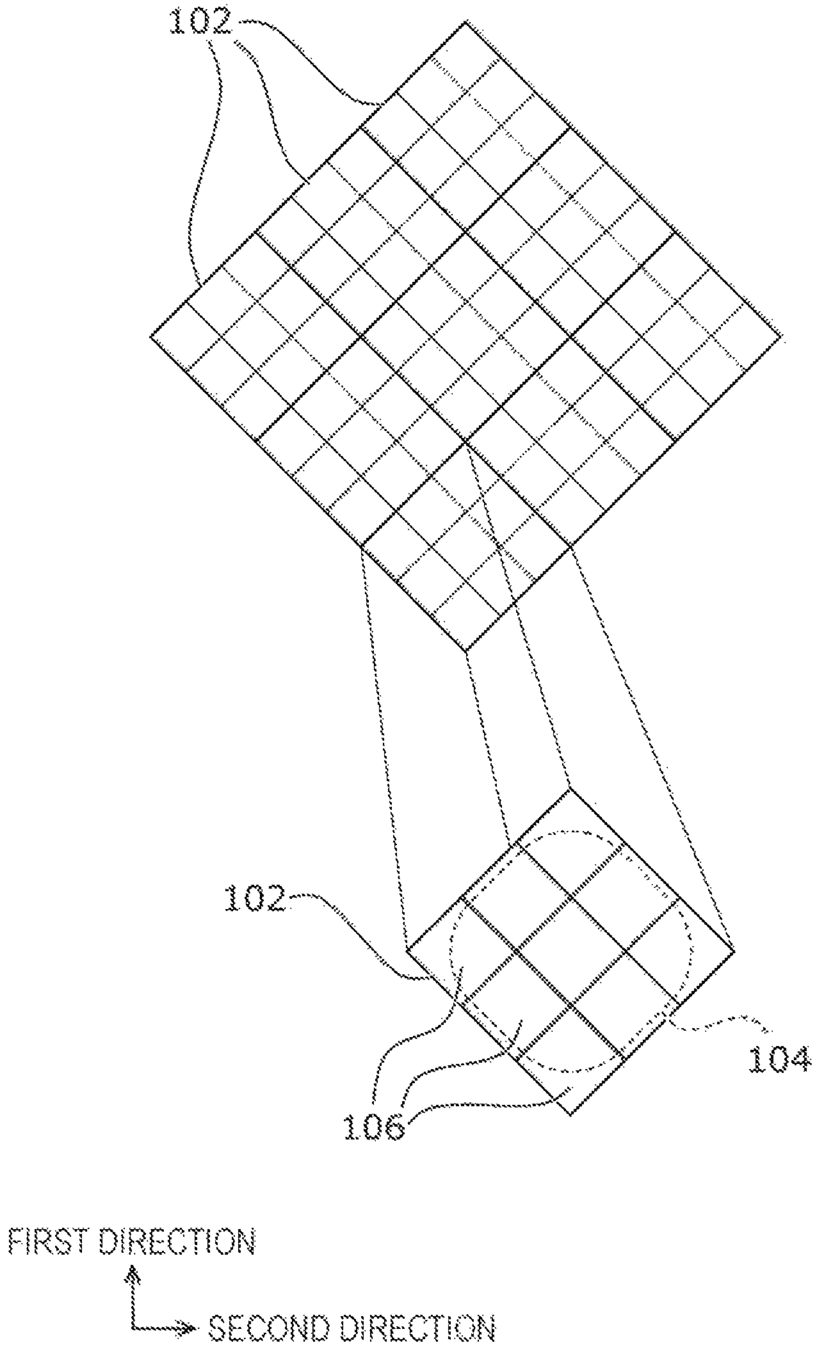
FIG. 18 is a view schematically illustrating an example of pixels according to an embodiment.

FIG. 18 is a view schematically illustrating an example of pixels according to an embodiment. A pixel 102 has 3×3 subpixels 106, but is not limited thereto, and may include 5×5 or less or more subpixels 106 similarly to FIG. 4. Furthermore, 3×3 pixels 102 are illustrated, but of course, these pixels 102 represent part of the pixel array. The view illustrated at the bottom is an enlarged view of the pixel 102.

As illustrated in FIG. 18, the pixels 102 may be arranged by forming a pixel array along a direction different from a first direction and a second direction with respect to an electronic device 1. The pixel 102, a lens 104, and the subpixels 106 show, for example, an array arranged by being rotated by approximately 45 degrees with respect to the first direction and the second direction. By arranging the pixels 102 in this manner, a pitch of the pixels 102 can be reduced to $1/\sqrt{2}$, so that high resolution can be implemented while maintaining imaging characteristics.

Eighth Embodiment

Figure 19:
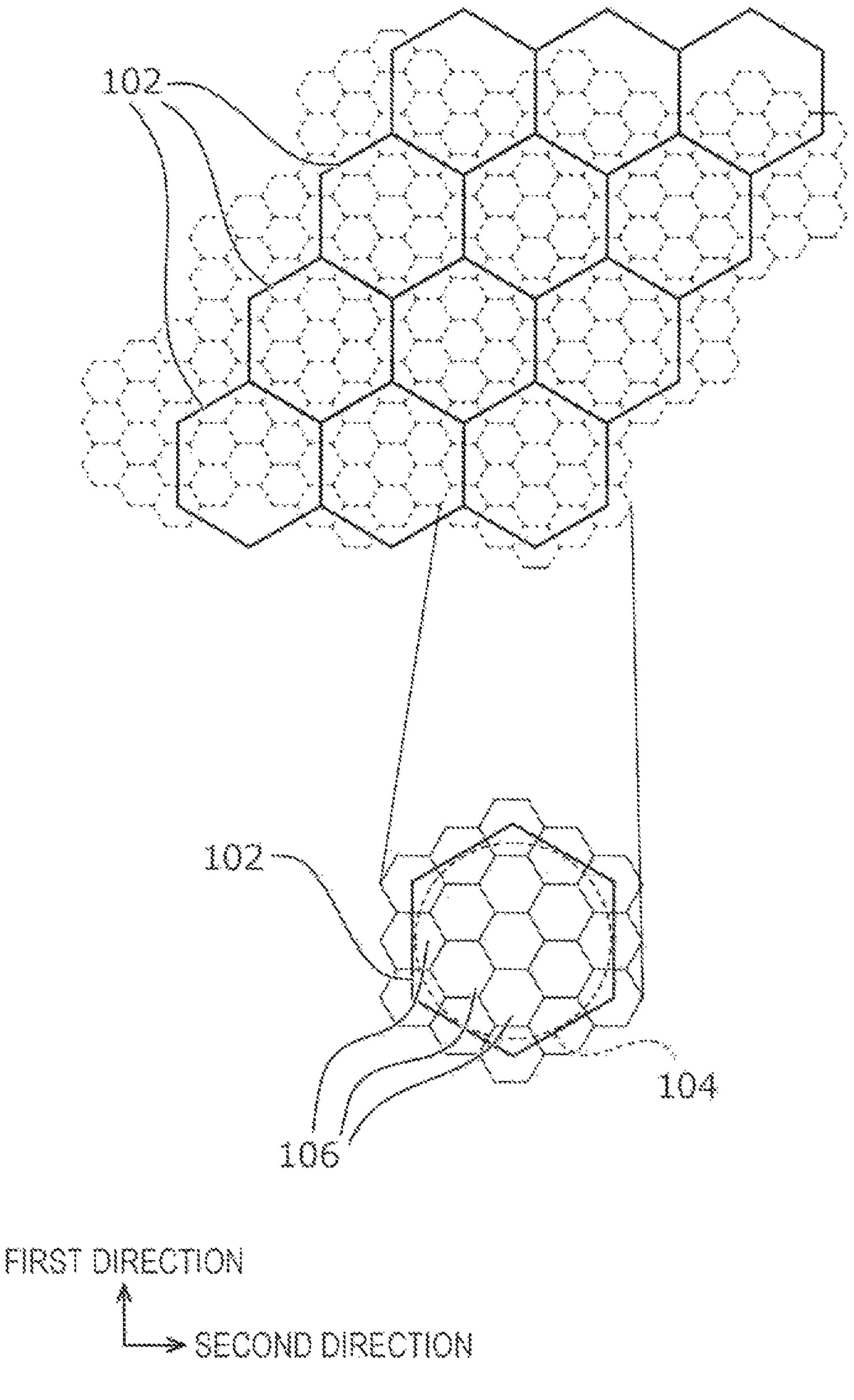
FIG. 19 is a view schematically illustrating an example of pixels according to an embodiment.

FIG. 19 is a view schematically illustrating an example of pixels according to an embodiment. As illustrated in FIG. 19, a pixel 102 may include a subpixel 106 having a regular hexagonal shape. As another example, the pixel 102 may include a subpixel 106 having a parallel hexagonal shape. The pixel 102 may have a structure in which the subpixels 106 are provided in a honeycomb structure.

Since the regular hexagon has the shortest circumference among figures capable of tessellation, efficient resolution enhancement can be expected by forming the subpixel 106 in a regular hexagon shape or a shape similar thereto.

Furthermore, in a light-shielding wall 108 and a photoelectric conversion element isolation portion 110 described above, stress concentration occurs due to trench processing of the light-shielding wall and the photoelectric conversion element isolation portion and embedding of metal or an insulating film. In contrast, by forming the pixel 102 in a hexagonal shape having a high stress dispersion effect, initial failure risk can be reduced as compared with a case of including the rectangular subpixels 106 and the pixels 102.

Moreover, in a case where the light-shielding wall 108 and the photoelectric conversion element isolation portion 110 include a cross portion, processing variation occurs in a depth direction due to a microloading effect at the time of etching. By forming the subpixel 106 into a hexagonal shape, the number of butts is three with respect to butts of four lines in a rectangle, and processing variation in micro-loading can be suppressed.

Ninth Embodiment

Figure 20:
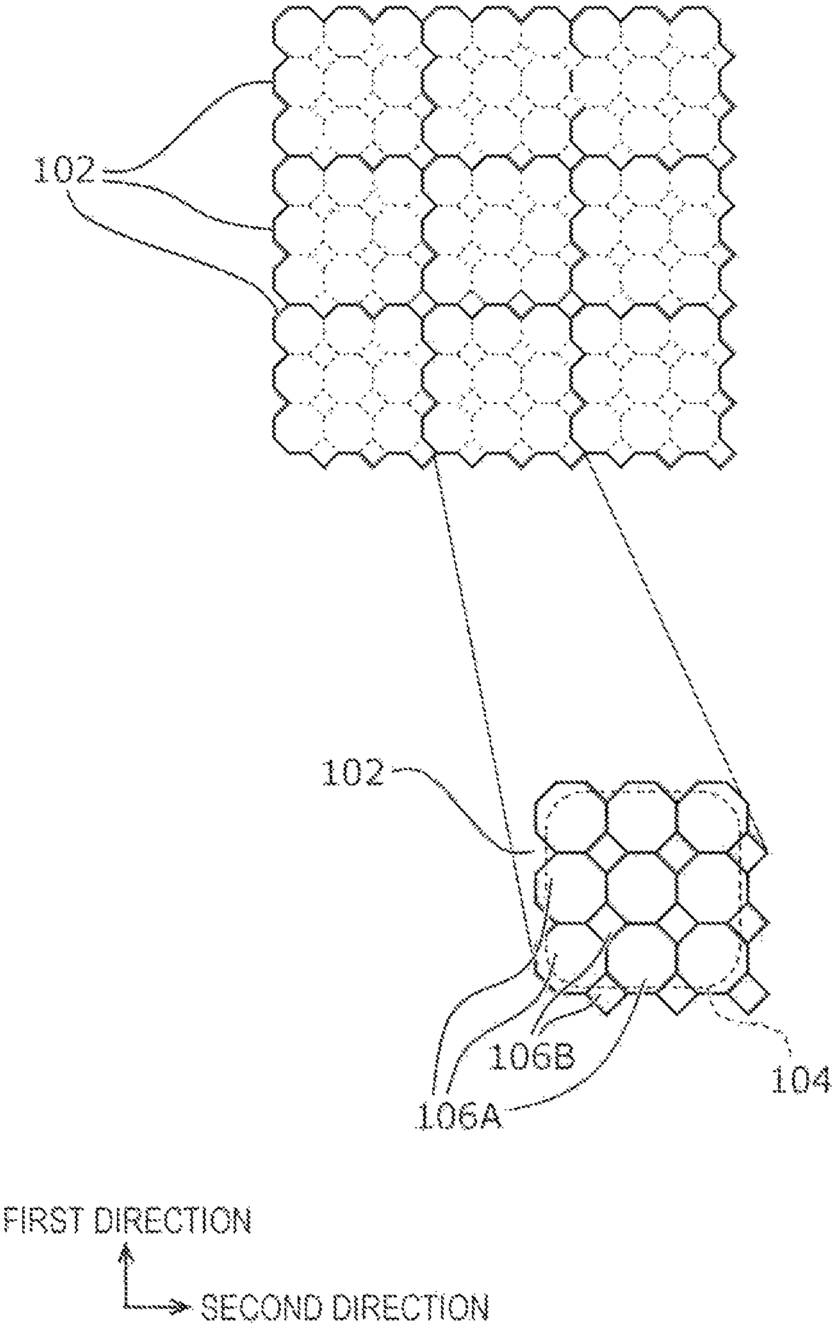
FIG. 20 is a view schematically illustrating an example of pixels according to an embodiment.

FIG. 20 is a view schematically illustrating an example of pixels according to an embodiment. As illustrated in FIG. 20, subpixels 106A and 106B having different sizes and/or shapes may be provided in a pixel 102.

For example, as illustrated in FIG. 20, the subpixel 106A has a large area, and the subpixel 106B has a small area. Comparing these two subpixels, the subpixel 106A has lower angular resolution but higher sensitivity than the subpixel 106B. Conversely, the subpixel 106B has lower sensitivity but more excellent angular resolution than the subpixel 106A.

As described above, by mixing the subpixels 106 having different sizes, a high-sensitivity subpixel image and a high-resolution subpixel image can be acquired at the same time. As a result, for example, a wide dynamic range can be obtained by acquiring an image with pixels having these subpixels 106.

Next, a case where a color filter is provided in each pixel 102 will be described.

In the drawing used for description, nine pixels 102 are illustrated, for example. The nine pixels are extracted from a pixel array 100 and are illustrated. The filter may be provided over the entire pixel array 100 or may be provided over a part of the pixel array 100. Furthermore, the filter having a different arrangement may be provided for each region instead of over the entire pixel array 100. Furthermore, the subpixels 106 are not explicitly illustrated in the drawing, but of course, the subpixels 106 are provided in the pixel 102 as in each of the above-described embodiments.

In the following illustration of filters for pixels 102, the same filters are arranged for pixels 102 hatched in the same way.

Tenth Embodiment

Figure 21:
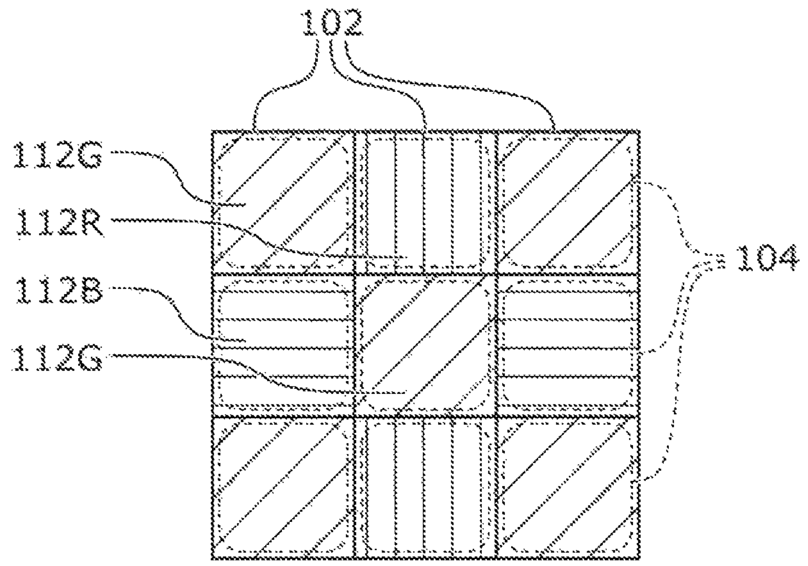
FIG. 21 is a plan view schematically illustrating an example of filter arrangement according to an embodiment.

FIG. 21 is a view illustrating an example of a filter applied to each pixel. FIG. 21 is a view illustrating an example in which a filter 112 is arranged for each pixel 102, for example. The filter 112 is, for example, a color filter, and is a filter that extracts light in a predetermined frequency region among incident light. The filter 112 may be provided at any position between a lens 104 and subpixels 106, for example. In the case of the color filter, the filter 112 may include an organic film.

As the filter 112, for example, a green filter 112G, a red filter 112R, and a blue filter 112B may be arranged in a Bayer array, as illustrated in FIG. 21.

Compared with a color array in which one on-chip lens, one color filter, and one photoelectric conversion element are combined, there is an advantage that angle information is given to the pixel 102 by the subpixels 106 according to such an arrangement of filters. By arranging the filters according to the Bayer array, an array in consideration of color reproduction can be obtained.

Eleventh Embodiment

Figure 22:
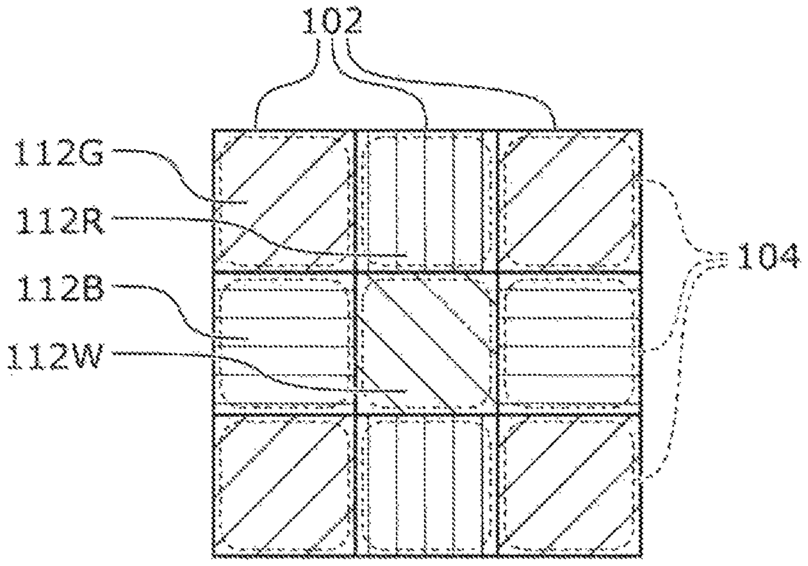
FIG. 22 is a plan view schematically illustrating an example of filter arrangement according to an embodiment.

FIG. 22 is a view illustrating an example of a filter applied to each pixel. FIG. 22 is a view illustrating an example in which a filter 112 is arranged for each pixel 102, similarly to FIG. 21.

As the filter 112, a green filter 112G, a red filter 112R, a blue filter 112B, and a white (transparent) filter 112W are arranged. This arrangement is an RGBW array including the sensitivity-focused filter 112W in a Bayer array. More specifically, the white light filter 112W is provided instead of one of the green filters 112G in the Bayer array for each unit.

The filter 112W may be a filter that transmits light, or may not be provided depending on an arrangement place as long as an optical path length is not so different from that of other filters. For example, in a case where the structure of the pixel 102 is the structure illustrated in FIG. 6 and a color filter is provided in an interlayer film 306, the filter 112W may not be explicitly provided.

By adopting such a filter arrangement, an array with improved sensitivity with respect to the Bayer array can be obtained.

Twelfth Embodiment

Figure 23:
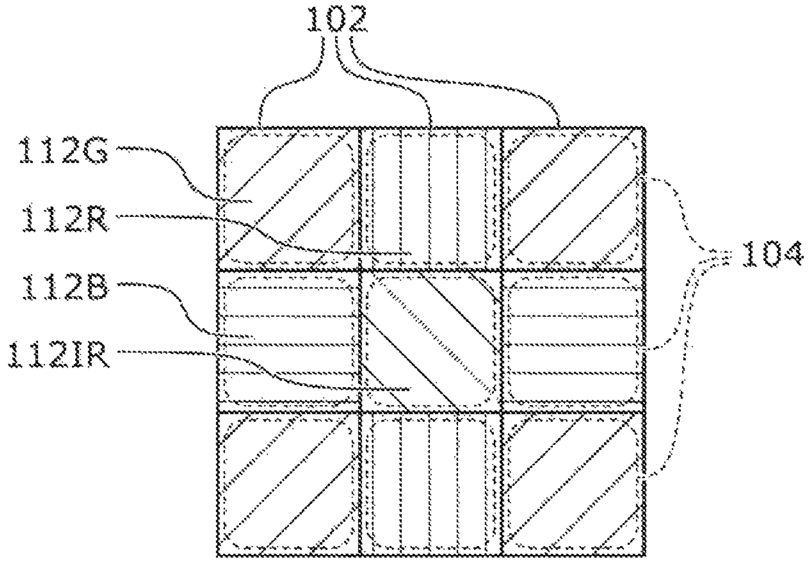
FIG. 23 is a plan view schematically illustrating an example of filter arrangement according to an embodiment.

FIG. 23 is a view illustrating an example of a filter applied to each pixel. FIG. 23 is a view illustrating an example in which a filter 112 is arranged for each pixel 102, similarly to FIG. 21.

As the filter 112, a green filter 112G, a red filter 112R, a blue filter 112B, and an infrared filter 112IR are arranged. This arrangement is an RGB-IR array with the filter 112IR for sensing an infrared ray in a Bayer array. More specifically, the infrared filter 112IR is provided instead of one of the green filters 112G in the Bayer array for each unit.

By adopting such a filter arrangement, an array that also receives an infrared ray with respect to the Bayer array can be obtained.

Thirteenth Embodiment

Figure 24:
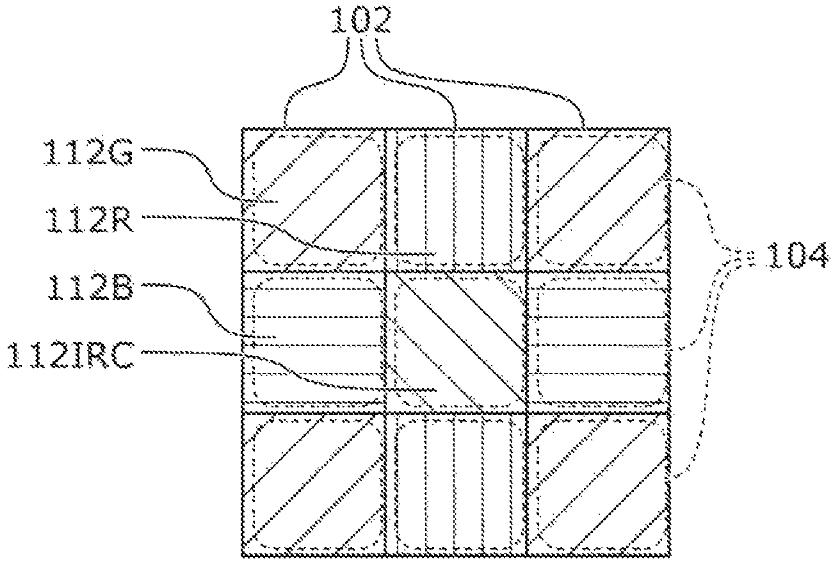
FIG. 24 is a plan view schematically illustrating an example of filter arrangement according to an embodiment.

FIG. 24 is a view illustrating an example of a filter applied to each pixel. FIG. 24 is a view illustrating an example in which a filter 112 is arranged for each pixel 102, similarly to FIG. 21.

As the filter 112, a green filter 112G, a red filter 112R, a blue filter 112B, and a filter 112IRC for cutting infrared rays are arranged. This arrangement is an array including the filter 112IRC that cuts infrared rays in a Bayer array. More specifically, the filter 112IRC for cutting infrared rays is provided instead of one of the green filters 112G in the Bayer array for each unit.

With such a filter arrangement, an array that also receives light in which infrared rays are cut with respect to the Bayer array can be obtained, and sensitivity can be improved in a visible light region similarly to white light.

Fourteenth Embodiment

Figure 25:
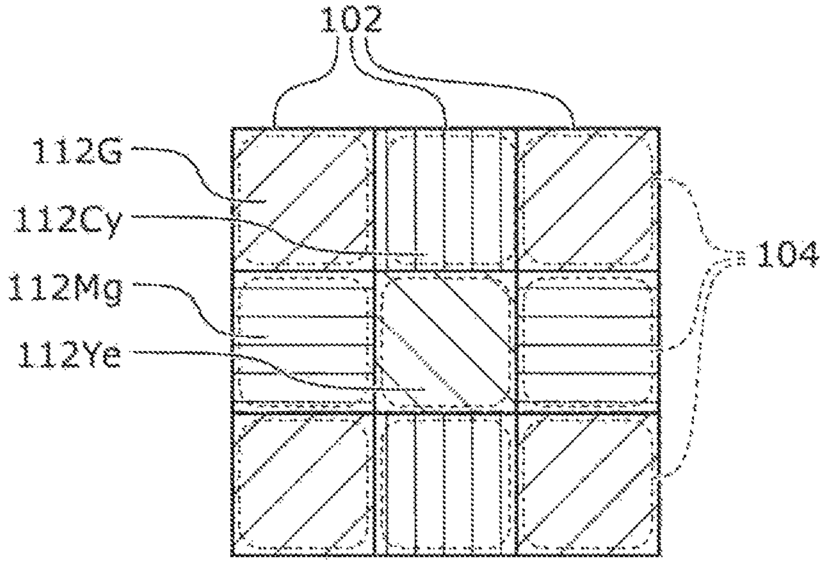
FIG. 25 is a plan view schematically illustrating an example of filter arrangement according to an embodiment.

FIG. 25 is a view illustrating an example of a filter applied to each pixel. FIG. 25 is a view illustrating an example in which a filter 112 is arranged for each pixel 102, similarly to FIG. 21.

As the filter 112, a green filter 112G, a cyan filter 112Cy, a magenta filter 112Mg, and a yellow filter 112Ye are arranged. In the present embodiment, an array having color filters in a complementary color system will be described.

For example, in a case where an imaging device 3 is provided below a display and detects light transmitted through the display, an electronic device 1 may include a polyimide layer between an incident surface (reading surface 12) and an imaging element 10. Typically, a yellow-brown polyimide is known to absorb light in a blue wavelength region and have high green and red transmittances. Therefore, the imaging element 10 can efficiently sense light intensity and wavelength band information from an object by including a pixel 102 provided with the yellow filter.

Fifteenth Embodiment

Furthermore, as another example of using a visible light filter other than RGB, filters of green, orange, red, and the like that can appropriately acquire sensitivity of light having a rising spectrum unique to human skin (500 nm to 650 nm: see FIG. 271) may be provided. As a result, it is also possible to acquire information of fingerprints and the like, and determine whether light is reflected or scattered light by a skin of a human or the like, and implement biometric authentication, that is, implement an impersonation countermeasure. Moreover, color resolution may be improved by providing filters of four or more colors. In this case, the unit of a filter array does not need to be 2×2 pixel units.

Signals obtained by these pixels may be adjusted in balance while being mutually interpolated by signal processing at a subsequent stage called linear matrix or white balance, for example.

As described above, an imaging device 3 can include various appropriate filters for the pixel 102 according to information to be acquired without being caught up in a primary color system and a complementary color system in the visible light.

Sixteenth Embodiment

Figure 26:
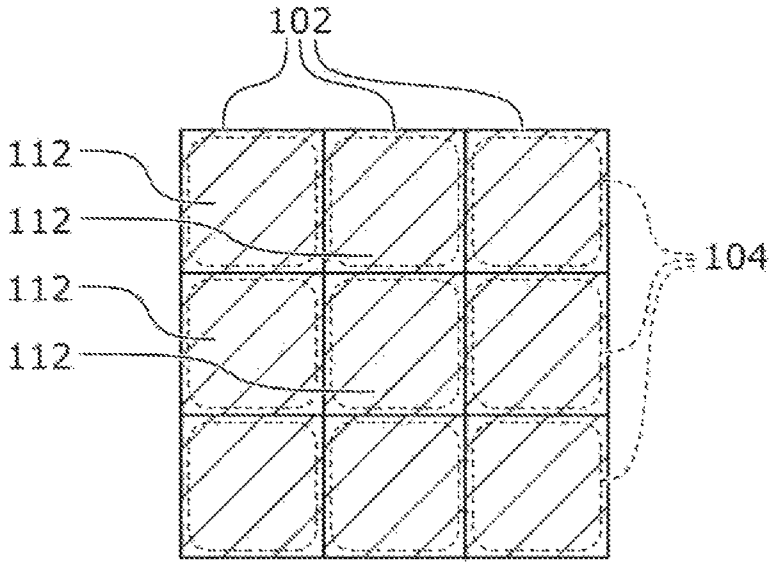
FIG. 26 is a plan view schematically illustrating an example of filter arrangement according to an embodiment.

FIG. 26 is a view illustrating an example of a filter applied to each pixel. FIG. 26 is a view illustrating an example in which a filter 112 is arranged for each pixel 102, similarly to FIG. 21.

As illustrated in FIG. 26, a single filter 112 may be provided for an entire pixel array 100 or a partial region thereof.

By using the single filter 112 in this manner, an imaging device 3 can acquire a signal placing emphasis on resolution.

Seventeenth Embodiment

Figure 27:
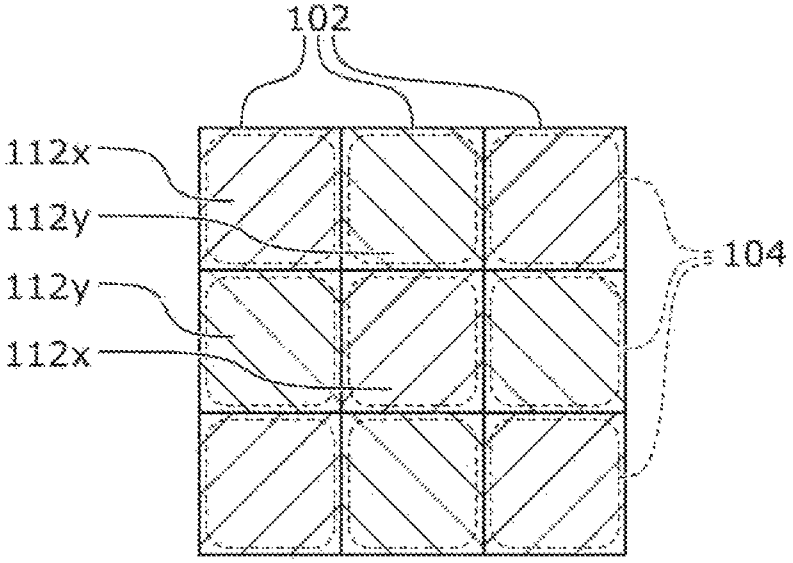
FIG. 27 is a plan view schematically illustrating an example of filter arrangement according to an embodiment.

FIG. 27 is a view illustrating an example of a filter applied to each pixel. FIG. 27 is a view illustrating an example in which a filter 112 is arranged for each pixel 102, similarly to FIG. 21.

As illustrated in FIG. 27, two types of filters 112*x* and 112*y* may be arranged in a checkered pattern for an entire pixel array 100 or a partial region thereof.

By the pixel 102 including the two different types of filters, images respectively assuming different objects can be acquired. As the two types of filters 112, for example, a combination of the filter 112*x* for visible light and the filter 112*y* for IR may be arranged. As the arrangement of the filters, an example of a checkered pattern has been described, but the arrangement is not limited thereto.

Although not illustrated, for example, a 2×2 Bayer array may be replaced with another filter 112, for example, an IR filter, with a longer period, or as another example, several different filters may be arranged in the array filled with single filters. In these descriptions, the term "period" is used, but arrangement at non-equal intervals or random arrangement may be used.

Note that the arrangement of the filter 112 is not applied only to the same rectangular pixels 102 as illustrated in FIGS. 21 to 27, but can also be applied to the pixels 102 as illustrated in FIGS. 19 and 20. The filter may be applied in the arrangement illustrated in FIGS. 21 to 27, or may be arranged to be more distinctive depending on the shape, size, and the like of each pixel.

Next, arrangement of a filter for the subpixels 106 in the pixel 102, not for the pixel 102, will be described. According to a device of the present disclosure, it is also possible to provide a filter not for each pixel 102 but for each subpixel 106.

In the following illustration of filters for the subpixels 106, the same filters are arranged for the same subpixels 106 hatched in the same way, similarly to the case of the pixel 102. Furthermore, in the following drawings, the pixel 102 is assumed to be provided with 3×3 or 5×5 subpixels 106, but the number of subpixels 106 is not limited to the above-described numbers.

Eighteenth Embodiment

Figure 28A:
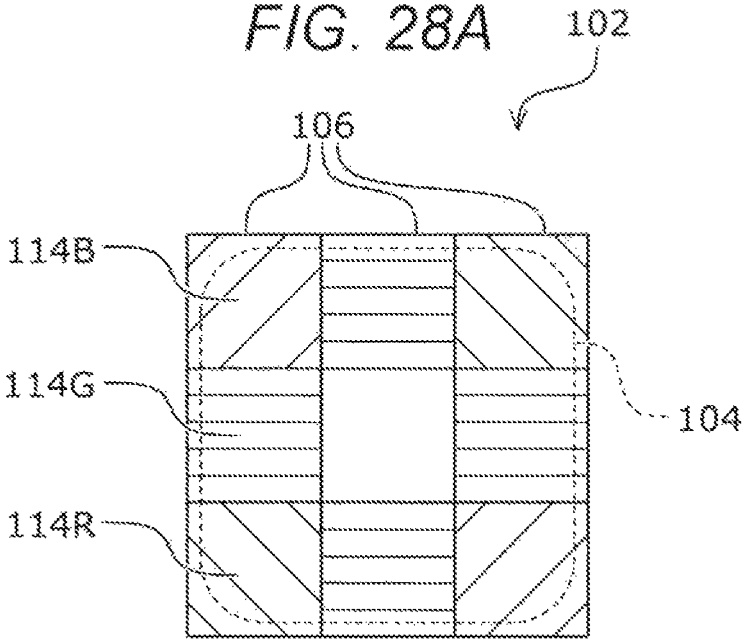
FIG. 28A is a plan view schematically illustrating an example of filter arrangement according to an embodiment.

FIG. 28A is a view illustrating an example of a filter applied to each subpixel. FIG. 28A is a view illustrating an example in which a filter 114 is arranged for each subpixel 106, for example. In this drawing, as an example, a pixel 102 includes 3×3 subpixels 106.

The pixel 102 includes at least two different types of filters in the subpixels 106 in the pixel 102. A color filter may not be provided for the subpixel 106 located at a center of the pixel 102. Filters 114 such as color filters are provided in the subpixels 106 around the subpixel 106 located at the center of the pixel 102.

For example, the right-up slant-line subpixel 106 may be provided with a red filter 114R, the transverse-line subpixel 106 may be provided with a green filter 114G, and the left-up slant-line subpixel 106 may be provided with a blue filter 114B.

By providing the color filters in this manner, luminance information can be accurately acquired in the subpixel 106 located at the center of the pixel 102, which is likely to efficiently receive light, and color information can be acquired in the subpixels 106 around the subpixel 106, in one pixel 102. As compared with a case where a filter is provided for each pixel 102, the luminance information and the color information can be acquired in a well-balanced manner in one pixel, that is, in closer regions in on object.

Figure 28B:
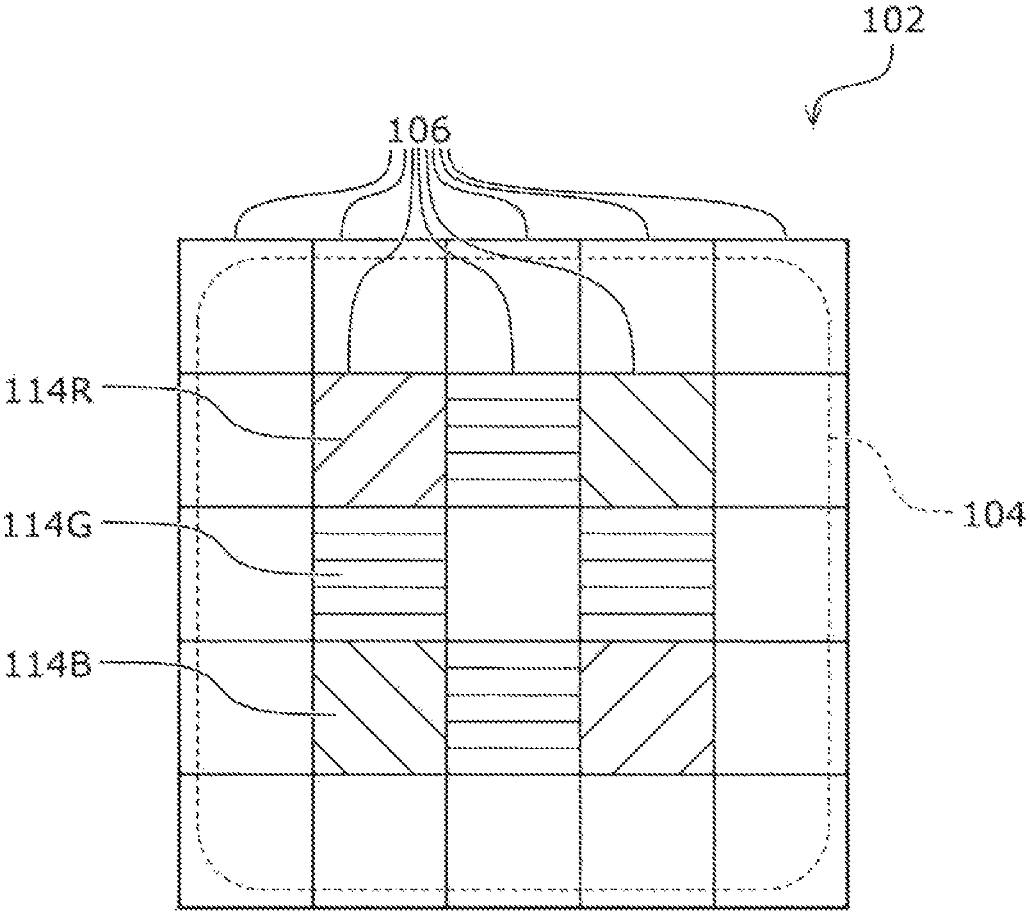
FIG. 28B is a plan view schematically illustrating an example of filter arrangement according to an embodiment.

FIG. 28B is a view illustrating an example of a filter applied to each subpixel. While the array of filters 114 is the same as that in FIG. 28A, the pixel 102 includes 5×5 subpixels 106 in FIG. 28B. As described above, even in the case of 5×5 pixels, the subpixel 106 located at the center and the subpixels 106 therearound may be similarly provided with different filters.

Although each subpixel 106 in the pixel 102 has a different parallax with respect to the object, synthesis processing of shifting and overlapping images acquired by the respective subpixels 106 may be performed. For example, a shift amount may be obtained by signal processing so that the degree of coincidence becomes the highest after image acquisition.

Furthermore, in a case where it is guaranteed that an object distance is constant, the shift amount may be determined in advance in consideration of an oblique incidence characteristic of the sensor. The synthesis processing after shifting may be color reproduction improvement by a general linear matrix or white balance. As another example, the synthesis processing may be SN improvement by addition of the same filter configurations, or an operation of extracting a wavelength of a specific spectrum. These pieces of processing may output a plurality of different images such as an object image in a visible light region and a characteristic spectrum image in a near-infrared region, for example, instead of outputting one synthesis image.

In a case where the shift amount between the images to be synthesized has a fraction of less than one pixel, processing of aligning grids by interpolation approximation may be performed. Furthermore, in the case of the same filters, images may be synthesized in a state of being shifted by the fraction and an image having an increased number of pixels may be temporarily generated, and a high-resolution image may be generated by interpolation into information with an easily handled equal pitch.

A part of the processing for the parallax images will be described in more detail in embodiments to be described below.

Nineteenth Embodiment

Figure 29:
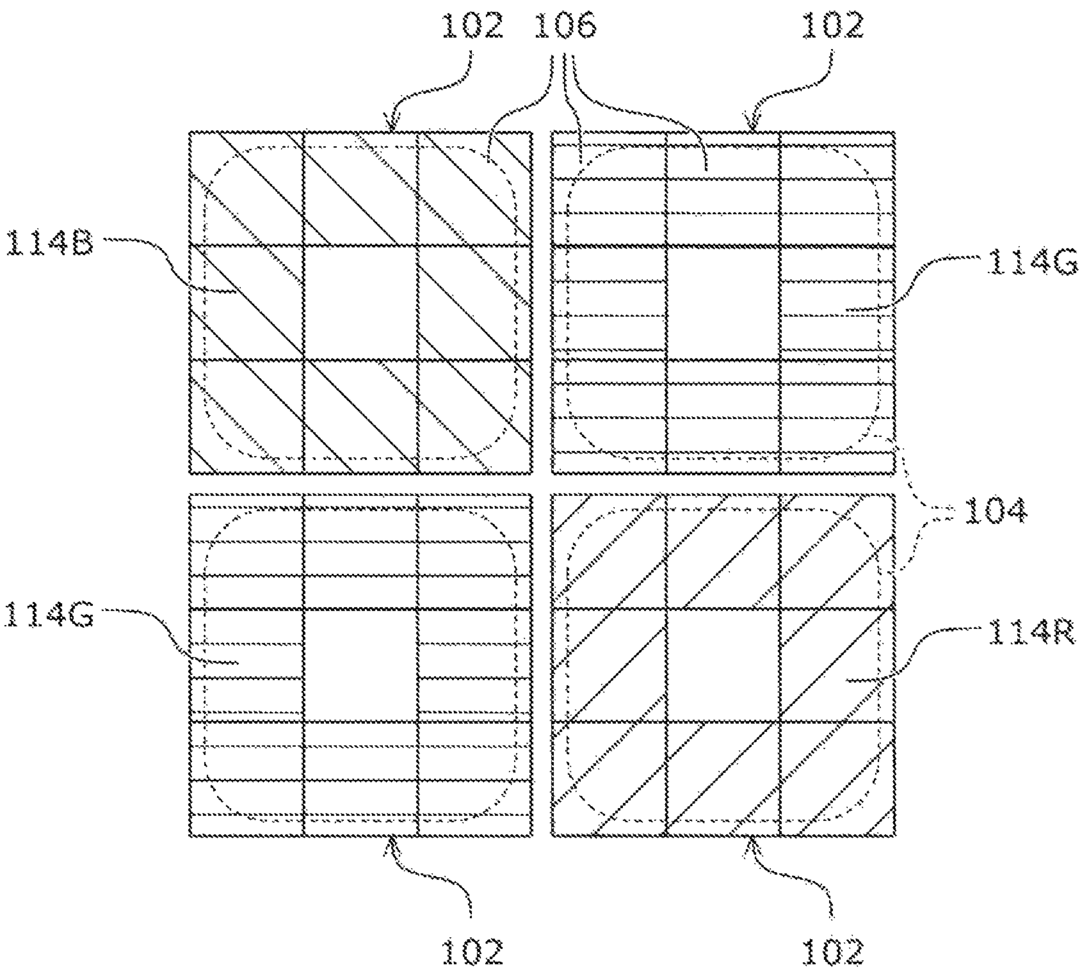
FIG. 29 is a plan view schematically illustrating an example of filter arrangement according to an embodiment.

FIG. 29 is a view illustrating an example of a filter applied to each subpixel. As filters 114 such as color filters, a right-up slant-line subpixel 106 is provided with a red filter 114R, a transverse-line subpixel 106 is provided with a green filter 114G, and the left-up slant-line subpixel 106 is provided with a blue filter 114B, similarly to FIG. 28A, for example.

FIG. 29 illustrates four pixels 102. The subpixel 106 at a center of each pixel may not be provided with a color filter, and the subpixels 106 therearound may be provided with the filter 114. The filter 114 is a color filter unified for each pixel, and a combination of colors of the filter may be changed between different pixels. As illustrated in the drawing, the color arrangement of the color filter may be an array of primary colors or an array used when applying other multi-color filters.

For example, a filter of a color corresponding to the pixel 102 in FIGS. 21 to 27 described in the above-described embodiment may be provided not for each pixel 102 but for each subpixel 106. That is, a filter provided for each pixel 102 may be determined not as the filter 112 but as the filter 114.

By providing such an array, luminance information can be accurately acquired in the subpixel 106 located at the center of the pixel 102, which is likely to efficiently receive light, and color information can be acquired in the subpixels 106 therearound.

When only signals of the subpixels 106 located at the same place with respect to the pixel 102 are collected, an output of the same condition is obtained at the same resolution as the pixel 102 in FIG. 28A, whereas resolving power is inferior in FIG. 29, but each subpixel image other than the center periodically includes outputs of a plurality of different color conditions, and demosaic processing can be independently performed.

Twentieth Embodiment

Figure 30:
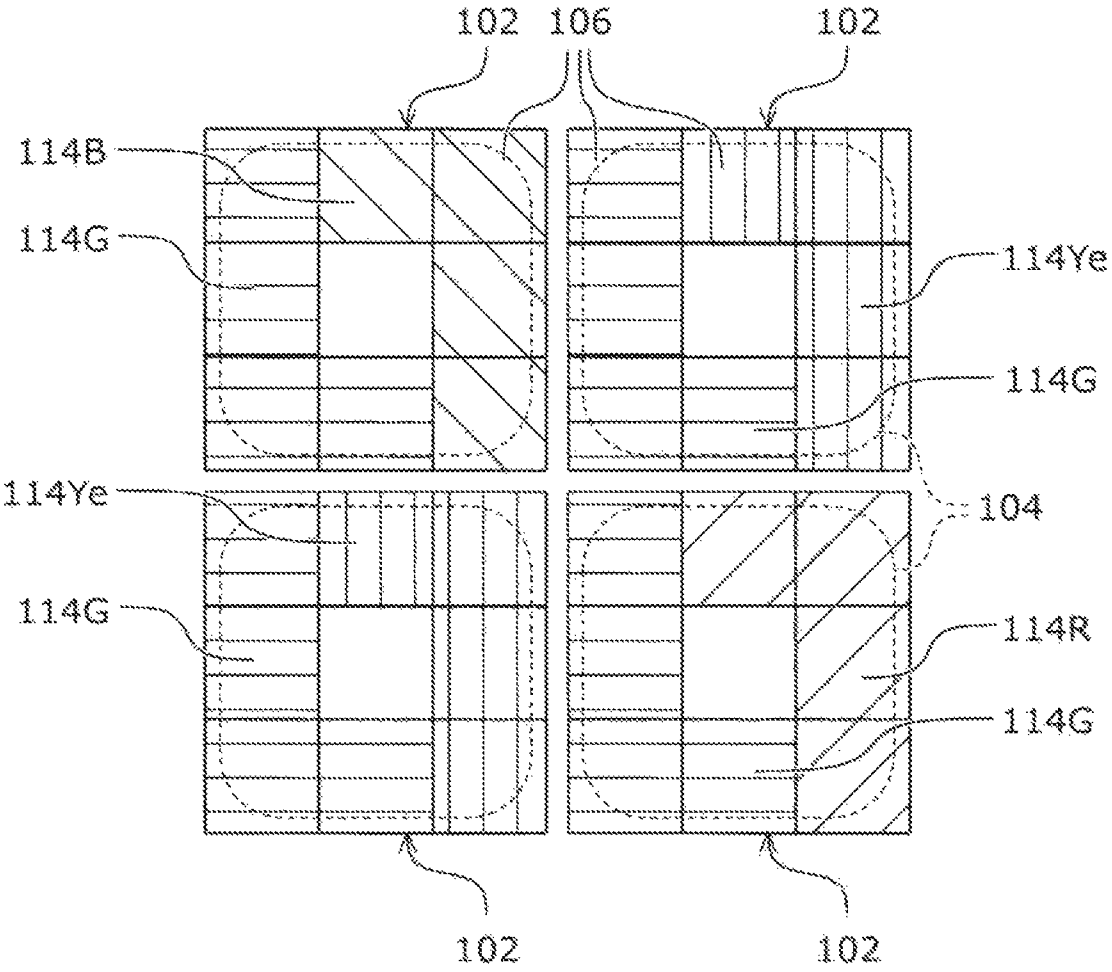
FIG. 30 is a plan view schematically illustrating an example of filter arrangement according to an embodiment.

FIG. 30 is a view illustrating an example of a filter applied to each subpixel. As this color filter, a right-up slant-line subpixel 106 is provided with a red filter 114R, a transverse-line subpixel 106 is provided with a green filter 114G, and a left-up slant-line subpixel 106 is provided with a blue filter 114B, similarly to FIG. 28A.

Furthermore, for all of pixels 102, a vertical-line subpixel 106 is provided with, for example, a yellow filter 114Ye. The yellow filter 114Ye can efficiently sense light intensity and wavelength band information from an object when, for example, polyimide is present therebetween in the above-described case of being provided under a display. As described above, the filter 114 of two colors or a plurality of colors may be provided for each pixel 102.

Note that, in the above description, the color filters are red, green, blue, and yellow, but the color filters are not limited thereto. Similarly to the above-described embodiment of the filter 112 for the pixel, the subpixels 106 may suitably be provided with, for example, a magenta filter 114Mg, a cyan filter 114Cy, a white filter 114W, a filter 114IR for acquiring an infrared wavelength, and a filter 114IRC for blocking an infrared wavelength.

In addition, for example, to acquire characteristics of skin color, a filter of orange that can appropriately acquire sensitivity of light having a rising spectrum (550 nm to 600 nm) may be provided. In this case, color resolution can be improved by using filters of three or more colors.

The pixel 102 may be formed by combining the filter 112 applied to the pixel 102 and the filter 114 applied to the subpixel 106 described so far. For example, a filter 112IRC for cutting an infrared region may be provided in the pixel 102, and filters 114R, 114G, and 114B for acquiring red, green, and blue may be appropriately arranged in the subpixels 106.

Twenty-First Embodiment

In the above-described embodiments, the case where the color filter is used as the filter 114 has been described, but the filter 114 is not limited thereto, and a special filter may be used.

Figure 31:
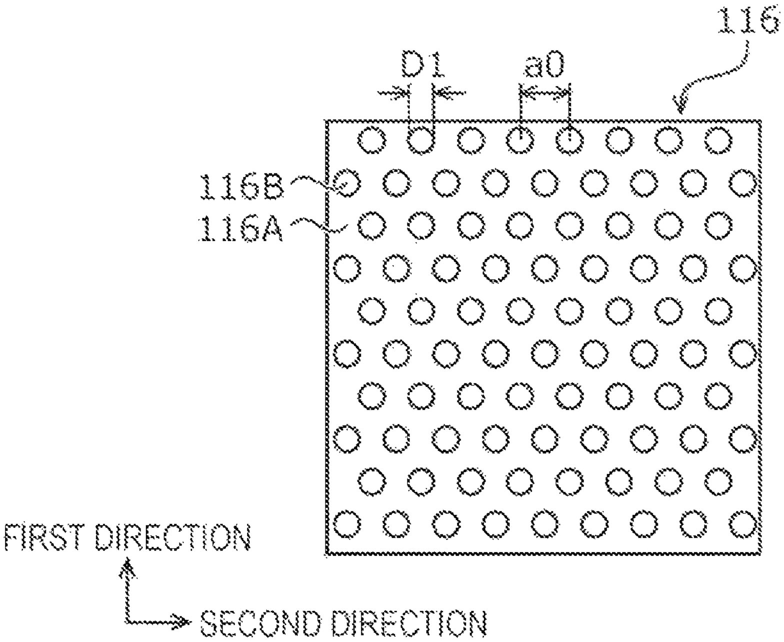
FIG. 31 is a plan view schematically illustrating an example of a filter according to an embodiment.

FIG. 31 is a view illustrating an example of a filter included in a subpixel 106. This filter is a plasmon filter 116. The plasmon filter 116 is a filter that selectively transmits a specific wavelength using plasmon resonance. By using the plasmon filter 116, a narrowband filter by plasmon resonance of a metal surface can be implemented.

As illustrated in FIG. 31, the plasmon filter 116 includes a metal film 116A and a hole 116B. For example, as illustrated in FIG. 31, the plasmon filter 116 is configured by a plasmon resonance pair in which holes 116B are arranged in a honeycomb manner in the thin metal film 116A, for example.

The metal film 116A is configured by a thin metal film. The metal film 116A may be, for example, a metal film of aluminum, silver, gold, copper, platinum, molybdenum, tungsten, chromium, titanium, nickel, iron, tellurium, or the like, a compound of these metals, or an alloy of these metals. As the metal film 116A, these materials may be formed in multiple layers.

The material selection of the metal film affects a transmitted light spectrum. For example, aluminum is one of desirable materials for a wide wavelength region because aluminum reflects all RGB and no absorption occurs. Meanwhile, copper easily reflects a red wavelength region, and is a desirable material as a filter specialized for a red or near-infrared wavelength region.

Each of the holes 116B penetrates the thin metal film 116A and acts as a waveguide. Generally, a waveguide tube has a cutoff frequency and a cutoff wavelength defined according to a shape such as a side length and a diameter, and has a property that light having a frequency equal to or lower than the cutoff frequency (a wavelength equal to or larger than the cutoff wavelength) does not propagate. The cutoff wavelength of the hole 116B mainly depends on an opening diameter D1, and the cutoff wavelength becomes shorter as the opening diameter D1 is smaller. Note that the opening diameter D1 is set to a value smaller than the wavelength of light to be transmitted.

Meanwhile, when light enters the thin metal film 116A having the holes 116B periodically formed with a short period equal to or smaller than the wavelength of the light, a phenomenon in which the light having the wavelength longer than the cutoff wavelength of the hole 116B is transmitted occurs. This phenomenon is called abnormal plasmon transmission phenomenon. This phenomenon occurs when surface plasmons are excited at a boundary between the thin metal film 116A and an interlayer film thereon. Therefore, by adjusting a hole pitch a0 and an opening diameter D1 of the hole 116B, it is possible to selectively acquire information of light of various wavelengths.

The plasmon resonance theoretically occurs in a case where following conditions are satisfied by a dielectric constant εm of a conductor thin film, a dielectric constant εd of the interlayer film, and the hole pitch a0 where a surface plasma frequency is ωsp. Here, i and j represent degrees.

[Math. 1]

$$R_e\left[\frac{\omega sp}{c}\sqrt{\frac{\varepsilon m\cdot\varepsilon d}{\varepsilon m+\varepsilon d}}\right]=\left|\frac{2\pi}{\lambda}\sin\theta+iGx+jGy\right| \quad (1)$$

[Math. 2]

$$|Gx|=|Gy|=\frac{2\pi}{a0} \quad (2)$$

Figure 32:
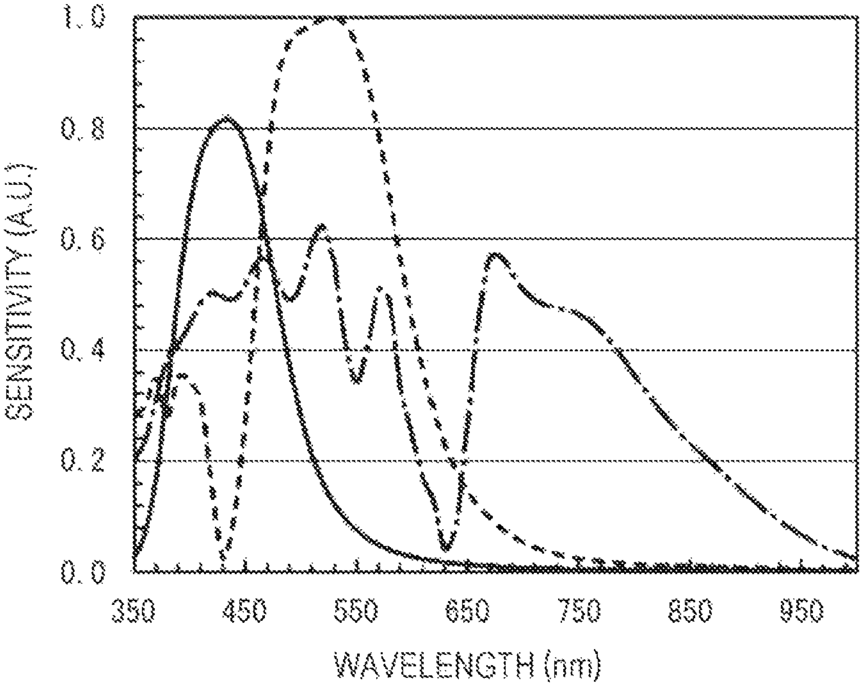
FIG. 32 is a graph illustrating characteristics of an example of a filter according to an embodiment.

FIG. 32 is a graph illustrating the configuration of the hole 116B in the plasmon filter 116 and the sensitivity to the wavelength. The solid line indicates the relationship between the wavelength and the sensitivity in a case of the hole pitch a0=250 nm, the broken line indicates the relationship in a case of the hole pitch a0=325 nm, and the alternate long and short dash line indicates the relationship in a case of the hole pitch a0=500 nm.

Figure 33:
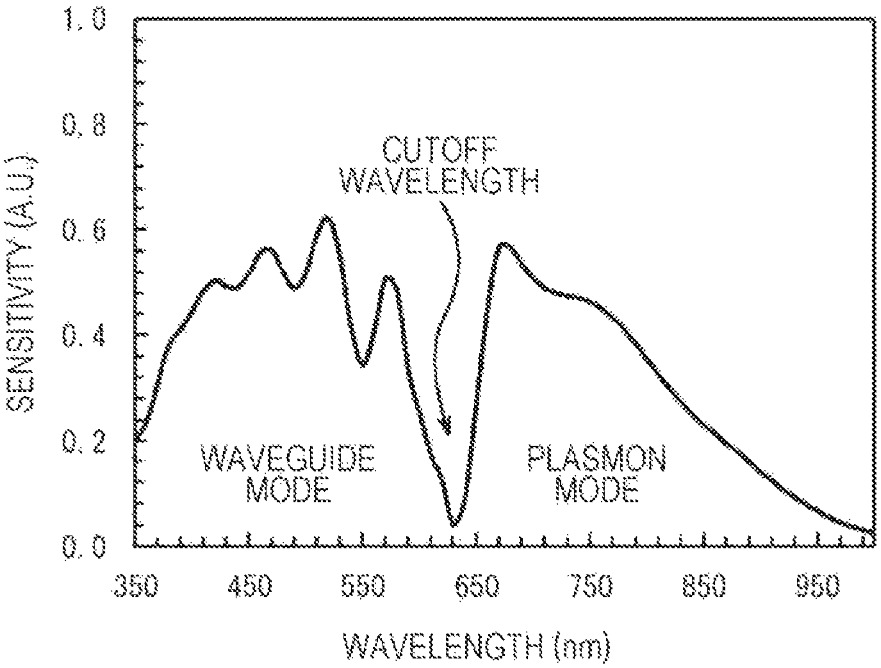
FIG. 33 is a graph illustrating characteristics of an example of a filter according to an embodiment.

FIG. 33 is a graph illustrating a plasmon mode and a waveguide mode.

When the hole pitch a0 is increased, a transmission spectrum is shifted to a longer wavelength side as illustrated in FIG. 32. Meanwhile, since the spectrum is acquired as a spectrum mixed with a waveguide mode of the cutoff wavelength or less as illustrated in FIG. 33, for example, it is desirable to stack the plasmon filter in combination with the filter 112 as the color filter for the pixel 102 to narrow the band.

As another example, one plasmon filter 116 may include a plurality of layers of various plasmon filters. As yet another example, the plasmon filter 116 may obtain outputs of a plurality of spectra and narrow the bands in signal processing.

As the interlayer film for the plasmon filter, a film having a low dielectric constant, for example, a dielectric such as a silicon oxide or a low-K film may be used.

As described above, by providing the plasmon filter 116 instead of the color filter, information of light in a predetermined spectral region may be acquired. For example, the plasmon filter 116 may be provided instead of at least a part in the embodiment related to the color filter. In the third direction, the pixel 102 may include the color filter and the plasmon filter in combination.

Furthermore, since the plasmon filter includes a metal film, the plasmon filter has an advantage of a higher heat resistance than the normal color filter. In a process, in a case where a filter is provided before formation of a light-shielding wall, there is an advantage that a light-shielding wall 108 and the like can be manufactured by an appropriate processing means without being restricted by thermal fragility, by using the plasmon filter including metal as the filter.

Moreover, a metal film 316 for the purpose of light-shielding between the pixels 102 or light-shielding between the subpixels 106, and the plasmon filter 116 may include the same metal material. By using the same metal material, there is an advantage that the number of processes can be reduced. When the metal film 316 also serves as the light-shielding film of a black reference pixel region, a required film thickness for light-shielding and an optimum film thickness of the plasmon filter may be different. In this case, it is desirable to separately provide metal materials for these film pressures or to separately form the thickness of the metal film.

Meanwhile, in the plasmon filter 116, since the metal film easily reflects light and an opening ratio is low, so-called flare or ghost may occur, in which reflected light is reflected by a member such as a seal glass or an IR cut filter and re-enters a sensor.

As a countermeasure, the color filter may be provided on an upper side and the plasmon filter 116 may be provided on a lower side in a combination of close wavelength regions of the transmission spectra. With such a configuration, a wavelength component that is easily reflected by the plasmon filter 116 is absorbed by the color filter at the time of incidence, and a reflection component by the plasmon filter 116 is also absorbed by the color filter again, so that flare and ghost can be suppressed.

Note that the plasmon filter 116 has low transmittance in principle. To obtain sufficient signal strength for authentication, it is desirable to provide a storage time to be variable for each subpixel. Specifically, an imaging element 10 may be formed such that the storage time of the subpixel including the plasmon filter 116 is lengthened the storage time of the subpixel not including the plasmon filter 116 is shortened.

Next, arrangement of the various filters in the pixel 102 and the subpixels 106 will be described using a cross-sectional view. The following drawings illustrate the configuration of the pixel 102 and the like on a substrate but do not illustrate a wiring layer 302 and the like. Other necessary configurations are not illustrated as appropriate, and only the relationship between the pixel 102 and the like and the filter 112 and the like is focused and illustrated. Therefore, it is assumed that components (not appropriately illustrated) are further provided.

Twenty-Second Embodiment

Figure 34:
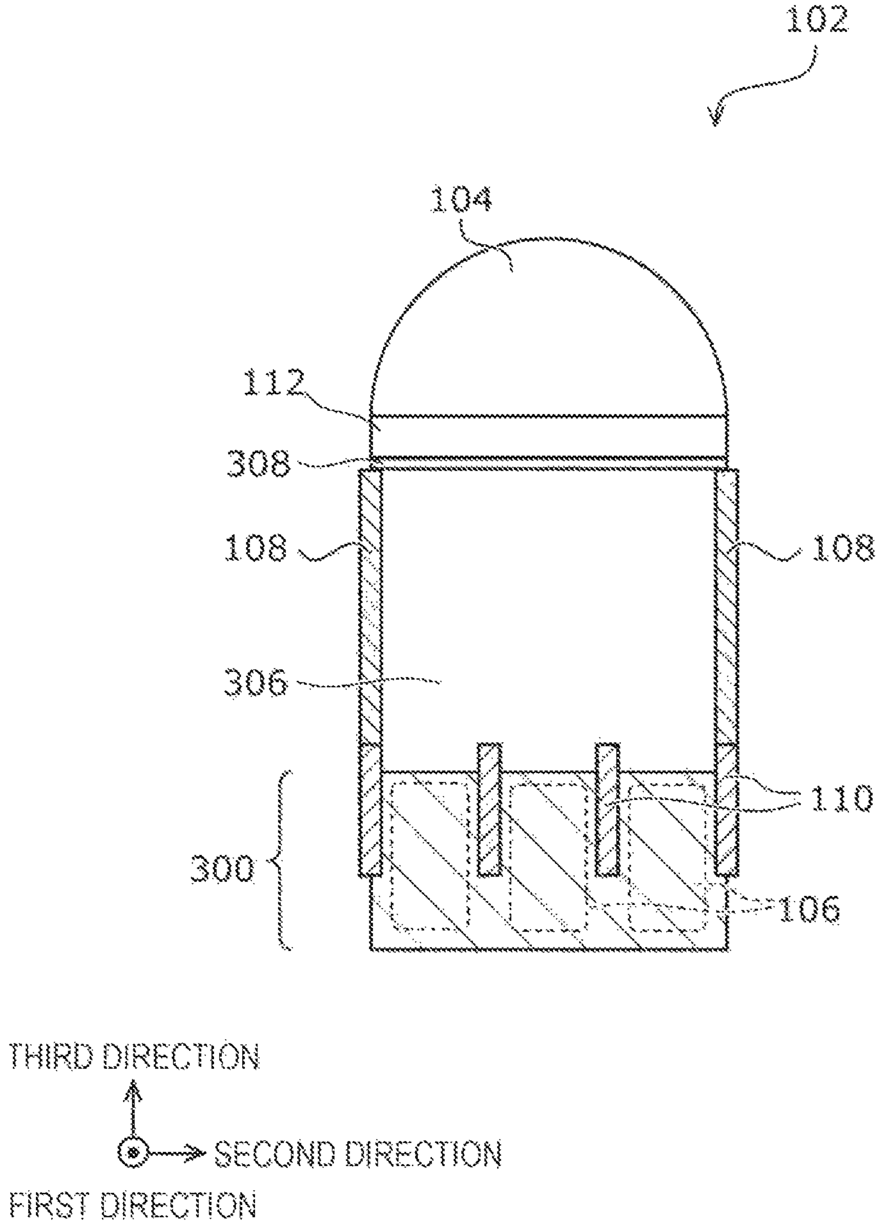
FIG. 34 is a cross-sectional view schematically illustrating an example of filter arrangement according to an embodiment.

FIG. 34 is a view schematically illustrating a cross-sectional view of a pixel 102 illustrating an example of arrangement of a filter 112. Although the filter 112 is an insulator, for example, hatching is omitted. As illustrated in FIG. 34, the pixel 102 may include the filter 112 between an interlayer film 306 and an on-chip lens. An adhesion layer 308 may be further provided between the interlayer film 306 and the filter 112.

The configuration of the pixel 102 according to the present embodiment has an advantage of, in its formation, not affecting thermal constraints during a wall structure process, whereas common organic filters are subject to high temperature processing, for example, denaturation to cause problems such as reduction in sensitivity when 300 degrees or higher.

Twenty-Third Embodiment

Figure 35:
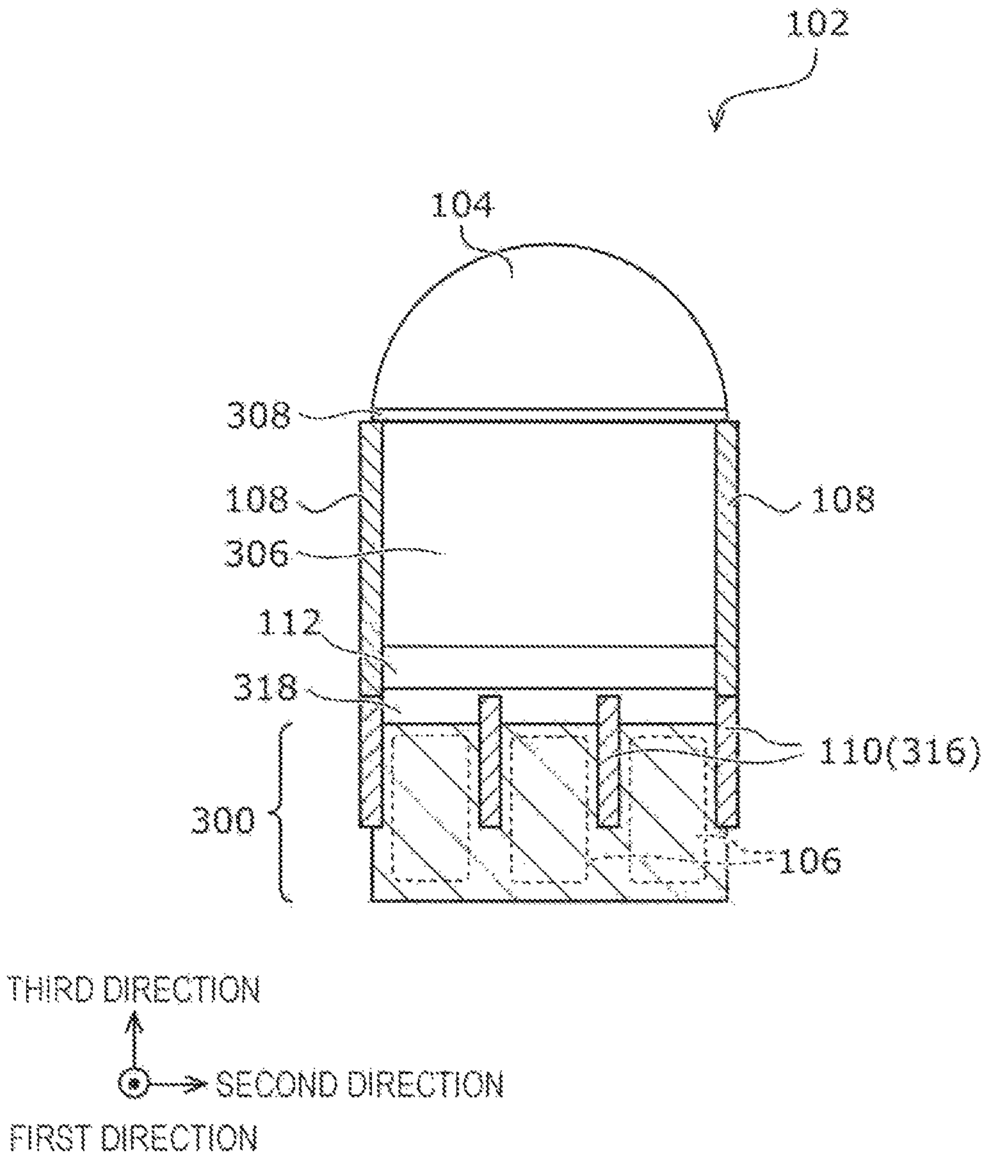
FIG. 35 is a cross-sectional view schematically illustrating an example of filter arrangement according to an embodiment.

FIG. 35 is a view schematically illustrating a cross-sectional view of a pixel 102 illustrating an example of arrangement of a filter 112. As illustrated in FIG. 35, the pixel 102 may include the filter 112 after including a planarization film 318 on a metal film 316 of a photoelectric conversion element isolation portion 110. The planarization film 318 is, for example, a layer including a substance such as a transparent organic material having a viscosity adjusted similarly to an adhesion layer 308 and having an upper surface planarized.

As a modification, although not illustrated, the filter 112 may be provided immediately above the metal film 316.

In the filter 112, if the filter is exposed during a trench processing of a light-shielding wall 108, deposits adhere to a chamber wall of a device. Therefore, it is desirable that a filter end is positioned so that the filter is not exposed in consideration of, for example, a process variation of a line width and misalignment. When a gap is formed between the filter 112 and the metal film 316 of the photoelectric conversion element isolation portion 110 as viewed from an upper surface, color mixing is deteriorated. Therefore, for example, it is desirable that the metal film 316 and the filter 112 overlap without a gap in consideration of a process variation of a line width and misalignment.

Twenty-Fourth Embodiment

Figure 36:
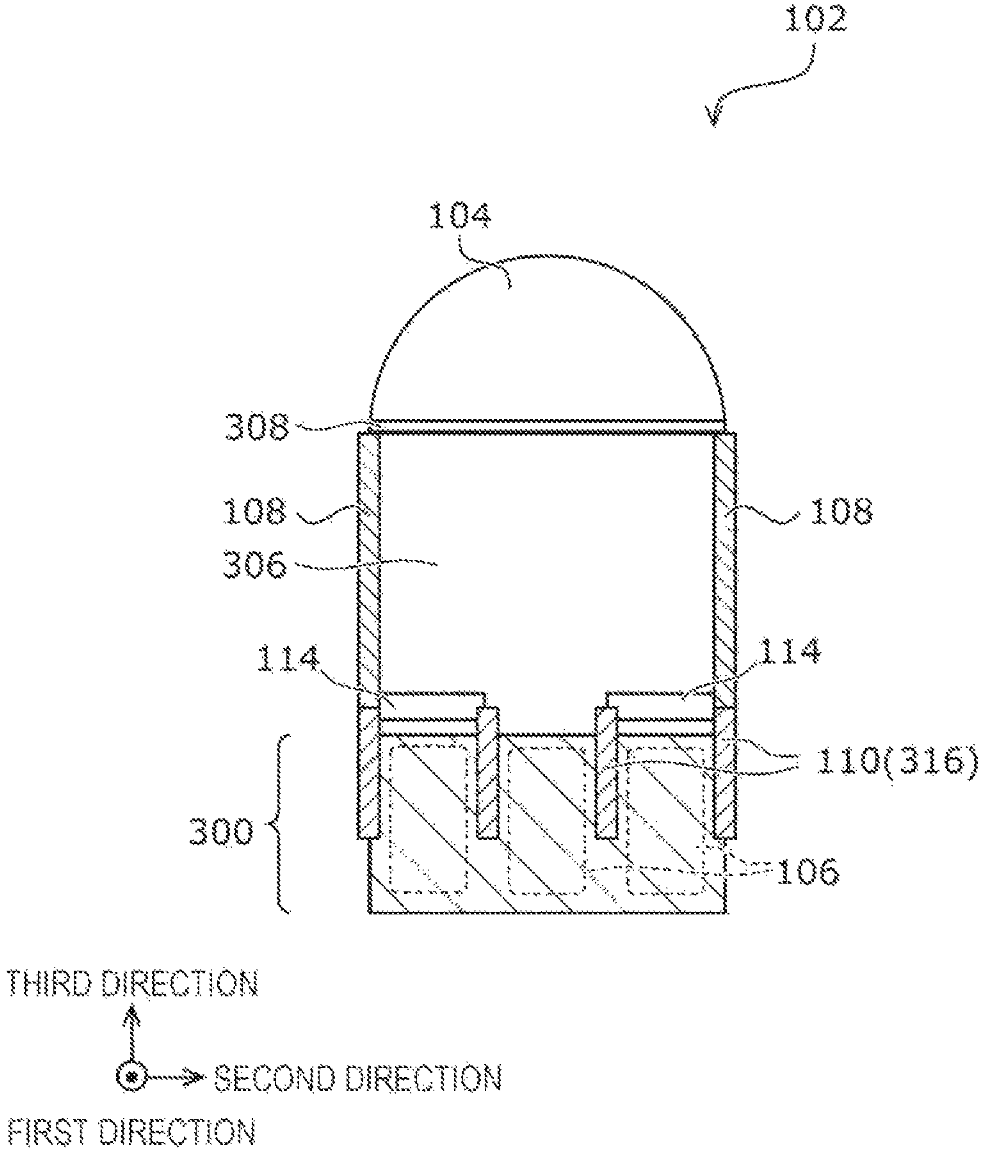
FIG. 36 is a cross-sectional view schematically illustrating an example of filter arrangement according to an embodiment.

FIG. 36 is a view schematically illustrating a cross-sectional view of a pixel 102 illustrating an example of arrangement of a filter 114. As illustrated in FIG. 36, the filter 114 is provided in an interlayer film 306 so as to cover an upper surface of each subpixel 106. For example, each filter 114 is arranged to cover the subpixel 106 from above a photoelectric conversion element isolation portion 110.

Also in this case, a planarization film 318 may be provided and the filter 114 may be provided thereon, similarly to the above-described case where the filter 112 is provided on the photoelectric conversion element isolation portion 110.

The filter 114 may not be the same filter across the pixels 102 as described above. For example, the filter 114 on the left side in FIG. 36 may be a filter 114G that is a green color filter, and the filter 114 on the right side may be a filter 114R that is a red color filter.

Furthermore, for example, the subpixel 106 located at a center may output a sensitivity-focused signal without arranging a filter. In this case, a sensitivity-focused signal can be acquired and color information can be interpolated in the peripheral subpixel 106 to which the filter 114 is applied.

Twenty-Fifth Embodiment

Figure 37:
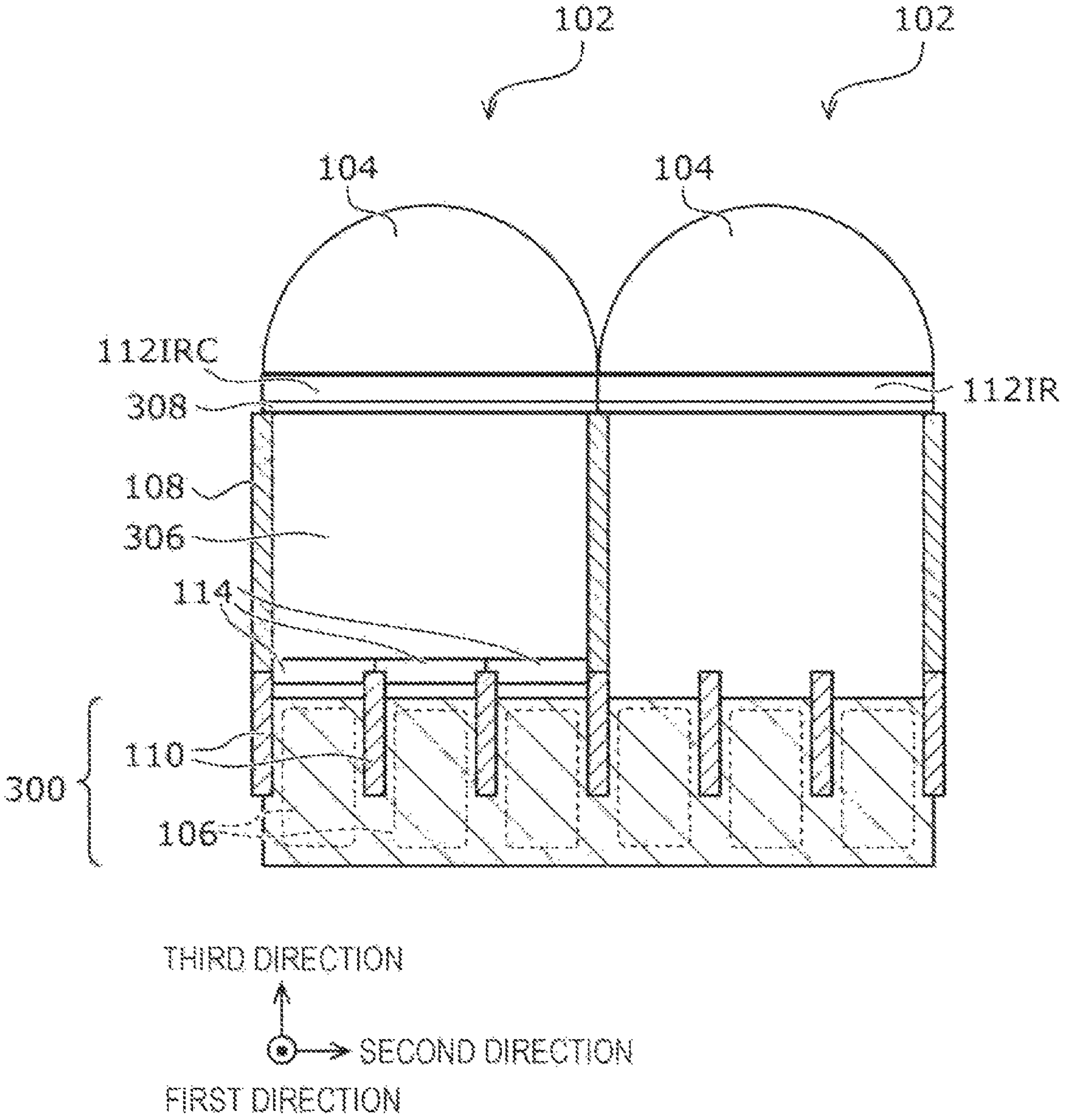
FIG. 37 is a cross-sectional view schematically illustrating an example of filter arrangement according to an embodiment.

FIG. 37 is a view schematically illustrating a cross-sectional view of pixels 102 illustrating an example of arrangement of filters 112 and 114. As illustrated in FIG. 37, two layers of filters 112 and 114 may be provided in an up-down direction.

The pixel 102 on the left may include, for example, an on-chip filter 112IRC that absorbs infrared rays at an upper part thereof, and a filter 114 that is the same or different for each subpixel 106 at a lower part thereof, for example, any filter 114 such as a green filter 114G, a red filter 114R, a blue filter 114B, or the like. Meanwhile, the pixel 102 on the right side may include, for example, a filter 112IR that transmits only infrared rays at an upper part thereof.

With such a configuration, it is possible to simultaneously acquire color information and infrared information to which angle information is also given without mounting an infrared absorption filter in a portion other than an imaging element 10 of an electronic device 1. In addition, it is possible to implement a solid-state imaging element having a new transmittance spectrum by combining different filters up and down.

Twenty-Sixth Embodiment

Here, a case of overlapping color filters will be described in terms of spectrum.

Figure 38:
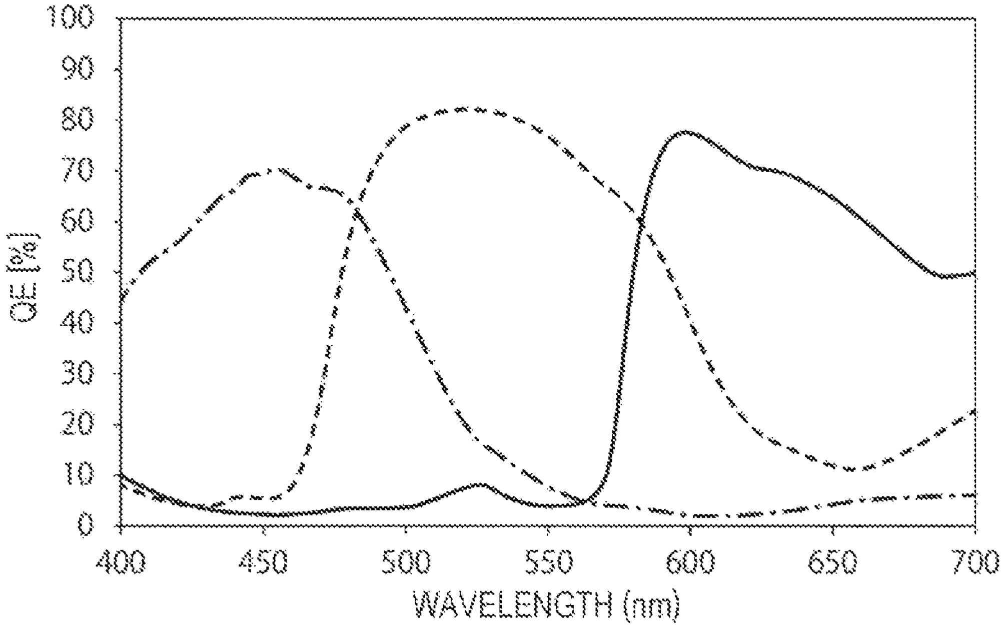
FIG. 38 is a graph illustrating sensitivity to a spectrum in a case where a filter according to an embodiment is used.

FIG. 38 is a graph illustrating an example of characteristics of color filters. In the following description of the spectrum, the horizontal axis represents a wavelength [nm], and the vertical axis represents light reception sensitivity (quantum efficiency (QE)) [%].

The solid line indicates a sensitivity characteristic of the red filter, a dotted line indicates the sensitivity characteristic of the green filter, and an alternate long and short dash line indicates the sensitivity characteristic of the blue filter. As described above, the filter of each color is designed so that light reception sensitivity (transmittance) becomes high in a predetermined wavelength band.

Filters used in various imaging devices and the like include those of materials having various transmission spectra by preparation of pigments and dyes. For example, to place emphasis on the light reception sensitivity of the filter, there is a combination in which a half-value width is widened and spectra overlap between different colors. In a case where two filters having overlapping spectra are stacked up and down, the respective transmission spectra are superimposed, and a new narrow-band sensitivity spectrum can be implemented.

Figure 39:
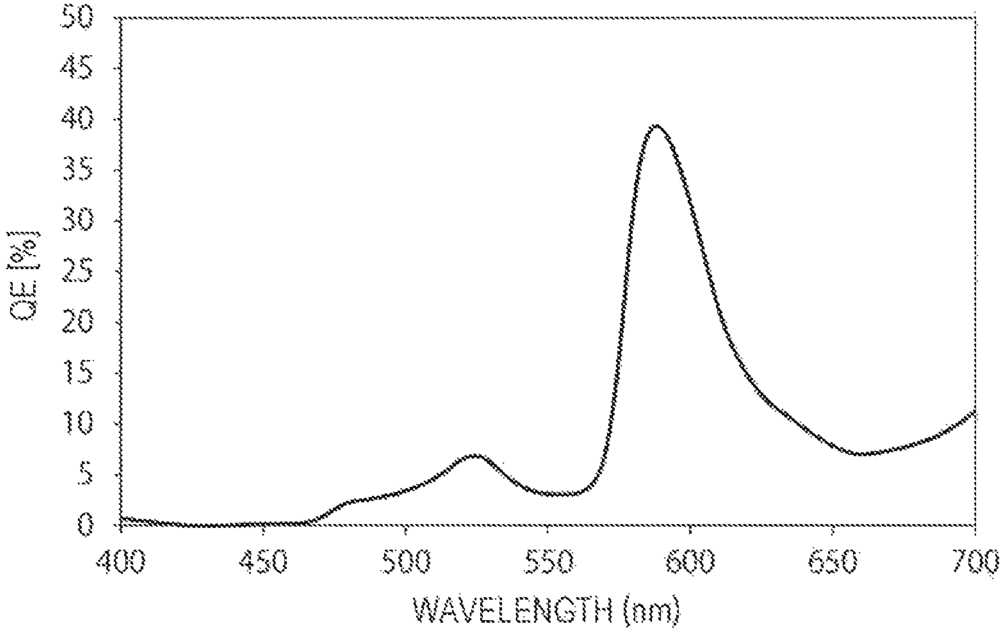
FIG. 39 is a graph illustrating sensitivity to a spectrum in a case where a filter according to an embodiment is used.

FIG. 39 illustrates an example of the transmittance in the case where the green filter and the red filter are stacked up and down. As illustrated in FIG. 39, a characteristic sensitivity spectrum in which the sensitivity is high in a wavelength region of 550 to 600 nm is obtained by using the green filter and the red filter in a stacked manner.

For example, as illustrated in FIG. 271, the wavelength region having a large spectral change exists in the vicinity of about 550 to 600 nm, more typically, around 590 nm, regardless of a skin color. For this reason, biometric authentication is often performed in the wavelength region as illustrated in FIG. 39.

From the above fact, for example, the filter in which the green filter and the red filter illustrated in FIG. 39 are stacked can be said to be a combination of filters having sensitivity spectral characteristics suitable for biometric authentication. This characteristic does not change even when there is a gap between the green filter and the red filter, for example, when there is a substance that transmits the entire visible light. Therefore, filters of different colors can be provided in both the filter 112 and the filter 114 illustrated in the above-described drawings.

For example, in a case where the filter is stacked as in the pixel 102 on the right side of FIG. 37, a combination of filters suitable for biometric authentication can be obtained by providing the red filter 112R immediately below the lens 104 and the green filter 114G on the subpixel 106.

Figure 40:
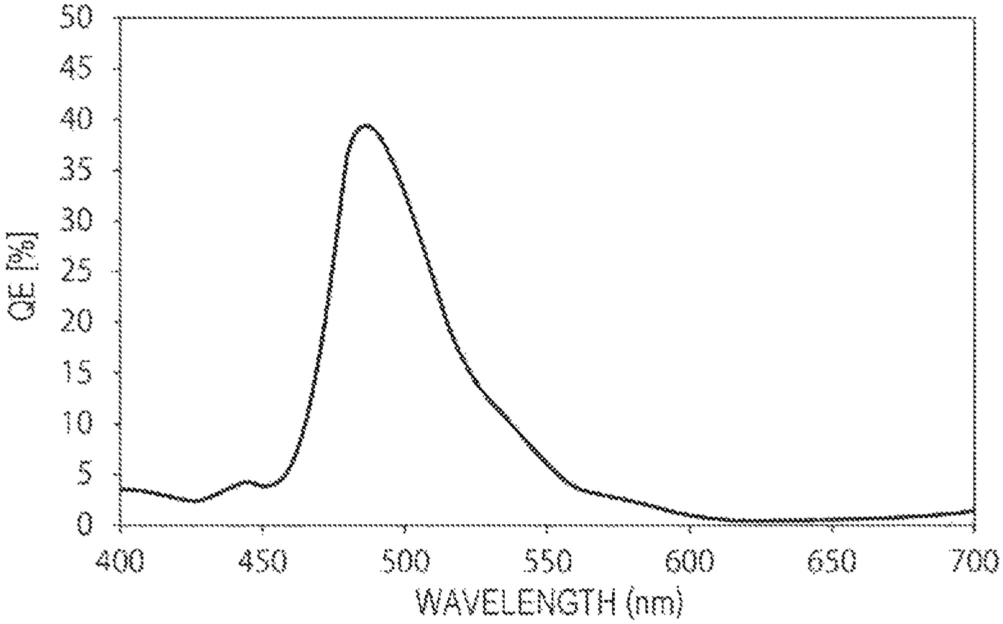
FIG. 40 is a graph illustrating sensitivity to a spectrum in a case where a filter according to an embodiment is used.

As another example, FIG. 40 illustrates an example of the transmittance in the case where the green filter and the blue filter are stacked up and down. Meanwhile, in a color-matching experiment in color engineering, a negative region that cannot be reproduced by an additive color mixture of three primary colors of red, blue, and green exists approximately at 436 to 546 nm, and four primary color coding of red, blue, green, and emeralds has been proposed as a means for compensating for the influence of image quality in this region. The transmission spectrum of FIG. 40 can be utilized for emerald pixels in the four primary color coding.

Figure 41:
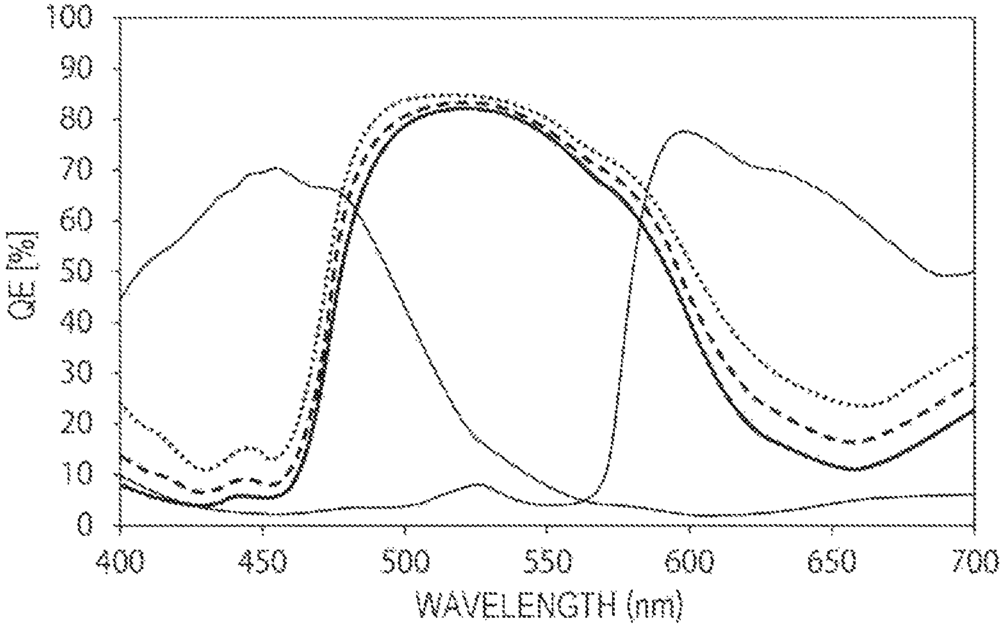
FIG. 41 is a graph illustrating sensitivity to a spectrum in a case where a filter according to an embodiment is used.

FIG. 41 illustrates an example of the sensitivity spectrum of behavior of the sensitivity spectrum when a film thickness of the green filter is changed. The drawing illustrates examples of cases where the solid line indicates that the film pressure of the green filter is 500 nm, the broken line indicates 400 nm, and the dotted line indicates 300 nm. The film thickness dependence of the green filter follows the Lambert-Beer law. That is, the influence of the film pressure of the filter is smaller as an absorption rate (absorbance) is lower (transmittance is higher), and is larger as the absorption rate (absorbance) is higher (transmittance is lower). The dependence due to the film pressure can be confirmed from the relationship among the solid line, the broken line, and the dotted line in FIG. 41.

Figure 42:
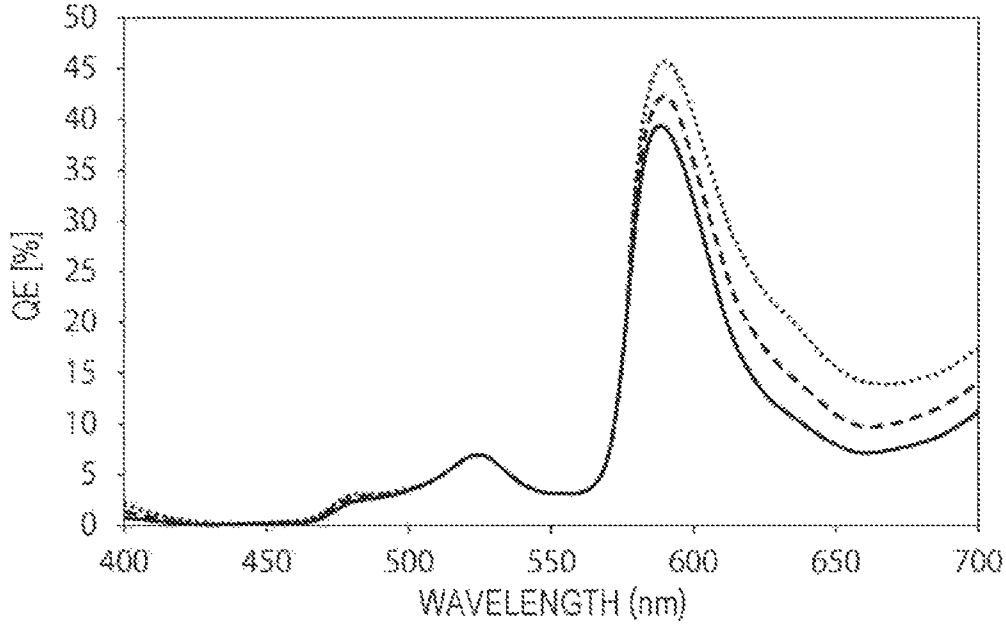
FIG. 42 is a graph illustrating sensitivity to a spectrum in a case where a filter according to an embodiment is used.

FIG. 42 is a graph illustrating spectral sensitivity to the wavelength in a case where the green filters having different film pressures are stacked with the red filter. Similarly to FIG. 41, examples of cases where the solid line indicates that the film pressure of the green filter is 500 nm, the broken line indicates 400 nm, and the dotted line indicates 300 nm.

As illustrated in FIG. 42, a state of a side lobe of the sensitivity spectrum on the high wavelength side, for example, at a wavelength of 580 nm or more can be changed with respect to the graph of FIG. 39. Using this result, the thickness of the filter may be changed by matching the sensitivity spectrum with the spectrum of an assumed object.

Moreover, in FIG. 37, for example, the red filter 112R may be provided in an upper portion of the left pixel 102, and the green filters 114G having different film thicknesses may be provided for the lower individual subpixels 106. The green filters may be, for example, 300 nm in thickness and 500 nm in thickness as illustrated in FIGS. 41 and 42.

By providing such green filters 114G having different film pressures, two spectra having different side lobe sensitivities in a wavelength region of 580 nm or higher can be obtained. It is possible to extract an object spectrum of 580 nm or higher on the basis of a difference between these sensitivity spectra.

To obtain a difference between signals received by the subpixels 106 corresponding to the filters 114G having different film pressures, image offset processing may be performed in consideration of a parallax of each subpixel 106 and object distance. As another form, even in the case of color filters of the same color, a similar effect can be obtained by changing the type of the pigment or a mixing ratio of the pigments.

Figure 43:
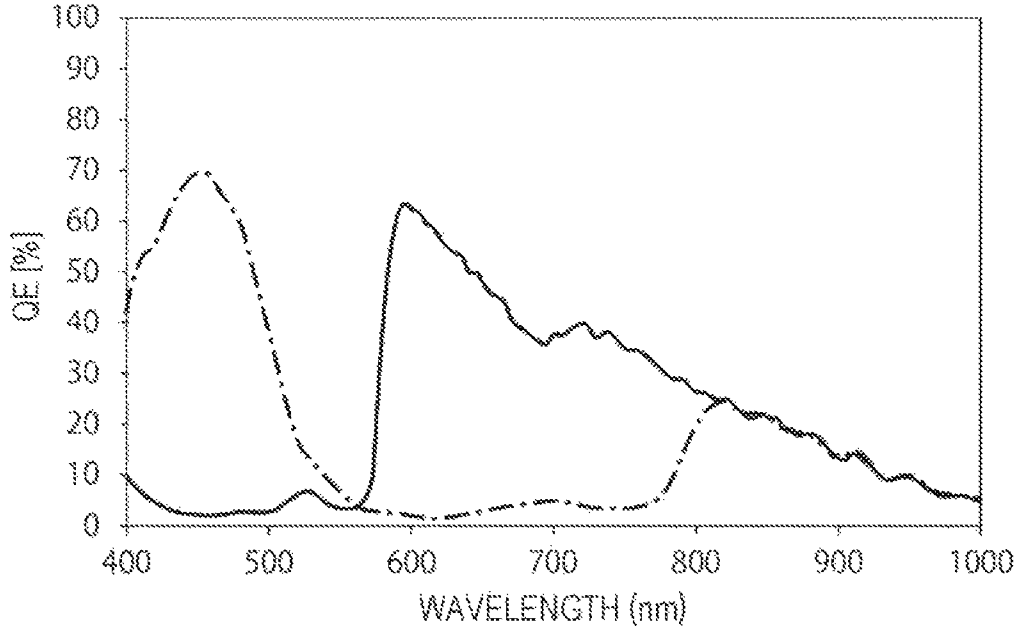
FIG. 43 is a graph illustrating sensitivity to a spectrum in a case where a filter according to an embodiment is used.

FIG. 43 is a graph illustrating sensitivity spectra of the red filter and the blue filter alone. The solid line indicates the sensitivity of the red filter and the alternate long and short dash line indicates the sensitivity of the blue filter. As described above, between the red filter and the blue filter, the regions where the sensitivity becomes sufficiently high (for example, 10% or higher) in the visible light region (about 400 to 700 nm) do not overlap with each other.

Figure 44:
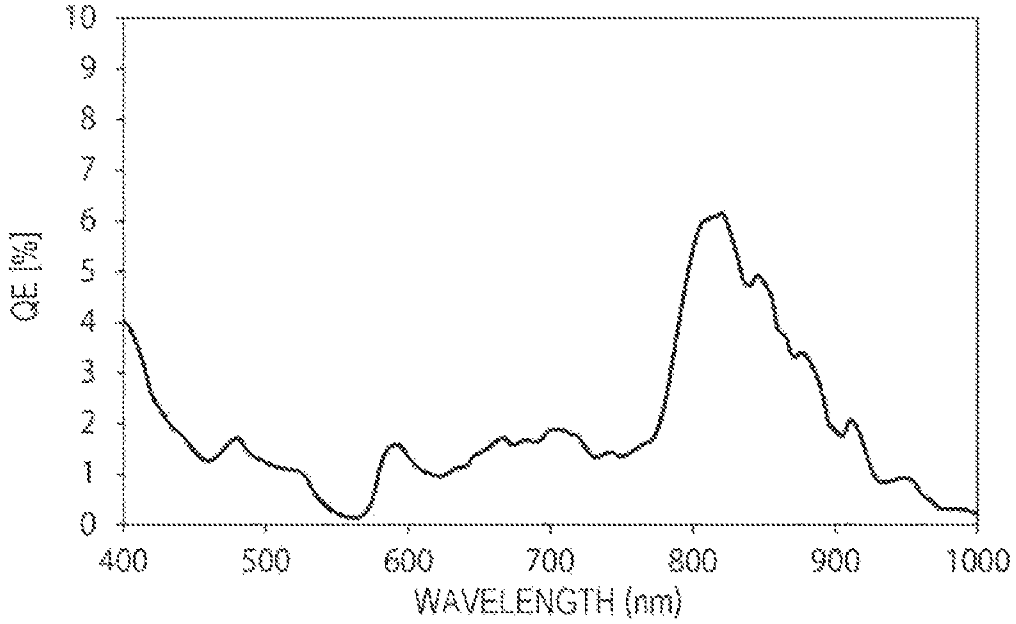
FIG. 44 is a graph illustrating sensitivity to a spectrum in a case where a filter according to an embodiment is used.

FIG. 44 illustrates another example of the sensitivity spectrum obtained when different color filters are arranged up and down on the basis of the above description.

Since the red filter and the blue filter have transmission spectrum peaks separated from each other in the visible light region, the red filter and the blue filter complementarily act when stacked up and down. As a result, light is substantially shielded in the entire visible light region by stacking the red filter and the blue filter.

Meanwhile, in the near-infrared region, both form almost the same transmission spectrum peak between 800 nm and 900 nm. For this reason, it is possible to have sensitivity to near infrared rays when these filters are stacked up and down. That is, by using these filters in a stacked manner, it is possible to function as a near-infrared filter.

Note that, in FIGS. 38, 39, 40, 41, 42, 43, and 44, the description has been given using the structure of FIG. 37 as an example, but the configuration of stacking the color filters up and down is not limited thereto. In the overlapping of the color filters up and down in the present embodiment, for example, a second stage may be formed on a single-layer filter in FIGS. 34, 35, and 36, and FIG. 47 to be described below.

More specifically, color filters may be stacked as the filter 112 and the filter 114, or as another example, color filters may be stacked as two layers of the filters 112 or two layers of the filters 114. Furthermore, the combination of the color filters is not limited to the above-described combinations, and may be a combination other than these combinations. Furthermore, the types of filters to be stacked are not limited to the two types, and three or more types of color filters may be stacked in the third direction.

Twenty-Seventh Embodiment

In the above-described embodiment, the stacking of the color filters has been described, but a form in which one of the color filters is a plasmon filter will be described.

Figure 45:
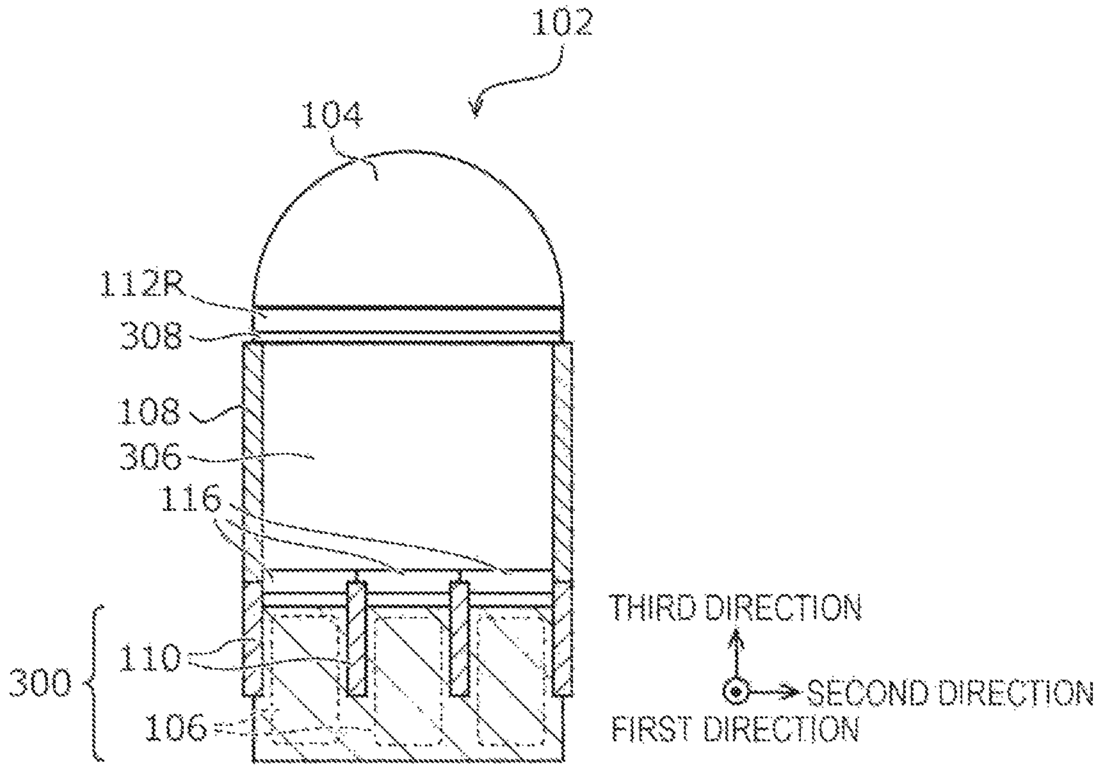
FIG. 45 is a view schematically illustrating an example of filter arrangement according to an embodiment.

FIG. 45 is a cross-sectional view illustrating a structure example of an imaging pixel according to the present embodiment. An imaging element 10 includes a lens 104, a red filter 112R, an adhesion layer 308, a light-shielding wall 108, an interlayer film 306, and a plasmon filter 116.

The lens 104 is equivalent to that described in the foregoing embodiments.

The filter 112R is provided below the lens 104.

The adhesion layer 308 for allowing the filter 112R and the interlayer film 306 to be in close contact is provided below the filter 112R. The adhesion layer 308 is not essential depending on the configuration of the interlayer film 306 and the filter 112R.

The interlayer film 306 is provided below the filter 112R via the adhesion layer 308. As described above, the interlayer film includes, for example, a permeable substance.

A crosstalk between the interlayer films 306 of the pixel 102 is suppressed by the light-shielding wall 108.

Then, the plasmon filters 116 illustrated in FIG. 31 are provided at locations where the various filters 114 are provided in the above-described embodiments. The plasmon filter 116 is configured by forming a hole 116B in a metal film 116A, for example, an aluminum film. For example, the inside of the hole 116B is filled with the interlayer film 306.

For example, sensitivity of the plasmon filter 116 to a wavelength is as illustrated in FIGS. 32 and 33. The specific configuration examples of the spectra illustrated in these drawings are suitable for detecting a spectrum specific to human skin as illustrated in FIG. 271. Therefore, the spectrum acquired via the plasmon filter 116 is suitable for use in biometric authentication.

Figure 46:
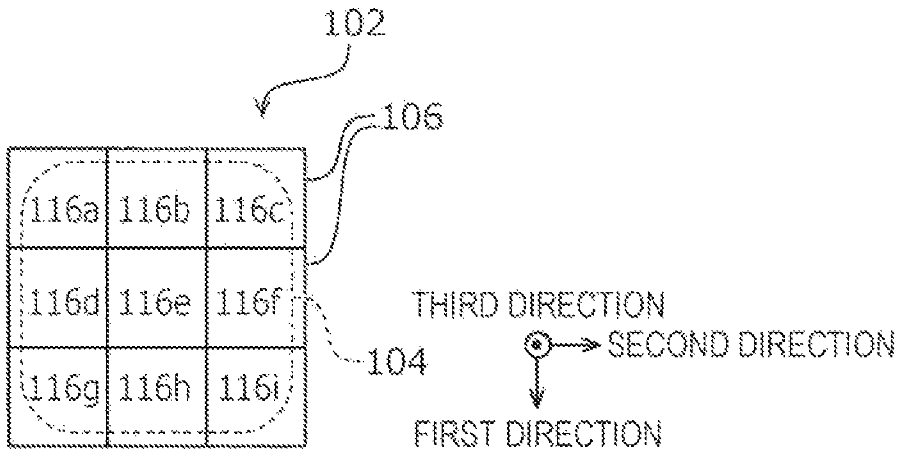
FIG. 46 is a view schematically illustrating an example of filter arrangement according to an embodiment.

FIG. 46 is a plan view of the plasmon filter 116 as viewed from above of an imaging pixel in FIG. 45. As illustrated in FIG. 46, an imaging element 10 includes the holes 116B having different shapes and pitches of the plasmon filter 116 for each subpixel 106.

For example, a plasmon filter 116*a* is designed to have the hole pitch of 320 nm and to easily transmit light of the wavelength of 550 nm, and for example, the plasmon filter 116*b* is designed to have the hole pitch of 340 nm and to easily transmit light of the wavelength of 580 nm. Similarly, the plasmon filters may be formed to have different hole pitches so that a plasmon filter 116*c* easily transmits light of the wavelength of 610 nm, a plasmon filter 116*d* easily transmits light of the wavelength of 640 nm, a plasmon filter 116*e* easily transmits light of the wavelength of 670 nm, a plasmon filter 116*f* easily transmits light of the wavelength of 700 nm, a plasmon filter 116*g* easily transmits light of the wavelength of 730 nm, a plasmon filter 116*h* easily transmits light of the wavelength of 760 nm, and a plasmon filter 116*i* easily transmits light of the wavelength of 790 nm.

By designing the plasmon filter 116 for each subpixel 106 in this manner, the imaging element 10 can acquire a spectrum in the wavelength range of 550 to 790 nm.

For example, by providing the red filter 112R illustrated in the graph of FIG. 41 on these plasmon filters, it is possible to suppress an influence of a waveguide mode of a cutoff wavelength or less illustrated in FIG. 33. Moreover, it is possible to suppress flare and ghost.

Figure 47:
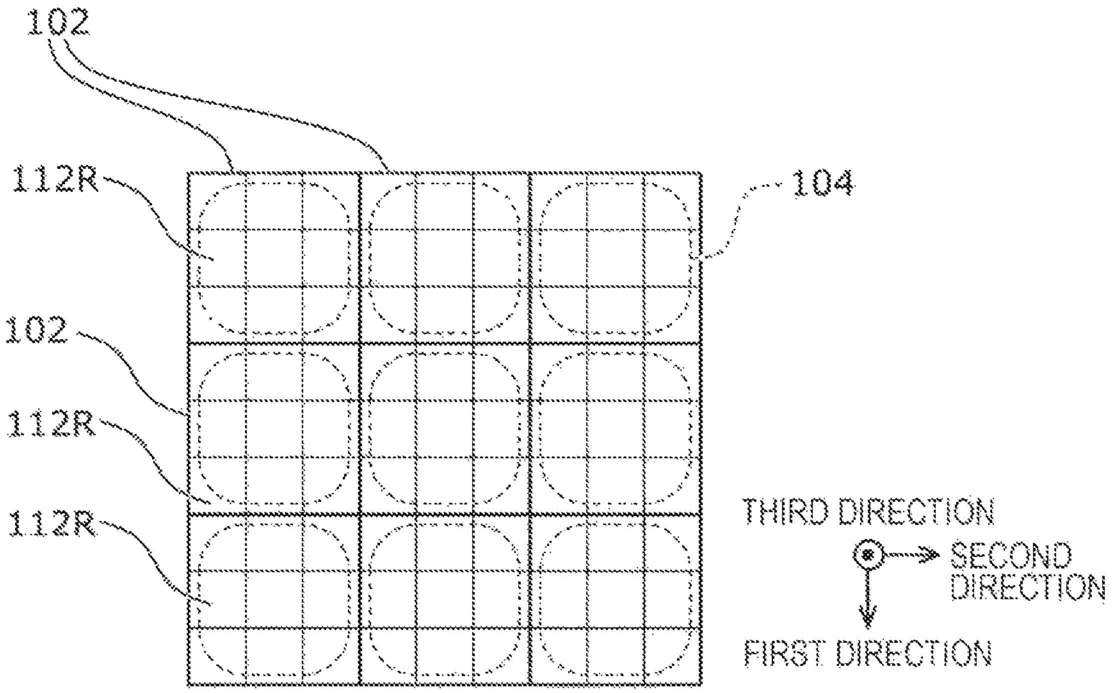
FIG. 47 is a view schematically illustrating an example of filter arrangement according to an embodiment.

FIG. 47 is a plan view illustrating a structure example of the imaging element. As illustrated in FIG. 47, for example, the same red filter 112R is provided for a plurality of pixels 102.

Figure 48:
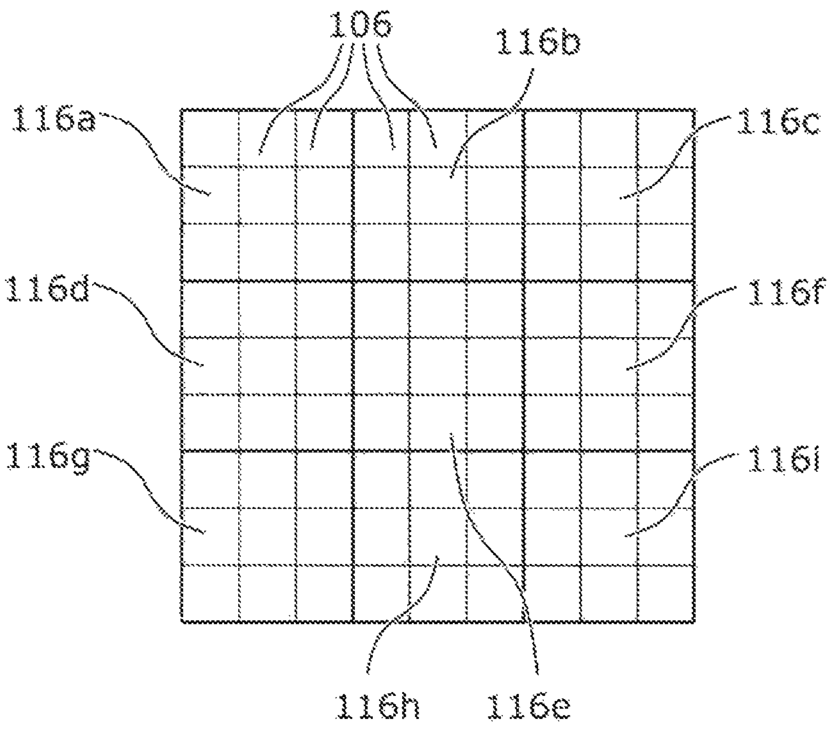
FIG. 48 is a view schematically illustrating an example of filter arrangement according to an embodiment.

FIG. 48 is a plan view illustrating a structure example of the subpixels 106 in the imaging plane view illustrated in FIG. 47. In the imaging element 10, the plasmon filters 116 having the same shape are included in the subpixels 106 included in one imaging element 10. Meanwhile, different imaging elements 10 include different plasmon filters 116.

By providing the filter 112R and the plasmon filter 116 in this manner, it is possible to acquire an image signal to which demosaic processing is easily applied to each subpixel image.

Twenty-Eighth Embodiment

Figure 49:
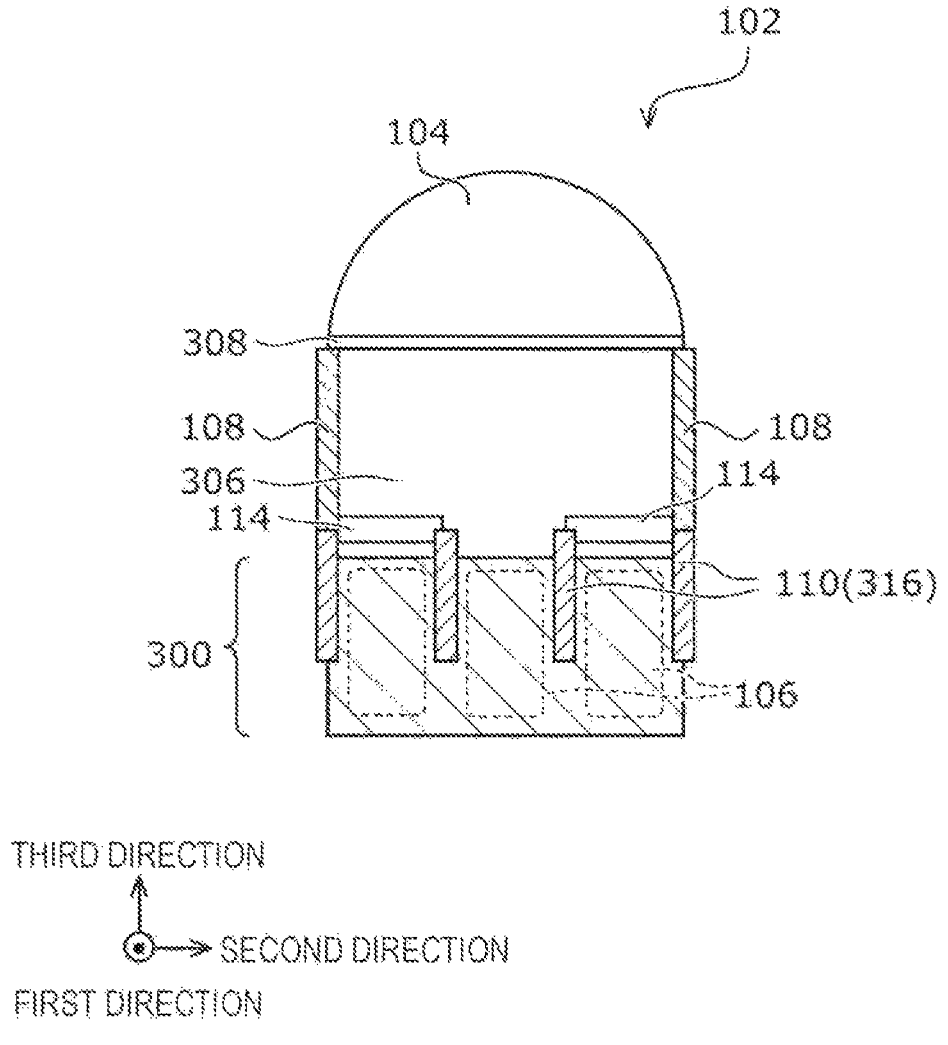
FIG. 49 is a view schematically illustrating an example of filter arrangement according to an embodiment.

FIG. 49 is a cross-sectional view illustrating an example of a structure of an imaging pixel. In regard to FIG. 36 described above, an optical path of a pixel 102 is designed so that a vicinity of an uppermost portion of a metal film 316 is not in focus.

This structure is different in that a beam diameter near the uppermost portion of the metal film 316 is larger than at least one subpixel 106. Even in a case where the structure is combined with a telecentric optical system that is substantially perpendicularly incident on an imaging device, light information can be acquired by a plurality of subpixels 106 in the pixel 102.

As described above, various color filters may be appropriately arranged according to a use. For example, as illustrated in FIGS. 21, 22, 23, 24, 25, 26, and 27, a filter of a different color may be used for each pixel 102. As another example, filters of different colors may be appropriately arranged in one pixel 102 as illustrated in FIGS. 28A, 28B, 29, and 30.

Furthermore, a color filter may be provided for all the pixels 102 included in an imaging element 10, or a color filter may be provided for some of the pixels 102. Moreover, filters may be stacked in an up down direction to have a sensitivity spectrum having a characteristic different from that of each individual color filter.

Note that the subpixel 106 including an organic photoelectric conversion film instead of a color filter may be provided, or a plasmon filter may be provided. As described above, an alternative to the color filter may be used as long as information can be appropriately acquired for each color, that is, for each wavelength of light.

The configurations of these filters can be appropriately selected according to a use, design restriction, and the like. Specific examples have been described in the foregoing embodiments.

For example, the filter 112, the filter 114, or the plasmon filter 116 uses, for example, a pigment or a dye as the material, transmits light of a desired wavelength, and can obtain spectrum information of light from an object. The filter 112 may be provided on, for example, an interlayer film 306, and an adhesion layer 308 also serving as planarization may be provided between the interlayer film 306 and the filter 112.

For example, the filter 114 or the plasmon filter 116 may be provided on the metal film 316, and an adhesion layer also serving as a planarization film may be provided between the metal film 316 and the filter 114 or the plasmon filter 116.

For example, one filter 114 or one plasmon filter 116 may be provided for each subpixel 106, or the filter 114 or the plasmon filter 116 may be different for each subpixel 106. Furthermore, one filter 114 or one plasmon filter 116 having the same configuration may be provided for each pixel 102, and these filters may be different for each pixel 102. The color filter may not be provided placing emphasis on sensitivity and resolution.

Twenty-Ninth Embodiment

Aspects in the present disclosure are not limited to the back-illuminated type in each of the above-described embodiments.

Figure 50:
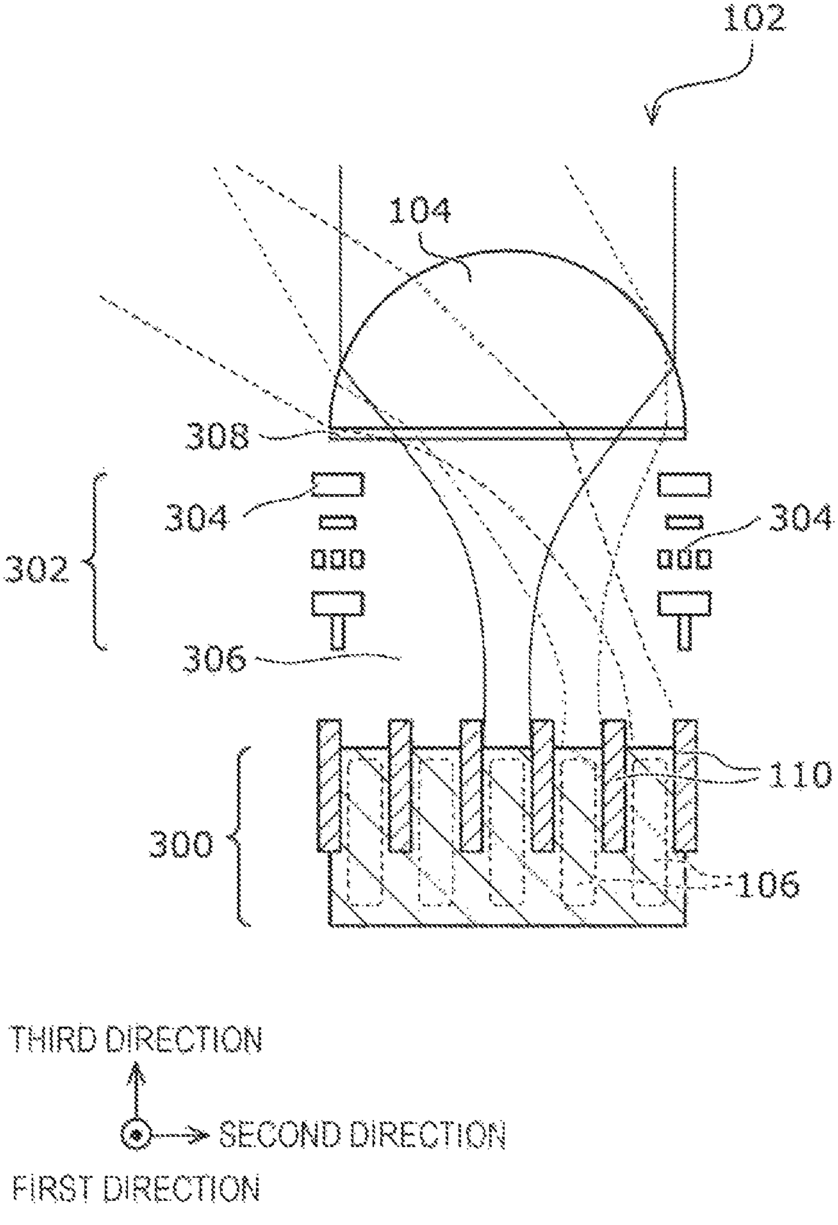
FIG. 50 is a cross-sectional view schematically illustrating an imaging pixel according to an embodiment.

FIG. 50 is a cross-sectional view illustrating a pixel 102 in a front-illuminated imaging element. The front-illuminated sensor has a configuration different from a back-illuminated sensor in that a wiring layer and a pixel transistor are formed on an irradiation surface side. This structure difference will be described.

In the front-illuminated type, although there are some crosstalk paths in gaps between the wirings and between the through-vias, a metal film (wiring 304) of a wiring layer 302 serves as a light-shielding wall 108 in the back-illuminated type.

In the front-illuminated type, an optical path opening under a lens 104 is narrowed by the wiring layer 302. Therefore, in the front-illuminated type, oblique incidence characteristics of the pixel 102 are deteriorated due to vignetting of the wiring 304, as compared with the back-illuminated type having the same pixel size and the same lens configuration.

Moreover, the wiring layer 302 has a necessary specification as a circuit. For this reason, even in a case where it is desirable to reduce the height as the optical path design, it is not possible to freely design as compared with the back-illuminated type.

In the front-illuminated type, a pixel transistor is formed on the irradiation surface side of a semiconductor substrate 300, and is subject to the restriction in a potential design region of the pixel. Note that, although not illustrated, an insulating film 314 is provided on a surface of the semiconductor substrate 300 as in FIG. 7.

In the front-illuminated type, the area and volume of the wiring layer 302 increases when trying to speed up an operation by parallel processing. For this reason, the speed-up, and sensitivity and oblique incidence characteristics are in a trade-off relationship. Meanwhile, in the back-illuminated type, since the wiring layer 302 is arranged not to affect the optical path design, the degree of freedom in wiring design is high.

In the front-illuminated type, since the color filter (filter 114) of the organic film cannot withstand heat due to a formation process of the wiring layer 302, the arrangement of the color filter is limited to the filter 112 on the wiring layer 302. Meanwhile, since the plasmon filter 116 is a metal film, the plasmon filter can be formed at any height of the wiring layer 302, but this affects a wiring capacitance.

In these comparisons, the back-illuminated type is more advantageous in terms of product specifications and characteristics, but the front-illuminated type has an advantage that a support substrate is unnecessary, the number of processes is small, and manufacturing cost is low. The front-illuminated type is often sufficient depending on accuracy required for light reception by the pixel 102 in the imaging element 10. In such a case, the front-illuminated imaging element 10 can be used.

In the following embodiment, the back-illuminated type will be mainly described as an example, but the embodiment is not limited to the back-illuminated type, and for example, the front-illuminated type may be used. Furthermore, stacking of the filters in each of the above-described embodiments can be similarly implemented within a range that can be implemented in the above-described restriction.

Thirtieth Embodiment

In the above description, the pixel 102, the subpixel 106, the filters 112 and 114, and the like have been described. Next, a lens included in the pixel 102 will be described. In each of the above-described embodiments, the case of including the on-chip lens for which etch-back processing is performed in a manufacturing process has been described.

As a lens 104, various lenses can be used in addition to such a lens by etch-back processing. Since the respective lenses have different characteristics, by changing the lenses, it is possible to implement more appropriate control of light collection, diffusion, and the like according to an object to be imaged and a use. The various lens configurations in the following embodiments need not be the same across a pixel array. That is, the type of lens used for each pixel 102 may be changed as necessary.

By combining and mixing various lenses for each pixel 102, the pixels 102 having various characteristics can be formed in the same pixel array. For example, the lens to be used may be changed on the basis of the position of the pixel 102 in the pixel array.

In the present embodiment, a case where a so-called reflow lens is provided will be described as a modification of an on-chip lens. More specifically, a form of a light-shielding structure suitable for variation control of the reflow lens in a case where the reflow lens is provided as the lens 104 will be described.

A method of transferring a lens-shaped resist described in the above-described embodiment to a lens material by the etch-back processing has an advantage of narrowing a gap between lenses by a deposit at the time of etching. That is, the sensitivity can be enhanced by narrowing an ineffective region of the lens.

Meanwhile, according to the Fraunhofer diffraction theory, a spot radius $\omega_0$ when light having a wavelength $\lambda$ is collected can be approximately expressed as follows, where a refractive index n of a medium, a focal length f, and a lens size D are defined.

[Math. 3]

$$\omega_0 = \frac{1.22 f\lambda}{nD} \tag{3}$$

That is, the light can be narrowed as the thickness of the lens is increased and the focal length is shortened, or as the size of the lens is increased. However, when an attempt is made to increase the lens thickness in a similar manner while increasing the lens size, there is a problem that a processing amount of etching for the lens material increases, the deposition in a chamber increases, and maintenance frequency increases. The thickness of the lens is assumed to be limited to, for example, about 3 to 4 μm in terms of device operation.

One of solutions is a reflow lens that forms the lens shape by heat. As a material of the reflow lens, for example, a material obtained by dissolving a resin such as an acrylic resin in a solvent and adding a photosensitizer, for example, an ortho-naphthoquinone diazide compound is already commercially available.

In the reflow lens, it is difficult to narrow a gap with respect to the method using etch-back, and for example, the gap becomes wide at diagonal vertexes. Meanwhile, there are advantages that a thick lens is easily formed, the number of processes is small without requiring etch-back, and the lens material of a PAD portion can be removed by exposure and development.

Figure 51:
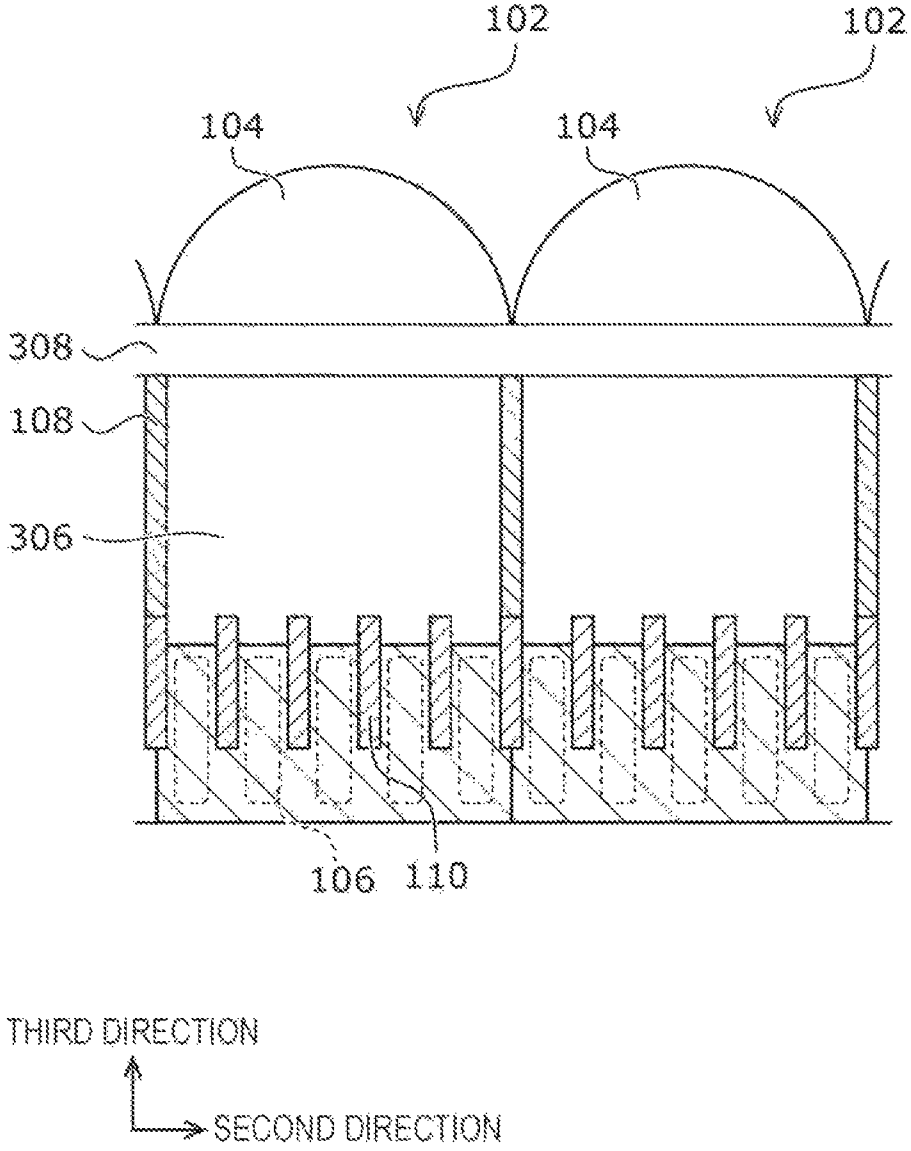
FIG. 51 is a cross-sectional view schematically illustrating imaging pixels according to an embodiment.

FIG. 51 illustrates a cross-sectional view of imaging pixels according to an embodiment. The lens 104 illustrated in FIG. 51 is a reflow lens provided in an adhesion layer 308 that is a substantially flat base. The lens 104 is provided on an interlayer film 306 via the adhesion layer 308. Note that, in the case of the reflow lens, there is a possibility that a boundary between the lenses is not clear as illustrated in the drawing, but also in this case, a large difference does not occur in the following description.

Figure 52:
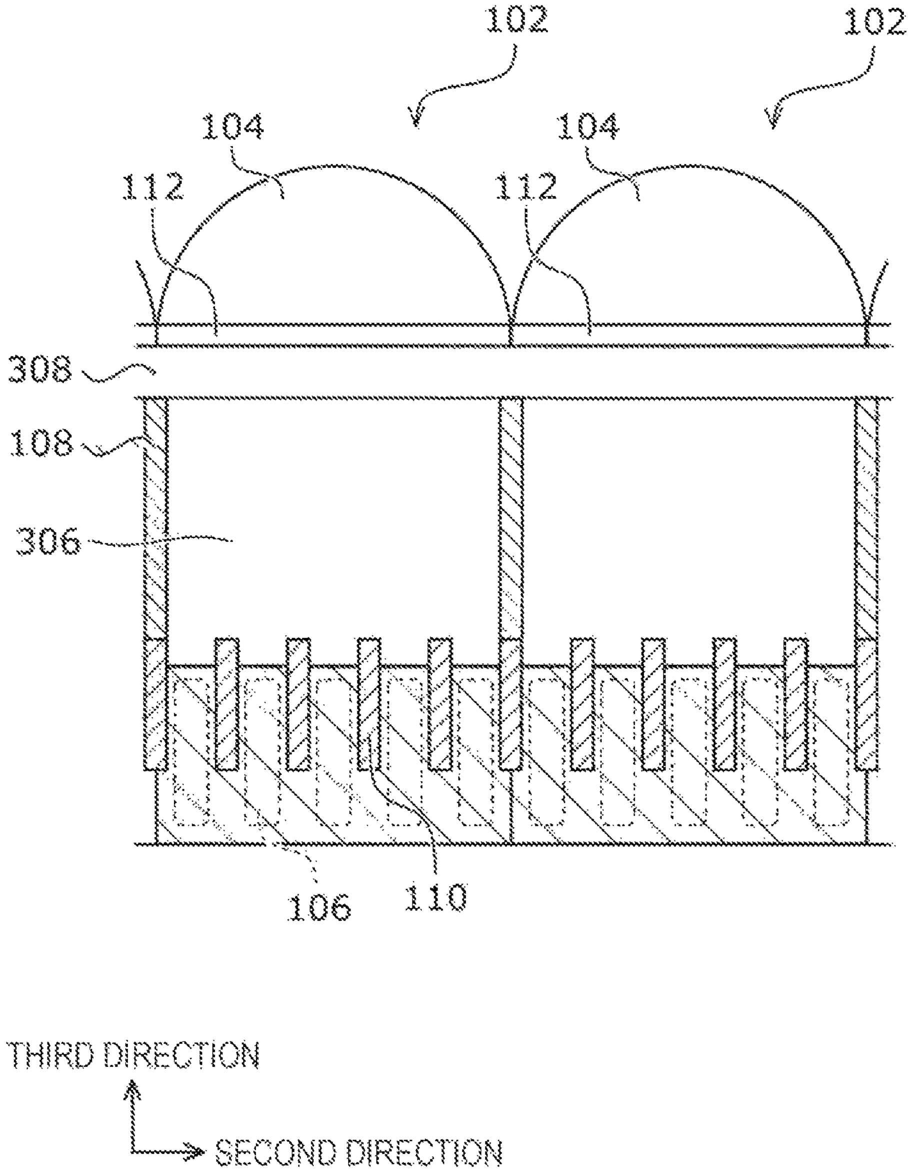
FIG. 52 is a cross-sectional view schematically illustrating imaging pixels according to an embodiment.

FIG. 52 illustrates a cross-sectional view of imaging pixels according to an embodiment. The configuration of FIG. 52 is a configuration including a filter 112 in the configuration of FIG. 51. In this way, the filter 112 may be provided on the basis of the above-described embodiments for the pixel 102. In the case where the filter 112 is provided, as illustrated in the drawing, the filter 112 may be provided between the adhesion layer 308 and the lens 104 that is the reflow lens. As another example, the filter 112 may be provided between the adhesion layer 308 and the interlayer film 306.

As illustrated in FIGS. 51 and 52, the reflow lens may be provided as the lens 104 similarly to the etch-back lens.

Figure 53:
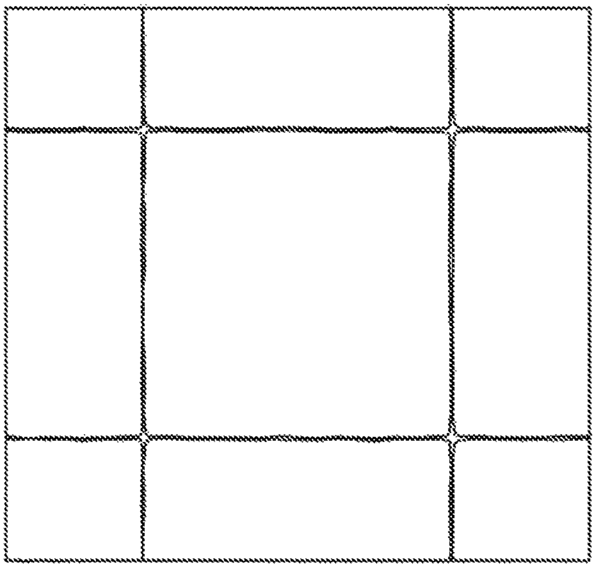
FIG. 53 is a plan view of an example of an etch-back lens.
Figure 54:
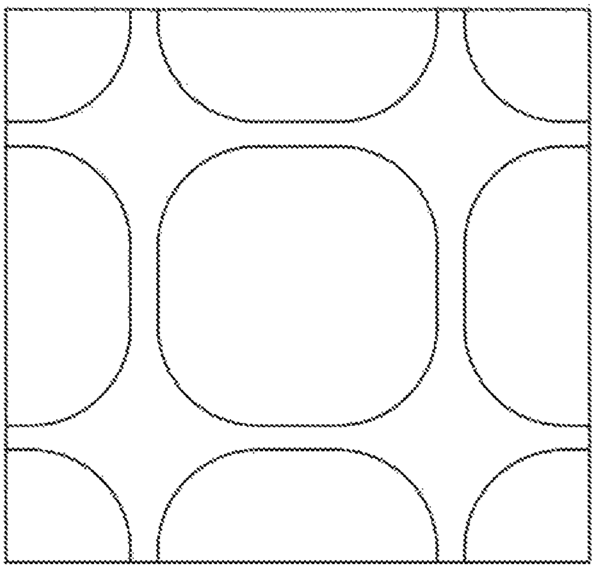
FIG. 54 is a plan view of an example of a reflow lens.

FIG. 53 is a plan view illustrating an example of a micro-lens array of the etch-back lens. In contrast, FIG. 54 is a plan view illustrating an example of a micro-lens array of the reflow lens. In FIG. 53, the lens array is formed such that there is almost no gap between the lenses. In contrast, in FIG. 54, the gap between the lenses is formed wide.

In the case where the micro-lens array is formed by the reflow lens, shape reproducibility may be poor due to variations in heat treatment. Furthermore, it cannot be said that the material of the reflow lens and silicon oxide have good adhesion. Therefore, as illustrated in FIGS. 51 and 52, the adhesion layer 308 may be formed between the reflow lens and the interlayer film 306 so as to bring the lens 104 and the interlayer film 306 into close contact with each other. The adhesion layer 308 may be deteriorated by coming into contact with metal. For this reason, a transparent inorganic film (not illustrated) such as silicon oxide may be provided under the adhesion layer 308 so as not to cause alteration.

Figure 55:
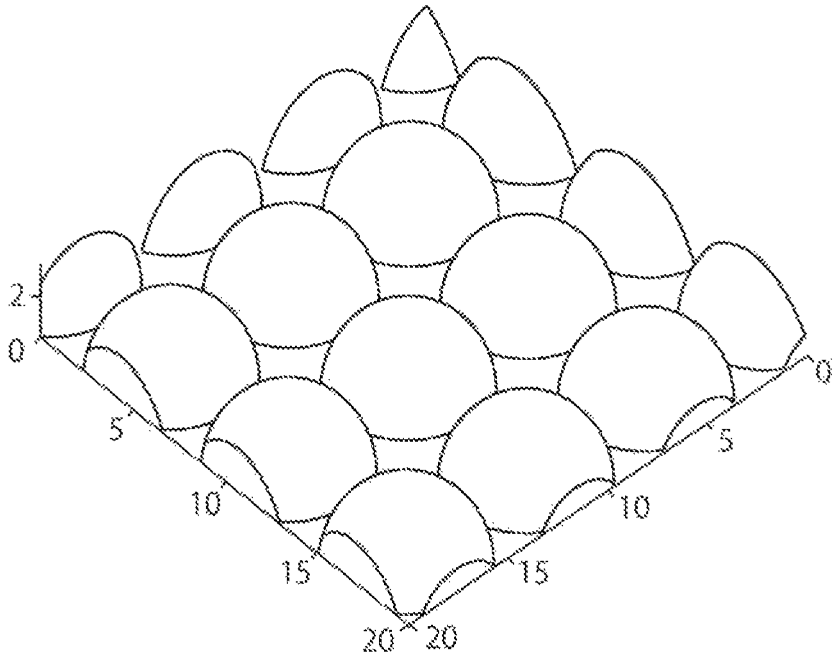
FIG. 55 is a perspective view illustrating an AFM image of an example of a reflow lens.

FIG. 55 is a schematic view of an atomic force microscopy (AFM) image of the micro-lens array by the reflow lens. For example, by providing the adhesion layer 308, it is possible to form the micro-lens array by the reflow lens as illustrated in FIG. 55. To improve the above-described shape reproducibility, it is also possible to arrange a wall such that a space between the lens 104 and the adjacent lens 104 is not filled by the heat treatment.

As described above, according to the present embodiment, the pixel 102 may include the reflow lens as the lens 104. By using various lenses, it is possible to control the characteristics such as sensitivity and angular resolution, and to implement suppression of an increase in size of the imaging element 10 and the like. As an example, the reflow lens may be used. By appropriately designing the lens 104 according to the use, various uses can be made according to the use of the electronic device 1.

Furthermore, the same lens may not be used over the pixel array of the imaging element 10, and lenses using various methods may be mixed. For example, the lens to be used may be changed on the basis of the position of the pixel 102 in the pixel array.

Hereinafter, examples of various lenses will be further described. First, application of the shape of the pixel 102 to the reflow lens will be described.

Thirty-First Embodiment

Figure 56:
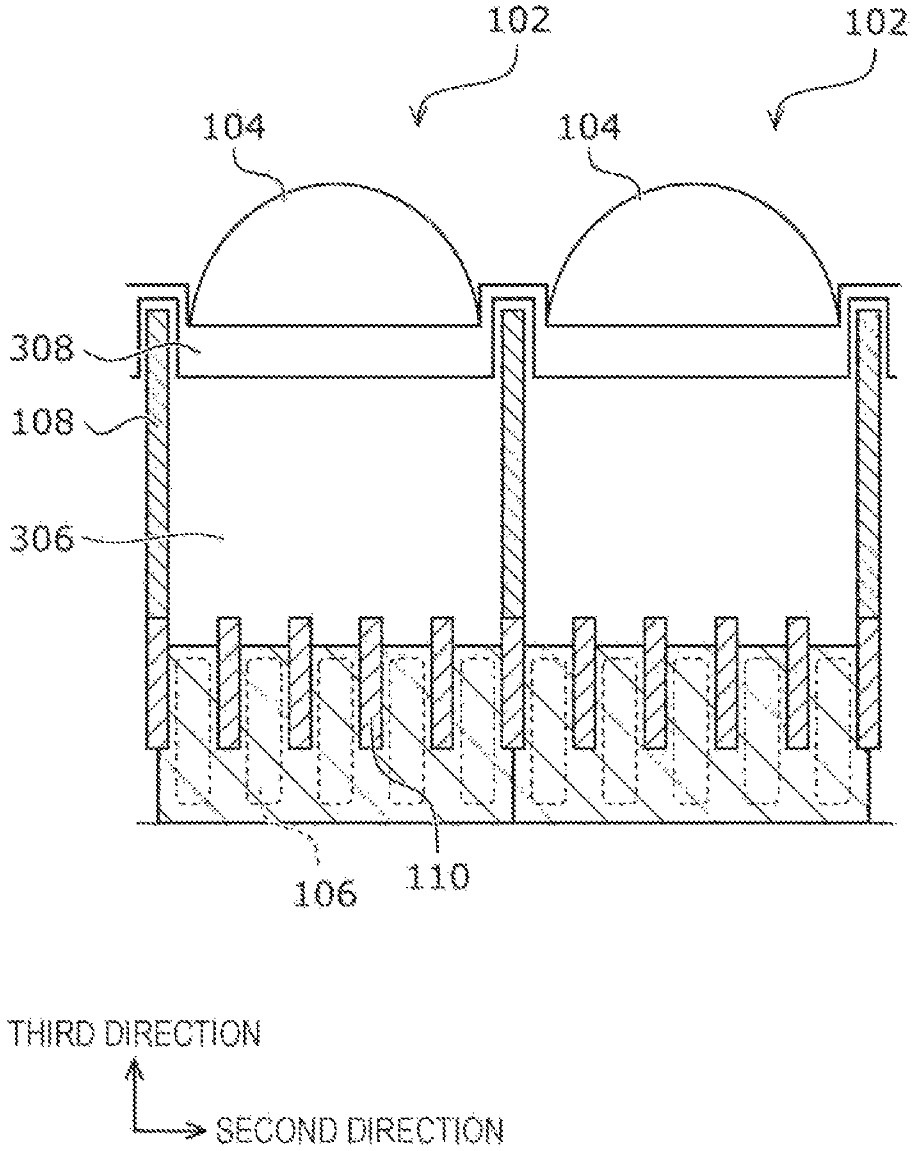
FIG. 56 is a cross-sectional view schematically illustrating imaging pixels according to an embodiment.

FIG. 56 illustrates a cross-sectional view of imaging pixels according to an embodiment. A pixel 102 illustrates an example of an embodiment including a bank (lens isolation portion) including a metal film with respect to a lens 104. An adhesion layer 308 is, for example, an insulator, but hatching is omitted. For example, the pixel 102 includes a reflow lens as the lens 104. For example, this embodiment differs from FIG. 51 in that a lens material is dammed by the bank in reflow processing. That is, a wall is provided between the lenses 104 of the adjacent pixels 102 to avoid contact with the adjacent lenses 104.

With this bank, the shape of the lens 104 can be stabilized. Moreover, by providing the metal film in the bank portion, light-shielding performance can be enhanced and stray light can be suppressed. In the case where the bank portion is provided with the metal film, a film forming process can be made common by using the same material as the metal embedded in a light-shielding wall 108 as the metal film.

Figure 57:
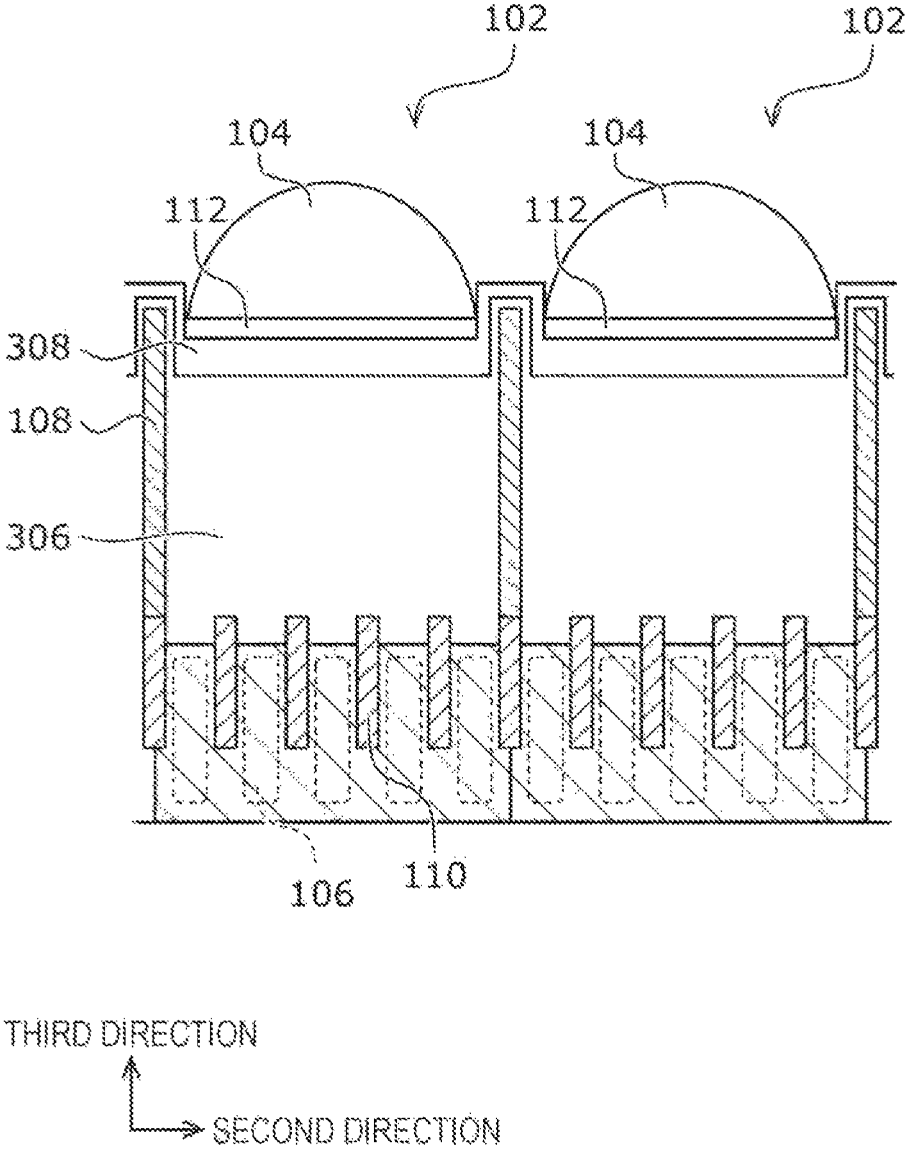
FIG. 57 is a cross-sectional view schematically illustrating imaging pixels according to an embodiment.

FIG. 57 illustrates a cross-sectional view of imaging pixels according to an embodiment. Basically, similarly to FIG. 56, the bank portion having the metal film between the lenses 104 is provided. The imaging pixel in FIG. 57 includes a filter 112. The filter 112 may be provided between the bank portions, that is, immediately below the lens 104.

As illustrated in FIGS. 56 and 57, the bank between the lenses 104 is formed by deforming the adhesion layer 308 and an interlayer film 306 as an example. Then, a metal film serving as a bone may be provided, and the metal film may be formed integrally with the light-shielding wall 108.

Figure 58:
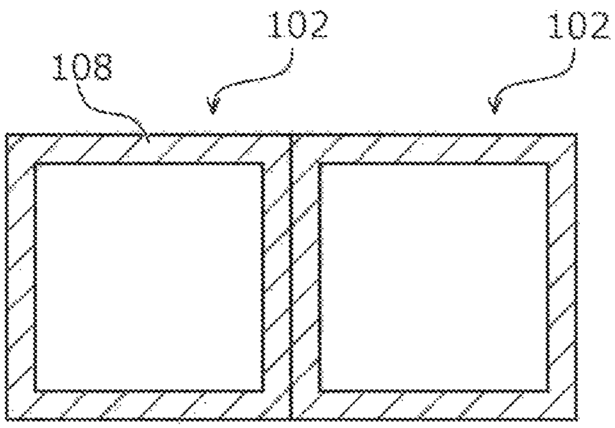
FIG. 58 is a plan view schematically illustrating imaging pixels according to an embodiment.
Figure 59:
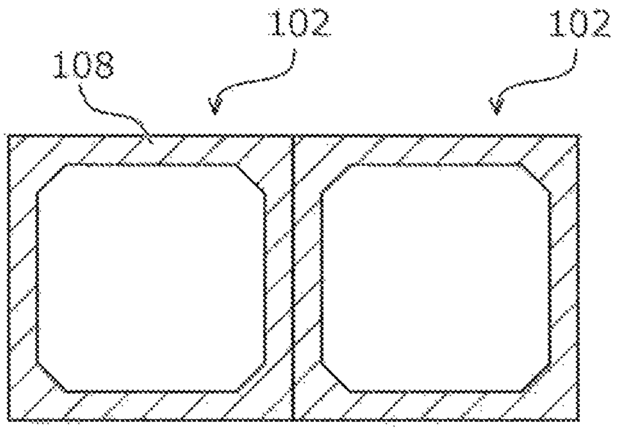
FIG. 59 is a plan view schematically illustrating imaging pixels according to an embodiment.
Figure 60:
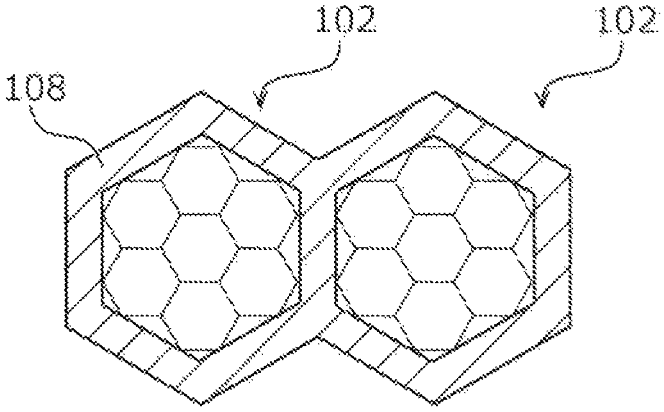
FIG. 60 is a plan view schematically illustrating imaging pixels according to an embodiment.

FIGS. 58, 59, and 60 are plan views of imaging pixels according to an embodiment. For example, FIGS. 56 and 57 illustrate examples of bank shapes viewed from directly above.

In FIG. 58, the bank is formed with a rectangular opening. The vicinity of a side center of the bank exhibits a damming effect. Meanwhile, in a diagonal portion, the lens material does not reach the bank, a gap causes stray light, and the lens shape may vary. However, this rectangular bank shape is advantageous in terms of area in terms of sensitivity.

In FIG. 59, the bank is formed at a boundary of the pixels 102 so as to trace the shape of an ineffective region of the lens 104 viewed from the top. Since the lens material is dammed over the entire bank, the shape of the lens 104 is stabilized. Furthermore, there is also an advantage that the metal film (for example, a part of the light-shielding wall 108) included in the bank can effectively suppress the stray light from the gap portion. As an example, an example in which the cross-sectional result acquired by the AFM is approximated by an octagonal shape has been described, but the present embodiment is not limited thereto, and for example, the bank may be formed in a rectangular shape having a rounded corner in an arc shape.

FIG. 60 is characterized in that the pixel 102 has a shape close to a circle, for example, a hexagonal shape, and includes the bank in a shape close to a circle. It is an advantage that all boundaries are obtuse and denseness of the reflow lens with poor pattern fidelity is increased. For example, in a case where subpixels 106 and the pixel 102 are formed in a hexagonal shape as illustrated in FIG. 19, it is possible to effectively form the reflow lens by forming the bank in such a shape.

Note that the structure including the bank having the light-shielding property illustrated in FIGS. 58, 59, and 60 is not limited to the reflow lens. For example, the structure may be provided in the lens 104 by etch-back processing in the above-described embodiment. Also in this case, the light-shielding performance can be similarly enhanced.

Figure 61:
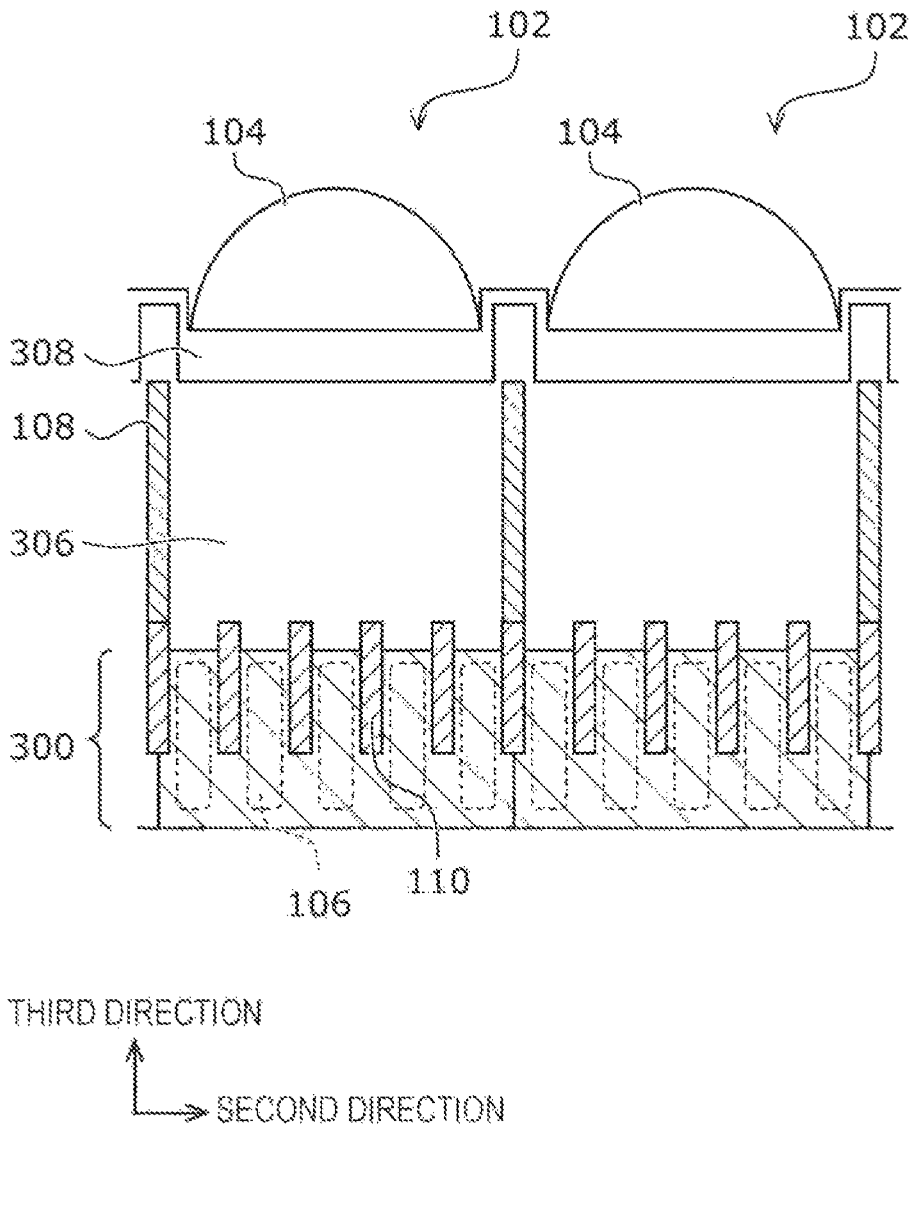
FIG. 61 is a cross-sectional view schematically illustrating imaging pixels according to an embodiment.

FIG. 61 illustrates a cross-sectional view of imaging pixels according to an embodiment. The pixel 102 includes, for example, a bank including only a transparent material with respect to the reflow lens. Such a configuration is inferior in the light-shielding property to the lens isolation portion illustrated in FIG. 56, but can suppress a sensitivity loss. Since the shape of the bank in plan view viewed from the top overlaps with the state of the pixel 102 illustrated in FIG. 58, 59, or 60, description thereof is omitted.

Figure 62:
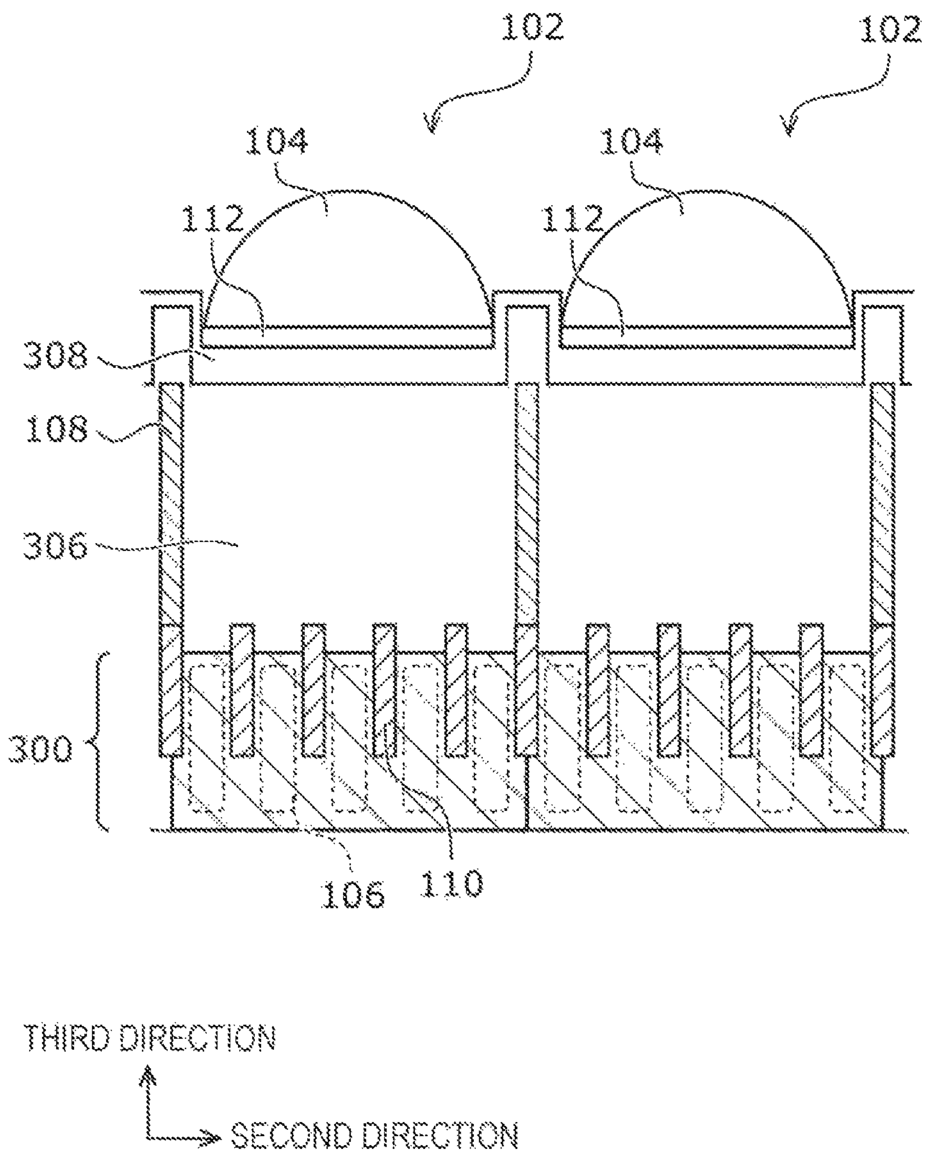
FIG. 62 is a cross-sectional view schematically illustrating imaging pixels according to an embodiment.

FIG. 62 illustrates a cross-sectional view of imaging pixels according to an embodiment. The pixel 102 in FIG. 61 includes the filter 112. Also in the example of FIG. 62, a bank made only of a transparent material is provided, similarly to the example of FIG. 61. Similarly, according to such a configuration, the light-shielding property is inferior to that of the lens isolation portion having the light-shielding wall 108, but the sensitivity loss can be suppressed.

Figure 63:
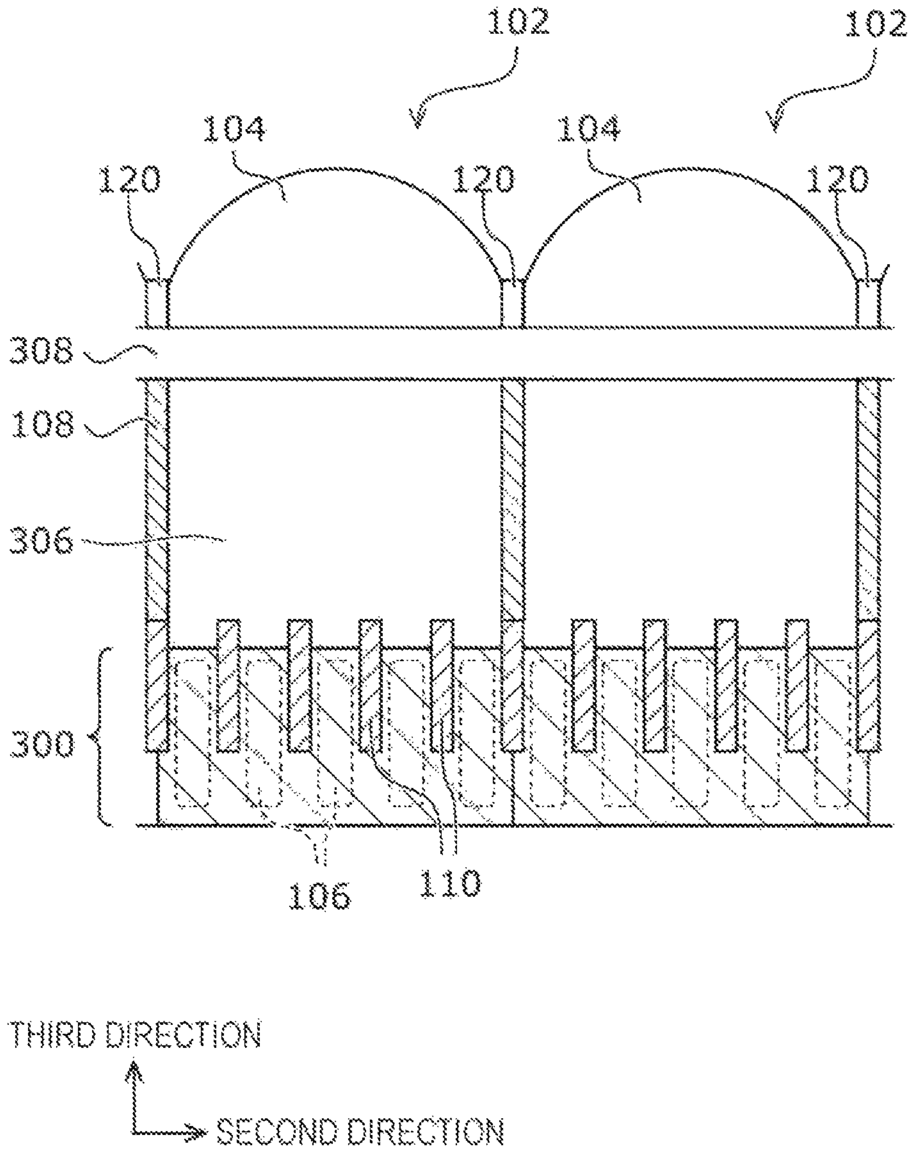
FIG. 63 is a cross-sectional view schematically illustrating imaging pixels according to an embodiment.

FIG. 63 illustrates a cross-sectional view of imaging pixels according to an embodiment. The pixel 102 includes a lens isolation portion 120 on the adhesion layer 308. The lens isolation portion 120 has a similar effect to the above-described bank in the present embodiment.

The pixel 102 includes, as the lens isolation portion 120, a bank mainly including a light-shielding material having photosensitivity to the reflow lens, for example, a carbon black resist. As compared with the bank portion including the metal film of FIG. 56, the light-shielding property is slightly inferior but manufacturing processes can be reduced. A plan view of the bank shape viewed from above overlaps with FIG. 58 or the like, and is thus omitted.

Figure 64:
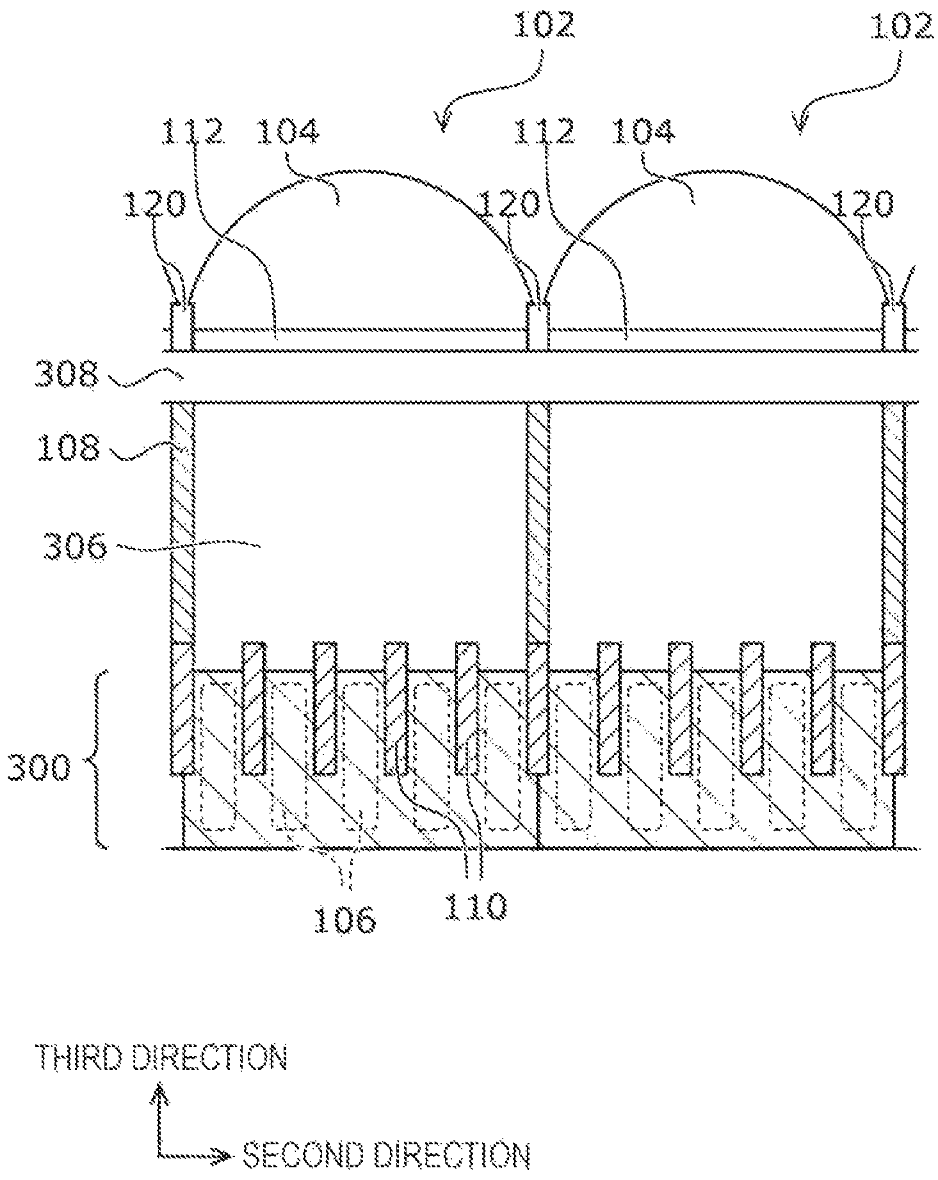
FIG. 64 is a cross-sectional view schematically illustrating imaging pixels according to an embodiment.

FIG. 64 illustrates a cross-sectional view of imaging pixels according to an embodiment. As illustrated in this drawing, the lens isolation portion 120 may be provided between the filters.

Figure 65:
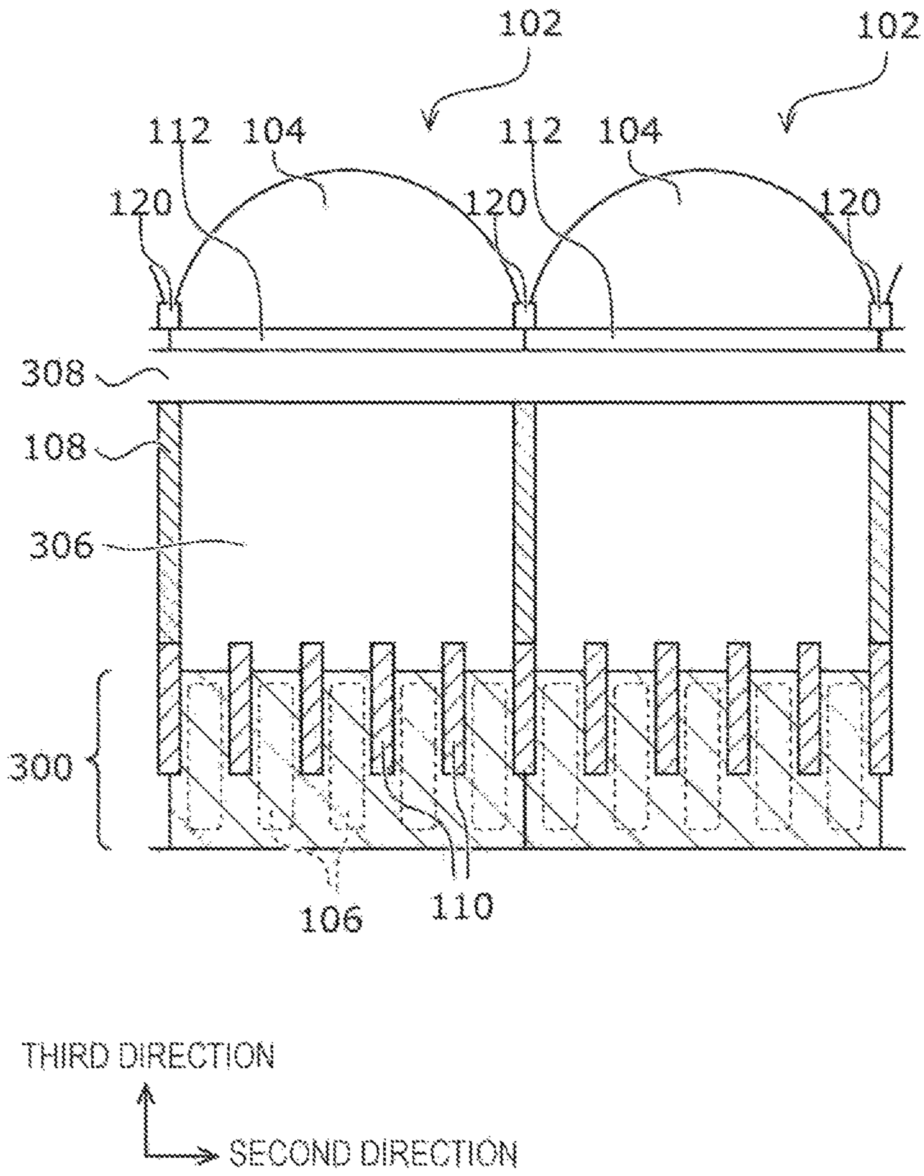
FIG. 65 is a cross-sectional view schematically illustrating imaging pixels according to an embodiment.

FIG. 65 illustrates a cross-sectional view of imaging pixels according to an embodiment. The lens isolation portion 120 may be provided on the filter as illustrated in this drawing.

Similarly to the above, the configuration including the lens isolation portion 120 having the light-shielding property as illustrated in FIGS. 63, 64, and 65 is formed for stabilizing the lens shape in the case of using the reflow lens as the lens 104 as an example, but is not limited thereto. For example, in the case of the lens 104 formed by etch-back as in the above-described embodiment, it is possible to exhibit an effect of suppressing crosstalk by including the lens isolation portion 120.

As described above, as in the present embodiment, the lens isolation portion can also be formed between the lenses 104 of the adjacent pixels 102. By forming the lens isolation portion, for example, the shape of the reflow lens can be stabilized. Furthermore, by providing the metal film or the like, or by providing the lens isolation portion including a material having low transmittance, the effect of suppressing crosstalk between the pixels 102 can be exhibited, as described above. In addition, various forms of exhibiting the effect of suppressing the sensitivity loss are also as described above.

Thirty-Second Embodiment

Figure 66:
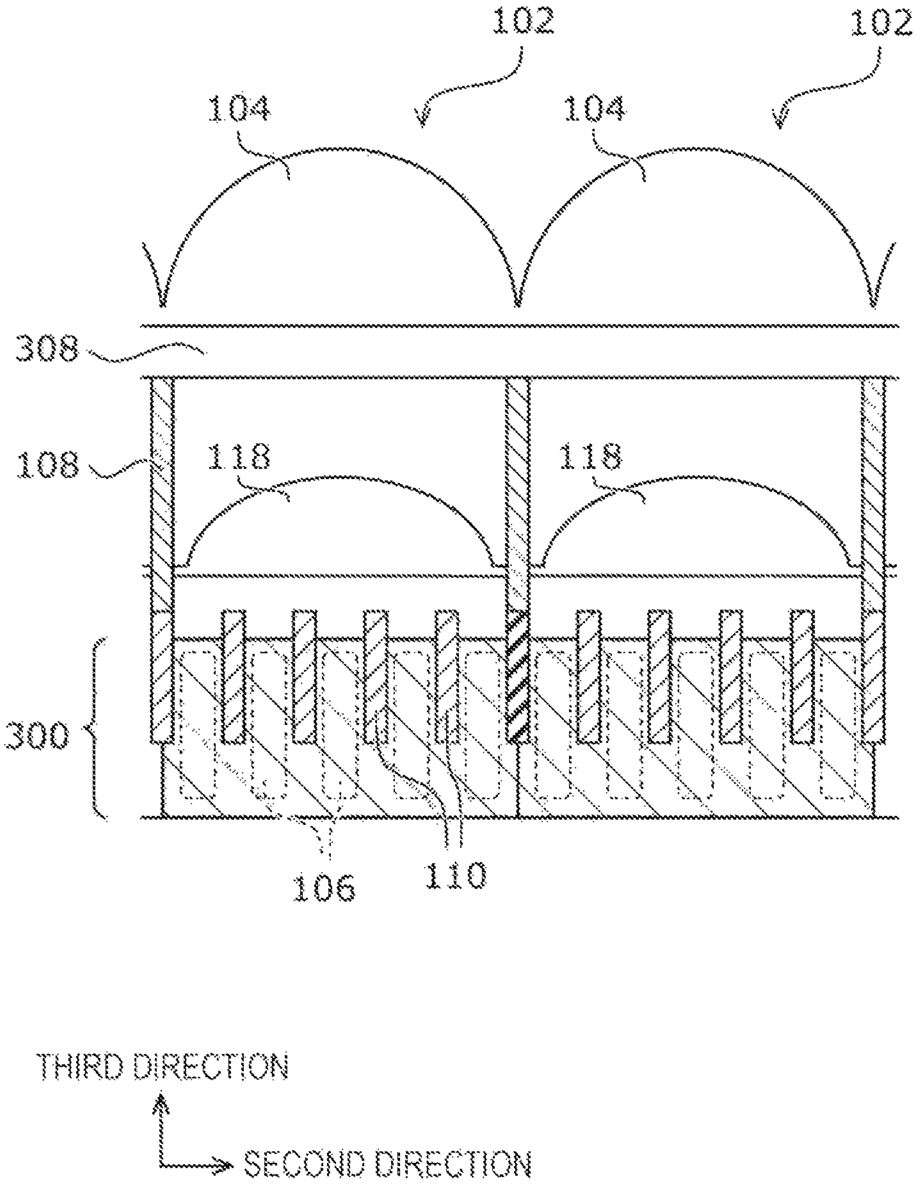
FIG. 66 is a cross-sectional view schematically illustrating imaging pixels according to an embodiment.

FIG. 66 illustrates a cross-sectional view of imaging pixels according to an embodiment. This drawing is a view illustrating another configuration of a lens included in a pixel 102. In the present embodiment, the pixel 102 includes a lens 104 as an on-chip lens similarly to each of the above-described embodiments, and may further include a lens in the pixel 102. That is, an inner lens 118 is provided between the subpixel 106 and the lens 104.

By providing the inner lens 118 as in the present embodiment, the pixel 102 can form an image of light incident via the lens 104 on the subpixel 106 at a short distance. By reducing a focal length of the lens, a spot radius $\omega_0$ of the collected light of the pixel 102 can be reduced according to the Fraunhofer diffraction theory (Equation (3))

Note that FIG. 66 illustrates the structure in which light is incident on a photoelectric conversion element of each subpixel 106 via two lenses, but the present embodiment is not limited to the structure. For example, light may be incident via three or more lenses.

Thirty-Third Embodiment

Some forms will be described as examples of the inner lens 118 in the above-described embodiment.

Figure 67:
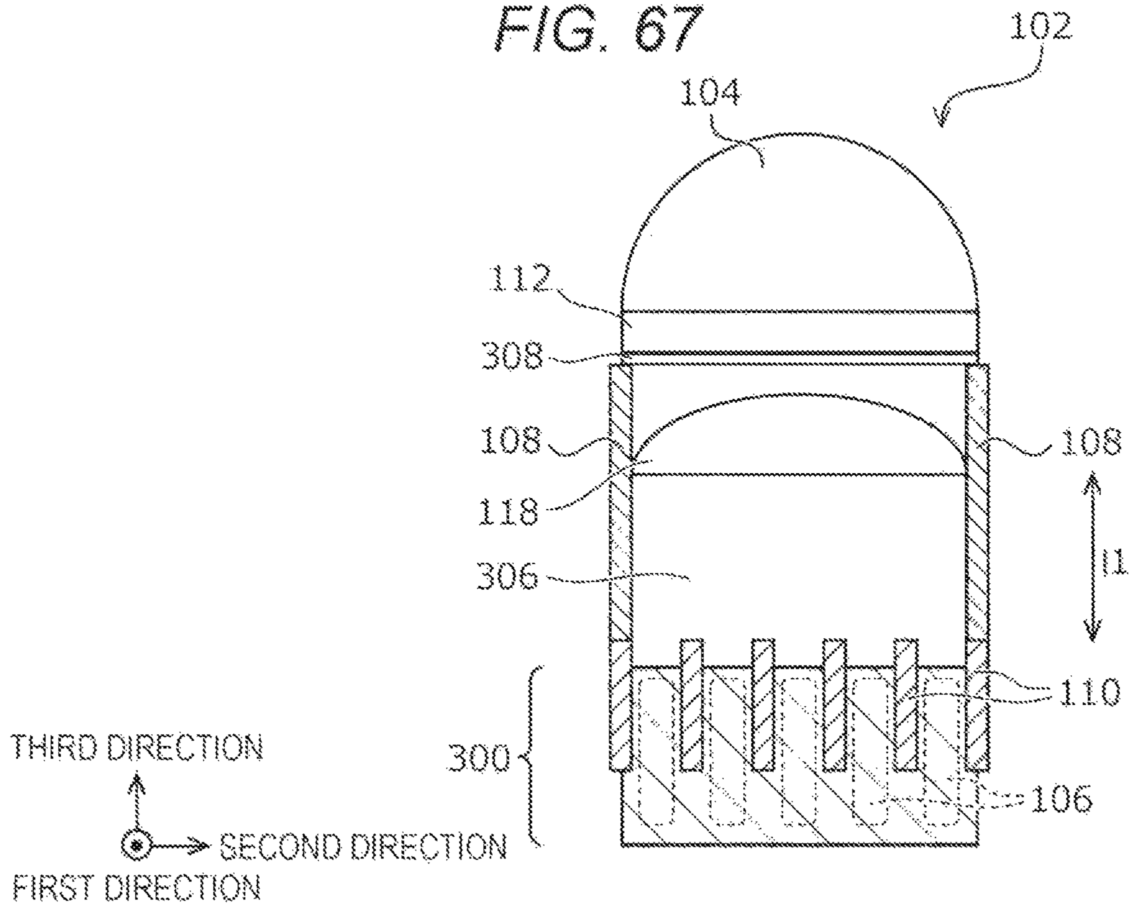
FIG. 67 is a cross-sectional view schematically illustrating an imaging pixel according to an embodiment.

FIG. 67 is a cross-sectional view illustrating an example of a case where an imaging element 10 according to an embodiment includes an inner lens. In the case where the imaging element 10 includes the inner lens, oblique incidence characteristics of light beams in the imaging element 10 can be controlled by changing the distance from the inner lens to a light receiving element.

Hereinafter, description of arrangement of filters 112 and 114 and plasmon filter 116 described in the above-described embodiment is omitted, but even in the case where the inner lens is provided, these filters can be appropriately provided.

As described above, the imaging element 10 includes the inner lens 118 in addition to the configuration of each of the above-described embodiments. Incident characteristics of light incident through the lens 104 with respect to a subpixel 106 changes depending on the position of the inner lens 118. For example, characteristics of obliquely incident light change.

In FIG. 67, for example, as in FIG. 6, the inner lens 118 is arranged such that the light vertically incident on the pixel 102 from a third direction is incident on an entire surface of the subpixel 106 located at a center of the pixel 102. A distance of the inner lens 118 from a photoelectric conversion element isolation portion 110 in this case is set to 11.

Figure 75:
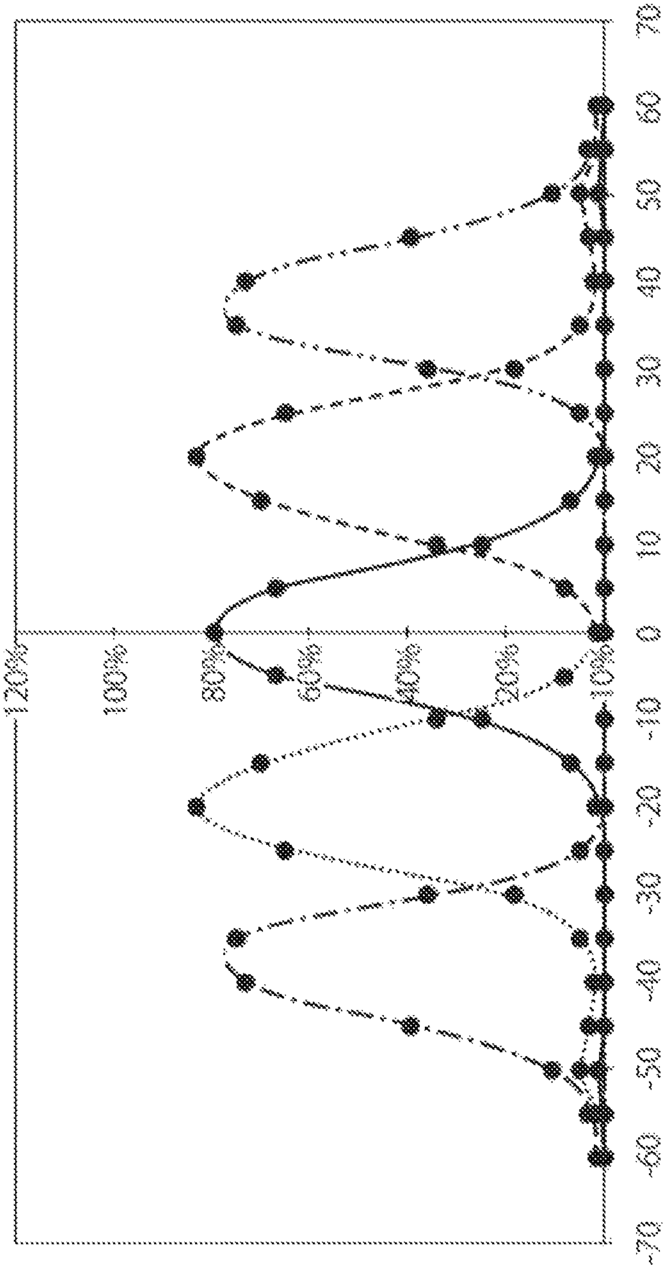
FIG. 75 is a graph illustrating sensitivity for each subpixel according to an embodiment.

Note that, in the description up to FIG. 75, the distance (the film thickness of the interlayer film 306) between the inner lens 118 and the photoelectric conversion element isolation portion 110 is changed, but the present embodiment is not limited thereto. For example, a distance between an adhesion layer 308 and the inner lens 118 (the film thickness of the interlayer film 306) may be appropriately changed, or both the distances may be changed.

Figure 68:
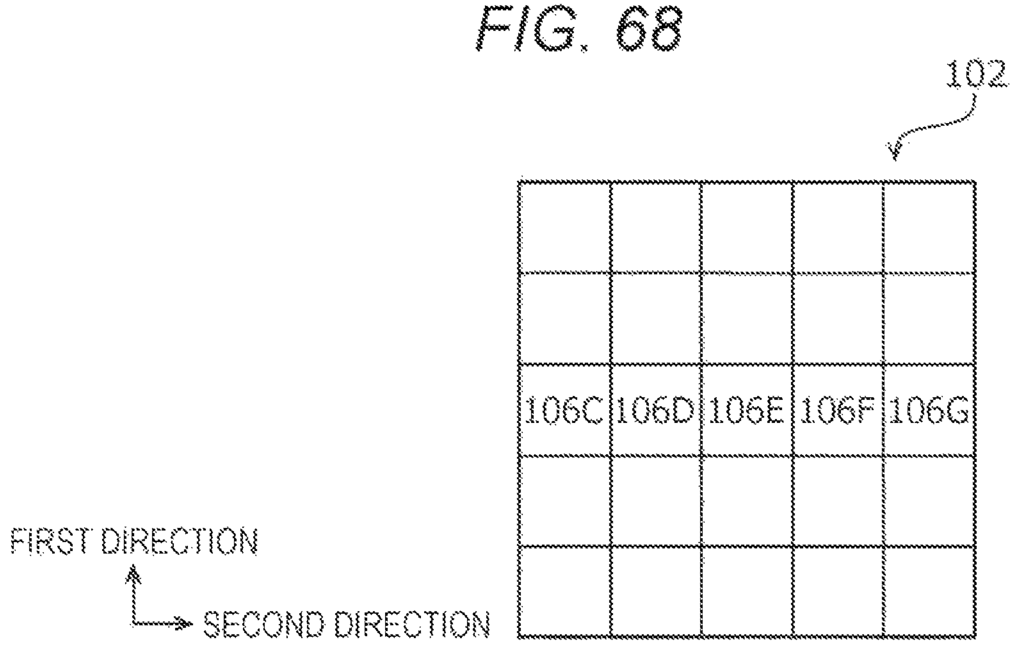
FIG. 68 is a plan view illustrating arrangement of subpixels according to an embodiment.

FIG. 68 illustrates an arrangement of subpixels 106 used in the following description. The subpixels 106 located at the center of the pixel 102 in a first direction will be described as subpixels 106C, 106D, 106E, 106F, and 106G along a second direction.

Figure 69:
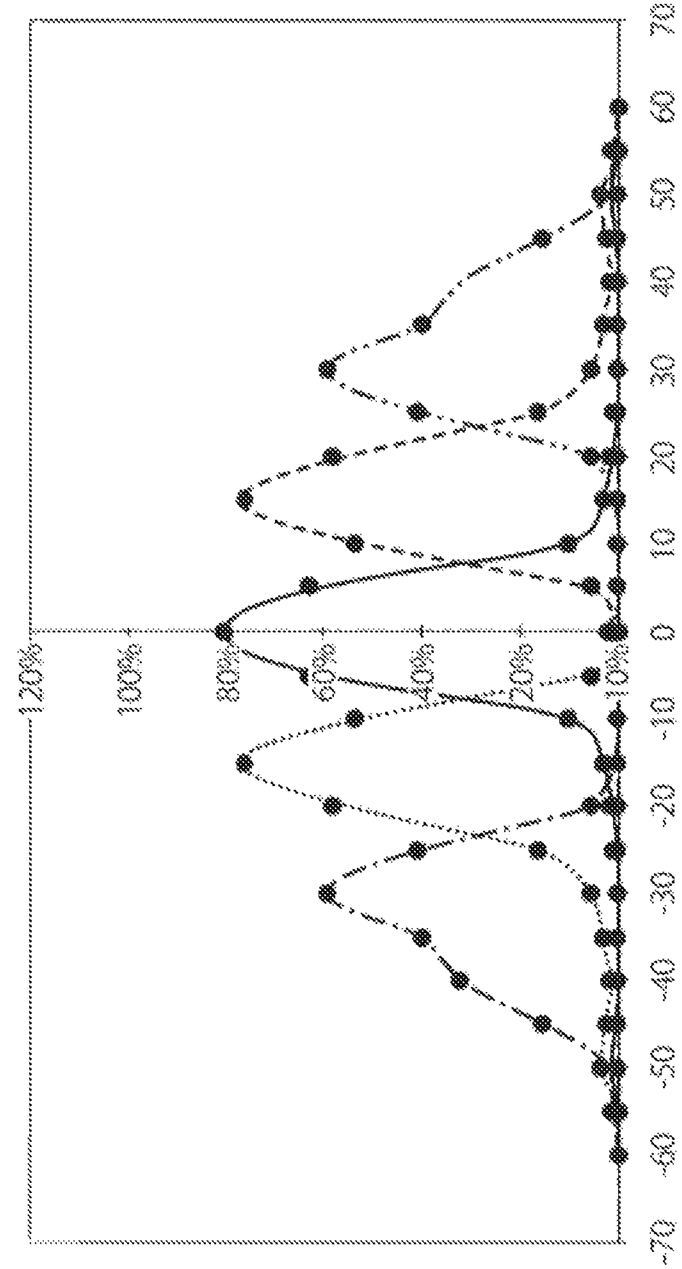
FIG. 69 is a graph illustrating sensitivity for each subpixel according to an embodiment.

FIG. 69 is a graph illustrating light receiving characteristics of the subpixel 106 in the case where the inner lens 118 is provided as illustrated in FIG. 67. As a non-limiting example, the size of the pixel 102 is 6 μm, and the pixel 102 includes 5×5=25 subpixels 106 of 1.2 μm.

As illustrated in FIG. 67, the imaging element 10 includes the inner lens 118 in the pixel 102, and a metal film 316 is embedded in the photoelectric conversion element isolation portion 110. The solid line indicates sensitivity of the subpixel 106E, the dotted line indicates sensitivity of the subpixel 106D, the broken line indicates sensitivity of the subpixel 106F, the alternate long and short dash line indicates sensitivity of the subpixel 106C, and the alternate long and two short dashes line indicates sensitivity of the subpixel 106G in FIG. 68.

The vertical axis of the graph defines an incident angle in the second direction with 0 deg sensitivity of the pixel 102 without subpixel division as a normalization factor. The influence of a decrease in the number of photons per unit area of the incident light by cos θ is returned and corrected.

As illustrated in FIG. 69, the sensitivity of the subpixel 106G located at the center decreases toward an outside of the pixel 1102.

Thirty-Fourth Embodiment

Figure 70:
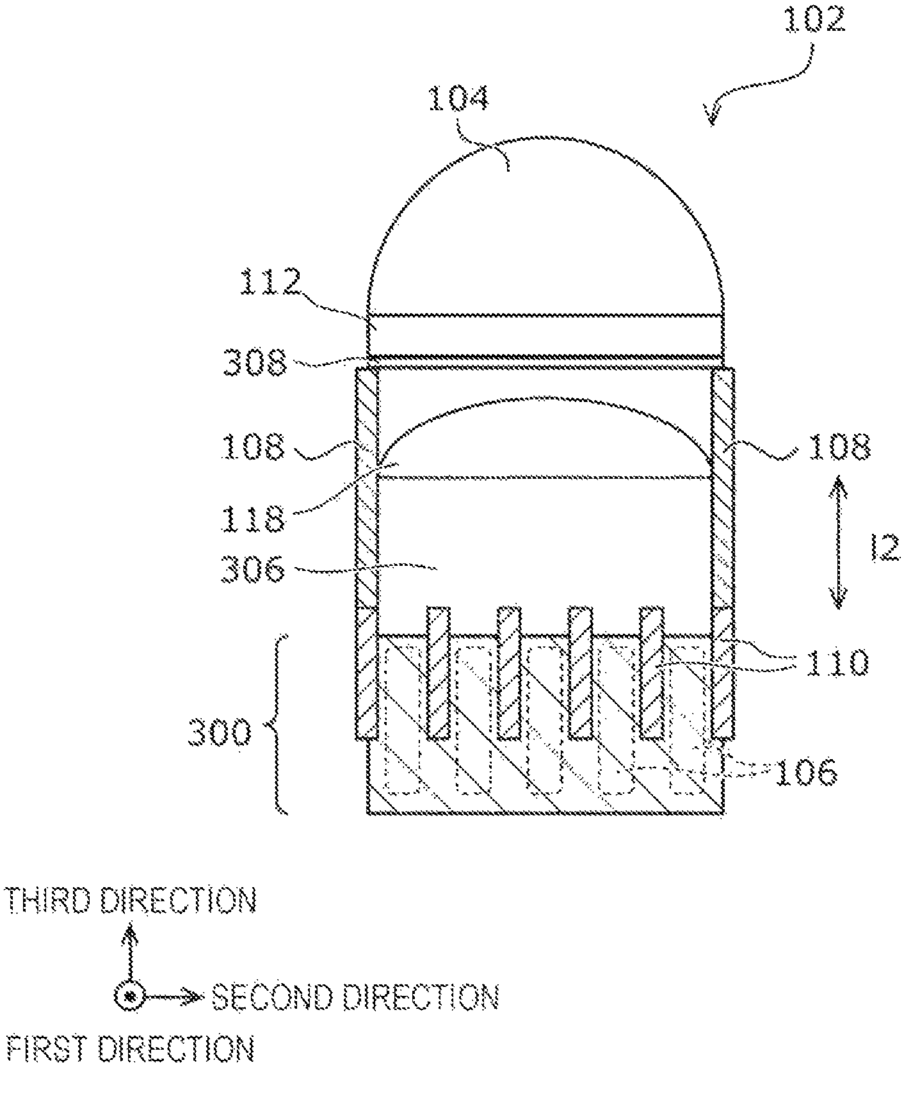
FIG. 70 is a cross-sectional view schematically illustrating an imaging pixel according to an embodiment.

FIG. 70 is a cross-sectional view illustrating an example of a case where an imaging element 10 according to an embodiment includes an inner lens 118. In the present embodiment, an optical path is designed so that a vicinity of an uppermost portion of a metal film 316 is in focus in a subpixel 106E at a center of a pixel 102. For example, the optical path is implemented by changing 11 in FIGS. 67 to 12.

Figure 71:
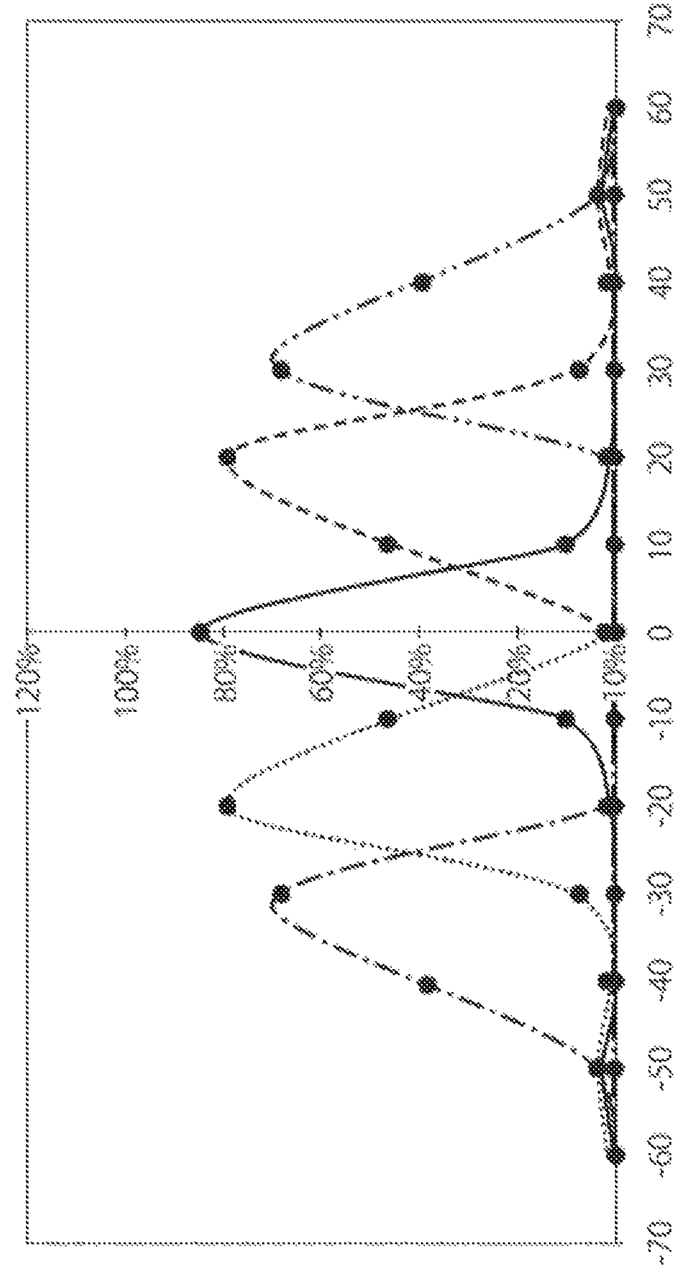
FIG. 71 is a graph illustrating sensitivity for each subpixel according to an embodiment.

FIG. 71 is a graph illustrating sensitivity in the case of FIG. 70. Although the variation between the subpixels 106 increases, there is an advantage that an image having a high resolution can be acquired at the center.

Thirty-Fifth Embodiment

Figure 72:
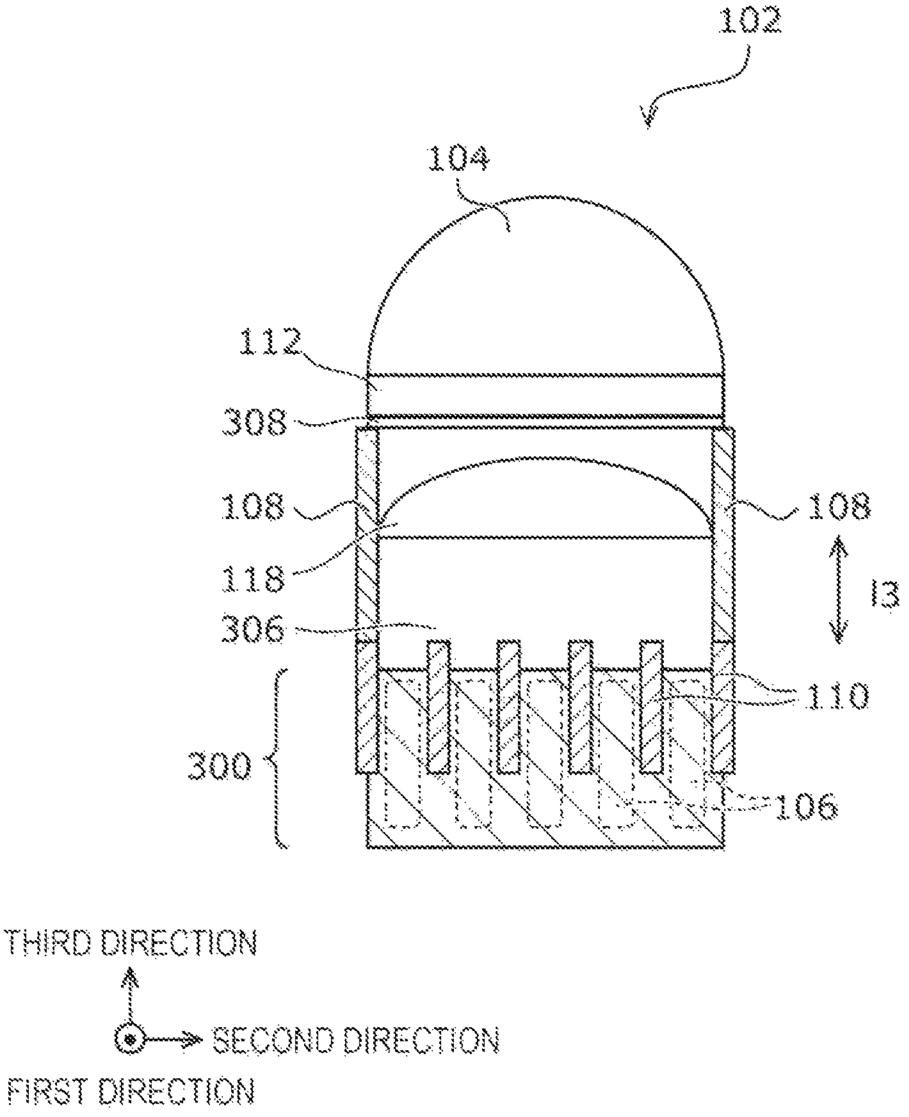
FIG. 72 is a cross-sectional view schematically illustrating an imaging pixel according to an embodiment.

FIG. 72 is a view illustrating a case where the distance between the inner lens 118 and the photoelectric conversion element isolation portion 110 is separated by a distance 13 that is between a distance 14 to be an end of the pixel 102 and a distance 12 in FIG. 70.

Figure 73:
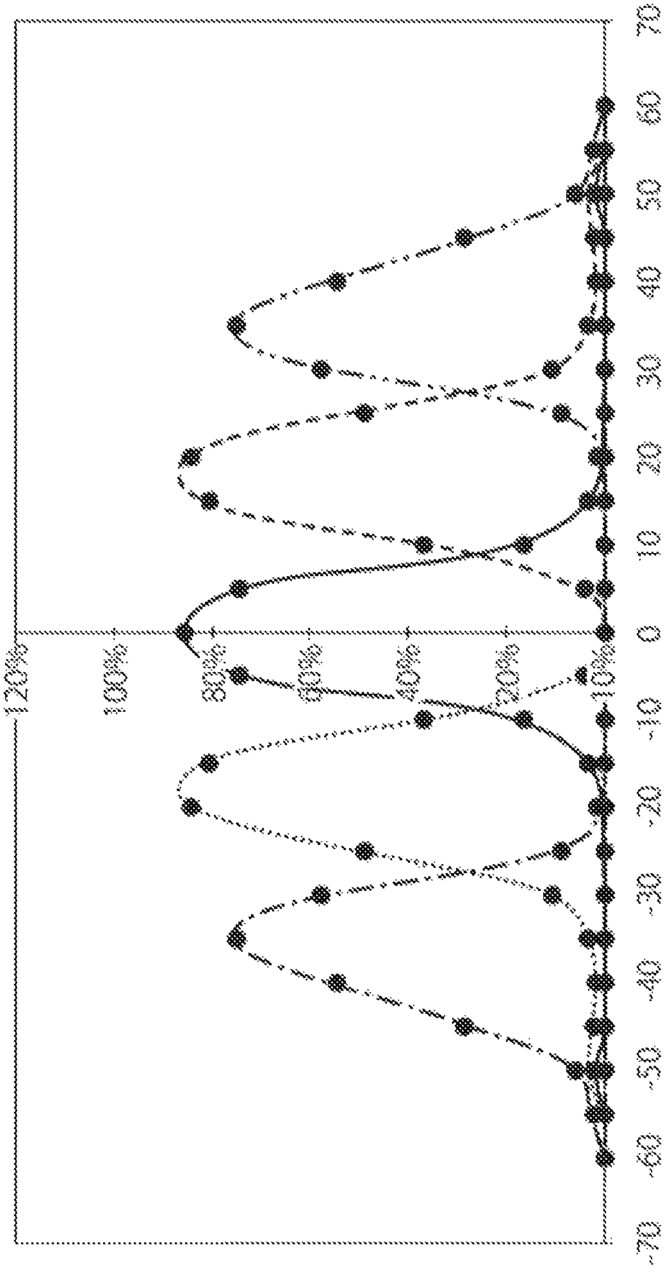
FIG. 73 is a graph illustrating sensitivity for each subpixel according to an embodiment.

FIG. 73 is a graph illustrating sensitivity of each subpixel in the case of FIG. 72. In this case, there is an advantage that sensitivity and angular resolution between the subpixels can be made uniform, a characteristic difference between the subpixels is reduced, and it becomes easy to handle an imaging element in image processing such as PSF correction and image synthesis to be described below.

Thirty-Sixth Embodiment

Figure 74:
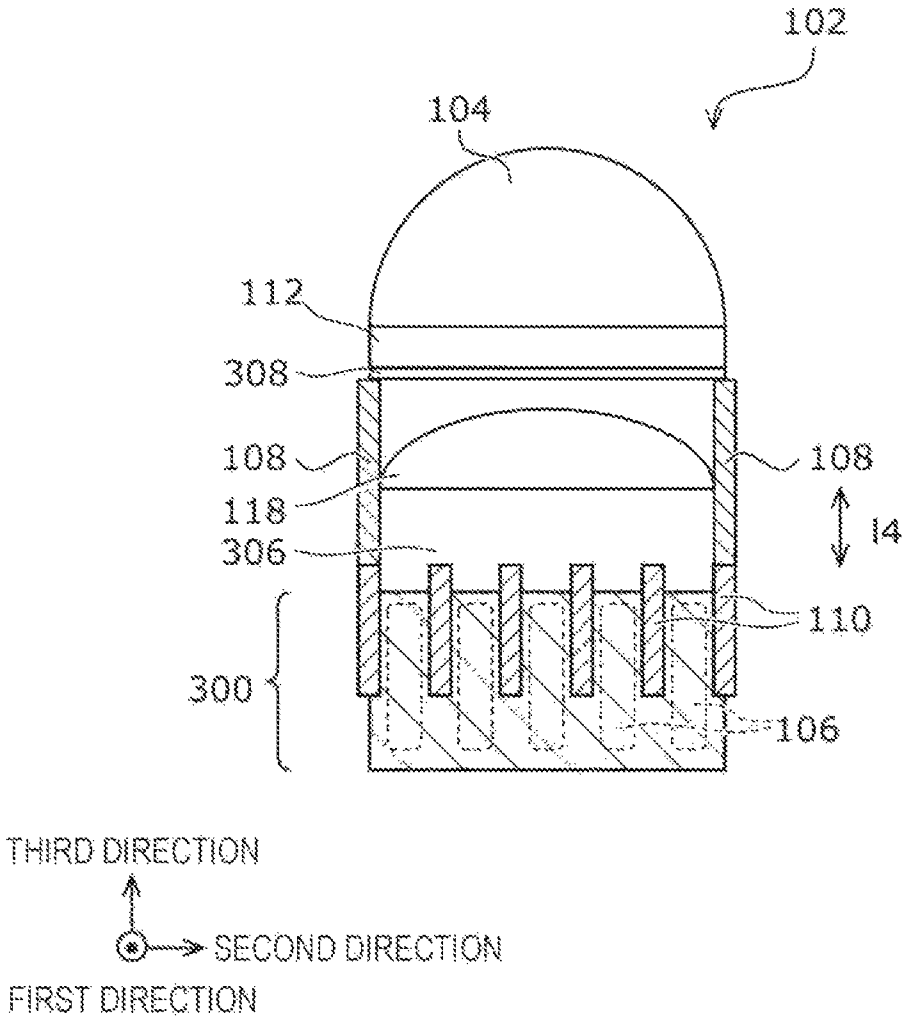
FIG. 74 is a cross-sectional view schematically illustrating an imaging pixel according to an embodiment.

FIG. 74 is a cross-sectional view in a case where the distance between an inner lens 118 and a photoelectric conversion element isolation portion 110 is a distance 14, that is, an upper portion of the photoelectric conversion element isolation portion 110 of a subpixel 106 present at an end is in focus. As illustrated in this drawing, an optical path may be designed so that an end of a pixel 102 is in focus in consideration of geometric extension of an optical path length at the end of the pixel 102.

FIG. 75 is a graph illustrating sensitivity of each subpixel in the case of FIG. 74. In this case, since light reception sensitivity in subpixels 106C and 106G at the ends can be maximally improved, for example, in a case of acquiring a parallax image or the like, characteristics of the ends can be extracted.

An imaging element 10 may include an inner lens 118 at a distance other than those described in the thirtieth embodiment to the thirty-third embodiment.

For example, the optical path may be designed so that a focal position of the pixel 102 is greatly shifted from a height of a metal film 316, and a beam diameter becomes larger than at least the subpixel 106 in the vicinity of the uppermost portion of the metal film 316. By designing in this way, for example, even in a case of being combined with a telecentric optical system vertically incident with respect to an imaging device, there is an advantage that not only the central subpixel 106 but also the peripheral subpixels 106 can acquire information of light in the pixel 102.

As described above, a focal position of the lens 104 is determined according to a layer thickness of a condensing structure, a lens thickness, an optical physical property value of each material, and the like with respect to assumed light characteristics (wavelength and angle). It is possible to control oblique incidence characteristics with any of such parameters, and an optical path designing means is not limited to the height of a lower wall (the above-described 11 to 14).

Thirty-Seventh Embodiment

Figure 76:
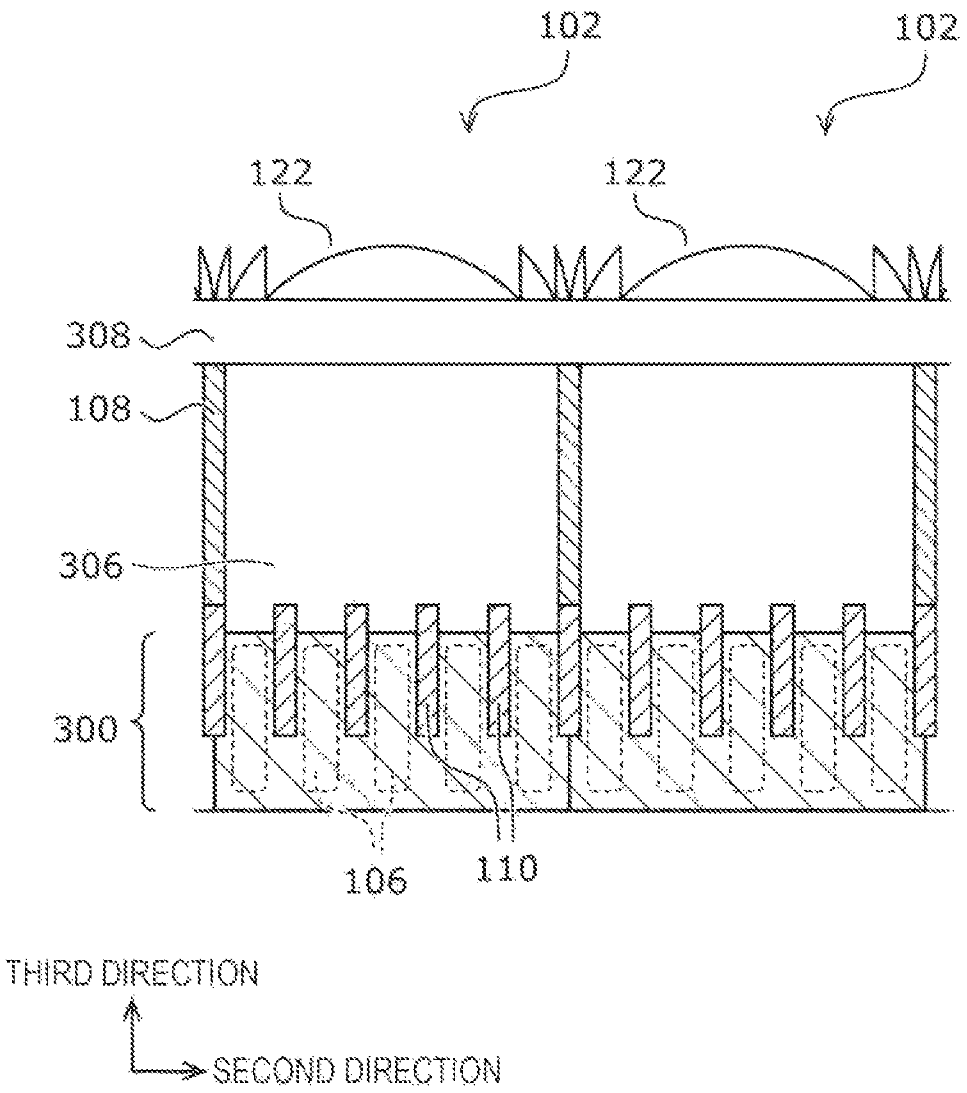
FIG. 76 is a cross-sectional view schematically illustrating imaging pixels according to an embodiment.

FIG. 76 is a cross-sectional view illustrating imaging pixels according to an embodiment. FIG. 76 is a view illustrating another configuration of a lens 104 included in a pixel 102. The pixel 102 includes a Fresnel lens 122 as an on-chip lens. The Fresnel lens 122 has a shape in which a refractive lens is concentrically divided to reduce a thickness.

By providing the Fresnel lens 122 as the lens 104 as in the present embodiment, for example, in a case of lens molding using nanoimprint to be described below, there is an advantage that shape variation due to UV irradiation or heat increases as a volume of a lens material increases.

Thirty-Eighth Embodiment

Figure 77:
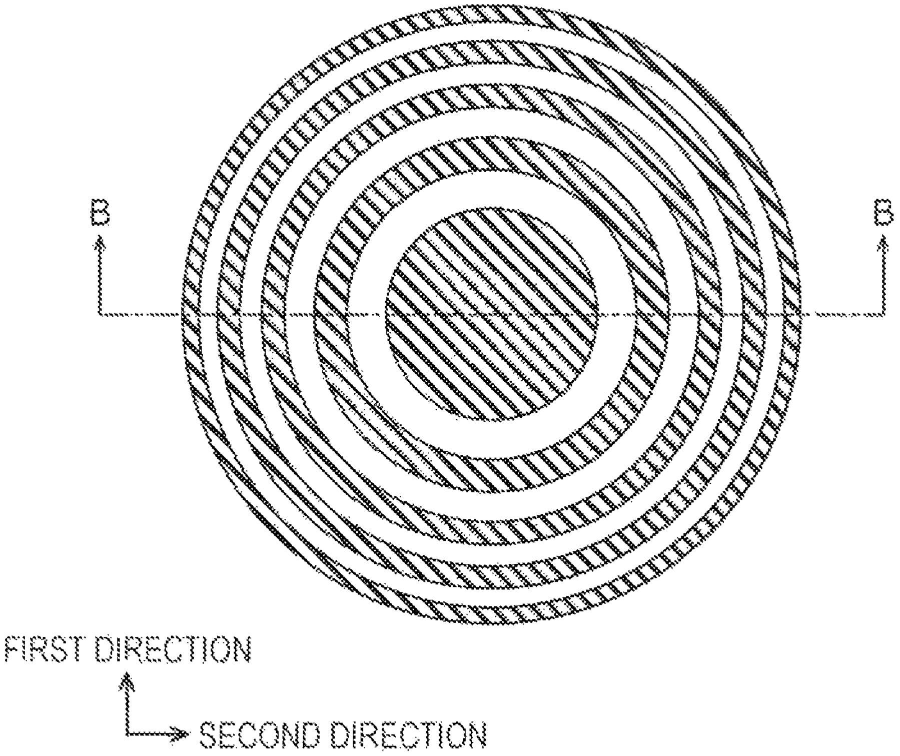
FIG. 77 is a plan view schematically illustrating a lens according to an embodiment.

FIG. 77 is a plan view illustrating an example of a lens included in an imaging pixel according to an embodiment. A pixel 102 includes a diffractive lens 124 as a lens. The diffractive lens 124 is a lens capable of condensing light by designing a depth of a groove according to a wavelength and an interval of the groove according to an angle of diffraction, using a diffraction phenomenon of a microscopic undulating structure equal to or less than the wavelength.

Figure 78:
FIG. 78 is a cross-sectional view schematically illustrating a lens according to an embodiment.

FIG. 78 is a cross-sectional view illustrating an example of a lens included in an imaging pixel according to an embodiment. That is, FIG. 78 is a cross-sectional view taken along line B-B of FIG. 77.

In FIGS. 77 and 78, a slant-line region and a white region between the slant-line regions include materials having different transmittances (different refractive indexes). By changing the transmittance in this manner, the light is condensed by the diffraction phenomenon on the basis of the depth of the groove and the interval between the grooves defined above.

The pixel 102 may include the diffractive lens 124 as a lens. Note that the Fresnel lens is based on a pure refraction phenomenon in a processing level difference sufficiently larger than the wavelength, and the diffractive lens and the Fresnel lens are completely different in principle.

Figure 79:
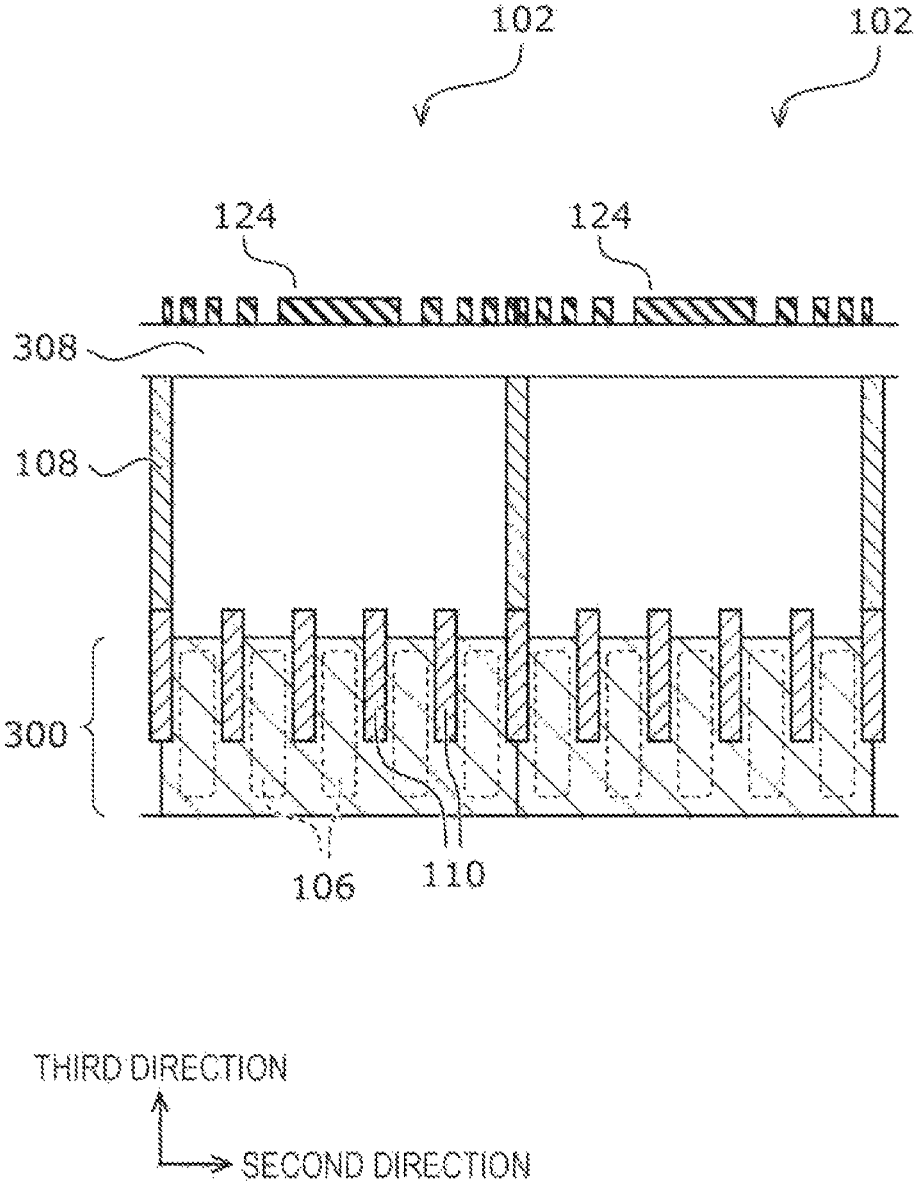
FIG. 79 is a cross-sectional view schematically illustrating imaging pixels according to an embodiment.

FIG. 79 is a cross-sectional view illustrating an example of imaging pixels according to an embodiment. For example, as described above, the pixel 102 may include the diffractive lens 124 as an on-chip lens (lens 104). For example, as illustrated in FIG. 79, the diffractive lens 124 may include a plurality of fine undulating shapes having a depth of about a wavelength of light on a surface of a resin, an inorganic film, or the like, for example, concentrically around an optical axis. Such a diffractive lens is called a zone plate type (Fresnel zone plate). The shape of the diffractive lens 124 is not limited to the concentric shape, and may be, for example, an octagonal shape, a hexagonal shape, a rectangular shape, or the like.

The diffractive lens can be used as the lens 104 as described above, but is not limited thereto. Several use methods of the diffractive lens will be described. For example, as illustrated in FIG. 79, only one diffractive lens 124 may be provided for each pixel 102.

Figure 80:
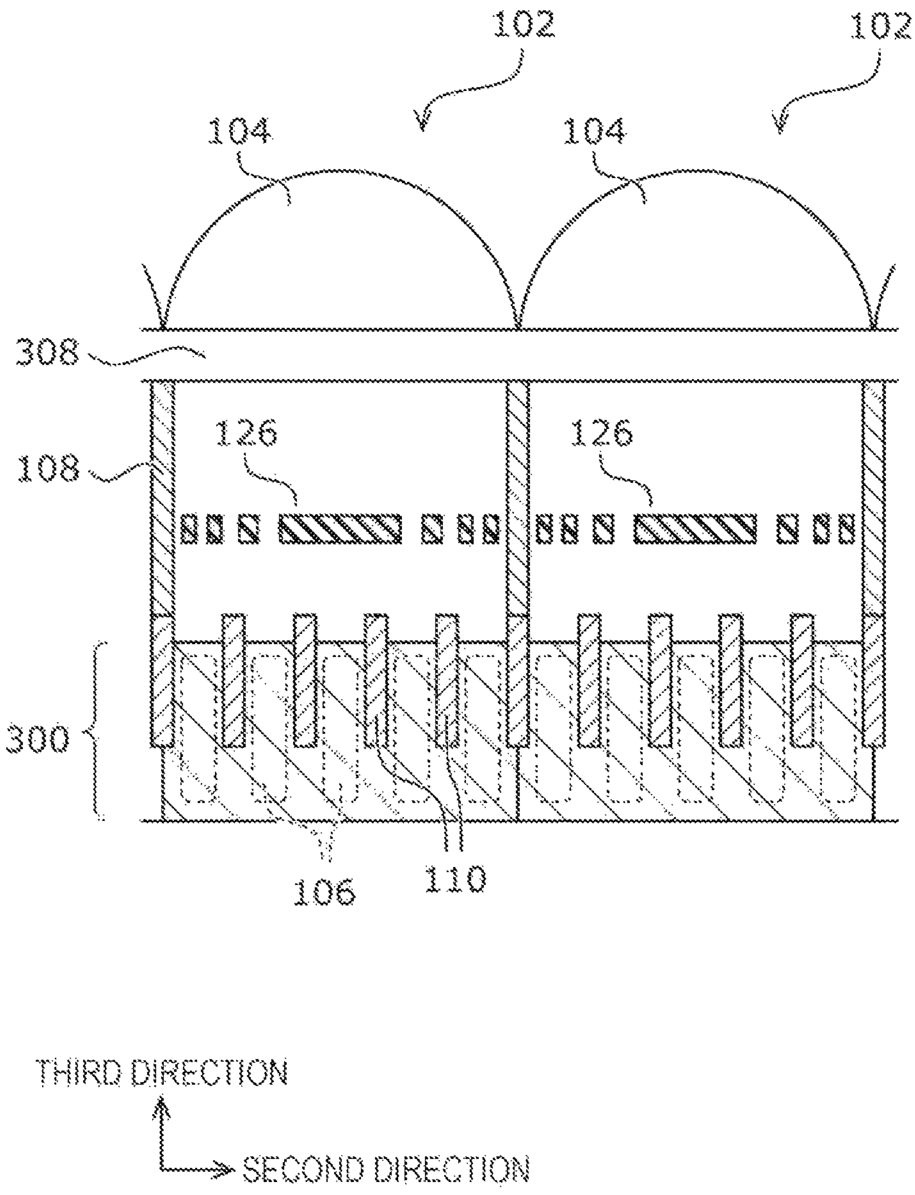
FIG. 80 is a cross-sectional view schematically illustrating imaging pixels according to an embodiment.

FIG. 80 is a cross-sectional view illustrating an example of imaging pixels according to an embodiment. As illustrated in FIG. 80, a diffractive lens 126 may be provided instead of the inner lens 118. The diffractive lens 126 does not have a table, but may appropriately include a table having transparency or high transmittance.

Figure 81:
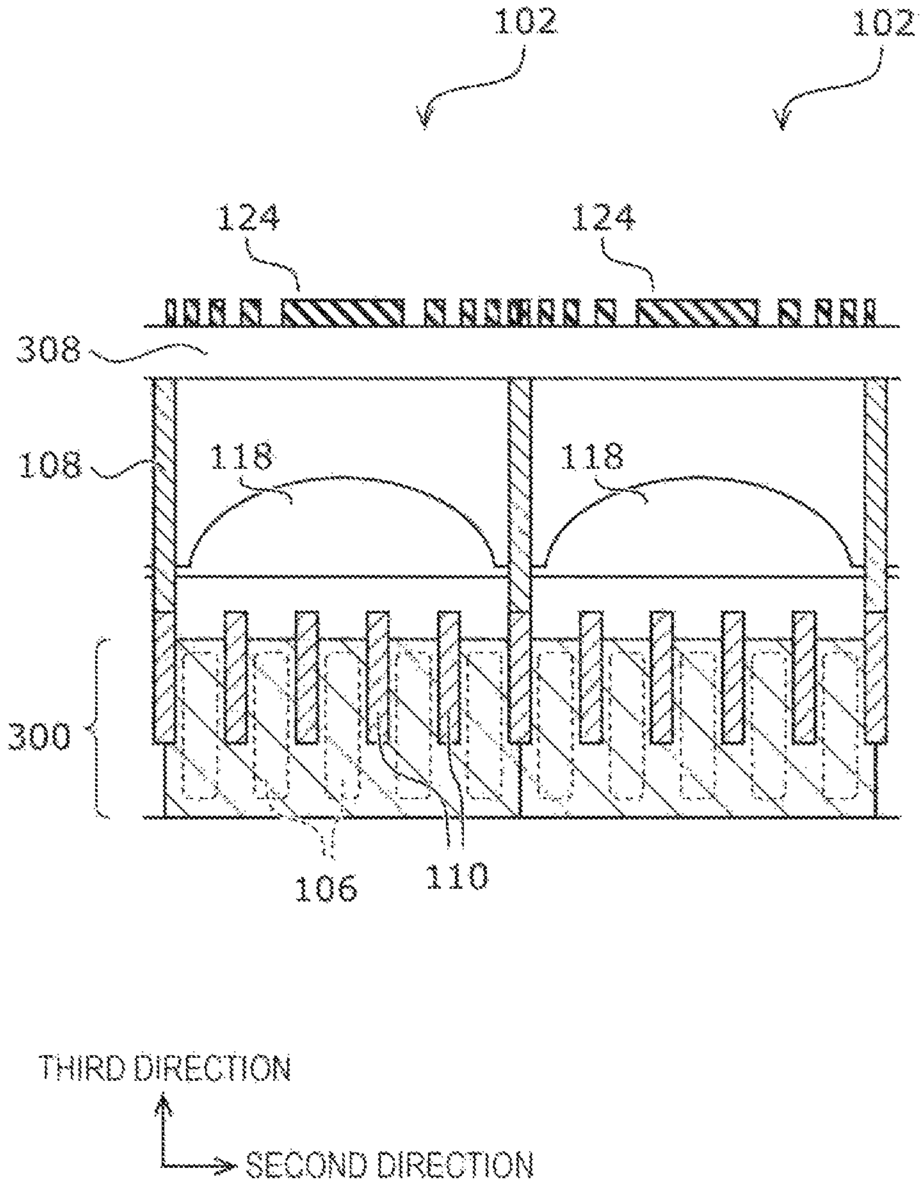
FIG. 81 is a cross-sectional view schematically illustrating imaging pixels according to an embodiment.

FIG. 81 is a cross-sectional view illustrating an example of imaging pixels according to an embodiment. As illustrated in FIG. 81, a two-stage configuration of the diffractive lens 124 as an on-chip lens and the inner lens 118 may be adopted.

Note that, in FIGS. 80 and 81, the lenses are configured as a two-stage lens, but a multistage lens configuration including two or more lenses can be adopted. In a case where a plurality of lenses is superimposed along a third direction, an arbitrary number of lenses among the plurality of lenses may be used as the diffractive lenses.

A diffraction grating causes an interference in a region where the following relational expression holds, in a case where the wavelength is A, the diffraction order is m, the diffraction grating interval is d, and the refractive indexes of the incident-side material and the emission-side material are $n_1$ and $n_2$, respectively.

[Math. 4]

$$n_2 \sin\theta_2 - n_1 \sin\theta_1 = \frac{m\lambda}{d} \quad (4)$$

Figure 82:
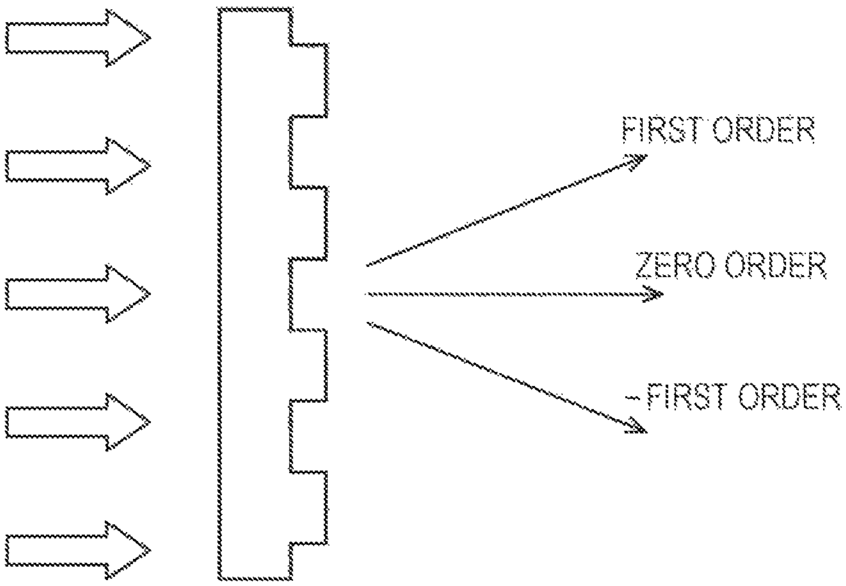
FIG. 82 is a cross-sectional view schematically illustrating a diffractive lens according to an embodiment.

FIG. 82 is a view illustrating a diffraction grating. In a simple slit structure illustrated in FIG. 82, intensity of transmitted light is dispersed in a plurality of diffraction spots. The direction in which diffracted light is emitted is determined on the basis of the above-described Equation (4). For example, the direction of first-order light is diffracted in a direction of $\theta_2$ obtained as $\theta_1=0$ and m=1 in Equation (4), and diffraction fringes are generated. As can be seen from Equation (4), the direction in which the fringes are generated varies depending on the wavelength.

Figure 83:
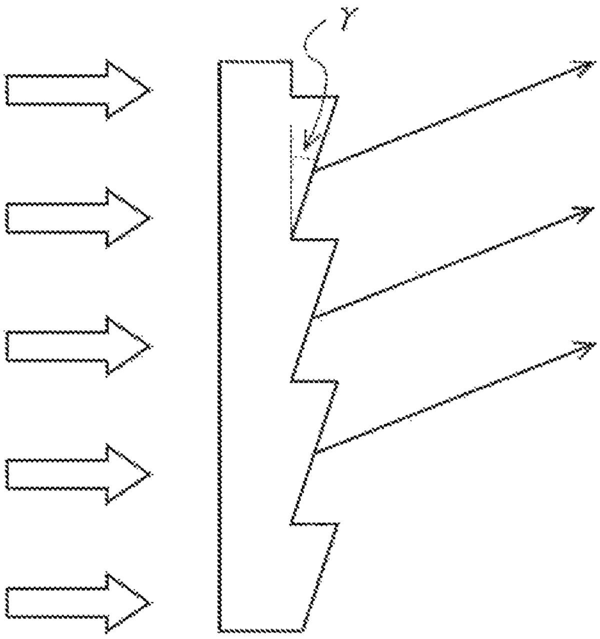
FIG. 83 is a cross-sectional view schematically illustrating a diffractive lens according to an embodiment.

FIG. 83 is a view illustrating another example of the diffraction grating. This diffraction grating has a sawtooth shape called blazing. By blazing, diffraction efficiency of a certain specific wavelength can be enhanced. This specific wavelength λ can be expressed by the following equation using a blaze angle γ. Here, n is a relative refractive index.

[Math. 5]

$$\tan\gamma = \frac{m\lambda}{dn - \sqrt{d^2 - (m\lambda)^2}} \quad (5)$$

In the blazing, the undulations of the diffraction grating may be replaced with a sawtooth shape, and an angle of an inclined surface may be determined such that wavefronts diffracted at a target diffraction order are parallel in all places.

The diffractive lenses 124 and 126 are different from refractive lenses in responsiveness of a focal length and the like with respect to a wavelength change of incident light because of using an interference effect. The pixel 102 may correct chromatic aberrations by combining the diffractive lens with a refractive lens optical system, using the difference.

Conversely, in the pixel 102, chromatic aberrations may be actively generated using the diffractive lens and spectrally resolved using the output from each subpixel 106 in the pixel 102.

Moreover, the respective pixels 102 may include the diffractive lenses having different characteristics from each other. For example, while a refractive-type on-chip lens in the imaging device performs pupil correction by continuous position shift, the diffractive lens can freely implement individual light condensing states by including the diffractive lenses having different shapes in the pixels 102, respectively, regardless of a lens state of an adjacent pixel.

As described above, by using the diffractive lens, it is possible to form the pixel 102 having characteristics different from that of the refractive lens. These lenses may be used in combination, or the lenses may be combined so as to have different characteristics for each pixel 102. By appropriately using the diffractive lens, it is possible to receive light having characteristics different from those in the case of using the refraction lens.

Note that FIGS. 79, 80, and 81 illustrates examples in which the filter 112 and the like and the lens isolation portion 120 are not provided but the present embodiment is not limited thereto. As described in the above-described embodiment, the filter 112 or the like, the lens isolation portion 120 may be appropriately provided as necessary.

Thirty-Ninth Embodiment

By forming the lens 104 and the inner lens 118 in various forms as described above, light reception in various characteristics can be implemented. Similarly, the pixel 102 can also implement pupil correction according to the arrangement and type of lenses. The plurality of subpixels 106 included in the pixel 102 according to each of the above-described embodiments can simultaneously acquire information having different parallaxes with respect to the lens 104, but can shift an angle range of receivable light by adding pupil correction for shifting the position of the lens 104.

For example, by shifting an on-chip lens outward in proportion to a distance from a chip center, an angle of view of a subpixel image is extended, whereas conversely, by shifting the on-chip lens toward the chip center, an effect of increasing a resolution of the subpixel image can be obtained. Moreover, in a case where an optical system 9 includes a lens, it becomes possible to efficiently receive an object image at the entire angle of view by performing pupil correction according to a principal light beam of the lens for each image height.

Figure 84:
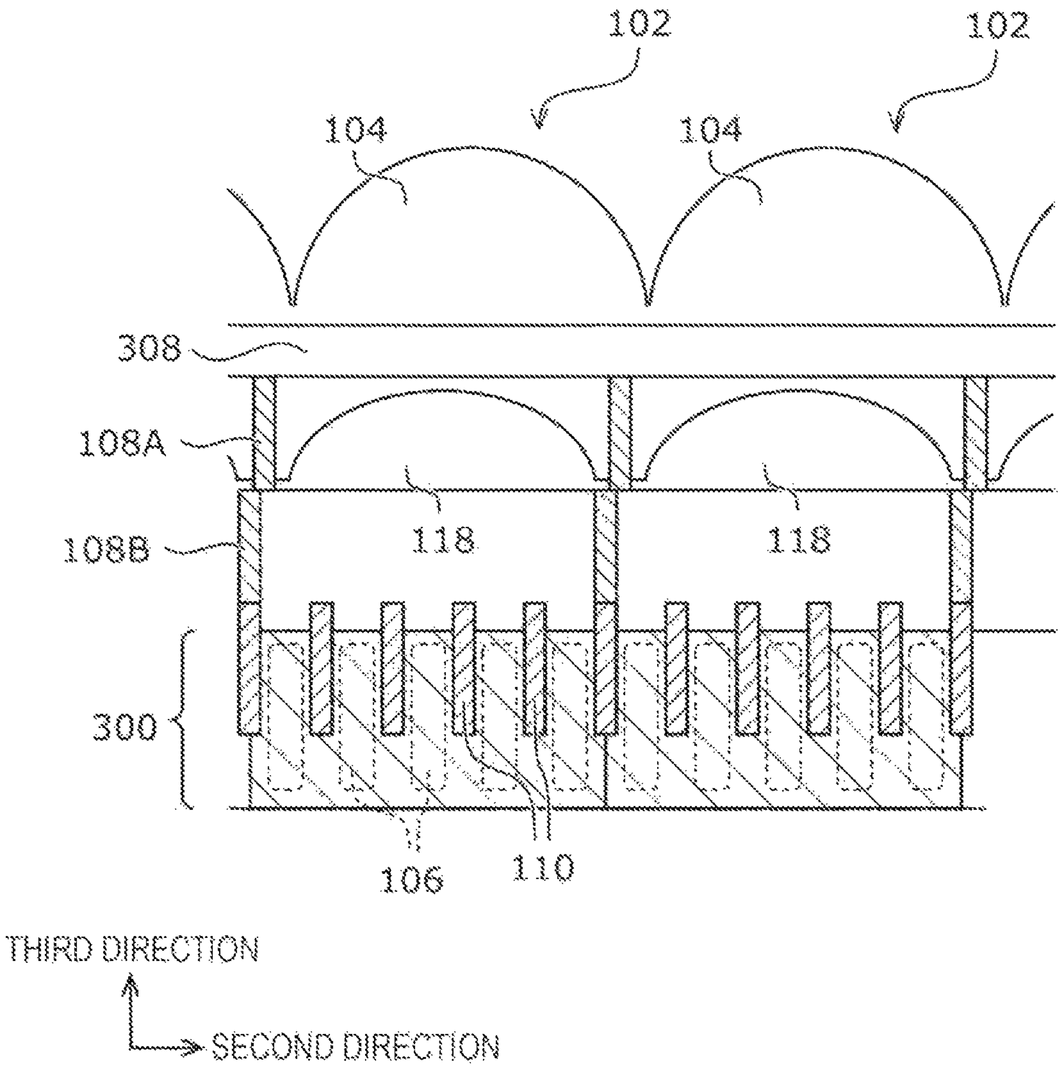
FIG. 84 is a cross-sectional view schematically illustrating imaging pixels according to an embodiment.

FIG. 84 is a cross-sectional view of imaging pixels according to an embodiment. As a structure according to the present embodiment, for example, some pixels 102 in a pixel array 100 have the configuration illustrated in this cross-sectional view. The pixel 102 includes an inner lens 118 whose position is shifted with respect to the lens 104 in at least one of a first direction and a second direction. As an example, the inner lens 118 is shifted, but the pixel 102 may not include the inner lens 118. In this case, a similar effect can be obtained by shifting the position of a subpixel 106 located at a center of the pixel 102 from the center.

For example, the pixel 102 located at an end of the pixel array 100 has a large shift illustrated in FIG. 84, and the pixel 102 located at the center of the pixel array 100 has a small shift or has no shift.

Figure 85:
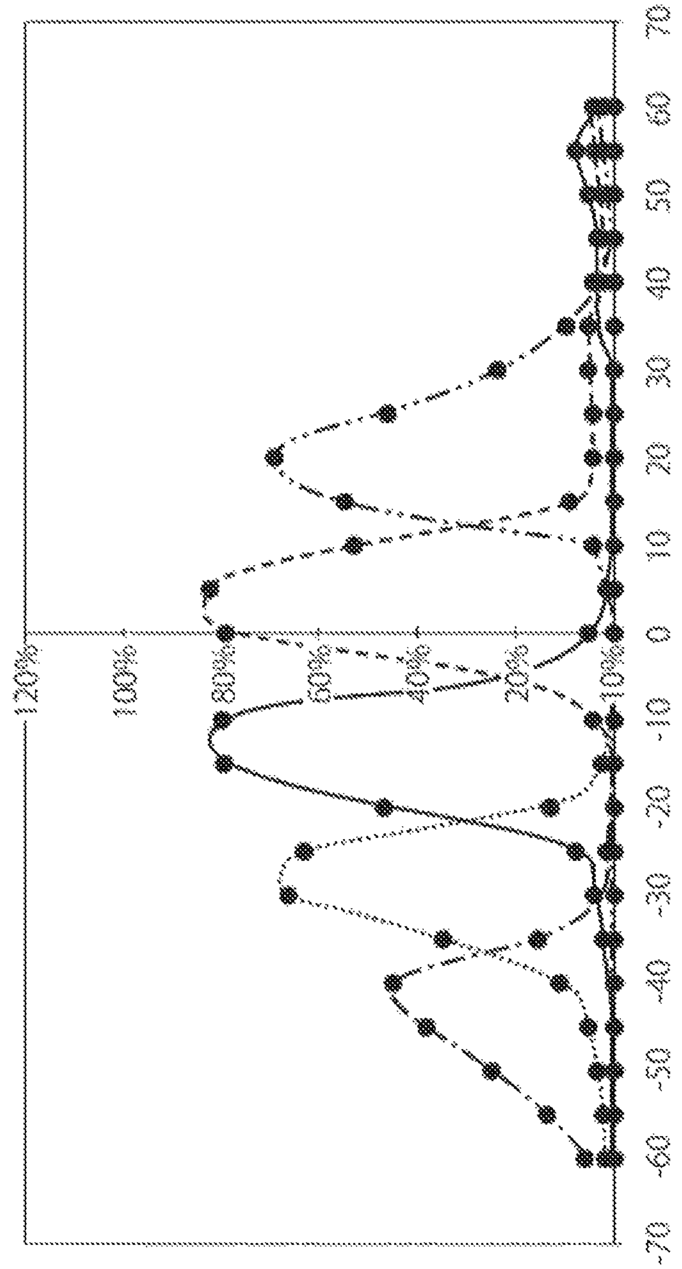
FIG. 85 is a graph illustrating sensitivity for each subpixel according to an embodiment.

FIG. 85 is a graph illustrating light reception sensitivity in the pixel 102 illustrated in FIG. 84. It can be seen that the light reception sensitivity of light incident from a predetermined oblique direction is high by being compared with FIG. 69 that is the light reception sensitivity in the case of no pupil correction. This graph illustrates a state in which the pupil correction is applied at the end of the angle of view in the second direction as an example of the arrangement of the pixels 102, and illustrates the oblique incidence characteristics of the respective pixels. Note that this structure has a similar configuration to FIG. 70, and an optical path is designed so that a vicinity of an uppermost portion of a metal film 316 is in focus. A measurement method, an analysis method, and the like are also similar to those of the above-described embodiments, and thus redundant detailed description is omitted.

For example, a pupil correction amount may change according to the distance from the chip center and increase toward the end. Furthermore, the shift amount of the pupil correction may be increased as a layer thickness from a surface of a semiconductor substrate 300 is increased. For example, in the case of FIG. 84, the pupil correction amount may be increased in the order of the lens 104>a filter 112=the inner lens 118=a light-shielding wall 108A≥a light-shielding wall 108B≥an opening position of the metal film 316 (in a photoelectric conversion element isolation portion 110) according to the height of the layer thickness.

Regarding the pupil correction amount, when a gap is generated in the light-shielding structure, the gap becomes a path through which a stray light component leaks, and thus the performance is deteriorated. To avoid the deterioration, it is desirable to configure the light-shielding wall 108A to have a portion (contact region) overlapping with the light-shielding wall 108B in a plane in the first direction and the second direction. Similarly, it is desirable to configure the light-shielding wall 108B to have a region overlapping with the metal film 316 of the photoelectric conversion element isolation portion 110 in the plane in the first direction and the second direction.

Moreover, regarding the pupil correction amount, it is desirable to increase the width of overlapping, so-called an overlap amount, between the light-shielding wall 108A and the light-shielding wall 108B in design data, in consideration of variation in a line width of a lowermost portion of the light-shielding wall 108A, variation in a line width of an uppermost portion of the light-shielding wall 108B, and variation in misalignment between the light-shielding wall 108A and the light-shielding wall 108B.

As can be seen from FIG. 85, the oblique incidence characteristic of the pixel 102 in FIG. 84 designed in this way can maintain a state in which there is almost no floating due to crosstalk after each peak position is shifted by about 10 deg as compared with the case without pupil correction.

The pupil correction can also be implemented by a diffractive lens.

Fortieth Embodiment

Figure 86:
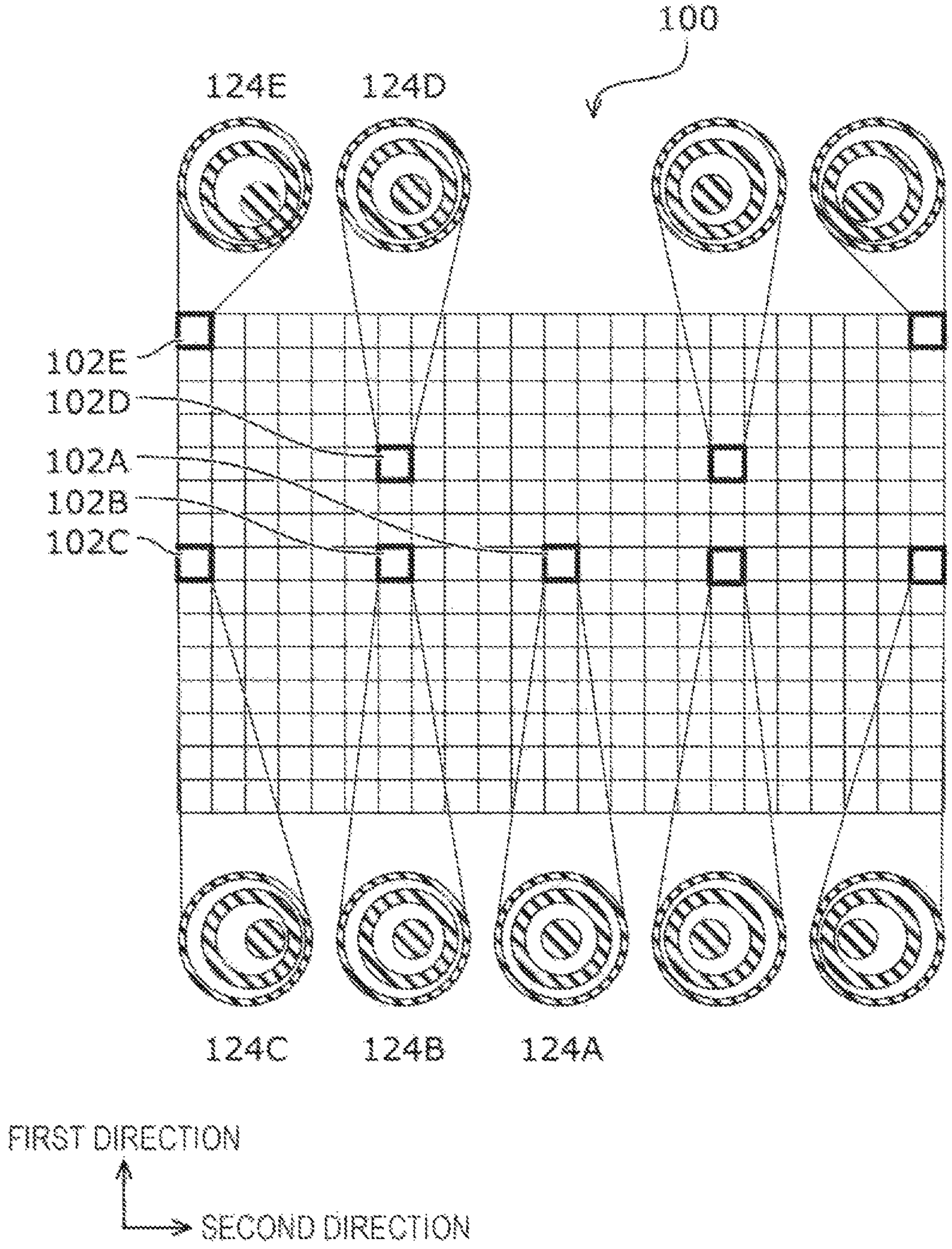
FIG. 86 is a view illustrating an example of a pixel array and diffractive lenses included in pixels according to an embodiment.

FIG. 86 is a view schematically illustrating diffractive lenses 124 of pixels 102 in a pixel array 100 included in an imaging element 10 according to an embodiment. Each lattice is assumed to represent the pixel 102. As described above, among the pixels 102 provided in the array, a pixel 102A is a pixel located at a center, and pixels 102B and 102C are pixels located at the center in a first direction in the drawing but located at positions shifted from the center in a circumferential direction in a second direction. Pixels 102D and 102E are pixels existing at positions shifted from the center in the circumferential direction in both the first direction and the second direction.

The diffractive lens 124 for each pixel is illustrated in the drawing. For example, in a diffractive lens 124A for the pixel 102A located at the center, centers of gratings are aligned as illustrated in FIG. 86.

Meanwhile, a diffractive lens 124B for the pixel 102B is formed to have a plurality of gratings in which the center of the grating is shifted toward the center of the pixel array 100. By providing the gratings in this manner, for example, when parallel light passes through the diffractive lens 124B in the pixel 102B, it is possible to form an image of light from an object at a position shifted inward (to the right in the drawing) of the pixel array 100 with respect to the center of the pixel 102B.

A diffractive lens 124C is provided in the pixel 102C located at an end with respect to the pixel 102B with respect to the center of the pixel array 100. When parallel light passes through the diffractive lens 124C in the pixel 102C, an image of light from an object is formed at a position shifted inward (to the right in the drawing) of the pixel array 100 with respect to the center of the pixel 102C. Then, due to a difference in shift of the gratings between the diffractive lens 124B and the diffractive lens 124C, the light is further shifted toward the inside of the pixel array 100 and condensed in the pixel 102C.

The same similarly applies to a case of being shifted from the center in the first direction. The pixel 102D is a pixel arranged at a position (upper left in the drawing) shifted from the center of the pixel array 100 in both the first direction and the second direction. The pixel 102D includes, for example, the diffractive lens 124D. The diffractive lens 124D has a plurality of gratings in which the center of the grating is shifted in a center direction (lower right in the drawing) of the pixel array 100.

The pixel 102E is a pixel arranged at a position (upper left in the drawing) further shifted from the center of the pixel array 100 toward the end in the same directions as the pixel 102D in the first direction and the second direction. The pixel 102E includes, for example, the diffractive lens 124E. The diffractive lens 124E includes a plurality of gratings in which the center of the grating is shifted in the center direction of the pixel array (lower right in the drawing). Then, due to a difference in shift of the gratings between the diffractive lens 124D and the diffractive lens 124E, the light is further shifted toward the inside of the pixel array 100 and condensed in the pixel 102E.

By providing such diffractive lenses, for example, when parallel light similarly passes through the diffractive lens 124 in the pixel 102, it is possible to form an image of light from an object at a position shifted inward (to the right in the drawing) of the pixel array 100 with respect to the center of the pixel 102.

Note that the optical path after passing through the diffractive lens 124, that is, an emission angle can be controlled according to the shift amount of the grating. Thus, the design of the diffractive lens can implement the design of the optical path equivalent to the pupil correction. By using the diffractive lens 124, optimal pupil correction can be performed without shifting the center position of the lens 104 of each pixel 102 in the pixel array 100.

Forty-First Embodiment

An application example in a pixel 102 that performs pupil correction in the above-described two embodiments will be described.

Figure 87:
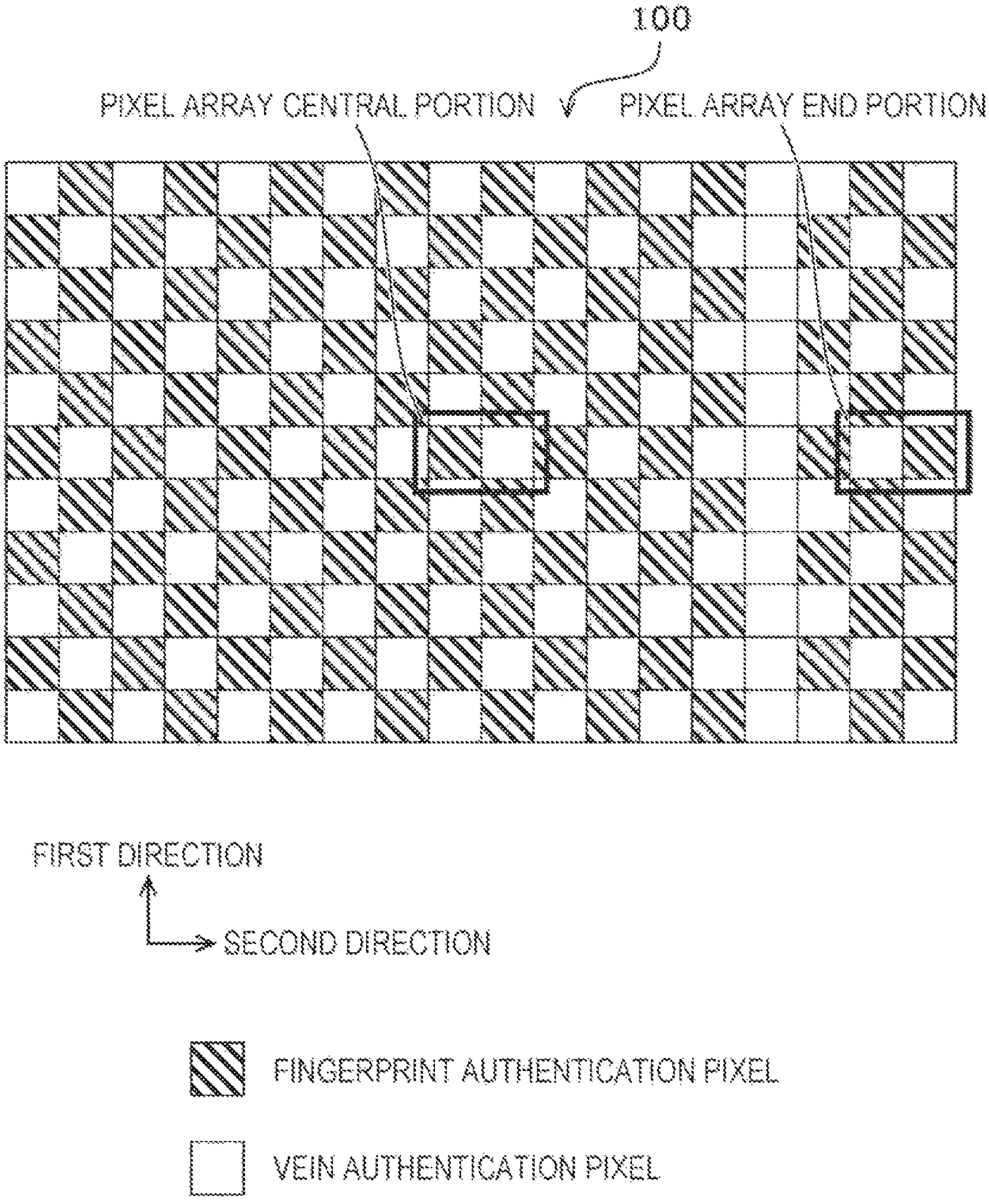
FIG. 87 is a view illustrating an example of a pixel array and diffractive lenses included in pixels according to an embodiment.

FIG. 87 is a view illustrating an example of a pixel array 100 of an imaging element 10 according to an embodiment. FIG. 87 illustrates an example of an application form of pupil correction by a diffractive lens 124.

Figure 88:
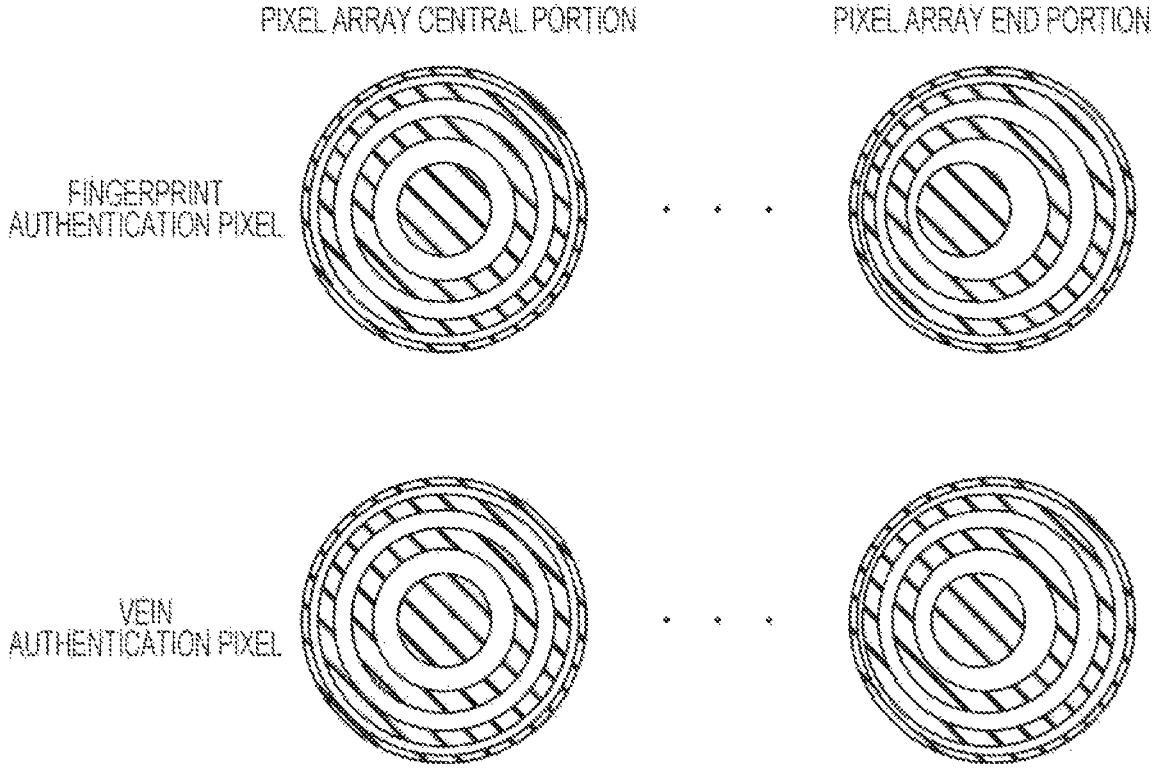
FIG. 88 is a view illustrating an example of a pixel array and diffractive lenses included in pixels according to an embodiment.

FIG. 88 is a view schematically illustrating diffractive lenses 124 of pixels 102 in the pixel array 100 in FIG. 87.

Figure 89:
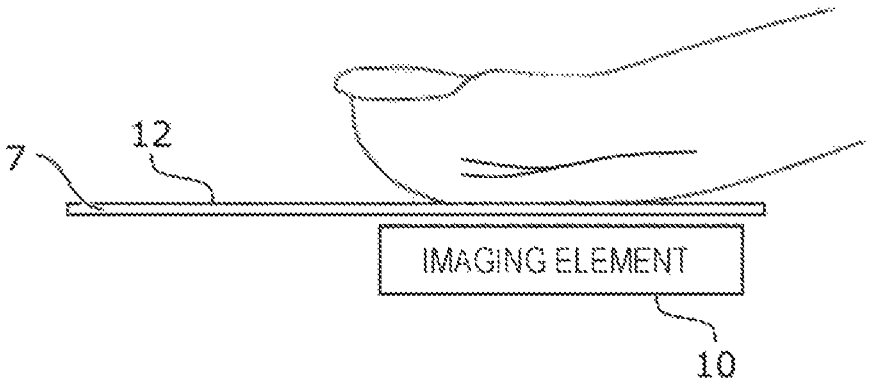
FIG. 89 is a view illustrating a state of imaging a finger according to an embodiment.

FIG. 89 is a view schematically illustrating reading of an electronic device 1 including the imaging element 10 configured by the pixel array 100 illustrated in FIG. 87.

The electronic device 1 has functions of fingerprint authentication and vein authentication for signals received by the same sensor. In this sensor, for example, vein authentication pixels and fingerprint authentication pixels are mixed in a checkered pattern.

In a case of capturing an image, placing a finger on a reading surface 12, a fingerprint to be captured is a pattern of a finger surface, and a vein to be captured is located at a depth of about 2 mm from the finger surface. Since the vein is farther from the imaging element 10 at capture timing, a wider field of view of the vein can be captured at a slight angle.

Here, for simplicity of description, it is approximately assumed as follows. For example, the distance from an imaging element surface to the reading surface 12 is set to 1 mm, and for example, a refractive index of a member such as a cover glass between the imaging element surface and the reading surface is set to about 1.5, and the refractive index of an inside of the finger is also set to about 1.5.

In this case, when the fingerprint and the vein are designed to be captured at substantially the same viewing angle, the pupil correction amount of the vein authentication is about ⅓ with respect to the pupil correction amount of a fingerprint pixel. Even in a case of capturing such a plurality of objects having different optimum angles, the diffractive lens 124 can be designed to perform optimum pupil correction for each object.

For example, as illustrated in the upper part of FIG. 88, the diffractive lenses included in the pixels 102 used for the fingerprint authentication are arranged at the center and the end with a large shift so that the pupil correction can be strongly performed. In contrast, as illustrated in the lower part, the diffractive lenses included in the pixels 102 used for the vein authentication are arranged at the center and the end with a smaller shift than the diffractive lenses for use in the pupil correction for the fingerprint authentication. As illustrated in this drawing, the strength of the pupil correction by the diffractive lenses 124 to be used can be changed between the fingerprint authentication and the vein authentication.

As described above, in the same pixel array 100, the pixels 102 having different pupil correction intensities can coexist by the arrangement of the gratings of the diffractive lenses 124. Of course, the appropriate filter 112 or 114 or plasmon filter 116 is provided in the pixel used for each authentication. With the configuration, it is possible to implement, in the pixel 102 (subpixel 106), reception of light of an appropriate wavelength for which appropriate pupil correction according to the use has been executed.

Note that, if a similar thing is tried to be implemented in pupil correction by a general lens shift, the shift amount is different between adjacent lenses, and thus a layout interference occurs. This interference can be avoided if the area of the lens is reduced and the degree of freedom of the layout is secured, but it cannot be said that it is a desirable embodiment since a small lens has poor light collection efficiency. Therefore, it is more desirable to achieve the effect of pupil correction by using the diffractive lens as described in the present embodiment.

Next, a photoelectric conversion element isolation portion 110 will be described with some embodiments.

In the present embodiment, various examples of the pixel 102 and the photoelectric conversion element isolation portion 110 of each of the above-described embodiments will be described. Hereinafter, the expressions "at the boundary of the pixels 102 . . . " and "in the photoelectric conversion element isolation portion 110 . . . " are used. The expressions do not indicate all the boundaries, and may be, for example, an element isolation portion arranged in a U shape, an element isolation portion divided as indicated by a dotted line, or the like, and are given to the effect that "at least a part of the boundary of the pixels 102", "at least a part of the photoelectric conversion element isolation portion 110", and the like.

As described in the above-described embodiments, in the following drawings, the filter 112 is provided, the filter 114 or the like, the inner lens 118 are not provided, and the lens 104 is a refractive lens, as an example, but can be combined with the above-described various configurations. Furthermore, other configurations such as the configuration of pupil correction can be appropriately applied.

Forty-Second Embodiment

Figure 90:
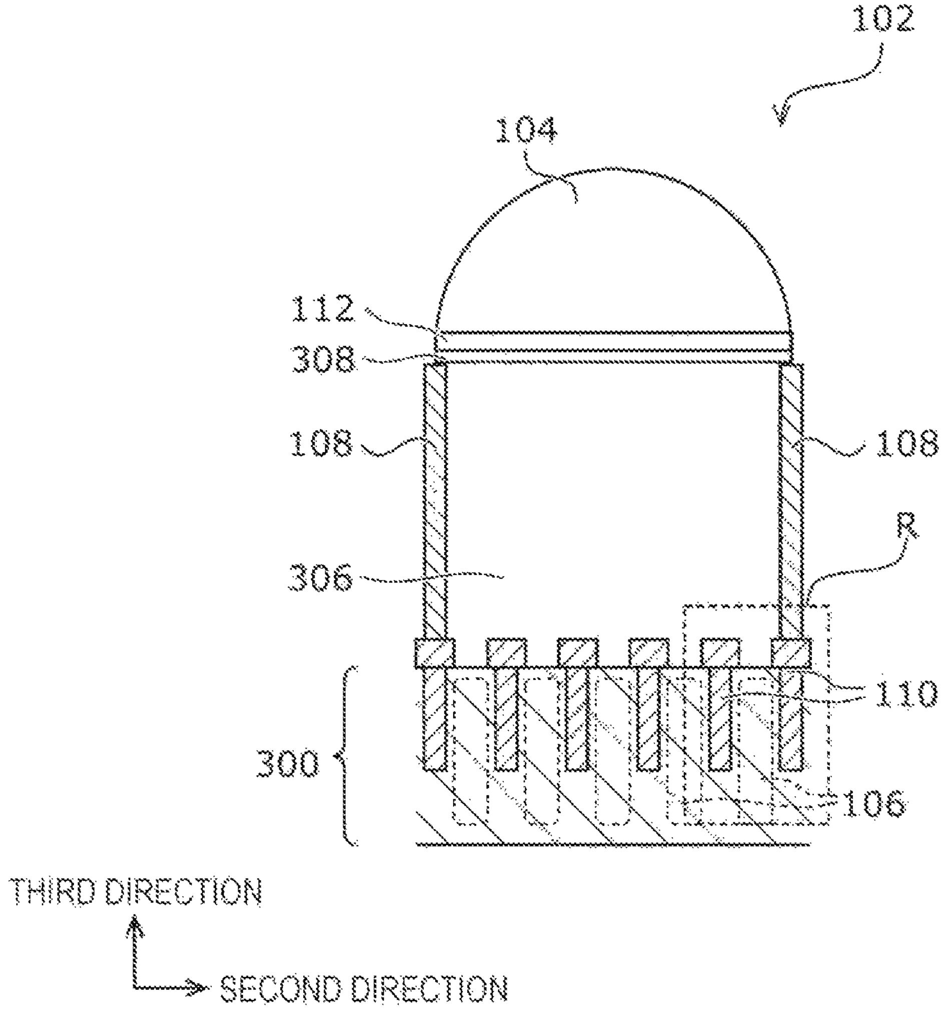
FIG. 90 is a cross-sectional view schematically illustrating an imaging pixel according to an embodiment.

FIG. 90 is a cross-sectional view illustrating an example of an imaging pixel according to an embodiment. An example of a trench of a photoelectric conversion element isolation portion 110 in a semiconductor substrate 300 is illustrated. Here, a drawing of a trench shape that does not penetrate the semiconductor substrate 300 is used, but the trench may penetrate the semiconductor substrate 300 while avoiding an interference with a pixel transistor and the like, and the present embodiment is not limited thereto.

The photoelectric conversion element isolation portion 110 is formed in a trench of the semiconductor substrate 300, and is formed such that a top portion thereof overlaps a part of a subpixel 106.

Figure 91:
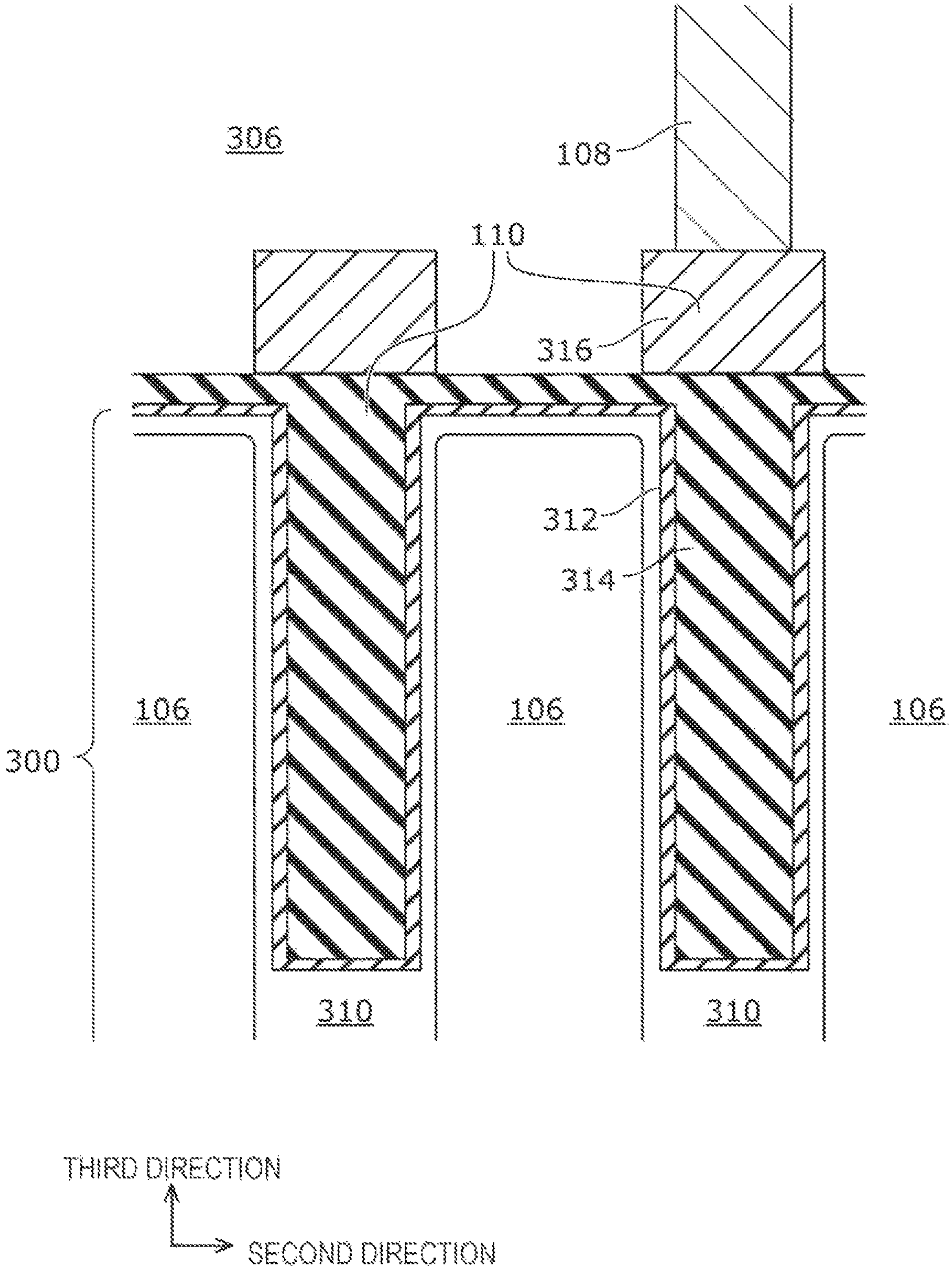
FIG. 91 is a cross-sectional view schematically illustrating an isolation portion according to an embodiment.

FIG. 91 is a cross-sectional view illustrating an example of the photoelectric conversion element isolation portion 110 according to an embodiment. More precisely, FIG. 91 is an enlarged view of a region R illustrated by the broken line in FIG. 90. The following description will be given using a similar combination.

The photoelectric conversion element isolation portion 110 is different from the photoelectric conversion element isolation portion 110 illustrated in FIG. 6 in that an insulating film 314 and a fixed charge film 312 are provided in the trench of the semiconductor substrate 300, and a metal film 316 is provided only above an interface of the semiconductor substrate 300.

In the present structure, charge crosstalk is prevented by the fixed charge film 312, and optical crosstalk is suppressed by interface reflection due to a difference in refractive index of a trench sidewall portion. As compared with a case where the metal film 316 is embedded in the trench, the effect of suppressing the optical crosstalk is weakened, but it is advantageous in that a dark current by the metal film 316 and deterioration of white spot characteristics are suppressed, and light absorbed by the metal film 316 contributes to sensitivity.

Forty-Third Embodiment

Figure 92:
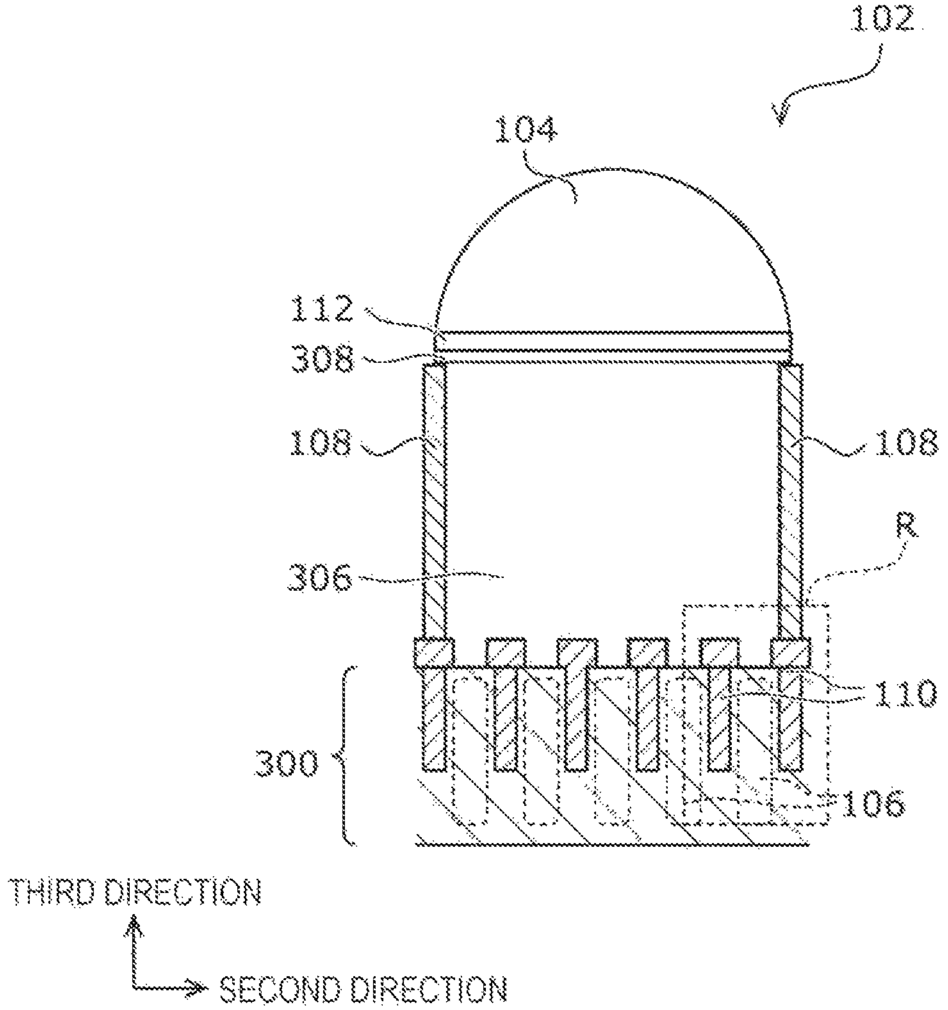
FIG. 92 is a cross-sectional view schematically illustrating an imaging pixel according to an embodiment.

FIG. 92 is a cross-sectional view illustrating an example of an imaging pixel according to an embodiment. A photoelectric conversion element isolation portion 110 is formed in a state where no trench is formed in a semiconductor substrate 300.

Figure 93:
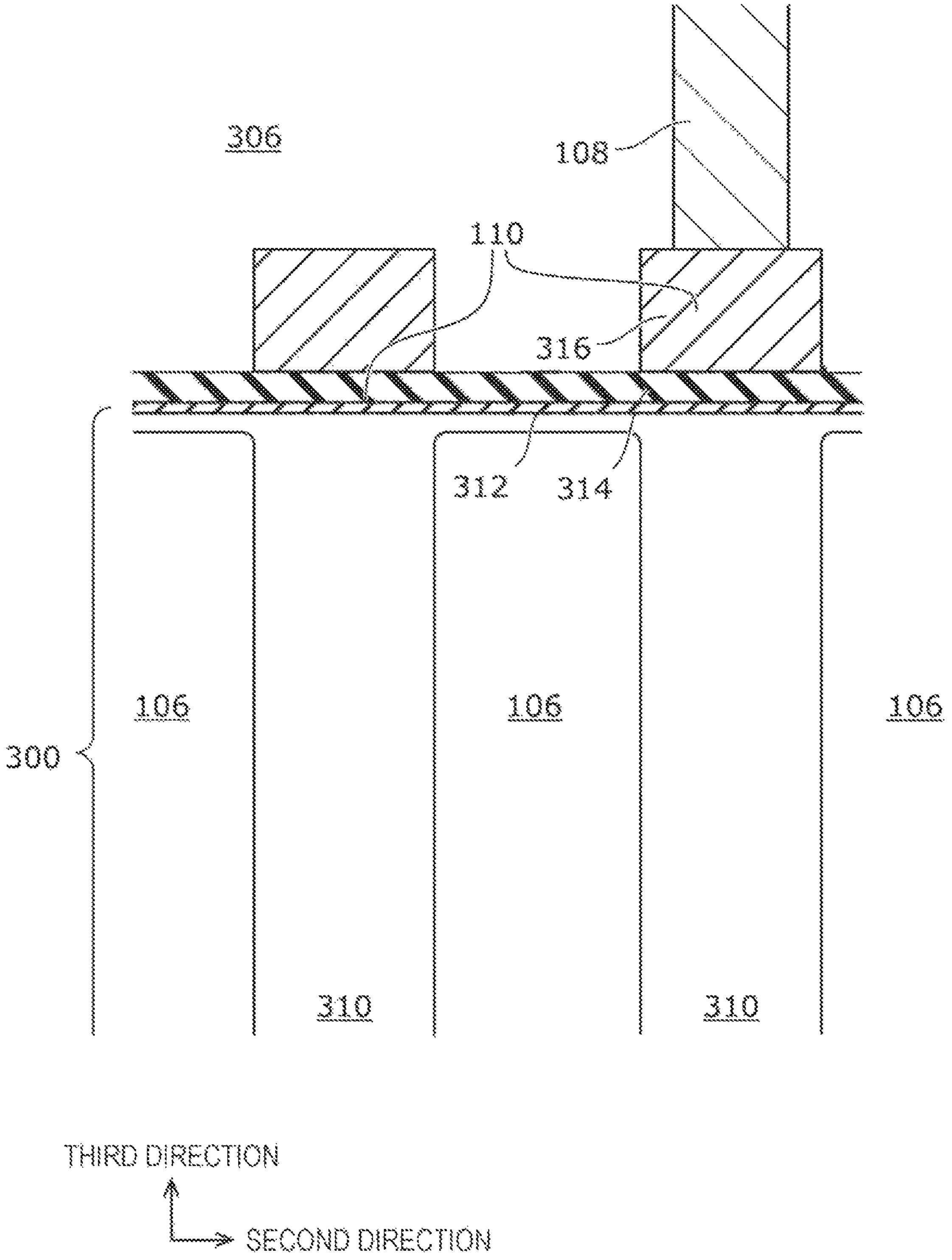
FIG. 93 is a cross-sectional view schematically illustrating an isolation portion according to an embodiment.

FIG. 93 is a cross-sectional view illustrating an example of the photoelectric conversion element isolation portion 110 according to an embodiment. As described above, no trench is formed in the semiconductor substrate 300, and a metal film 316 is provided above an interface of the semiconductor substrate 300. Although a crosstalk suppression effect is impaired optically and electrically as compared with the example of FIG. 6, the number of processes is small, and there is an advantage in manufacturing cost.

Forty-Fourth Embodiment

Figure 94:
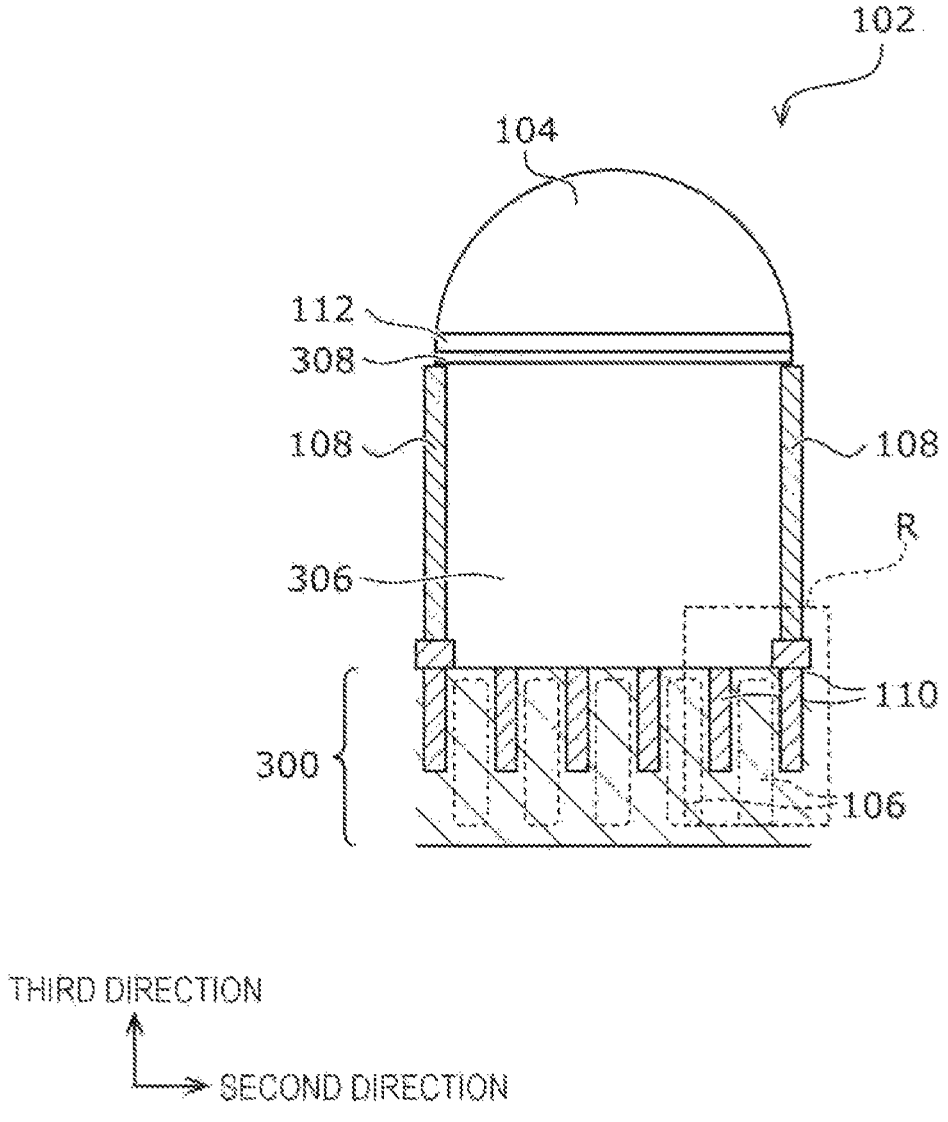
FIG. 94 is a cross-sectional view schematically illustrating an imaging pixel according to an embodiment.

FIG. 94 is a cross-sectional view illustrating an example of an imaging pixel according to an embodiment. A photoelectric conversion element isolation portion 110 is formed by different configurations between isolation of pixels 102 and isolation of subpixels 106. The photoelectric conversion element isolation portion 110 between the subpixels 106 in the same pixel 102 has a configuration not provided with a metal film 316 above an interface of a semiconductor substrate 300 but provided with the metal film at a boundary of the pixel 102.

Figure 95:
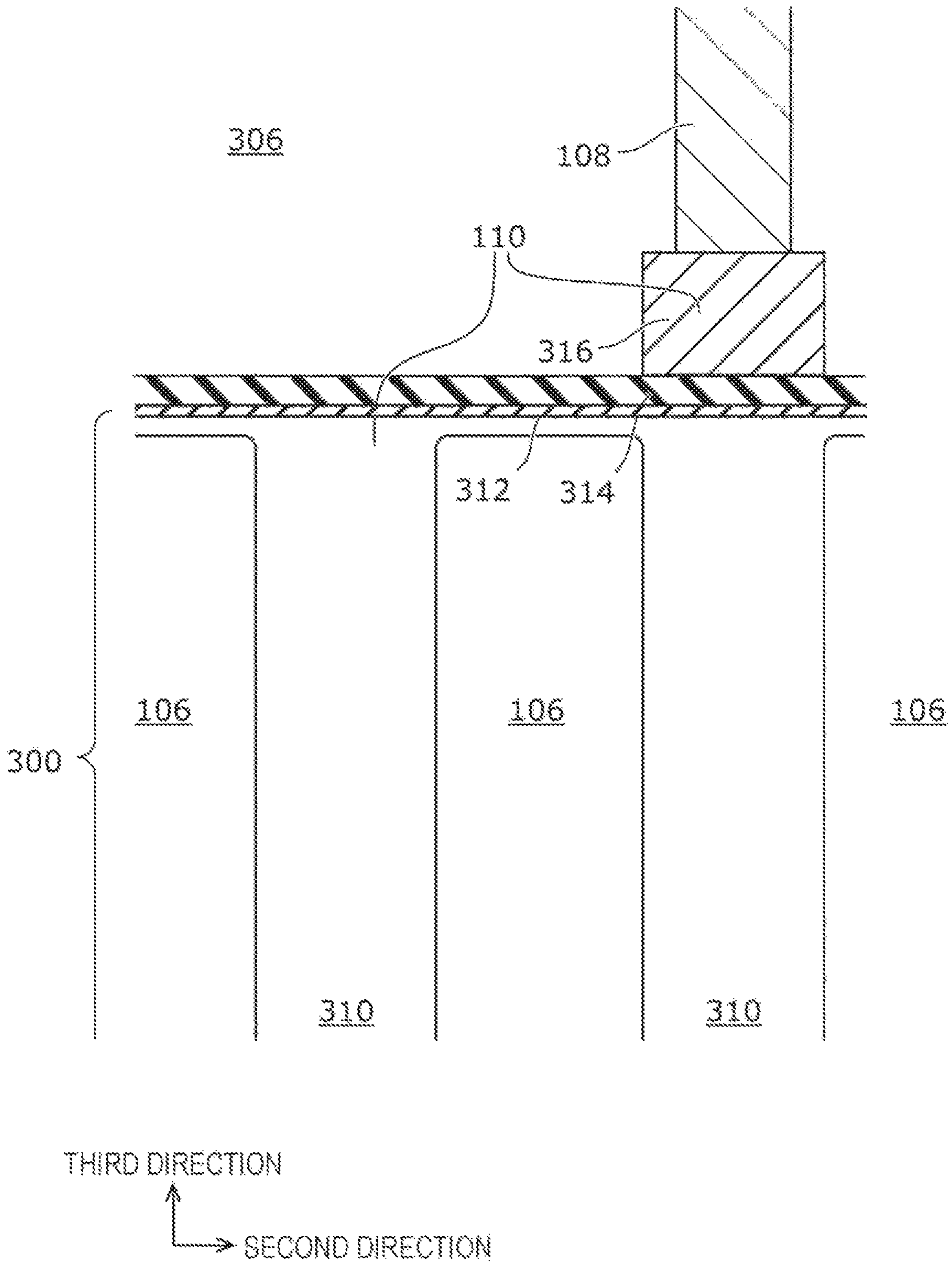
FIG. 95 is a cross-sectional view schematically illustrating an isolation portion according to an embodiment.

FIG. 95 is a cross-sectional view illustrating an example of the photoelectric conversion element isolation portion 110 according to an embodiment. As described above, the metal film 316 is provided above the interface of the semiconductor substrate 300 at the boundary of the pixel 102, and is not provided at a position other than the boundary of the pixel 102. As compared with the examples of FIGS. 92 and 93, although an optical crosstalk suppression effect and an angular resolution are impaired, it is advantageous in that vignetting by the metal film 316 is eliminated and sensitivity is increased.

Forty-Fifth Embodiment

Figure 96:
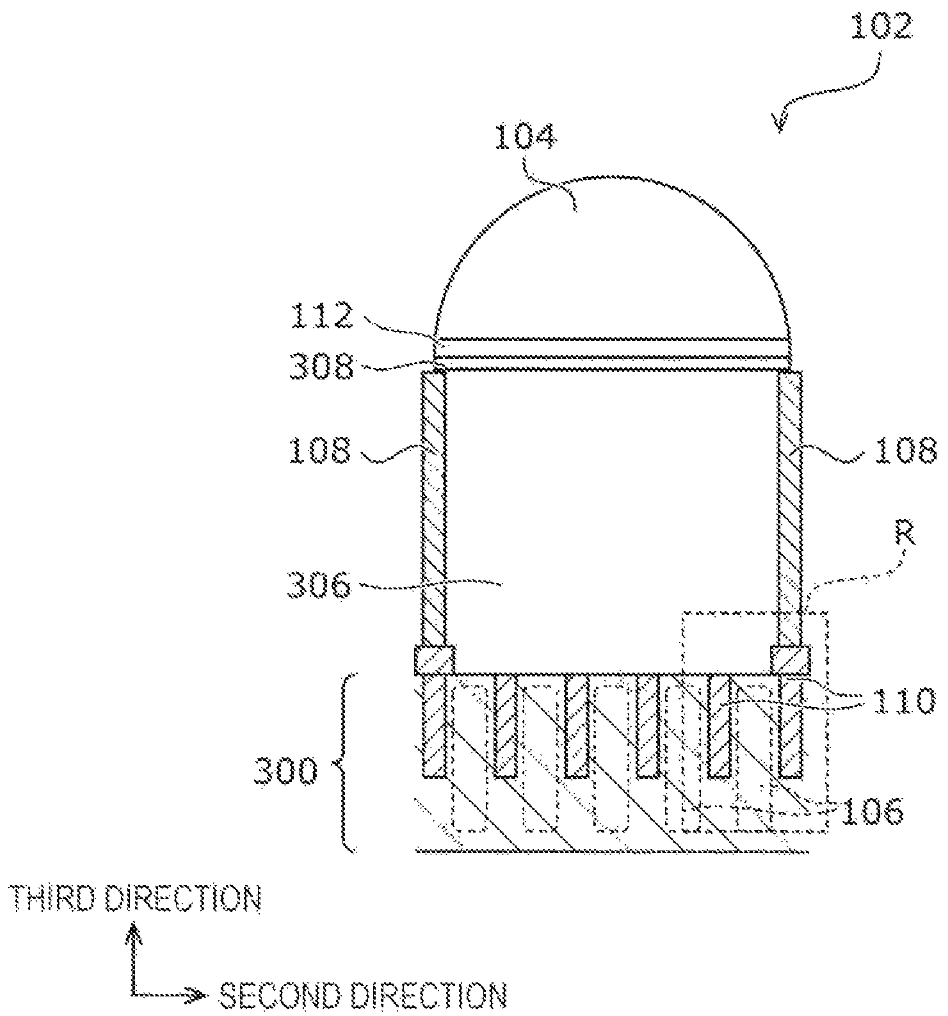
FIG. 96 is a cross-sectional view schematically illustrating an imaging pixel according to an embodiment.

FIG. 96 is a cross-sectional view illustrating an example of an imaging pixel according to an embodiment. A photoelectric conversion element isolation portion 110 is formed by different configurations between isolation of pixels 102 and isolation of subpixels 106. The photoelectric conversion element isolation portion 110 between the subpixels 106 in the same pixel 102 has a similar configuration to the example of FIGS. 92 and 93, while the photoelectric conversion element isolation portion 110 between the pixels 102 has a similar configuration to the example of FIGS. 90 and 91.

Figure 97:
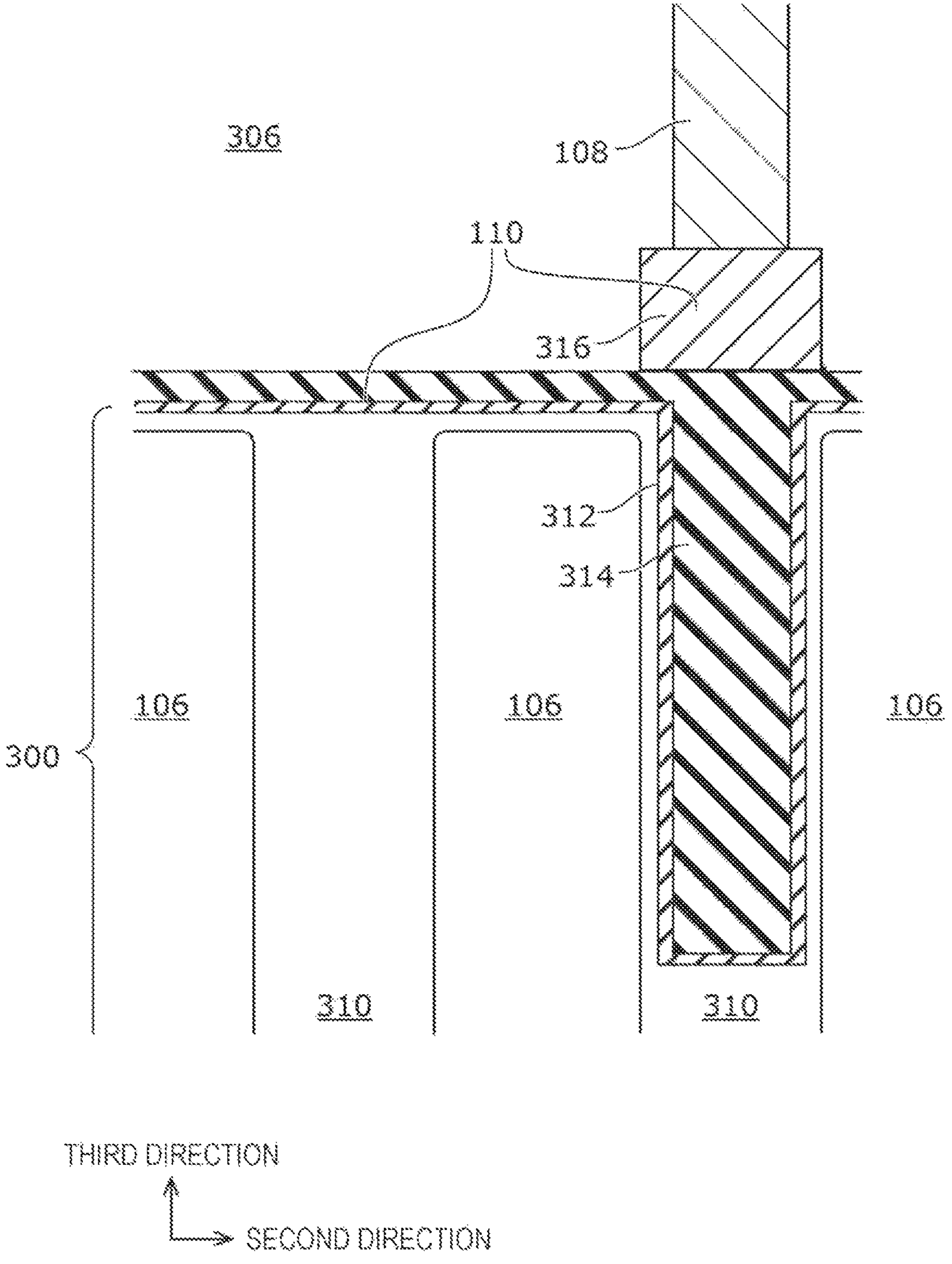
FIG. 97 is a cross-sectional view schematically illustrating an isolation portion according to an embodiment.

FIG. 97 is a cross-sectional view illustrating an example of the photoelectric conversion element isolation portion 110 according to an embodiment. A trench is formed in the semiconductor substrate 300, and an insulating film 314 and a fixed charge film 312 are provided therein in the photoelectric conversion element isolation portion 110 between the pixels 102. Although the number of processes is increased as compared with the example of FIGS. 94 and 95, there is an advantage that optical crosstalk and charge crosstalk between the pixels 102 are suppressed.

Furthermore, as compared with FIGS. 90 and 91, the optical and charge crosstalk suppression effect and the angular resolution between the subpixels 106 at positions other than the boundary of the pixels 102 are inferior, but the sensitivity is higher. For example, it is suitable for a case where crosstalk suppression is not emphasized so much, such as a case where the pixel 102 is provided with a filter 112 and no filter is provided for each subpixel 106.

Forty-Sixth Embodiment

Figure 98:
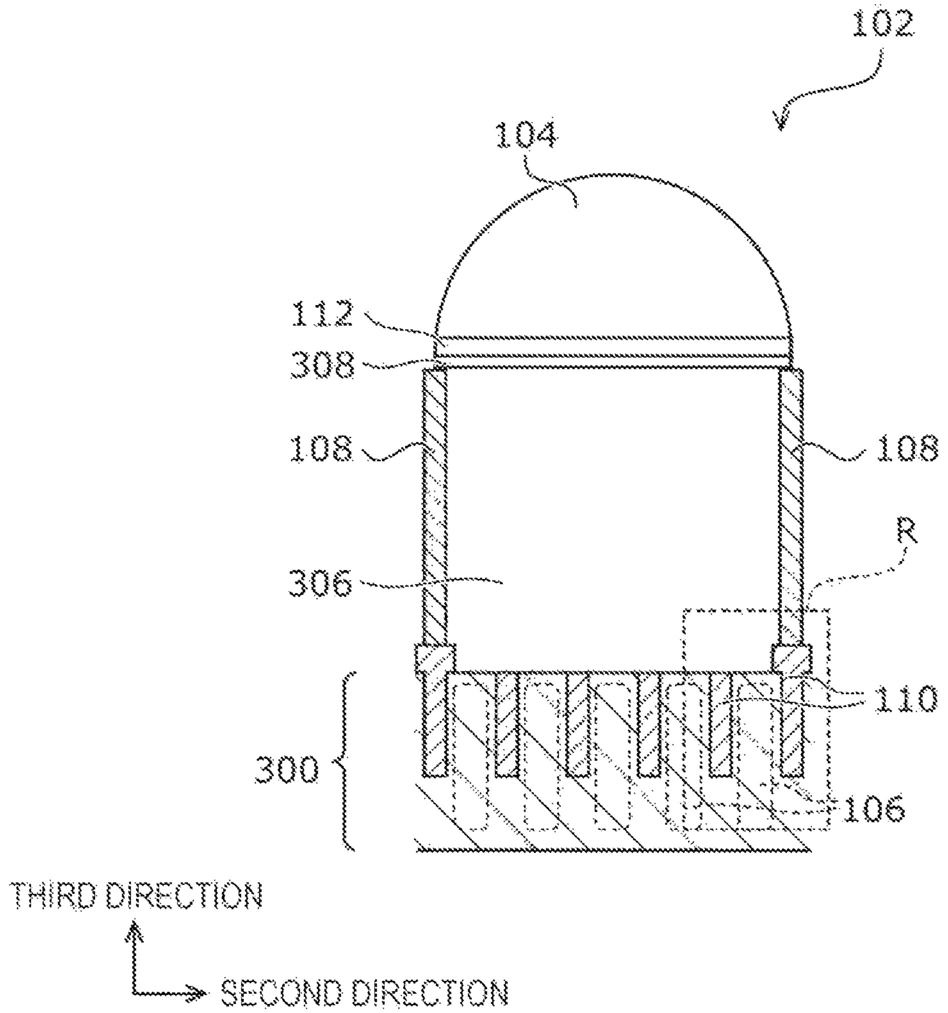
FIG. 98 is a cross-sectional view schematically illustrating an imaging pixel according to an embodiment.

FIG. 98 is a cross-sectional view illustrating an example of an imaging pixel according to an embodiment. A photoelectric conversion element isolation portion 110 is formed by different configurations between isolation of pixels 102 and isolation of subpixels 106. The photoelectric conversion element isolation portion 110 between the subpixels 106 in the same pixel 102 has a similar configuration to the examples of FIGS. 92 and 93, while the photoelectric conversion element isolation portion 110 between the pixels 102 has a similar configuration to the examples of FIGS. 6 and 7.

Figure 99:
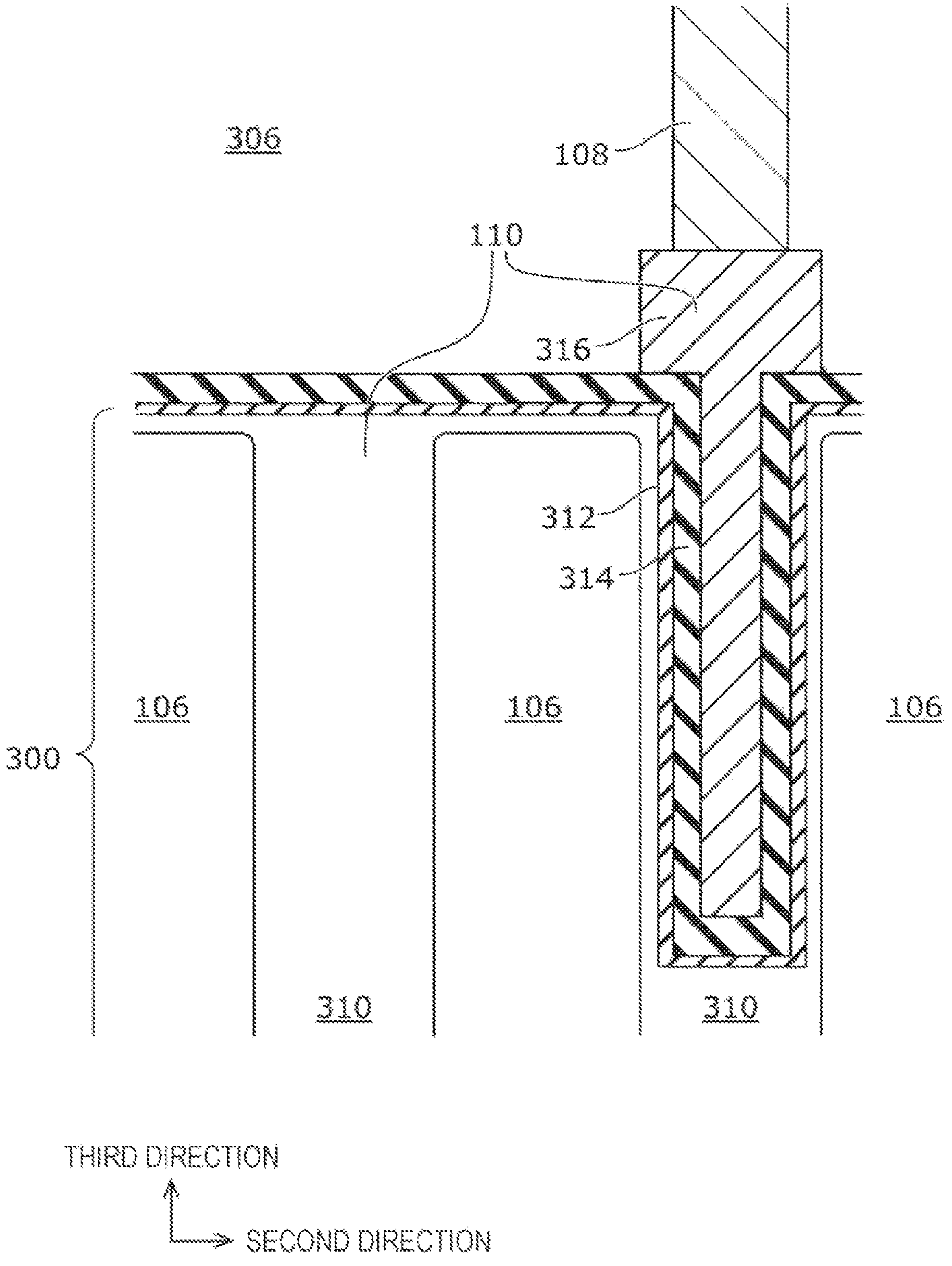
FIG. 99 is a cross-sectional view schematically illustrating an isolation portion according to an embodiment.

FIG. 99 is a cross-sectional view illustrating an example of the photoelectric conversion element isolation portion 110 according to an embodiment. Between the pixels 102, the photoelectric conversion element isolation portion 110 has a metal film 316 embedded in a trench in addition to an insulating film 314 and a fixed charge film 312. As compared with the example of FIGS. 96 and 97, the metal film 316 provided in the trench near a boundary of the pixel 102 causes a dark current and white spot characteristic degradation of the neighboring subpixels 106, and there is a concern about sensitivity degradation, but optical crosstalk between the pixels 102 is suppressed.

Forty-Seventh Embodiment

Figure 100:
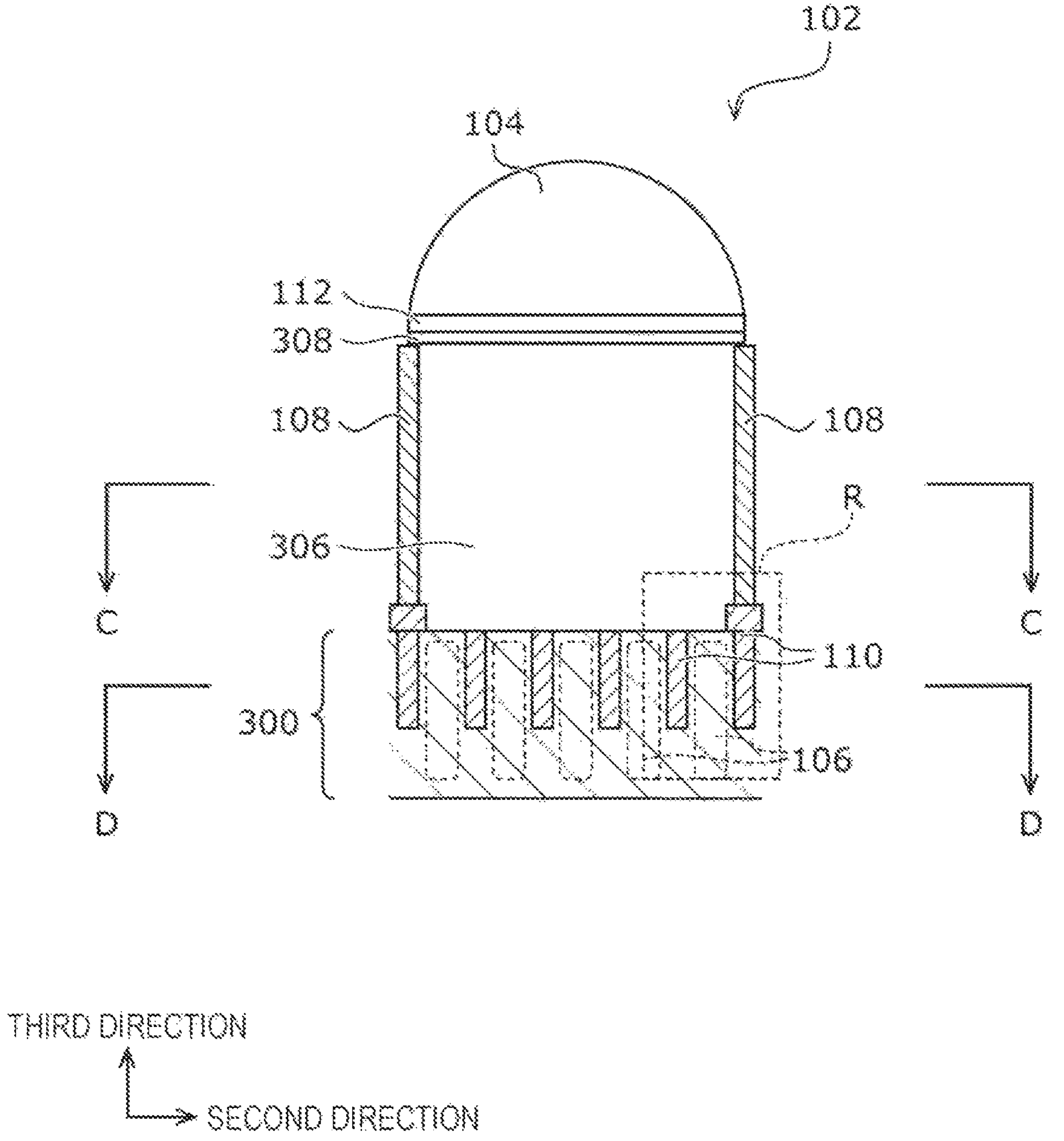
FIG. 100 is a cross-sectional view schematically illustrating an imaging pixel according to an embodiment.

FIG. 100 is a cross-sectional view illustrating an example of an imaging pixel according to an embodiment. A photoelectric conversion element isolation portion 110 is formed by different configurations between isolation of pixels 102 and isolation of subpixels 106. A photoelectric conversion element isolation portion 110 between the subpixels 106 in the same pixel 102 has a configuration in which an insulator is embedded in a trench. The photoelectric conversion element isolation portion 110 between the pixels 102 has a similar configuration to the example of FIGS. 96 and 97.

Figure 101:
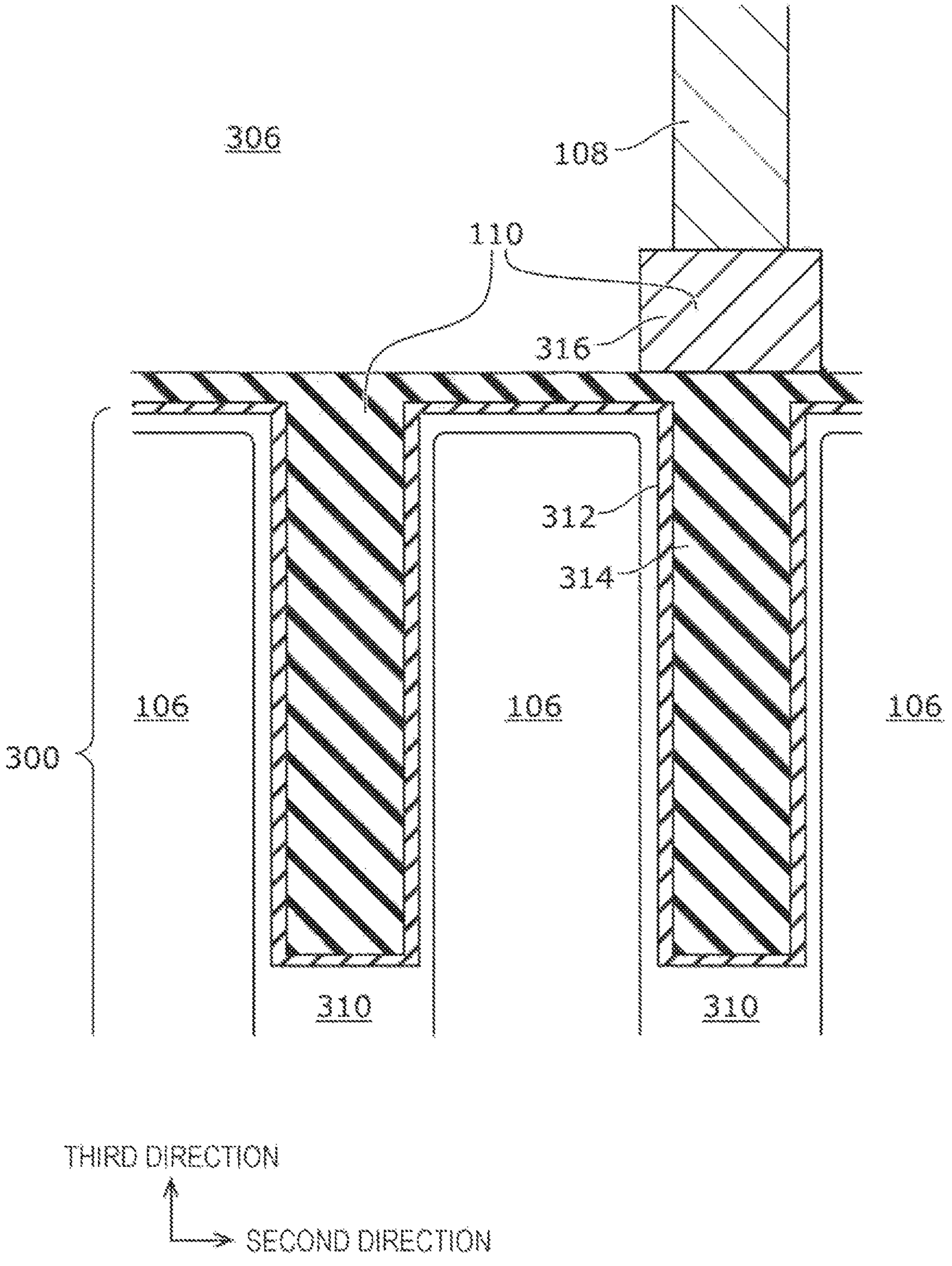
FIG. 101 is a cross-sectional view schematically illustrating an isolation portion according to an embodiment.

FIG. 101 is a cross-sectional view illustrating an example of the photoelectric conversion element isolation portion 110 according to an embodiment. The photoelectric conversion element isolation portion 110 is provided with a metal film 316 above an interface of a semiconductor substrate 300 between the pixels 102. The photoelectric conversion element isolation portion 110 does not include the metal film 316 except between the pixels 102. As compared with the example of FIGS. 90 and 91, an optical crosstalk suppression effect is impaired, but there is an advantage that sensitivity is increased. For example, it is suitable for a case where crosstalk suppression is not emphasized so much, such as a case where the pixel 102 is provided with a filter 112 and no filter is provided for each subpixel 106.

Forty-Eighth Embodiment

Figure 102:
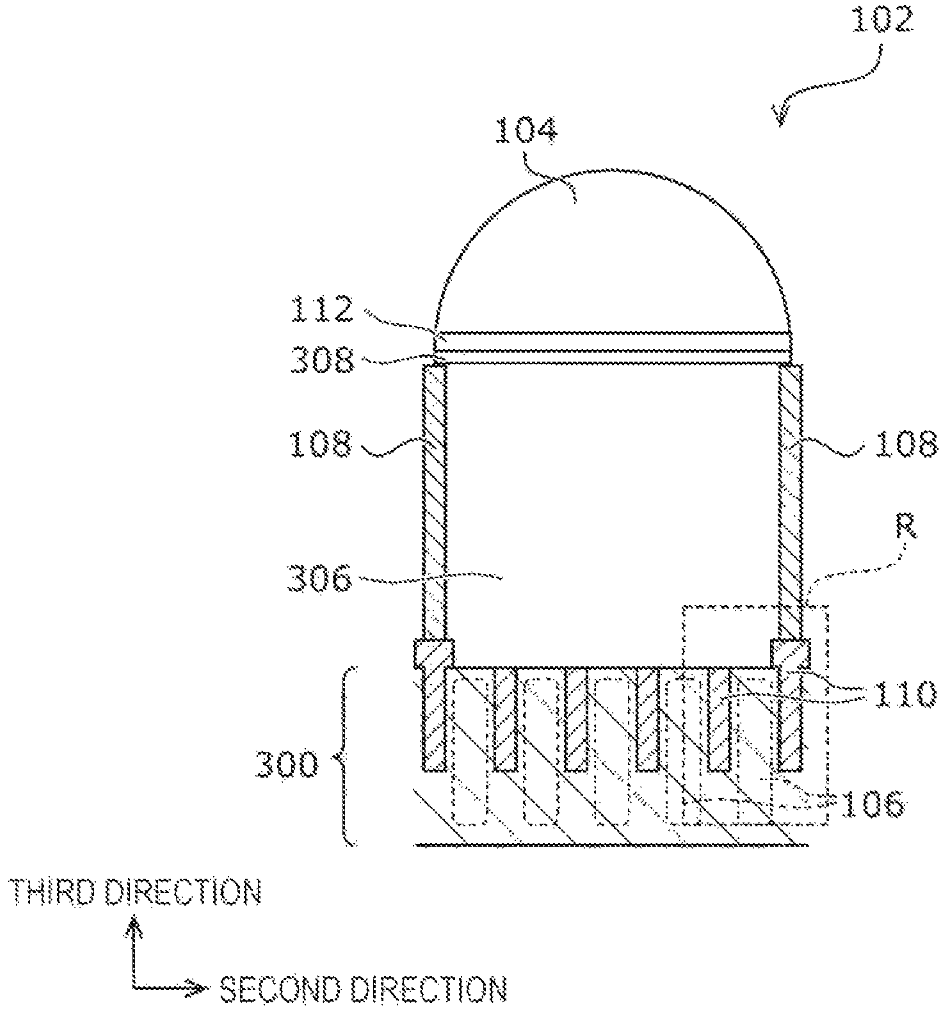
FIG. 102 is a cross-sectional view schematically illustrating an imaging pixel according to an embodiment.

FIG. 102 is a cross-sectional view illustrating an example of an imaging pixel according to an embodiment. A photoelectric conversion element isolation portion 110 is formed by different configurations between isolation of pixels 102 and isolation of subpixels 106. The photoelectric conversion element isolation portion 110 between the subpixels 106 in the same pixel 102 has a similar configuration to the examples of FIGS. 100 and 101, while the photoelectric conversion element isolation portion 110 between the pixels 102 has a similar configuration to the examples of FIGS. 6 and 7.

Figure 103:
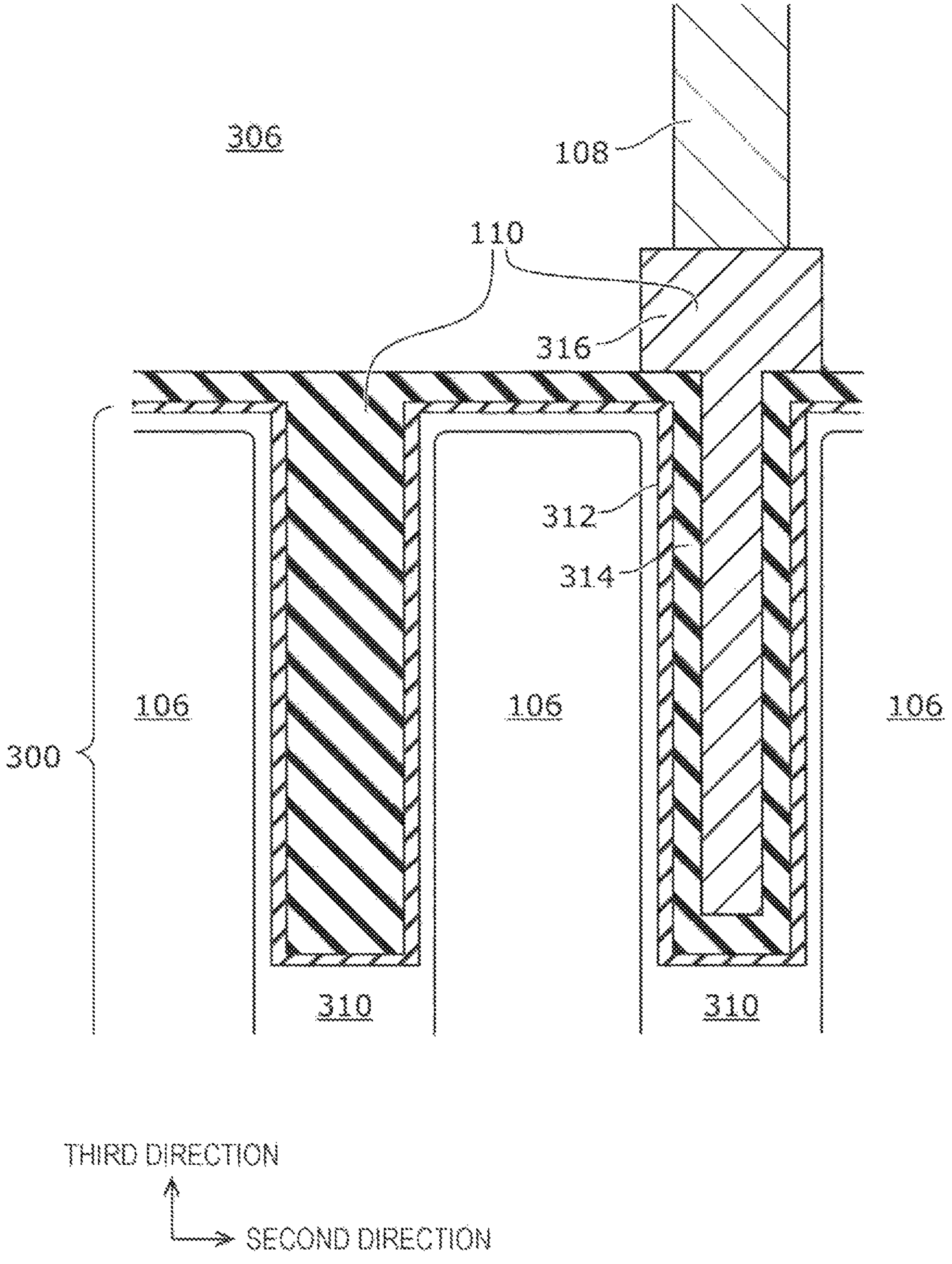
FIG. 103 is a cross-sectional view schematically illustrating an isolation portion according to an embodiment.

FIG. 103 is a cross-sectional view illustrating an example of the photoelectric conversion element isolation portion 110 according to an embodiment. Between the pixels 102, a metal film 316 is embedded in the photoelectric conversion element isolation portion 110 in addition to an insulating film 314 and a fixed charge film 312. As compared with the example of FIGS. 101 and 102, there are concerns about a dark current, deterioration of white spot characteristics, and a decrease in sensitivity in the subpixels 106 between the pixels 102, but optical crosstalk between the pixels 102 is suppressed.

Forty-Ninth Embodiment

Figure 104:
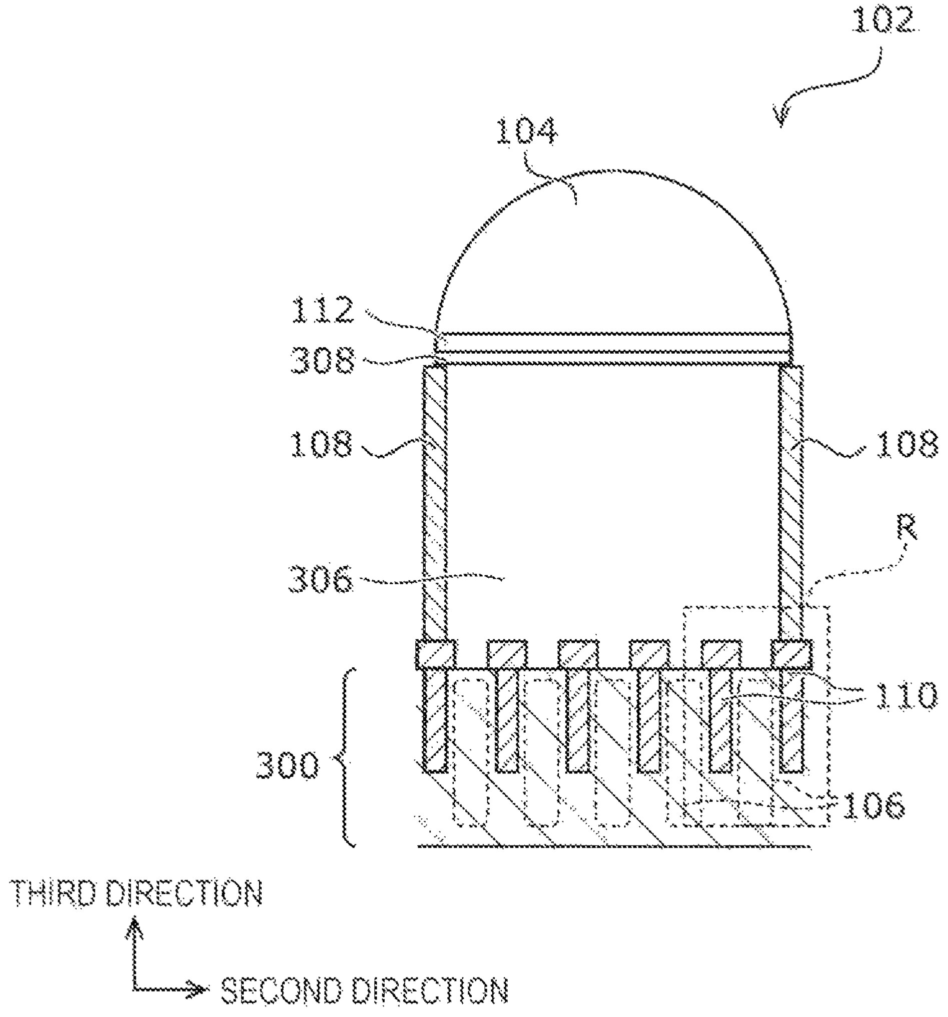
FIG. 104 is a cross-sectional view schematically illustrating an imaging pixel according to an embodiment.

FIG. 104 is a cross-sectional view illustrating an example of an imaging pixel according to an embodiment. A photoelectric conversion element isolation portion 110 is formed by different configurations between isolation of pixels 102 and isolation of subpixels 106. The photoelectric conversion element isolation portion 110 between the subpixels 106 in the same pixel 102 has a similar configuration to the example of FIGS. 91 and 92, while the photoelectric conversion element isolation portion 110 between the pixels 102 has a similar configuration to the example of FIGS. 93 and 94.

Figure 105:
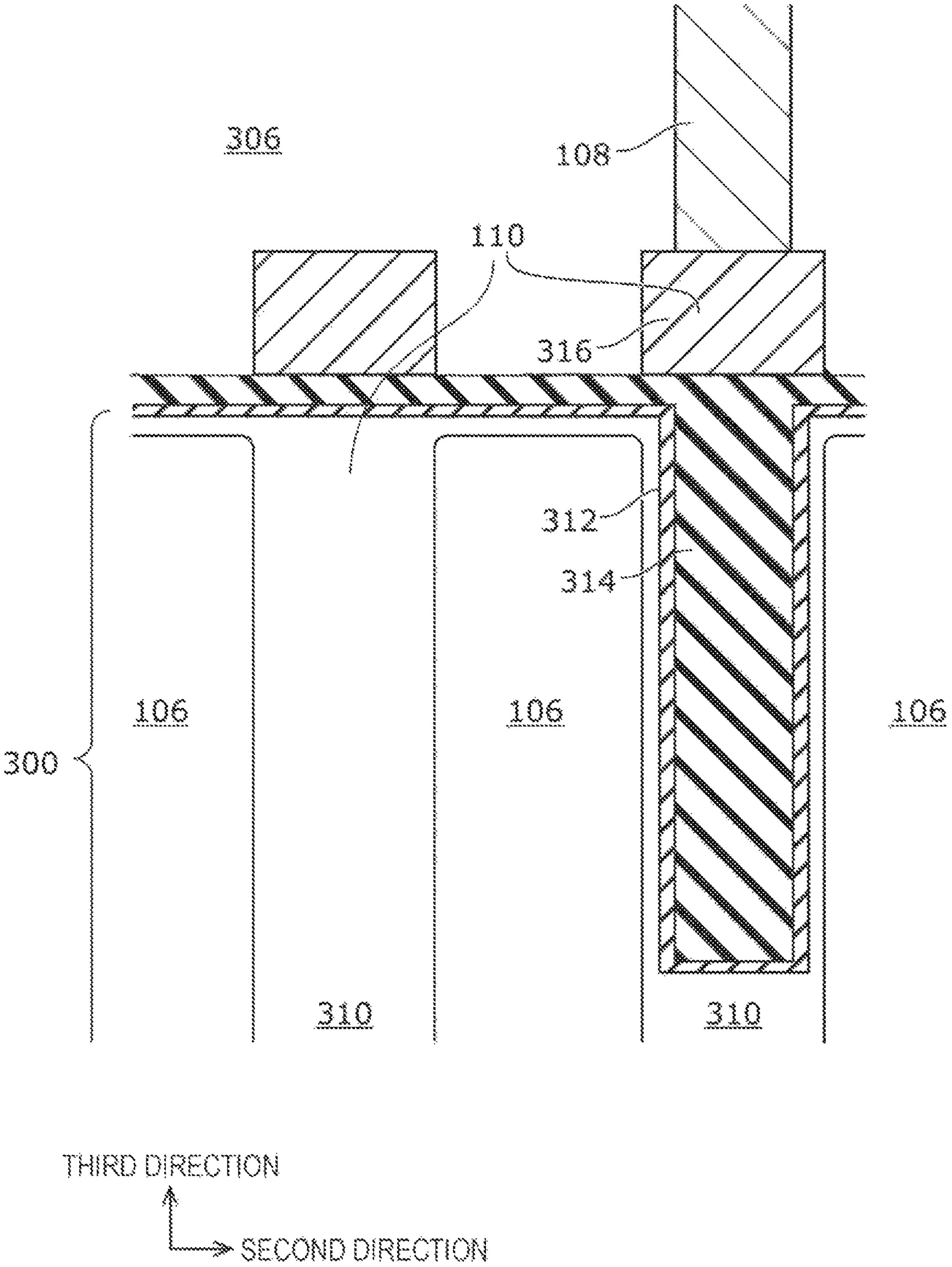
FIG. 105 is a cross-sectional view schematically illustrating an isolation portion according to an embodiment.

FIG. 105 is a cross-sectional view illustrating an example of the photoelectric conversion element isolation portion 110 according to an embodiment. The photoelectric conversion element isolation portion 110 is provided with a metal film 316 above an interface of a semiconductor substrate 300 between the pixels 102. Although sensitivity of the photoelectric conversion element isolation portion 110 decreases due to vignetting by the metal film 316, optical crosstalk is suppressed and angular resolution is improved.

Fiftieth Embodiment

Figure 106:
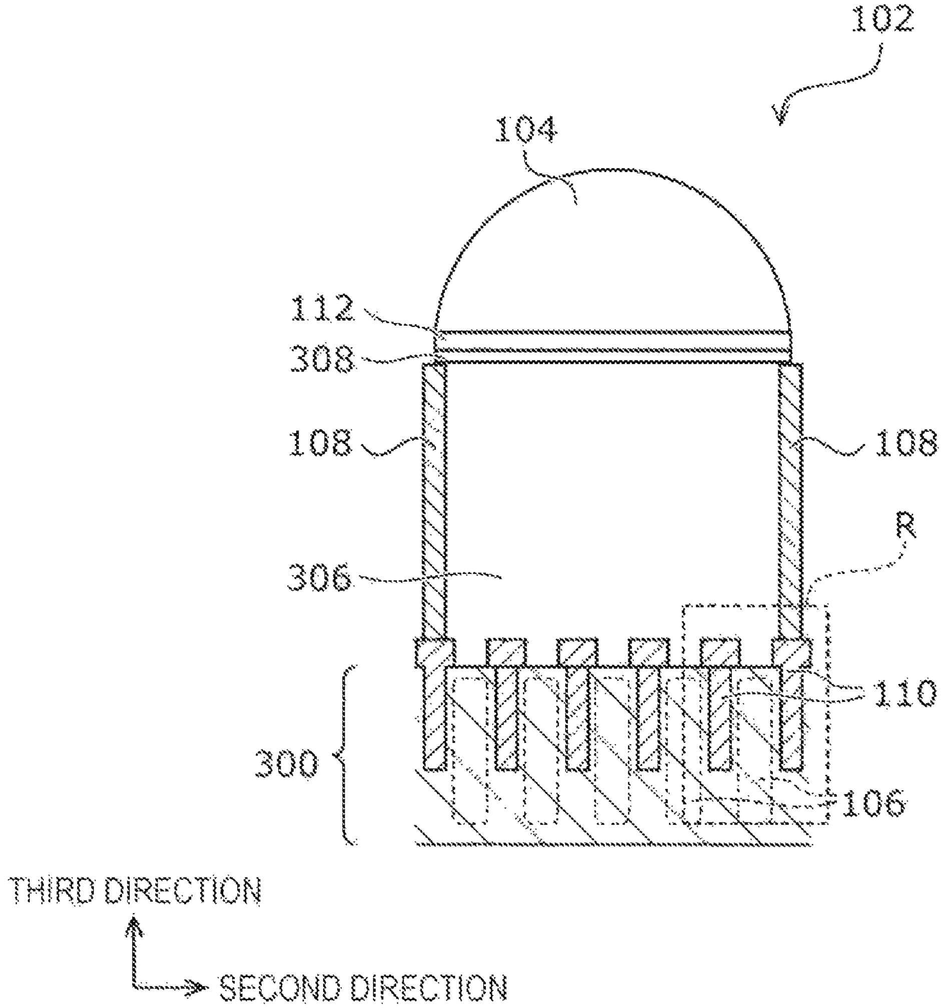
FIG. 106 is a cross-sectional view schematically illustrating an imaging pixel according to an embodiment.

FIG. 106 is a cross-sectional view illustrating an example of an imaging pixel according to an embodiment. A photoelectric conversion element isolation portion 110 is formed by different configurations between isolation of pixels 102 and isolation of subpixels 106. The photoelectric conversion element isolation portion 110 between the subpixels 106 in the same pixel 102 has a similar configuration to the examples of FIGS. 92 and 93, while the photoelectric conversion element isolation portion 110 between the pixels 102 has a similar configuration to the examples of FIGS. 6 and 7.

Figure 107:
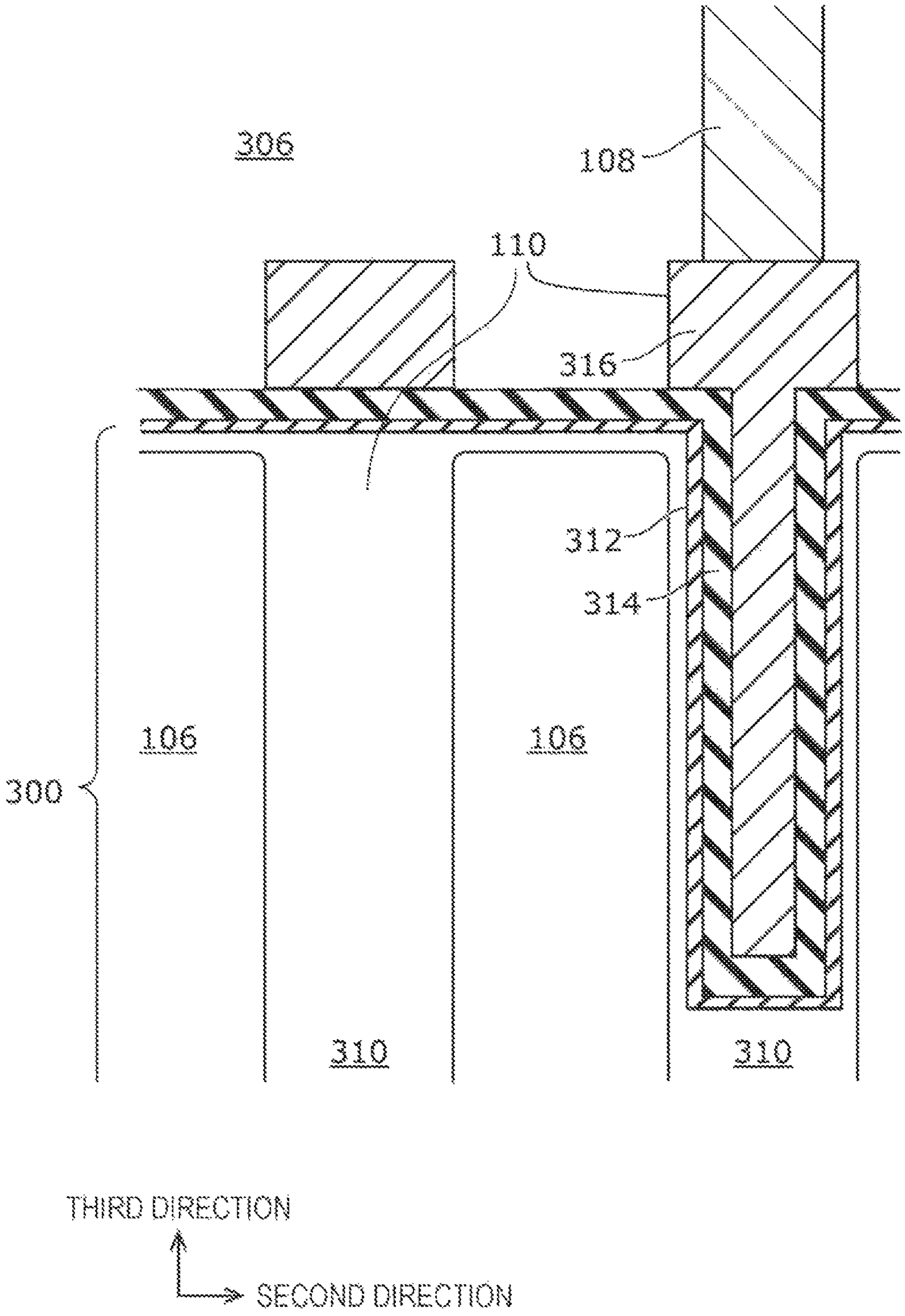
FIG. 107 is a cross-sectional view schematically illustrating an isolation portion according to an embodiment.

FIG. 107 is a cross-sectional view illustrating an example of the photoelectric conversion element isolation portion 110 according to an embodiment. Between the pixels 102, a metal film 316 is embedded in the photoelectric conversion element isolation portion 110 in addition to an insulating film 314 and a fixed charge film 312. As compared with the example of FIGS. 104 and 105, the photoelectric conversion element isolation portion 110 has concerns about a dark current, deterioration of white spot characteristics, and a decrease in sensitivity in the subpixels 106 near a boundary of the pixels 102, but optical crosstalk in the boundary portion of the pixels 102 is suppressed.

Fifty-First Embodiment

Figure 108:
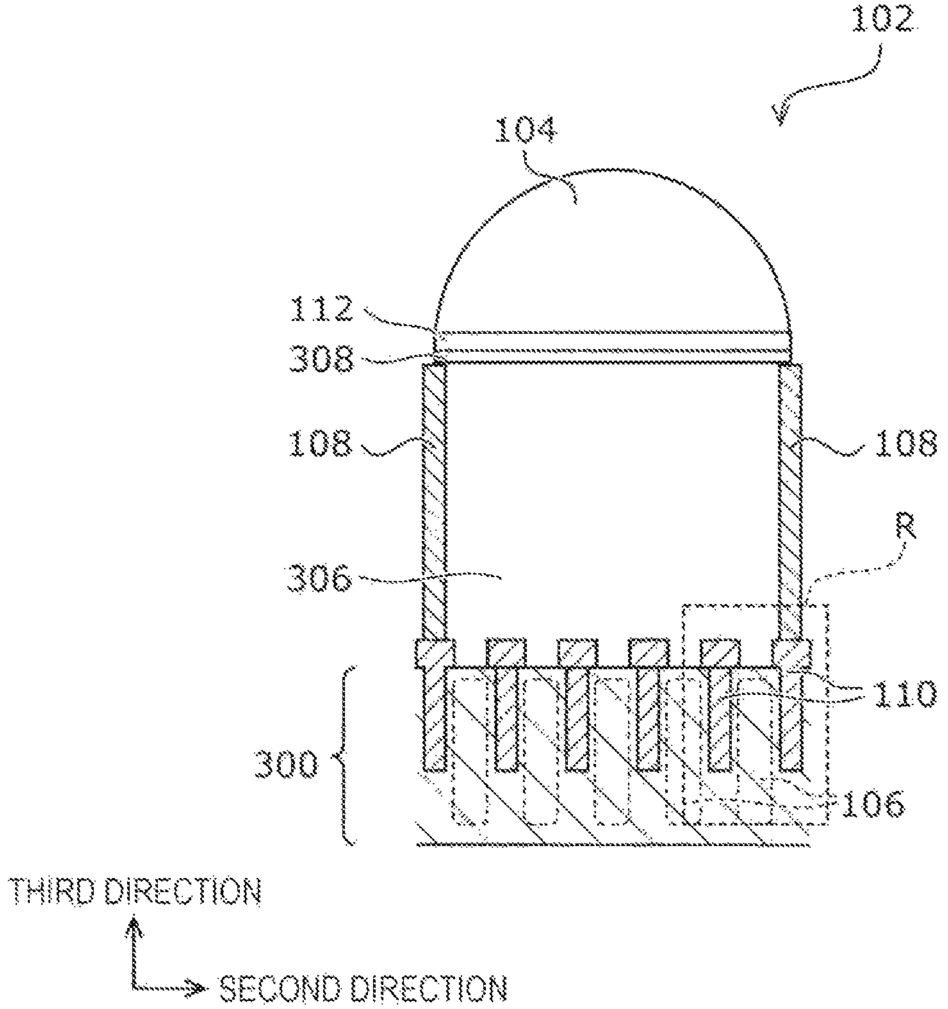
FIG. 108 is a cross-sectional view schematically illustrating an imaging pixel according to an embodiment.

FIG. 108 is a cross-sectional view illustrating an example of an imaging pixel according to an embodiment. A photoelectric conversion element isolation portion 110 is formed by different configurations between isolation of pixels 102 and isolation of subpixels 105. The photoelectric conversion element isolation portion 110 between the subpixels 106 in the same pixel 102 has a similar configuration to the examples of FIGS. 90 and 91, while the photoelectric conversion element isolation portion 110 between the pixels 102 has a similar configuration to the examples of FIGS. 6 and 7.

Figure 109:
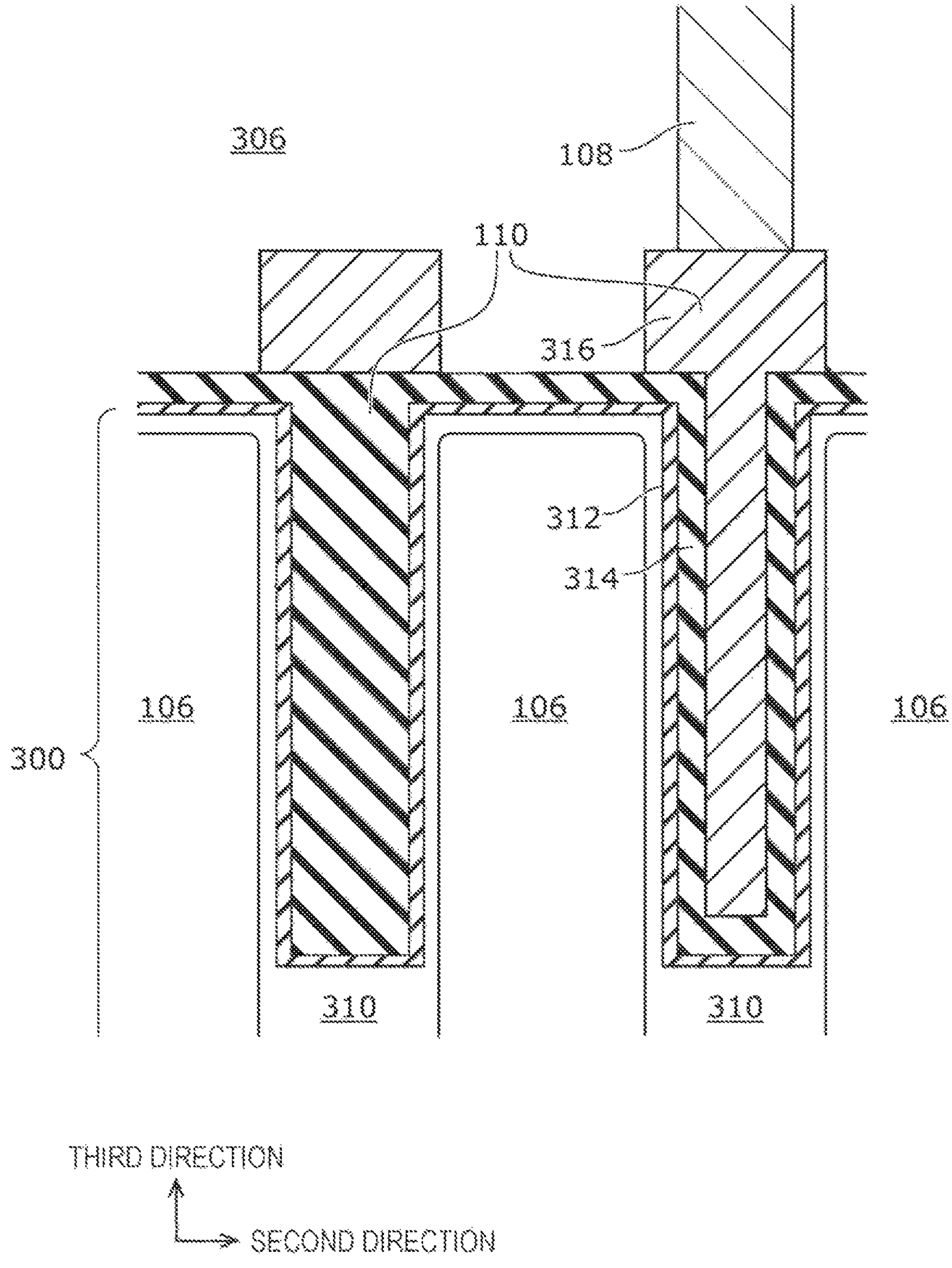
FIG. 109 is a cross-sectional view schematically illustrating an isolation portion according to an embodiment.

FIG. 109 is a cross-sectional view illustrating an example of the photoelectric conversion element isolation portion 110 according to an embodiment. Between the pixels 102, a metal film 316 is embedded in the photoelectric conversion element isolation portion 110 in addition to an insulating film 314 and a fixed charge film 312. As compared with the example of FIGS. 90 and 91, the photoelectric conversion element isolation portion 110 has concerns about a dark current, deterioration of white spot characteristics, and a decrease in sensitivity in the subpixels 106 near a boundary of the pixels 102, but optical crosstalk between the pixels 102 is suppressed.

Fifty-Second Embodiment

Figure 110:
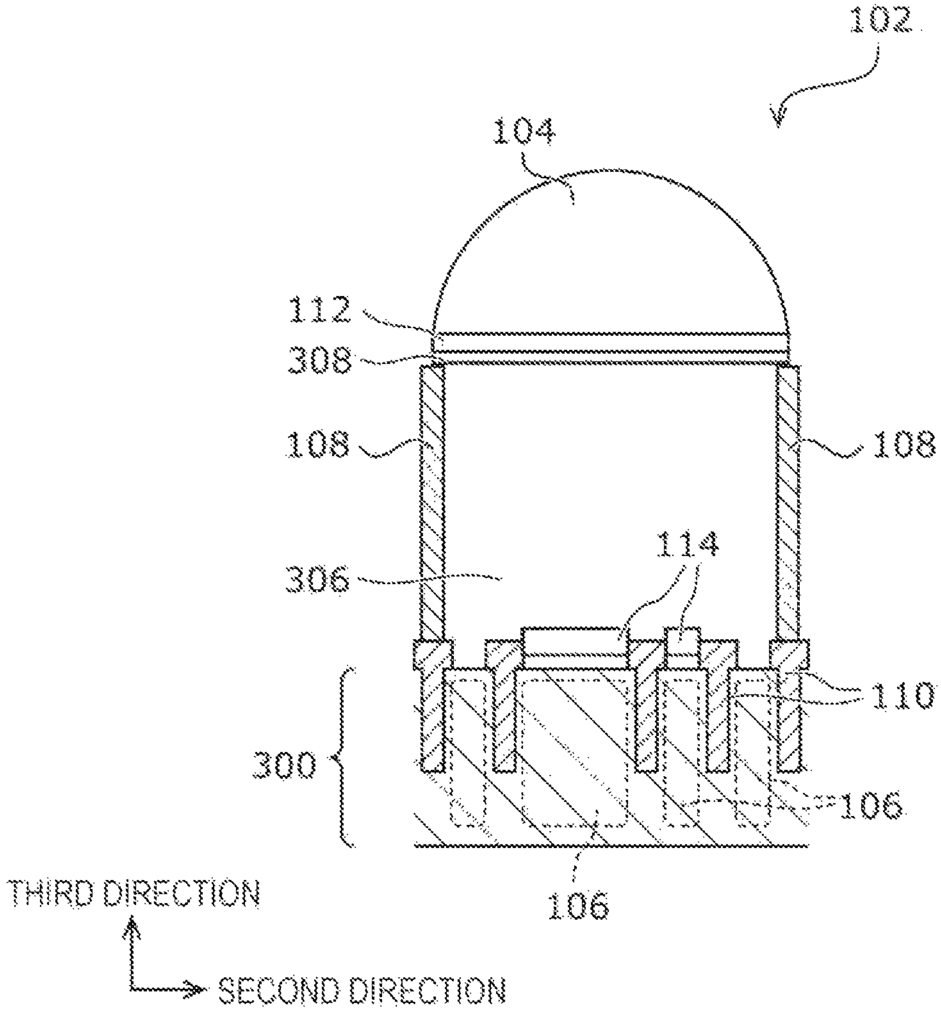
FIG. 110 is a cross-sectional view schematically illustrating an imaging pixel according to an embodiment.

FIG. 110 is a cross-sectional view illustrating an example of an imaging pixel according to an embodiment. A pixel 102 includes a filter 114, and a photoelectric conversion element isolation portions 110 between pixels 102 and between subpixels 106 in the same pixel 102 may be equivalent to those of the above-described embodiments.

An example of the pixel 102 illustrated in FIG. 110 is an arrangement example of a photoelectric conversion element isolation portion 110 in a case where a subpixel 106 included in the pixel 102 includes the filter 114 and the like. For example, in a case where the subpixels 106 including the same filters 114 or the like are adjacent to each other, it is not necessary to equally divide all the subpixels 106. For example, as illustrated in FIG. 110, the photoelectric conversion element isolation portion 110 may not be provided between the subpixels 106. Furthermore, similarly, the pixel 102 may not include a metal film 316 on an interface of a semiconductor substrate 300 as the photoelectric conversion element isolation portion 110.

This is given as an example, and a plurality of the subpixels 106 in the above-described embodiments may be combined into one subpixel 106. With such a configuration, an influence of vignetting on an upper portion of the photoelectric conversion element isolation portion 110 can be suppressed.

Hereinafter, light receiving characteristics of each subpixel 106 based on the shape, configuration, and the like of the photoelectric conversion element isolation portion 110 in the pixel 102 will be described. The graph illustrates sensitivity in the subpixels 106 illustrated in FIG. 68. The following characteristics are oblique incidence characteristics in the case of using the photoelectric conversion element isolation portion 110 in some of the above-described embodiments.

A portion above a metal film 316 in the following case has the same configuration to FIG. 70, and an optical path is designed so that a vicinity of an uppermost portion of the metal film 316 is in focus. Since only the photoelectric conversion element isolation portion 110 is different, and the measurement method, the analysis method, and the like are the same as those in FIG. 69 and the like, description thereof is herein omitted.

Figure 111:
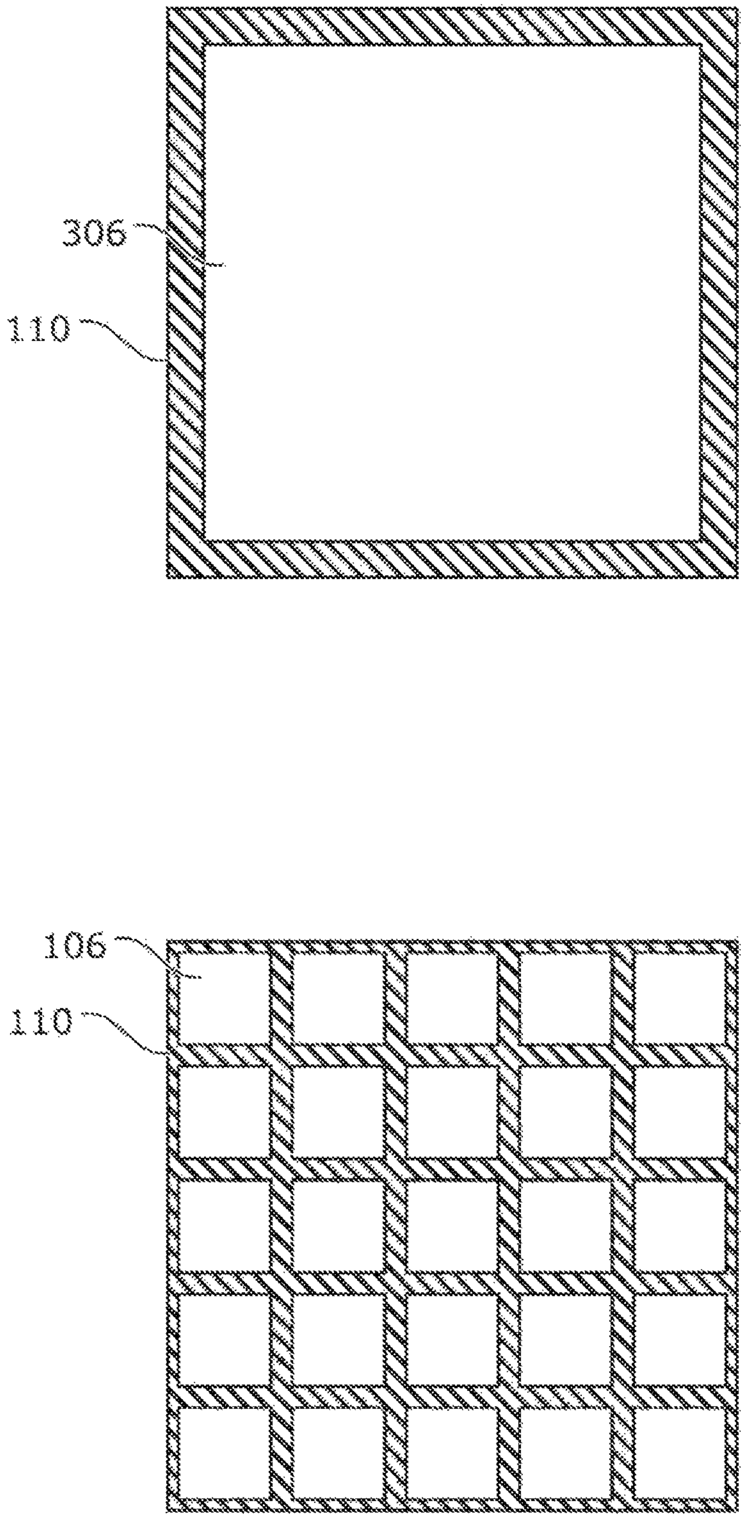
FIG. 111 is a cross-sectional view schematically illustrating an imaging pixel according to an embodiment.

FIG. 111 is a plan cross-sectional view of the pixel 102 according to an embodiment. This is an example of using the photoelectric conversion element isolation portion 110 of the pixel 102 in FIG. 100 focusing on sensitivity. The upper view is viewed from a C-C cross section in FIG. 100, and the lower view illustrates a D-D cross-sectional view in FIG. 100. Note that, unlike a normal cross-sectional view, hatching does not indicate a material thereof, but classifies, for example, light transmittance and electron transmittance. For example, the light transmittance is low (close to 0) in the slant-line portion, and the light transmittance is high (for example, transparent) in other portions.

In the photoelectric conversion element isolation portion 110, an insulating film 314 and a fixed charge film 312 are embedded in the semiconductor substrate 300. The insulating film 314 is, for example, an oxide film, and a surface of the semiconductor substrate 300 and a surface of the photoelectric conversion element isolation portion 110 are formed substantially flat.

Figure 112:
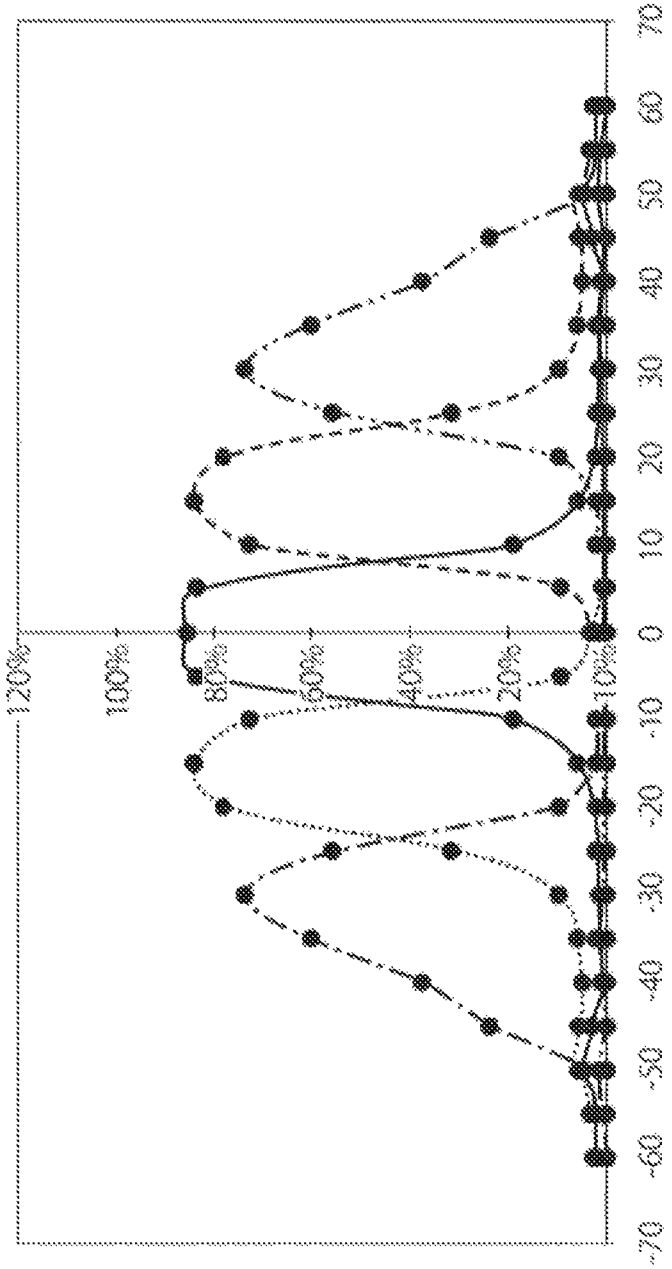
FIG. 112 is a graph illustrating sensitivity for each subpixel according to an embodiment.

FIG. 112 is a graph illustrating sensitivity characteristics in the case of FIG. 111. The position of the subpixel 106 having sensitivity is the same as that in FIG. 69 and the like. As illustrated in the drawing, in particular, the 3×3 region at a center does not have the metal film 316 and thus obtains good sensitivity characteristics.

Figure 113:
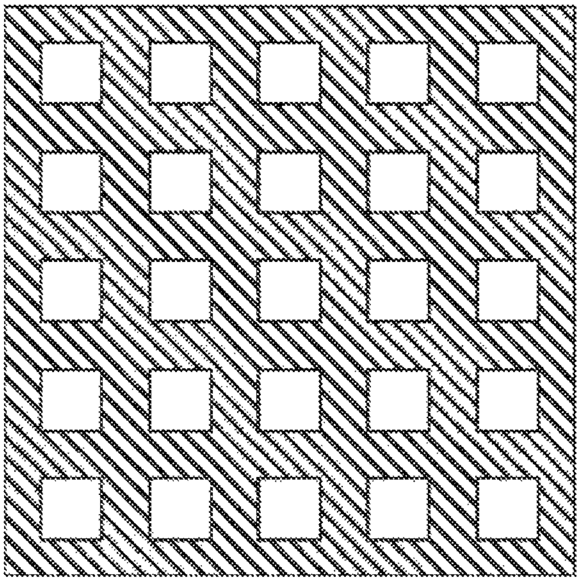
FIG. 113 is a cross-sectional view schematically illustrating an imaging pixel according to an embodiment.
Figure 113:
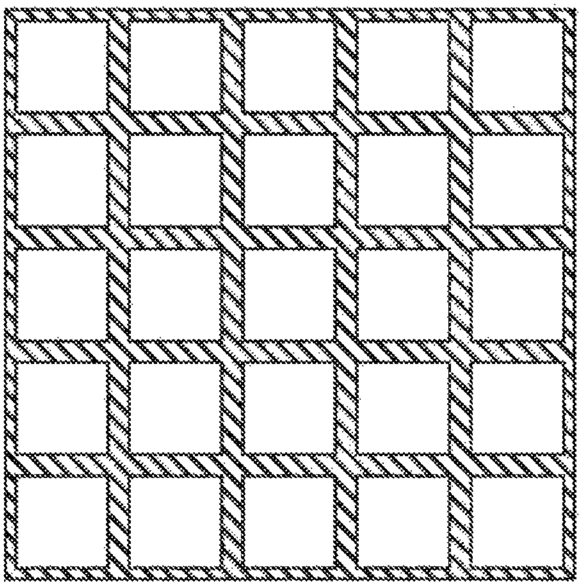

FIG. 113 is a plan cross-sectional view of the pixel 102 according to an embodiment. This is an example of using the photoelectric conversion element isolation portion 110 of the pixel 102 in FIG. 6 placing emphasis on suppression of crosstalk. The upper view is viewed from an E-E cross section in FIG. 6, and the lower view illustrates an F-F cross-sectional view in FIG. 6. The hatching is similar to that in FIG. 111.

In the photoelectric conversion element isolation portion 110, the insulating film 314, the fixed charge film 312, and the metal film 316 are embedded. The metal film 316 has a shape protruding from the surface of the semiconductor substrate 300 and slightly protruding above a light receiving element of the subpixel 106.

Figure 114:
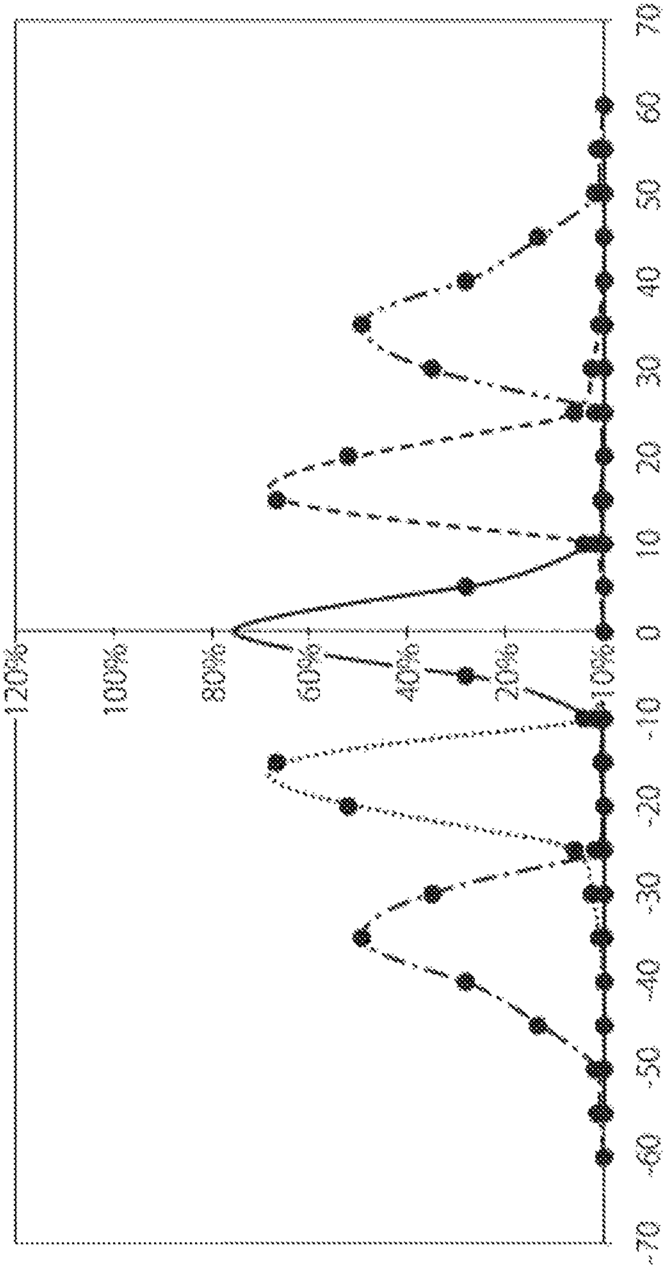
FIG. 114 is a graph illustrating sensitivity for each subpixel according to an embodiment.

FIG. 114 is a graph illustrating sensitivity characteristics in the case of FIG. 113. The position of the subpixel 106 having sensitivity is the same as that in FIG. 69 and the like. As illustrated in the drawing, the sensitivity itself is reduced but the crosstalk is significantly improved and there is little overlap of side lobes between the subpixels, as compared with the example of FIG. 112.

Figure 115:
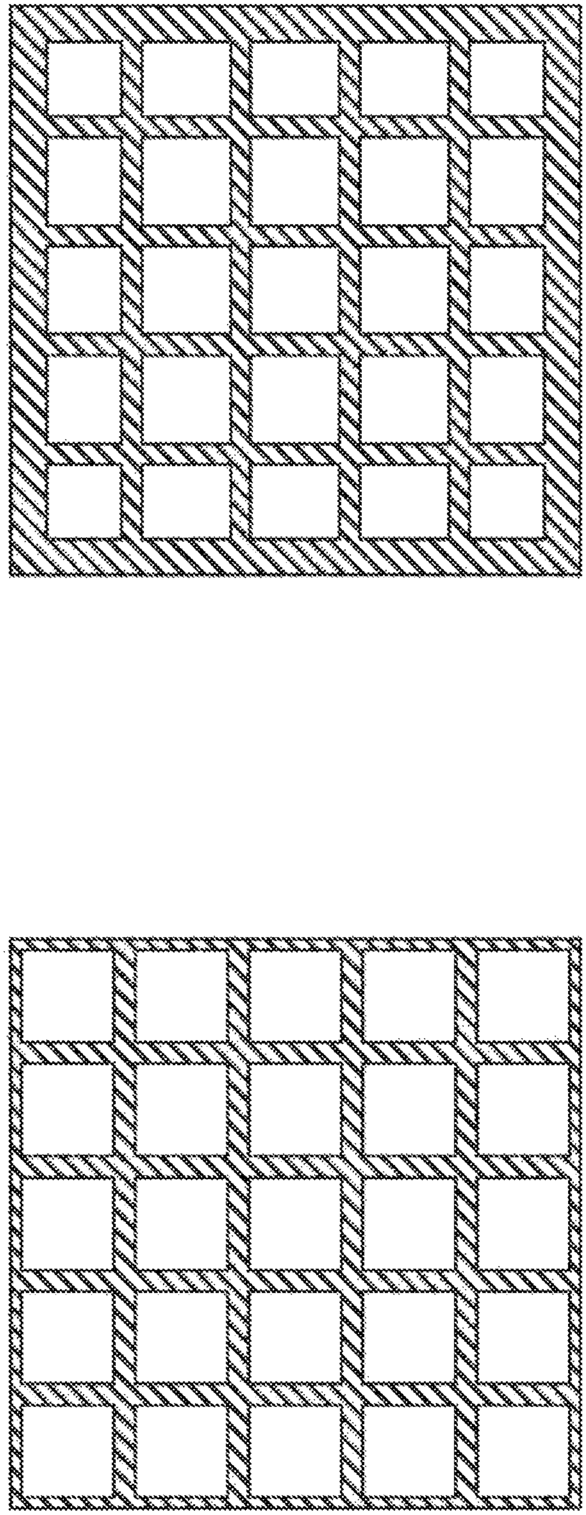
FIG. 115 is a cross-sectional view schematically illustrating an imaging pixel according to an embodiment.

FIG. 115 is a plan cross-sectional view of the pixel 102 according to an embodiment. The metal film 316 other than the metal film at the boundary of the pixel 102 is thinned. Similarly to FIG. 111 and the like, the upper view and the lower view respectively illustrate a plan cross-sectional view in a region of an interlayer film 306 of the pixel 102 and a cross-sectional view in the semiconductor substrate 300. This form is a shape between FIGS. 111 and 113, and the photoelectric conversion element isolation portion 110 protrudes from the surface of the semiconductor substrate 300 but does not cover the upper side of the light receiving element of the subpixel 106.

Figure 116:
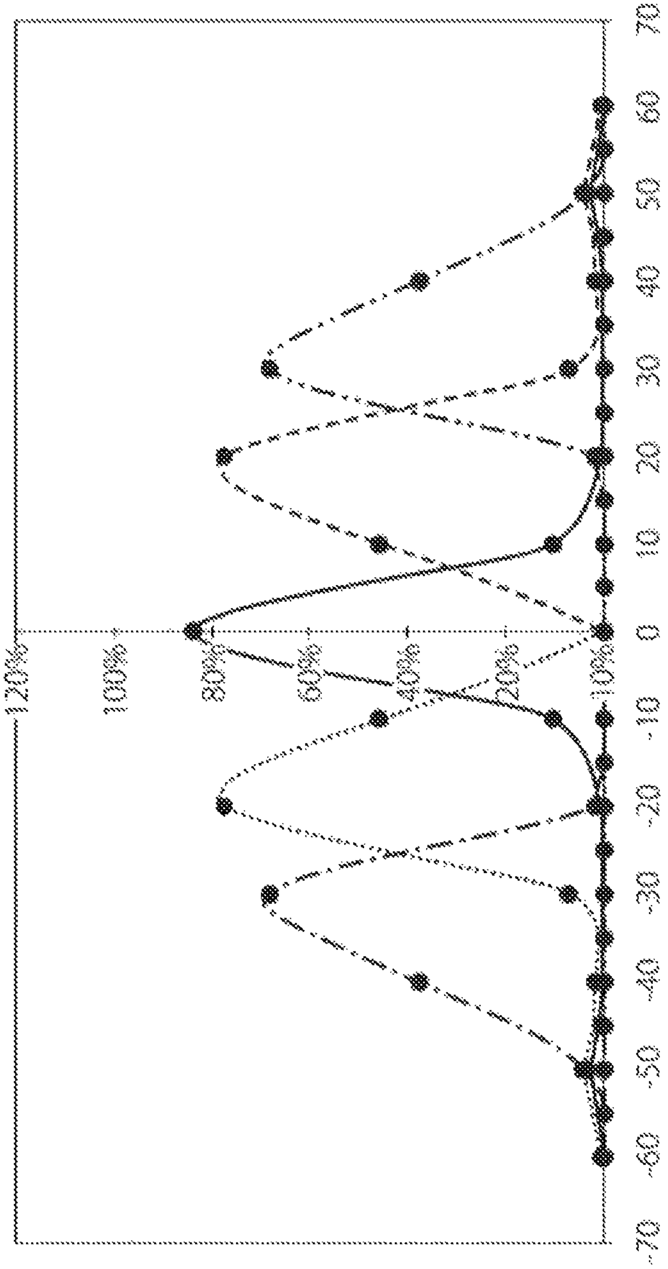
FIG. 116 is a graph illustrating sensitivity for each subpixel according to an embodiment.

FIG. 116 is a graph illustrating sensitivity characteristics in the case of FIG. 115. The position of the subpixel 106 having sensitivity is the same as that in FIG. 69 and the like. As illustrated in the drawing, it is possible to achieve both the sensitivity and the crosstalk by designing the metal film 316 other than the metal film at the boundary of the pixel 102 to be thin.

According to the above-described various embodiments of the photoelectric conversion element isolation portion 110, it is possible to design the photoelectric conversion element isolation portion 110 based on each purpose. This design can be determined by various factors such as the arrangement of the filter 112, the filter 114, and the like, required resolution, angular resolution, color resolution, the amount of suppression of crosstalk, and the like. As described above, according to these embodiments, it is possible to form the photoelectric conversion element isolation portion 110 according to various situations.

Fifty-Third Embodiment

The photoelectric conversion element isolation portion 110 described in the above several embodiments is an example in which the semiconductor substrate 300 is formed from the upper side in the third direction through manufacturing processes. Conversely, the photoelectric conversion element isolation portion 110 can be obtained by forming a trench from the wiring layer 302 side. Some photoelectric conversion element isolation portions 110 formed from the wiring layer 302 side will be described.

Note that the drawings of trench shapes penetrating the semiconductor substrate 300 are illustrated, but a trench shape that does not penetrate the semiconductor substrate up to the irradiation surface may be adopted, and the embodiment is not limited.

Figure 117:
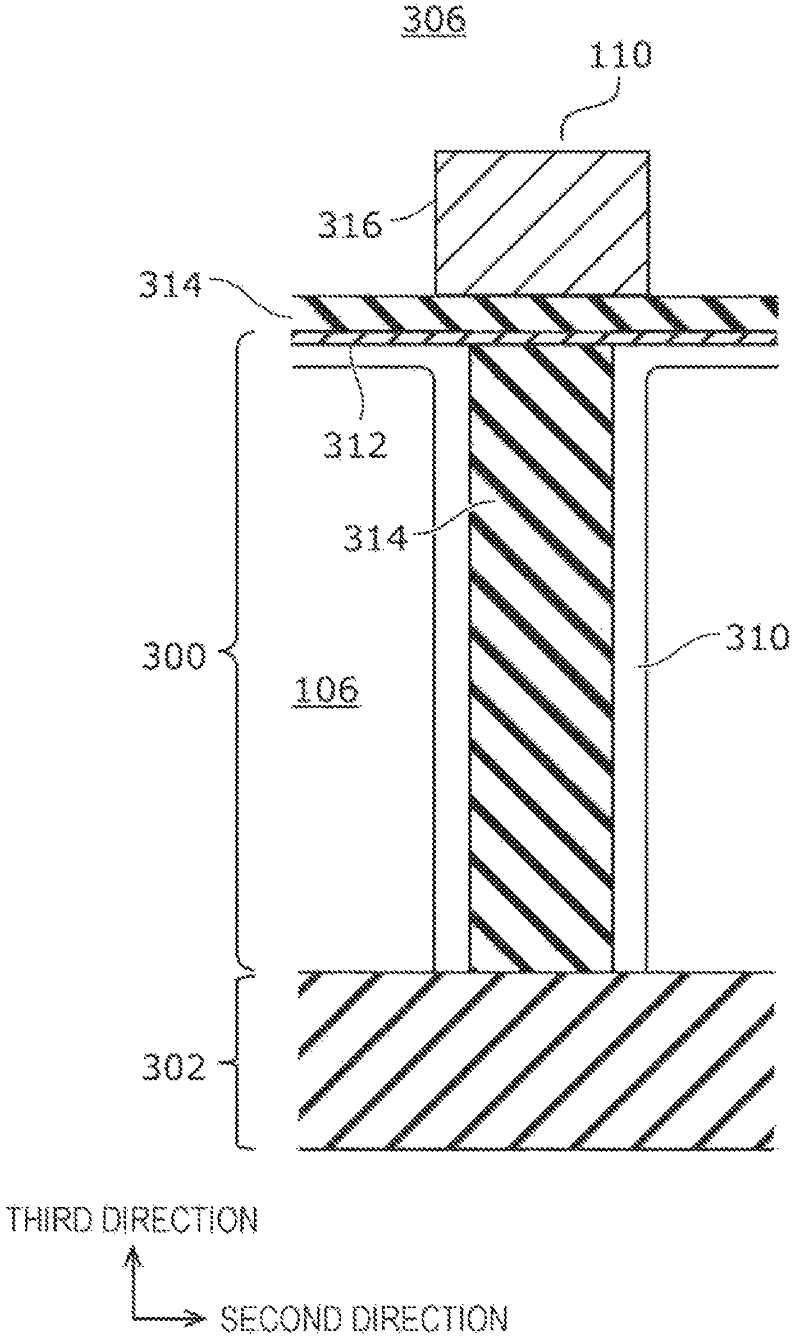
FIG. 117 is a cross-sectional view schematically illustrating an isolation portion according to an embodiment.

FIG. 117 is a cross-sectional view illustrating an example of an imaging pixel according to an embodiment. A photoelectric conversion element isolation portion 110 is formed by embedding an insulating film 314, for example, silicon nitride or silicon oxynitride, or a multilayer film thereof in an inner wall of a trench of a semiconductor substrate 300 processed from a wiring layer 302 side.

According to the photoelectric conversion element isolation portion 110 of the present embodiment, it is possible to suppress optical crosstalk by total reflection due to a difference in refractive index from the semiconductor substrate 300 and to suppress charge color mixture by the insulating film.

Fifty-Fourth Embodiment

Figure 118:
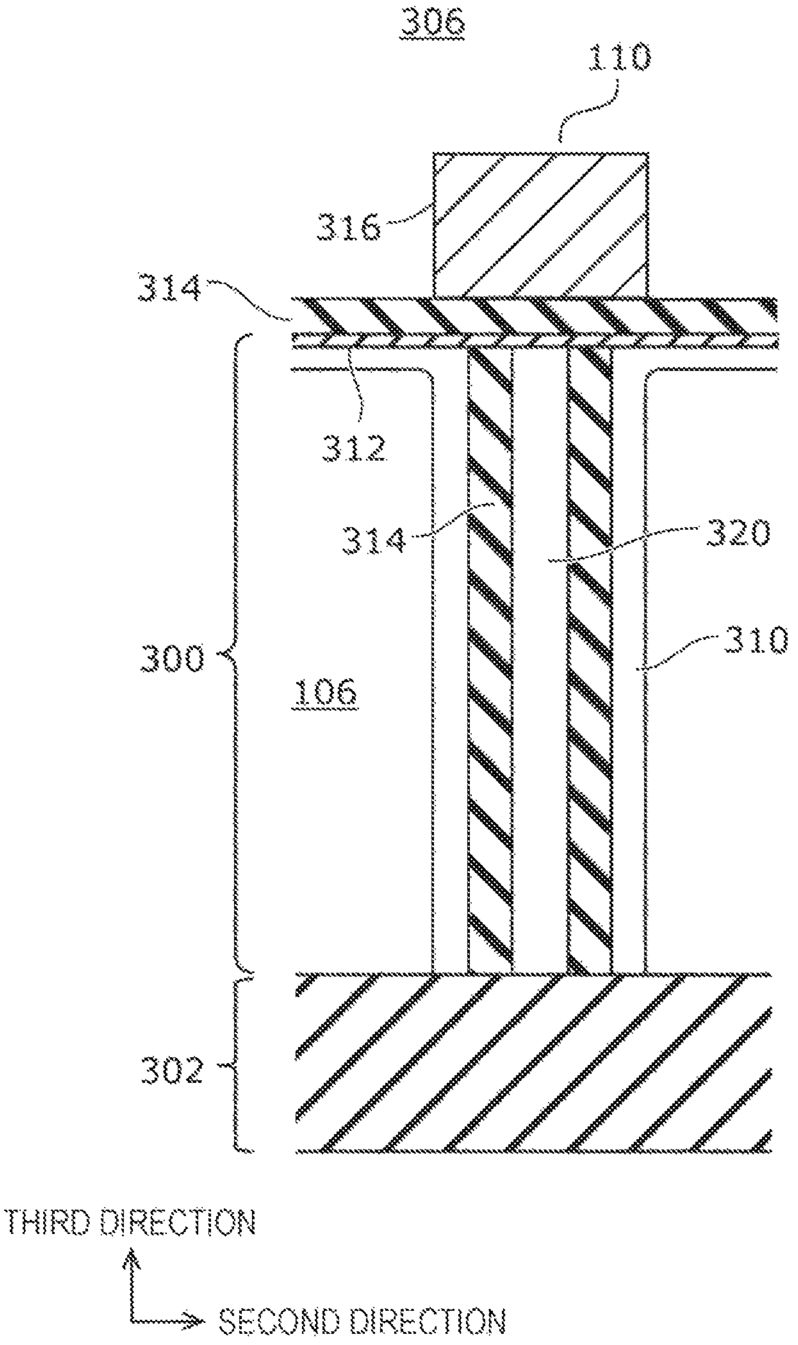
FIG. 118 is a cross-sectional view schematically illustrating an isolation portion according to an embodiment.

FIG. 118 is a cross-sectional view illustrating an example of an imaging pixel according to an embodiment. A photoelectric conversion element isolation portion 110 is formed by forming a sidewall film of the insulating film 314 on the inner wall of the trench of the semiconductor substrate 300 processed from the wiring layer 302 side and embedding polysilicon 320 inside the sidewall film. As the polysilicon 320, for example, doped polysilicon may be used, or n-type impurities or p-type impurities may be doped after polysilicon is filled.

According to the photoelectric conversion element isolation portion 110 of the present embodiment, it is possible to enhance pinning of the sidewall by applying a negative bias to the polysilicon 320 and improve dark time characteristics.

Fifty-Fifth Embodiment

Figure 119:
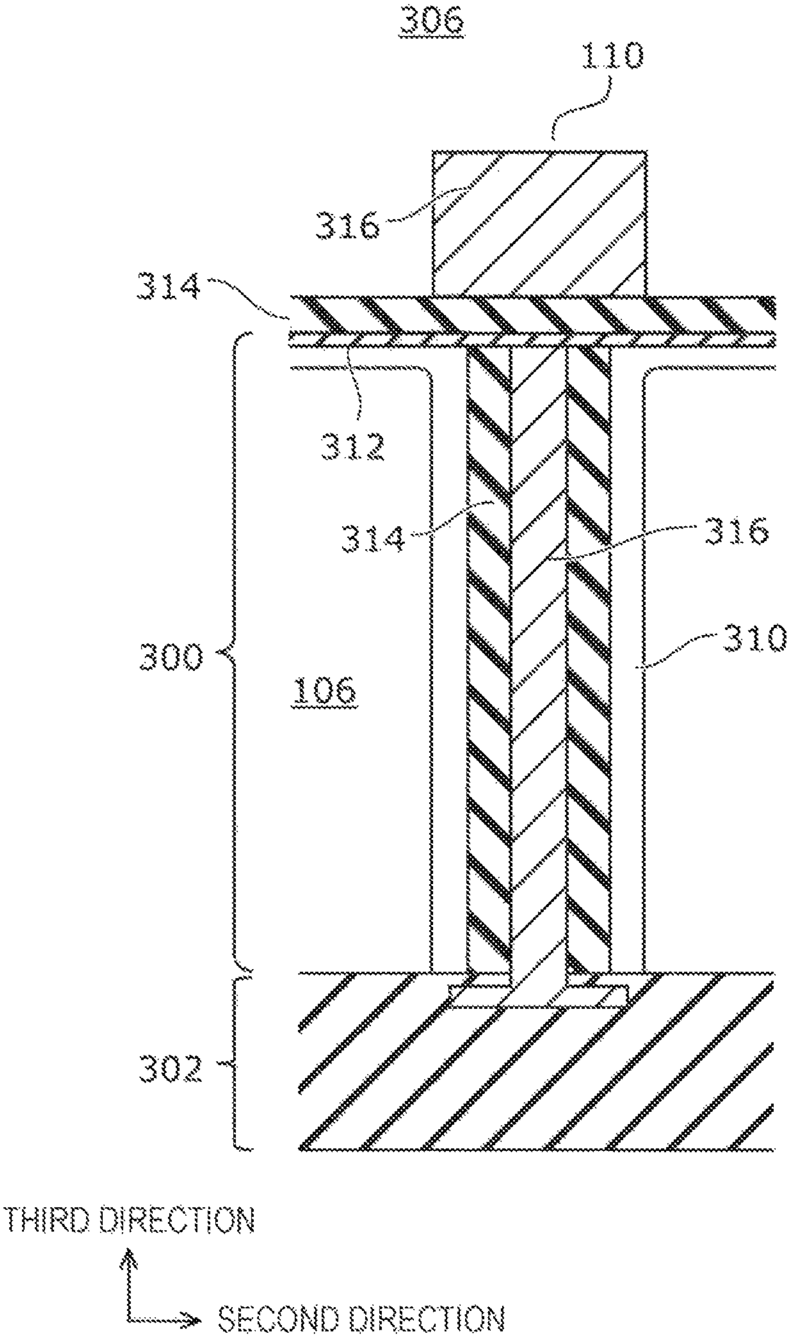

FIG. 119 is a cross-sectional view illustrating an example of an imaging pixel according to an embodiment. A photoelectric conversion element isolation portion 110 is formed by forming a sidewall film of an insulating film 314 on an inner wall of a trench of a semiconductor substrate 300 processed from a wiring layer 302 side and embedding a metal film 316 inside the sidewall film.

The metal film 316 may be, for example, a metal film of aluminum, silver, gold, copper, platinum, molybdenum, tungsten, chromium, titanium, nickel, iron, tellurium, or the like, a compound of these metals, or an alloy of these metals. Furthermore, these materials may be formed in multiple layers.

According to the photoelectric conversion element isolation portion 110 of the present embodiment, it is possible to enhance pinning of the sidewall by applying a negative bias to the metal film 316 and improve dark time characteristics. Moreover, it is possible to suppress crosstalk of a path penetrating the photoelectric conversion element isolation portion 110 by reflection, absorption, and the like by the metal film.

Fifty-Sixth Embodiment

Solid-phase diffusion is a process of forming a film containing impurities and diffusing the impurities into Si by, for example, heat treatment at around 1000° C. In a general imaging element, a PN junction of a photodiode is planarly formed by ion implantation, and Qs is improved by PN junction capacitance. Meanwhile, in a semiconductor formed by a process based on solid-phase diffusion, a Si substrate is subjected to trench processing, an electric field is increased in a trench sidewall with a steep profile due to the solid-phase diffusion, an area is secured in the sidewall, and a significant improvement in Qs is achieved.

The solid-phase diffusion is limited before formation of a wiring layer 302 due to heat treatment restrictions. In the solid-phase diffusion, since the sidewall is used as a capacitance, a vertical transistor 324 may be adopted, which is formed in a third direction of a semiconductor substrate 300 so as to reach an n-type semiconductor region where photoelectric conversion is performed. In the process, the vertical transistor 324 may be connected to a power supply via a wiring 304, for example.

According to the solid-phase diffusion, a high-concentration p-type semiconductor region is formed in the semiconductor substrate 300. In this process, since a transistor or the like formed as a semiconductor device is formed on the wiring layer 302 side of the semiconductor substrate 300, there is an n-type semiconductor region, and a strong electric field portion is generated between the p-type and the n-type. As a countermeasure, a region that does not undergo solid-phase diffusion may be formed in the vicinity of a surface of the trench that undergoes solid-phase diffusion on the wiring layer 302 side, for example, up to about 700 nm. This region is formed in the manufactured semiconductor, for example, as a region indicated as a well region 310 in the drawing.

Some modifications of a photoelectric conversion element isolation portion 110 using the solid-phase diffusion will be described.

Figure 120:
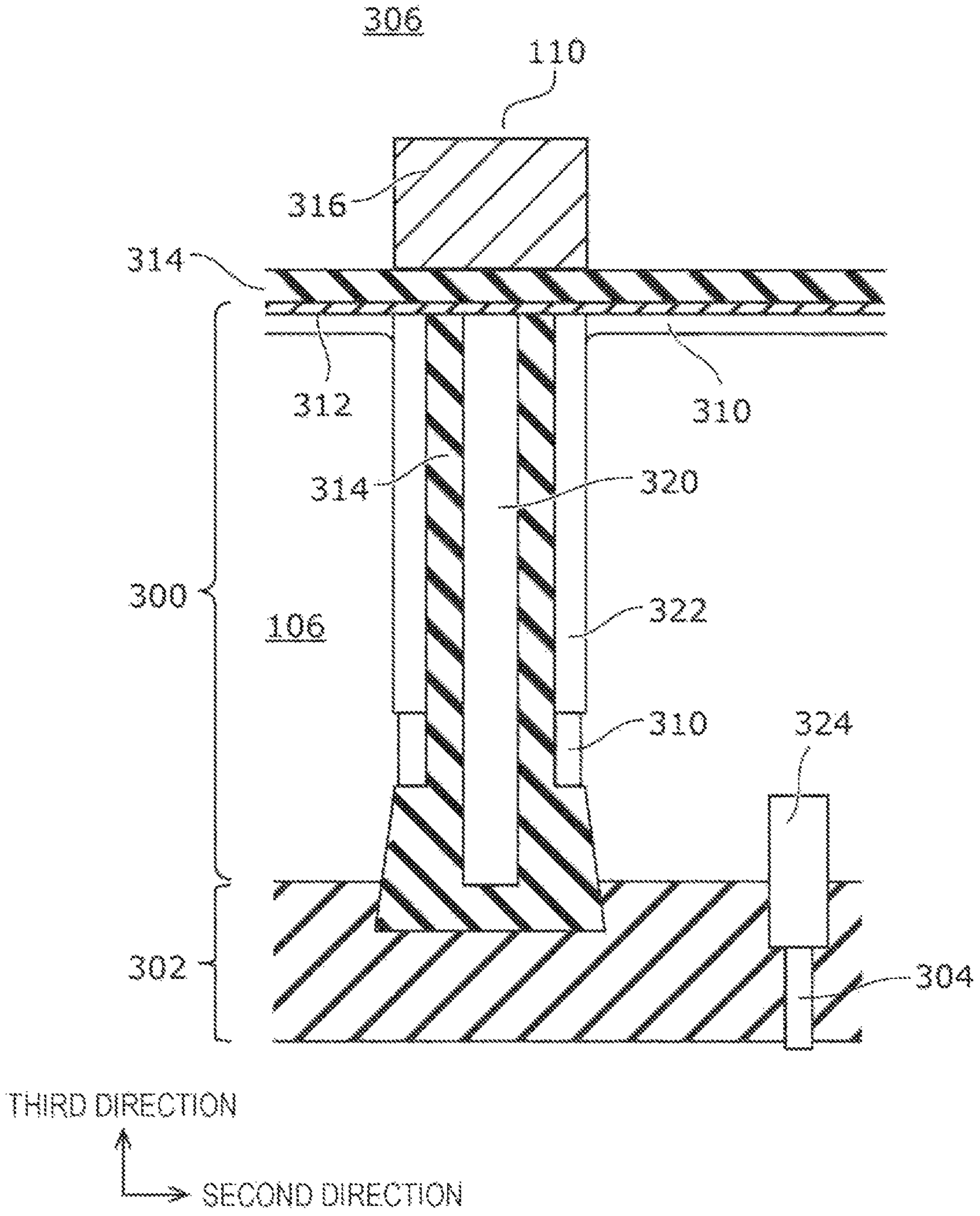

FIG. 120 is a cross-sectional view illustrating an example of the photoelectric conversion element isolation portion 110 according to an embodiment. The semiconductor substrate 300 has a stepped trench shape having different widths in a third direction. The trench has a larger width on the wiring layer 302 side of the semiconductor substrate 300 than the width on the lens 104 side.

In the semiconductor substrate 300, a solid-phase diffused impurity region 322 is provided beside the region having the narrow trench width, and an insulating film 314, for example, silicon oxide, silicon nitride, or the like is embedded in the trench. Polysilicon 320 may be embedded as a filler in a gap of the insulating film 314.

As the polysilicon, for example, doped polysilicon may be used, or n-type impurities or p-type impurities may be doped after polysilicon is filled. By applying a negative bias thereto, it is possible to enhance pinning of a trench sidewall and improve dark time characteristics.

Fifty-Seventh Embodiment

Figure 121:
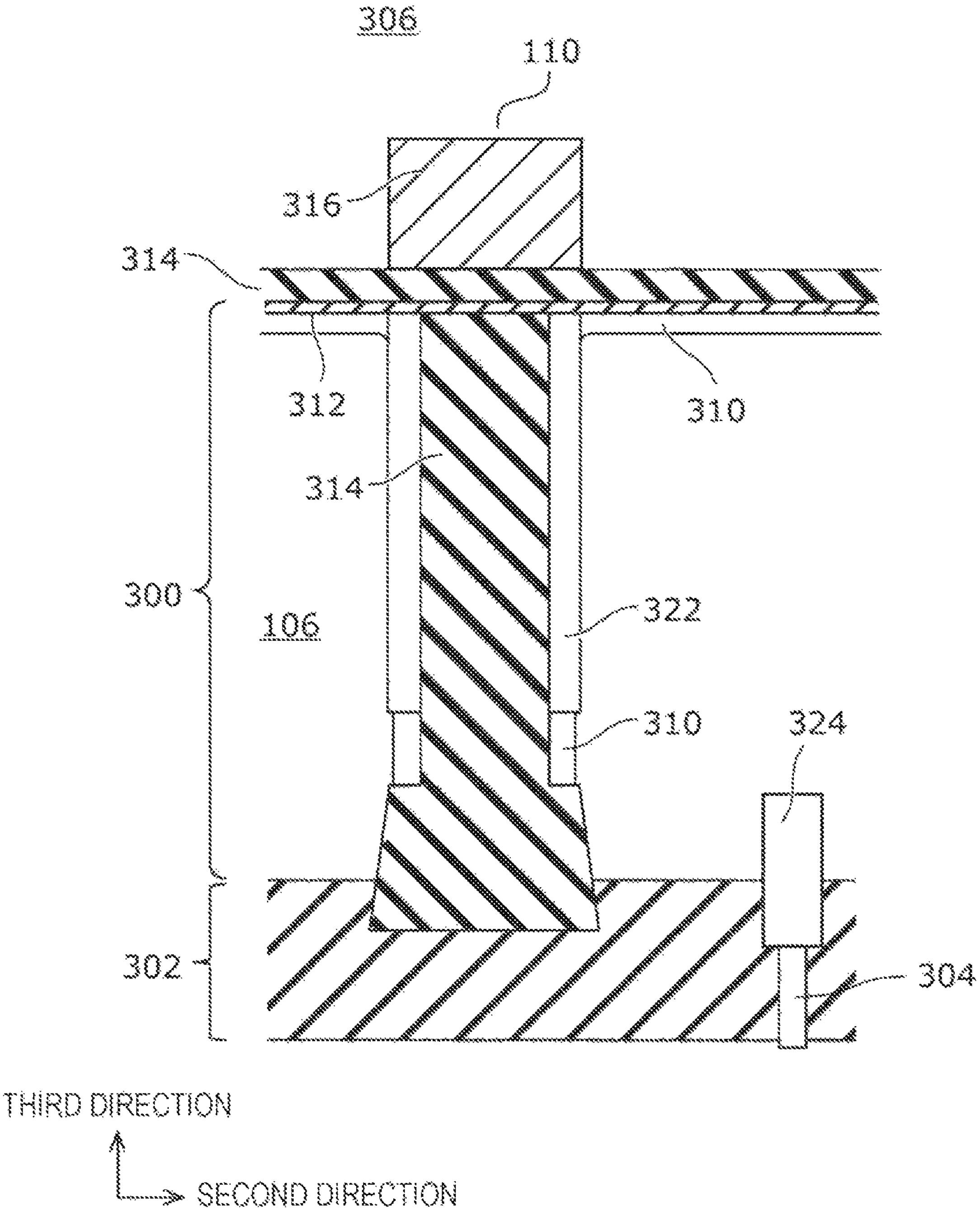

FIG. 121 is a cross-sectional view illustrating an example of a photoelectric conversion element isolation portion 110 according to an embodiment. FIG. 121 is different from FIG. 120 in that only an insulating film 314 is embedded in a trench without polysilicon 320. According to calculation of a Fresnel coefficient, a reflection effect of a sidewall interface can be enhanced by adopting such a configuration with respect to a trench cross section including silicon oxide and polysilicon in FIG. 120.

Fifty-Eighth Embodiment

Figure 122:
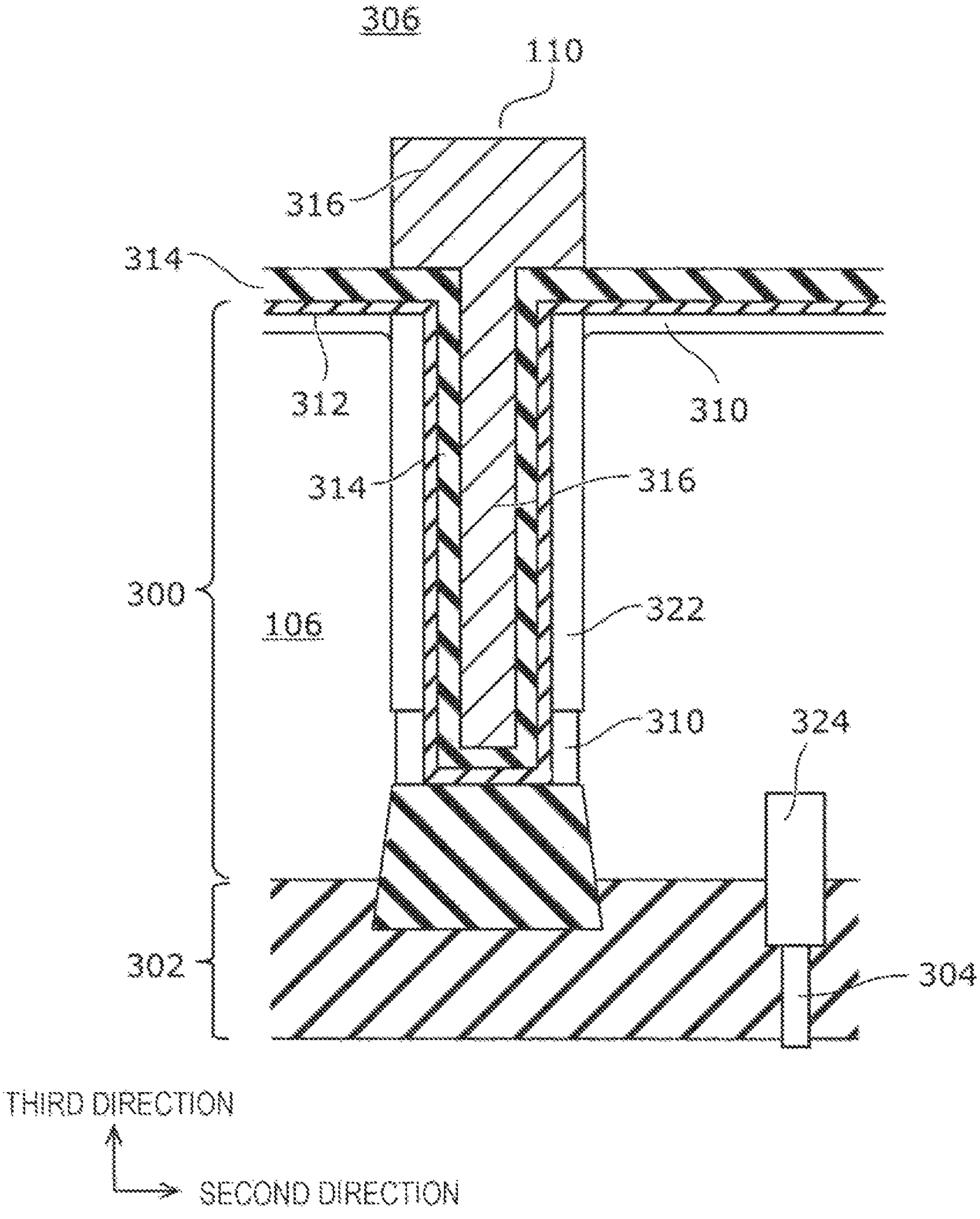

FIG. 122 is a cross-sectional view illustrating an example of a photoelectric conversion element isolation portion 110 according to an embodiment. A metal film 316 is embedded in a trench from an irradiation surface (lens 104) side. An insulating film 314 may be provided below the metal film 316. Moreover, a fixed charge film 312 may be provided on a lower side (wiring layer 302 side) of the insulating film 314. Then, these films may be formed from the irradiation surface side. With such a configuration, an optical crosstalk suppression effect can be enhanced as compared with the example of FIG. 120.

In general, a potential formed by solid-phase diffusion from a trench sidewall accumulates charges in a sidewall portion to increase Qs. Therefore, in the same thickness of the semiconductor substrate 300, the effect is high in a small pixel whereas the effect is reduced in a large pixel in an area ratio. Moreover, as the substrate thickness increases, the sidewall area increases, and improvement of Qs by solid-phase diffusion can be expected. In the present embodiment, an aspect ratio represented by (the thickness of the semiconductor substrate 300) (the length of one side of the photoelectric conversion element) is desirably at least 4 or more in view of the effect of solid-phase diffusion and the manufacturing cost related to the solid-phase diffusion.

Fifty-Ninth Embodiment

In the present embodiment, to prevent reflection of light by a pixel 102, an imaging pixel having a moth-eye structure on a semiconductor substrate 300 for forming a subpixel 106 will be described.

Figure 123:
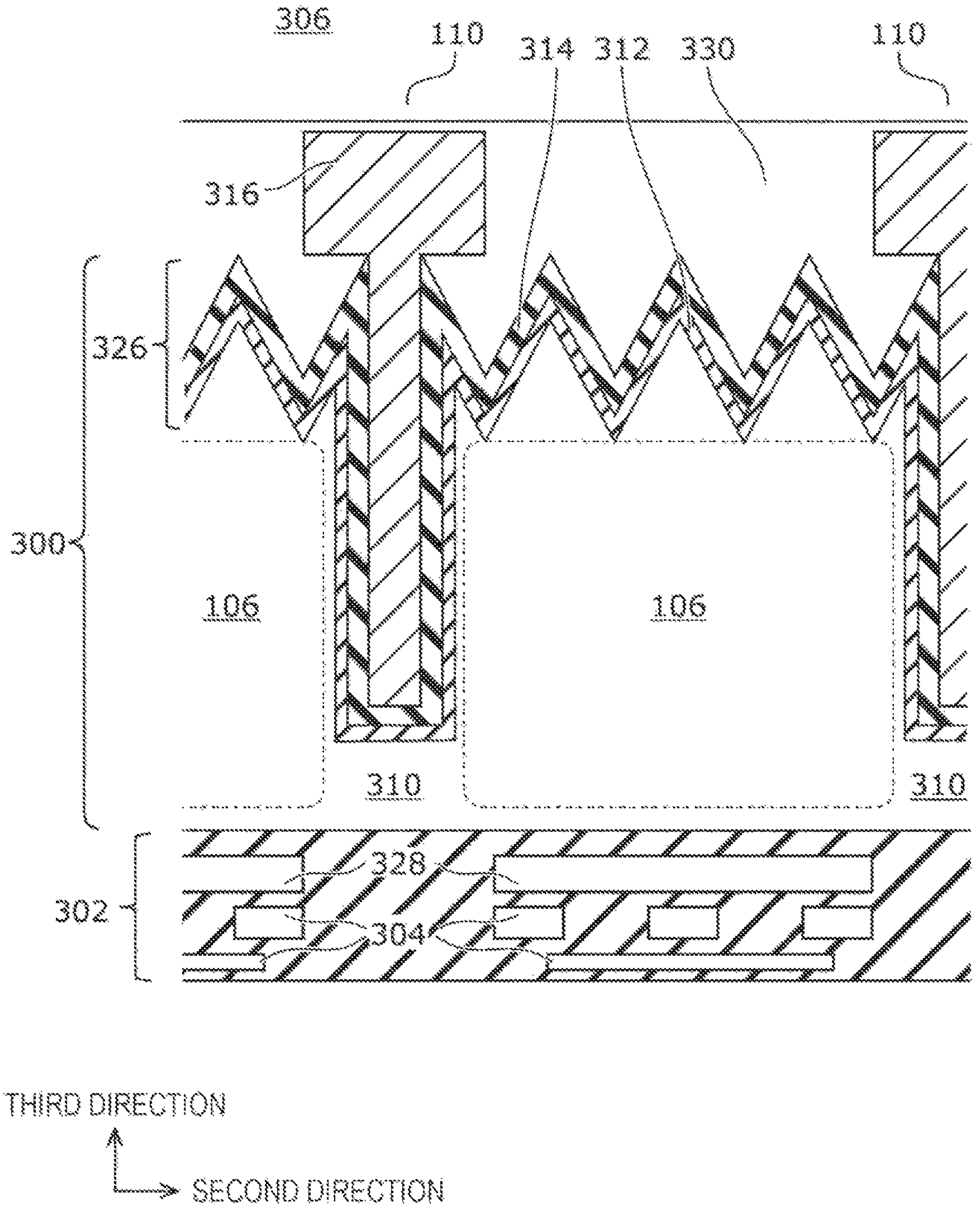

FIG. 123 is a cross-sectional view illustrating an example of an imaging pixel according to an embodiment. In particular, a subpixel 106 portion of the pixel 102 is enlarged. Similar to the structures described in some of the above-described embodiments, the subpixel 106 may include, for example, a photoelectric conversion element isolation portion 110 including a metal film 316, an insulating film 314, and a fixed charge film 312 in the present embodiment. The subpixel 106 may be provided in the semiconductor substrate 300, and a wiring layer 302 may be provided on a side opposite to an irradiation surface of the semiconductor substrate 300.

Note that, in the drawings, the moth-eye structure is large and the number of irregularities (the number of periods) is illustrated in a limited manner, but the present embodiment is not limited thereto. That is, the subpixel 106, the photoelectric conversion element isolation portion 110, and the moth-eye structure or the like of an antireflection layer 326 are illustrated as an example in an easy-to-understand manner, and ratios of the size and the number (the number of periods and the like) thereof are appropriately designed.

The antireflection layer 326 is provided on a surface of the semiconductor substrate 300 on a lens 104 side. Since the semiconductor substrate 300, for example, a silicon substrate has a large refractive index of about 4, reflection due to a difference in refractive index at an interface is large. For example, by forming the surface on an irradiation surface side of the semiconductor substrate 300 into the moth-eye structure by fine protrusions, the antireflection layer 326 becomes equivalent to a continuous change in refractive index, and the reflection can be suppressed. That is, by providing the antireflection layer 326 having such a moth-eye structure, it is possible to improve sensitivity of an imaging device. As illustrated in the drawing, an adhesion layer 330 may be provided on an upper surface of the antireflection layer 326 in order to enhance adhesion with an interlayer film 306.

Furthermore, suppressing the reflection of light on the irradiation surface side suppresses a flare phenomenon that occurs when reflection from an imaging element 10 is re-reflected by a package or a component of an electronic device and re-enters the subpixel 106 again. Moreover, since a diffraction phenomenon occurs in the antireflection layer 326 due to a periodic structure, an effect of increasing an effective optical path length is generated in high-order components that are strengthened each other by interference depending on an angle. That is, a probability that the light incident on the subpixel 106 is photoelectrically converted in the subpixel 106 increases, and sensitivity can be improved.

The photoelectric conversion element isolation portion 110 is provided between the subpixels 106, and can prevent high-order components that are strengthened each other by gaining an angle in the antireflection layer 326 from being mixed into the adjacent subpixels 106. That is, crosstalk between the subpixels 106 is suppressed, and resolution degradation of the imaging device can be suppressed.

A reflecting film 328 is provided on the wiring layer 302 side, of a surface on a side opposite to the irradiation surface of the semiconductor substrate 300. The reflecting film 328 includes, for example, a metal film. This metal film may be processed at the same time with wiring of a wiring layer, for example. Furthermore, the reflecting film 328 may serve a part of functions of a circuit, for example. The present embodiment is not limited thereto, and the reflecting film 328 may be processed separately from the wiring and provided.

Note that, in a case where the reflecting film 328 includes a metal film, there is a risk that plasma damage occurs if processing is performed in a state where the metal is electrically floating, and thus it is desirable to ground the metal film via a contact via or the like in the process.

As another example, the reflecting film 328 may be formed by a multilayer film in which substances having a high refractive index and a low refractive index are alternately stacked.

The reflecting film 328 reflects light transmitted through the subpixel 106, and causes the light to be re-incident on the subpixel 106 from the wiring layer 302 side. Therefore, by providing the reflecting film 328, it is possible to improve use efficiency of the light incident on the subpixel 106. As a result, by including the reflecting film 328, it is possible to improve sensitivity of the imaging element 10.

As described above, as in the present embodiment, the antireflection layer 326 having the moth-eye structure may be provided for the subpixel 106. By providing the antireflection layer 326, it is possible to suppress flare and improve the sensitivity. Furthermore, by providing the photoelectric conversion element isolation portion 110, it is possible to suppress crosstalk and improve resolution. Moreover, by providing the reflecting film 328, it is possible to improve the sensitivity of the subpixel 106.

Note that the reflecting film 328 has been described as an example of the present embodiment, but may be provided in other embodiments. By providing the reflecting film 328 in this manner, it is possible to similarly improve the sensitivity in other embodiments.

Note that the photoelectric conversion element isolation portion 110 is not limited to have the structure described in the present embodiment, and may have any structure described in some of the above-described embodiments.

Sixtieth Embodiment

For example, as illustrated in FIG. 6, a light-shielding wall 108 is provided with a material having a light-shielding property between pixels 102 so that light from an adjacent pixel is not incident (crosstalk does not occur). In a third direction, the light-shielding wall 108 is provided between an irradiation surface of a semiconductor substrate 300 and a lens 104. Embodiments of the light-shielding wall 108 will be described with some examples.

Figure 124:
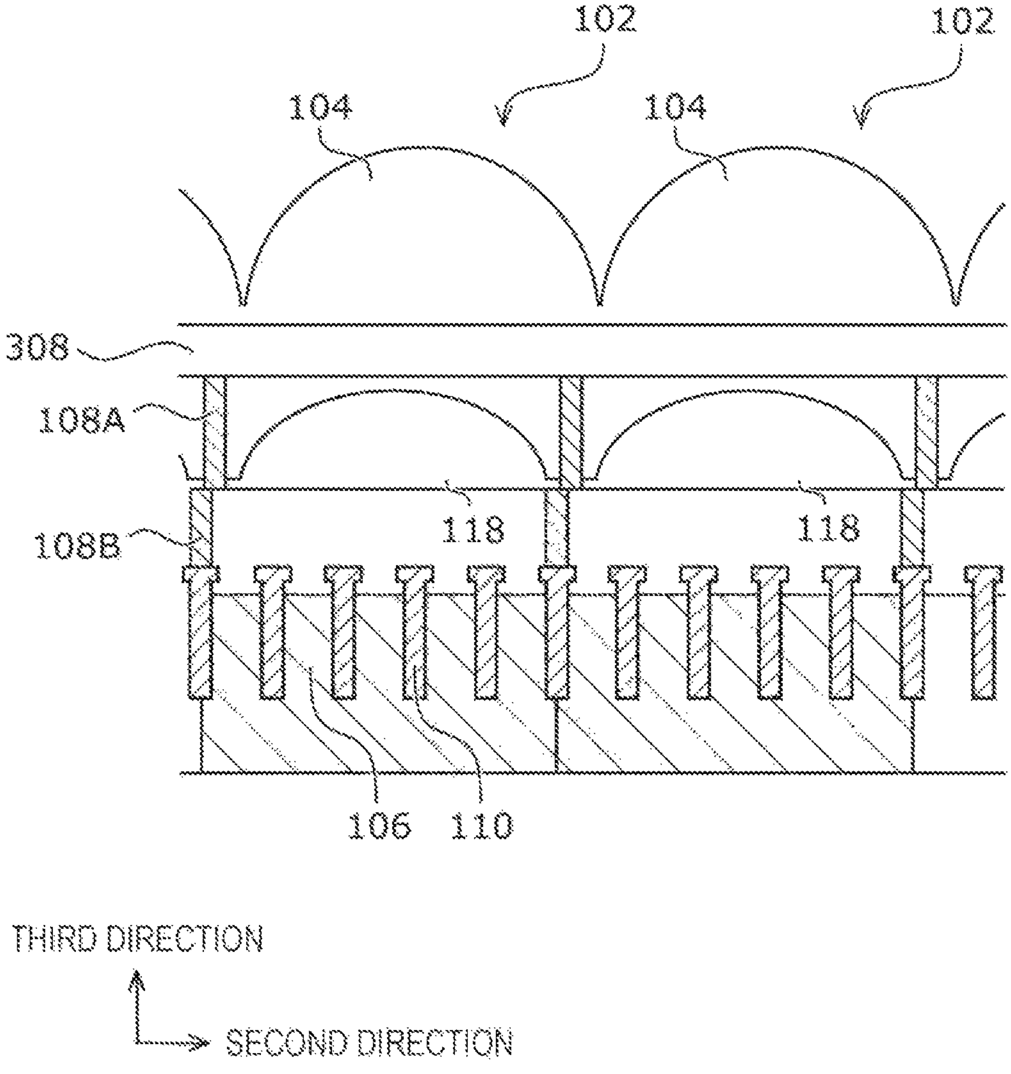

FIG. 124 is a cross-sectional view illustrating an example of imaging pixels according to an embodiment. FIG. 124 illustrates an example of the light-shielding wall 108 in the pixel 102. The pixel 102 includes a lens 104, an inner lens 118, a subpixel 106, light-shielding walls 108A and 108B, and a photoelectric conversion element isolation portion 110.

For example, the lens 104 may be disposed at a position where a center is shifted from a center of the subpixel 106 located at a center of the pixel.

For example, the inner lens 118 may be provided between the lens 104 and the semiconductor substrate 300 in the third direction, and a position of a center of the inner lens 118 may be provided between the shifted position of the lens 104 and the center of the pixel or may coincide with either of them. In the above-described pixel 102 according to the embodiment for performing the pupil correction, the lens 104 and the inner lens 118 may be arranged in this manner.

Note that, in the case of implementing the pupil correction, the shift may be adjusted by the position of the pixel 102 in a pixel array 100. In the present embodiment and the following embodiments, description will be given assuming that the shift exists only in a second direction, but the embodiments are not limited thereto and may have the shift in either a first direction or the second direction, or a direction of a combination of the first direction and the second direction. For example, an effect similar to that of the diffractive lens illustrated in FIG. 86 can be implemented by the shift.

The light-shielding wall 108 included in the pixel 102 may include the light-shielding walls 108A and 108B configured in two stages in order to suppress crosstalk from an adjacent pixel in each path. In the case of performing the pupil correction, the lens 104 and the inner lens 118 are arranged such that the centers thereof are shifted.

The light-shielding wall 108B may be formed to be shifted toward a center side of the pixel with respect to the lens 104 in accordance with the arrangement, or may be formed at the same position as the lens 104. The light-shielding wall 108A may be shifted in the same direction by the same distance as the inner lens 118 in accordance with the arrangement.

From the viewpoint of light-shielding performance, it is desirable to provide the light-shielding walls 108A and 108B in contact with each other as closely as possible. Furthermore, it is desirable to consider variations in processes such as line width and misalignment. Therefore, it is desirable to determine a size of an overlapping region in a plane formed by the first direction and the second direction such that the light-shielding walls 108A and 108B are always in contact with each other.

In a case where a shift amount of sufficient pupil correction cannot be set by a definition of the size of the overlapping region, for example, an upper limit of the shift amount of the light-shielding wall may be widened by providing a metal film 316 with a large width, which the light-shielding wall 108B is in contact with. Furthermore, an allowable amount of the shift amount may be increased by increasing a thickness itself of the light-shielding wall 108B. Although an opening of the metal film 316 on a light-receiving surface may be narrowed and the sensitivity may be sacrificed, this method has an advantage of being performed with the same number of processes.

Sixty-First Embodiment

Figure 125:
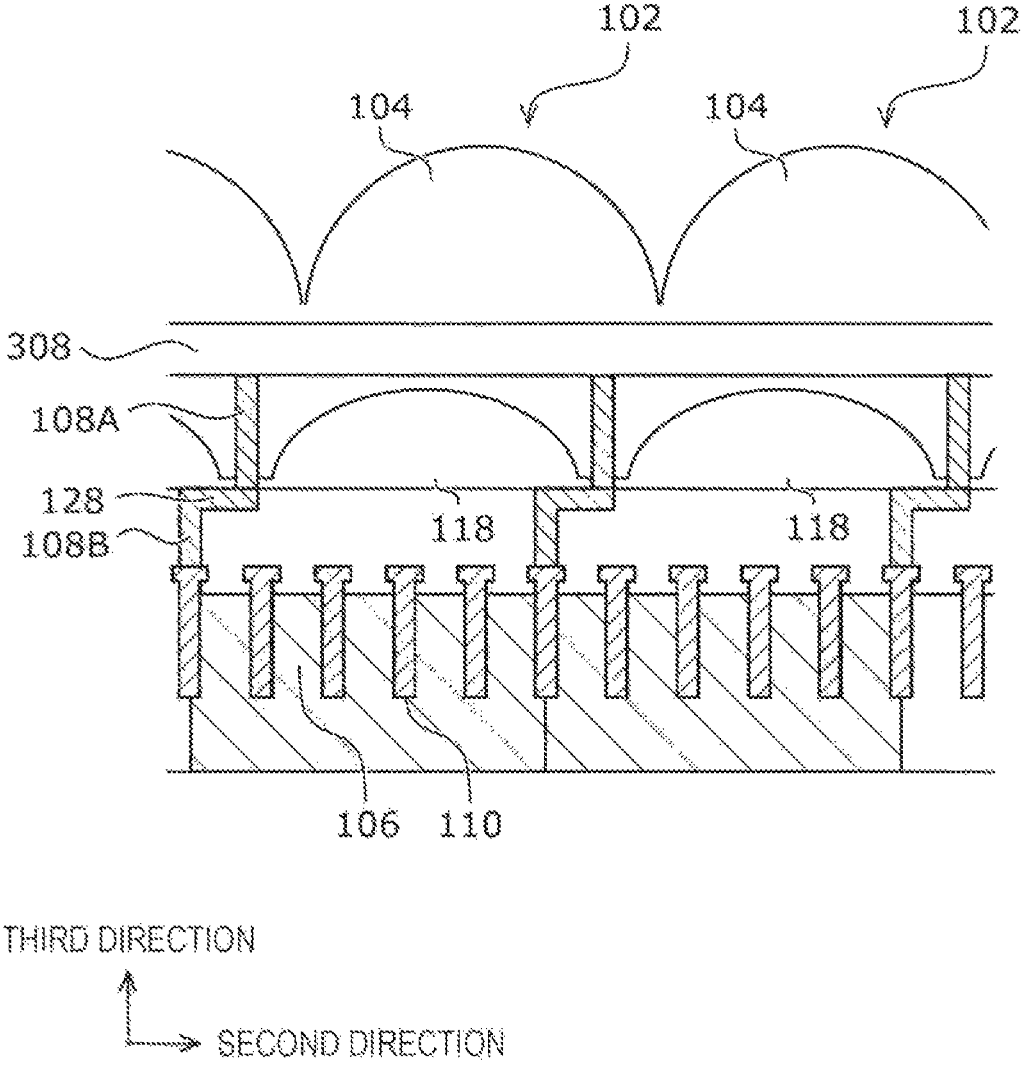

FIG. 125 is a cross-sectional view illustrating an example of imaging pixels according to an embodiment. FIG. 125 illustrates another embodiment of a light-shielding wall 108 in a pixel 102. The pixel 102 further includes a light-shielding film 128 in addition to the configuration of FIG. 124.

The light-shielding film 128 is a film formed to fill a gap in a case where the gap is generated between a light-shielding wall 108A and a light-shielding wall 108B. As illustrated in FIG. 125, for example, the light-shielding film 128 is formed on or below a lower surface of an inner lens 118 in a third direction.

Unlike the overlap of the light-shielding walls as illustrated in FIG. 124, it is not necessary that the light-shielding wall 108A and the light-shielding wall 108B overlap each other, and the present embodiment can also be applied to a case where a margin occurs in the arrangement of the light-shielding wall 108A and the light-shielding wall 108B. That is, a larger shift can be generated as compared with the case of FIG. 124.

It is possible to suppress light incident on the pixel 102 through the gap between the light-shielding walls 108A and 108B, and to increase the shift amount of the pupil correction by the light-shielding film 128.

Sixty-Second Embodiment

Figure 126:
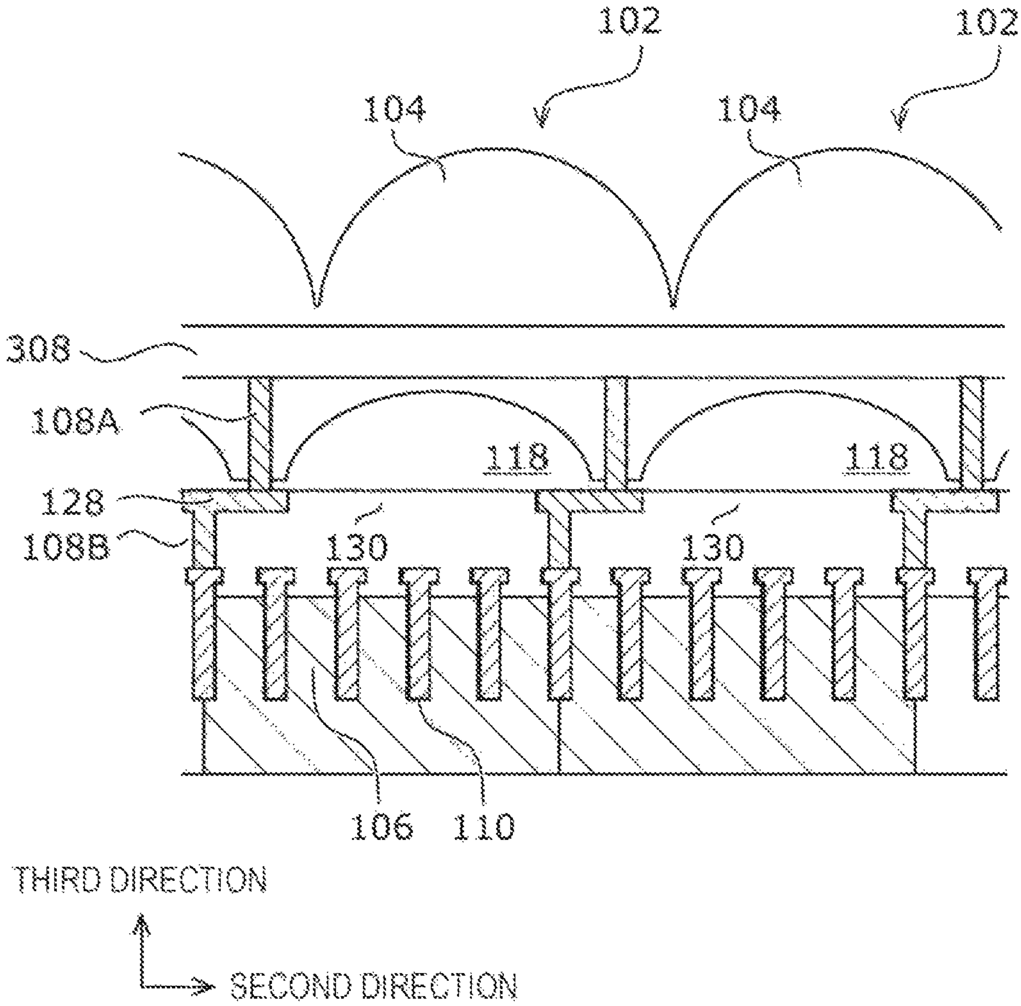

FIG. 126 is a cross-sectional view illustrating an example of imaging pixels according to an embodiment. FIG. 126 illustrates a pixel 102 including a light-shielding film 128 below an inner lens 118. That is, the pixel 102 includes the light-shielding film 128 having an opening 130 between the inner lens 118 and a subpixel 106.

Figure 127:
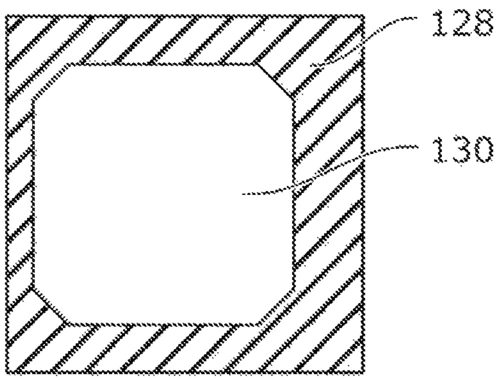

FIG. 127 is a plan cross-sectional view illustrating an example of an imaging pixel according to an embodiment. FIG. 127 illustrates a relationship between the light-shielding film 128 and the opening 130. The slant-line portion is a region where the light-shielding film 128 exists. The opening 130 that transmits light is formed inside the region by the light-shielding film 128.

In the above-described embodiment, the light-shielding film 128 is formed to fill a space between the light-shielding wall 108A and the light-shielding wall 108B. In contrast, in the present embodiment, the light-shielding film 128 is formed not only between the light-shielding wall 108A and the light-shielding wall 108B but also to protrude to a lower side of the inner lens 118. Then, the light-shielding film 128 forms the opening 130 narrower than the light transmission region due to the light-shielding wall 108A and the light-shielding wall 108B.

By providing the opening 130, the light-shielding film 128 can obtain an effect of suppressing stray light in its own pixel, for example, reflection from the light-shielding wall 108, and the like, in addition to suppressing light leakage to the adjacent pixel 102. In this case, the opening 130 of the light-shielding film 128 is desirably arranged so as not to have vignetting in an optical path condensed on each subpixel 106. Thereby, resolution of the pixel can be further improved.

Sixty-Third Embodiment

Figure 128:
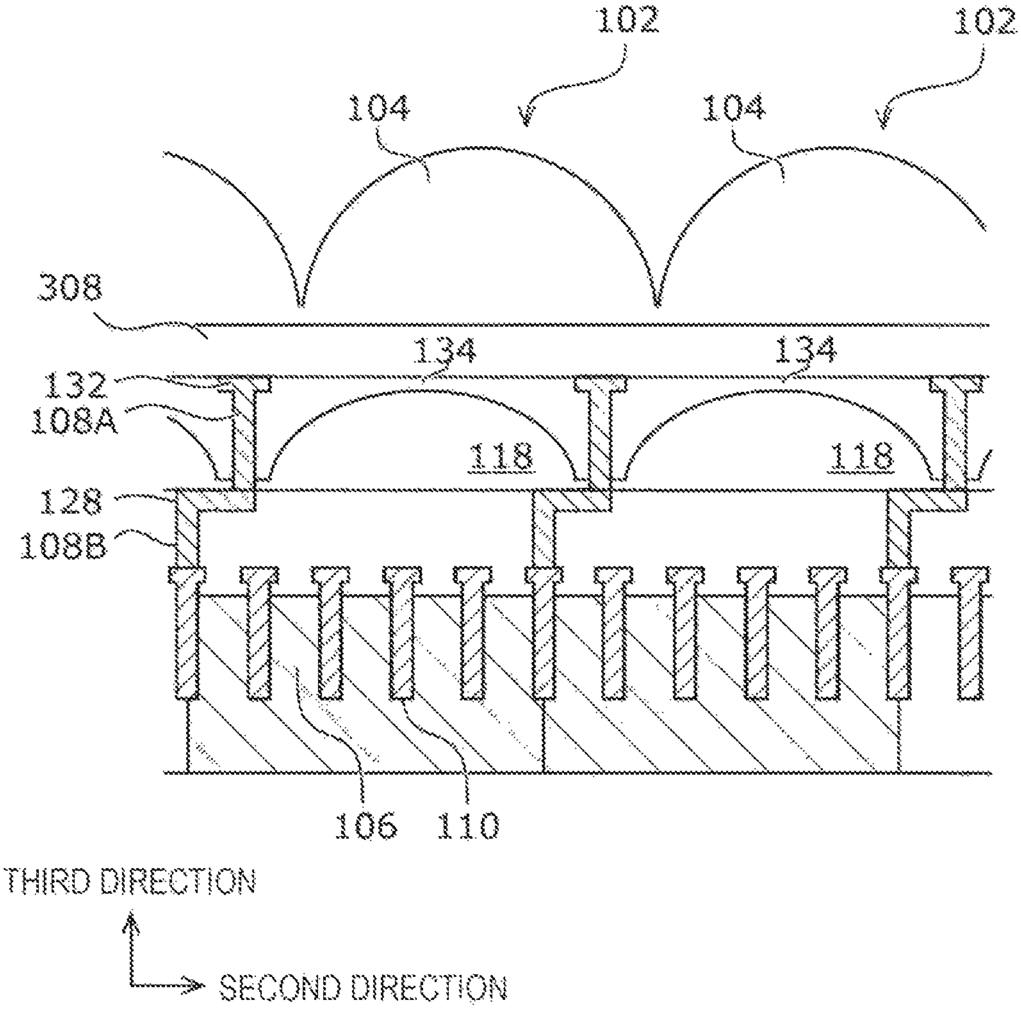

FIG. 128 is a cross-sectional view illustrating an example of imaging pixels according to an embodiment. FIG. 128 illustrates a pixel 102 including a light-shielding film 132 above an inner lens 118. That is, the pixel 102 includes the light-shielding film 132 having an opening 134 between a lens 104 and the inner lens 118.

Figure 129:
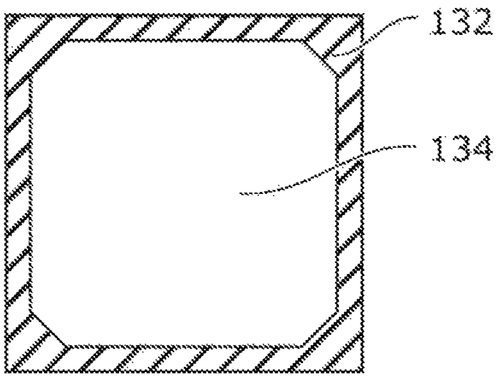

FIG. 129 is a plan cross-sectional view illustrating an example of an imaging pixel according to an embodiment. FIG. 129 illustrates a relationship between the light-shielding film 132 and the opening 134. The slant-line portion is a region where the light-shielding film 132 exists. The opening 134 that transmits light is formed inside the region by the light-shielding film 132.

The present embodiment is different from the above-described embodiments in that the light-shielding film 132 is formed above the inner lens 118. The light-shielding film 132 is formed so as to protrude to above the inner lens 118, for example, similarly to the above-described light-shielding film 128. Then, the light-shielding film 132 forms the opening 134 narrower than the region transmitted by the light-shielding wall 108A.

By providing the opening 134, it is possible to obtain an effect of suppressing in advance stray light in its own pixel, for example, a reflection component generated in the light-shielding wall 108. In this case, the opening 134 of the light-shielding film 132 is desirably arranged so as not to excessively shield an optical path condensed on each subpixel 106 (so that vignetting less easily occurs). Thereby, resolution of the pixel can be further improved.

Sixty-Fourth Embodiment

Figure 130:
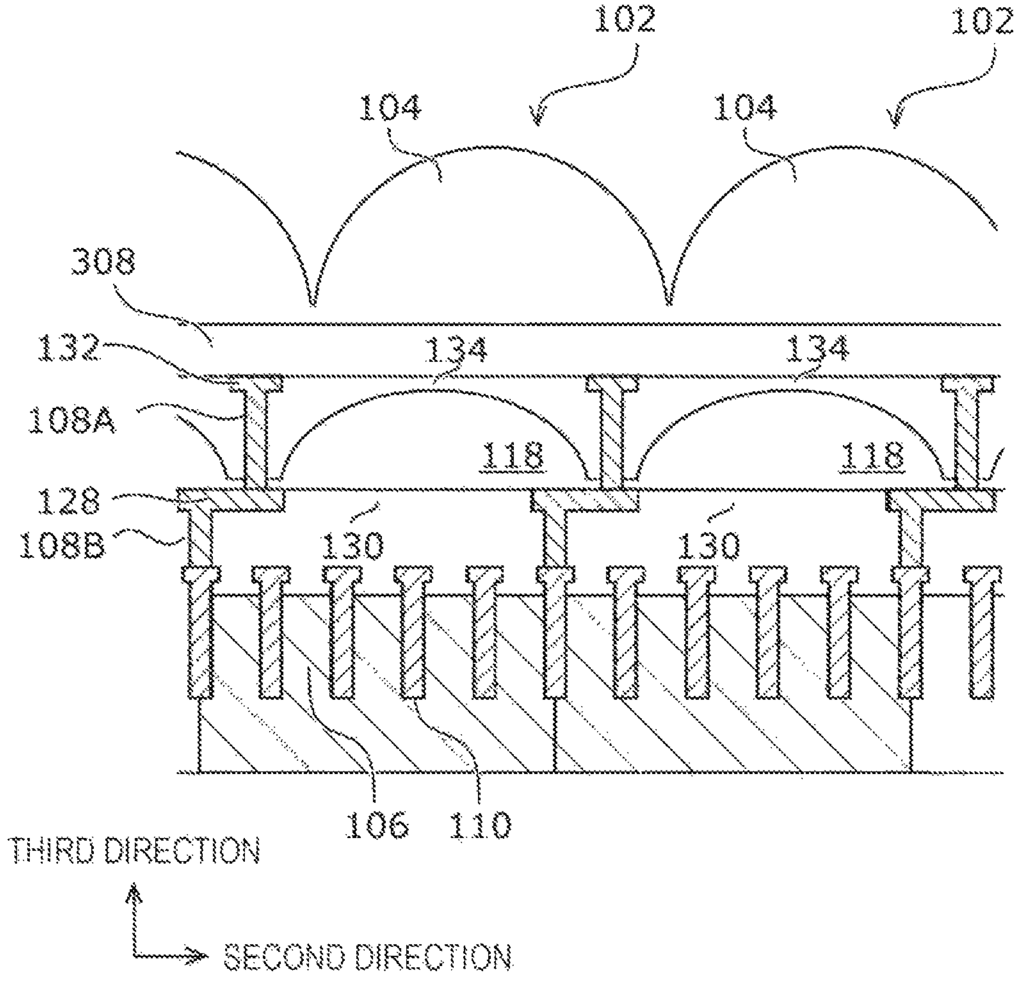

FIG. 130 is a cross-sectional view illustrating an example of imaging pixels according to an embodiment. FIG. 130 illustrates a pixel 102 including light-shielding films above and below an inner lens 118. The pixel 102 includes a light-shielding film 132 forming an opening 134 and a light-shielding film 128 forming an opening 130.

FIG. 131 is a plan cross-sectional view illustrating an example of an imaging pixel according to an embodiment. FIG. 131 illustrates a relationship between the light-shielding film 132 and the opening 134, and a relationship between the light-shielding film 128 and the opening 130. A right-up slant-line indicates a region of the light-shielding film 128, and a left-up slant-line line indicates a region of the light-shielding film 132.

Note that, in FIGS. 130 and 131, edges of the light-shielding film 128 and the light-shielding film 132 look overlapping in the same plane, but the present embodiment is not limited to this form. For example, the light-shielding film 128 may protrude more inward than the light-shielding film 132, and vice versa.

In the respective light-shielding films, the opening 134 of the light-shielding film 132 and the opening 130 of the light-shielding film 128 are desirably arranged so as not to excessively shield optical paths condensed on respective subpixels 106 (so that vignetting less easily occurs). The light-shielding film 128 and the light-shielding film 132 have an effect of suppressing stray light in its own pixel, for example, reflection from a light-shielding wall 108, and the like. Moreover, the light-shielding film 128 may have an effect of suppressing leakage to other pixels. By configuring the openings in multiple stages in this manner, it is possible to enhance suppression of crosstalk and to acquire information with higher resolution.

Note that the light-shielding films 128 and 132 in FIGS. 124, 125, 126, 128, and 130 may be, for example, a metal film of aluminum, silver, gold, copper, platinum, molybdenum, tungsten, chromium, titanium, nickel, iron, tellurium, or the like, a compound of these metals, or an alloy of these metals. Furthermore, these materials may be formed into a multilayer film, and for example, titanium, titanium nitride, or the like may be used as a barrier metal for improving adhesion. Furthermore, instead of metal, a material having an effect of absorbing light, for example, a carbon black resist or the like may be used.

As described above, the light-shielding wall 108 can also have various configurations. Moreover, by providing the light-shielding films, it is possible to increase the degree of freedom of positions of the light-shielding wall 108 and the inner lens 118 and obtain an effect of suppressing stray light. By forming the pixel 102 in this manner, it is possible to suppress crosstalk and acquire image information with higher resolution. Furthermore, by providing the light-shielding wall 108 and the light-shielding films 128 and 132, for example, it is possible to suppress flare and ghost that occur in a case where a strong light beam such as sunlight or a headlight enters an imaging element 10.

Note that, in FIGS. 124, 125, 126, 128, and 130, the inner lens 118 is provided, but the present embodiment is not limited thereto. Even in a case where the inner lens 118 is not provided, it is possible to similarly provide the light-shielding films and the openings formed by the light-shielding films. Even in a case where the inner lens 118 is not provided, the effects of suppressing crosstalk and stray light and improving resolution and the like can be obtained by the light-shielding films. Furthermore, the present embodiment does not limit the number of stages, and for example, a configuration of three or more stages may be adopted instead of the two-stage configuration.

Moreover, the shapes of the openings 130 and 134 are octagonal shapes with cut rectangular corners due to the shapes of the light-shielding films 128 and 132, but are not limited thereto. For example, the shapes may be a rectangular shape. Furthermore, in a case where the subpixel 106 has a hexagonal shape, the openings 130 and 134 may have a hexagonal shape or a dodecagonal shape obtained by cutting out corners of the hexagonal shape.

Sixty-Fifth Embodiment

In all of the above-described embodiments, the subpixel 106 may include a memory region and a transfer transistor that transfers signal charges accumulated in the photoelectric conversion element to the memory region, in addition to the photoelectric conversion element. With the configuration, a global shutter operation without focal plane distortion can be implemented.

FIG. 132 is a cross-sectional view illustrating an example of an imaging pixel according to an embodiment. Note that this drawing is illustrated in a simpler manner than the drawing of each of the above-described embodiments for easy understanding of the gist thereof. More specifically, FIG. 132 is a diagram illustrating a structure of a subpixel 106 according to the present embodiment.

Similarly to some of the above-described embodiments, the subpixels 106 may be isolated by, for example, a photoelectric conversion element isolation portion 110 including a fixed charge film 312, an insulating film 314, and a metal film 316. As another example, the photoelectric conversion element isolation portion 110 may have the structure described in other embodiments, and a combination is not limited.

In the present embodiment, the subpixel 106 includes a light-receiving region, a memory region 332, and a transistor 334.

The memory region 332 is provided adjacent to the light-receiving region. The memory region 332 is formed by a semiconductor layer that holds charges generated by light received by the subpixel 106 until there is a request. For example, the memory region 332 may be formed so as to be surrounded by the fixed charge film 312, the insulating film 314, and the metal film 316. For example, the memory region 332 may be formed such that a surface is covered with the metal film 316, the fixed charge film 312, and the insulating film 314 on the lens 104 side, and light from the lens 104 is not directly incident.

The transistor 334 transfers the charge stored in the subpixel 106 to the memory region 332 at predetermined timing. More precisely, the transistor 334 illustrated in FIG. 132 corresponds to a gate electrode of a transistor that transfers a charge from the light-receiving region of the subpixel 106 to the memory region 332. By applying an appropriate voltage to the gate electrode, the light-receiving region and the memory region 332 are electrically connected, and a photoelectrically converted analog signal is output to the memory region 332 with a potential that is lowered to a predetermined potential.

An imaging element 10 performs raster scan, that is, causes a plurality of photoelectric conversion elements to scan a pixel array 100 to acquire intensity of light, for example. In this case, when the imaging element 10 acquires an analog signal from a charge by the scan for each pixel 102, timing of acquiring the analog signal is different depending on a location where the photoelectric conversion element exists. As a result, focal plane distortion in which an image is formed on the basis of information of lights acquired at different timings occurs between a photoelectric conversion element that performs scan at early timing and a photoelectric conversion element that performs scan at late timing.

To avoid this focal plane distortion, the charge in the memory region 332 is set to a predetermined level at predetermined timing over the photoelectric conversion elements that receive light, and then the charge stored in the photoelectric conversion element is transferred to the memory region 332 by the transistor 334 at predetermined timing. Thereafter, by scanning the memory region 332 of the subpixel 106 to acquire the analog signal, it becomes possible to avoid the focal plane distortion.

As described above, according to the present embodiment, the focal plane distortion can be suppressed by providing the memory region 332. In a case of using the present embodiment in a fingerprint sensor or the like, it is possible to avoid deterioration in image quality by global shutter driving for focal plane distortion or blur of a fingerprint shape caused by movement of a finger during imaging by the rolling shutter driving, and improve authentication accuracy.

By using the global shutter, it is possible to instantaneously perform authentication even when the finger is moving, and to implement authentication for the fingerprint or the like by a flip operation in the electronic device 1, for example. As long as the authentication can be performed by the flip operation, for example, the imaging element 10 may be disposed elongated in a first direction or a second direction of a display unit. In this case, by adopting a specification of prompting a user to perform the flip operation substantially perpendicular to an arranged azimuth, it is possible to expand an authentication area while reducing an occupied area. A length in a long side direction that the imaging element 10 can receive light is desirably set to a length in which an image can be captured from an end to an end of a display angle of view as much as possible because the position at which the flip operation is performed is indefinite.

Note that all the embodiments according to the present invention are not limited to the authentication use, and can be used for non-contact proximity imaging or the like, as an example. More specifically, the embodiments can also be applied to, for example, a camera that performs super macro close-up shooting, iris authentication, reading of a minimum barcode, inspection by a machine vision device, and the like. Furthermore, by combining the embodiments with an optical lens, it can also be used for general camera uses such as digital cameras and video cameras.

Moreover, as an electronic device having a motion capture function, a motion of an object such as a finger can be regarded as an optical image including a depth direction to be described below, and an operation command can be input. Such an operation command becomes complicated with a demand for functions, but if the regular operation is made into a common language, it can also be a new communication means with a hearing-impaired person.

By applying the global shutter driving according to the present embodiment to these applications, it is possible to solve various image quality problems in rolling shutter driving such as an influence on image distortion and image quality due to camera shake or movement of an object, or a phenomenon (so-called flash band) in which flash light is partially reflected in a band shape by a flash.

Sixty-Sixth Embodiment

An electronic device 1 according to the present embodiment includes an imaging element 10 described in the previous embodiments, and has an authentication function mainly for a finger of a living body as an object and an impersonation prevention function. Although a finger is exemplified as a specific example, the present embodiment may be applied to other body parts such as a palm, and is not limited thereto.

[Manufacturing Method]

Next, some processes will be described for some structures according to semiconductors described in each of the above-described embodiments. Note that, in the description of the process, sizes of layers and films are emphasized for the sake of description. Therefore, a ratio in each drawing is not accurate, and is appropriately designed and formed.

First, some overall methods of manufacturing an imaging element 10 (semiconductor process) will be described.

Sixty-Seventh Embodiment

First, a method of manufacturing a subpixel 106 illustrated in FIG. 93 will be described with reference to FIGS. 133 to 139. FIGS. 133, 134, 135, 136, 137A (137B), 138A (138B), and 139A (139B) are views illustrating a continuous process of manufacturing the subpixel 106 illustrated in FIG. 93.

In the method for manufacturing an imaging device according to the present embodiment, a subpixel 106 separated by an element isolation region of a p-type semiconductor region is formed in a region where a pixel region of a semiconductor substrate 300, for example, silicon is to be formed. The subpixel 106 is formed to have a pn junction including an n-type semiconductor region over the entire region in a thickness direction of the semiconductor substrate 300 and a p-type semiconductor region in contact with the n-type semiconductor region and facing both front and back surfaces of the semiconductor substrate 300.

An impurity region (p-type well region 310) is formed by, for example, ion-implanting desired impurities from the front surface side of the semiconductor substrate 300 using a resist 350 as a mask as illustrated in FIG. 133. In a region corresponding to each pixel on the substrate surface, a p-type semiconductor well region (well region 310) in contact with the element isolation region is formed, and each of a plurality of pixel transistors is formed in the well region 310. Each of the pixel transistors includes a source region and a drain region, a gate insulating film, and a gate electrode.

Moreover, a wiring layer 302 including aluminum, copper, or the like is formed on a substrate surface with an interlayer insulating film (not illustrated) such as a silicon oxide film interposed therebetween. A through-via is formed between the pixel transistor formed on the substrate surface and the wiring layer, and is electrically connected to drive the imaging element. An interlayer insulating film such as a silicon oxide film is stacked on the wiring, the interlayer insulating film is planarized by chemical mechanical polishing (CMP) to make a surface of the wiring layer a substantially flat surface, and formation of wiring is repeated on wiring while being connected to lower layer wiring by the through-via, and the wiring of each layer is sequentially formed.

Next, as illustrated in FIG. 134, the semiconductor substrate 300 is turned upside down and bonded to a support substrate by plasma bonding or the like. Thereafter, the substrate is thinned by, for example, wet etching or dry etching from a back surface side.

For example, as illustrated in FIG. 135, the substrate is thinned to a desired thickness by CMP. The thickness of the substrate is desirably in a range of, for example, 2 to 6 μm in a case of only detecting a visible light region, or is desirably in a range of, for example, 3 to 15 μm in a case of also detecting a near-infrared region, according to an assumed wavelength region. In this process, for example, a well region 310 may be formed on a surface of a pixel.

Furthermore, as another example, before the process illustrated in FIG. 133, lithography and ion implantation may be repeated to form a pixel potential, and the well region 310 may be formed on the surface as illustrated in FIG. 135. The same similarly applies to the following embodiments.

Next, in a photoelectric conversion element isolation portion 110, a trench may be formed in the semiconductor substrate 300 by a so-called Bosch process in which etching and deposition are alternately repeated for, for example, a resist punching pattern in which at least a part of a boundary portion of each pixel or of a boundary portion of each subpixel is opened. In a case where etching resistance of the resist is insufficient, a hard mask having a high selection ratio, for example, silicon nitride or silicon oxide, may be formed in advance and a groove pattern of the resist is transferred, and etching may be performed via the hard mask. After the trench processing, the hard mask and foreign substances may be removed with a chemical solution or the like.

Next, as illustrated in FIG. 136, a fixed charge film 312 and an insulating film 314 are formed. For example, this formation is executed by forming a film on a light-receiving surface or in the trench of the semiconductor substrate 300 using vapor phase growth (chemical vapor deposition, hereinafter CVD), sputtering, atomic layer deposition (hereinafter, ALD), or the like.

The film thickness of the fixed charge film 312 immediately above the subpixel 106 is desirably determined so as to increase the transmittance of light having an assumed wavelength with respect to the refractive index and an extinction coefficient of the material. For the film in contact with a Si interface, it is desirable to use ALD capable of obtaining good coverage at an atomic layer level. When the insulating film 314, for example, silicon oxide formed by ALD is thinned, film peeling called blister is likely to occur, and therefore the thickness is favorably at least 20 nm or more, and desirably 50 nm or more.

Furthermore, the light-shielding performance may be enhanced by embedding a metal film 316 in a gap of the insulating film 314 in the trench portion by CVD, sputtering, ALD, or the like. Note that, when processing is performed in a state where metal is electrically floating, there is a risk of occurrence of plasma damage. Therefore, as illustrated in FIGS. 137A and 137B, it is desirable to transfer the resist punching pattern having a width of, for example, several μm in a region outside the imaging element 10, form the groove by anisotropic etching or wet etching to expose the surface of the semiconductor substrate 300, and then form a film by grounding the metal film 316 to the semiconductor substrate 300 as illustrated in FIGS. 138A and 138B.

Here, FIGS. 137A and 138A are regions formed as the pixel 102, and FIGS. 137B and 138B are regions formed not as the pixel 102 but as, for example, a black reference pixel. The same similarly applies to FIGS. 139A and 139B.

The semiconductor substrate region to which the metal film 316 is grounded is desirably set to a ground potential as a p-type semiconductor region, for example. A plurality of metal films 316 may be stacked. For example, titanium or titanium nitride may be deposited by about 30 nm by sputtering as an adhesion layer to the insulating film 314, and then a film of tungsten may be formed.

In a case where not only the metal film 316 constitutes the photoelectric conversion element isolation portion 110 but also shields light to cover a black reference pixel region and a peripheral circuit region from light, it is desirable to set the film thickness according to required light-shielding performance. Depending on the use of the electronic device, for example, in a case where light-shielding performance of −160 dB or less is required, it is desirable to set the thickness to 200 nm or more with tungsten, for example.

As illustrated in FIGS. 139A and 139B, a resist punching pattern may be formed on the metal film 316, for example, for the region of the subpixel 106, further, a pad portion, a scribe line portion, and the like, and the metal film 316 may be partially removed by anisotropic etching or the like.

Sixty-Eighth Embodiment

Regarding the above-described method of manufacturing the photoelectric conversion element isolation portion 110, an example of a manufacturing method without processing a trench in a semiconductor substrate 300 will be described with reference to FIGS. 133 to 139B. Here, a modification of processing a trench in a semiconductor substrate from an irradiation surface and a modification of processing a trench in a semiconductor substrate from a side opposite to the irradiation surface will be described. Hereinafter, description overlapping with the above embodiments is omitted.

Note that, in the following embodiment, a state of grounding is not illustrated in a process of forming a metal film 316, but it is assumed that grounding is appropriately performed in each step. Furthermore, each element may be protected from electrostatic discharge (ESD) or the like by other means, for example, instead of grounding.

FIGS. 140 to 145 illustrate an example of a manufacturing method of processing a trench in a semiconductor substrate 300 from an irradiation surface and embedding a fixed charge film 312 and an insulating film 314. For example, a pixel 102 formed by this process has the configuration illustrated in FIG. 91.

FIG. 140 illustrates a process subsequent to FIG. 135 of the above-described embodiment. After the process of FIG. 135, a hard mask 354 is layered, and a resist 350 is formed on a region where a subpixel 106 is to be formed on the hard mask 354. That is, the resist 350 is formed to etch the semiconductor substrate 300 only in the region of the trench.

In the state of FIG. 140, the hard mask 354 is removed in an upper portion of the trench using the resist 350. For example, the hard mask 354 includes silicon nitride or silicon oxide. As illustrated in FIG. 141, the hard mask 354 is etched with the pattern of the resist 350 to transfer the pattern of the resist 350 to the hard mask 354.

Next, as illustrated in FIG. 142, the trench is formed. For example, the trench is formed by etching the region of the semiconductor substrate 300, the region being not covered with the hard mask 354, by a Bosch process or the like.

Next, as illustrated in FIG. 143, the hard mask 354 is removed with a chemical solution.

Next, as illustrated in FIG. 144, the fixed charge film 312 and the insulating film 314 are formed.

Next, as illustrated in FIG. 145, a metal film 316 is formed on the trench via the insulating film 314 and the fixed charge film 312.

Sixty-Ninth Embodiment

FIGS. 146 to 149 illustrate an example of a manufacturing method of processing a trench in a semiconductor substrate 300 from an irradiation surface and embedding a fixed charge film 312, an insulating film 314, and a metal film 316. For example, a pixel 102 formed by this process has the configuration illustrated in FIG. 7.

FIG. 146 illustrates a process subsequent to FIG. 143 of the above-described embodiment. After the process of FIG. 143, the fixed charge film 312 and the insulating film 314 are formed. This formation is performed by, for example, CVD, ALD, sputtering, or the like. In this process, the fixed charge film 312 and the insulating film 314 are also formed in the trench. Unlike the above-described embodiments, formation of an oxide film or the like is executed with a margin for forming the metal film 316 in a later process, instead of filling the inside of the trench with the insulating film 314.

Next, as illustrated in FIG. 147, the metal film 316 is formed on the insulating film 314. The metal film 316 is also formed in the trench.

Next, as illustrated in FIG. 148, a resist 350 is formed on the trench.

Then, as illustrated in FIG. 149, the metal film 316 is removed on the basis of the pattern of the resist 350, and then the resist 350 is removed, so that the metal film 316 is formed in a shape in which a head protrudes (becomes a hammerhead shape) from the semiconductor substrate 300.

In general, it is known that when a photoelectric conversion region is opened by anisotropic etching, an interface state is deteriorated by ultraviolet light emission by plasma during processing (see, for example, Y. Ichihashi et. al., Journal for Vacuum Science & Technology B28 (2010) 577-, T. Yunogami et. al., Japan Journal of Applied Physics 28 (1989) 2172-).

In the method of manufacturing the photoelectric conversion element isolation portion 110 according to the previous embodiment illustrated in FIGS. 140 to 145 and the present embodiment illustrated in FIGS. 146 to 149, the metal film 316 is made wider than a processing width of the trench formed in the semiconductor substrate 300. It is possible to always protect an interface of a trench sidewall with the metal film 316 against the ultraviolet light emission by the plasma during processing and to suppress deterioration of a dark current and white spot characteristics. Moreover, there is advantage that crosstalk and angular resolution are improved as the line width of the metal film 316 is increased.

Seventieth Embodiment

FIGS. 150 to 151 illustrate an example of a manufacturing method of processing a trench in a semiconductor substrate 300 from an irradiation surface and embedding a fixed charge film 312, an insulating film 314, and a metal film 316. For example, a pixel 102 formed by this process has the configuration illustrated in FIG. 115.

FIG. 150 illustrates a process subsequent to FIG. 147 of the above-described embodiment. After the process of FIG. 147, a resist 350 is formed on the trench similarly to FIG. 148. The resist 350 is a resist having a width narrower than that in the case of FIG. 148. For example, the resist 350 may have such a size that a metal film 316 having the same size as the metal film 316 formed in the trench remains on an upper surface of the semiconductor substrate 300 by processing such as etching in a later process.

Then, as illustrated in FIG. 151, the metal film 316 is removed on the basis of a pattern of the resist 350, and then the resist 350 is removed, so that the metal film 316 is formed so as to protrude to the upper surface of the semiconductor substrate 300.

The method for manufacturing a photoelectric conversion element isolation portion 110 illustrated in FIGS. 151 and 152 is different from that of the previous embodiment in that the metal film 316 is formed to be narrower than a processing width of the trench. There is a concern that a dark current and white point characteristics are deteriorated due to exposure of a trench sidewall interface to ultraviolet light by plasma during the processing of FIG. 152, but there is an advantage of suppression of vignetting by the metal film 316 and high sensitivity.

Note that, for example, provision of a film that absorbs ultraviolet light between the metal film 316 and the semiconductor substrate 300 can be a countermeasure against interface damage during etching processing. For example, $Ta_2O_5$ (tantalum pentoxide) mentioned as one of materials of the fixed charge film 312 has an actually measured extinction coefficient k of 0.000, and k=0.775 at a wavelength of 250 nm.

FIG. 152 illustrates a transmittance calculation result. By forming $Ta_2O_5$ into a film having a thickness of at least 15 nm or more, favorably 60 nm or more, it is possible to suppress dark current and white spot deterioration without impairing almost no deterioration in visible light sensitivity. $Ta_2O_5$ mentioned here is merely an example, and various combinations of materials that suppress ultraviolet light and transmit visible light, and film thickness setting are conceivable.

Seventy-First Embodiment

FIGS. 153A, 153B, 153C, 154A, 154B, and 154C illustrate an example of a manufacturing method of processing a trench in a semiconductor substrate 300 from an irradiation surface and embedding a fixed charge film 312, an insulating film 314, and a metal film 316. For example, a pixel 102 formed by this process has the configuration illustrated in FIG. 113.

FIGS. 153A and 154A are views illustrating the pixel 102 that receives light, FIGS. 153B and 154B are views illustrating the pixel 102 in a black reference pixel region, and FIGS. 153C and 154C are views illustrating a ground region outside a pixel region.

FIGS. 153A, 153B, and 153C illustrate processes corresponding to FIG. 147. In the pixel 102 that receives light, in FIG. 153A, the metal film 316 is formed similarly to FIG. 147, and nothing is performed until the next process.

In the black reference pixel region, as illustrated in FIG. 153B, a resist 350 is formed on the metal film 316 over the entire surface.

In the ground region outside the pixel region, as illustrated in FIG. 153C, the resist 350 is formed on the metal film 316 over the entire surface as in FIG. 153B. For example, this process is a process similar to the formation of the state of FIG. 138A.

Next, as illustrated in FIG. 154A, the metal film 316 is removed by etching, polishing, or the like. As illustrated in FIG. 154A, the metal film 316 is not disposed on the insulating film 314 in a light-receiving region of the subpixel 106 in the region of the pixel 102. Meanwhile, the metal film 316 is embedded in a photoelectric conversion element isolation portion 110 such that the metal film 316 is substantially flat with the surrounding insulating film 314.

In the black reference region, as illustrated in FIG. 154B, the resist 350 is removed after the process of removing the metal film 316. Therefore, the metal film 316 is not removed and the surface is covered with the metal film 316, unlike the region of the pixel 102.

In the ground region outside the pixel region, as illustrated in FIG. 154C, the process is executed so that the metal film 316 remains over the entire surface as in FIG. 154B.

The method of manufacturing the photoelectric conversion element isolation portion 110 illustrated in the present embodiment is different from that in FIGS. 150 and 151 in that the metal film 316 located above the surface of the oxide film (insulating film 314) in the photoelectric conversion element isolation portion 110 is removed. For example, the removal of the metal film in FIGS. 154A, 154B, and 154C is only required to be performed by applying anisotropic etching to the resist mask and performing chemical cleaning. Compared with a process flow of the previous embodiment, there is an advantage that vignetting of the metal film 316 can be further suppressed. Regarding the interface damage during processing, the countermeasures described in the previous embodiment are effective.

Seventy-Second Embodiment

FIGS. 155 to 160 illustrate an example of a manufacturing method of processing a trench in a semiconductor substrate 300 from an irradiation surface and embedding a fixed charge film 312, an insulating film 314, and a metal film 316. For example, a pixel 102 formed by this process has the configuration illustrated in FIG. 109.

FIG. 155 illustrates a process following FIG. 135. After the process of FIG. 135, a hard mask 354 and a resist 350 are formed on the semiconductor substrate 300. The resist 350 has a pattern in which a width to transfer varies depending on a location. Note that, similarly to the pattern to transfer, a well region 310 to be formed in the semiconductor substrate 300 may be formed by changing the width thereof in the processes up to FIG. 135.

Next, as illustrated in FIG. 156, the pattern of the resist 350 is transferred to the hard mask 354. The width of the pattern transferred to the hard mask 354 is also different on the basis of the width of the pattern of the resist 350.

Next, as illustrated in FIG. 157, trenches are formed in the semiconductor substrate 300. The resist 350 may be removed together in this process. Due to the difference in the width of the resist pattern, trenches having different widths are formed in this process.

Next, as illustrated in FIG. 158, the hard mask 354 is removed.

Next, as illustrated in FIG. 159, the fixed charge film 312 and the insulating film 314 are formed. The fixed charge film 312 and the insulating film 314 are formed by, for example, CVD, ALD, sputtering, or the like. In this process, the trench of a photoelectric conversion element isolation portion 110 having a narrow width is closed first due to a dimensional difference in the width of the trench. As illustrated in FIG. 159, while the photoelectric conversion element isolation portion 110 having a narrow width is closed, a slit-shaped opening remains in the photoelectric conversion element isolation portion 110 having a wide width.

Next, as illustrated in FIG. 160, the metal film 316 is formed by CVD, ALD, or sputtering, and the formed metal film 316 is removed from a region other than the photoelectric conversion element isolation portion 110 using the pattern of the resist 350 or the like as necessary. The metal film 316 is formed in the trench having a wide width in which a space is left in the trench in the entire process. Meanwhile, in the narrow trench, the metal film is not formed because the trench is closed by the insulating film 314.

The method for manufacturing the photoelectric conversion element isolation portion 110 illustrated in the present embodiment is different from the above-described embodiment in forming the photoelectric conversion element isolation portion 110 in which the metal film 316 is not embedded and the photoelectric conversion element isolation portion 110 in which the metal film 316 is embedded.

As in the above-described embodiment, it is possible to form the photoelectric conversion element isolation portion 110 from an irradiation surface side of the semiconductor substrate 300. Furthermore, the photoelectric conversion element isolation portion 110 has been described as various embodiments in FIGS. 90 to 1010 and the like, but can be manufactured by applying the above steps in combination.

Seventy-Third Embodiment

Meanwhile, it is also possible to form a photoelectric conversion element isolation portion 110 from a side opposite to an irradiation surface. In the present embodiment, a case of forming the photoelectric conversion element isolation portion 110 from a back surface for some of the above-described embodiments will be described.

In the present embodiment, an example of processing a trench in a semiconductor substrate 300 from a wiring layer side opposite to the irradiation surface will be described.

FIGS. 161 to 169 are views schematically illustrating an example of processes of manufacturing the photoelectric conversion element isolation portion 110 in a pixel 102 according to the present embodiment.

First, as illustrated in FIG. 161, a pattern of a resist 350 in which at least a part of a boundary portion of the pixel 102 or a boundary portion of a subpixel 106 is opened is formed on a wiring layer 302 side of the semiconductor substrate 300. Then, a well region 310 is formed by doping impurities on the basis of the pattern of the resist 350. After the well region 310 is formed, the resist 350 may be removed once.

Next, as illustrated in FIG. 162, the resist 350 having a punching pattern narrower than the well region 310 is formed. In the case where the resist 350 has been removed in the previous process, the resist 350 is newly formed. Furthermore, the new resist 350 may be formed in order to form a thinner trench pattern without removing the resist 350 in the previous process.

Next, as illustrated in FIG. 163, a trench is formed by, for example, a Bosch process or the like in which etching and deposition are alternately repeated. In a case where etching resistance of the resist 350 is insufficient, a hard mask having a high selection ratio, for example, silicon nitride or silicon oxide, may be formed in advance and a trench pattern of the resist 350 is transferred, and etching may be performed via the hard mask. After the trench is formed, the resist 350 is removed. At this timing, the hard mask or foreign substance may be removed with a chemical solution or the like.

Next, as illustrated in FIG. 164, an insulating film 314, for example, silicon oxide or silicon nitride may be formed and embedded in the trench. Note that the insulating film 314 may be formed so as to allow polysilicon 320 to be embedded in a gap between the insulating film 314 and the well region 310, or the metal film 316 to be embedded in the trench inside the insulating film 314.

Next, as illustrated in FIG. 165, after pixel transistors, a wiring layer 302, and the like are sequentially formed, the semiconductor substrate 300 is turned upside down and bonded to a support substrate 352 by plasma bonding or the like. In the following drawings, illustration of the wiring layer 302 and the support substrate 352 is omitted.

Next, as illustrated in FIG. 166, the semiconductor substrate 300 is thinned from the back surface side by wet etching or dry etching, and thinned to a desired thickness by CMP. In the CMP, it is desirable from the viewpoint of suppressing crosstalk to polish the insulating film 314 until a tip on the irradiation surface side is exposed.

The subsequent processes are similar to those of the manufacturing method described in the other embodiments. That is, as illustrated in FIG. 167, a fixed charge film 312 and an insulating film 314 are formed, and subsequently, as illustrated in FIG. 168, the metal film 316 is formed. FIGS. 167 and 168 illustrate the processes as an example, and processes subsequent to FIG. 166 are not limited thereto. That is, the fixed charge film 312, the insulating film 314, and the metal film 316 may be appropriately formed in arbitrary shapes following the above-described embodiments.

Seventy-Fourth Embodiment

In an imaging element 10 of the present invention, a plurality of subpixels 106 each including a photoelectric conversion element is provided in one lens, and parallaxes of the subpixels are different. Since light is captured with a large lens, sensitivity is high in terms of area. Meanwhile, since the area is reduced by being divided into the subpixels 106, a saturation charge (Qs) is reduced.

That is, when a balance between the sensitivity and Qs is lost, and image quality deterioration such as generation of saturated pixels or increase in noise is likely to occur in an object having intensity contrast.

An influence of this principle problem can be reduced by reducing the number of divisions of the subpixels 106.

Meanwhile, when the number of divisions of the subpixels 106 is reduced, a variation to be obtained in parallaxes is reduced.

Therefore, in the present embodiment, a method using solid-phase diffusion will be described. Processes by solid-phase diffusion may implement Qs expansion in a pixel 102 in the present disclosure, and alleviate tradeoff between sensitivity and Qs. Furthermore, trenches used for the solid-phase diffusion can suppress crosstalk between the subpixels 106 and/or crosstalk between the pixels 102 in terms of both optical aspect and charge color mixing. Furthermore, blooming from a saturated pixel to a peripheral pixel can be suppressed.

Through the processes of the present embodiment, for example, the subpixel 106 can be formed by the solid-phase diffusion, as illustrated in FIGS. 120, 121, and 122.

FIGS. 169 to 178 are views for describing a method of manufacturing a periphery of a photoelectric conversion element isolation portion 110 according to the present embodiment.

First, as illustrated in FIG. 169, wide and shallow trenches are formed in advance so as not to cause the solid-phase diffusion in the vicinity of a surface of the semiconductor substrate 300 on a wiring layer 302 side. For the formation of the trenches, for example, a resist is used. First, a hard mask 354 includes silicon nitride or silicon oxide over the entire surface. The hard mask 354 is covered with the resist except for a position where a trench is formed on the semiconductor substrate 300. Next, a pattern is transferred to the hard mask 354 by etching. Then, the portion not covered with the hard mask 354 is etched by, for example, the above-described Bosch process or the like to form a trench. By removing the resist used for forming the trench, the state of FIG. 169 is obtained.

Next, as illustrated in FIG. 170, an insulating film 314 includes, for example, silicon oxide or silicon nitride. Subsequently, a formed insulating film 314 is planarized. Then, a resist 350 in a deep trench portion for the solid-phase diffusion may be formed and transferred to the insulating film 314 by etching. In this process, for example, the resist 350 is formed such that the width to be transferred becomes narrower than that in the previous process in order to form a narrower trench than the trench formed in the previous step.

Next, as illustrated in FIG. 171, etching is performed by a Bosch process or the like up to a desired depth, using the insulating film 314 as a hard mask. By making the width of the second trench processing narrower than that of the first trench processing, the insulating film 314 remains on a sidewall portion, and the solid-phase diffusion in the vicinity of the surface of the semiconductor substrate 300 on the wiring layer 302 side can be prevented.

Next, as illustrated in FIG. 172, silicon oxide (impurity-containing film 356) containing boron (B) as a p-type impurity is deposited inside the opened trench. Here, boron is used as an example, but an oxide film containing other appropriate impurities may be formed.

Next, as illustrated in FIG. 173, heat treatment, for example, heat of about 1000 degrees is applied. By this heat treatment, impurities are solid-phase diffused to form a p-type semiconductor region (well region 310) self-aligned in a trench shape.

Next, as illustrated in FIG. 174, silicon oxide (impurity-containing film 356) containing impurities formed on an inner wall of the trench is removed. For example, the impurity-containing film 356 is removed using dilute hydrofluoric acid or the like.

Next, as illustrated in FIG. 175, the insulating film 314 is formed on the inner wall of the opened trench. The insulating film 314 is formed by forming a film of, for example, silicon oxide or silicon nitride. Subsequently, a gap of the insulating film 314 is filled with polysilicon 320.

Next, as illustrated in FIG. 176, etch-back is performed over the entire surface. The polysilicon 320 formed on the flat surface is removed by the etch-back process. For example, as illustrated in FIG. 176, the polysilicon 320 exists in a shape recessed in the gap of the insulating film 314 in the trench.

Next, as illustrated in FIG. 177, silicon oxide is formed on the recessed polysilicon 320. The silicon oxide is formed by, for example, high density plasma (HDP) CVD. Thereafter, planarization is performed by CMP or the like. Moreover, a nitride film is removed with hot phosphoric acid or the like.

Then, the shapes of the semiconductor substrate 300 and the photoelectric conversion element isolation portion 110 as illustrated in FIG. 178 are obtained.

Thereafter, a vertical transistor 324, a wiring layer 302, and the like (not illustrated) are appropriately formed as necessary. Then, the semiconductor substrate 300 is turned upside down (that is, the state of FIG. 178 is vertically inverted) and bonded to a support substrate by plasma bonding or the like.

The semiconductor substrate 300 is thinned from the back surface side by, for example, wet etching or dry etching, and then thinned by, for example, CMP until the insulating film 314 and the polysilicon 320 at the trench tip are exposed. Thereafter, for example, a manufacturing method similar to that in FIG. 136 and subsequent drawings can be applied.

Seventy-Fifth Embodiment

Meanwhile, a structure of FIG. 122 can be obtained by a manufacturing method of another embodiment.

After FIG. 178, a semiconductor substrate is thinned until an insulating film 314 and polysilicon 320 at a trench tip are exposed. For example, a silicon oxide film is formed as a hard mask, and only an upper portion of the polysilicon 320 is selectively removed by lithography and etching.

Thereafter, for example, the polysilicon 320 is dissolved in a chemical solution such as ammonium hydroxide ($NH_4OH$).

Next, the hard mask and the insulating film 314 are dissolved with dilute hydrofluoric acid or the like.

The state in which the trench is dug from an irradiation surface side corresponds to FIG. 143. Therefore, the manufacturing method and the like illustrated in FIGS. 144 to 160 and the like can be applied to subsequent processes.

As still another embodiment, the structure of FIG. 121 can be formed by adopting a manufacturing method in which the polysilicon 320 is not embedded in FIG. 175 and is closed by the insulating film 314.

Note that, in the manufacturing methods described in some of the above embodiments (for example, FIGS. 133 to 168), a black reference pixel region and/or a peripheral circuit region (not illustrated) may be protected with a resist in etching for processing a trench in a semiconductor substrate from a side opposite to an irradiation surface of a metal film 316.

Furthermore, in any process flow, it is desirable to provide the metal film 316 as an etching stopper layer immediately below a light-shielding wall 108 at a boundary portion of a pixel 102. Moreover, it is desirable to determine a line width of the metal film 316 at the boundary of the pixel 102 so that a process variation such as a line width or misalignment between the light-shielding wall 108 and the metal film 316 does not cause a misstep.

In a case where the metal film 316 is provided between subpixels 106 at positions other than the boundary of the pixel 102, it is not necessary to consider the misstep of the light-shielding wall 108, and thus shapes may be separately formed in consideration of optical characteristics. In a case of placing emphasis on sensitivity, the dimension of the metal film 316 formed between the subpixels 106 at positions other than the boundary of the pixel 102 be smaller than the dimension of the metal film 316 formed at the boundary of the pixel 102.

Seventy-Sixth Embodiment

Next, a process of manufacturing each configuration element on a region constituting a light receiving element described in each of the above-described embodiments will be described.

First, a process of forming a light-shielding wall 108, an interlayer film 306, and the like that isolate pixels 102 will be described. Next, a process of an example of forming the lens 104 will be described. Note that, similarly to some the above-described embodiments, illustration of a wiring layer 302, a support substrate 352, and the like is omitted for easy understanding of a product in a process to be described, but is assumed to be appropriately provided.

FIGS. 179 to 186 illustrate an example of a method of manufacturing an upper layer after processing of a metal film 316.

FIG. 179 is a view illustrating an example of a state in which processes up to the above-described embodiments have been applied and up to the photoelectric conversion element isolation portion 110 has been formed. Although the state of the pixel 102 illustrated in FIGS. 6 and 7 will be described, it is a matter of course that the state of the pixel 102 having the shape and the like described in each of the above-described embodiments may be used. For example, the photoelectric conversion element isolation portion 110 is formed using any of the processes described in some of the above-described embodiments.

First, as illustrated in FIG. 180, a transparent interlayer film 306 is formed on the metal film 316. For the interlayer film 306, for example, silicon oxide is deposited up to a height of a light condensing state designed using a method such as ALD or CVD. As another example, the interlayer film 306 may be formed to be higher than the designed height of the light condensing state.

Next, as illustrated in FIG. 181, the interlayer film 306 is formed at a desired height while planarizing a surface by CMP or the like. Note that this process is not an essential process when the height is not required in the previous process.

In a case where a level difference of the metal film 316 is present to such an extent that planarization is difficult in the process of forming the interlayer film 306, a resist pattern in which a remaining portion of the metal film 316 is opened may be formed, and inversion processing may be performed by anisotropic etching so as to reduce the level difference.

Next, as illustrated in FIG. 182, a resist punching pattern is formed on at least a part of a boundary of the pixel 102 on the interlayer film 306. This process may be performed by, for example, forming a resist so as to form a trench and performing etching.

Next, as illustrated in FIG. 183, groove processing is performed by anisotropic etching, and a metal film to be a material of the light-shielding wall 108, for example, a metal film containing at least one of aluminum, silver, gold, copper, platinum, molybdenum, tungsten, chromium, titanium, nickel, iron, tellurium, or the like, a compound of these metals, or an alloy thereof may be embedded by CVD, sputtering, ALD, or the like.

Furthermore, these materials may be formed in multiple layers. Titanium, titanium nitride, or a laminated film thereof may be formed on the oxide film by, for example, CVD of about 10 nm to form an adhesion layer, and then tungsten may be embedded by CVD or sputtering. Since there is a risk that plasma damage occurs when processing is performed in a state where the metal is electrically floating, it is desirable to connect the light-shielding wall 108 to the metal film 316, and the connected shape enhances a light-shielding effect of the light-shielding wall 108.

Next, as illustrated in FIG. 184, a planar metal film on the surface formed when the metal film is embedded in a groove portion is removed. The metal film is removed by, for example, CMP or anisotropic etching. Through this removal process, an opening for passing light to a subpixel 106 is formed. Furthermore, for example, as illustrated in FIGS. 125 to 130, in a case where the light-shielding wall 108 has a multi-stage configuration, the light-shielding wall 108 may be divided into multiple stages in a third direction.

In a case where the light-shielding wall 108 is not formed, for example, an organic material containing at least one of a styrene-based resin, an acrylic resin, a styrene-acrylic copolymer-based resin, a silosane-based resin, or the like may be used as the interlayer film 306 after processing the metal film 316. For example, these materials may be spin-coated to a desired layer thickness. Furthermore, in a case where there is a possibility that alteration of the material occurs due to contact of these organic materials with the metal film 316, a transparent inorganic film, for example, a silicon oxide film may be formed and then an organic film may be applied as a measure for reliability.

Next, as illustrated in FIG. 185, the interlayer film 306 is formed to have a desired thickness, and then planarization is performed. Note that this process may be executed as necessary as to be described below, and is not an essential process depending on the pixel 102 to be formed.

Next, as illustrated in FIG. 186, a filter 112 is formed. Note that, in a case where the filter is not necessary, for example, the formation of the interlayer film 306 in the previous process may be continued until the thickness becomes appropriate. This can be a different process depending on the presence or absence of each filter 112 depending on the pixels 102 present in a same pixel array 100.

As the filter 112, a photosensitive agent and a resist having a pigment or a dye may be spin-coated onto a wafer, and exposure, development, and post-baking may be performed, for example. Moreover, in the case of the dye resist, UV curing or additional baking may be performed.

An adhesion layer 308 also serving as planarization may be provided below the filter 112. As the adhesion layer 308, for example, a transparent organic material with adjusted viscosity, more specifically, an acrylic resin or an epoxy resin may be spin-coated. The adhesion layer 308 can also play a role as a lift-off layer with a wet chemical solution in peeling and regeneration against patterning failure or device trouble in a subsequent process.

Moreover, in a case where there is a possibility that the adhesion layer 308 is altered by contact with the underlying metal, a transparent inorganic film, for example, a silicon oxide film may be formed below the adhesion layer 308 to protect the adhesion layer, as illustrated in FIG. 185.

The above process can be a pre-process of forming a lens 104.

Seventy-Seventh Embodiment

As an example of a method of manufacturing a lens 104, a case of using etch-back processing will be described with reference to FIGS. 187 to 189.

As illustrated in FIG. 187, a lens material 336 to be a material of the lens 104 is formed on a filter 112 after the process described with reference to FIG. 186. In a case where the filter 112 is not formed, for example, the lens may be formed on an adhesion layer 308 or an interlayer film 306.

The material of the lens 104 is, for example, an organic material such as a styrene-based resin, an acrylic resin, a styrene-acrylic copolymer-based resin, or a silosane-based resin. As illustrated in FIG. 187, the lens material 336 including any one of these materials may be spin-coated. As another example, the lens material 336 may be formed as illustrated in FIG. 187 by forming a film of an inorganic material such as silicon nitride or silicon oxynitride by CVD or the like.

Next, as illustrated in FIG. 188, a resist 350 is applied onto the lens material 336. The resist 350 is formed in accordance with the shape of the lens 104 formed by etch-back.

For example, the resist 350 may be formed to have a period of a pixel 102 in FIG. 5 by performing exposure and development after applying a photosensitive resist in an appropriate shape. Thereafter, heating is performed to a temperature equal to or higher than a softening point of the resist 350 to form a lens shape.

Next, as illustrated in FIG. 189, anisotropic etching is performed using the resist 350 as a mask. Through this process, the shape of the resist 350 can be transferred to the lens material 336.

The etch-back processing can narrow a gap at a boundary of the lens 104 by not only etching but also deposition. By narrowing the gap, a lens ineffective region is reduced, and sensitivity can be improved. Furthermore, a material having a different refractive index, for example, silicon oxide or the like may be formed on the surface of the lens 104 to provide an antireflection film in consideration of so-called 4/nλ law. As a specific example, in a case where silicon oxide having the refractive index of 1.47 is used as the antireflection film in a visible light region for the lens material of a styrene-acrylic copolymer resin having the refractive index of 1.58, the thickness of silicon oxide is favorably 70 to 140 nm, and desirably 90 to 120 nm.

Seventy-Eighth Embodiment

Next, other methods of manufacturing an on-chip lens described in some of the above-described embodiments will be described.

In the present embodiment, a process of manufacturing a reflow lens will be described with reference to FIGS. 190 to 192.

These views illustrate an example of a manufacturing method including a reflow lens as a lens 104 on a flat base.

FIG. 190 is a view after forming up to a filter 112 in the previous embodiment.

In this state, as illustrated in FIG. 191, a lens material 336 is formed on the filter 112. In such a shape, for example, after exposure+development, a photosensitive agent is decomposed by bleaching treatment by light irradiation to increase transmittance. Then, for example, a lens shape is formed by a stepwise reflow processing of about 150 to 200 degrees.

Through this process, the shape of the lens 104 is formed as illustrated in FIG. 192. Finally, the lens 104 may be cured by a thermal crosslinking reaction.

Since the reflow lens material and silicon oxide have poor adhesion, an adhesion layer 308 may be provided below the reflow lens material as a countermeasure therefor. Since the adhesion layer 308 may be altered by coming into contact with a metal, a transparent inorganic film, for example, silicon oxide may be provided below the adhesion layer 308.

In FIGS. 51 to 55, actual SEM pictures and AFM images are illustrated, but as compared with a method of generating the lens 104 by etch-back, the reflow lens has a wider gap and the shape reproducibility varies. Therefore, embodiments for improving the shape reproducibility will be described below with some examples.

Seventy-Ninth Embodiment

FIGS. 193 to 199 illustrate an example of a manufacturing method of forming a reflow lens and a bank-like reflow stopper including a metal film.

FIG. 193 is a view in which the processes up to FIG. 183 have been performed. In the process of embedding the metal film in a light-shielding wall 108 of FIG. 193, a bank shape between lenses 104 is formed using a part of the light-shielding wall 108.

As illustrated in FIG. 194, a resist 350 is formed on the metal film (light-shielding wall 108) formed on a plane parallel to a light-receiving surface. The resist 350 is formed on the light-shielding wall 108 in a first direction and a second direction.

Next, as illustrated in FIG. 195, etching is performed using the resist 350. Through this process, the metal film is left as the light-shielding wall 108 only at a boundary of pixels 102, and a bank-shaped level difference is formed. The reflow lens may be formed using the bank-shaped level difference between pixels 102 as a stopper of the lens material in the reflow process.

That is, the reflow lens may be formed as the lens 104 through the same processes as those in FIGS. 190 to 192 after the process in FIG. 195.

As another example, as illustrated in FIG. 196, in a case where there is a reliability concern such as alteration at an interface between the metal film and the reflow lens material, a transparent insulating film, for example, silicon oxide or the like may be conformally formed by CVD, ALD or the like.

Moreover, as illustrated in FIG. 197, in a case where the adhesion is poor, an adhesion layer 308 may be spin-coated with a material that is transparent, and has low viscosity and good adhesion, for example, an acrylic resin or an epoxy resin so as to leave a level difference.

A bank portion may be formed by directly processing a planar metal film generated when metal is embedded in a groove of the light-shielding wall 108. Such processing makes it possible to integrate the metal film forming processes into one and reduce the processes. Of course, the metal film for generating the bank portion may be different from the metal film of the light-shielding wall 108, that is, may be formed separately from the light-shielding wall 108, and the metal film is not limited thereto.

Next, as illustrated in FIG. 198, a lens material 336 to be a material of the reflow lens is formed.

As illustrated in FIG. 199, the lens 104 is formed through the reflow process after the lens material 336 is formed.

Eightieth Embodiment

FIGS. 200 to 204 illustrate another manufacturing method of forming a reflow lens and a bank-like reflow stopper including a metal film.

First, processing up to the process illustrated in FIG. 200 is applied similarly to the above-described embodiment. Next, in a process of embedding a metal film in a light-shielding wall 108, the metal film formed on a plane parallel to a light-receiving surface is polished and removed by CMP.

Next, as illustrated in FIG. 201, for example, an interlayer film 306 including silicon oxide or the like is made lower than the metal of the light-shielding wall by wet etching using hydrofluoric acid.

Thereafter, as illustrated in FIG. 202, the interlayer film 306 is formed.

Subsequently, as illustrated in FIG. 203, an adhesion layer 308 is formed.

Next, a lens material 336 is formed as illustrated in FIG. 204.

Then, as illustrated in FIG. 205, a lens 104 is formed through a reflow process.

This manufacturing method is advantageous in that the reflow lens can be formed on the light-shielding wall 108 by self-alignment.

Eighty-First Embodiment

FIGS. 206 to 212 illustrate an example of a manufacturing method of forming a reflow lens and a bank-like reflow stopper including a transparent material.

First, processing up to the process illustrated in FIG. 206 is applied similarly to the above-described embodiment. That is, processes for forming a light-shielding wall 108 up to FIG. 184 are performed.

Next, after the planar metal film is removed in FIG. 206, a transparent film, for example, a silicon oxide film is formed again as an interlayer film 306 as illustrated in FIG. 207.

Next, as illustrated in FIG. 208, a resist 350 is formed. The resist 350 is formed so as to mask a region that can maintain a state in which the light-shielding wall 108 is covered by an etching process, for example.

Next, as illustrated in FIG. 209, etching is performed for a mask using the resist 350 to form a bank-shaped level difference while leaving silicon oxide only at a boundary of pixels 102. A lens shape may be formed using the bank-shaped level difference between pixels 102 as a reflow stopper. After the etching, the resist 350 is appropriately removed.

Next, as illustrated in FIG. 210, in a case where adhesion between the reflow lens material and silicon oxide is poor, an adhesion layer 308 is formed. The adhesion layer 308 includes, for example, a transparent material having adjusted viscosity and good adhesion, for example, an acrylic or epoxy resin. For example, the adhesion layer 308 is formed by thinly spin-coating the resin or the like so as to leave the level difference.

Next, as illustrated in FIG. 211, a lens material 336 is formed between stoppers formed by the interlayer film 306 or the adhesion layer 308.

Next, as illustrated in FIG. 212, a reflow lens may be formed as the lens 104 from the lens material 336 by reflow processing.

Eighty-Second Embodiment

FIGS. 213 to 216 illustrate an example of a manufacturing method of forming a reflow lens and a bank-shaped reflow stopper including a photosensitive organic light-shielding material, for example, a carbon black resist.

A carbon black material is, for example, a photoresist composition including a carbon black dispersion, an acrylic monomer, an acrylic oligomer, a resin, a photopolymerization initiator, and the like.

First, processing up to the process illustrated in FIG. 213 is applied similarly to the above-described embodiment. That is, processes for forming a light-shielding wall 108, an adhesion layer 308, and the like up to FIG. 198 are performed. Similarly to the above-described embodiment, the adhesion layer 308 and a filter 112 are not essential configurations on the basis of use and state thereof.

Next, as illustrated in FIG. 214, a lens isolation portion 120 is formed on the filter 112. The lens isolation portion 120 may be formed in a bank shape at a boundary of pixels 102 by, for example, photolithography. A lens shape may be formed using a bank-shaped level difference formed at the boundary between pixels 102 as a reflow stopper.

In a case where adhesion between carbon black and silicon oxide, or adhesion between a reflow lens material and silicon oxide is poor, a transparent material having low viscosity and good adhesion, for example, an acrylic resin or an epoxy resin may be thinly spin-coated so as to leave a level difference.

Next, as illustrated in FIG. 215, a lens material 336 is formed between the lens isolation portions 120 formed on the interlayer film 306, the adhesion layer 308, or the filter 112.

Next, as illustrated in FIG. 216, a reflow lens may be formed as a lens 104 from the lens material 336 by reflow processing.

Eighty-Third Embodiment

In some of the above-described embodiments, the manufacturing method of etch-back processing or reflow processing used as the on-chip lens has been described with some examples. Next, an example of a method of manufacturing an inner lens 118 will be described.

FIGS. 217 to 224 illustrate an example of a manufacturing method of forming the inner lens 118 of a pixel 102.

In the present embodiment, as an example, a structure formed on an upper light-shielding wall of two-stage wall will be described an example, but the light-shielding wall may have any number of stages. Furthermore, the inner lens 118 is located substantially at a center of the pixel 102 in a first direction and a second direction and substantially at a center of an interlayer film 306 in a third direction, but this is also illustrated as an example, and the inner lens may be provided at any position. For example, there may be a shift in the first direction or the second direction due to pupil correction, or a shift in the third direction due to control of light condensing characteristics.

FIG. 217 is a view after a lower light-shielding wall 108 is formed, and since the manufacturing method up to this process has been described in the description with respect to FIGS. 179 to 184, description is omitted.

In this state, a lens material 336 is formed as illustrated in FIG. 218.

Next, as illustrated in FIG. 219, a resist 350 is formed on the basis of the shape of the inner lens 118 to be formed.

Next, as illustrated in FIG. 220, the shape of the resist 350 is transferred to the lens material 336 to form the inner lens 118.

Thereafter, processing such as film formation is applied to the inner lens 118 as necessary. For the inner lens 118, for example, an inorganic material having a high refractive index, such as SiN or SiON, by CVD or the like may be deposited. Furthermore, the inner lens 118 may be a multilayer film, and a hydrogen supply amount may be controlled to control an interface state of a semiconductor substrate. In the case of providing a multilayer film, a film may be appropriately formed with a film thickness in consideration of the 4/nλ law with respect to a refractive index difference, and an antireflection effect may be exhibited.

As another example, the resist 350 having a lens shape by thermal reflow processing may be transferred to an inner lens material by etching processing. Furthermore, antireflection films having different refractive indexes may be conformally formed on the inner lens 118 by CVD or the like with a film thickness setting in consideration of the 4/nλ law.

Next, as illustrated in FIG. 221, a transparent inorganic film, for example, silicon oxide or the like is formed as the interlayer film 306 by CVD.

Next, as illustrated in FIG. 222, planarization may be performed by CMP or the like.

Thereafter, as illustrated in FIG. 223, the pattern of the upper wall is transferred to the resist and then etched.

Subsequently, as illustrated in FIG. 224, a metal film of aluminum, tungsten, copper, or the like, or an alloy material containing at least one of the metals may be embedded in a groove of the upper wall by CVD, sputtering, or the like after forming an adhesion layer as necessary. Then, the metal of a surface layer is removed by CMP or etching, and the upper wall is formed while leaving the metal film only in the groove.

Eighty-Fourth Embodiment

Next, a manufacturing process in a case where a Fresnel lens 122 is provided as an on-chip lens (lens 104) will be described.

FIGS. 225 to 229 illustrate an example of processing using nanoimprinting as a manufacturing method of forming the Fresnel lens 122 of a pixel 102.

After the process of FIG. 183, an adhesion layer 308 is formed as illustrated in FIG. 225.

Next, as illustrated in FIG. 226, after the adhesion layer 308 is formed, a lens material 336 is formed. For example, a transparent ultraviolet curing resin to be the lens material 336 may be discharged onto a wafer.

Next, as illustrated in FIG. 227, an alignment mark on the wafer is measured, and a Fresnel lens shaped mold 338 is pressed against a predetermined position and then temporarily cured by ultraviolet irradiation.

Thereafter, as illustrated in FIG. 228, the mold 338 may be released upward. This process is repeated until the required temporary curing of the Fresnel lens 122 is completed. For example, this processing is repeated for pixels 102 of the entire wafer.

Then, as illustrated in FIG. 229, the Fresnel lens 122 may be formed by completely curing the lens by additional ultraviolet irradiation and heat treatment.

Eighty-Fifth Embodiment

FIGS. 230 to 232 illustrate another example of a manufacturing method of forming a Fresnel lens 122 of a pixel 102.

FIG. 230 illustrates, for example, a process subsequent to FIG. 186. As illustrated in FIG. 230, a lens material 336 is formed on the filter 112.

Figure 231A:
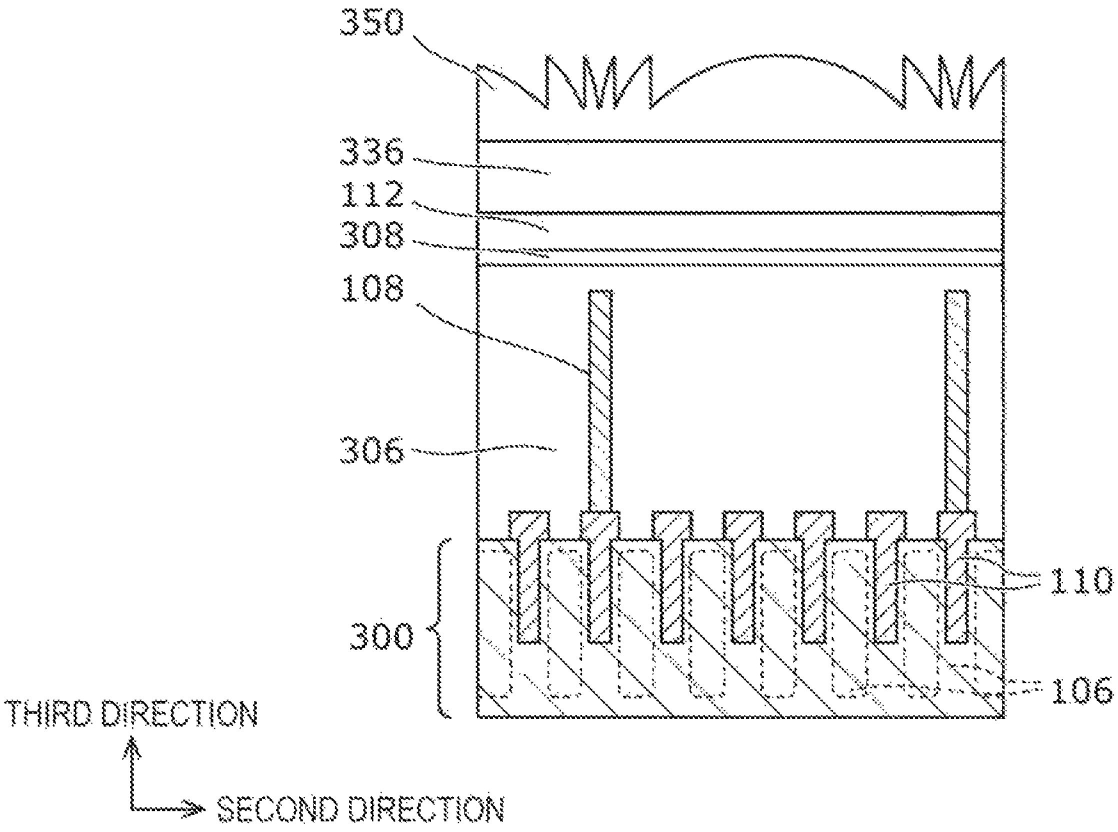

Next, as illustrated in FIG. 231A, a resist 350 appropriate for a shape of the Fresnel lens is formed on the lens material 336.

Figure 231B:
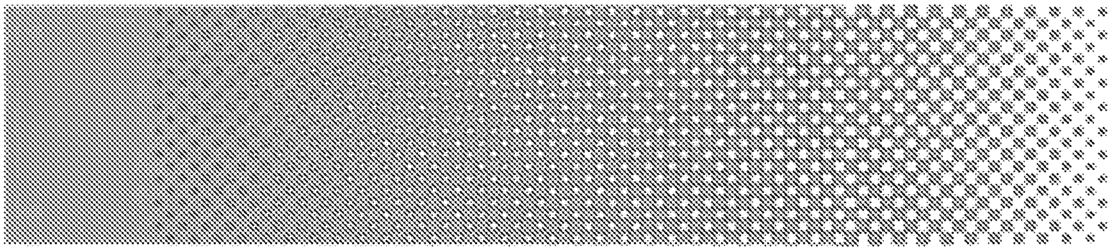

The resist 350 is formed using, for example, a grayscale mask as illustrated in FIG. 231B. In the resist 350, a blazed-shaped pattern is formed by lithography using the grayscale mask. The grayscale mask is a mask capable of adjusting transmittance of zero-order component light reaching a wafer by changing a pattern coverage at a pitch at which resolution is not good.

A reticle pattern of the grayscale mask is arranged so as to enable zero-order light to be used for lithography to be appropriately transmitted through the wafer. For example, by changing density of an unmodified fine pattern, the zero-order transmitted light from an exposure device is controlled to form the blazed-shaped resist 350.

As illustrated in FIG. 232, the Fresnel lens 122 may be formed by transferring the resist 350 to a lens material by etching or the like.

Eighty-Sixth Embodiment

Next, some examples of a manufacturing process in a case where a diffractive lens 124 is provided as a lens 104 will be described.

FIGS. 233 to 235 illustrate an example of a manufacturing method for forming a zone plate-type diffractive lens 124. In the present embodiment, a lens material is, for example, an organic material such as a styrene-based resin, an acrylic resin, a styrene-acrylic copolymer-based resin, or a silosane-based resin.

In FIG. 233, for example, a lens material 336 of the above material is formed for the one illustrated in FIG. 186. This formation is performed by, for example, applying the above-described material.

Next, as illustrated in FIG. 234, a resist 350 is formed on the lens material 336.

Then, as illustrated in FIG. 235, a pattern is transferred to the lens material 336 by etching processing using the resist 350 as a mask to form the diffractive lens 124.

Eighty-Seventh Embodiment

FIGS. 236 to 238 are views illustrating another example of a method of manufacturing a diffractive lens 124.

In FIG. 236, an interlayer film 306 is further formed and planarized after the process of FIG. 184.

As illustrated in FIG. 237, a resist 350 is formed on the interlayer film 306.

Then, as illustrated in FIG. 238, a part of the interlayer film 306 may be processed into a lens shape as the diffractive lens 124.

Eighty-Eighth Embodiment

FIGS. 239 to 242 are views illustrating another example of a method of manufacturing a diffractive lens 124. Wavelength dependence of the diffractive lens 124 varies depending on a thickness. Therefore, the diffractive lens 124 is desirably formed to have an appropriate thickness.

FIG. 239 illustrates a state that has undergone up to the process of FIG. 184.

As illustrated in FIG. 240, a lens material 336 is formed on an interlayer film 306. The lens material 336 is another transparent insulating film different from the interlayer film 306 having a high refractive index, for example, silicon nitride, SiON, or the like. These materials are deposited.

Next, as illustrated in FIG. 241, a resist 350 is formed on the lens material 336.

Next, as illustrated in FIG. 242, a part of the lens material 336 is removed using the resist 350 as a mask. For example, at timing of this anisotropic etching, the interlayer film 306 can be uniformly processed as an etching stopper layer.

As described above, according to the present embodiment, the diffractive lens 124 having an appropriate thickness can be generated.

Eighty-Ninth Embodiment

The diffractive lens 124 may have a blazed-shape as illustrated in FIG. 83.

The blaze-type diffractive lens 124 is formed by using, for example, a resist 350 formed by lithography using a gray-scale mask as illustrated in FIG. 231B. Furthermore, as another example, it may be formed by nanoimprinting using a mold as illustrated in FIG. 227.

In any case, it is possible to form the appropriate diffractive lens 124 by designing the shape of the resist or the mold to be appropriately formed into the shape of the blazed diffractive lens 124.

Ninetieth Embodiment

As to formation of a color filter, an exemplary embodiment has been described in the above embodiment, and thus is omitted. In the present embodiment, respective manufacturing methods will be described for the configurations of various pixels 102 having color filters illustrated in FIGS. 34 to 37 and 49.

FIG. 34 illustrates an embodiment in which a filter 112 is provided above a light-shielding wall 108. That is, the filter 112 is formed in a process after formation of the light-shielding wall 108. In general, the material of the filter has weak heat resistance, and even a relatively resistant pigment is likely to be altered at 300 degrees or higher to cause problems such as a decrease in sensitivity.

The present embodiment has an advantage of manufacturing the light-shielding wall 108 by an appropriate processing means without being restricted by vulnerability of heat resistance of the filter. For example, an interlayer film 306 such as plasma-tetraethoxysilan (P-TEOS) or plasma-silicon monoxide (P—SiO) may be formed at about 400 degrees by using plasma CVD for forming a film under high-frequency plasma. A trench for forming the light-shielding wall 108 may be formed, and tungsten may be embedded in the trench by thermal CVD at a reduced pressure of about 400 degrees with good coverage.

Ninety-First Embodiment

FIGS. 35, 36, 37, and 49 first form a filter 114.

Therefore, it is necessary to process a wall structure by a low-temperature process in a subsequent process so as not to alter the filter 114.

As an interlayer film 306, for example, a low-temperature oxide (LTO) film may be formed by CVD. As another example, an organic material such as a styrene-based resin or an acrylic resin may be spin-coated. A light-shielding material for a trench of a light-shielding wall 108 has poor coverage, but for example, a metal film may be embedded by sputtering that can form a film at 300 degrees or less. In addition, an organic material having a light-shielding property, for example, a material containing carbon black may be embedded by spin-coating.

Ninety-Second Embodiment

In the above-described embodiment, a method of manufacturing a color filter has been described, but in the present embodiment, an example of a method of manufacturing a plasmon filter will be described.

FIGS. 243 to 246 illustrate an example of a method of manufacturing a plasmon filter 116. FIGS. 244A, 245A, and 246A illustrate processing in a region where a pixel 102 exists, and FIGS. 244B, 245B, and 246B illustrate processing in a region where the pixel 102 does not exist.

FIG. 243 is formed by the same processes as those up to FIG. 136.

When processing is performed in a state where metal is electrically floating, there is a risk of occurrence of plasma damage.

Therefore, as illustrated in FIGS. 244A and 244B, in the state of FIG. 243, a resist 350 is formed on an insulating film 314, and etching is performed. Through this etching process, a via is formed as illustrated in FIG. 244B, the via for grounding a metal film 116A on which the plasmon filter 116 is formed, outside the region of the pixel 102.

As illustrated in FIGS. 245A and 245B, at the timing of forming the metal film 116A, a conductive region of a semiconductor substrate 300 is electrically connected to the metal film 116A outside the region of the pixel 102 via a contact via to be grounded. Meanwhile, in the region where the pixel 102 is present, a well region 310 and the metal film 116A are insulated via a fixed charge film 312 and the insulating film 314.

As the metal film 116A, aluminum may be deposited by about 150 to 200 nm by CVD, sputtering, ALD, or the like. As a barrier metal, for example, titanium nitride (TiN), titanium (Ti), or the like may be deposited by about several nm below aluminum as necessary.

Next, as illustrated in FIG. 246A, a hole 116B of the metal film 116A is formed in the region of the pixel 102. An insulating film, for example, silicon oxide may be embedded in the hole 116B by ALD or the like.

Meanwhile, as illustrated in FIG. 246B, it is not necessary to form the hole 116B in the metal film 116A outside the region of the pixel 102.

In a case where the metal film 116A of the plasmon filter 116 also serves as inter-pixel light-shielding or a metal film 316 formed as a light-shielding film of a black reference pixel region, there is a possibility that optimum film thicknesses thereof are different from each other. In this case, it is desirable to form a metal film with a film thickness required in the black reference pixel region and then mask the metal film with a resist to thin the plasmon filter portion by etching.

As described above, according to the present embodiment, the plasmon filter 116 can be appropriately formed.

[Signal Processing Device]

Here, some usage examples of an imaging device 3 including pixels 102 described above will be described.

More specifically, processing for a signal acquired in a subpixel 106 of the imaging device 3 will be described with some examples.

The imaging element 10 having the pixel array 100 including the pixels 102 described in each of the above-described embodiments is provided in the imaging device 3. As illustrated in FIG. 8, the electronic device 1 includes the imaging element 10, that is, the imaging device 3. The electronic device 1 includes a signal processing unit 40, a storage unit 42, an image processing unit 44, an authentication unit 46, and a result output unit 48, in addition to the imaging device 3. In the following embodiment, an example of the signal processing unit 40 and the image processing unit 44 among these elements will be described.

Note that, in the following description, the signal processing unit 40 and the image processing unit 44 will be separately described, but these functions may not be clearly separated. The signal processing unit 40 and the image processing unit 44 will be separately described, but each configuration element included in these units may be included in any unit.

That is, there is a signal processing device including the signal processing unit 40 and the image processing unit 44, and it may be understood that the signal processing device includes each configuration element to be described below. Then, the electronic device 1 may be a device including the imaging device 3 and the signal processing device.

Ninety-Third Embodiment

FIG. 247 is a block diagram illustrating an example of a signal processing unit 40. The signal processing unit 40 includes an A/D conversion unit 400, a clamp unit 402, an output unit by subpixel 404, and an output unit by color 406.

Each unit illustrated in this drawing may be implemented by a dedicated circuit, or a part thereof may be implemented by a dedicated circuit. Furthermore, as another example, in part of or entire processing, information processing by software may be specifically executed by an electronic circuit such as a CPU using hardware resources. In this case, programs and the like necessary for the information processing by software may be stored in a storage unit 42. This configuration is similar in an image processing unit 44, an authentication unit 46, and a result output unit 48 to be described below.

The A/D conversion unit 400 (analog to digital converter) converts an analog signal output from an imaging element 10 into a digital signal for each subpixel 106. The A/D conversion unit 400 outputs the converted digital signal, for example, as image data.

For example, the clamp unit 402 defines a black level, subtracts the defined black level from the image data output from the A/D conversion unit 400, and outputs the image data. The clamp unit 402 may set a ground level for each photoelectric conversion element included in a pixel, and in this case, may perform ground correction of a signal value for each acquired photoelectric conversion element.

The output unit by subpixel 404 outputs the image data output from the clamp unit 402 for each subpixel. The imaging element 10 has pixels 102 in an array (pixel array 100), and includes a plurality of subpixels 106 in each of the pixels 102.

That is, the pixels 102 each including the subpixels 106 as described above are arranged. Then, intensity information of light incident on each pixel 102 is output as digital image data for each subpixel 106. The output unit by subpixel 404 classifies and aggregates the image data according to the arrangement of the subpixels 106 in the pixel 102, and outputs the image data for each position of the subpixels 106.

As a specific example, for example, in a case where the imaging element 10 includes 2000×4000=eight million pixels 102 and the pixel 102 includes 3×3=nine subpixels 106, the output unit by subpixel 404 outputs a total of nine pieces of image data of eight million pixels for each subpixel. An image thus output is hereinafter referred to as a subpixel image.

As an example, information of the subpixel 106 located in a center of the pixel 102 is aggregated by the number of pixels 102 in the pixel array 100 to obtain one subpixel image. The subpixels 106 arranged at other positions in the respective pixel 102 are also aggregated by the number of pixels 102 to acquire subpixel images.

For example, in a case where an analog signal is acquired by color in the imaging element 10, the output unit by color 406 outputs data of the subpixel image for each color. In the imaging element 10, for example, red (R), green (G), and blue (B) filters are provided in a pixel.

The clamp unit 402 adjusts the ground level on the basis of these filters and outputs the image data on the basis of the adjusted ground level. The output unit by subpixel 404 outputs the subpixel image on the basis of the image data output by the clamp unit 402. The output unit by color 406 outputs the signal output from the output unit by subpixel 404 by color.

The analog signal acquired by the imaging element 10 does not include color data. To cope with this, for example, the output unit by color 406 may store data of a filter provided for each light receiving element in the imaging element 10 and perform output for each color on the basis of this data. For example, each subpixel image may be output as multi-channel data having color information in another channel.

Although the imaging element 10 includes the color filter, the present embodiment is not limited thereto. For example, the imaging element 10 may be configured to identify the color by an organic photoelectric conversion film.

Furthermore, there may be a case where the imaging element 10 includes, for example, a photoelectric conversion unit that receives near-infrared light, or a case where the imaging element 10 includes a complex spectrum such as a plasmon filter. Although it is difficult to express these pieces of information with a simple concept of color, the output unit by color 406 may process these pieces of information as long as they can be classified from the viewpoint of a wavelength of light.

The signal processing unit 40 converts the analog signal output from the imaging element 10 into an appropriate digital signal and outputs the digital signal in this manner. For example, as described above, analog data received from the imaging element 10 is converted into the digital subpixel image and is output by color.

FIG. 248 is a block diagram illustrating an example of the image processing unit 44. The image processing unit 44 includes a defect correction unit 440, a subpixel shift amount calculation unit 442, a resolution operation unit 444, an angle of view operation unit 446, an addition processing unit 448, a demosaic unit 450, a linear matrix unit 452, and a spectrum analysis unit 454.

The defect correction unit 440 corrects a defect in the image data. The defect of the image data occurs due to, for example, a pixel defect or information defect due to a defect of a photoelectric conversion element provided in the pixel, or information loss due to light saturation in an optical system 9. The defect correction unit 440 may execute defect correction processing by performing interpolation on the basis of, for example, information of surrounding pixels, information of pixels considered to be equivalent in other subpixel images, or information of surrounding subpixels 106 in the same pixel 102.

For example, the defect correction unit 440 can interpolate the subpixel image or the like by an arbitrary algorithm such as bilinear, bicubic, or lanczos. Furthermore, a method such as a nearest-neighbor may be used using another subpixel image or the like. The user may select an interpolation method. As another example, the defect correction unit 440 may automatically select an appropriate interpolation method in accordance with the image.

The subpixel shift amount calculation unit 442 calculates a shift amount with which images of respective objects match each other for a plurality of subpixel images having different parallaxes. A reference subpixel image to be matched can be arbitrarily selected, and is, for example, a subpixel image in the center of the pixel 102. Even in a case of selecting another subpixel image, the subpixel shift amount calculation unit 442 can execute similar processing.

In a case where it is guaranteed that an object distance is constant, the shift amount may be calculated in advance and stored in the storage unit 42 as a fixed parameter. In a case where the object distance changes, each subpixel image and a reference image may be shifted little by little, and the shift amount with a smallest difference may be obtained by calculation.

When a thick protective seal is stuck on a cover glass or the like, the object distance becomes constant, but there is a concern that the object distance may change due to replacement of the protective seal. In such a case, when an authentication success rate falls below a predetermined probability, the object distance may be calculated by calculation, and the shift amount stored as the fixed parameter may be corrected.

Furthermore, in a case where the object distance changes within the angle of view, the angle of view may be divided into a plurality of blocks, and the shift amount may be calculated in each block. This corresponds to, for example, a case where there is a parallelism deviation between a reading surface 12 and a fingerprint sensor, a case where there is an influence of a foreign substance when a protective seal is attached, or a case where finger contact failure or the like occurs. Note that these shift amounts do not necessarily need to be expressed by an integer of how many pixels, and may be output by a required number of decimal places.

The resolution operation unit 444 operates resolution of the acquired image data. For example, the resolution operation unit 444 may perform arithmetic processing of operating the resolution on the basis of the subpixel image, or may redefine an appropriate pixel pitch and the number of pixels in the image. Note that, in general, in image processing for operating resolution, side effects such as an increase in artifacts and noise components may be caused. Therefore, the resolution operation unit 444 may pass the image to a next process without executing the resolution conversion processing at all.

Furthermore, at the time of initial authentication, the image may be output in the next process without performing the resolution processing. In a case where the output required by an electronic device 1 cannot be obtained, the calculation of the resolution operation unit 444 may be performed in the second and subsequent processing. Of course, an image for which the resolution operation unit 444 has performed the resolution processing may be output from the first time.

The angle of view operation unit 446 operates the angle of view of input image and outputs the image. For example, the angle of view operation unit 446 may output an image with an expanded angle of view on the basis of the shift amount of each subpixel image with respect to magnitude of the angle of view of the subpixel image to be input image. The expansion of the angle of view is performed by shifting and synthesizing a plurality of subpixel images having different parallaxes. As a result, the angle of view operation unit 446 can output information of a wide viewing angle.

The addition processing unit 448 performs calculation such as addition processing for the image input from the angle of view operation unit 446. The addition processing described herein may be another processing that produces an effect close to addition. The addition processing may be, for example, median processing, moving average processing, or average processing after outlier determination is performed and an abnormal value is excluded.

As another example, in a case where a signal to noise ratio (SN ratio) of the input image is not sufficient, for example, the addition processing unit 448 may improve the SN ratio by adding outputs of a plurality of neighboring pixels in the same subpixel image. In this case, the pixel pitch and the number of pixels of an output image from the addition processing unit 448 are redefined.

As a specific example, the addition processing unit 448 divides a demosaic image of 1000×2000 pixels (=two million pixels) into sections of 5×5 pixels, and performs the addition processing and the like for each section. As a result, an image of 200×400 pixels (=80,000 pixels) with a good SN ratio may be output. Even in a case where the SN ratio of the input image is sufficient, there is an advantage that a calculation time can be shortened by reducing the number of pixels. Therefore, the addition processing may be performed within a range in which an influence on determination accuracy of the authentication unit 46 in the subsequent stage can be determined to be small.

Another embodiment in the addition processing unit 448 will be described. For example, the addition processing unit 448 may perform the addition processing in the same information by color for images to which the shift amount has been applied so that the respective object images match each other, using a plurality of subpixel images.

For example, it is assumed that the imaging element 10 does not include a color filter in the pixel 102 and has 3×3 subpixels in the pixel 102. Moreover, it is assumed that the imaging element 10 includes a lens 104 so as to collect light near a metal film 316. In this case, an output almost nine times a sensitivity light amount of one subpixel image is obtained by performing the addition processing.

In other words, an output close to the sensitivity light amount in a case where one photoelectric conversion element is provided for one lens 104 is acquired, and angular resolution is improved. Note that, in practice, it is necessary to consider an influence of vignetting by the metal film 316, a cosine fourth law, and the like, and thus the numerical value of nine times is not accurate. However, it is obvious that effect of the addition processing is significant.

The number of divisions of the subpixels is not limited to 3×3 as described in each of the above embodiments, and may be, for example, 4×4 divisions or 5×5 divisions. Note that, when the number of divisions is increased, the influence of a sensitivity loss due to vignetting or the like increases. Moreover, a balance between sensitivity and a saturation charge amount is lost, and there are new problems such as potential breakage and electron leakage due to blooming. Therefore, it is desirable to appropriately set the number of divisions. In a case where there is a difference in oblique incidence characteristics of the respective subpixels, the addition processing unit 448 may appropriately weight a value to be used for the addition processing and perform the addition processing.

The demosaic unit 450 executes demosaic processing using the plurality of subpixel images output by the addition processing unit 448. Specifically, interpolation or the like for the information by color is performed on the basis of the plurality of subpixel images, and for example, the subpixel images are converted into image data of RGB three channels.

In general, demosaic processing is processing of interpolating color information by collecting insufficient color information from signals of peripheral pixels of a signal of each pixel having only monochromatic color information in a Bayer array including red, blue, and green, for example, to create a full-color image. Meanwhile, the demosaic processing in the present embodiment is different from the conventional method in performing interpolation using a plurality of subpixel images.

Specifically, the demosaic unit 450 performs shift processing for each of the plurality of subpixel images so that the object images match each other. Subsequently, the demosaic unit 450 can complementarily interpolate information by color and output values at equivalent addresses (positions in the images) in the plurality of images for which the shift processing has been performed to synthesize the images. Moreover, the demosaic unit 450 may apply the demosaic processing of outputting a full-color image by interpolating the information by color that is insufficient in the signal of each pixel of the synthesis image with the signals of peripheral pixels of the synthesis image.

Note that, in a case where there is a fraction in the shift amount of each subpixel image, the demosaic unit 450 may round the shift amount to an integer by rounding off or the like. As another example, the demosaic unit 450 may apply the demosaic processing after correcting the shift amount to an array in which no fraction occurs by interpolations.

For example, in a certain subpixel image, it is assumed that the arrangement of outputs of a certain row is {100, 116, 109, . . . }, and the shift amount is +0.25 pixels in an X direction. In this case, the demosaic unit 450 may shift a phase so as to match the reference image by, for example, a linear interpolation algorithm, and may perform output as follows:

$$\{100+(116-100)\times 0.25,\ 116+(109-116)\times 0.25,\ \ldots\} = \{104.0,\ 114.3,\ \ldots\}$$

The demosaic processing of the present embodiment is not limited to the concept of color, and for example, information of wavelength bands other than visible light such as near-infrared light may be included in the information by color. Furthermore, a plurality of these wavelength bands may be defined.

The linear matrix unit 452 executes matrix operation for the color information of RGB or the like. The linear matrix unit 452 performs correct color reproduction by this matrix operation. The linear matrix unit 452 is also referred to as a color matrix unit.

For example, the linear matrix unit 452 acquires desired spectroscopy by performing an operation related to a plurality of wavelengths. In the present embodiment, for example, the linear matrix unit 452 performs an operation so as to perform an output suitable for detecting a skin color. The linear matrix unit 452 may include an operation path of a different system from the skin color, and for example, may perform the operation so as to obtain an output suitable for detection of yellow to red wavelength regions in order to acquire information of a vein.

The spectrum analysis unit 454 analyzes a spectrum, for example, detects the skin color or the like, on the basis of data output from the linear matrix unit 452. For example, the spectrum analysis unit 454 determines whether or not there is a rise in skin color spectrum, and detects a wavelength of the skin color in a case where the skin color is present.

The skin color varies from individual to individual, but a rise is often present in a wavelength region of approximately 550 to 650 nm, typically around 590 nm. For this reason, the spectrum analysis unit 454 detects whether or not a human finger is in contact with the reading surface 12, for example, by detecting a rise of a signal in a range including 500 to 700 nm, and in this case, detects and outputs a wavelength of the human finger. The range of the wavelength to be determined is not limited to the above range, and may be wider or narrower than the above range.

In this manner, the image processing unit 44 applies appropriate image processing to the subpixel image output from the signal processing unit 40 and outputs the subpixel image. The authentication unit 46 may execute personal authentication as illustrated in the above-described embodiment on the basis of the output.

The authentication unit 46 executes personal authentication on the basis of, for example, a fingerprint shape (characteristic point) output from the addition processing unit 448 or the like. For example, the authentication unit 46 may execute biometric authentication or personal authentication with a rising spectral shape of a skin color spectrum analyzed by the spectrum analysis unit 454.

In a case where the spectrum analysis unit 454 detects characteristics of a spectrum from a vein, the authentication unit 46 may further confirm that an object in contact with the reading surface 12 is a living body using data of the characteristic. Furthermore, the authentication may be executed in combination with authentication related to the vein shape.

For example, personal information may be stored in the authentication unit 46 as a characteristic point of a fingerprint or a sweat gland, or may be stored in the storage unit 42. The stored information may be information regarding a spectrum or information regarding a shape such as a fingerprint. In a case where an object comes into contact with the reading surface 12, the authentication unit 46 can determine that the object is a finger of a living body and can authenticate that the object is a stored individual.

The result output unit 48 outputs a personal authentication result on the basis of a result output from the authentication unit 46. For example, the result output unit 48 may output a signal of authentication OK in a case where the finger in contact with the reading surface 12 at the timing matches the recorded personal data, or may output a signal of authentication NG in the other cases.

FIG. 249 is a flowchart illustrating processing of the electronic device 1 according to the present embodiment. This flowchart differs from FIG. 9 in using a spectrum for authentication. This part will be described in detail. Since processing of S100 to S106 is not particularly changed from the description of FIG. 9, detailed description is omitted.

After receiving light, the signal processing device applies necessary processing such as signal processing and image processing to a received analog signal (S108). In this processing, as described above, first, the signal processing unit 40 converts the analog signal acquired from the imaging device 3 into the image data that is a digital signal. Subsequently, the image processing unit 44 converts the image data into appropriate image data.

Processing of S110 is also similar to the description of FIG. 9, and thus details are omitted.

Following the processing of S110, the authentication unit 46 determines whether or not spectra match each other (S114). The authentication unit 46 compares a result of the spectrum analyzed by the spectrum analysis unit 454 with a result of an individual stored in the storage unit 42, and executes this determination. For example, the determination is made on the basis of whether or not the acquired spectrum is present within a predetermined range from the stored rising spectrum of the skin color. In this manner, the personal authentication may be performed not only with the fingerprint shape but also with the spectrum. Moreover, identification accuracy may be improved by adding not only the information of the sensitivity spectrum of the imaging element 10 but also spectrum information of a light source.

Furthermore, spectrum information of a vein may be acquired as another means for determining whether or not the object is a living body. In this case, near-infrared light may be emitted from a light emitting unit, and a spectrum indicating a state of the vein may be acquired and analyzed.

Furthermore, as will be described in an embodiment to be described below, the shape of the vein may be acquired in the signal processing device. In this case, the authentication unit 46 may also perform the personal authentication by comparing the shape of the vein shape. Moreover, the signal processing device may acquire three-dimensional information of a three-dimensional vein shape by synthesizing subpixel images. Then, the authentication unit 46 may perform the personal authentication by collating the three-dimensional information of the three-dimensional vein shape acquired by the synthesis processing with the stored three-dimensional information.

In a case where the spectra do not match each other (S114: NO), the processing from S102 is repeated. Since the position of the finger is indefinite at the beginning, a display unit is caused to emit light in a wide region. However, for example, in the second and subsequent times of the light emission condition acquisition S104, the authentication accuracy may be enhanced by reducing noise light by narrowing down a light emission area on the basis of image information of the first authentication. Furthermore, the second and subsequent authentications may be performed while changing the light source condition. Moreover, the second and subsequent authentications may be performed while changing content of the signal processing such as the image processing and the authentication algorithm.

In the case where the spectra match each other (S114: YES), the authentication unit 46 determines that the authentication is successful (S112) and outputs the authentication result from the result output unit 48. In this case, the result output unit 48 outputs information indicating that the authentication is successful, and permits access to another configuration of the electronic device 1, for example.

Note that, in the above description, the output is performed in the case where the result output unit 48 has succeeded, but the present invention is not limited thereto. Even in the case of S108: NO or S114: NO, notification of failure of the authentication may be provided to the light emitting unit, the imaging element 10, and the like via the result output unit 48, and data may be acquired again. Note that, in the case where the light emission area is narrowed down on the basis of the image information of the first authentication, it is desirable to perform continuous operation without outputting an error message so as not to allow the user to get the finger off.

For example, in a case where the authentication has failed a predetermined number of times (S108: NO and S114: NO), the authentication unit 46 may output that the authentication has failed, that is, that the user is an unregistered individual. In this case, the electronic device 1 may reject subsequent input from the same user because the authentication has not been successfully performed.

As described above, according to the present embodiment, the subsequent processing for the signal output from the imaging device 3 by the signal processing device has been described with some examples. By the processing, rejection of authentication based on the spectrum information, in addition to the fingerprint authentication, for example, authentication by impersonation, and the like can be implemented. Furthermore, the accuracy of the fingerprint authentication can also be improved by various types of signal processing and image processing. Moreover, some examples will be given in the embodiments to be described.

Ninety-Fourth Embodiment

Here, an imaging device 3 included in an electronic device according to the present embodiment will be described.

FIG. 250 is a diagram illustrating a position example of arrangement of subpixels 106 in a pixel 102. In the following description, the subpixels 106 may be referred to as subpixels 106*a*, 106*b*, . . . , and 106*i* depending on the positions in the pixel 102. Note that the present embodiment also describes a case where 3×3 subpixels 106 are provided in the pixel 102, but the number of subpixels 106 is not limited thereto.

As described above, an imaging element 10 includes the pixels 102 in a pixel array 100 in an array manner, and the pixel 102 includes the plurality of subpixels 106. Reflected light, diffracted light, scattered light, transmitted light, and the like from an object are incident on the imaging element 10, and the imaging element acquires object information such as a finger by reading a state of the incident light using the pixel array 100.

FIG. 251 is a graph illustrating angular dependence of light reception sensitivity of a photoelectric conversion element according to the position of the subpixel 106. The vertical axis represents a ratio of the light reception sensitivity where sensitivity of the subpixel 106*e* located at a center is 100%. The horizontal axis represents an incident angle of a light beam with respect to an optical axis. The solid line represents a sensitivity characteristic of the subpixel 106*e*, the broken line represents a sensitivity characteristic of the subpixel 106*d*, and the dotted line represents a sensitivity characteristic of the subpixel 106*f*.

As illustrated in FIG. 250, parallax information can be acquired by the plurality of subpixels 106 included in the pixel 102. By synthesizing subpixel images having different parallaxes, an angle of view can be expanded, and resolution or an SN ratio can be improved.

Furthermore, spectrum information can be acquired by various filters provided in the pixel 102.

Moreover, a parallax may be operated by applying pupil correction based on a distance and an azimuth from a chip center of each pixel 102 and a height of each optical member included in the pixel 102.

The embodiments of all the imaging elements described above can be applied to the imaging element 10, and the present embodiment does not limit the imaging element.

As one mode, a method of operating the resolution from the above information will be described. For example, a resolution operation unit 444 executes the operation of the resolution by the following method.

In general, in a case where an image of a point light source is blurred and formed on a sensor, a function expressing the blur is referred to as a point spread function (PSF). Many methods for restoring a sharp ideal image from an input image (hereinafter, deterioration image) deteriorated by blur have been proposed. Here, as an example, resolution processing by a deconvolution method will be described.

The PSF is often formulated for blur, camera shake, motion blur, and the like due to diffraction of an imaging optical system. In the present embodiment, the PSF includes resolution deterioration due to angular resolution of a fingerprint sensor, diffraction of a display unit immediately above the fingerprint sensor, and the like. Note that, in a case where the shape of the PSF is different (shift variant) for each subpixel image, an operation using a different coefficient (kernel) or a different algorithm may be performed for each subpixel image.

In a case where the PSF (x, y) in a certain image has the same shape (shift invariant) regardless of the position in the angle of view, a deterioration image g (x, y) and an ideal image f (x, y) can be expressed as follows using the PSF (x, y).

[Math. 6]

$$g(x, y) = PSF(x, y) * f(x, y) \tag{6}$$

Here, "*" represents a convolution integral. The shape of the PSF may be calculated by various optical simulations or may be obtained by actual measurement by imaging evaluation.

The ideal image f (x, y) can be obtained as follows when a Fourier transform is "F" and an inverse Fourier transform is "$F^{-1}$".

[Math. 7]

$$f(x, y) = \mathcal{F}^{-1}\left[\frac{\mathcal{F}[g(x, y)]}{\mathcal{F}[PSF(x, y)]}\right] \tag{7}$$

An operation expressed by the Fourier transform is a principle of resolution restoration by the deconvolution method. In a case where the number of frequencies at which the value of the Fourier transform of the PSF (x, y) becomes 0 is at most finite, processing of Equation (7) may be executed while ignoring the value of the pixel.

When the Fourier transform of the PSF is around 0, the PSF diverges. Therefore, for example, a Wiener filter of Equation (8) in which a minute constant Γ is appropriately defined may be used.

[Math. 8]

$$f(x, y) \cong \mathcal{F}^{-1}\left[\mathcal{F}[g(x, y)] \times \frac{\mathcal{F}[PSF(x, y)]}{\mathcal{F}\left[PSF(x, y)^2 \mp \Gamma\right]}\right] \tag{8}$$

High frequency restorability is slightly poor, but a calculation load can be greatly reduced. In a case where an influence of noise is known to some extent, a noise term in consideration of the noise may be substituted into Equation (8) instead of Γ.

Furthermore, as another example, to reduce a high frequency component, an artifact may be suppressed by smoothly reducing the high frequency component to avoid a sudden change. The function to be applied at this time is called a window function, and for example, a hamming window function in Equation (9) may be used.

[Math. 9]

$$Wn(\omega) = 0.5(1 + \cos(\omega)) \tag{9}$$

The window function is not limited to the hamming window in Equation (9), and various other known methods such as a Gaussian window, a hann window, a Hanning window, a Kaiser window, an exponential window, a generalized hamming window, and a Lanczos window may be used.

Note that an air scan, a structured illumination microscopy (SIM), a localization method, or the like may be used in addition to the deconvolution method described herein.

Furthermore, in the subpixel image, sharpening may be performed by processing of subtracting outputs of peripheral pixels from an output of each pixel. For example, a sharpening operator M may be defined as follows by an example of a Laplacian Gaussian filter (LoG).

[Math. 10]

$$M = \begin{pmatrix} -0.5 & -1 & -0.5 \\ -1 & 9 & -1 \\ -0.5 & -1 & -0.5 \end{pmatrix} \tag{10}$$

Arithmetic processing may be performed so as to scan the deterioration image g (x, y), using M. In this example, processing of multiplying its own output by 9, multiplying outputs adjacent in up, down, right, and left directions by 1 and subtracting the outputs, and multiplying outputs adjacent in oblique directions by 0.5 and subtracting the outputs is repeated.

In the above description, the operator is illustrated by a 3×3 matrix, but may be, for example, a 5×5 matrix or a 7×7 matrix, and there is no limitation. Moreover, the coefficient case of a minus sign is illustrated to subtract the outputs of the peripheral pixels, but the present embodiment is not limited thereto. For example, in the case of a plus code, an effect of noise removal by smoothing can be obtained. Thus, the operator's sign is not limited.

Moreover, in the 5×5 matrix, ±signs may be appropriately mixed in consideration of the PSF. For example, a coefficient of an adjacent pixel with respect to a central pixel is set to a minus sign, and a coefficient of a pixel two pixels away from the central pixel is set to a plus sign.

In the case of being shift variant depending on the manner of optical design of the electronic device 1 and the imaging element 10, inside of the angle of view may be divided into a plurality of blocks and the processing may be executed, for example. For example, the signal processing device may perform calculation with a different coefficient in each divided block or calculation based on a different algorithm. In such block division processing, an artifact in which a block boundary is discontinuous is likely to occur. Therefore, a smoothing filter may be processed only in a boundary portion, or the above-described window function may be used for each block.

As described above, according to the present embodiment, it is possible to implement the resolution operation on the basis of the PSF. For example, by storing the operator in the storage unit 42, it is possible to acquire an image with high resolution with high accuracy at high speed by the processing such as an inverse filter and a Wiener filter.

Ninety-Fifth Embodiment

Although the resolution conversion using the PSF has been described in the previous embodiment, the resolution may be operated by another embodiment to be described below. In the present embodiment, processing of operating resolution using a plurality of subpixels is performed with respect to processing of operating resolution with a single image.

FIG. 252A is a graph illustrating a subpixel image corresponding to a subpixel 106*d*. Furthermore, FIG. 252B is a graph illustrating a subpixel image corresponding to a subpixel 106*f*. These drawings illustrate output signals obtained by extracting a region capturing substantially the same object region and scanning the extracted region in a second direction. The vertical axis represents a pixel value of each subpixel image. For example, in the two images, a shift amount for matching subpixels is assumed not to be an integral multiple of the number of pixels but 5.5 pixels.

In such a case, when each subpixel image is viewed, an object image is unclear due to rough sampling. Therefore, a signal processing device may synthesize the subpixels while leaving a fractional shift of 0.5 pixels in shift processing of shifting by 5 pixels. By performing synthesis in this manner, the signal processing device can improve the resolution of the synthesized image.

FIG. 253 is a graph illustrating pixel values in a case of scanning the same region in a second direction in a synthesized image. As illustrated in FIG. 253, it can be seen that resolution of the synthesized image is improved by synthesizing images while leaving a fraction as described above.

In a case where synthesis processing is performed between subpixel images, there may be a shift due to oblique incidence characteristics or the like for each subpixel. To cope with the shift, the subpixel images may be synthesized after output levels are adjusted by gain correction for the images.

Furthermore, in a case of a shift amount not at equal intervals in the synthesis processing, for example, the shift amount may be 5.4 pixels instead of 5.5 pixels. In such a case, a signal processing device may perform processing by rounding the shift amount to approximate 5.5 pixels, for example. As another example, the signal processing device may calculate and process data at equal intervals by interpolation.

Moreover, an output image from a resolution operation unit 444 may redefine an appropriate pixel pitch. For example, the signal processing device may output the original pixels 102 having a pitch of 30 μm as an image corresponding to a pitch of 10 μm, for example.

As described above, it is also possible to improve the resolution by using a plurality of subpixel images instead of image filtering processing based on the PSF.

Ninety-Sixth Embodiment

In the previous embodiment, an example of operating the resolution as the signal processing device has been described. In the present embodiment, an example of operating an angle of view will be described.

An angle of view operation unit 446 may output an image with an expanded angle of view. For example, the angle of view operation unit 446 may output an image having an angle of view expanded in consideration of a shift amount of each subpixel image with respect to magnitude of an angle of view of a subpixel image as an input. This extension of the angle of view is required to output information at a wide viewing angle obtained by shifting and synthesizing a plurality of subpixel images having different parallaxes.

For example, it is assumed that the angle of view at which a subpixel image of a subpixel 106*e* in FIG. 251 can receive light is 6×6 mm (=36 $mm^2$) on a reading surface 12. Meanwhile, it is assumed that the shift amount of an object image in a second direction of a subpixel image due to the parallax acquired by a subpixel 106*d* is −800 μm, and the subpixel image acquired by a subpixel 106*f* is 800 μm.

In such a case, the angle of view of the reading surface 12 obtained by synthesizing the subpixel images is 7.4×7.4 mm (=55 $mm^2$), and an effect corresponding to an expansion of the angle of view of +52% in terms of an area ratio can be obtained. According to the expansion processing of the angle of view, for example, a detection area in fingerprint authentication can be expanded.

Note that, in each subpixel image, there may be no information for an extended region, and prediction accuracy may not be secured. In such a case, for example, the angle of view operation unit 446 may set an invalid flag that does not contribute to subsequent operation for one hundred pixels at right end when shifting pixels by one hundred pixels in a left direction, and execute subsequent processing.

Ninety-Seventh Embodiment

Next, a method of managing a shift amount of an image will be described with an example.

To implement a resolution operation, the shift amount between subpixel images is important. The shift amount of an image is generally defined by design of an optical path of an electronic device 1 and an imaging element 10.

For example, it is assumed that a pitch of pixels 102 is 20 μm, a subpixel 106*e* coincides with a center of a lens 104, and a subpixel 106*d* has sensitivity near 30 degrees diagonally upward right with respect to a third direction. For simplicity of description, it is assumed that a refractive index of a cover glass is 1.5 and an air layer from a bottom of the cover glass to a fingerprint sensor is 300 μm.

In this simple model, the optical path in which a fraction of the shift amount between two subpixel images is 0.5 pixels can be designed by calculation by ray tracing using a thickness of the cover glass as a parameter, for example. When the thickness of the cover glass is 500 μm, the shift amount is 17.5 pixels (350 μm), or when the thickness of the cover glass is 556 μm, the shift amount is 18.5 pixels (370 μm). This can be implemented by including thickness information of the cover glass as the parameter.

In practice, the electronic device 1 has a complicated configuration, but even in this case, it is possible to determine the shift amount between subpixel images by using the design based on ray tracing in a similar manner. Here, the design based on the thickness of the cover glass has been described as an example, but the design parameter may include a refractive index obtained by changing a material.

Note that, in an actual manufacturing process, dimensional intersection and mounting accuracy variation of each member occur, and thus the shift amount between subpixel images is deviated. To solve this, in an assembly process of the electronic device 1, a procedure of assembling the electronic device while monitoring and adjusting the shift amount of a subpixel image may be adopted.

Furthermore, the electronic device 1 may include a mechanism that adjusts a distance between a reading surface 12 and the imaging element 10. In this case, final adjustment may be performed using the mechanism after the assembly is completed.

Moreover, for example, there is a case where a commercially available protective seal is attached to a surface of a display unit in a mobile terminal. There is a high possibility that the shift amount of the subpixel image changes depending on the thickness of the protective seal. In a case where the shift amount is to be controlled by hardware, a unified standard and tolerance for the protective seal are defined. As another example, the electronic device 1 may be shipped after adjusted in advance with a protective seal, and in a case where replacement of the protective seal is required due to some circumstances, service operation involving adjustment work may be performed as necessary.

Some adjustment examples will be described below.

For example, an adjustment parameter may be provided that accepts that the designed shift amount between subpixels actually varies and calibrates the deviation of the shift amount from the design in calculation. This adjustment parameter may be adjusted at the time of shipment.

For example, the adjustment may be performed at predetermined time intervals or at arbitrary time intervals.

For example, a user may be able to request adjustment at any timing.

For example, the shift amount between subpixels may be calculated by calculation every time authentication is performed.

For example, by storing the calculated shift amount each time and constructing a shift amount database, a calculation model of an optimum shift amount may be constructed by machine learning or the like.

As described above, according to the present embodiment, the shift amount of the angle of view can be appropriately set on the basis of the situation, environment, and the like.

Ninety-Eighth Embodiment

In the present embodiment, synthesis of subpixel images will be described using a fingerprint image as an example.

FIG. 254 is a diagram illustrating examples of subpixel images acquired in respective subpixels 106. Subpixel images 500*a*, 500*b*, 500*c*, 500*d*, 500*e*, 500*f*, 500*g*, 500*h*, and 500*i* are subpixel images obtained by subpixels 106*a*, 106*b*, 106*c*, 106*d*, 106*e*, 106*f*, 106*g*, 106*h*, and 106*i*, respectively.

FIG. 255 is a cross-sectional view illustrating a relationship between a pixel 102 for obtaining these subpixel images 500 and the subpixels 106. This FIG. 255 shows a cross-section of the pixel 102 through the subpixels 106*d*, 106*e*, 106*f*. The thin solid line represents a locus of a light flux incident on the pixel 102 in parallel with an optical axis of a lens 104, and the thin broken line represents a locus of a light flux incident on the pixel 102 with an angle with respect to the optical axis of the lens 104.

These subpixel images 500 schematically illustrate respective subpixel images of a fingerprint received by an imaging element 10 in optical fingerprint authentication of a mobile terminal such as a smartphone.

The imaging element 10 includes a pixel array 100 having pixels 102 in an array. Each pixel 102 is provided with a plurality of subpixels 106. That is, the same number of first subpixels 106*a* as the number of pixels 102 is arrayed at the same pitch as the pixels 102. Similarly, the same numbers of second and subsequent subpixels 106*b*, 106*c*, 106*d*, 106*e*, 106*f*, 106*g*, 106*h*, and 106*i* as the number of pixels 102 are arrayed at the same pitch as the pixels 102.

The subpixel image 500*a* is an image in which signals of the first subpixel 106*a* are extracted and arranged in the same manner as the array of the pixels 102. Similarly, a total of nine subpixel images 500 are generated by the signals of the respective subpixels 106.

To these subpixel images 500, information by color (or spectrum information) associated with a filter included in each photoelectric conversion element is added in addition to information of signal intensity received by each photoelectric conversion element.

Moreover, the subpixel 106 has an inherent oblique incidence sensitivity that is mainly determined by its relative position to the lens 104. Therefore, each subpixel image 500 receives an object image at a different angle.

As an example, the subpixel image 500*d* in FIG. 254 will be described. The subpixel 106*d* is located at a left end in the cross section including a second direction and a third direction of the pixel 102 illustrated in FIG. 255, and receives light incident from diagonally upper right through the lens 104. FIG. 251 illustrates an example of the oblique incidence characteristic of the subpixel 106*d* as the broken line. As illustrated in this graph, in this case, the light incident at an angle of approximately −18 degrees has sensitivity of a half-value width of approximately 13 degrees.

More specifically, in a case where a finger is placed on a reading surface 12 near the center of the pixel 102, the left-end subpixel 106*d* of the pixel 102 receives light at the angle of approximately 18 degrees from the third direction. That is, the fingerprint is shifted to a left side and formed on the acquired subpixel image 500*d*. Meanwhile, the subpixel 106*e* located at the center of the pixel 102 receives light propagating substantially in parallel from the third direction, and an image of the fingerprint is formed at the center of the acquired subpixel image 500*e*.

In the present embodiment, a color filter (filter 114) is further provided in each of the subpixels 106 illustrated in FIG. 250. As an example, the subpixel 106*a* and the subpixel 106*i* are provided with a red filter 114R. The subpixel 10*b*, the subpixel 106*d*, the subpixel 106*f*, and the subpixel 106*h* are provided with a green filter 114G. The subpixel 106*c* and the subpixel 106*g* are provided with a blue filter 114B.

Each subpixel 106 acquires information of incident light having a predetermined angle as described above.

More specifically, the information by color of red and the subpixel image 500*a* of the fingerprint shifted to upper left and formed are obtained by the subpixel 106*a*. The information by color of green and the subpixel image 500*b* of the fingerprint shifted upward and formed are obtained by the subpixel 106*b*. The information by color of blue and the subpixel image 500*c* of the fingerprint shifted upper right and formed are obtained by the subpixel 106*c*. Similarly, the subpixel images 500 illustrated in FIG. 254 are respectively acquired by the subpixel 106*d*, the subpixel 106*e*, the subpixel 106*f*, the subpixel 106*g*, the subpixel 106*h*, and the subpixel 106*i*.

As a result, in an imaging device 3, a total of nine subpixel images 500 associated with the positions illustrated in FIG. 254 and the above-described information by color of the filters 114 are obtained. For example, a defect correction unit 440 may correct a defective pixel in these subpixel images 500.

Next, a subpixel shift amount calculation unit 442 calculates a shift amount for each subpixel image, using the subpixel image 500*e* at the center as a reference image. The subpixel shift amount calculation unit 442 calculates the shift amount of the image so that the fingerprint image of the subpixel image 500*e* as the reference image and the fingerprint image of each subpixel image 500 match each other. The shift amount may be a fixed value stored in a storage unit 42, or may be calculated by calculation from an image each time the image is acquired.

FIG. 256 is a diagram illustrating an example in which the shift amount of each subpixel image 500 is calculated and each subpixel image 500 is shifted. The subpixel shift amount calculation unit 442 may calculate the shift amount of the subpixel image 500 and shift the subpixel image 500 to output the diagram illustrated in FIG. 256. That is, the subpixel shift amount calculation unit 442 may execute processing as a subpixel image shift unit.

In a case where a fraction occurs when the shift amount is expressed by the number of pixels, the subpixel shift amount calculation unit 442 may perform interpolation processing for the fraction so that grids of the subpixel images 500 match each other. Moreover, the subpixel shift amount calculation unit 442 may perform addition processing for each subpixel image 500 included in the same information by color to improve an SN ratio of the signal.

Furthermore, a resolution operation unit 444 may increase the number of pixels and operate resolution by a synthesis using the fractions of the shift amounts calculated by the subpixel shift amount calculation unit 442. In this case, the resolution operation unit 444 may perform the interpolation processing such that data at non-equal intervals due to the fraction of the shift amount becomes at equal intervals. The resolution operation unit 444 may further execute deconvolution processing based on a PSF for the image as described in the above embodiment.

The angle of view operation unit 446 may output an image having an angle of view expanded in consideration of a shift amount of each subpixel image with respect to magnitude of an angle of view of a subpixel image 500 to be an input image. This expansion of the angle of view reflects that an object image can be captured at a wider viewing angle by the processing of shifting and synthesizing the plurality of subpixel images 500 having different parallaxes. By the enlargement processing of the angle of view by the angle of view operation unit 446, for example, an authentication unit 46 can expand a detection area in fingerprint authentication.

A demosaic unit 450 may interpolate, for the image generated in this manner, the color information insufficient for the signal of each pixel 102 from signals of equivalent coordinates of different subpixel images 500. Furthermore, the demosaic unit 450 may apply demosaic processing of performing interpolation from signals of peripheral pixels in the subpixel image 500. Thereafter, a demosaiced image may be converted into a full-color image by a linear matrix unit 452 and output.

The full-color image is not limited to visible light, and for example, an image signal in a near-infrared region may be output.

FIG. 257 is a diagram illustrating fingerprint information synthesized with a full-color image, for example. For the full-color image described above, a spectrum analysis unit 454 may acquire an output of a wavelength region desirable for authentication by performing calculation regarding a plurality of wavelengths. For example, in a case where the spectrum analysis unit 454 also serves as authentication based on skin color as an impersonation countermeasure, the spectrum analysis unit may perform calculation specialized for the purpose. Furthermore, the spectrum analysis unit 454 may perform calculation specialized for the purpose in order to acquire vein information as an impersonation countermeasure.

As described above, an image processing unit 44 (signal processing device) can synthesize images necessary for fingerprint authentication and impersonation countermeasures on the basis of a plurality of subpixel images 500 acquired by the imaging element 10.

Ninety-Ninth Embodiment

In the present embodiment, another example of an image processing unit 44 will be described. An electronic device 1 according to the present embodiment includes an imaging element 10 described in each of the above-described embodiments, and has an authentication function for a vein.

The vein has a different shape for each person, and can be used as biometric authentication. The vein is internal information rather than a surface of a body, so it is not possible to take a peek at a shape of details. Furthermore, the vein does not leave a trace like a fingerprint even when an object is touched. For these reasons, vein authentication is difficult to counterfeit or impersonate, and thus is excellent in terms of security.

A signal processing device according to the present embodiment has a configuration different from the signal processing device according to the fingerprint authentication of the previous embodiments in that a blood vessel has a three-dimensional structure inside the body and the shape looks different depending on an angle, it is necessary to detect a characteristic spectrum such as hemoglobin contained in the blood, and the like.

In the present embodiment, the vein authentication with a finger is exemplified, but the object is not necessarily limited to a finger, and may be, for example, another part of the body such as a palm or a wrist.

Note that a reason why the vein authentication has become widespread is that the vein is relatively shallow with respect to an artery, for example, runs at a depth of about 2 mm in the finger, whereas the artery is deep in the body and it is difficult to acquire a signal. Furthermore, a reason is that red blood cells in the vein are likely to absorb specific near infrared rays (around 760 nm). The authentication according to the present embodiment is not limited to the authentication using information regarding the vein, and information regarding the artery may be used for the authentication.

In the description of the present embodiment, description overlapping with the above-described embodiments will be simplified, and differences that occur unique to the vein authentication will be described in detail. Note that both the fingerprint and the vein may be authenticated by the same electronic device 1, and in this case, overlapping configuration elements in the electronic device 1, for example, various components, a signal processing circuit, and the like may also be used both in the fingerprint authentication and the vein authentication. Furthermore, the signal processing device may commonly acquire an authentication image and perform each authentication. Of course, dedicated configuration elements may be separately provided, or separate images may be acquired and authenticated.

FIG. 257 is a block diagram schematically illustrating a part (image processing unit 44) of the electronic device 1 according to the present embodiment. The image processing unit 44 includes a defect correction unit 440, an outer shape measurement unit 456, a clipping unit 458, a demosaic unit 450, a spectrum analysis unit 454, a stereoscopic image synthesis unit 460, and an addition processing unit 448. Note that configurations of a signal processing unit 40, an authentication unit 46, and a result output unit 48 may be similar to those in the above-described embodiments. Furthermore, a configuration denoted by the same reference numeral may execute processing similar to the above-described embodiment.

The imaging element 10 may receive light from an object in a subpixel 106 without including a lens. Furthermore, the imaging element 10 may receive incident light from an external light source or reflected light from an internal light source in the subpixel 106 via an optical system 9 that controls the incident light. For example, the subpixel 106 is included in the imaging element 10. Other configuration elements may be provided in, for example, the same chip as the imaging element 10, another chip formed in a stacked type, or another chip.

Since light reception by the imaging element 10 and signal processing from information of received light are the same as those in the above-described embodiments, description is omitted. Furthermore, since the same similarly applies to processing in the defect correction unit 440, description is omitted.

The outer shape measurement unit 456 extracts a contour of a finger in each subpixel image 500. As extraction processing, for example, any processing such as binarization, an edge detection filter, snake processing, morphology processing, or Hough transform can be used. The outer shape measurement unit 456 outputs the measured contour to the clipping unit 458.

Furthermore, the outer shape measurement unit 456 outputs finger contour information to the authentication unit 46, and collates the blood vessel shape with the contour of the finger, thereby improving the authentication accuracy.

The clipping unit 458 cuts out an image to a small size so as to include at least the finger contour inside each subpixel image 500, thereby reducing a subsequent calculation load.

The demosaic unit 450 executes demosaic processing for the subpixel image 500. The demosaic processing is processing of collecting and giving insufficient color information from signals of peripheral pixels to a signal of each pixel having only single information by color to create an image with interpolated information by color. Note that the information by color used here is distinguished on the basis of spectrum information of a filter 114 (including a plasmon filter 116) provided in each subpixel 106, and is defined in a broad sense including a near-infrared region.

The spectrum analysis unit 454 may perform analysis so as to extract, for example, a spectrum component of 650 to 1000 nm on the basis of an output by color. Light in this wavelength region is also called a "biological window". Light of 400 to 650 nm, which corresponds to visible light, has large absorption of hemoglobin and other biological constituents, and also has large absorption of water at a wavelength longer than near-infrared light, so that light cannot travel in a living body. Meanwhile, light having a wavelength of 650 to 1000 nm is easily transmitted through a living body, which the biological window derives from.

As another example, the spectrum analysis unit 454 may perform analysis so as to extract an output in a wavelength region around 760 nm, which is an absorption spectrum unique to reduced hemoglobin present in a large amount in veins.

The stereoscopic image synthesis unit 460 outputs three-dimensional shape information from a plurality of subpixel images 500 having different parallaxes.

The addition processing unit 448 may improve an SN ratio by adding outputs of a plurality of neighboring pixels in a three-dimensional shape to the output of the stereoscopic image synthesis unit 460. In this case, the addition processing unit 448 redefines a pixel pitch and the number of pixels of the output image and outputs an image.

As a specific example, a demosaic image of a three-dimensional space of 600×1500×400 pixels (=two million pixels) is divided into sections of 5×5×5 pixels, and addition processing or the like is executed in each section. As a result, the addition processing unit 448 may output an image of 200×400 pixels (=80,000 pixels) having a good SN ratio.

Even in a case where the SN ratio of the input image is sufficient, a calculation time can be shortened by reducing the number of pixels. Therefore, the addition processing unit 448 may apply the addition processing within a range that does not affect determination accuracy of the authentication unit 46.

The authentication unit 46 may execute the personal authentication on the basis of, for example, a three-dimensional shape (characteristic point) of the vein output by the addition processing unit 448 or the like and information of relative positions of the finger outer shape and the vein shape. Moreover, the personal authentication may be performed in consideration of not only the vein shape but also the spectrum information of the vein used for analysis. The personal information may be information related to the vein shape or the like, or may be data related to a wavelength range.

The result output unit 48 outputs a personal authentication result on the basis of a result output from the authentication unit 46. For example, the result output unit 48 may output a signal of authentication OK in a case where the finger in contact with a reading surface 12 at the timing matches the recorded personal data, or may output a signal of authentication NG in the other cases.

Next, a case where the vein authentication is performed for the electronic device 1 according to the present embodiment will be described. Note that the authentication method described in the present embodiment does not limit a combination with another authentication method using the imaging element 10, and may be, for example, a combination of the fingerprint shape and the vein authentication. Furthermore, these authentications, and the vein authentication and skin color authentication may be combined, or only the vein authentication may be executed.

Moreover, another authentication method, for example, face authentication in which collation is performed based on the position of a characteristic point such as an eye, a nose, or a mouth of a face or the position or size of a face region, authentication by a passcode input, or the like may be combined with the present embodiment, and these authentication methods are not limited. Furthermore, the authentication method or the combination may be selectively used according to the use of the electronic device 1. For example, the electronic device 1 may shorten a processing time by the fingerprint authentication to unlock a lock screen, and perform the vein authentication in authentication that requires high authentication accuracy such as financial transaction.

FIG. 259 is a flowchart illustrating a flow of processing of the electronic device 1 (signal processing device) according to the present embodiment. Sensor activation (S100), external light condition acquisition (S102), and light emission (S104) are omitted because they are described in the above embodiments.

Next, light emitted by a light emitting unit and including information of the vein or the like of the finger is scattered, and the imaging element 10 receives incident light (S206). The light reception is executed by the above-described imaging element 10 (imaging device 3).

Next, the signal processing device executes processing of acquiring data such as an image necessary for authentication (S208). For example, following the light reception, processing related to acquisition of a vein shape or acquisition of spectrum information of reflected light, diffused light, or transmitted light is executed via A/D conversion and background correction.

Next, the authentication unit 46 determines whether or not the vein shapes match each other (S210). The determination of the vein shapes may be performed by a general method. For example, the authentication unit 46 may extract a predetermined number of characteristic points from the vein, and determines whether or not the vein can be determined as of a stored individual by comparing the extracted characteristic points. Alternatively, the determination may be made on the basis of relative positional information of the vein with respect to the outer shape of the finger.

In a case where the vein shapes do not match each other (S210: NO), the processing from S102 is repeated. At the second and subsequent times, for example, a user may be requested to perform the authentication again by a voice or a display so as to move the finger in a direction of enhancing the authentication accuracy with respect to the first authentication result. After this request, the electronic device 1 may perform the authentication process again.

As another example, the electronic device 1 may perform the second and subsequent authentications while changing a light source condition. As still another example, the electronic device 1 may perform the second and subsequent authentications while changing content of the signal processing such as image processing and authentication algorithm.

In a case where the vein shapes match each other (S210: YES), the authentication unit 46 subsequently determines whether or not the spectra match each other (S212). The authentication unit 46 compares a result of the spectrum analyzed by the spectrum analysis unit 454 with a result of a stored individual, and executes this determination.

For example, the authentication unit 46 may determine whether or not the acquired spectrum is present within a predetermined range from the stored vein spectrum. In this manner, the personal authentication may be performed not only with the vein shape but also with the spectrum. Moreover, identification accuracy may be improved by adding not only the information of the sensitivity spectrum of the imaging element 10 but also spectrum information of a light source.

In a case where the spectra do not match each other (S212: NO), the processing from S102 is repeated.

Furthermore, the second and subsequent authentications may be performed while changing the light source condition. The electronic device 1 may perform the second and subsequent authentications while changing content of the signal processing such as image processing and authentication algorithm, similarly to the case of S210: NO.

In the case where the spectra match each other (S212: YES), the authentication unit 46 determines that the authentication is successful (S112) and outputs the authentication result from the result output unit 48. In this case, the result output unit 48 outputs information indicating that the authentication is successful, and permits access to another configuration of the electronic device 1, for example.

Note that, in the above description, the output is performed in the case where the result output unit 48 has succeeded, but the present invention is not limited thereto. Even in the case of S210: NO or S212: NO, notification of failure of the authentication may be provided to the light emitting unit, the imaging element 10, and the like via the result output unit 48, and data may be acquired again.

The above processing is repeated in a case where the authentication has failed, but for example, in a case where the repetition continues a predetermined number of times, access to the electronic device 1 may be blocked without performing the authentication any more. In this case, a user may be requested to input a passcode by another access means, for example, a numeric keypad, from the interface.

Furthermore, in such a case, there is a possibility of failure in reading of the device, and thus the authentication processing may be repeated while changing the light emission, the light reception, the state of the reading surface, the spectrum being used, and the like. For example, in a case where an analysis result that the device is wet with water is obtained, some output may be performed via the interface to the user to wipe the water and perform the authentication operation again.

Although the configurations of the electronic device 1 illustrated in FIGS. 10 to 17 have been described assuming the fingerprint authentication, a similar configuration can be applied to the electronic device 1 that executes the vein authentication according to the present embodiment.

Here, a light source provided in the electronic device according to the present embodiment will be described. Various modifications of installation of the light source in the electronic device 1 are as illustrated in FIGS. 10 to 17. The spectrum of the light source in the vein authentication of the electronic device 1 illustrated in these drawings will be described.

In a case where a light source is provided in addition to the display light source of the electronic device 1, the light of a wavelength of 650 to 1000 nm, which is also referred to as the "biological window" described above, is easily transmitted through a living body. Therefore, it is desirable to use a light source having spectral intensity in this region for light emission of the electronic device 1. The electronic device 1 may use, for example, an LED light source, a semiconductor laser, or the like around 850 nm or around 940 nm as the light source, or may use a VCSEL as the light source. Furthermore, the material may be a phosphor phosphorescent material such as ZnS containing rare earth ions $Yb3+$, $Tm3+$, $ND3+$, or the like at a light emission center, or may be a quantum dot such as GaAs or InGaAs, and is not limited.

As another example, a display of the electronic device 1 may be used as the light source for the vein authentication. The vein can be visually recognized as a thin blue streak when a finger is observed under a room light, the sun, or the like, but is brown when actually measured using a colorimeter. The reason why the vein looks blue is that mainly the light in the red region is more absorbed by hemoglobin in the vein, and the vein looks relatively blue with respect to the skin color due to optical illusion called color contrast.

That is, even in a visible light region where the absorption by the living body is large, visibility of the vein can be improved by performing irradiation in a red wavelength region closest to infrared light or a green wavelength region relatively close to the infrared light.

FIG. 260 is a schematic diagram of subpixel images 500 for a vein acquired with monochromatic light.

Although it is desirable to acquire a vein image using near-infrared light, it is possible to generate a vein image having a contrast close to near-infrared light by acquiring an image in a wavelength region of red, green, or the like without using near-infrared light and performing weighting and synthesis. From this result, the vein image may be acquired by visible light irradiation by organic EL. Then, the acquired image may be used for authentication, and in that case, it is desirable to emit red and green or red light.

The signal of the subpixel image 500 obtained by irradiation using the above-described various light sources also includes, for example, a signal of unevenness of a fingerprint of a surface of a finger. In a case where the authentication accuracy is not affected in stereoscopic synthesis between the subpixel images 500 to be described below, the electronic device 1 may execute authentication while including these pieces of extra information.

When the signal from the fingerprint adversely affects as a noise component, the electronic device 1 may extract a fingerprint component with light in a blue wavelength region, for example, continuously with image acquisition for the vein authentication. Then, the signal processing device may remove the fingerprint component from the vein image by signal processing. Furthermore, when both the fingerprint authentication and the vein authentication are executed, for example, the signal processing device may remove the fingerprint component from the image for the vein authentication using the image for the fingerprint authentication.

Note that these light sources do not need to be formed by one type of element, and may include a plurality of light sources each having a unique emission spectrum. The electronic device 1 may include, inside or outside the electronic device, for example, both the organic EL that emits visible light and the LED light source that emits near infrared rays.

Next, the imaging device 3 included in the electronic device 1 according to the present embodiment will be described.

As illustrated in some of the above-described embodiments, the imaging element 10 includes the pixels 102 in an array in the pixel array 100, and the pixel 102 includes a plurality of subpixels 106. Reflected light, diffracted light, scattered light, transmitted light, and the like from an object are incident on the imaging element 10, and the imaging element acquires object information by reading a state of the incident light using the pixel array 100.

Furthermore, as illustrated in FIGS. 250 and 251, parallax information can be acquired by the plurality of subpixels 106 included in the pixel 102. Information of a three-dimensional shape of the object can be acquired by synthesizing parallax angle information of the subpixels.

Furthermore, spectrum information can be acquired by various filters, or a plasmon filter and the like provided in the pixel 102.

Moreover, a parallax can be operated by applying pupil correction according to a distance and an azimuth from a chip center of each pixel 102 and a height of each optical member included in the pixel 102. The above-described embodiments of all the imaging elements 10 can be applied to the imaging element 10, and the present embodiment does not limit the imaging element.

Next, reconfiguration of stereoscopic image information using these subpixel images 500 will be described.

In general, it is known that, when there is a plurality of images having different parallaxes, stereoscopic information can be acquired from the images, similarly to stereoscopic recognition by the right eye and the left eye of a human. By using this method related to parallax, it is possible to acquire the three-dimensional shape of the vein from a plurality of subpixel images in the present embodiment.

FIG. 261 is a diagram illustrating a relationship between the object and the pixel array 100 in the present embodiment. A method for synthesizing a three-dimensional image of the object from the plurality of subpixel images 500 will be described using a simplified model of FIG. 261. Note that the structure of the pixel 102 included in the pixel array 100 may be, for example, similar to that in FIG. 255, but not limited thereto, the one described in each of the above-described embodiments.

FIG. 261 illustrates a state in which an object 52 is imaged by the pixel 102 included in the pixel array 100. In the pixel 102 of interest, the reflected light of the object 52 is incident substantially at a right angle. In this case, a subpixel **106*e* obtains a subpixel image 520*e*. Similarly, a subpixel 106*d* obtains a subpixel image 520*d*, and a subpixel 106*f* obtains a subpixel image 520*f***.

Note that the same object as the object 52 is illustrated as an image, but this is emphasized for ease of understanding in the drawing. In practice, light reflected from a part of the object 52 is acquired by each of the subpixels **106*d*, 106*e*, and 106*f*, and the subpixel images 520*d*, 520*e*, and 520*f*** are acquired as intensity of one pixel.

Here, it is assumed that the object 52 exists on a plane away from the imaging element 10 by a distance D, and the atmosphere (refractive index of 1) is between the object 52 and the imaging element 10. The pixel 102 of the imaging element 10 includes, for example, the subpixels **106*d*, 106*e*, and 106*f*. The parallaxes of these subpixels 106*d*, 106*e*, and 106*f* are provided as, for example, +30 degrees for the subpixel image 520*d*, 0 degrees for the subpixel image 520*e*, and −30 degrees for the subpixel image 520*f*** in a certain direction from a vertical axis.

It is assumed that an image of a certain portion of the object 52 is formed at an address Ad in the subpixel image **500*d*, an image of the certain portion is formed at an address Ae in the subpixel image 500*e*, and an image of the certain portion is formed at an address Af in the subpixel image 500*f*. That is, for example, the subpixel image 520*d* is a luminance value at the position of the address Ad of the subpixel image 500*d*. Similarly, for example, the subpixel image 520*e* is a luminance value at the position of the address Ae of the subpixel image 500*e*, and the subpixel image 520*f* is a luminance value at the position of Af of the subpixel image 500*f***.

When these situations are considered as geometric optics, the object exists directly above the pixel 102 at the address Ae in the subpixel image **500*e*. From such information, the signal processing device cannot determine the distance of the object. Similarly, in the subpixel image 500*d*, the object exists in an azimuth looking up in the +30 degree direction from the pixel 102** corresponding to the address Ad, but the distance of the object is not determined only by the information.

A distance between the address Ad and the address Ae is assumed to be $R_{12}$. If the information of these two optical paths is known, it can be uniquely determined that the object is present at a place separated by the distance $D=R_{12}\times\tan(\pi/6)$ directly above the pixel 102 corresponding to the address Ae. This deriving method can obtain a similar result even when combined with information of another subpixel images 500*f*.

Next, this analysis method is generalized, and an analysis method of specifying an existing region of an object from a plurality of subpixel images in a case where the object exists at an unknown position and at an unknown distance will be described.

First, the signal processing device extracts a contour of the object in each subpixel image 500 by differential processing or the like, and binarizes the contour with an inside as 1 and an outside as 0.

Next, the signal processing device sets a virtual plane at the distance D on the imaging element 10, shifts the subpixel image 520*d* at a viewing angle θ1 by D/tan θ1, shifts the subpixel image 520*e* at a viewing angle θ2 by D/tan θ2, and applies shift processing ton all the subpixel images.

Moreover, when multiplication processing is performed between these images, in a case where the object truly exists, the outputs at the positions where the object exists in the shifted image are all 1, and as a result of the multiplication, the output of 1 remains. On the other hand, in a case where the object does not exist, the value of any of the shifted images is basically 0, and the output is also 0.

In this way, it is possible to specify a region where the object can exist in the virtual plane. By performing this operation while changing the distance D of the virtual plane, it is possible to extract the three-dimensional region where the object can exist like a tomographic photograph. In the following description, such a stereoscopic analysis will be referred to as rendering.

Note that this rendering has some points to pay attention to.

First, a region that becomes a shadow when viewed from any subpixel image has a result as if an object is present due to an influence of the object that obstructs the region in front, regardless of whether or not an object is present.

Second, in a case where contrast of an absorption rate of the object is weak, it is difficult to clearly binarize that the object exists/does not exist, and there is a risk of erroneous determination.

Third, in a case where there is no air between the object and the device, the optical path changes depending on a refractive index of a substance therebetween, so that it is necessary to shift the image in consideration of Snell's law.

For the first and second points, it is desirable to model and apply constraint conditions on the basis of a physical premise, a specification premise, or the like of the object. For example, for the vein, it is desirable to set, as the constraint conditions, that a typical blood vessel has a thickness of about 0.7 mm, that the blood vessel tends to easily run in a longitudinal direction of the finger, that the blood vessel cannot exist in an isolated state (blood does not flow), that an extreme acute angle figure does not exist in the blood vessel when viewed in a cross section, that density and a cycle of signals of the vein and the fingerprint are different, and the like.

For the third point, it is only required to be reflected as a parameter in an image shift analysis algorithm in advance on the basis of physical property values such as a refractive index and an extinction coefficient of each member or the object. If the physical property values are unknown, the physical property values may be actually measured by means such as a spectroscopic ellipsometer. Furthermore, there is also a case where an intermediate substance is a repeating pattern or a random pattern. Even in such a case, it is only required to treat the case as average field approximation, and set a parameter so as to match actual measurement, or perform an analysis using a model incorporating a diffraction phenomenon or the like.

Next, a specific example of the vein authentication will be described. Here, processing and ingenuity required for three-dimensional vein authentication will be mainly described.

First, the signal processing device outputs the subpixel image 500 for each subpixel 106. Subsequently, the signal processing device performs preprocessing such as background correction and defect correction. Then, the signal processing device extracts the outer shape of the finger by differential processing or the like.

Note that, in a case where the finger image is not reflected, such as the subpixel image 500 at a pixel end, the signal processing device may exclude the subpixel image from an analysis target at that stage. To narrow volume of the calculation processing, the signal processing device may clip the image in a size that always includes the outer shape of the finger in any subpixel image 500.

Next, the signal processing device performs demosaic for each subpixel image 500 of the clipped region.

Then, the signal processing device may extract a signal in the wavelength region related to the vein by spectral analysis. For example, it is assumed that, in the imaging element 10, pixels including filters of red, blue, and green and pixels without a color filter are periodically arrayed. In a case where there is no infrared absorption filter between the imaging element 10 and the object and between the object and the light source, for example, the pixel without a filter can receive both near-infrared light and visible light. The signal processing device may perform an operation of predicting a visible light component of the pixel without a filter from outputs of green, red, and blue, for example, a matrix operation such as a linear matrix, in consideration of the light source spectrum and the spectrum of each filter, and subtract a result from the output of the pixel without a filter.

The signal processing device performs, for the subpixel image thus obtained, two-dimensional contour extraction of a blood vessel image by differential processing or the like. For example, the signal processing device may perform binarization processing of setting the output of the region where the blood vessel will exist to 1 and the output of the region where the blood vessel will not exist to 0 while observing an output difference between the inner region and the outer region.

Here, for example, the signal processing device desirably forcibly sets a blood vessel region having a minute area that cannot be a blood vessel to 0, or removes a noise signal due to the fingerprint by collation with the fingerprint image.

Note that the signal processing device may set an intermediate value between 1 and 0 in consideration of a probability that the signal is a blood vessel instead of simple binarization for a pixel that is difficult to determine in these processing.

FIG. 262 illustrates examples of processing results for the vein images acquired in the three subpixels 106. The subpixel image 500*d* is obtained by applying the above processing to the image acquired by the subpixel 106*d*. Similarly, the subpixel images 500*e* and 500*f* are obtained by applying the above processing to the images acquired by the subpixels 106*e* and 106*f*, respectively.

Next, the signal processing device assumes a virtual plane away from the surface of the imaging element 10 by the distance D, and calculates the shift amount for each subpixel image 500 from the unique parallax and the refractive index of a medium therebetween.

Next, the signal processing device executes calculation of shifting a pixel value of each subpixel image 500 by the shift amount.

Next, the signal processing device performs multiplication processing between the same addresses, and determines whether or not the vein exists in the virtual plane. Note that, in the case where an intermediate value other than 0 and 1 is set, it is desirable to redetermine the multiplication result using an appropriate threshold value.

The signal processing device performs such arithmetic processing while changing the distance D of the virtual plane, and perform scanning in a range where the vein can exist. The signal processing device can thus specify the three-dimensional region in which the blood vessel will be present.

FIG. 263 illustrates a process of shifting the image while shifting the virtual plane for the subpixel image 500 of FIG. 262. Z illustrated above the drawing indicates the distance to the virtual plane. The subpixel image 500*d* acquired by the subpixel 106*d*, the subpixel image 500*e* acquired by the subpixel 106*e*, and the subpixel image 500*f* acquired by the subpixel 106*f* are illustrated from the top. The bottom row illustrates a synthesis image 540 obtained by synthesizing these subpixel images 500.

For example, in the synthesis image 540, a three-dimensional structure of the vein can be acquired by the three synthesis images having different heights surrounded by the black frame. Specifically, it can be seen that the structure extends upward from the depth of about 1.4 mm from the surface of the finger to a vicinity of the depth of 2.1 mm in a right oblique direction of the paper on a lower side of an imaging region, then extends relatively straight while maintaining the height, and extends upward to the vicinity of the depth of 2.8 mm in the right oblique direction of the paper on an upper side of the imaging region.

Note that, in addition to the above-described image analysis, the signal processing device may execute processing for improving identification accuracy on the basis of a rule (rule base) based on a physical model or an empirical rule derived by machine learning or the like for an image determined to be a blood vessel that has been detected. For example, the signal processing device can improve the identification accuracy by using, as a determination material, whether or not the blood vessel has an appropriate thickness as a blood vessel, whether or not the blood vessel is not isolated, and the like.

In addition, the signal processing device may collate, for example, characteristic points such as relative positions of characteristic points such as branch points of the vein, relative positions between these characteristic points and the outer shape of the finger, and three-dimensional angles of the blood vessel with personal information stored in the storage unit 42. In this case, positioning of measurement data and registration data may be performed by three-dimensional rotation processing on the basis of the outer shape of the finger or the vein shape in consideration of the indefinite placement of the finger.

FIG. 264 shows a cross-section of the synthesis image of the synthesized three-dimensional vein. As illustrated in FIG. 264, the shape of the blood vessel in each acquired subpixel image 500 is slightly different from the original shape of the blood vessel.

This shape deviation results from two causes. The upper and lower acute angle portions are caused by a narrow sampling range of the visual field. The other obtuse angle portions are due to the small number of samplings. The increase in the cross-sectional area of the synthesis image is caused by the oblique incidence characteristics of the subpixel having a sensitivity characteristic with a finite width instead of a delta function.

To suppress erroneous determination due to these influences, the signal processing device may make a model function for a cross-sectional shape (a hexagon in FIG. 264) assumed from the parallax information of the subpixel 106, for example. The signal processing device may perform fitting such that the model function is inscribed when a certain cross section is obtained. The signal processing device may consider that a centroid of the blood vessel is at a centroid position of the model function, and may estimate the thickness of the blood vessel by reflecting the cross-sectional area of the model function.

Note that, since there is a possibility that the blood vessel is present adjacent to a vicinity, in a case where fitting accuracy is poor, the signal processing device may perform optimization with a model function assuming a plurality of blood vessels. Furthermore, the signal processing device may define and determine the individual information with a characteristic regarding how the blood vessel is stereoscopically routed in the finger, and the like, without using the cross-sectional shape of the blood vessel alone as the determination material.

Moreover, as an impersonation prevention measure, the signal processing device may add a spectral characteristic unique to the vein, for example, easy transmittance of light of the wavelength of 650 to 1000 nm to biometric authentication. Furthermore, for example, the signal processing device may measure that the reduced hemoglobin abundantly present in the vein is likely to absorb the wavelength region around 760 nm and add a measurement result to the biometric authentication. Furthermore, the signal processing device may measure the vein several times at different times to capture pulsation of the blood vessel, and add a measurement result to the biometric authentication.

As described above, according to the present embodiment, it is possible to implement highly accurate vein authentication by synthesizing the three-dimensional vein image from the outputs of the pixels having the plurality of subpixels using a light source and signal processing in consideration of the absorption spectrum of the vein. Moreover, the authentication accuracy of being the living body may be enhanced by using information of the spectrum and pulsation.

Note that, in the present embodiment, the example of the vein authentication by the three-dimensional shape has been described, but the vein authentication may be handled as a two-dimensional image. Even in the case of using a two-dimensional image, the electronic device 1 can perform approximate authentication. That is, the dimension of analysis in the authentication of the electronic device 1 is not limited thereto.

Furthermore, although an example of the three-dimensional shape estimation method has been described, the present embodiment is not limited thereto, and for example, the output information may be handled without binarization. For example, the electronic device 1 may first two-dimensionally extract characteristic points of each subpixel image 500, specify a stereoscopic positional relationship of the plurality of characteristic points while considering the parallaxes, and then authenticate an individual.

Hundredth Embodiment

An electronic device 1 according to the present embodiment includes an imaging element 10 described in the above embodiments, and has a function of a pulse oximeter.

An oximeter is a device that measures a saturated oxygen concentration in blood. The oximeter provides an important indicator of respiratory physical condition management for a user having a respiratory disease such as asthma, for example, like a thermometer at the time of fever.

A measurement principle of the oximeter uses a fact that spectra of extinction coefficients of oxygenated hemoglobin abundantly contained in an artery and reduced hemoglobin abundantly contained in a vein are different. For example, the electronic device 1 may calculate the oxygen saturation concentration by measuring a signal ratio around 660 nm where the difference in spectra is remarkable and around 850 nm or 940 nm in a near-infrared region where the difference in spectra is little.

The imaging element 10 can increase spectrum sensitivity around 660 nm and around 940 nm by appropriately combining a filter 114 or a plasmon filter 116. Information with a narrower wavelength band may be acquired by signal processing for outputs having a plurality of sensitivity spectra.

In these analyses, the electronic device 1 is assumed to grasp spectrum information on a light source side. In the case of a light source that is controlled from the electronic device 1 and emits light, the electronic device 1 can grasp the spectrum information of the light source by recording spectrum information measured in advance in a storage unit 42.

In a case of using an external light source with an unknown spectrum, the electronic device 1 may analyze this spectrum during authentication. For example, the electronic device 1 specifies a region where a finger exists from intensity distribution of transmitted light. Then, the electronic device 1 may analyze the spectrum of the external light source by the same method as the measurement and signal processing of the signal and the acquisition in a pixel 102 in another region where the finger is not placed.

The pulse oximeter measures a pulse in addition to the saturated oxygen concentration. Since the blood flow is strong and weak in the artery, the electronic device 1 can simultaneously measure the pulse by measuring this cycle. Furthermore, since this pulsation indicates a living body, the electronic device 1 may use the pulsation for determination for impersonation prevention.

One Hundred and First Embodiment

An electronic device 1 according to the present embodiment includes an imaging element 10 described in the above embodiments, and implements processing generally called light field, such as refocusing after imaging using a synthesis image by a subpixel 106, acquisition of three-dimensional stereoscopic information, viewpoint movement, distance information of each object, depth information, and the like.

First, a concept of refocusing will be described according to a point of view of image plane phase difference. In a state where a certain object is focused, light from the object reaches one point of a sensor surface through any optical path. Meanwhile, in an out-of-focus state, an arrival position on the sensor surface of the light from the object changes depending on the path.

In other words, the out-of-focus becomes a state where images having different shift amounts (different phase differences of images in the image plane phase differences) overlap and blur many times when focusing on a certain pixel 102. In refocusing, when focusing on an output of a certain pixel 102, virtual focus adjustment is implemented by calculation by decomposing and grasping from which angle and how much a breakdown of the output has reached.

A method of implementing refocusing using parallax information will be specifically described with an example.

For understanding, FIG. 265 is a schematic view illustrating a state of light reception of the pixels 102 of the simplified electronic device 1 without an optical lens. The pixel 102 includes a plurality of subpixels.

For convenience, the pixels 102 in this cross-sectional view are defined as pixels 102A, 102B, 102C, 102D, 102E, and 102F from the left, and the subpixels 106 included in the pixel 102 are defined as subpixels 106A, 106B, 106C, 106D, and 106E in each pixel 102.

Subpixel images 500 acquired by the respective subpixels 106A, 106B, 106C, 106D, and 106E are subpixel images 500A, 500B, 500C, 500D, and 500E.

The subpixel 106A receives light from diagonally upper right via a lens 104, and a parallax angle of the subpixel 106A is defined as θA. Similarly, parallax angles of the subpixels 106B, 106C, 106D, and 106E are defined as θB, θC, θD, and θE, respectively.

For example, a method in which the signal processing device focuses on a refocusing surface 560A at a distance R1 from a sensor surface and generates an image focused on the refocusing surface 560A will be described.

The subpixel image 500A is designed to receive light from the angle A. It is considered that light from the refocusing surface 560A distant by the distance R1 forms an image at one point. It can be understood that the subpixel image 500A is shifted by R1/tan (θA) by tracing back a light beam.

Similarly, the subpixel images 500B, 500C, 500D, and 500E are shifted by R1/tan (θB), R1/tan (θC), R1/tan (θD), and R1/tan (θE), respectively.

The signal processing device can generate an image focused on the refocusing surface 560A by shifting and summing the plurality of subpixel images 500 in this manner. Similarly, the signal processing device can generate a synthesis image focused on a refocusing surface 560B at a distance R2 or a refocusing surface 560C at a distance R3 from the sensor surface.

Next, a method of acquiring three-dimensional stereoscopic information from an image acquired by the electronic device 1 according to the present embodiment will be described.

FIG. 266 is a schematic view illustrating a state of light reception of the pixels 102 of the simplified electronic device 1 without an optical lens. A method of acquiring three-dimensional stereoscopic information will be described with reference to FIG. 266. The definition of names of the pixel 102, the subpixel 106, and the like is the same as that in FIG. 265. For example, the electronic device 1 acquires information of an object 52 in the subpixel 106.

In general, the light from the object to be captured often includes a characteristic pattern that can uniquely identify the object as viewed from any angle, such as a pattern on a surface, a shadow due to unevenness, or nonuniformity in intensity or color of illumination light. Here, it is assumed that the object has a characteristic pattern.

How diffused light from a certain portion in a certain stereoscopic object is received by the imaging element 10 of the present embodiment will be considered. For example, the diffused light when an object surface exists in S1 of FIG.

266 is received by the subpixel 106A of the pixel 102D, the subpixel 106C of the pixel 102E, and the subpixel 106E of the pixel 102F.

In this manner, which subpixel 106 of which pixel 102 receives the diffused light from a certain portion in a certain stereoscopic object can be geometrically and uniquely obtained.

Three-dimensional stereoscopic information can be acquired from the plurality of subpixel images 500 on the basis of the above-described two premises. It is assumed that the image acquired in the subpixel image 500A captures the characteristic pattern of the surface of the object 52. Although there is a difference in parallax in another subpixel images 500, the characteristic thereof should be captured. Therefore, the signal processing device can calculate the shift amount in which the characteristic patterns of the subpixels 106 match each other by executing image shift.

For example, the signal processing device shifts the subpixel image 500A to the right by one pixel with respect to the subpixel image 500C, and shifts the subpixel image 500E to the left by one pixel with respect to the subpixel image 500C, to match the characteristic pattern in S1 of the object 52. Since the shift amount is uniquely determined according to the distance between the sensor surface and the object, it is possible to grasp the three-dimensional shape of the object by the difference in the shift amount for each characteristic pattern.

Note that there is anisotropy of calculation accuracy in the shift amount calculation using the characteristic pattern. For example, in the case of the object with vertical stripes, the calculation accuracy of the subpixel images arranged in a horizontal direction is high, it is difficult to obtain contrast in the subpixel images 500 arranged in the horizontal direction, and the calculation accuracy is deteriorated.

When the image shift is exhaustively executed, it takes a processing time, but for example, the signal processing device may specify an azimuth with high object contrast. Then, the signal processing device can shorten the processing time by preferentially shifting the combination of the subpixel images 500 in the azimuth with high contrast.

Note that, although the description has been given with reference to the schematic view of the embodiment without an optical lens in FIG. 265, even in a case where the electronic device 1 images the object via an optical lens, it is possible to execute similar analysis by geometric optical ray tracing.

As described above, the electronic device 1 according to the present embodiment includes the imaging element 10 described in the above embodiments, and can implement the function generally called light field camera, such as refocusing after imaging using the synthesis image by the subpixel 106, acquisition of three-dimensional stereoscopic information, distance information of each object, depth information, and the like, by being combined with the optical lens.

Moreover, it is possible to acquire the three-dimensional information even for a moving object by acquiring an image without focal plane distortion by global shutter driving.

Furthermore, by acquiring narrowband multispectrum information or spectrum information by infrared rays, it is possible to calculate the shift amount of the characteristic pattern due to a weak color difference that cannot be identified by human eyes and a wavelength band that cannot be seen by human eyes. For example, in a case where the electronic device 1 is used for inspection of unevenness of a surface in machine vision, the measurement accuracy can be improved by using the method of the present embodiment.

Furthermore, the method according to the present embodiment can also be applied to a commercial camera that is increasingly involved in digital cinema such as a movie. In the digital cinema, CIE1931 is a standard as a color representation method, and a huge number of colors can be handled with a color depth (driving bit depth) of 12 bits. For such digital cinema, the camera (electronic device 1) that implements the method of the present embodiment may include a plasmon filter 116 after enabling refocusing after imaging and viewpoint movement. By providing the plasmon filter 116, the electronic device 1 can simultaneously implement fine color reproduction by multispectrum.

One Hundred and Second Embodiment

FIG. 267 is a view illustrating an example of an imaging device 3. The imaging device 3 includes, for example, an optical system 9 and an imaging element 10. The optical system 9 is disposed on a light incident surface side of the imaging element 10, that is, on a side close to a display unit 2. Light transmitted through a display surface of the display unit 2 is propagated to the imaging element 10 by the optical system 9.

The imaging element 10 is, for example, the imaging element 10 of each of the above-described embodiments. The light condensed, diffused, or the like by the optical system 9 and propagated is received by a pixel array included in the imaging element 10 and outputs an analog signal. Furthermore, although not illustrated, an element, a circuit, and the like necessary for receiving light and outputting the analog signal are provided. For example, photoelectric conversion may include a complementary metal-oxide-semiconductor field-effect transistor (CMOS) element or a charge coupled device (CCD) element. In addition, configuration elements having the characteristics described in the above-described embodiments may be arbitrarily provided.

The optical system 9 may include, for example, a lens. Furthermore, the optical system 9 may be a concept including an opening provided in a display panel 4 described above, or may be a concept of a simple opening without a lens.

For example, as the optical system 9, an opening provided in the display panel 4 and a lens arranged at a position closer to the imaging element 10 than the opening in a third direction are provided. For example, the opening may be provided in a substrate 4*a* having low transmittance, and a lens that propagates light transmitted through the opening to the imaging element 10 may be provided. For example, optical characteristics such as numerical aperture (Na) and F-number in each imaging device 3 are defined by the lens and the opening.

Moreover, the optical system 9 may cause the imaging device 3 to have another optical characteristic such as having a different Abbe number.

The lens included in the optical system 9 is illustrated as one lens, but is not limited thereto, and may be provided as a lens system including a plurality of various types of lenses. Furthermore, the optical system 9 may not include a lens. For example, the optical system 9 may include a plurality of stacked lenses as illustrated by the dotted lines.

The light incident from a display surface side of a display unit 2 is transmitted through, refracted, diffracted, and the like the optical system 9, and received by the imaging element 10. In the electronic device 1, at a portion where the optical system 9 is not provided, reflection and the like may be appropriately suppressed, and display on the display unit 2 may be adjusted to be easily viewable, similarly to a normal display.

For example, the electronic device 1 may include an opening between light emitting pixels of the display panel 4. The electronic device 1 may include a lens on a side opposite to the display surface of the opening in the third direction, and may propagate light incident from the display surface to the imaging element 10. Furthermore, the electronic device 1 may include an opening between each two of successive light emitting pixels. In other words, the electronic device 1 may include light emitting pixels between the openings.

The electronic device 1 includes, for example, the imaging element 10 and the configuration illustrated in any one of FIGS. 8, 247, and 248 or FIG. 258 as a subsequent signal processing circuit.

Some or all of the configuration described above may be formed on the same substrate. For example, some or all of the above-described configuration elements may be formed on one chip, or some of the configuration may be appropriately formed as another chip. Furthermore, some of the configuration formed on the same substrate of one chip may be formed by being stacked with some of a configuration formed on another substrate by technologies such as chip on chip (CoC), chip on wafer (CoW), and wafer on wafer (WoW) in a manufacturing process.

As described above, by providing the imaging element 10 described in each of the above-described embodiments below the display, the imaging device 3 can be caused to function as, for example, an inner camera also having a fingerprint sensor function. In this case, the imaging device 3 or the electronic device 1 may appropriately correct stray light from the display, reflected light from another polarizing plate or the like, and flare by the signal processing circuit.

Furthermore, the imaging device 3 or the electronic device 1 may suppress occurrence of flare or the like by arranging a light-shielding wall at an appropriate position or the like. Since the imaging device 3 or the electronic device 1 can efficiently use the subpixels 106, the angular resolution can be improved and the sensitivity can also be improved.

The various types of signal processing may include a digital circuit or a programmable circuit such as a field programmable gate array (FPGA). Furthermore, processing content may be described in a program, and information processing by software may be specifically implemented using hardware resources such as a CPU.

One Hundred and Third Embodiment

FIG. 268 is a schematic view including an imaging element 10 below a display. Even if the amount of light transmitted through the display is increased by, for example, opening a part of a polyimide resin of a display unit, a shielding body 58, for example, a transistor, wiring, or the like does not transmit light, which affects an object image received by the imaging element 10. For example, a light emitting element, a TFT, other electrodes, and the like of the display unit can be the shielding body 58 that affects an object image.

In a case where the shielding body 58 of the display is not present, subpixel images 500 can be synthesized to form an object image of a focus plane according to a light field camera principle. However, in a case where the shielding body 58 of the display is present therebetween, the light is partially shielded, which causes image quality deterioration such as blurring and unevenness.

FIG. 269 is a schematic view illustrating the imaging element 10 provided below a display according to the present embodiment. As a countermeasure against the above, as illustrated in FIG. 269, the subpixel 106 affected by a light-shielding substance of the display may be excluded, and the object image may be synthesized only from outputs of the subpixels 106 that appropriately receives light from the object.

Note that the subpixels 106 affected by the light-shielding substance of the display may be sorted at a design stage and stored in the electronic device 1. Alternatively, a uniform object may be imaged, and the subpixel 106 with reduced output may be extracted and stored by actual measurement.

This method of removing a display element image can be applied to any case where an imaging element for any purpose such as fingerprint authentication, vein authentication, or a light field camera is provided under the display, and it is possible to increase a use value of the electronic device 1 and to spread a use environment of the electronic device 1.

One Hundred and Fourth Embodiment

In the previous embodiment, the subpixels 106 are controlled, but an optical system may be inserted between the shielding body 58 and the pixel 102.

FIG. 270 is a schematic view illustrating an imaging element 10 provided below a display according to the present embodiment. As illustrated in FIG. 270, light may enter the pixel 102 via an optical system 9. Even in such a case, similarly, signal processing may be executed while excluding the subpixel 106 that does not receive light due to the shielding body 58.

By receiving light in this manner, an appropriate object image can be synthesized using outputs from the subpixels 106 that appropriately receive light from the object.

Various embodiments have been described above. According to these embodiments, among various effects, for example, the following effects can be exhibited.

An electronic device 1 having a motion capture function according to another aspect of the present disclosure can capture a motion of an object such as a finger as an optical image including a depth direction as an input mode different from a touch display, and can input an operation command to the electronic device 1.

An electronic device 1 including an imaging device 3 without an optical lens according to another aspect of the present disclosure enables proximity imaging with a thin housing. Specifically, the electronic device 1 can be applied to, for example, a camera that performs super macro close-up shooting, iris authentication, reading of a minimum barcode, inspection by a machine vision device, and the like.

An electronic device 1 having an imaging function according to another aspect of the present disclosure can bring added values such as refocusing after imaging by a synthesis image by a subpixel, shift of a viewpoint position, acquisition of three-dimensional stereoscopic information, distance information of each object, depth information, and spectrum information of a narrow band in a digital camera, a video camera, or the like by being combined with an optical lens. Moreover, by mounting a memory in the light receiving element, global shutter driving becomes possible, and an image without focal plane distortion can be acquired.

One Hundred and Fifth Embodiment

In each of the above-described embodiments, examples of various forms have been described as a subpixel 106. In the present embodiment, still another form of a subpixel 106 will be described.

The subpixel 106 may include a wire grid polarizer (WGP). The wire grid polarizer is an element that transmits radiation of an electric field vector perpendicular to a wire and reflects radiation of an electric field vector parallel to the wire.

For example, a reflection-type wire grid polarizer is processed such that linear conductors and spaces are alternately arranged. In a case where oscillation directions of the linear conductor and the electric field of light are the same direction, free electrons in the conductor move by receiving a force from the electric field of the light, and follow the electric field so that the electric field becomes 0, and a reflected wave generated by this movement and the electric field of the light cancel each other and cannot be transmitted.

Meanwhile, in a case where the oscillation direction of the linear conductor and the oscillation direction of the electric field of light are orthogonal to each other, free electrons in the conductor cannot follow the electric field and the light is transmitted without generating a reflected wave. As a result, the direction in which the electric field of light is reflected and transmitted is defined by the direction in which the linear conductor is installed.

As described above, light in which the oscillation direction of the electric field is perpendicular to the plurality of linear conductors of the polarizer can be selectively transmitted. Note that, in a case where the direction of the conductor on the line is the same as the oscillation of the electric field, the electric field is reflected. However, this is not the limitation that excludes absorption of a part of the electric field, and at least a part of the electric field may be absorbed.

FIG. 272 is a view illustrating an example of a wire grid polarizer. As a filter included in a subpixel 106, a wire grid polarizer 140 as illustrated in the drawing may be used.

FIG. 273 is a view illustrating a cut section obtained by cutting the wire grid polarizer 140 at an intermediate portion with respect to a thickness direction of the element. The wire grid polarizer 140 includes, for example, a conductor as illustrated in the drawing. In this manner, the wire grid polarizer 140 may include a conductor.

FIG. 274 is a view illustrating an example of the cut section obtained by cutting the wire grid polarizer 140 at an intermediate portion with respect to the thickness direction of the element. The wire grid polarizer 140 includes a wire portion including a conductor and a frame portion including an insulator. As illustrated in the drawing, the wire grid polarizer 140 may include an insulator or a semiconductor instead of a conductor except for the wire portion.

In the following description, hatching is not provided as illustrated in FIG. 272 because the illustration becomes complicated, but a form similar to that in FIGS. 273 and 274 may be used. Furthermore, these forms may be integrally formed with a pixel 102 described in each of the above-described embodiments.

The wire grid polarizer 140 illustrated in FIG. 272 includes, for example, the wire portion and a base material. As an example, the base material and the wire portion may have a stacked structure including the same material. At least a part of the base material and the wire portion includes a conductor such as metal. The wire grid polarizer 140 is an optical element that supplies light having oscillation of an electric field that the light is selectively transmitted through to a photoelectric conversion region in an opening portion formed to be sandwiched by the wire portion. The wire grid polarizer 140 may be provided so as to overlap a photoelectric conversion region of the subpixel 106 in plan view as illustrated in FIG. 272.

FIG. 275 is an example of a cross-sectional view of the wire portion of FIG. 272 taken along a second direction.

FIG. 276 is an example of a cross-sectional view of the wire portion of FIG. 272 taken along a first direction.

As illustrated in these drawings, the wire grid polarizer 140 may include a reflection layer 142, an insulating layer 144, and an absorption layer 146 in the wire portion. This configuration may be similar in the base material forming the wire grid polarizer 140. An opening 148 is provided so as to be sandwiched by the wire portion formed by the above elements.

For example, in a case where the electric field of incident waves has a component in a line longitudinal direction in the polarizer, free electrons in the polarizer follow the electric field of the incident light along the line longitudinal direction with respect to the electric field in the longitudinal direction, and the reflection layer 142 radiates the reflected wave and reflects the incident light. Therefore, the reflection layer 142 includes a material for reflecting the incident light, for example, a conductor such as metal. The reflection layer 142 may include an inorganic material having conductivity instead of metal or the like.

The reflection layer 142 can be made by, for example, a metal film containing at least one of tungsten (W), aluminum (Al), silver (Ag), gold (Au), copper (Cu), platinum (Pt), molybdenum (Mo), chromium (Cr), titanium (Ti), nickel (Ni), iron (Fe), tellurium (Te), or the like, a compound including at least two of these metals, an oxide of these metals, a nitride of these metals, or an alloy of these metals. Furthermore, the reflection layer can be configured as a multilayer film obtained by combining these materials. Moreover, the reflection layer can also be configured by these materials and a semiconductor material such as silicon (Si) or germanium (Ge).

A base film formed in a stacked structure of Ti, TiN, or a Ti/TiN may be formed on a lower side of the reflection layer 142 as an adhesion layer.

When light is reflected on a surface of a solid-state imaging element with respect to strong light such as sunlight, the light is re-reflected by a sealing glass, an infrared absorption filter, a set housing, or the like, and the re-reflected light may be re-incident on the solid-state imaging element. This re-incidence may cause image quality deterioration such as flare and ghost. Therefore, it is desirable to suppress the re-incidence. As a countermeasure, to suppress the reflected light from the reflection layer 142 forming the wire grid polarizer 140, it is desirable to form a material that easily absorbs light on the conductive material of the reflection layer of the wire portion.

The absorption layer 146 is a layer including a material that easily absorbs light. As illustrated in the drawing, the absorption layer 146 is desirably formed on the reflection layer 142 via the insulating layer 144, similarly to the reflection layer 142. As the material configuring the absorption layer 146, a metal material, an alloy material, or a semiconductor material having an extinction coefficient k that is not 0, that is, having a light absorbing function is desirable.

Specifically, examples of the absorption layer 146 include metal materials such as silver (Ag), gold (Au), copper (Cu), molybdenum (Mo), chromium (Cr), titanium (Ti), nickel (Ni), tungsten (W), iron (Fe), silicon (Si), germanium (Ge), tellurium (Te), and tin (Sn), alloy materials containing these metals, and semiconductor materials.

The insulating layer 144 may include, for example, a material such as silicon oxide ($SiO_2$). The insulating layer is disposed between the reflection layer 142 and the absorption layer 146, and adjusts a phase of light reflected by the reflection layer.

Specifically, the insulating layer 144 adjusts the phase of the light reflected by the reflection layer 142 to a phase opposite to the phase of the light reflected by the absorption layer. Since the light whose phase has been adjusted by the insulating layer 144 and the light reflected by the absorption layer 142 have opposite phases, both are attenuated by interference. This makes it possible to reduce reflection of light by the wire grid polarizer 140. The insulating layer 144 also serves as a base of the absorption layer 146.

The opening 148 is a groove penetrating the base material in a third direction. The wire portion is arranged between the openings 148. The wire grid polarizer 140 is formed by continuously arranging the opening 148 and the wire portion.

The wire portion and the base material portion of the wire grid polarizer 140 are formed with the above-described FIGS. 275 and 276 as a basic configuration. Moreover, a protective layer may be provided for this configuration.

FIG. 277 is an example of a cross-sectional view of the wire portion of FIG. 272 taken along the second direction.

FIG. 276 is an example of a cross-sectional view of the wire portion of FIG. 272 taken along the first direction.

The wire portion of the wire grid polarizer 140 may be protected by a protective layer 150. The material configuring the protective layer is desirably, for example, a material having a refractive index of 2 or less and an extinction coefficient close to 0. Non-limiting examples of such a material include insulating materials such as $SiO_2$ containing TEOS-$SiO_2$, SiON, SiN, SiC, SiOC, and SiCN, and metal oxides such as aluminum oxide (AlOX), hafnium oxide (HfOx), zirconium oxide (ZrOx), and tantalum oxide (TaOx). Furthermore, other non-limiting examples may include perfluorodecyltrichlorosilane and octadecyltrichlorosilane.

The protective layer 150 can be formed by a process such as various CVD methods, a coating method, a sputtering method, a PVD method including a vacuum vapor deposition method, or a sol-gel method. As another example, it is more favorable to adopt a so-called atomic layer deposition (ALD method) or a high density plasma chemical vapor deposition (HDP-CVD method). By using the ALD method, a thin protective film can be conformally formed on the wire grid polarizer. Moreover, by using the HDP-CVD method, a thinner protective film can be formed on the wire portion.

As another example, at timing after the opening 148 is formed, the opening 148 may be filled with the material for forming the protective layer 150. Moreover, it is also possible to lower the refractive index of the protective layer 150 by providing a gap, a hole, a void, or the like in the material for forming the protective layer 150.

Note that, in the present embodiment, the wire portion includes the reflection layer 142, the insulating layer 144, the absorption layer 146, and the protective layer 150, but the present embodiment is not limited thereto. Among them, the wire portion of the wire grid polarizer 140 may include at least the reflection layer 142.

Furthermore, the wire grid polarizer 140 has, for example, an air gap structure as the opening 148, but may have a structure other than this structure. For example, in the wire grid polarizer 140, an insulating film that transmits light, such as a silicon oxide film, may be embedded in the opening 148.

A non-limiting specific configuration example of the wire grid polarizer 140 will be described.

The reflection layer 142 includes, for example, aluminum (Al) having a thickness of 50 to 250 nm, more desirably, 100 to 200 nm.

The insulating layer 144 includes, for example, $SiO_2$ having a thickness of 25 to 50 nm.

The absorption layer 146 includes, for example, tungsten (W) having a thickness of 10 to 50 nm, more desirably 15 to 35 nm.

Note that the adhesion layer below an absorption layer has a stacked structure of Ti, TiN, and Ti/TiN of 0 to 50 nm, more favorably 0 to 30 nm.

The base material containing the metal of the wire grid polarizer 140 may also serve as element isolation between the pixels 102 and between the subpixels 106. In this case, a black reference for outputting optical black serving as a reference of a black level may be arranged on a sparse region and used for light shielding.

The wire grid polarizer 140 of FIG. 272 thus formed is arranged on at least one subpixel 106 in at least one pixel 102, and functions as a polarizer that blocks the electric field oscillating in the first direction and transmits the electric field oscillating in the second direction.

FIG. 279 is a view illustrating another example of the wire grid polarizer 140. The wire grid polarizer 140 is shifted by 90 degrees from the wire grid polarizer 140 in FIG. 272, and functions as a polarizer that transmits the electric field oscillating in the first direction and blocks the electric field oscillating in the second direction.

FIG. 280 is a view illustrating another example of the wire grid polarizer 140. The wire grid polarizer 140 is shifted by 45 degrees from the wire grid polarizer 140 in FIG. 272, and functions as a polarizer that transmits the electric field oscillating in a direction shifted by the 45 degrees and blocks the electric field oscillating in a direction shifted by 90 degrees from the direction shifted by 45 degrees.

FIG. 281 is a view illustrating another example of the wire grid polarizer 140. The wire grid polarizer 140 is shifted by 90 degrees from the wire grid polarizer 140 in FIG. 280 (that is, 135 degrees from the wire grid polarizer 140 in FIG. 272), and functions as a polarizer that transmits the electric field oscillating in a direction shifted by the 90 degrees and blocks the electric field oscillating in a direction shifted by 90 degrees from the direction shifted by 90 degrees.

The filter disposed in the subpixel 106 can be such a wire grid polarizer 140. Next, some non-limiting examples of how these wire grid polarizers 140 are arranged in the subpixels 106 will be described.

FIG. 282 is a view schematically illustrating an example of an array of filters arranged in the subpixels 106 in the pixels 102 according to an embodiment. The wire grid polarizer 140 is arranged for the subpixel 106 at an equivalent position in the pixel 102, as illustrated in FIG. 282. The wire grid polarizer 140 may be configured to have a different polarization direction for each pixel 102. In one non-limiting example, a wire grid polarizer 140A illustrated in FIG. 282 is the wire grid polarizer 140 illustrated in FIG. 272, a wire grid polarizer 140B is the wire grid polarizer 140 illustrated in FIG. 279, a wire grid polarizer 140C is the wire grid polarizer 140 illustrated in FIG. 280, and a wire grid polarizer 140D is the wire grid polarizer 140 illustrated in FIG. 281.

The same wire grid polarizer 140 is arranged for the same hatched subpixels 106. The method of selecting the wire grid polarizer 140 is not limited to the above, and any selection method may be used as long as the wire grid polarizers 140A, 140B, 140C, and 140D have different polarization directions. Furthermore, instead of the four types, for example, only a combination of the wire grid polarizers 140 in FIGS. 272 and 279 may be used, or the wire grid polarizers 140 of various angles may be mixed.

A pixel array 100 may periodically include pixels 102 in an arrangement of the wire grid polarizers 140 having different polarization directions in adjacent pixels 102 as illustrated in the drawing. By periodically providing the wire grid polarizers 140 having periodically different polarization directions as described above, it is possible to detect polarization information from an object in a parallax azimuth of the corresponding subpixel 106 in a state of high resolution.

FIG. 283 is a view illustrating another example of the arrangement of the wire grid polarizer 140. The wire grid polarizers 140A, 140B, 140C, and 140D are, for example, wire grid polarizers 140 having different polarization directions as in FIG. 282.

As illustrated in FIG. 283, in the subpixels 106 at equivalent positions in the pixels 102, the wire grid polarizers 140 may be thinned out and periodically arranged, and mixed with the pixel 102 that performs normally output (the pixel 102 including another type of filter). With this arrangement, resolution of polarization information is degraded, but it is possible to generate an image using the pixel 102 to which another filter having the parallax has been applied.

FIG. 284 is a view illustrating another example of the arrangement of the wire grid polarizer 140. The wire grid polarizers 140A, 140B, 140C, and 140D are, for example, wire grid polarizers 140 having different polarization directions as in FIG. 282.

As illustrated in FIG. 284, the wire grid polarizers 140 may be periodically arranged for a plurality of subpixels 106 at equivalent positions in the pixel 102. With this arrangement, an angle of view of the polarization information can be widened by acquiring the polarization information of different parallaxes in the pixel 102.

It is possible to increase the resolution of overlapping regions by the widened angle of view, and it is also possible to improve an SN by the shift addition processing. Furthermore, phase unwrapping processing can be implemented.

Moreover, there is a problem of indefiniteness that it is difficult to determine whether or not the object has a convex shape or a concave shape only by the polarization analysis. However, by combining such subpixels 106, the indefiniteness problem can be solved.

Note that, in FIG. 284, the wire grid polarizers 140 having polarization directions different by 90 degrees are arranged in a checkered pattern. However, as illustrated in FIG. 282, for example, the wire grid polarizers 140 may be arranged such that polarization directions are different by 90 degrees in the pixel 102 adjacent in the second direction.

Furthermore, in FIGS. 283 and 284, the wire grid polarizer 140 is provided at the position of a midpoint of a predetermined side of the pixel 102 among the subpixels 106, but the present embodiment is not limited thereto. For example, as illustrated in FIGS. 285 and 286, the wire grid polarizer 140 may be provided at a predetermined diagonal position in the pixel 102. These can be appropriately selected according to information desired to be acquired. Furthermore, as illustrated in FIG. 287, a polarizer may be provided in the subpixel 106 located at the center. Furthermore, in the form as illustrated in FIG. 284, the pixels 102 can be thinned out as illustrated in FIG. 283.

According to the present embodiment, it is possible to acquire information of light polarized in a predetermined direction for each pixel 102.

Note that the form in which the subpixels 106 are included in 3×3 in the pixel 102 has been described, but the present embodiment is not limited thereto. The pixel 102 may include, for example, 2×2 subpixels 106 or 4×4 or more subpixels 106. Furthermore, as another non-limiting example, the pixel 102 may include 2×3 subpixels 106, or at least one of the subpixels 106 may be the wire grid polarizer 140 in any form as illustrated in FIGS. 15 to 17.

Furthermore, in the above description, the form in which the wire grid polarizer 140 is provided in the subpixel 106 has been described. However, as illustrated in FIG. 287, the form in which the wire grid polarizer 140 is provided in the pixel 102 may be adopted. That is, the same polarization information may be input to the subpixels 106 belonging to the same pixel 102. In this case, another type of filter may be further provided for each subpixel 106.

In the above description, the case of using the wire grid polarizer 140 has been described using some non-limiting examples, but the present embodiment is not limited thereto.

For example, the polarization directions are not limited to 0 degrees, 45 degrees, 90 degrees, and 135 degrees, and may be other angles, may have polarization directions of three directions or less or five directions or more instead of four directions. In the case of acquiring the polarization information in three directions, normal analysis by fitting using a trigonometric function can be performed, and the accuracy of fitting can be improved by using five or more directions.

As described above, the wire grid polarizer 140 can be mixed with other filters. For example, a color filter may be provided above or below the wire grid polarizer 140.

Note that, in the same plane in which the wire grid polarizer 140 is provided for the subpixel 106 or the pixel 102 in the pixel array 100, a filter having a light-shielding property with pinholes, a plasmon filter, a GMR filter to be described below, or the like can be mixed. Moreover, the pinholes, the plasmon filter, the GMR filter, or the like may be provided to overlap above or below the wire grid polarizer 140.

One Hundred and Sixth Embodiment

As still another example of a filter, a guided mode resonance (GMR) filter can be mentioned. The GMR filter is a filter including a diffraction grating having a periodic structure and a waveguide. The GMR filter is a filter that transmits light selected by the diffraction grating and the waveguide. In the present embodiment, the GMR filter is provided above a subpixel 106, for example, to transmit and supply the selective light to a photoelectric conversion unit.

More specifically, the GMR filter is an optical filter capable of transmitting only light in a narrow wavelength band (narrow band) by combining the diffraction grating and a clad-core structure. The resonance of diffracted light in the guided mode generated in the waveguide is used, light use efficiency is high, and a sharp resonance spectrum can be acquired.

FIG. 289 is a view illustrating an example of the GMR filter in plan view. As illustrated in this drawing, a GMR filter 160 includes a base material 162 and a diffraction grating 164. The GMR filter 160 is formed, for example, by providing an opening in the base material 162 and providing the diffraction grating 164.

For example, the diffraction grating 164 may have a one-dimensional grating shape as illustrated in FIG. 289.

FIG. 290 is a view illustrating an example of the GMR filter in plan view. As illustrated in this drawing, the diffraction grating 164 may have a two-dimensional grating shape.

FIG. 291 is, for example, a view illustrating a grating portion of a G-G cross section of the GMR filter 160 in FIG. 289. The GMR filter 160 includes a diffraction grating 164, a cladding layer 166, and a core layer 168. As illustrated in the drawing, the GMR filter 160 is formed such that the diffraction grating 164, the cladding layer 166, and the core layer 168 are stacked from a light incident direction.

As described above, the diffraction grating 164 is formed by the opening provided in the base material. More specifically, openings are provided at an equal pitch Pg with respect to the base material, and the diffraction grating 164 is formed by the openings. The opening is, for example, a groove penetrating the base material in a thickness direction (third direction) of the semiconductor layer.

As the diffraction grating 164, for example, a metal thin film is used. More specifically, as a non-limiting example, the diffraction grating 164 includes aluminum (Al), an alloy containing aluminum (Al) as a main component, or copper (Cu) or an alloy containing copper (Cu) as a main component.

The thickness of the diffraction grating 164 is determined in consideration of performance of the GMR filter, an installation volume, a manufacturing process, and the like. The thickness of the diffraction grating 164 is set, for example, in a range of 20 to 200 nm.

As illustrated in the drawing, a refractive index of an upper interlayer insulating film 306*a* is set to $n_1$, a refractive index of the cladding layer 166 is set to $n_2$, a refractive index of the core layer 168 is set to $n_3$, and a refractive index of an interlayer insulating film 306*b* between the core layer 168 and the photoelectric conversion element is set to $n_4$. In this case, a grating period Pg of the diffraction grating 164 can be set within a range that satisfies the following expression where a center wavelength of a transmission wavelength band of the GMR filter is λ.

[Math. 11]

$$200\text{ nm} \leq \frac{0.5\lambda}{n_4} < Pg < \frac{\lambda}{n_4} \leq 600\text{ nm} \tag{11}$$

By setting the grating period Pg to 200 to 600 nm, the diffraction grating can support light in a wavelength band from ultraviolet light to near-infrared light.

Furthermore, the refractive index is set as follows.

[Math. 12]

$$n_3 > n_2, \quad n_4 > n_1 \tag{12}$$

Note that a magnitude relationship between $n_2$ and $n_4$ is not limited.

The cladding layer 166 includes, for example, $SiO_2$. The thickness of the cladding layer is determined in consideration of, for example, performance of the GMR filter, an installation volume, a manufacturing process, and the like. The thickness of the cladding layer 166 is set to be, for example, 150 nm or less.

The core layer 168 is a layer having a waveguide structure using SiN, tantalum dioxide, titanium oxide, or the like, or a light guide plate structure, for example. The thickness of the core layer 168 is determined in consideration of, for example, performance of the GMR filter, an installation volume, a manufacturing process, and the like. The thickness of the core layer 168 is set in a range of 50 to 200 nm, for example.

The cladding layer 166 and the core layer 168 form the waveguide. The cladding layer 166 is formed between the base material (diffraction grating 164) and the core layer 168. The core layer 168 is formed between the cladding layer 166 and an underlying insulating layer.

The diffraction grating 164 diffracts and interferes with the incident light on an incident surface of the GMR filter. When the incident light enters the waveguide formed by the cladding layer 166 and the core layer 168, light having a predetermined wavelength propagates through the waveguide to form a resonant guided mode. Due to the generation of the resonant guided mode, light in a narrow band is transmitted through the GMR filter 160. In this manner, the GMR filter 160 transmits the selective light in the narrow band to the photoelectric conversion unit.

FIG. 292 is a diagram illustrating the GMR filter 160 as a whole. As illustrated in FIG. 292, a reflection layer 170 may be provided to sandwich the cladding layer 166 and the core layer 168. The reflection layer 170 includes a conductor of metal or the like. Furthermore, a periphery of the diffraction grating 164 may also be surrounded by the reflection layer.

By surrounding the waveguide including the cladding layer 166 and the core layer 168 with the reflection layer 170, the light of the resonant guided mode can be prevented from being reflected and propagated to the adjacent pixel 102 or the adjacent subpixel 106. That is, the waveguide formed by the cladding layer 166 and the core layer 168 can be optically isolated from the adjacent pixel 102 or the adjacent subpixel 106.

FIG. 293 is a diagram illustrating an example of transmission wavelength characteristics of the GMR filter 160 using a one-dimensional diffraction grating with respect to the grating period Pg. Specifically, the horizontal axis of the graph represents wavelength [nm], and the vertical axis represents transmittance [a.u.]. Each waveform indicates a wavelength characteristic of the GMR filter 160 in a case where the grating period Pg of the diffraction grating 164 is changed.

The transmission wavelength band of the GMR filter 160 transitions to a shorter wavelength band as the grating period Pg becomes shorter, that is, a grating interval becomes narrower. Conversely, the transmission wavelength band of the GMR filter 160 transitions to a longer wavelength band as the grating period Pg becomes longer, that is, the grating interval becomes wider.

For example, in the GMR filter 160 illustrated in the upper left part of FIG. 293, the grating period Pg is 280 nm. In this case, a peak of the transmission wavelength band of the diffraction grating 164 appears in the wavelength band of blue light.

Meanwhile, for example, in the GMR filter 160 illustrated in the upper right, the grating period Pg is 500 nm. In this case, the peak of the transmission wavelength band of the diffraction grating 164 appears in the wavelength band of red to near-infrared light.

The GMR filter 160 is provided for each subpixel 106 or each pixel 102. In the pixel 102, at least one subpixel 106 may be provided with the GMR filter 160.

For example, in a case where a color filter is provided in the subpixel 106, the GMR filter 160 having a peak transmission wavelength that matches or is close to the peak wavelength of the color filter may be provided in order to suppress the trail of color mixing.

The GMR filter 160 may be arranged for the pixel 102.

The arrangement of the GMR filter 160 may be any subpixel 106. As a non-limiting example, the GMF filter 160 may be provided for the subpixel 106 located at the center of the pixel 102. The present embodiment is not limited thereto, and two or more other subpixels 106 may be provided with the GMF filter, or one another subpixel 106 may be provided with the GMF filter. Furthermore, in a case where color filters of different wavelength regions are arranged for the subpixels 106 in the pixel 102, the GMR filter 160 that transmits light of a wavelength region corresponding to the color filter arranged for each subpixel 106 may be provided.

As described above, in the imaging device according to the present embodiment, by providing the filter such as the GMR filter 160 in the subpixel 106 or the pixel 102, it is possible to improve the accuracy in the case of using the color filter.

Note that, in the same plane in which the GMR filter 160 is provided for the subpixel 106 or the pixel 102, a filter having a light-shielding property with pinholes, a plasmon filter, and a wire grid polarizer can be mixed. Moreover, the pinholes, the plasmon filter, the wire grid polarizer, or the like may be provided to overlap above or below the GMF filter 160.

Note that the present technology can also have the following configurations.

(1)

An imaging device including:

a subpixel including a photoelectric conversion element and configured to receive light incident at a predetermined angle and output an analog signal on the basis of intensity of the received light;

a pixel including a plurality of the subpixels, a lens that condenses the light incident from an outside on the subpixel, and a photoelectric conversion element isolation portion that does not propagate information regarding the intensity of the light acquired in the photoelectric conversion element to the adjacent photoelectric conversion element, and further including a light-shielding wall that shields light incident on the lens of another pixel; and a pixel array including a plurality of the pixels.

(2)

The imaging device according to (1), in which the lens causes light incident in parallel to an optical axis of the lens to be incident on the subpixel located at a center of the pixel.

(3)

The imaging device according to (1), in which the lens causes part of light incident in parallel to an optical axis of the lens to be incident on at least the subpixel located at a center of the pixel.

(4)

The imaging device according to (1), in which the lens condenses light incident at an angle not parallel to an optical axis of the lens on the subpixel provided at a predetermined position among the subpixels provided in the pixel.

(5)

The imaging device according to (1), in which the lens is a reflow lens, and includes a level difference of a reflow stopper between the lens and an adjacent lens.

(6)

The imaging device according to (5), in which the reflow stopper is at least a part of the light-shielding wall, and includes a self-alignment reflow lens.

(7)

The imaging device according to (1), in which the lens is a Fresnel lens.

(8)

The imaging device according to (1), in which the lens is a diffractive lens.

(9)

The imaging device according to (1), in which the pixel further includes an inner lens between the lens and the photoelectric conversion element.

(10)

The imaging device according to (1), in which the lens is arranged such that a position of a center of the lens is shifted from a position of a center of the corresponding pixel on the basis of a position of the pixel in the pixel array.

(11)

The imaging device according to (1), in which the pixel includes a color filter that transmits a predetermined color to at least one of the subpixels.

(12)

The imaging device according to (11), in which the subpixel does not include the photoelectric conversion element isolation portion between the subpixel and the adjacent subpixel in a case where light transmitted through the color filter of the same color as that of the adjacent subpixel is incident on the subpixel.

(13)

The imaging device according to (11), in which the pixel includes a plasmon filter as at least one of the color filters.

(14)

The imaging device according to (1), in which the pixel includes at least two types of color filters between the lens and the photoelectric conversion element.

(15)

The imaging device according to (13), in which the color filter includes a plasmon filter on a photoelectric conversion element side of a light-shielding wall.

(16)

The imaging device according to (13), in which the color filter includes a color filter of an organic film on a lens side of the light-shielding wall.

(17)

The imaging device according to (13), in which a part of a combination of the color filters has a transmittance spectrum that transmits light of near infrared rays and absorbs visible light.

(18)

The imaging device according to (1), in which the light-shielding wall is configured in multiple stages at different positions in a case where the light-shielding wall is viewed from a direction of an optical axis of the pixel on the basis of a position where the lens is provided.

(19)

The imaging device according to (17), further including:

a light-shielding film configured to shield light incident on an adjacent pixel from between the light-shielding walls configured in multiple stages.

(20)

The imaging device according to (15), in which the pixel includes at least one diaphragm between the lens and the photoelectric conversion element, and the diaphragm is a light-shielding film provided in a direction intersecting an optical axis of the lens.

(21)

The imaging device according to (1), further including:

a memory region in which a charge converted from light in the photoelectric conversion element are temporarily stored.

(22)

The imaging device according to (1), further including:

an antireflection film having a moth-eye structure on the lens side of the photoelectric conversion element, and a reflecting film on a side opposite to the antireflection film of the photoelectric conversion element, and a metal film in a semiconductor substrate of the photoelectric conversion element isolation portion.

(23)

The imaging device according to (1), in which the photoelectric conversion element isolation portion includes a groove from a side of the semiconductor substrate, the side being not an irradiation surface, has a level difference in a part of the groove, includes a vertical transistor, and has a back-illuminated structure.

(24)

The imaging device according to (23), in which the photoelectric conversion element isolation portion includes an impurity layer by solid-phase diffusion.

(25)

The imaging device according to (24), in which in the pixel, an aspect ratio of a thickness of the semiconductor substrate a length of one side of the photoelectric conversion element is at least 4 or more.

(26)

The imaging device according to (1), in which the pixel has subpixels of at least two different sizes.

(27)

A method of manufacturing an imaging element including a subpixel and a pixel including a plurality of the subpixels, the method including:

forming a well region in a substrate;

forming a photoelectric conversion element isolation portion that isolates a light-receiving region of the subpixel in the well region;

forming an insulating film on the substrate;

forming an interlayer film including a material that transmits light on the insulating film;

forming a light-shielding wall on the photoelectric conversion element isolation portion that isolates the pixel in the interlayer film; and forming a lens on the interlayer film.

(28)

An electronic device including:

a subpixel including a photoelectric conversion element and configured to receive light incident at a predetermined angle and output an analog signal on the basis of intensity of the received light;

a pixel including a plurality of the subpixels, a lens that condenses the light incident from an outside on the subpixel, and a photoelectric conversion element isolation portion that does not propagate information regarding the intensity of the light acquired in the photoelectric conversion element to the adjacent photoelectric conversion element, and further including a light-shielding wall that shields light incident on the lens of another pixel; and an imaging element including a pixel array including a plurality of the pixels. The imaging element may be the imaging element according to any one of (1) to (26), or may be an imaging element created by the method according to (27).

(29)

The electronic device according to (28), further including:

a signal processing device that synthesizes outputs of a plurality of subpixels acquired by the imaging element and acquires three-dimensional stereoscopic information of an object.

(30)

The electronic device according to (28), further including:

a signal processing device that synthesizes outputs of a plurality of subpixels acquired by the imaging element and expands an angle of view.

(31)

The electronic device according to (28), further including:

a signal processing device that synthesizes outputs of a plurality of subpixels acquired by the imaging element and operates the number of pixels.

(32)

The electronic device according to (28), further including:

a signal processing device that synthesizes outputs of a plurality of subpixels acquired by the imaging element and refocuses an object image.

(33)

The electronic device according to (28), further including:

a signal processing device that acquires distance information of an object from a shift amount of a characteristic pattern of a plurality of subpixel images acquired by the imaging element.

(34)

The electronic device according to (28), further including:

a signal processing device including the imaging element according to (21), and configured to identify a motion of a human body and convert the motion into an operation command.

(35)

The electronic device according to (28), further including:

a signal processing device configured to perform Fourier transform for an output from the subpixel and perform deconvolution using a point spread function of the subpixel.

(36)

The electronic device according to (35), further including:

a signal processing device in which an image of the subpixel is divided into a plurality of regions, and the point spread function is defined for each of the regions, and configured to perform deconvolution for the each of the regions.

(37)

The electronic device according to (28), further including:

a display unit, in which the imaging element is provided on a side opposite to a display surface of the display unit.

(38)

The electronic device according to (37), further including:

an address storage unit of a subpixel in which light from an object is shielded by an element of the display unit; and a signal processing device configured to synthesize a subpixel image excluding a signal of the subpixel.

(39)

The electronic device according to (28), further including:

a personal authentication device including a storage unit that extracts a characteristic from a fingerprint image of an individual acquired by the imaging element and stores the characteristic in a database, and configured to acquire the fingerprint image of an object during an authentication operation, extract and collate the characteristic with the database, and make a determination.

(40)

The electronic device according to (39), further including:

the imaging element according to (21), in which a method of acquiring the fingerprint image is a flip operation.

(41)

The electronic device according to (28), further including:

a personal authentication device including a storage unit that extracts a characteristic from a vein image of an individual acquired by the imaging element and stores the characteristic in a database, and configured to acquire the vein image of an object during an authentication operation, extract and collate the characteristic with the database, and make a determination.

(42)

The electronic device according to (41), in which the characteristic of the vein image is three-dimensional stereoscopic information.

(43)

The electronic device according to (28), further including:

an impersonation prevention function to collate spectrum information of an object acquired by the imaging element with a rising spectrum unique to human skin in a vicinity of a wavelength of 590 nm, and determine whether or not the object is a living body.

(44)

The electronic device according to (28), further including:

an impersonation prevention function to detect pulsation of a vein from a plurality of image differences of a vein image acquired by the imaging element, and determine whether or not the vein image is of a living body.

(45)

The electronic device according to (28), further including:

a function to calculate a signal ratio between a wavelength around 660 nm and a near-infrared region from spectrum information of an object acquired by the imaging element, and to measure a saturated oxygen concentration.

(46)

The imaging device according to any one of (1) to (26) or the electronic device according to any one of (28) to (45), in which in the pixel, a wire grid polarizer is provided in at least one of the subpixels.

(47)

The imaging device or the electronic device according to (46), in which, in the pixel, the wire grid polarizer is provided in the plurality of subpixels.

(48)

The imaging device according to any one of (1) to (26) or the electronic device according to any one of (28) to (45), in which a wire grid polarizer is provided for the pixel.

(49)

The imaging device or the electronic device according to any one of (46) to (48), further including:

the wire grid polarizer having a plurality of polarization directions.

(50)

The imaging device or the electronic device according to (49), further including:

at least two types of the wire grid polarizers having polarization directions different by at 90 degrees.

(51)

The imaging device or the electronic device according to (49), further including:

the wire grid polarizer having three or more types of polarization directions, in which a normal analysis is executed by fitting.

(52)

The imaging device or the electronic device according to any one of (46) to (51), in which the subpixel mixes the wire grid polarizer and another type of filter.

(53)

The imaging device or the electronic device according to any one of (46) to (52), in which the subpixel receives light transmitted through the wire grid polarizer and another type of filter.

(54)

The imaging device according to any one of (1) to (26), the electronic device according to any one of (28) to (45), or the imaging device or the electronic device according to any one of (46) to (53), in which, in the pixel, at least one of the subpixels includes a GMR filter.

(55)

The imaging device according to any one of (1) to (26), the electronic device according to any one of (28) to (45), or the imaging device or the electronic device according to any one of (46) to (53), in which, in the pixel, the plurality of subpixels includes a GMR filter.

(56)

The imaging device according to any one of (1) to (26), the electronic device according to any one of (28) to (45), or the imaging device or the electronic device according to any one of (46) to (53), in which a GMR filter is provided for the pixel.

(57)

The imaging device or the electronic device according to any one of (54) to (56), further including:

two or more types of the GMR filters having different peak wavelengths.

(58)

The imaging device or the electronic device according to (54) or (55), in which the subpixel mixes the GMR filter and another type of filter.

The aspects of the present disclosure are not limited to the above-described individual embodiments, but also include various modifications that can be conceived by those skilled in the art, and the effects of the present disclosure are not limited to the above-described content. That is, various additions, changes, and partial deletions are possible without departing from the conceptual idea and purpose of the present disclosure derived from the content defined in the claims and its equivalents.

REFERENCE SIGNS LIST

1 Electronic device
2 Display unit

3 Imaging device
4 Display panel
5 Circularly polarizing plate
6 Touch panel
7 Cover glass
9 Optical system
10 Imaging element
12 Reading surface
14, 16, 18 Light source
100 Pixel array
102, 102A, 102B, 102C, 102D, 102E Pixel
104 Lens
106, 106A, 106B, 106C, 106D, 106E, 106F, 106G, 106*a*, 106*b*, 106*c*, 106*d*, 106*e*, 106*f*, 106*g*, 106*h*, 106*i* Subpixel
108, 108A, 108B Light-shielding wall
110 Photoelectric conversion element isolation portion
112, 112R, 112G, 112B, 112W, 112IR, 112IRC, 112Ye, 112Mg, 112Cy, 112*x*, 112*y* Filter
114, 114R, 114G, 114B, 114Ye Filter
116, 116*a*, 116*b*, 116*c*, 116*d*, 116*e*, 116*f*, 116*g*, 116*h*, 116*i* Plasmon filter
116A Metal film
116B Hole
118 Inner lens
120 Lens isolation portion
122 Fresnel lens
124, 124A, 124B, 124C, 124D, 124E, 126 Diffractive lens
128, 132 Light-shielding film
130, 134 Opening
140 Wire grid polarizer
142 Reflection layer
144 Insulating layer
146 Absorption layer
148 Opening
150 Protective layer
160 GMR filter
162 Base material
164 Diffraction grating
166 Cladding layer
168 Core layer
170 Reflection layer
20 Imaging control unit
200, 202 Signal line
22 Line drive unit
220 Line drive line
24 Column signal processing unit
240 Column signal line
300 Semiconductor substrate
302 Wiring layer
304 Wiring
306 Interlayer film
308 Adhesion layer
310 Well region
312 Fixed charge film
314 Insulating film
316 Metal film
318 Planarization film
320 Polysilicon
322 Impurity region
324 Vertical transistor
326 Antireflection layer
328 Reflecting film
330 Adhesion layer
332 Memory region
334 Transistor
336 Lens material
338 Mold
350 Resist
352 Support substrate
354 Hard mask
356 Impurity-containing film
40 Signal processing unit
42 Storage unit
44 Image processing unit
46 Authentication unit
48 Result output unit
400 A/D conversion unit
402 Clamp unit
404 Output unit by subpixel
406 Output unit by color
440 Defect correction unit
442 Subpixel shift amount calculation unit
444 Resolution operation unit
446 Angle of view operation unit
448 Addition processing unit
450 Demosaic unit
452 Linear matrix unit
454 Spectrum analysis unit
456 Outer shape measurement unit
458 Clipping unit
460 Stereoscopic image synthesis unit
500, 500*a*, 500*b*, 500*c*, 500*d*, 500*e*, 500*f*, 500*g*, 500*h*, 500*i*, 500A, 500B, 500C, 500D, 500E Subpixel image
52 Object
520*d*, 520*e*, 520*f* Subpixel image
540 Synthesis image
560A, 560B, 560C Refocusing surface
58 Shielding body

What is claimed is:

1. An electronic device, comprising:

a subpixel including a photoelectric conversion element and configured to receive light incident at a predetermined angle and output an analog signal on a basis of intensity of the received light;

a pixel including a plurality of the subpixels, a lens that condenses the light incident from an outside on the subpixel, and a photoelectric conversion element isolation portion that does not propagate information regarding the intensity of the light acquired in the photoelectric conversion element to an adjacent photoelectric conversion element, and further including a light-shielding wall that shields light incident on the lens of another pixel;

an imaging element including a pixel array including a plurality of the pixels; and a personal authentication device including a storage unit that extracts a characteristic from a fingerprint image of an individual acquired by the imaging element and stores the characteristic in a database, and configured to acquire the fingerprint image of an object during an authentication operation, extract and collate the characteristic with the database, and make a determination, wherein a method of acquiring the fingerprint image is a flip operation.

2. The electronic device according to claim 1, further comprising:

a signal processing device that synthesizes outputs of a plurality of subpixels acquired by the imaging element and acquires three-dimensional stereoscopic information of an object.

3. The electronic device according to claim 1, further comprising:

a signal processing device that synthesizes outputs of a plurality of subpixels acquired by the imaging element and refocuses an object image.

4. An electronic device, comprising:

a subpixel including a photoelectric conversion element and configured to receive light incident at a predetermined angle and output an analog signal on a basis of intensity of the received light;

a pixel including a plurality of the subpixels, a lens that condenses the light incident from an outside on the subpixel, and a photoelectric conversion element isolation portion that does not propagate information regarding the intensity of the light acquired in the photoelectric conversion element to an adjacent photoelectric conversion element, and further including a light-shielding wall that shields light incident on the lens of another pixel;

an imaging element including a pixel array including a plurality of the pixels a display unit in which the imaging element is arranged on a side opposite to a display surface;

an address storage unit of a subpixel in which light from an object is shielded by a light emitting element of the display unit; and a signal processing device configured to synthesize a subpixel image by excluding a signal from the subpixel in which the light is shielded.

5. The electronic device according to claim 4, further comprising:

a personal authentication device including a storage unit that extracts a characteristic from a fingerprint image of an individual acquired by the imaging element and stores the characteristic in a database, and configured to acquire the fingerprint image of an object during an authentication operation, extract and collate the characteristic with the database, and make a determination.

6. The electronic device according to claim 5, wherein a method of acquiring the fingerprint image is a flip operation.

7. The electronic device according to claim 4, further comprising:

a personal authentication device including a storage unit that extracts a characteristic from a vein image of an individual acquired by the imaging element and stores the characteristic in a database, and configured to acquire the vein image of an object during an authentication operation, extract and collate the characteristic with the database, and make a determination.

8. The electronic device according to claim 7, wherein the characteristic of the vein image is three-dimensional stereoscopic information.

9. The electronic device according to claim 4, further comprising:

an impersonation prevention function to collate spectrum information of an object acquired by the imaging element with a rising spectrum unique to human skin in a vicinity of a wavelength of 590 nm, and determine whether or not the object is a living body.

10. The electronic device according to claim 4, further comprising:

an impersonation prevention function to detect pulsation of a vein from a plurality of image differences of a vein image acquired by the imaging element, and determine whether or not the vein image is of a living body.

* * * * *